(12) United States Patent
Kimura

(10) Patent No.: US 10,012,880 B2
(45) Date of Patent: Jul. 3, 2018

(54) LIQUID CRYSTAL DISPLAY DEVICE

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/585,221

(22) Filed: May 3, 2017

(65) Prior Publication Data

US 2017/0235197 A1    Aug. 17, 2017

Related U.S. Application Data

(63) Continuation of application No. 14/945,651, filed on Nov. 19, 2015, now Pat. No. 9,645,461, which is a
(Continued)

(30) Foreign Application Priority Data

May 18, 2007   (JP) ................................. 2007-133533

(51) Int. Cl.
*G02F 1/136* (2006.01)
*G02F 1/1343* (2006.01)
(Continued)

(52) U.S. Cl.
CPC ...... *G02F 1/136213* (2013.01); *G02F 1/1368* (2013.01); *G02F 1/13624* (2013.01);
(Continued)

(58) Field of Classification Search
CPC .................................................. G02F 1/136227
(Continued)

(56) References Cited

U.S. PATENT DOCUMENTS 5,132,820 A    7/1992  Someya et al.
5,319,480 A    6/1994  Mccartney
(Continued)

FOREIGN PATENT DOCUMENTS

EP    1209748 A    5/2002
EP    1388842 A    2/2004
(Continued)

OTHER PUBLICATIONS

Kim.S, "66.1: Invited Paper: The World's Largest (82-In.) TFT-LCD", SID Digest '05 : SID International Symposium Digest of Technical Papers, May 24, 2005, vol. 36, pp. 1842-1847.
(Continued)

*Primary Examiner* — Wen-Ying P Chen
(74) *Attorney, Agent, or Firm* — Fish & Richardson P.C.

(57) ABSTRACT

To improve viewing angle characteristics by varying voltage which is applied between liquid crystal elements. A liquid crystal display device in which one pixel is provided with three or more liquid crystal elements and the level of voltage which is applied is varied between the liquid crystal elements is varied. In order to vary the level of the voltage which is applied between the liquid crystal elements, an element which divides the applied voltage is provided. In order to vary the level of the applied voltage, a capacitor, a resistor, a transistor, or the like is used. Viewing angle characteristics can be improved by varying the level of the voltage which is applied between the liquid crystal elements.

22 Claims, 143 Drawing Sheets

Related U.S. Application Data continuation of application No. 14/317,286, filed on Jun. 27, 2014, now Pat. No. 9,360,722, which is a continuation of application No. 13/451,619, filed on Apr. 20, 2012, now Pat. No. 8,767,159, which is a continuation of application No. 12/115,319, filed on May 5, 2008, now Pat. No. 8,253,911.

(51) Int. Cl.
| | | |
|---|---|---|
| G02F 1/1362 | (2006.01) | |
| G09G 3/36 | (2006.01) | |
| G02F 1/1368 | (2006.01) | |
| G09G 3/20 | (2006.01) | |
| G09G 3/3233 | (2016.01) | |
| H01L 27/12 | (2006.01) | |

(52) U.S. Cl.
CPC ..... *G02F 1/136286* (2013.01); *G09G 3/3648* (2013.01); *G09G 3/3659* (2013.01); *G02F 1/136227* (2013.01); *G02F 2001/134345* (2013.01); *G02F 2001/136295* (2013.01); *G09G 3/2022* (2013.01); *G09G 3/3233* (2013.01); *G09G 2300/0443* (2013.01); *G09G 2300/0447* (2013.01); *G09G 2300/0809* (2013.01); *G09G 2300/0842* (2013.01); *G09G 2300/0852* (2013.01); *G09G 2310/0262* (2013.01); *G09G 2320/028* (2013.01); *G09G 2320/0252* (2013.01); *G09G 2320/0261* (2013.01); *G09G 2320/10* (2013.01); *G09G 2320/106* (2013.01); *G09G 2330/021* (2013.01); *G09G 2340/0435* (2013.01); *G09G 2340/16* (2013.01); *H01L 27/12* (2013.01)

(58) Field of Classification Search
USPC .......................................................... 349/48
See application file for complete search history.

(56) References Cited

U.S. PATENT DOCUMENTS

| | | |
|---|---|---|
| 5,331,447 A | 7/1994 | Someya et al. |
| 5,528,396 A | 6/1996 | Someya et al. |
| 5,532,850 A | 7/1996 | Someya et al. |
| 5,708,484 A | 1/1998 | Someya et al. |
| 5,731,856 A | 3/1998 | Kim et al. |
| 5,744,864 A | 4/1998 | Cillessen et al. |
| 5,838,399 A | 11/1998 | Someya et al. |
| 6,184,963 B1 | 2/2001 | Someya et al. |
| 6,294,274 B1 | 9/2001 | Kawazoe et al. |
| 6,384,879 B2 | 5/2002 | Someya et al. |
| 6,563,174 B2 | 5/2003 | Kawasaki et al. |
| 6,600,472 B1 | 7/2003 | Nakai et al. |
| 6,646,692 B2 | 11/2003 | Yamazaki et al. |
| 6,727,522 B1 | 4/2004 | Kawasaki et al. |
| 6,839,098 B2 | 1/2005 | Someya et al. |
| 6,912,021 B2 | 6/2005 | Kimura |
| 6,936,845 B2 | 8/2005 | Kim et al. |
| 6,987,552 B2 | 1/2006 | Yamazaki et al. |
| 6,992,744 B2 | 1/2006 | Someya et al. |
| 6,999,134 B2 | 2/2006 | Lee et al. |
| 7,034,789 B2 | 4/2006 | Takeuchi et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,158,201 B2 | 1/2007 | Kim et al. |
| 7,196,762 B2 | 3/2007 | Someya et al. |
| 7,206,048 B2 | 4/2007 | Song |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,972 B2 | 9/2008 | Kim et al. |
| 7,450,210 B2 | 11/2008 | Someya et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,502,089 B2 | 3/2009 | Yoo et al. |
| 7,567,328 B2 | 7/2009 | Yamazaki et al. |
| 7,595,781 B2 | 9/2009 | Takeuchi et al. |
| 7,633,090 B2 | 12/2009 | Ishii |
| 7,651,896 B2 | 1/2010 | Honda et al. |
| 7,652,725 B2 | 1/2010 | Lee et al. |
| 7,674,650 B2 | 3/2010 | Akimoto et al. |
| 7,688,393 B2 | 3/2010 | Ueda et al. |
| 7,696,952 B2 | 4/2010 | Kimura et al. |
| 7,732,819 B2 | 6/2010 | Akimoto et al. |
| 7,764,329 B2 | 7/2010 | Lee |
| 7,768,604 B2 | 8/2010 | Lin et al. |
| 7,773,169 B2 | 8/2010 | Song |
| 7,791,072 B2 | 9/2010 | Kumomi et al. |
| 7,834,949 B2 | 11/2010 | Tasaka et al. |
| 7,876,410 B2 | 1/2011 | Hsu et al. |
| 7,898,623 B2 | 3/2011 | Kimura et al. |
| 7,910,490 B2 | 3/2011 | Akimoto et al. |
| 7,932,521 B2 | 4/2011 | Akimoto et al. |
| 7,944,424 B2 | 5/2011 | Tsao et al. |
| 7,973,901 B2 | 7/2011 | Yoo et al. |
| 7,977,168 B2 | 7/2011 | Honda et al. |
| 7,982,702 B2 | 7/2011 | Kamada et al. |
| 8,102,493 B2 | 1/2012 | Li et al. |
| 8,134,156 B2 | 3/2012 | Akimoto |
| 8,154,678 B2 | 4/2012 | Kimura et al. |
| 8,158,464 B2 | 4/2012 | Akimoto |
| 8,179,492 B2 | 5/2012 | Tasaka et al. |
| 8,228,452 B2 | 7/2012 | Lee et al. |
| 8,237,166 B2 | 8/2012 | Kumomi et al. |
| 8,274,077 B2 | 9/2012 | Akimoto et al. |
| 8,339,530 B2 | 12/2012 | Kimura et al. |
| RE44,166 E | 4/2013 | Kim et al. |
| 8,466,463 B2 | 6/2013 | Akimoto et al. |
| 8,587,742 B2 | 11/2013 | Kimura et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0122985 A1* | 7/2003 | Park .................... G02F 1/13458 349/43 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0103800 A1 | 5/2006 | Li et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0215066 A1 | 9/2006 | Ueda et al. |
| 2006/0228974 A1 | 10/2006 | Thelss et al. |
| 2006/0231882 A1 | 10/2006 | Kim et al. |

(56) References Cited

U.S. PATENT DOCUMENTS

| | | |
|---|---|---|
| 2006/0238135 A1 | 10/2006 | Kimura |
| 2006/0244107 A1 | 11/2006 | Sugihara et al. |
| 2006/0262237 A1 | 11/2006 | Chen et al. |
| 2006/0284171 A1 | 12/2006 | Levy et al. |
| 2006/0284172 A1 | 12/2006 | Ishii |
| 2006/0290827 A1 | 12/2006 | Kihara et al. |
| 2006/0292777 A1 | 12/2006 | Dunbar |
| 2007/0008263 A1 | 1/2007 | Kim |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0103615 A1 | 5/2007 | Cheng et al. |
| 2007/0108446 A1 | 5/2007 | Akimoto |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0211983 A1 | 9/2008 | Tsao et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0021658 A1 | 1/2009 | Takeuchi et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0195488 A1 | 8/2009 | Takeuchi et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0141841 A1 | 6/2010 | Kimura et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0260160 A1 | 10/2011 | Honda et al. |
| 2012/0057117 A1 | 3/2012 | Li et al. |
| 2015/0340513 A1 | 11/2015 | Akimoto et al. |

FOREIGN PATENT DOCUMENTS

| | | |
|---|---|---|
| EP | 1737044 A | 12/2006 |
| EP | 1770788 A | 4/2007 |
| EP | 1798591 A | 6/2007 |
| EP | 1978398 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2230551 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-309921 A | 12/1988 |
| JP | 02-039215 | 3/1990 |
| JP | 05-251705 A | 9/1993 |
| JP | 08-179370 A | 7/1996 |
| JP | 08-508110 | 8/1996 |
| JP | 08-264794 A | 10/1996 |
| JP | 09-230310 A | 9/1997 |
| JP | 11-505377 | 5/1999 |
| JP | 11-271713 A | 10/1999 |
| JP | 2000-044236 A | 2/2000 |
| JP | 2000-150900 A | 5/2000 |
| JP | 2001-281703 A | 10/2001 |
| JP | 2002-076356 A | 3/2002 |
| JP | 2002-289859 A | 10/2002 |
| JP | 2002-323867 A | 11/2002 |
| JP | 2003-050405 A | 2/2003 |
| JP | 2003-086000 A | 3/2003 |
| JP | 2003-086808 A | 3/2003 |
| JP | 2004-045623 A | 2/2004 |
| JP | 2004-078157 A | 3/2004 |
| JP | 2004-094231 A | 3/2004 |
| JP | 2004-103957 A | 4/2004 |
| JP | 2004-163943 A | 6/2004 |
| JP | 2004-213011 A | 7/2004 |
| JP | 2004-273614 A | 9/2004 |
| JP | 2004-273732 A | 9/2004 |
| JP | 2005-062882 A | 3/2005 |
| JP | 2005-316211 A | 11/2005 |
| JP | 2006-126842 A | 5/2006 |
| JP | 2006-133577 A | 5/2006 |
| JP | 2006-165528 A | 6/2006 |
| JP | 2006-245031 A | 9/2006 |
| JP | 2006-276411 A | 10/2006 |
| JP | 2006-276582 A | 10/2006 |
| JP | 2006-309239 A | 11/2006 |
| JP | 2006-330634 A | 12/2006 |
| JP | 2007-025694 A | 2/2007 |
| JP | 2007-041578 A | 2/2007 |
| JP | 2007-086785 A | 4/2007 |
| JP | 2007-123861 A | 5/2007 |
| JP | 2007-156379 A | 6/2007 |
| JP | 5859632 | 2/2016 |
| WO | WO-1994/022046 | 9/1994 |
| WO | WO-2004/114391 | 12/2004 |
| WO | WO-2006/038598 | 4/2006 |
| WO | WO-2006/093029 | 9/2006 |

OTHER PUBLICATIONS

Chen.Po-Lun et al., "69.3: Invited Paper: Advanced MVA for High Quality LCD-TVs", SID Digest '06 : SID International Symposium Digest of Technical Papers, May 1, 2006, vol. 37, pp. 1946-1949.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vo. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 30T    FIG. 30A    FIG. 30B    FIG. 30C
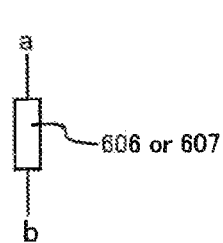   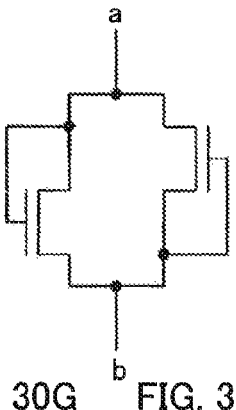
FIG. 30D    FIG. 30E    FIG. 30F    FIG. 30G    FIG. 30H
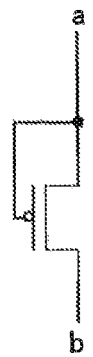  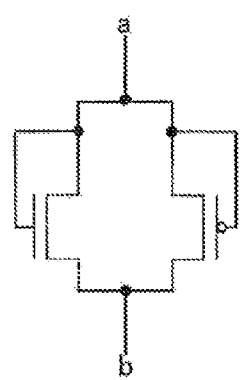  
FIG. 30I    FIG. 30J    FIG. 30K    FIG. 30L    FIG. 30M
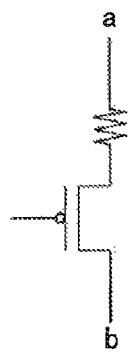 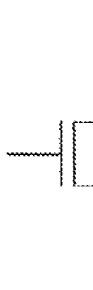 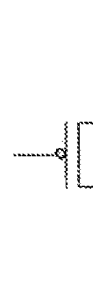 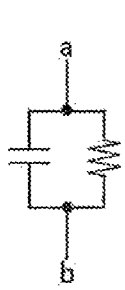 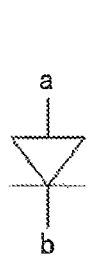
FIG. 30N    FIG. 30O    FIG. 30P    FIG. 30Q    FIG. 30R    FIG. 30S
 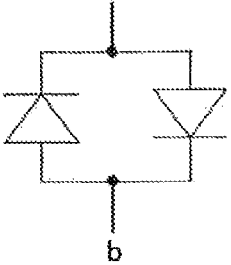  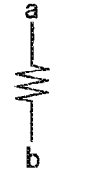  

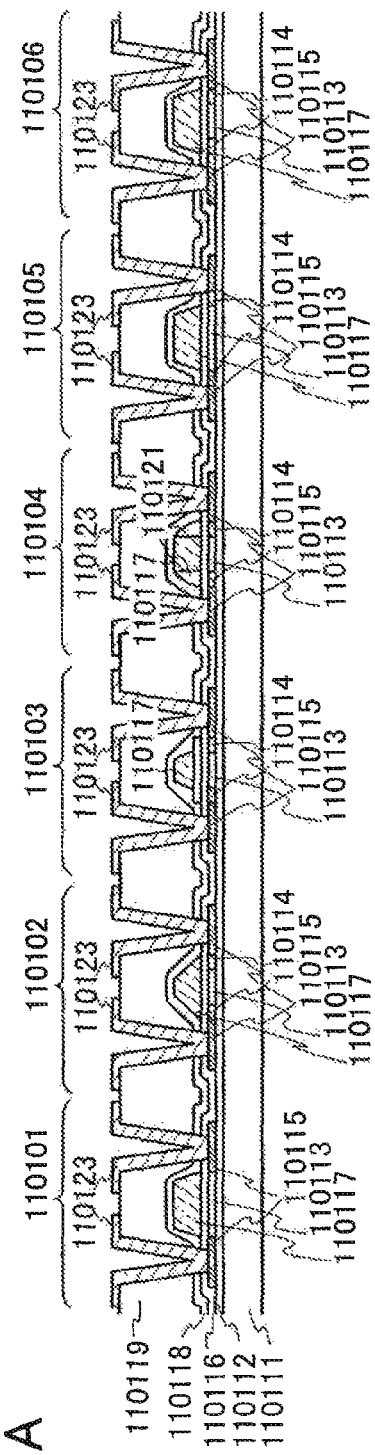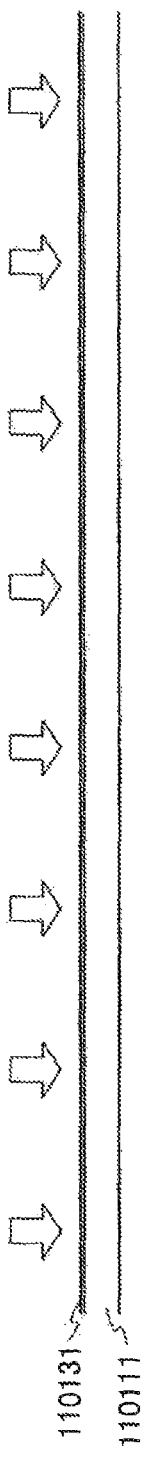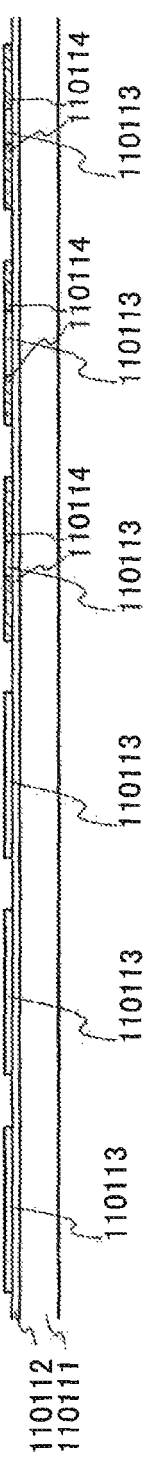

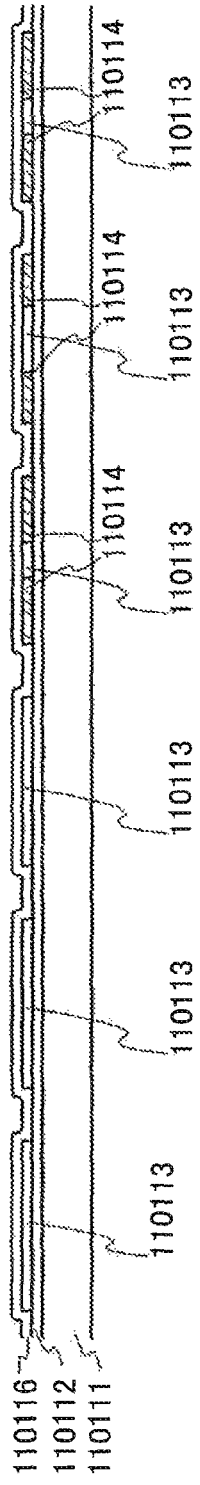
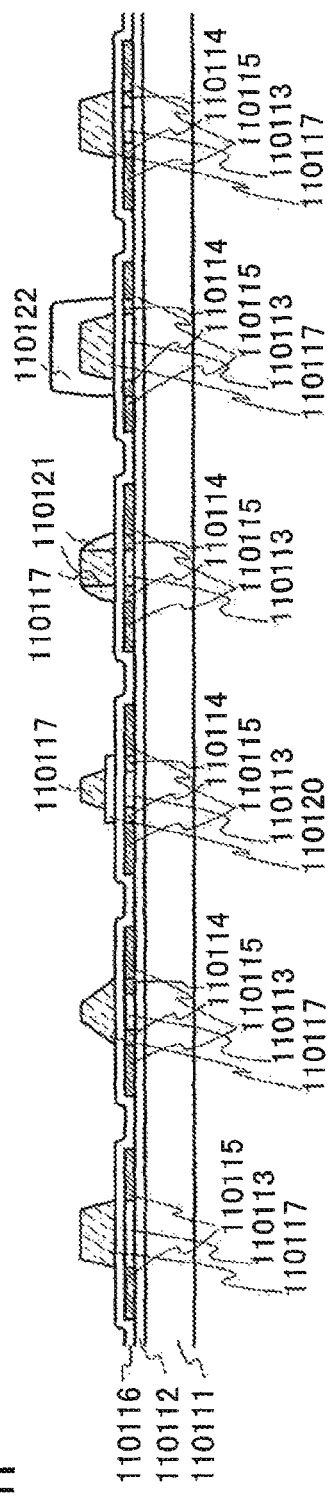
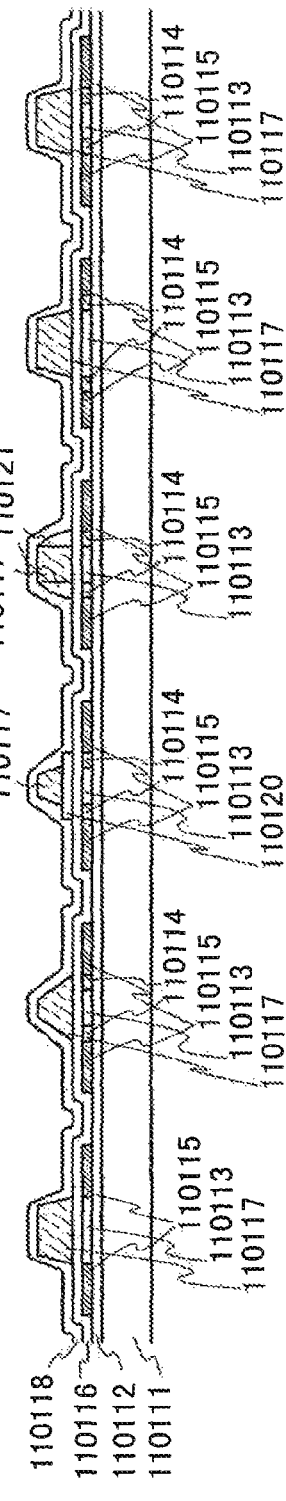

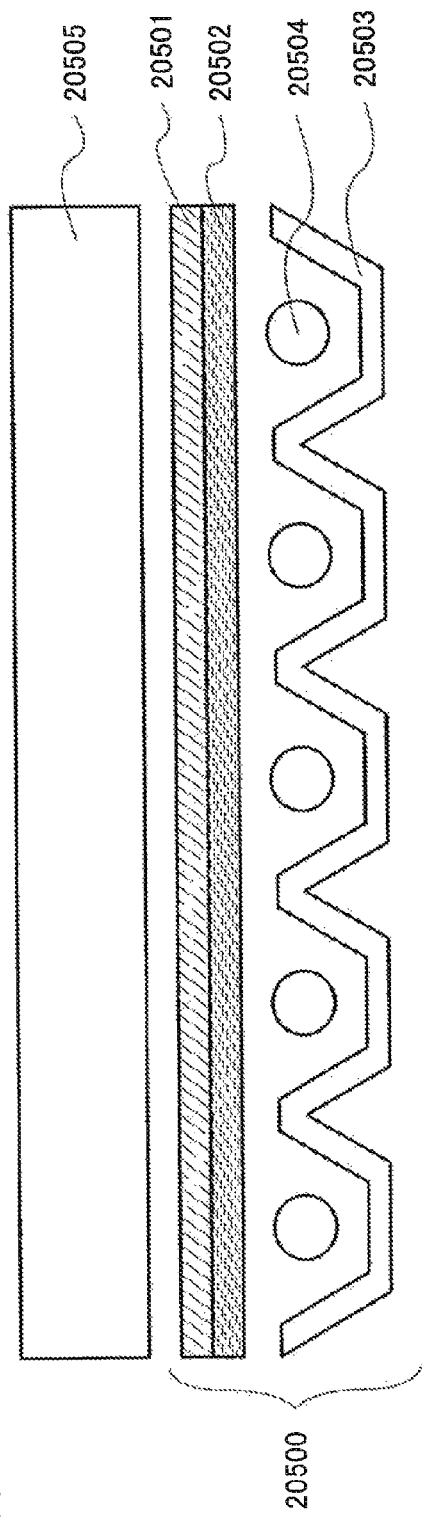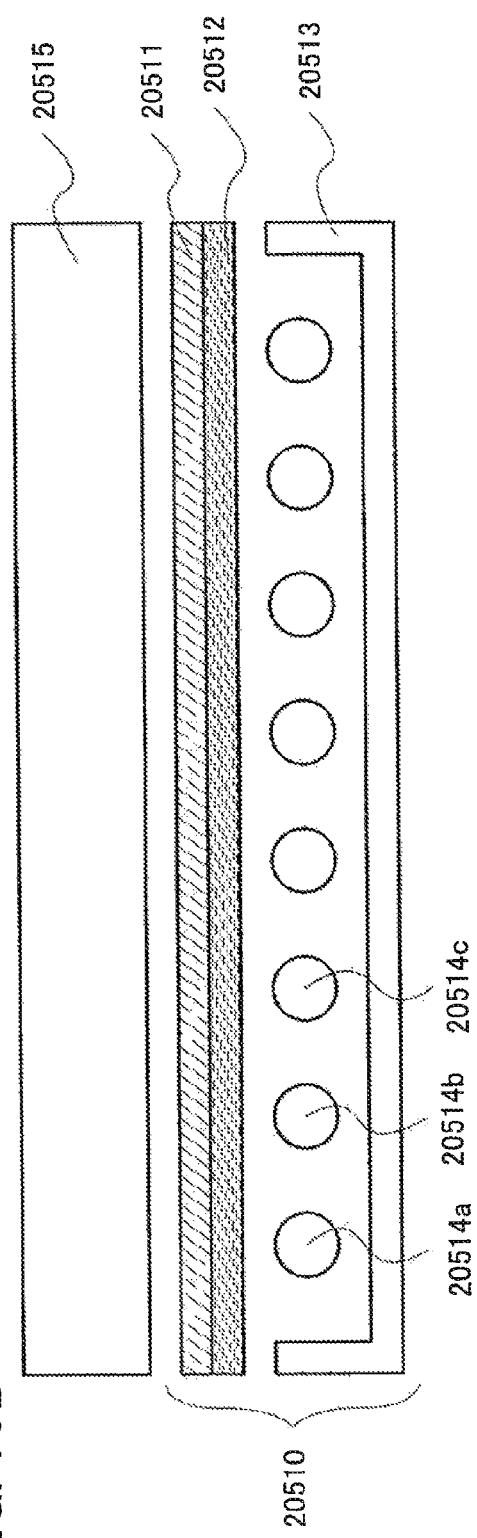

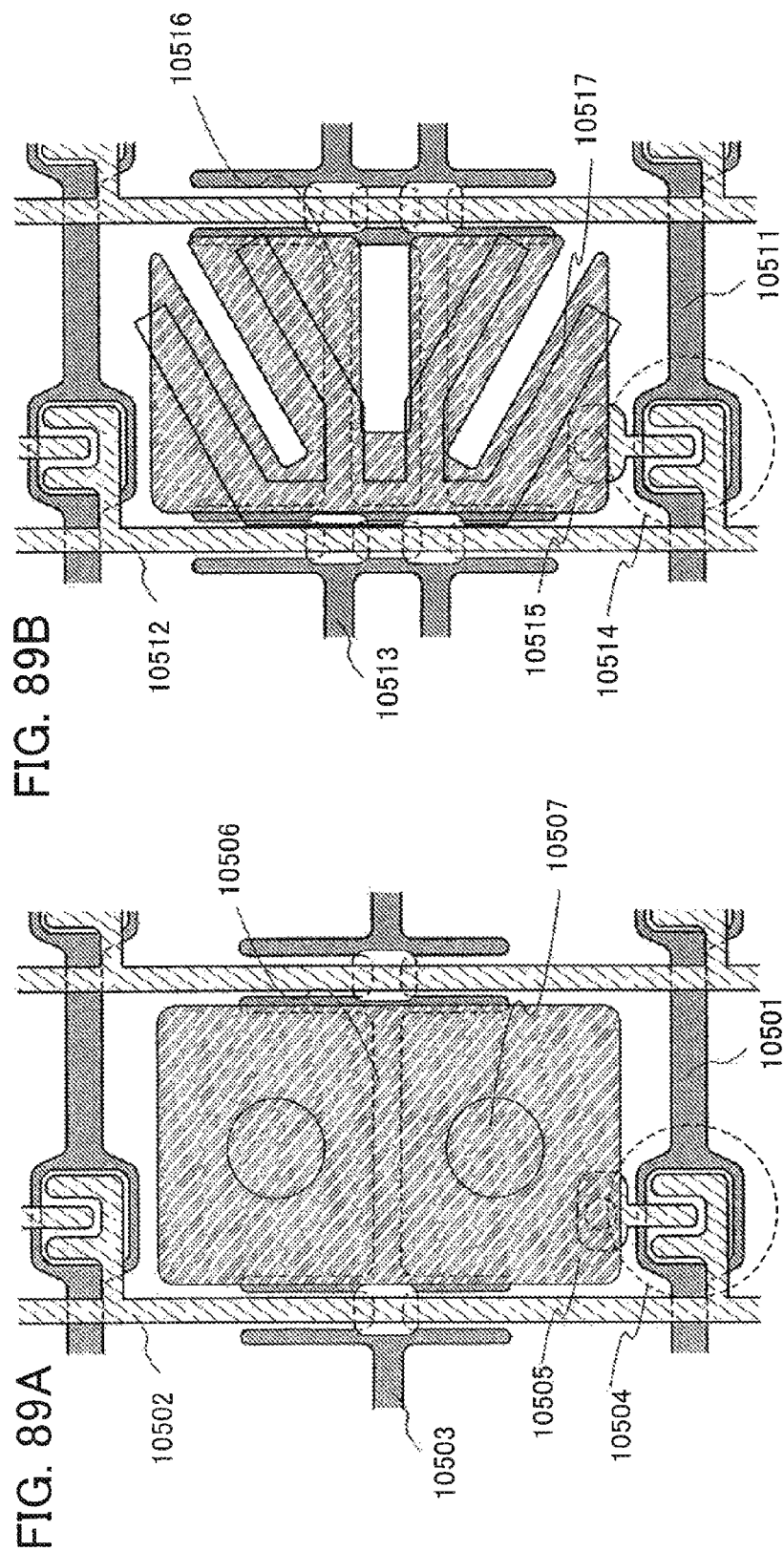

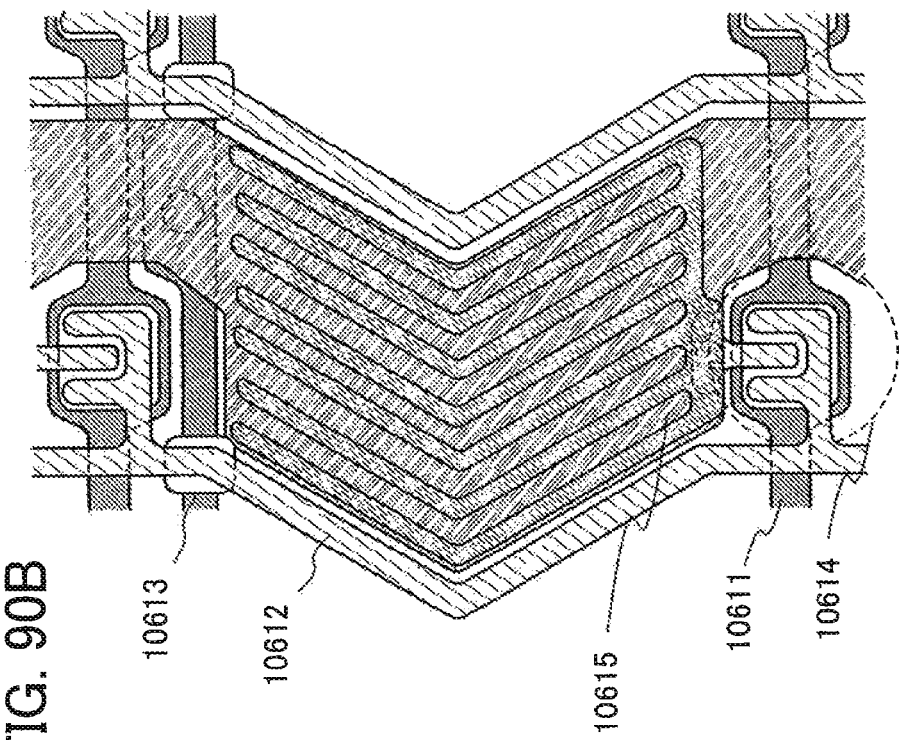
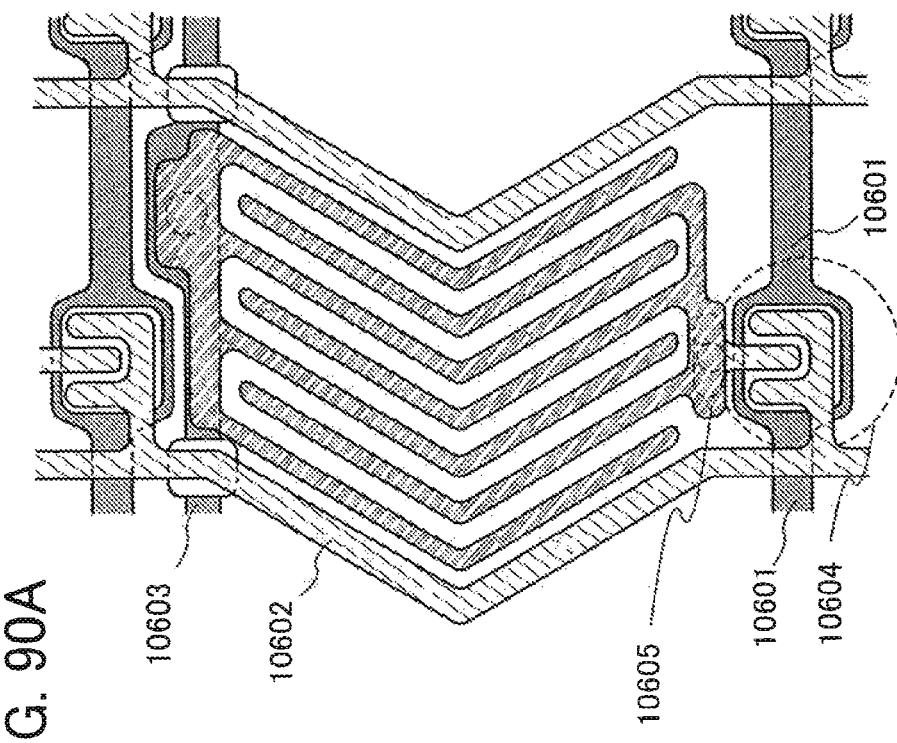

50701  50702

50711  50712

50731  50732

50741  50742

LIQUID CRYSTAL DISPLAY DEVICE

CROSS-REFERENCE TO RELATED APPLICATIONS

This application is a continuation of U.S. application Ser. No. 14/945,651, filed Nov. 19, 2015, now allowed, which is a continuation of U.S. application Ser. No. 14/317,286, filed Jun. 27, 2014, now U.S. Pat. No. 9,360,722, which is a continuation of U.S. application Ser. No. 13/451,619, filed Apr. 20, 2012, now U.S. Pat. No. 8,767,159, which is a continuation of U.S. application Ser. No. 12/115,319, filed May 5, 2008, now U.S. Pat. No. 8,253,911, which claims the benefit of a foreign priority application filed in Japan as Serial No. 2007-133533 on May 18, 2007, all of which are incorporated by reference.

BACKGROUND OF THE INVENTION

1. Field of the Invention

The present invention relates to an object, a method, or a method for producing an object. In particular, the present invention relates to a display device or a semiconductor device, particularly relates to a display device. Specifically, the present invention relates to an active matrix liquid crystal display device.

2. Description of the Related Art

In recent years, a liquid crystal display device and an EL display device have been actively developed as a display device. In particular, a liquid crystal display device has been remarkably spread. In a liquid crystal display device, high contrast, high-speed response, a wide viewing angle, and the like are necessary. Further, in a liquid crystal display device which is mounted on a portable electronic device, reduction in power consumption, weight, and size is also an important object.

In order to widen the viewing angle of a liquid crystal display device, various techniques have been developed. Examples of techniques for widening the viewing angle are an MVA (multi-vertical domain (hereinafter referred to as MVA)) mode, a PVA (patterned vertical alignment (hereinafter referred to as PVA)) mode, and a CPA (continuous pinwheel alignment) mode. With such a technique, the viewing angle has been widened compared to that of a conventional liquid crystal display device; however, the widened viewing angle has been insufficient. Therefore, a technique has been developed in which one pixel is divided into two subpixels to vary alignment of liquid crystals and inclined angles of liquid crystal molecules are averaged from appearance to cause a false sense of uniform display from any direction, so that viewing angle characteristics are improved (e.g., Reference 1: Japanese Published Patent Application No. 2006-276582).

SUMMARY OF THE INVENTION

In a liquid crystal display device, when a pixel is provided with subpixels so as to have a plurality of alignment, viewing angle characteristics can be improved. However, it cannot be said that viewing angle characteristics are sufficient, and there is a possibility that the viewing angle characteristics can be improved when subpixels are additionally provided.

However, when the number of subpixels is simply increased, disadvantages such as decrease in the aperture ratio and increase of driver circuits occur to increase manufacturing cost and cause an adverse effect such as decrease in performance as a display device itself. Specifically, when the aperture ratio is decreased, luminance and contrast are decreased, so that power consumption is increased. Alternatively, layout density of pixels is increased, so that manufacturing yield is decreased and cost is increased. Further alternatively, since the number of subpixels is increased, the number of image signals which should be input is also increased. Therefore, the number of connections between a glass substrate and an external driver circuit is increased. Accordingly, reliability is decreased due to a connection defect or the like.

It is an object of the present invention to provide a display device which maintains performance as a display device and has excellent viewing angle characteristics. Alternatively, it is an object of the present invention to provide a highly reliable display device. Alternatively, it is an object of the present invention to provide a display device having high contrast. Alternatively, it is an object of the present invention to provide a lightweight display device. Alternatively, it is an object of the present invention to provide a small display device. Alternatively, it is an object of the present invention to provide a display device having high luminance. Alternatively, it is an object of the present invention to provide a display device with low power consumption. Alternatively, it is an object of the present invention to provide a display device having a high aperture ratio. Alternatively, it is an object of the present invention to provide a display device with low manufacturing cost.

One aspect of the present invention is a liquid crystal display device in which one pixel is provided with three or more liquid crystal elements and the level of voltage which is applied is varied between the liquid crystal elements. In order to vary the level of the voltage which is applied to the liquid crystal elements, an element which divides the applied voltage is provided. Alternatively, an element which converts current into voltage or an element which converts voltage into current is provided. For example, a capacitor, a resistor, a non-linear element, a switch, a transistor, a diode-connected transistor, a diode (e.g., a PIN diode, a PN diode, a Schottky diode, an MIM diode, or an MIS diode), an inductor, or the like is provided.

Note that various types of switches can be used as a switch. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

An example of a mechanical switch is a switch formed using MEMS (micro electro mechanical system) technology, such as a digital micromirror device (DMD). Such a switch includes an electrode which can be moved mechanically, and operates by controlling connection and non-connection based on movement of the electrode.

In the case of using a transistor as a switch, polarity (a conductivity type) of the transistor is not particularly limited because it operates just as a switch. However, a transistor of polarity with smaller off-current is preferably used when off-current is to be suppressed. Examples of a transistor with smaller off-current are a transistor provided with an LDD region, a transistor with a multi-gate structure, and the like. In addition, it is preferable that an N-channel transistor be used when a potential of a source terminal is closer to a potential of a low-potential-side power supply (e.g., $V_{ss}$, GND, or 0 V), while a P-channel transistor be used when the potential of the source terminal is closer to a potential of a high-potential-side power supply (e.g., $V_{dd}$). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor, so that the transistor can be more precisely operated as a switch. This is also because the transistor does not often perform a source follower operation, so that reduction in output voltage does not often occur.

Note that a CMOS switch may be employed as a switch by using both N-channel and P-channel transistors. When a CMOS switch is employed, the switch can more precisely operate as a switch because current can flow when either the P-channel transistor or the N-channel transistor is turned on. For example, voltage can be appropriately output regardless of whether voltage of an input signal to the switch is high or low. In addition, since a voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not have a terminal for controlling conduction in some cases. Therefore, when a diode is used as a switch, the number of wirings for controlling terminals can be reduced compared to the case of using a transistor as a switch.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where A and B are electrically connected, one or more elements which enable electric connection between A and B (e.g., a switch, a transistor, a capacitor, an inductor, a resistor, and/or a diode) may be provided between A and B. In addition, in the case where A and B are functionally connected, one or more circuits which enable functional connection between A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a boosting circuit or a voltage lower control circuit) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

Note that when it is explicitly described that "A and B are directly connected", the case where A and B are directly connected (i.e., the case where A and B are connected without interposing another element or another circuit therebetween) and the case where A and B are electrically connected (i.e., the case where A and B are connected by interposing another element or another circuit therebetween) are included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can use various types and can include various elements. For example, a display medium, whose contrast, luminance, reflectivity, transmittivity, or the like changes by an electromagnetic action, such as an EL element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used as a display element, a display device, a light-emitting element, or a light-emitting device. Note that display devices using an EL element include an EL display; display devices using an electron emitter include a field emission display (FED), an SED-type flat panel display (SED: surface-conduction electron-emitter display), and the like; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoresis element include electronic paper.

Note that an EL element is an element having an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low molecular material, a layer including a low-molecular material and a high-molecular material, or the like can be used. Note that the present invention is not limited to this, and various EL elements can be used as an EL element.

Note that an electron emitter is an element in which electrons are extracted by high electric field concentration on a pointed cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, an HEED type, an EL type, a porous silicon type, a surface-conduction (SED) type, or the like can be used. However, the present invention is not limited to this, and various elements can be used as an electron emitter.

Note that a liquid crystal element is an element which controls transmission or non-transmission of light by optical modulation action of a liquid crystal and includes a pair of electrodes and a liquid crystal. Note that optical modulation action of a liquid crystal is controlled by an electric filed applied to the liquid crystal (including a horizontal electric field, a vertical electric field, and an oblique electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an CCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and the like. Note that the present invention is not limited to this, and various liquid crystal elements and driving methods can be used as a liquid crystal element and a driving method thereof.

Note that electronic paper corresponds to a device which displays an image by molecules which utilize optical anisotropy, dye molecular orientation, or the like; a device which displays an image by particles which utilize electrophoresis, particle movement, particle rotation, phase change, or the like; a device which displays an image by moving one end of a film; a device which displays an image by using coloring properties or phase change of molecules; a device which displays an image by using optical absorption by molecules; and a device which displays an image by using self-light emission by bonding electrons and holes. For example, the following can be used for a display method of electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to this, and various electronic paper and display methods can be used as electronic paper and a display method thereof. Here, when microcapsule electrophoresis is used, defects of electrophoresis, which are aggregation and precipitation of phoresis particles, can be solved. Electro liquid powder has advantages such as high-speed response, high reflectivity, wide viewing angle, low power consumption, and memory properties.

Note that a plasma display panel has a structure in which a substrate having a surface provided with an electrode and a substrate having a surface provided with an electrode and a minute groove in which a phosphor layer is formed face each other at a narrow interval and a rare gas is sealed therein. Note that display can be performed by applying voltage between the electrodes to generate an ultraviolet ray so that a phosphor emits light. Note that the plasma display panel may be a DC-type PDP or an AC-type PDP. As a driving method of the plasma display panel, AWS (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, or the like can be used. Note that the present invention is not limited to this, and various driving methods can be used as a driving method of a plasma display panel.

Note that electroluminescence, a cold cathode fluorescent lamp, a hot cathode fluorescent lamp, an LED, a laser light source, a mercury lamp, or the like can be used as a light source of a display device in which a light source is necessary, such as a liquid crystal display (a transmissive liquid crystal display, a transflective liquid crystal display, a reflective liquid crystal display, a direct-view liquid crystal display, or a projection liquid crystal display), a display device using a grating light valve (GLV), or a display device using a digital micromirror device (DMD). Note that the present invention is not limited to this, and various light sources can be used as a light source.

Note that various types of transistors can be used as a transistor, without limiting to a certain type. For example, a thin film transistor (TFT) including a non-single crystal semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Accordingly, transmission of light in a display element can be controlled by using the transistor formed using the light-transmitting substrate. Alternatively, part of a film which forms the transistor can transmit light because the film thickness of the transistor is thin. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. At this time, crystallinity can be improved by just performing heat treatment without performing laser irradiation. Accordingly, a gate driver circuit (e.g., a scan line driver circuit) and part of a source driver circuit (e.g., an analog switch) can be formed over the same substrate. In addition, in the case of not performing laser irradiation for crystallization, crystallinity unevenness of silicon can be suppressed. Therefore, a clear image can be displayed.

Note that polycrystalline silicon and microcrystalline silicon can be formed without using a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region, crystallinity of which is improved, is small, manufacturing steps can be decreased, throughput can be increased, and manufacturing cost can be reduced. Since the number of necessary manufacturing apparatus is small, manufacturing cost can be reduced.

A transistor can be formed by using a semiconductor substrate, an SOI substrate, or the like. Thus, a transistor with few variations in characteristics, sizes, shapes, or the like, with high current supply capacity, and with a small size can be formed. When such a transistor is used, power consumption of a circuit can be reduced or a circuit can be highly integrated.

A. transistor including a compound semiconductor or an oxide semiconductor such as ZnO, a-InGaZnO, SiGe, GaAs, IZO, ITO, or SnO, a thin film transistor obtained by thinning such a compound semiconductor or a oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can be used. Accordingly, a transistor can be formed at room temperature, can be formed at a low vacuum, or can be formed using a large substrate.

In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

Further, transistors with various structures can be used. For example, a MOS transistor, a junction transistor, a bipolar transistor, or the like can be used as a transistor. When a MOS transistor is used, the size of the transistor can be reduced. Thus, a large number of transistors can be mounted. When a bipolar transistor is used, large current can flow. Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

Note that a transistor can be formed using various types of substrates without limiting to a certain type. For example, a single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate. Further alternatively, the transistor may be formed using one substrate, and then, the transistor may be transferred to another substrate. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Further alternatively, the transistor may be formed using one substrate and the substrate may be thinned by polishing. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to be polished. Alternatively, a skin (e.g., epidermis or corium) or hypodermal tissue of an animal such as a human being can be used as a substrate to be polished. When such a substrate is used, a transistor with excellent properties or a transistor with low power consumption can be formed, a device with high durability, high heat resistance can be provided, or reduction in weight or thickness can be achieved.

Note that a structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced or the withstand voltage of the transistor can be increased to improve reliability. Alternatively, with the multi-gate structure, drain-source current does not fluctuate very much even if drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit or a current mirror circuit having excellent properties can be realized. As another example, a structure where gate electrodes are formed above and below a channel may be used. When the structure where gate electrodes are formed above and below the channel is used, a channel region is increased, so that the amount of current flowing therethrough can be increased or a depletion layer can be easily formed to decrease subthreshold swing. When the gate electrodes are formed above and below the channel, a structure where a plurality of transistors are connected in parallel is provided.

Alternatively, a structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be used. Further alternatively, a source electrode or a drain electrode may overlap with a channel region (or part of it). When the structure where the source electrode or the drain electrode may overlap with the channel region (or part of it) is used, the case can be prevented in which electric charges are accumulated in part of the channel region, which would result in an unstable operation. Further alternatively, an LDD region may be provided. When the LDD region is provided, off-current can be reduced or the withstand voltage of the transistor can be increased to improve reliability. Further, when the LDD region is provided, drain-source current does not fluctuate very much even if drain-source voltage fluctuates when the transistor operates in the saturation region, so that a flat slope of voltage-current characteristics can be obtained.

Note that various types of transistors can be used as a transistor and the transistor can be formed using various types of substrates. Accordingly, all the circuits that are necessary to realize a predetermined function may be formed using the same substrate. For example, all the circuits that are necessary to realize the predetermined function may be formed using a glass substrate, a plastic substrate, a single-crystal semiconductor substrate, an SOI substrate, or any other substrate. When all the circuits that are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function may be formed using one substrate and another part of the circuits which are necessary to realize the predetermined function may be formed using another substrate. That is, not all the circuits that are necessary to realize the predetermined function are required to be formed using the same substrate. For example, part of the circuits which are necessary to realize the predetermined function may be formed by transistors using a glass substrate and another part of the circuits which are necessary to realize the predetermined function may be formed using a single-crystal semiconductor substrate, so that an IC chip formed by a transistor using the single-crystal semiconductor substrate may be connected to the glass substrate by COG (chip on glass) and the IC chip may be provided over the glass substrate. Alternatively, the IC chip may be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. Further alternatively, when circuits with high driving voltage and high driving frequency, which consume large power, are formed using a single-crystal semiconductor substrate instead of forming such circuits using the same substrate and an IC chip formed by the circuit is used, increase in power consumption can be prevented.

Note that one pixel corresponds to one element whose brightness can be controlled. Therefore, for example, one pixel corresponds to one color element and brightness is expressed with the one color element. Accordingly, in the case of a color display device having color elements of R (red), G (green), and B (blue), a minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) may be used by adding white. Alternatively, one or more colors of yellow, cyan, magenta emerald green, vermilion, and the like may be added to RGB. Further alternatively, a color similar to at least one of R, G, and B may be added to RGB. For example, R, G, B1, and B2 may be used. Although both B1 and B2 are blue, they have slightly different frequency. Similarly, R1, R2, G, and B may be used. When such color elements are used, display which is closer to the real object can be performed and power consumption can be reduced. As another example, in the case of controlling brightness of one color element by using a plurality of regions, one region may correspond to one pixel. Therefore, for example, in the case of performing area ratio gray scale display or the case of including a subpixel, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. Further alternatively, in the case where brightness is controlled in a plurality of regions in each color element, regions which contribute to display have different area dimensions depending on pixels in some cases. Further alternatively, in the plurality of regions which control brightness in each color element, signals supplied to each of the plurality of regions may be slightly varied to widen a viewing angle. That is, potentials of pixel electrodes included in the plurality of regions provided in each color element may be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Meanwhile, explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included therein: the case where the pixels are arranged in stripes and the case where dots of the three color elements are arranged in a delta pattern. In addition, the case is also included therein in which dots of the three color elements are provided in Bayer arrangement. Note that the color elements are not limited to three colors, and color elements of more than three colors may be used. For example, RGBW (W corresponds to white), RGB plus one or more of yellow, cyan, and magenta, or the like may be used. Further, the sizes of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few number of manufacturing steps, manufacturing cost can be reduced or yield can be improved. Further, since the size of the element is small, the aperture ratio can be improved, so that power consumption can be reduced or high luminance can be achieved.

Note that as a method other than an active matrix method, a passive matrix method in which an active element (a non-linear element) is not used can also be used. Since an active element (a non-linear element) is not used, manufacturing steps is few, so that manufacturing cost can be reduced or yield can be improved. Further, since an active element (a non-linear element) is not used, the aperture ratio can be improved, so that power consumption can be reduced or high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, in this document, a region functioning as a source and a drain may not be called the source or the drain. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be called a drain region.

Note that a transistor may be an element having at least three terminals of a base, an emitter, and a collector. In this case, one of the emitter and the collector may be similarly referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region or the source region (or the drain region) with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may also be referred to as a gate electrode. Similarly, a portion (a region, a conductive film, a wiring, or the like) which is formed using the same material as a gate wiring, forms the same island as the gate wiring, and is connected to the gate wiring may also be referred to as a gate wiring. In a strict detect, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

Note that in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, it may be referred to as a gate wiring, and it may also be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive film which connects the gate electrode and the gate wiring and is formed using a material which is different from that of the gate electrode or the gate wiring may also be referred to as either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is referred to as a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer which is formed using a material different from that of a source region and is electrically connected to the source region. However, there is the case where a source electrode and a source region are collectively referred to as a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be referred to as a source electrode. Further, a portion which overlaps with a source region may be referred to as a source electrode. Similarly, a portion (a region, a conductive film, a wiring, or the like) which is formed using the same material as a source wiring, forms the same island as the source wiring, and is connected to the source wiring may also be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film which connects a source electrode and a source wiring and is formed using a material which is different from that of the source electrode or the source wiring may be referred to as either a source electrode or a source wiring.

Note that a source terminal corresponds to part of a source region, a source electrode, or a portion (a region, a conductive film, a wiring, or the like) which is electrically connected to the source electrode.

Note that when a wiring is referred to as a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that the same can be said for a drain.

Note that a semiconductor device corresponds to a device having a circuit including a semiconductor element (e.g., a transistor, a diode, or a thyristor). The semiconductor device may also include all devices that can function by utilizing semiconductor characteristics. In addition, the semiconductor device corresponds to a device having a semiconductor material.

Note that a display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element, a digital micromirror device (DMD), or the like. Note that the present invention is not limited to this.

Note that a display device corresponds to a device having a display element. The display device may include a plurality of pixels each having a display element. Note that that the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

Note that a light-emitting device corresponds to a device having a light-emitting element and the like. In the case of including a light-emitting element as a display element, the light-emitting device is one of specific examples of a display device.

Note that a reflective device corresponds to a device having a light-reflective element, a light diffraction element, a light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed in direct contact with A", it includes not the case where another object is interposed between A and B but the case where B is formed in direct contact with A.

Note that the same can be said when it is described that B is formed below or under A.

Note that when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

In accordance with the present invention, performance as a display device can be maintained and viewing angle characteristics can be improved compared to that of a conventional display device. Alternatively, in accordance with the present invention, a highly reliable display device can be provided. Alternatively, in accordance with the present invention, a display device having high contrast can be provided. Alternatively, in accordance with the present invention, a lightweight display device can be provided. Alternatively, in accordance with the present invention, a small display device can be provided. Alternatively, in accordance with the present invention, a display device having high luminance can be provided. Alternatively, in accordance with the present invention, a display device with low power consumption can be provided. Alternatively, in accordance with the present invention, a display device having a high aperture ratio can be provided. Alternatively, in accordance with the present invention, a display device with low manufacturing cost can be obtained.

BRIEF DESCRIPTION OF THE DRAWINGS

In the accompanying drawings:

FIGS. 30A to 30T each illustrate a divider element included in a pixel circuit of a display device of the present invention;

FIGS. 39A and 3913 each illustrate a pixel circuit of a display device of the present invention;

FIGS. 45A and 4513 each illustrate a pixel circuit of a display device of the present invention;

FIGS. 46A and 4613 each illustrate a pixel circuit of a display device of the present invention;

FIGS. 51A to 51G illustrate the present invention;

FIGS. 79A and 79B each illustrate the present invention;

FIGS. 89A and 89B each illustrate the present invention;

FIGS. 90A and 90B each illustrate the present invention;

DETAILED DESCRIPTION OF THE INVENTION

Figure 1A:
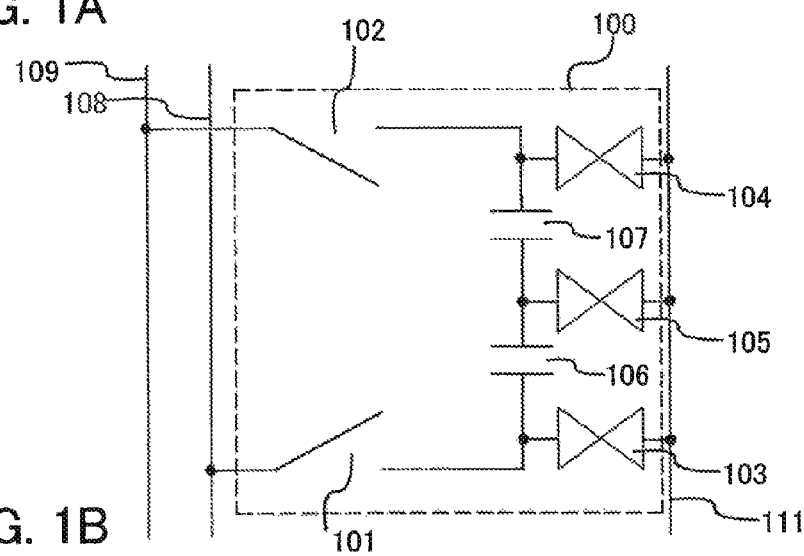
FIGS. 1A to 1C each illustrate a pixel circuit of a display device of the present invention.

Hereinafter, the present invention will be described by way of embodiment modes with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the description of the embodiment modes of the present invention. Note that in structures of the present invention described hereinafter, like portions or portions having similar functions are denoted by common reference numerals in different drawings, and detailed description thereof is omitted.

Hereinafter, embodiment modes will be described with reference to various drawings. In that case, in embodiment mode, the contents (or may be part of the contents) described in each drawing can be freely applied to, combined with, or replaced with the contents (or may be part of the contents) described in another drawing. Further, even more drawings can be formed when each part in a drawing described in embodiment mode is combined with another part in the above-described drawing.

Similarly, the contents (or may be part of the contents) described in each drawing of embodiment mode or a plurality of embodiment modes can be freely applied to, combined with, or replaced with the contents (or may be part of the contents) described in a drawing of another embodiment mode or a plurality of other embodiment modes. Further, even more drawings can be formed when each part in the drawing of embodiment mode or a plurality of embodiment modes is combined with part of another embodiment mode or a plurality of other embodiment modes.

Note that the contents (or may be part of the contents) described in embodiment mode will show an example of an embodied case of other contents (or may be part of the contents) described in the embodiment mode, an example of slight transformation thereof, an example of partial modification thereof, an example of improvement thereof, an example of detailed description thereof, an application example thereof, an example of related part thereof, or the like. Therefore, the contents (or may be part of the contents) described in embodiment mode can be freely applied to, combined with, or replaced with other contents (or may be part of the contents) described in the embodiment mode.

Note that the contents (or may be part of the contents) described in embodiment mode or a plurality of embodiment modes will show an example of an embodied case of the contents (or may be part of the contents) described in the embodiment mode or the plurality of embodiment modes, an example of slight transformation thereof, an example of partial modification thereof, an example of improvement thereof, an example of detailed description thereof, an application example thereof, an example of related part thereof, or the like. Therefore, the contents (or may be part of the contents) described in another embodiment mode can be freely applied to, combined with, or replaced with other contents (or may be part of the contents) described in another embodiment mode or a plurality of other embodiment modes.

(Embodiment Mode 1)

In this embodiment mode, structures and operations of a pixel circuit included in a liquid crystal display device of the present invention are described with reference to the drawings. The pixel circuit of the liquid crystal display device of the present invention has a structure in which one pixel is provided with a plurality of liquid crystal elements and voltage which is applied is varied between the liquid crystal elements. Specifically, one of or both a capacitor and a resistor connected to a liquid crystal element are provided to vary voltage applied to the liquid crystal element.

Note that a display element is not limited to a liquid crystal element, and various display elements (e.g., a light-emitting element (an EL element (e.g., an EL element including organic and inorganic materials, an organic EL element, or an inorganic EL element) or an electron emitter), an electrophoresis element, and the like) can be used.

There are various operation modes of liquid crystals to which this embodiment mode can be applied. For example, there are a TN (twisted nematic) mode, an IPS (in-plane-switching) mode, an FFS (fringe field switching) mode, an MVA (multi-domain vertical alignment) mode, a PVA (patterned vertical alignment) mode, a CPA (continuous pinwheel alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, and the like. Note that the present invention is not limited to this. Note that a liquid crystal to which a CPA mode is applied is often referred to as an ASV (advanced super view) liquid crystal.

FIG. 1A shows an example of the structure of a pixel included in a liquid crystal display device of the present invention. A pixel 100 includes a first switch 101, a second switch 102, a first liquid crystal element 103, a second liquid crystal element 104, a third liquid crystal element 105, a first capacitor 106, and a second capacitor 107.

A first wiring 108 is connected to a first electrode of the first liquid crystal element 103 and a first electrode (also referred to as a first terminal) of the first capacitor 106 through the first switch 101. A second wiring 109 is connected to a first electrode of the second liquid crystal element 104 and a first electrode of the second capacitor 107 through the second switch 102. A second electrode (also referred to as a second terminal) of the first capacitor 106 is connected to a second electrode of the second capacitor 107 and a first electrode of the third liquid crystal element 105.

Second electrodes of the first liquid crystal element 103, the second liquid crystal element 104, and the third liquid crystal element 105 are connected to a common electrode 111.

Each of the first wiring 108 and the second wiring 109 functions as a signal line. Therefore, an image signal is usually supplied to each of the first wiring 108 and the second wiring 109. Note that the present invention is not limited to this. A certain signal may be supplied regardless of an image.

Each of the first switch 101 and the second switch 102 is not particularly limited to a certain type as long as it functions as a switch. For example, a transistor can be used. The case where a transistor is used as each of the first switch 101 and the second switch 102 is described below (see FIG. 1B). In the case of using a transistor, the transistor may be either a P-channel transistor or an N-channel transistor. For example, in an N-channel transistor, when gate-source voltage ($V_{gs}$) exceeds the threshold voltage (Vth), a source and a drain are conducted. Note that drain-source voltage of the transistor is denoted by $V_{ds}$.

Figure 1B:
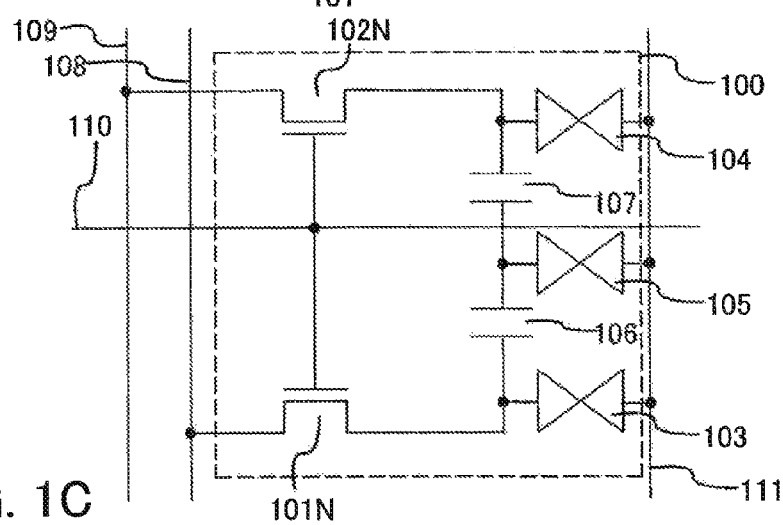
Figure 1C:
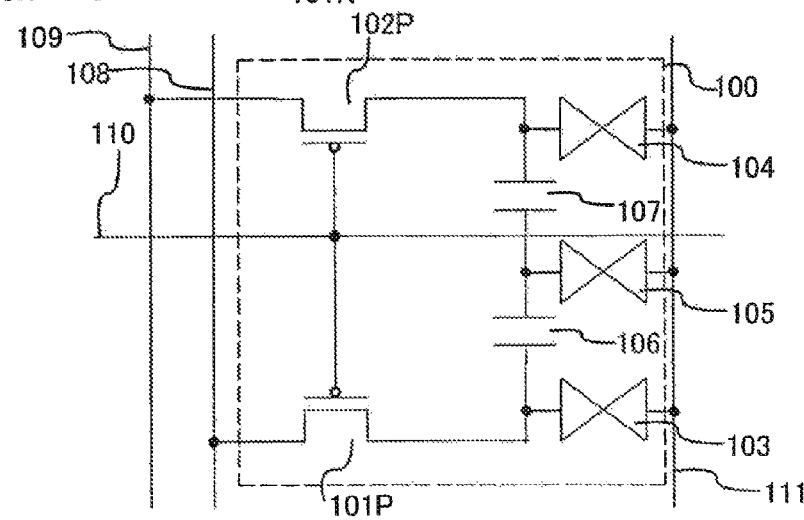

FIG. 1B shows the case where an N-channel transistor is used as a switch, and FIG. 1C shows the case where a P-channel transistor is used as a switch. In FIGS. 1B and 1C, gates of a first switch 101N (or a first switch 101P) and a second switch 102N (or a second switch 102P) are connected to a third wiring 110. The third wiring 110 functions as a scan line.

Figure 49:
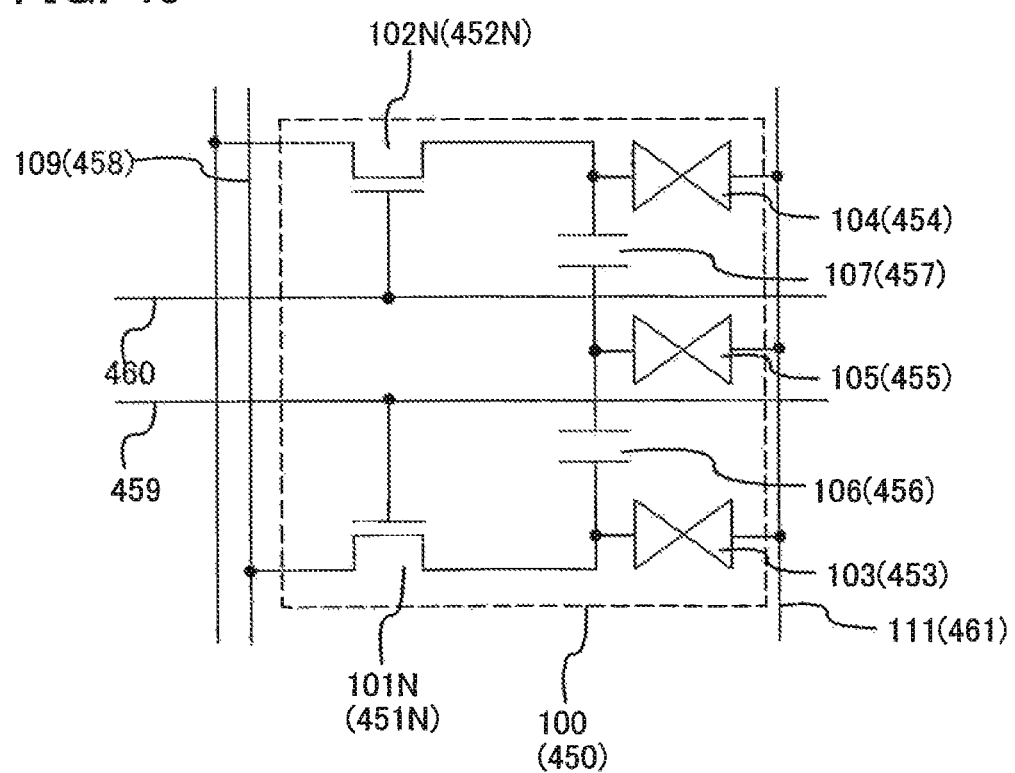
FIG. 49 illustrates a pixel circuit of a display device of the present invention.

Note that the number of scan lines may be two, as shown in FIG. 49. A circuit shown in FIG. 49 is similar to a circuit where two signal lines are provided in a circuit in FIG. 8B.

Although the case where a P-channel transistor is used as a switch is only shown in FIG. 1C, the present invention is not limited to this. In other drawings, at least one transistor can be replaced with a P-channel transistor.

Note that a switch is not limited to a transistor. Various elements such as diodes can be used as a switch.

A video signal is input to the first wiring 108 and the second wiring 109. A scan signal is input to the third wiring 110. The scan signal is an H-level or L-level digital voltage signal. In the case where the first switch 101 is an N-channel transistor, an H level of the scan signal is a potential which can turn on the first switch 101 and the second switch 102, and an L level of the scan signal is a potential which can turn off the first switch 101 and the second switch 102. Alternatively, in the case where the first switch 101 and the second switch 102 are P-channel transistors, an H level of the scan signal is a potential which can turn off the first switch 101 and the second switch 102, and an L level of the scan signal is a potential which can turn on the first switch 101 and the second switch 102. Note that the video signal has analog voltage. Note that the present invention is not limited to this, the video signal may have digital voltage. Alternatively, the video signal may be current, which may be either analog or digital. It is preferable that a potential of the video signal be lower than the H level of the scan signal and higher than the L level of the scan signal.

Operations of the pixel 100 are described by dividing the whole operations into the case where the first switch 101 and the second switch 102 are on and the case where the first switch 101 and the second switch 102 are off.

In the case where the first switch 101 is on, the first wiring 108 is electrically connected to the first electrode (a pixel electrode) of the first liquid crystal element 103 and the first electrode of the first capacitor 106. In the case where the second switch 102 is on, the second wiring 109 is electrically connected to the first electrode (a pixel electrode) of the second liquid crystal element 104 and the first electrode of the second capacitor 107. Therefore, a video signal is input from the first wiring 108 to the first electrode (the pixel electrode) of the first liquid crystal element 103 and the first electrode of the first capacitor 106. Alternatively, a video signal is input from the second wiring 109 to the first electrode (the pixel electrode) of the second liquid crystal element 104 and the first electrode of the second capacitor 107. Therefore, a potential $V_{103}$ of a signal input to the first liquid crystal element 103 is almost equal to a potential input from the first wiring 108, and a potential $V_{104}$ of a signal input to the second liquid crystal element 104 is almost equal to a potential input from the second wiring 109. In addition, a potential $V_{105}$ of the first electrode of the third liquid crystal element 105 has a value which is divided by voltage of the first capacitor 106 and voltage of the second capacitor 107. Here, a capacitance value of the first capacitor 106 is denoted by $C_{106}$ and a capacitance value of the second capacitor 107 is denoted by $C_{107}$. Then, $V_{105}=\Delta V \times C_{107}/(C_{106}+C_{107})+V_{103}$ is satisfied, where $\Delta V=V_{104}-V_{103}$ and no initial charge is accumulated in each capacitor. Here, when the values of $C_{106}$ and $C_{107}$ are the same, $V_{105}$ is half the sum of $V_{103}$ and $V_{104}$. Here, when a potential of the common electrode is 0, voltage applied to the first liquid crystal element is represented by $V_{103}$, voltage applied to the second liquid crystal element is represented by $V_{104}$, and voltage applied to the third liquid crystal element is represented by $V_{105}=(V_{103}+V_{104})/2$. When a potential of the signal input from the first wiring 108 and a potential of the signal input from the second wiring 109 are varied, voltage which is applied is varied between the liquid crystal elements can be varied, so that the liquid crystal elements can be aligned differently. Therefore, it is preferable that the potential of the signal input from the first wiring 108 and the potential of the signal input from the second wiring 109 be different from each other.

When two signals having different potentials are supplied and capacitors are used in this manner, voltage is divided in a pixel, so that intermediate voltage (third voltage) of the two signals can be produced. Then, when the third voltage is applied to the third liquid crystal element 105, liquid crystals can be easily controlled. Further, the third voltage is voltage between voltage applied to the first liquid crystal element 103 and voltage applied to the second liquid crystal element 104. Therefore, even when any gray scale is to be displayed, an adequate gray scale can be displayed. In addition, even when polarity of the image signal is positive (i.e., the image signal is higher than that of the common electrode) or polarity of the image signal is negative (i.e., the image signal is lower than that of the common electrode), an adequate gray scale can be displayed.

In addition, increase in number of scan lines, signal lines, transistors, and the like is suppressed and the third voltage is produced, so that the third liquid crystal element 105 can be controlled. Thus, the aperture ratio can be improved and power consumption can be reduced. In addition, since pixels can be arranged having a margin of layout, a defect such as short circuit which would occur due to dust or the like generated in manufacturing steps can be reduced, so that yield can be improved. Accordingly, manufacturing cost can be reduced. Further, since the third liquid crystal element 105 can be controlled without additionally providing a wiring functioning as a signal line for controlling the third liquid crystal element 105, the number of connections between a glass substrate and an external driver circuit is not increased. Accordingly, high reliability can be maintained.

Note that it is preferable that the capacitance value of the first capacitor 106 and the capacitance value of the second capacitor 107 be almost equal. When the capacitance values of the two capacitors are almost equal, the divided potential has an intermediate value of a potential supplied to the two capacitors. If there is difference in the capacitance values, the potential is biased on one of potentials, so that the liquid crystal elements cannot be controlled uniformly. Therefore, it is preferable that the capacitance value of the first capacitor 106 and the capacitance value of the second capacitor 107 be almost equal. Note that the present invention is not limited to this.

In the case where the first switch 101 is off, the first wiring 108 is electrically disconnected to the first electrode (the pixel electrode) of the first liquid crystal element 103 and the first electrode of the first capacitor 106. In the case where the second switch 102 is off, the second wiring 109 is electrically disconnected to the first electrode (the pixel electrode) of the second liquid crystal element 104 and the first electrode of the second capacitor 107. Therefore, each of the first electrode of the first liquid crystal element 103, the first electrode of the first capacitor 106, the first electrode of the second liquid crystal element 104, and the first electrode of the second capacitor 107 is set in a floating state. In addition, the third liquid crystal element 105 is connected to the first liquid crystal element 103 through the first capacitor 106. However, because of principle of conservation of charge, electric charge conserved in the third liquid crystal element 105 does not leak toward the first liquid crystal element 103. Similarly, the third liquid crystal element 105 is connected to the second liquid crystal element 104 through the second capacitor 107. However, because of principle of conservation of charge, the electric charge conserved in the third liquid crystal element 105 does not leak toward the second liquid crystal element 104. Therefore, a potential of a signal which is input just before is held in each of the first to third liquid crystal elements.

Note that each of the first liquid crystal element 103, the second liquid crystal element 104, and the third liquid crystal element 105 has transmittivity in accordance with a video signal.

As described above, when liquid crystal elements are aligned differently, the viewing angle can be widened.

Note that each of the liquid crystal elements may be divided into a plurality of elements. For example, FIGS. 11A and 11B each show the case where the third liquid crystal element 105 is divided into two elements of a third liquid crystal element 105a and a fourth liquid crystal element 105b. Similarly, each of the first liquid crystal element 103 and the second liquid crystal element 104 may be divided into a plurality of elements. Note that the same can be said for drawings other than FIGS. 1A to 1C.

Note that in FIGS. 1A to 1C and FIGS. 11A and 11B, when the first switch 101 and the second switch 102 are transistors, gates of the switches are connected to the third wiring 110. However, the present invention is not limited to this. The gate of the first switch 101 and the gate of the second switch 102 may be connected to different wirings (see FIG. 49). The same can be said for drawings other than FIGS. 1A to 1C and FIGS. 11A and 11B.

Note that although the first switch 101 and the second switch 102 are connected to different signal lines in FIGS. 1A to 1C and FIGS. 11A and 11B, the present invention is not limited to this. As shown in FIGS. 8A and 8B and FIGS. 17A and 17B, the first switch 101 and the second switch 102 may be connected to the same wiring. The same can be said for drawings other than FIGS. 1A to 1C and FIGS. 11A and 11B.

Note that although a liquid crystal element exhibits voltage holding properties, the retention rate thereof is not 100%. Therefore, in FIGS. 1A to 1C and FIGS. 11A and 11B, voltage may be held by providing a capacitor serving as a storage capacitor (hereinafter simply referred to as a storage capacitor) for each of the liquid crystal elements. Storage capacitors may be provided for all the liquid crystal elements, or may be provided for only part of the liquid crystal elements. Storage capacitors are provided between the respective pixel electrodes and a capacitor line connected to the respective pixel electrodes. The storage capacitors may be connected to different capacitor lines, or may be connected to the same capacitor line. Alternatively, part of the storage capacitors may be connected to the same capacitor line and other storage capacitors may be connected to different storage capacitor lines. In addition, a capacitor line may be shared with another pixel. For example, a capacitor line can be shared with a pixel in the previous row or a pixel in the next row. When a capacitor line is shared between different pixels, the number of wirings can be reduced and the aperture ratio can be improved. Alternatively, a capacitor line may be shared with a scan line. When a capacitor line is shared with a scan line, the number of wirings can be reduced and the aperture ratio can be improved. When a capacitor line is shared with a scan line, a scan line of the pixel in the adjacent row (the pixel in the previous row) is preferably used. This is because selection of signals has been already finished in an (i−1)th row (the previous row) when the pixel in an i-th row is selected. Note that in the case where liquid crystals are IPS mode, an FFS mode, or the like, the common electrode is provided over a substrate over which a transistor is formed. Therefore, a capacitor line is shared with the common electrode. When a capacitor line is shared with the common electrode, the number of wirings can be reduced and the aperture ratio can be improved. Note that the storage capacitor may be divided into a plurality of elements, in a similar manner that in the liquid crystal elements in FIGS. 11A and 11B. The same can be said for drawings other than FIGS. 1A to 1C and FIGS. 11A and 11B.

Figure 31:
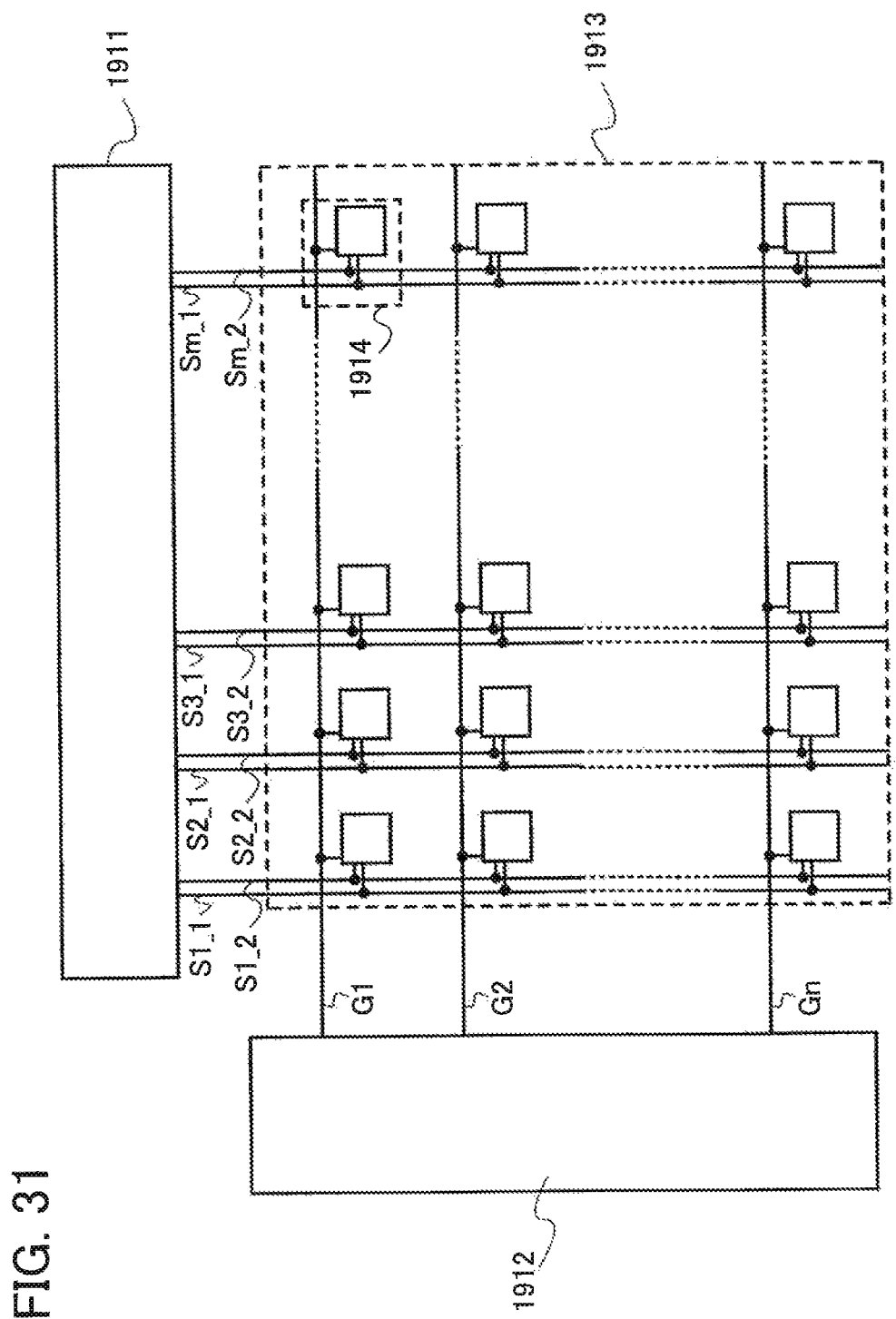
FIG. 31 illustrates a display device of the present invention.

Next, a display device including the pixel 100 in FIGS. 1A to 1C is described with reference to FIG. 31.

The display device includes a signal line driver circuit 1911, a scan line driver circuit 1912, and a pixel portion 1913. The pixel portion 1913 includes first wirings S1_1 to $S_{m}\_1$ and second wirings S1_2 to $S_{m}\_2$ which extend from the signal line driver circuit 1911 in a column direction; third wirings G1 to $G_n$ which extend from the scan line driver circuit 1912 in a row direction; and pixels 1914 which are arranged in matrix. The first and second wirings function as signal lines. The third wirings function as scan lines. In addition, each of the pixels 1914 is connected to a first wiring $S_j\_1$ (any one of the signal lines S1_1 to $S_{m}\_1$), a second wiring $S_j\_2$ (any one of the signal lines S1_2 to $S_{m}\_2$), and a third wiring $G_i$ (any one of the scan lines G1 to $G_n$).

Note that the first wiring Sj_1, the second wiring Sj_2, and the third scan line Gi correspond to the first wiring 108, the second wiring 109, the third wiring 110 in FIGS. 1A to 1C, respectively.

When a row of pixels to be operated is selected by a signal output from the scan line driver circuit 1912, pixels in the same row are selected at the same time. A video signal output from the signal line driver circuit 1911 is written to the pixels in the selected row. At this time, a potential in accordance with luminance data of each pixel is supplied to the first wirings S1_1 to $S_{m}\_1$ and second wirings S1_2 to $S_{m}\_2$.

For example, when a data writing period in the i-th row is finished, writing of a signal to pixels in an (i+1)th row is performed. Then, a pixel which finishes the data writing period in the i-th row has transmittivity in accordance with the signal.

Note that a plurality of signal line driver circuits 1911 or a plurality of scan line driver circuits 1912 may be provided. For example, the first wiring $S_j\_1$ (any one of the signal lines S1_1 to $S_{m}\_1$) may be driven by a first signal line driver circuit and the second wiring $S_j\_2$ (any one of the signal lines S1_2 to $S_{m}\_2$) may be driven by a second signal line driver circuit. In that case, the first signal line driver circuit and the second signal line driver circuit may be provided above and below the pixel portion 1913. For example, the first signal line driver circuit may be provided on one side over a main surface of a substrate, the second signal line driver circuit may be provided on an opposite side, and the pixel portion 1913 may be provided in a region sandwitched by the two signal line driver circuits.

Note that in order to suppress display unevenness such as deterioration in a liquid crystal material and flickers, inversion driving is preferably used in which driving is performed with polarity of voltage which is applied to a pixel electrode inverted every certain period with respect to a potential (a common potential) of a common electrode in liquid crystal capacitance. In this specification, when a potential of a pixel electrode is higher than a potential of a common electrode, description that "positive voltage is applied to liquid crystal capacitance" is used, and when the potential of the common electrode is higher than the potential of the pixel electrode, negative voltage is applied to the liquid crystal capacitance. In addition, an image signal which is input from a signal line when the positive voltage is applied to the liquid crystal capacitance is referred to as a positive signal, and an image signal which is input from the signal line when the negative voltage is applied to the liquid crystal capacitance is referred to as a negative signal. Note that examples of inversion driving are frame inversion driving, source line inversion driving, gate line inversion driving, dot inversion driving, and the like.

Frame inversion driving is a driving method in which polarity of voltage which is input to liquid crystal capacitance is inverted every one frame period. Note that one frame period corresponds to a period for displaying an image for one screen. Although one frame period is not particularly limited to a certain period, it is at least preferable that one frame period be 1/60 second or less so that a person viewing an image does not perceive flickers.

Source line inversion driving is a driving method in which polarity of voltage which is applied to liquid crystal capacitance in pixels connected to the same signal line is inverted with respect to polarity of voltage which is applied to liquid crystal capacitance in pixels connected to an adjacent signal line, and further frame inversion is performed on each pixel. On the other hand, gate line inversion driving is a driving method in which polarity of voltage which is applied to liquid crystal capacitance in pixels connected to the same wiring functioning as a scan line is inverted with respect to polarity of voltage which is applied to liquid crystal capacitance in pixels connected to an adjacent scan line, and further frame inversion is performed on each pixel.

Dot inversion driving is a driving method in which polarity of voltage which is applied to liquid crystal capacitance between adjacent pixels is inverted, and source line inversion driving and gate line inversion driving are combined.

In the case where the above-described frame inversion driving, source line inversion driving, gate line inversion driving, dot inversion driving, or the like is employed, the width of a potential which is necessary for an image signal written to a signal line is twice as wide as the width of a potential in the case of not performing inversion driving. Therefore, in order to solve this problem, in the case of frame inversion driving or gate line inversion driving, common inversion driving in which a potential of a counter electrode is inverted is also employed in some cases.

Common inversion driving is a driving method in which a potential of a common electrode is changed in synchronization with inversion of polarity of voltage which is applied to liquid crystal capacitance. When common inversion driving is performed, the width of a potential which is necessary for an image signal written to a signal line can be decreased.

Further, one pixel may include a plurality of above-described pixel structures. For example, one pixel may include a plurality of subpixels and gray scales of one pixel may be displayed by using the plurality of subpixels. A signal line connected to different subpixels may be shared between the subpixels. Note that when different potentials are supplied to capacitor lines connected to the subpixels, different voltage can also be applied to liquid crystal capacitance in the subpixels. When difference in alignment of liquid crystals in the respective subpixels is utilized in this manner, the viewing angle can be further improved.

Note that although storage capacitors are not shown in FIGS. 1A to 1C, it is preferable to provide storage capacitors as described above. When storage capacitors are provided, adverse effects of leakage current of the liquid crystal elements can be reduced and potentials can be easily held. In addition, adverse effects of switching noise such as feed through can be reduced. Then, FIGS. 16A and 16B show the case where storage capacitors are provided for the circuits in FIGS. 1A and 1B as an example of the case of illustrating storage capacitors.

Figure 16A:
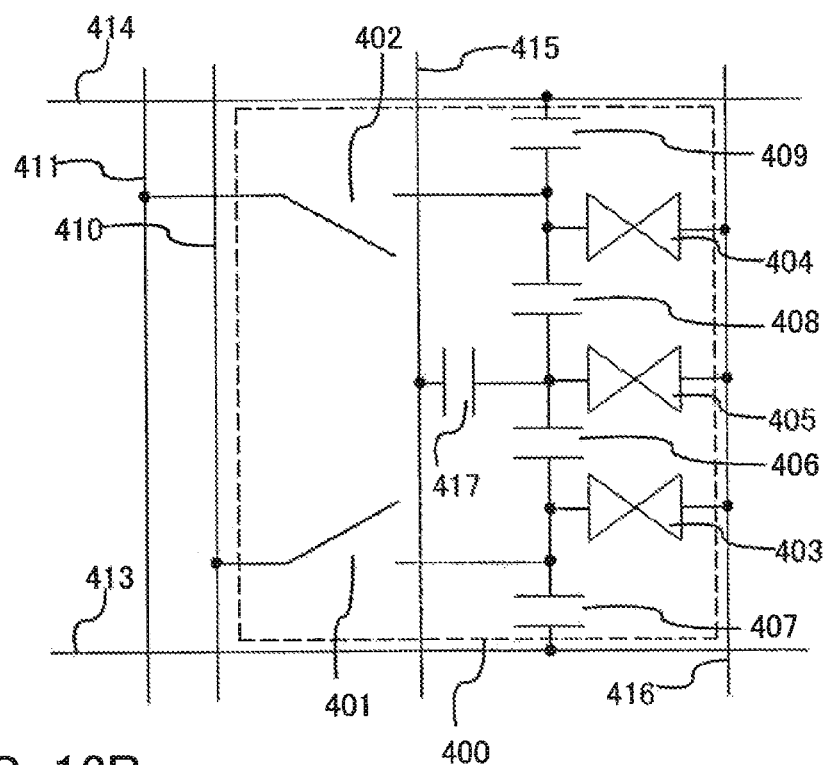
FIGS. 16A and 16B each illustrate a pixel circuit of a display device of the present invention.
Figure 16B:
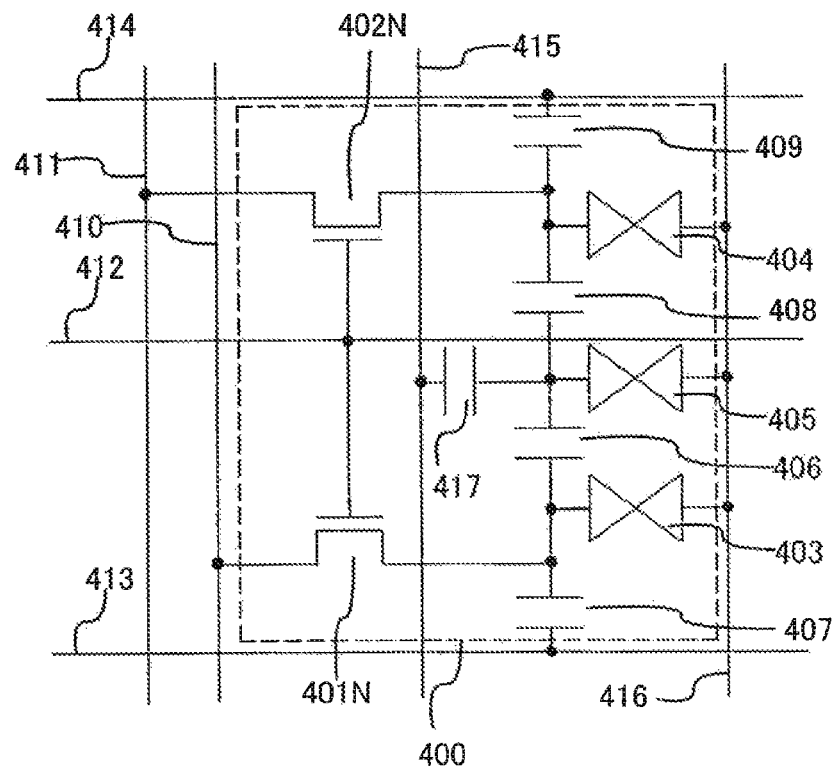

In FIG. 16A, a pixel 400 includes a first switch 401, a second switch 402, a first liquid crystal element 403, a second liquid crystal element 404, a third liquid crystal element 405, a first capacitor 406, a second capacitor 407, a third capacitor 408, a fourth capacitor 409, and a fifth capacitor 417.

A first wiring 410 is connected to a first electrode of the first liquid crystal element 403, a first electrode of the first capacitor 406, and a first electrode of the second capacitor 407 through the first switch 401. A second wiring 411 is connected to a first electrode of the second liquid crystal element 404, a first electrode of the third capacitor 408, and a first electrode of the fourth capacitor 409 through the second switch 402. Second electrodes of the first capacitor 406 and the third capacitor 408 are connected to a first electrode of the third liquid crystal element 405 and a first electrode of the fifth capacitor 417. A second electrode of the second capacitor 407 is connected to a fourth wiring 413. A second electrode of the fourth capacitor 409 is connected to a fifth wiring 414. A second electrode of the fifth capacitor 417 is connected to a sixth wiring 415.

Second electrodes of the first liquid crystal element 403, the second liquid crystal element 404, and the third liquid crystal element 405 are connected to a common electrode 416.

Each of the first wiring 410 and the second wiring 411 functions as a signal line. Therefore, an image signal is usually supplied to each of the first wiring 410 and the second wiring 411. Note that the present invention is not limited to this. A certain signal may be supplied regardless of an image. Each of the fourth wiring 413, the fifth wiring 414, and the sixth wiring 415 functions as a capacitor line.

Each of the first switch 401 and the second switch 402 is not particularly limited to a certain type as long as it functions as a switch. For example, a transistor can be used. The case where a transistor is used as each of the first switch 401 and the second switch 402 is described below. In the case of using a transistor, the transistor may be either a P-channel transistor or an N-channel transistor.

FIG. 16B shows the case where an N-channel transistor is used as a switch. In FIG. 16B, gates of a first switch 401N and a second switch 402N are connected to the third wiring 412. The third wiring 412 functions as a scan line.

Figure 7A:
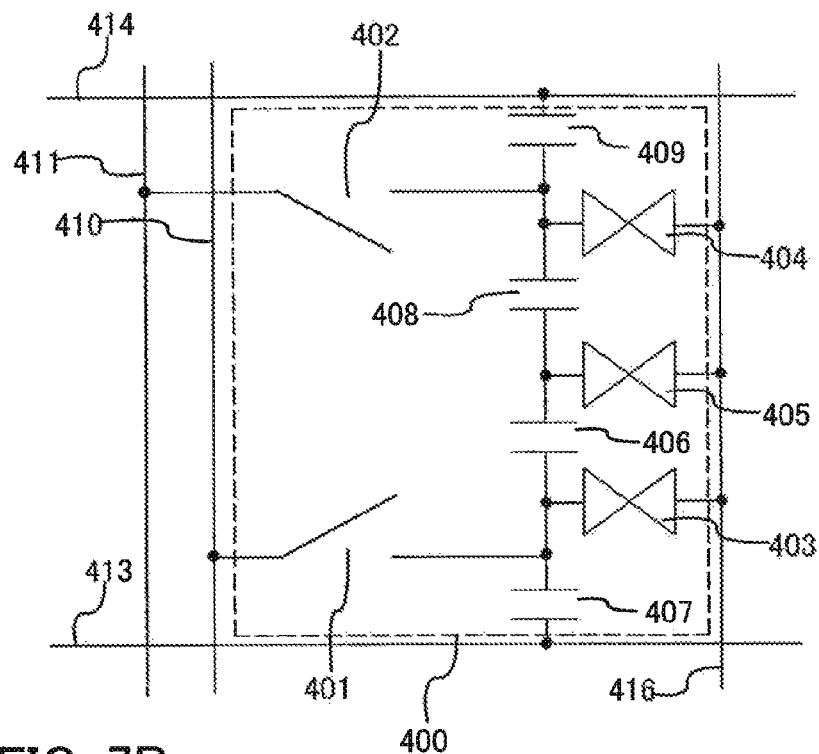
FIGS. 7A and 7B each illustrate a pixel circuit of a display device of the present invention.
Figure 7B:
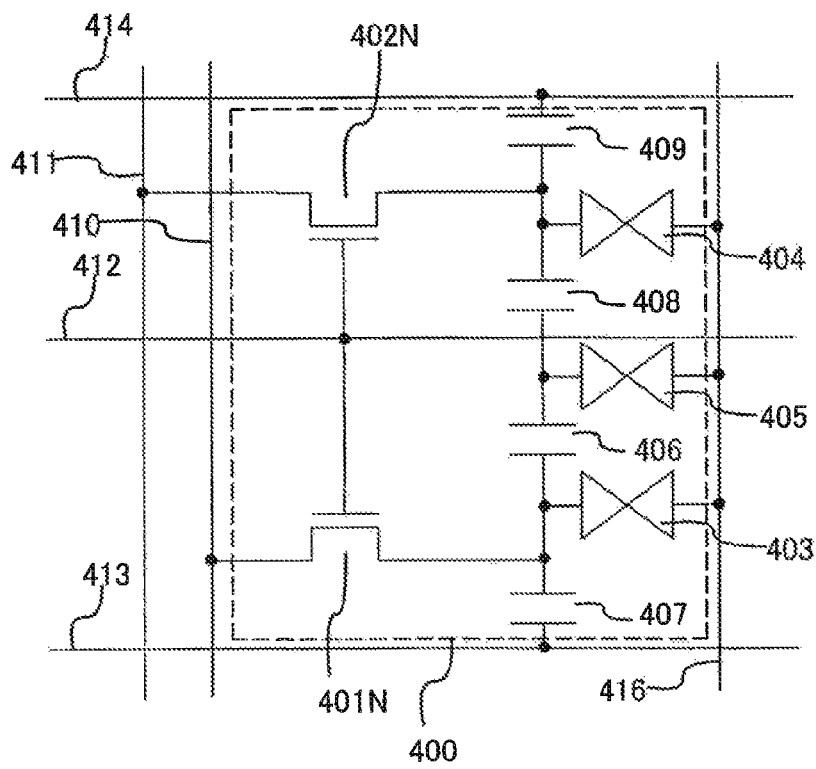

Note that although storage capacitors may be provided for all the liquid crystal elements as shown in FIGS. 16A and 16B, the present invention is not limited to this. For example, as shown in FIGS. 7A and 7B, storage capacitors may be provided for only part of the liquid crystal elements. Note that the storage capacitors may be connected to different capacitor lines, or may be connected to the same capacitor line. Alternatively, part of the storage capacitors may be connected to the same capacitor line and other storage capacitors may be connected to different storage capacitor lines. In addition, a capacitor line may be shared with another pixel. For example, a capacitor line can be shared with a pixel in the previous row or a pixel in the next row. When a capacitor line is shared between different pixels, the number of wirings can be reduced and the aperture ratio can be improved. Alternatively, a capacitor line may be shared with a scan line. When a capacitor line is shared with a scan line, the number of wirings can be reduced and the aperture ratio can be improved. When a capacitor line is shared with a scan line, a scan line of the adjacent pixel (the pixel in the previous row) is preferably used. This is because selection of signals has been already finished in an (i−1)th row (the previous row) when a pixel in an i-th row is selected. Note that in the case where liquid crystals are IPS mode, an FFS mode, or the like, the common electrode is provided over a substrate over which a transistor is formed. Therefore, a capacitor line is shared with the common electrode. When a capacitor line is shared with the common electrode, the number of wirings can be reduced and the aperture ratio can be improved.

Note that constant potential is preferably supplied to the capacitor lines. Note that the present invention is not limited to this. For example, in FIGS. 7A and 7B, a signal which periodically varies a plurality of times may be supplied to each of the capacitor lines, i.e., the fourth wiring 413 and the fifth wiring 414 in one frame period. Further, signals which are inverted with respect to each other may be supplied to the capacitor lines, i.e., the fourth wiring 413 and the fifth wiring 414. Accordingly, effective voltage applied to the first liquid crystal element 404, the second liquid crystal element 403, and the like can be made different.

Figure 50A:
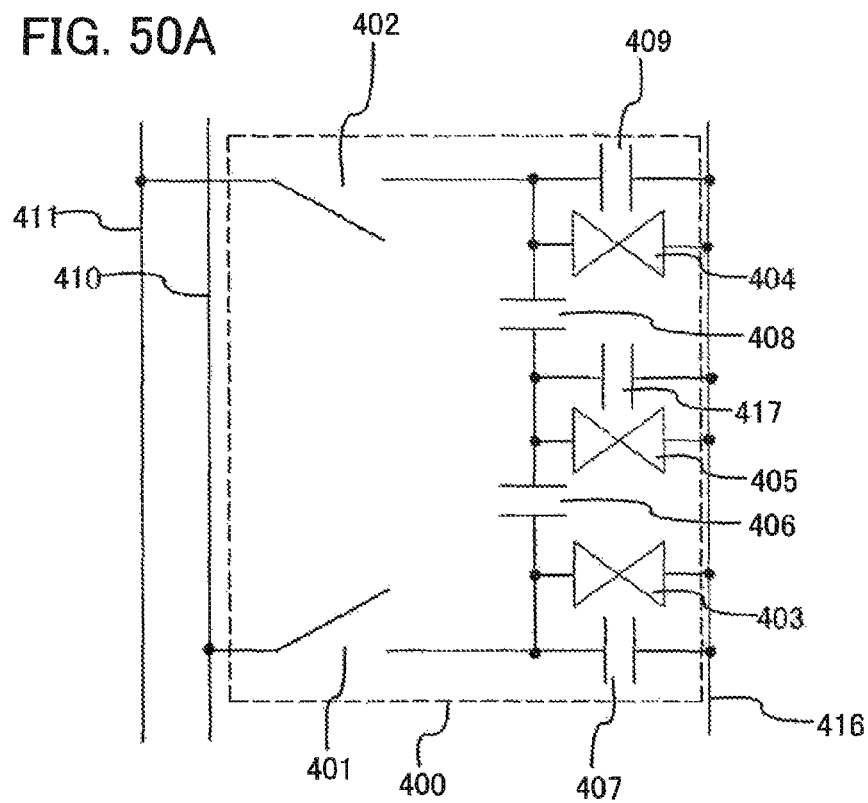
FIGS. 50A and 50B each illustrate a pixel circuit of a display device of the present invention.
Figure 50B:
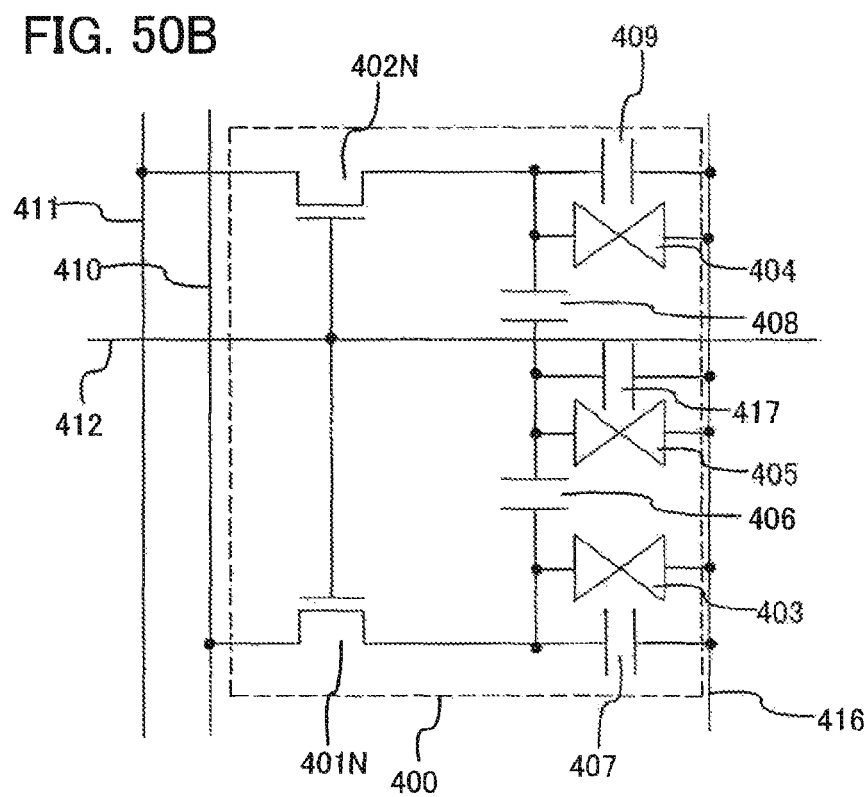

Note that although three wirings functioning as capacitor lines are included in FIGS. 16A and 16B, the present invention is not limited to this. The capacitor lines can be put into one capacitor line. Further, the common electrode and the capacitor line can be shared. This is because the common electrode and the capacitor line are not particularly limited to certain types except that potentials of the common electrode and the capacitor line need to be held constant. FIGS. 50A and 50B show the case where capacitor lines is put into one capacitor line and a common electrode and the capacitor line are shared. FIGS. 50A and 50B have similar advantages to FIGS. 16A and 16B.

As described above, when liquid crystal elements are aligned differently, the viewing angle can be widened.

Note that although the transistors which are used as the first switch or the second switch in drawings other than FIGS. 1A to 1C and the like used for the above description are connected to different signal lines, the present invention is not limited to this. These switches may be connected to the same signal line. For example, FIG. 8B shows an example of the case where the number of signal lines is one unlike the case where the number of signal lines is two in FIGS. 1A to 1C and a plurality of scan lines are provided. In addition, FIG. 17B shows the case where the scan lines in FIG. 8B is put into one wiring.

Note that in FIGS. 8A and 8B and 17A and 17B, storage capacitors can be provided for different liquid crystal elements, as shown in FIGS. 7A and 7B and FIGS. 16A and 16B. Then, for example, FIGS. 18A and 18B and FIGS. 19A and 19B each show an example where storage capacitors are provided for the first and second liquid crystal elements, in a similar manner that in FIGS. 7A and 7B.

Therefore, the contents described in FIGS. 1A to 1C and FIGS. 7A and 7B can also be applied to FIGS. 8A and 8B, FIGS. 16A and 16B, FIGS. 17A and 17B, and FIGS. 18A and 18B.

Figure 8A:
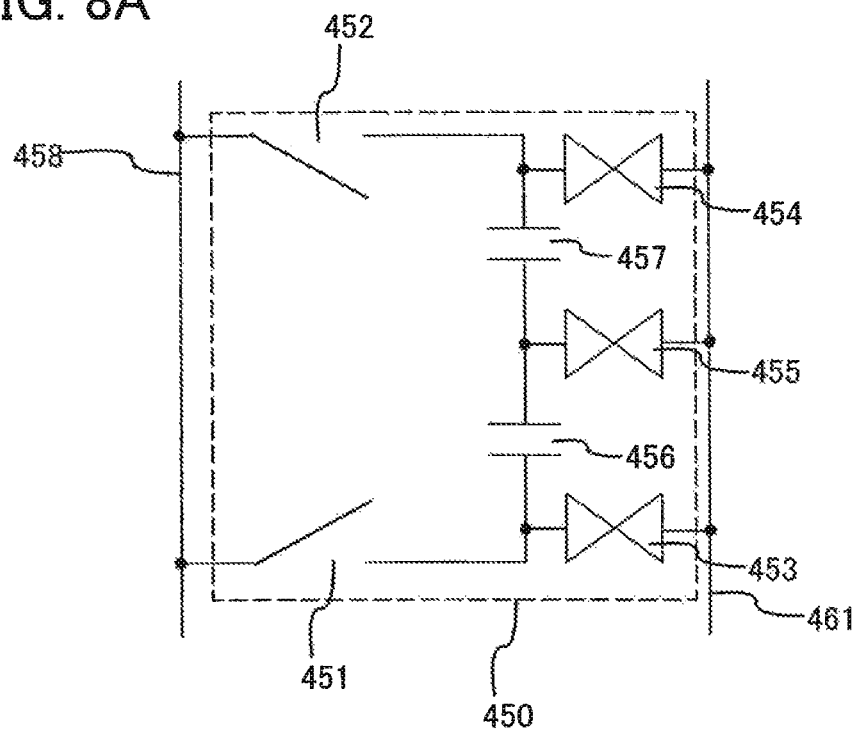
FIGS. 8A and 8B each illustrate a pixel circuit of a display device of the present invention.
Figure 8B:
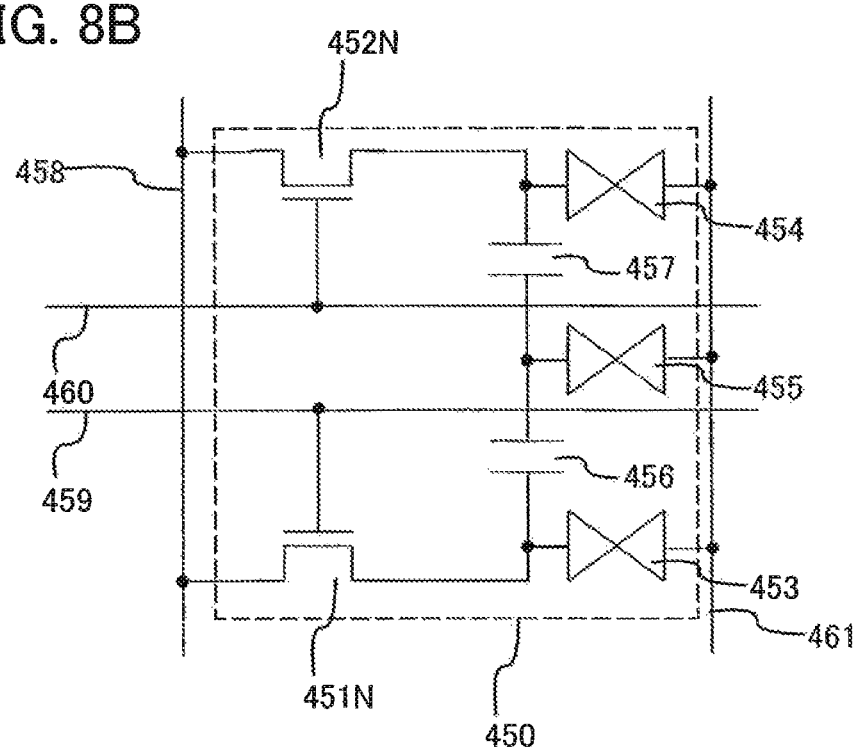

In FIG. 8A, a pixel 450 includes a first switch 451, a second switch 452, a first liquid crystal element 453, a second liquid crystal element 454, a third liquid crystal element 455, a first capacitor 456, and a second capacitor 407.

A first wiring 458 is connected to a first electrode of the first liquid crystal element 453 and a first electrode of the first capacitor 456 through the first switch 451. Further, the first wiring 458 is connected to a first electrode of the second liquid crystal element 454 and a first electrode of the second capacitor 457 through the second switch 452. Second electrodes of the first capacitor 456 and the second capacitor 457 are connected to a first electrode of the third liquid crystal element 455.

Note that a transistor can be used as a switch. A gate of a first switch 451N is connected to a second wiring 459. A gate of a second switch 452N is connected to a third wiring 460.

Second electrodes of the first liquid crystal element 453, the second liquid crystal element 454, and the third liquid crystal element 455 are connected to a common electrode 461.

The first wiring 458 functions as a signal line. Therefore, an image signal is usually supplied to the first wiring 458. Note that the present invention is not limited to this. A certain signal may be supplied regardless of an image. Each of the second wiring 459 and the third wiring 460 functions as a scan line.

Operations in FIGS. 8A and 8B and FIGS. 18A and 18B are described. First, an active signal is supplied to the third wiring 460, so that the second switch 452 or the second switch 452N is turned on. Here, an active signal corresponds to a signal which can turn on the second switch 452 or the second switch 452N. When the second switch 452 or the second switch 452N is turned on, a video signal is supplied from the first wiring 458 to the first electrode (a pixel electrode) of the second liquid crystal element 454 and the first electrode of the second capacitor 457.

Next, the second switch 452 or the second switch 452N is turned off and an active signal is supplied to the second wiring 459, so that the first switch 451 or the first switch 451N is turned on. Here, an active signal corresponds to a signal which can turn on the first switch 451 or the first switch 451N. Then, a video signal is supplied from the first wiring 458 to the first electrode (a pixel electrode) of the first liquid crystal element 453 and the first electrode of the first capacitor 456. The video signal supplied at this time preferably has a potential which is different from the potential when the second switch 452 or the second switch 452N is turned on. Since the potentials are different, different voltage can be applied to the liquid crystal elements. Therefore, the viewing angle can be improved.

Note that when the second switch 452 or the second switch 452N is on, the third liquid crystal element 455 is capacitively coupled to the pixel electrode of the first liquid crystal element 453 through the first capacitor 456. Therefore, a potential of a pixel electrode of the third liquid crystal element 455 is changed in accordance with the voltage applied from the first wiring 458 when the second switch 452 or the second switch 452N is on.

Similarly, when the first switch 451 or the first switch 451N is on, the second liquid crystal element 454 is capacitively coupled to the pixel electrode of the first liquid crystal element 456 through the first capacitor 456 and the second capacitor 457. Therefore, a potential of the pixel electrode of the second liquid crystal element 454 is changed in accordance with the voltage applied from the first wiring 458 when the first switch 451 or the first switch 451N is on.

Next, the first switch 451 or the first switch 451N is turned off, so that the potential of each of the liquid crystal elements is held. With such operations, the voltage which is applied can be varied between the liquid crystal elements. Accordingly, the viewing angle can be widened. Note that the driving method is not limited to this. Driving can be performed by using a variety of timing for turning on/off each transistor, potentials of a signal line, and the like.

Figure 18A:
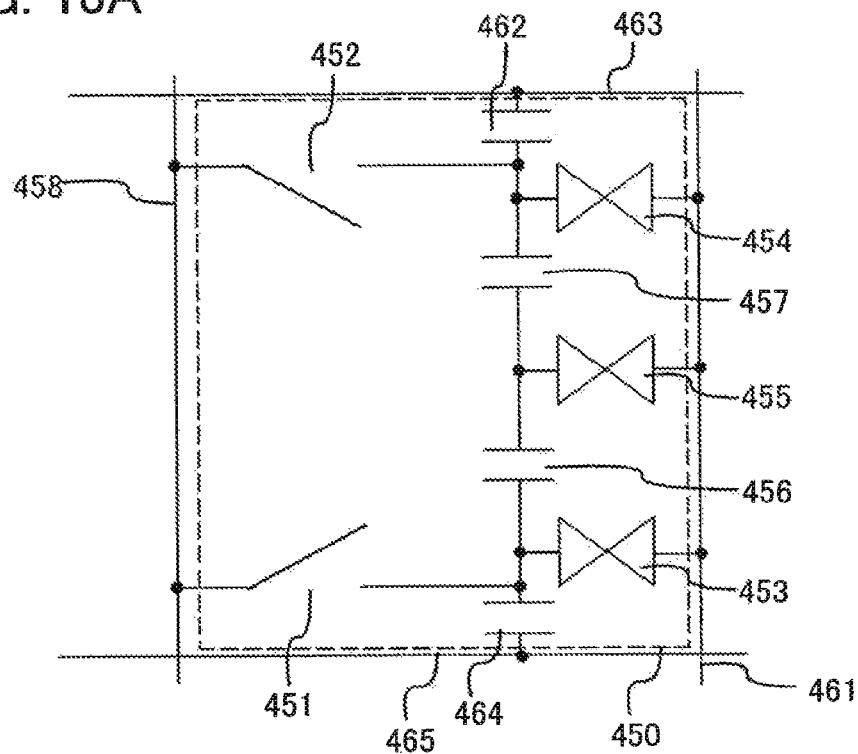
FIGS. 18A and 18B each illustrate a pixel circuit of a display device of the present invention.
Figure 18B:
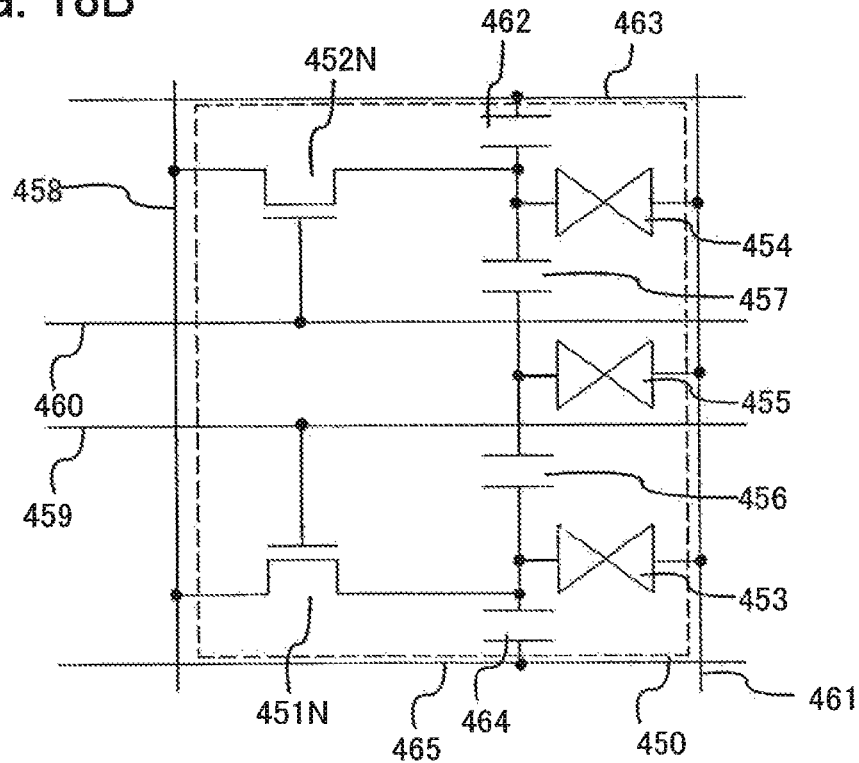

Note that in FIGS. 18A and 18B, a constant potential is preferably supplied to each of the capacitor lines. Note that the present invention is not limited to this. For example, a signal which periodically varies a plurality of times may be supplied to the capacitor lines, i.e., the first wiring and the second wiring in one frame period. Further, signals which are inverted with respect to each other may be supplied to the capacitor lines, i.e., the first wiring and the second wiring. Accordingly, effective voltage applied to the first liquid crystal element 453, the second liquid crystal element 454, and the like can be made different. With such operations, the potentials of the liquid crystal elements can be varied. Accordingly, the viewing angle can be widened.

Figure 17A:
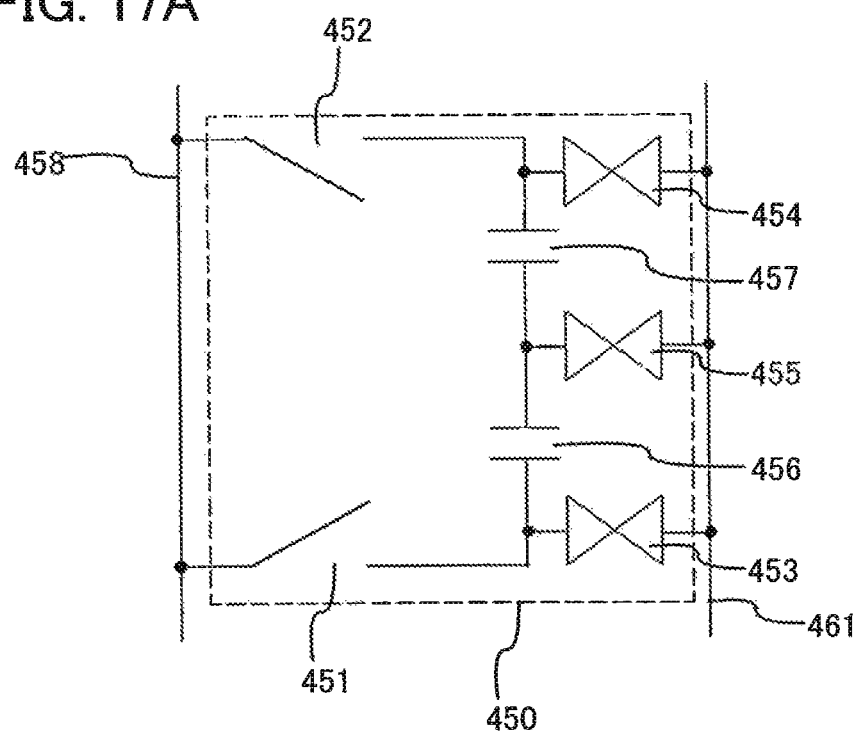
FIGS. 17A and 17B each illustrate a pixel circuit of a display device of the present invention.
Figure 17B:
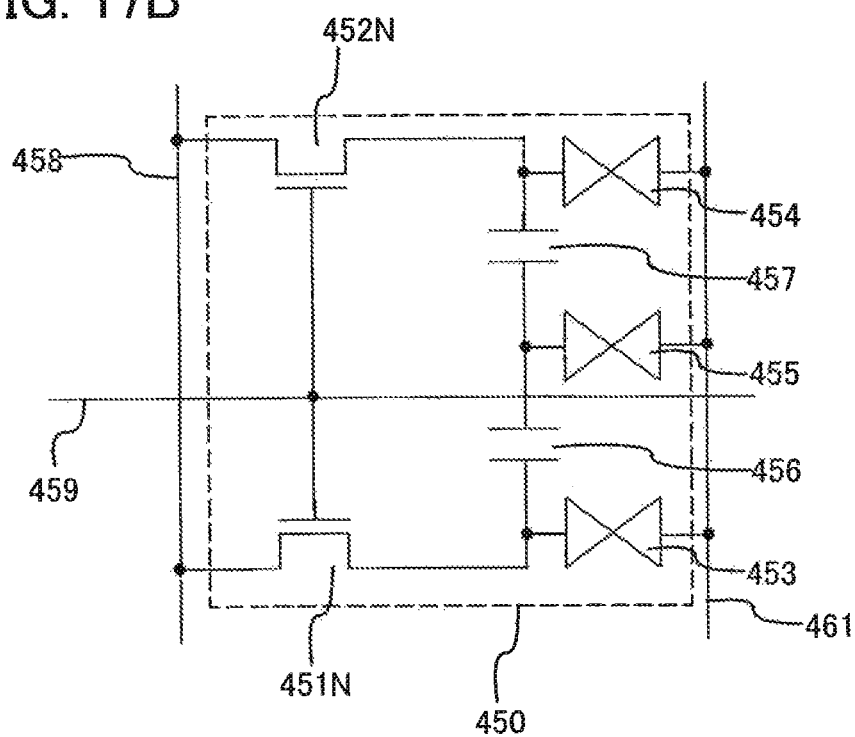
Figure 19A:
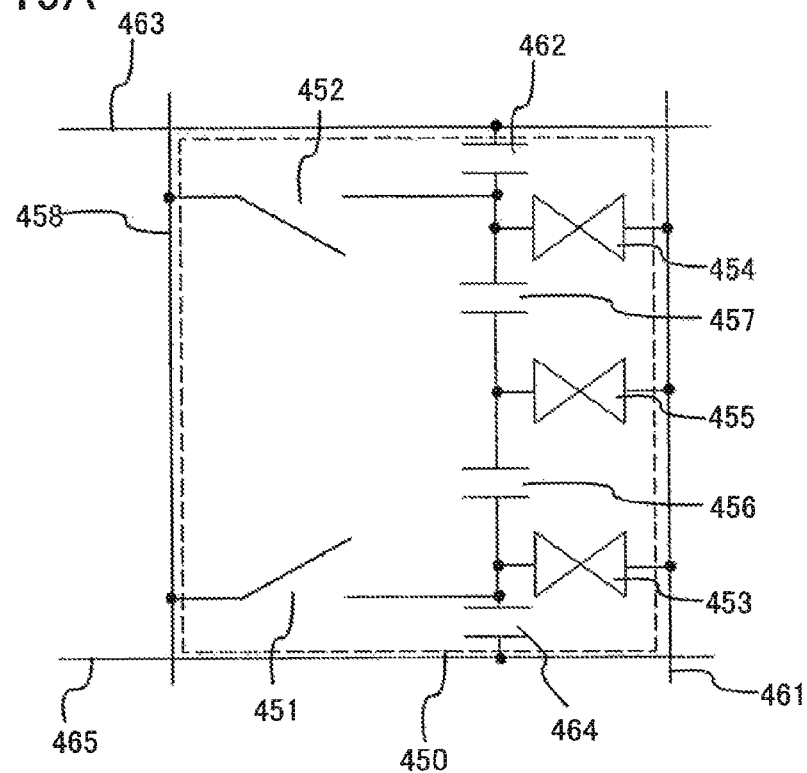
FIGS. 19A and 19B each illustrate a pixel circuit of a display device of the present invention.

Next, operations in FIGS. 17A and 19A are described.

An active signal is supplied to the second wiring 459, so that the first switch 451 and the second switch 452 are turned on. Then, a video signal is supplied from the first wiring 458 to the first electrode (the pixel electrode) of the first liquid crystal element 453, the first electrode of the first capacitor 456, the first electrode (the pixel electrode) of the second liquid crystal element 454, and the first electrode of the second capacitor 457.

At this time, when transistors are used as the first switch 451 and the second switch 452, on resistance is generated. On resistance of the first switch 451 is preferably higher than on resistance of the second switch 452. High on resistance of a transistor corresponds to a small ratio of the channel width W to the channel length L (W/L). When the on resistance of the transistor is increased in this manner, the potential of the pixel electrode of each of the liquid crystal elements is determined by balance of leakage current or the like of each capacitor, each storage capacitor, or the like. Then, different voltage can be applied to the liquid crystal elements, so that the viewing angle can be improved. Note that the present invention is not limited to this, and the on resistance of the first switch 451 and the on resistance of the second switch 452 can be almost equal.

Next, the first switch 451 and the second switch 452 are turned off, so that the potential of each of the liquid crystal elements is held.

With such operations, the voltage which is applied can be varied between the liquid crystal elements. Accordingly, the viewing angle can be widened. Note that the driving method is not limited to this. Driving can be performed by using a variety of timing for turning on/off each transistor, potentials of a signal line, and the like.

Figure 19B:
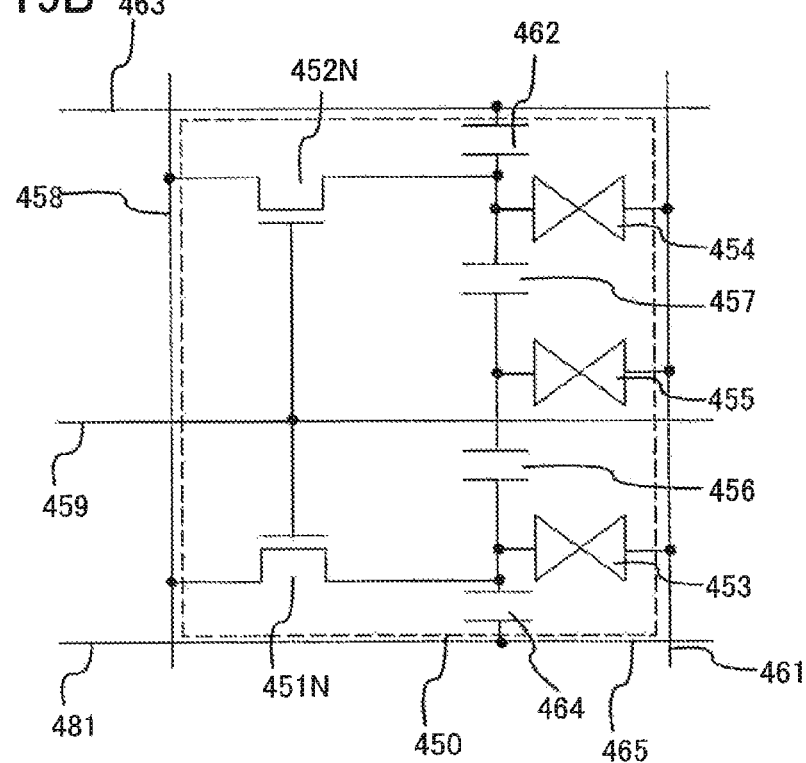

Note that in FIGS. 19A and 19B, a constant potential is preferably supplied to the capacitor lines. Note that the present invention is not limited to this. For example, a signal which periodically varies a plurality of times may be supplied to the capacitor lines, i.e., the first wiring 463 and the second wiring 465 in one frame period. Alternatively, signals which are inverted with respect to each other may be supplied to the capacitor lines, i.e., the first wiring 463 and the second wiring 465. Accordingly, effective voltage applied to the first liquid crystal element 453, the second liquid crystal element 454, and the like can be made different. With such operations, the voltage which is applied can be varied between the liquid crystal elements. Accordingly, the viewing angle can be widened.

As described above, when liquid crystal elements are aligned differently, the viewing angle can be widened.

Figure 2A:
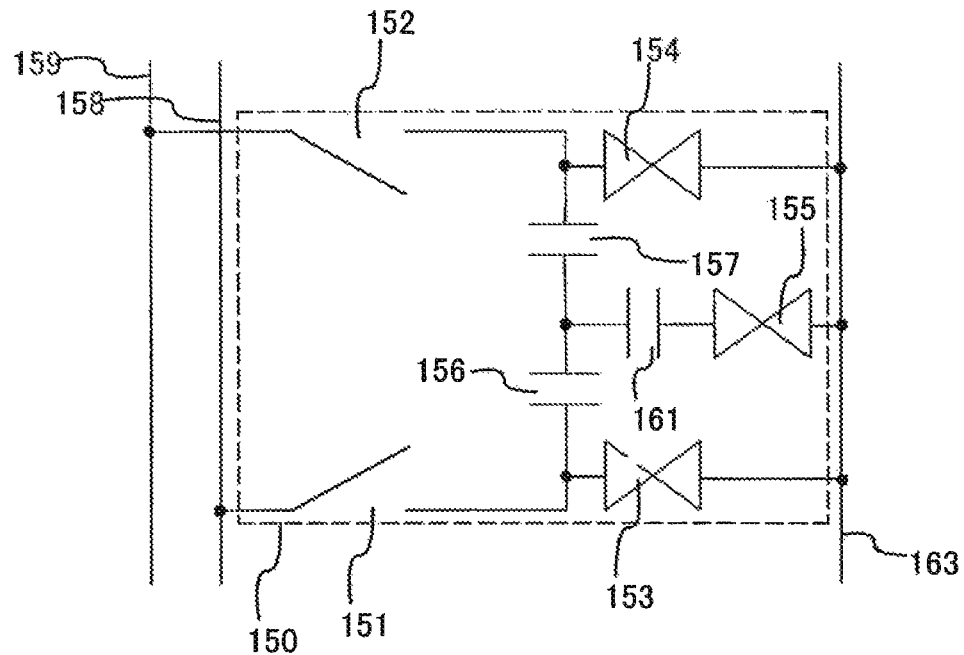
FIGS. 2A and 2B each illustrate a pixel circuit of a display device of the present invention.

FIG. 2A shows an example of the structure of a pixel circuit included in a liquid crystal display device of the present invention, which is different from that of FIG. 1A. A pixel 150 includes a first switch 151, a second switch 152, a first liquid crystal element 153, a second liquid crystal element 154, a third liquid crystal element 155, a first capacitor 156, a second capacitor 157, and a third capacitor 161.

A first wiring 158 is connected to a first electrode of the first liquid crystal element 153 and a first electrode of the first capacitor 156 through the first switch 151. A second wiring 159 is connected to a first electrode of the second liquid crystal element 154 and a first electrode of the second capacitor 157 through the second switch 152. A second electrode of the first capacitor 156 is connected to a second electrode of the second capacitor 157 and a first electrode of the third capacitor 161. A second electrode of the third capacitor 161 is connected to a first electrode of the third liquid crystal element 155.

Second electrodes of the first liquid crystal element 153, the second liquid crystal element 154, and the third liquid crystal element 155 are connected to a common electrode.

Each of the first wiring 158 and the second wiring 159 functions as a signal line. Therefore, an image signal is usually supplied to each of the first wiring 158 and the second wiring 159. Note that the present invention is not limited to this. A certain signal may be supplied regardless of an image. The third wiring 160 functions as a scan line.

Each of the first switch 151 and the second switch 152 is not particularly limited to a certain type as long as it functions as a switch. For example, a transistor can be used. The case where a transistor is used as each of the first switch 151 and the second switch 152 is described below. In the case of using a transistor, the transistor may be either a P-channel transistor or an N-channel transistor.

Figure 2B:
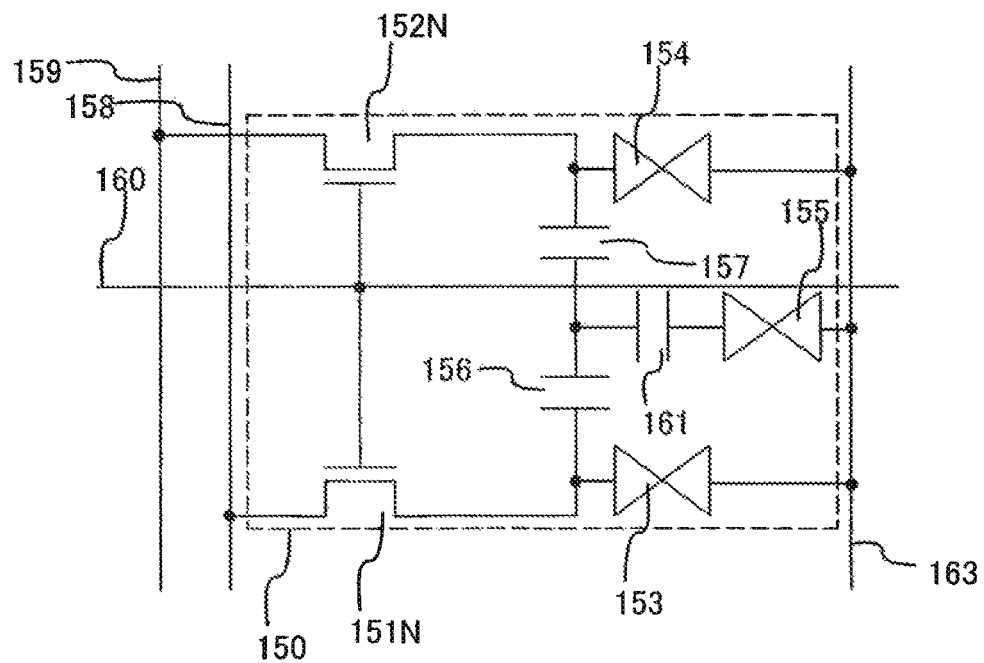

FIG. 2B shows the case where an N-channel transistor is used as a switch. In FIG. 2B, gates of a first switch 151N and a second switch 152N are connected to the third wiring 160. The third wiring 160 functions as a scan line.

Note that in FIGS. 2A and 2B, the number of scan lines may be two in a similar manner that in FIGS. 1A to 1B, as shown in FIG. 49.

Note that a P-channel transistor can be used as a switch.

A video signal is input to the first wiring 158 and the second wiring 159. A scan signal is input to the third wiring 160. The scan signal is an H-level or L-level digital voltage signal. In the case where each of the first switch 151 and the second switch 152 is an N-channel transistor, an H level of the scan signal is a potential which can turn on the first switch 151 and the second switch 152, and an L level of the scan signal is a potential which can turn off the first switch 151 and the second switch 152. Alternatively, in the case where each of the first switch 151 and the second switch 152 is a P-channel transistor, an H level of the scan signal is a potential which can turn off the first switch 151 and the second switch 152, and an L level of the scan signal is a potential which can turn on the first switch 151 and the second switch 152. Note that the video signal has analog voltage. Note that the present invention is not limited to this, the video signal may have digital voltage. Alternatively, the video signal may be current. In addition, current of the video signal may be either analog or digital. A potential of the video signal is lower than the H level of the scan signal and higher than the L level of the scan signal.

Operations of the pixel 150 in FIG. 2A are described by dividing the whole operations into the case where the first switch 151 and the second switch 152 are on and the case where the first switch 151 and the second switch 152 are off.

In the case where the first switch 151 is on, the first wiring 158 is electrically connected to the first electrode (a pixel electrode) of the first liquid crystal element 153 and the first electrode of the first capacitor 156. In the case where the second switch 152 is on, the second wiring 159 is electrically connected to the first electrode (a pixel electrode) of the second liquid crystal element 154 and the first electrode of the second capacitor 157. Therefore, a video signal is input from the first wiring 158 to the first electrode (the pixel electrode) of the first liquid crystal element 153 and the first electrode of the first capacitor 156, and a video signal is input from the second wiring 159 to the first electrode (the pixel electrode) of the second liquid crystal element 154 and the first electrode of the second capacitor 157. Therefore, a potential $V_{153}$ of a signal input to the first liquid crystal element 153 is almost equal to a potential input from the first wiring 158, and a potential $V_{154}$ of a signal input from the second liquid crystal element 154 is almost equal to a potential input to the second wiring 159. In addition, a potential $V_{161}$ of the first electrode of the third liquid crystal element 161 is almost similar to the potential $V_{105}$ of the first electrode of the third liquid crystal element 105 in FIGS. 1A to 1C, and when the values of $C_{156}$ and $C_{157}$ are the same, $V_{161}$ is almost half the sum of $V_{153}$ and $V_{154}$. Note that a potential of a first electrode of third liquid crystal element 155 is denoted by $V_{155}$. Here, when a potential of the common electrode is 0, voltage applied to the third liquid crystal element 155 is denoted by $V_{155}$. The voltage $V_{155}$ has a value which is divided by voltage of the third capacitor 161 and voltage of the third liquid crystal element 155. When the capacitors are used in this manner, different voltage can be further applied to the liquid crystal elements. The voltage which is applied can be varied between the liquid crystal elements in this manner, so that the liquid crystal elements can be aligned differently.

When two signals having different potentials are supplied and capacitors are used in this manner, voltage is divided in a pixel, so that third voltage can be produced. Then, when the third voltage is applied to the third liquid crystal element 155, liquid crystals can be easily controlled. Further, the third voltage is voltage between voltage applied to the first liquid crystal element 153 and voltage applied to the second liquid crystal element 154. Therefore, even when any gray scale is to be displayed, an adequate gray scale can be displayed. In addition, even when polarity of the image signal is positive (i.e., the image signal is higher than that of the common electrode) or polarity of the image signal is negative (i.e., the image signal is lower than that of the common electrode), an adequate gray scale can be displayed.

In addition, increase in number of scan lines, signal lines, transistors, and the like is suppressed and the third voltage is produced, so that the third liquid crystal element 155 can be controlled. Thus, the aperture ratio can be improved and power consumption can be reduced. In addition, since pixels can be arranged having a margin of layout, a defect such as short circuit due to dust or the like generated in manufacturing steps can be reduced, so that yield can be improved. Accordingly, manufacturing cost can be reduced. Further, since the third liquid crystal element 155 can be controlled without additionally providing a signal line, the number of connections between a glass substrate and an external driver circuit is not increased. Accordingly, high reliability can be maintained.

In the case where the first switch 151 is off, the first wiring 158 is electrically disconnected to the first electrode (the pixel electrode) of the first liquid crystal element 153 and the first electrode of the first capacitor 156. In the case where the second switch 152 is off, the second wiring 159 is electrically disconnected to the first electrode (the pixel electrode) of the second liquid crystal element 154 and the first electrode of the second capacitor 157. Therefore, each of the first electrode of the first liquid crystal element 153, the first electrode of the first capacitor 156, the first electrode of the second liquid crystal element 154, and the first electrode of the second capacitor 157 is set in a floating state. In addition, the third liquid crystal element 155 is connected to the first liquid crystal element 153 through the first capacitor 156 and the third capacitor 161. However, because of principle of conservation of charge, electric charge conserved in the third liquid crystal element 155 does not leak toward the first liquid crystal element 153. The third liquid crystal element 155 is connected to the first liquid crystal element 153 through the second capacitor 157. However, because of principle of conservation of charge, the electric charge conserved in the third liquid crystal element 155 does not leak toward the second liquid crystal element 154. Therefore, a potential of a signal which is input just before is held in each of the first to third liquid crystal elements.

Note that each of the first liquid crystal element 153, the second liquid crystal element 154, and the third liquid crystal element 155 has transmittivity in accordance with a video signal.

Figure 12A:
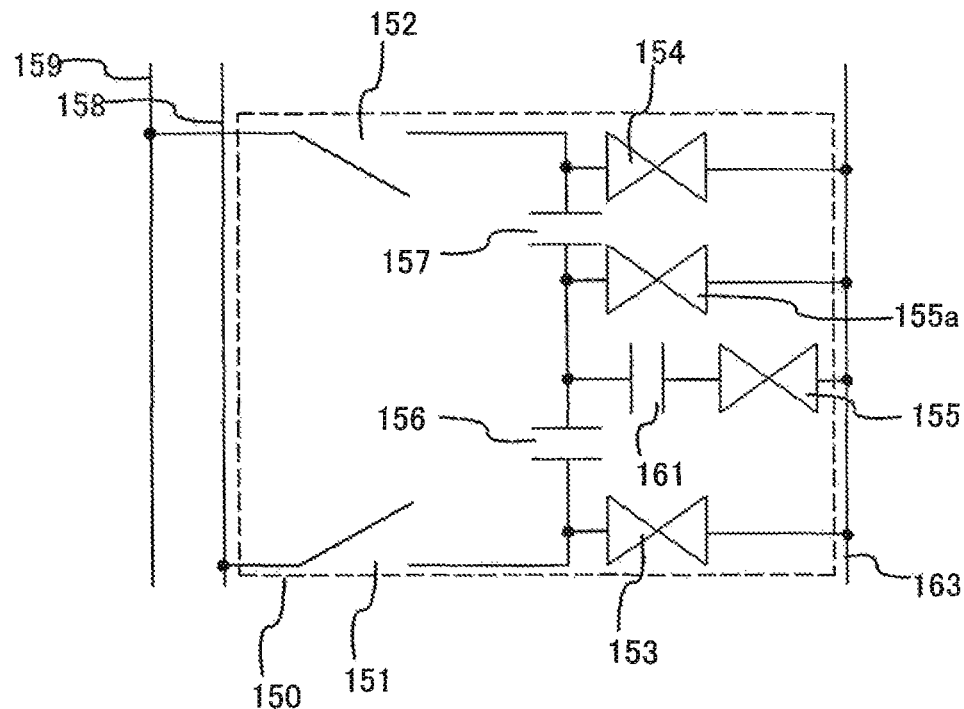
FIGS. 12A and 12B each illustrate a pixel circuit of a display device of the present invention.
Figure 12B:
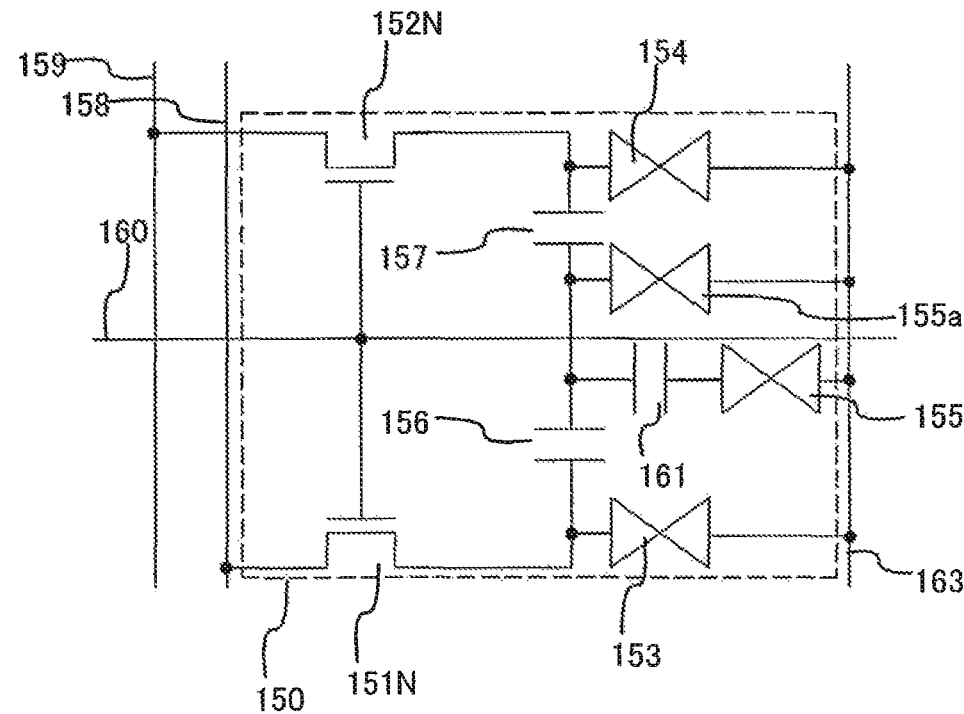
Figure 15A:
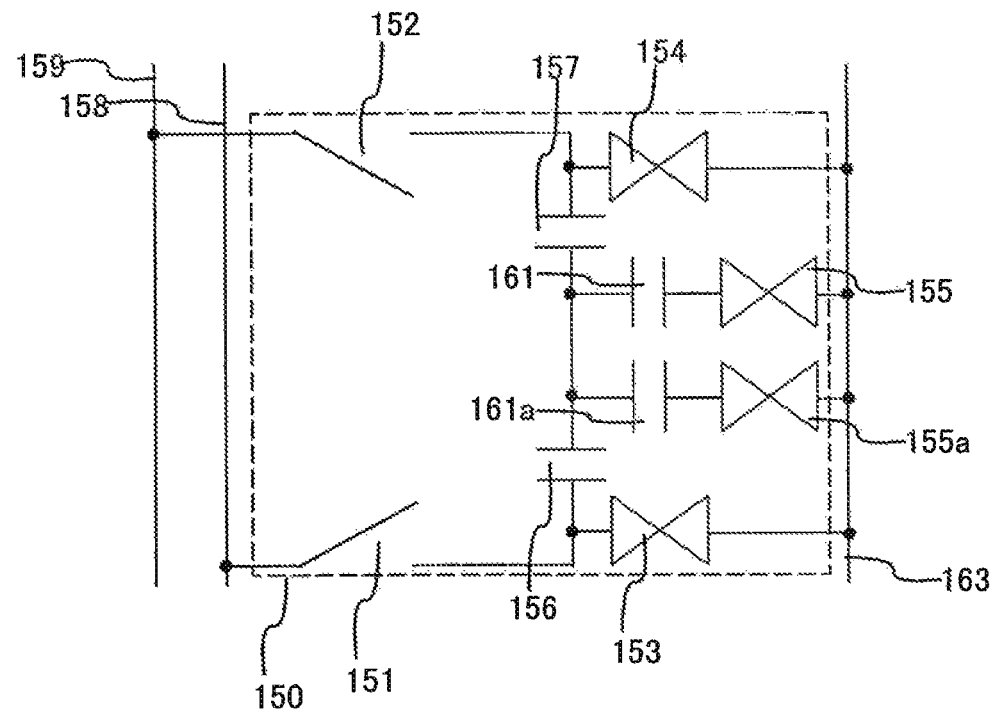
FIGS. 15A and 15B each illustrate a pixel circuit of a display device of the present invention.
Figure 15B:
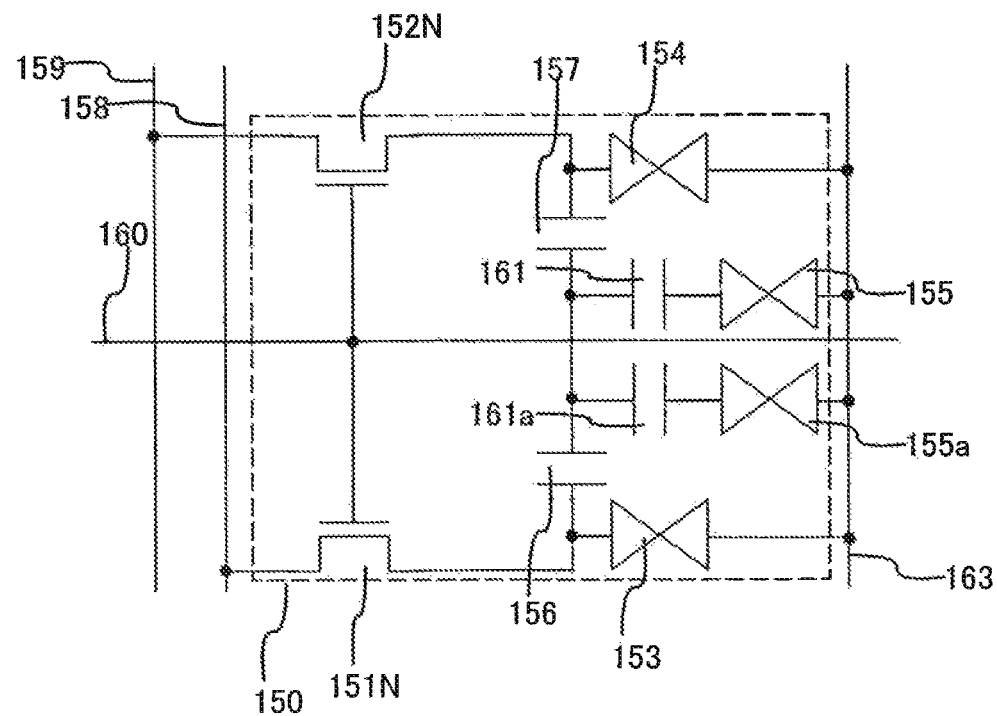

That is, when FIGS. 2A and 2B are compared to FIGS. 1A to 1B, FIGS. 2A and 2B correspond to the case where the third liquid crystal element 105 in FIGS. 1A to 1C is replaced with the third capacitor 161 and the third liquid crystal element 155 in FIGS. 2A and 2B which are connected in series. Therefore, the contents described in FIGS. 1A to 1C can also be applied to FIGS. 2A and 2B. For example, as shown in FIGS. 15A and 15B, the third capacitor 161 and the third liquid crystal element 155 which are connected in series may be divided into a plurality of elements. Alternatively, as shown in FIGS. 12A and 12B, the capacitor may be eliminated and only the liquid crystal element may be divided into a plurality of elements.

Figure 13A:
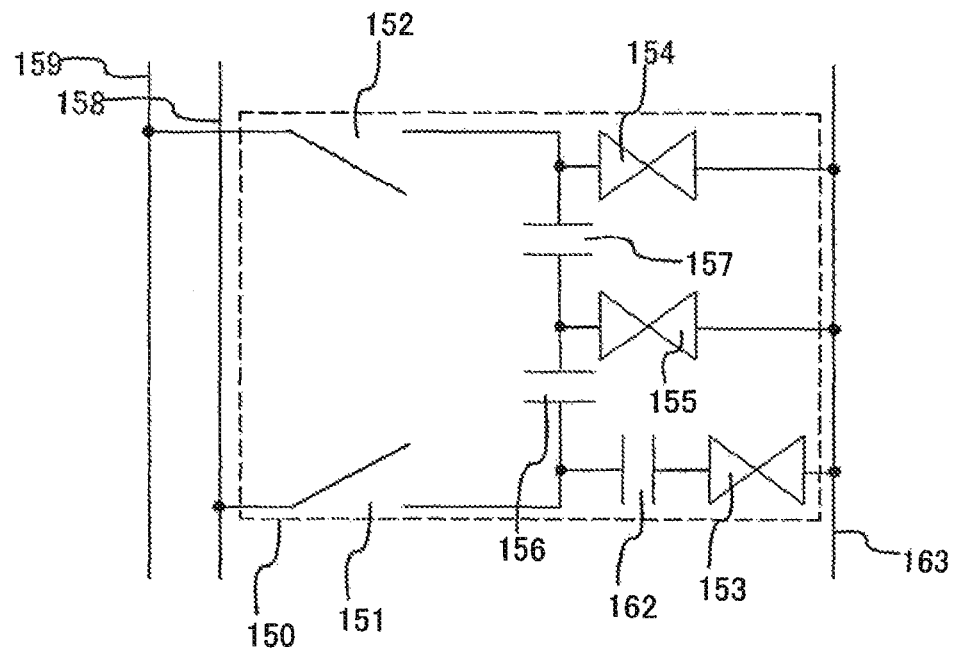
FIGS. 13A and 13B each illustrate a pixel circuit of a display device of the present invention.
Figure 13B:
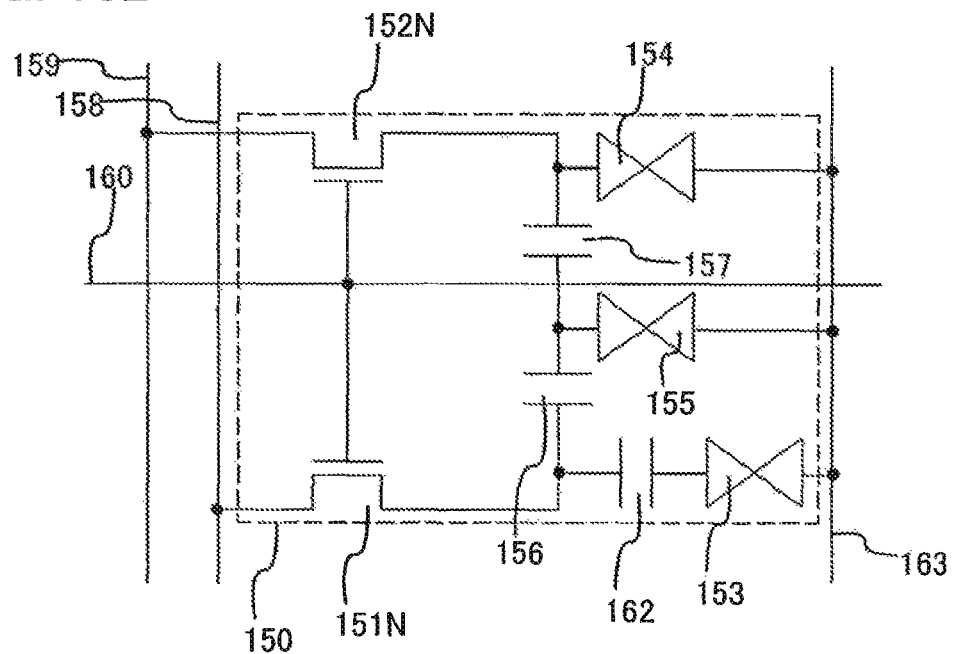
Figure 14A:
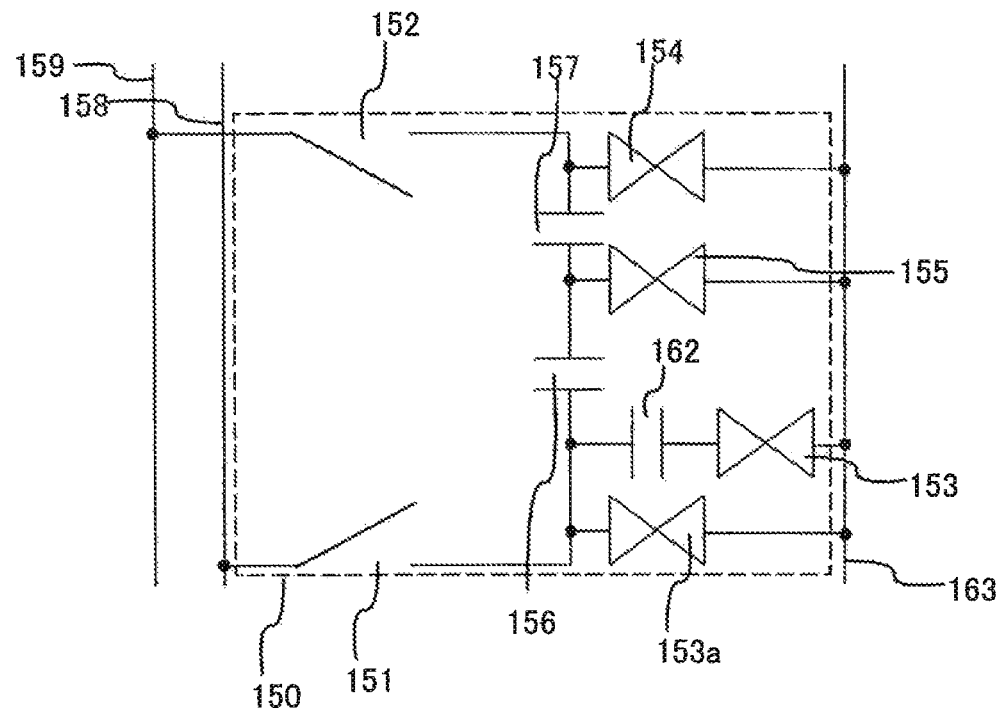
FIGS. 14A and 14B each illustrate a pixel circuit of a display device of the present invention.
Figure 14B:
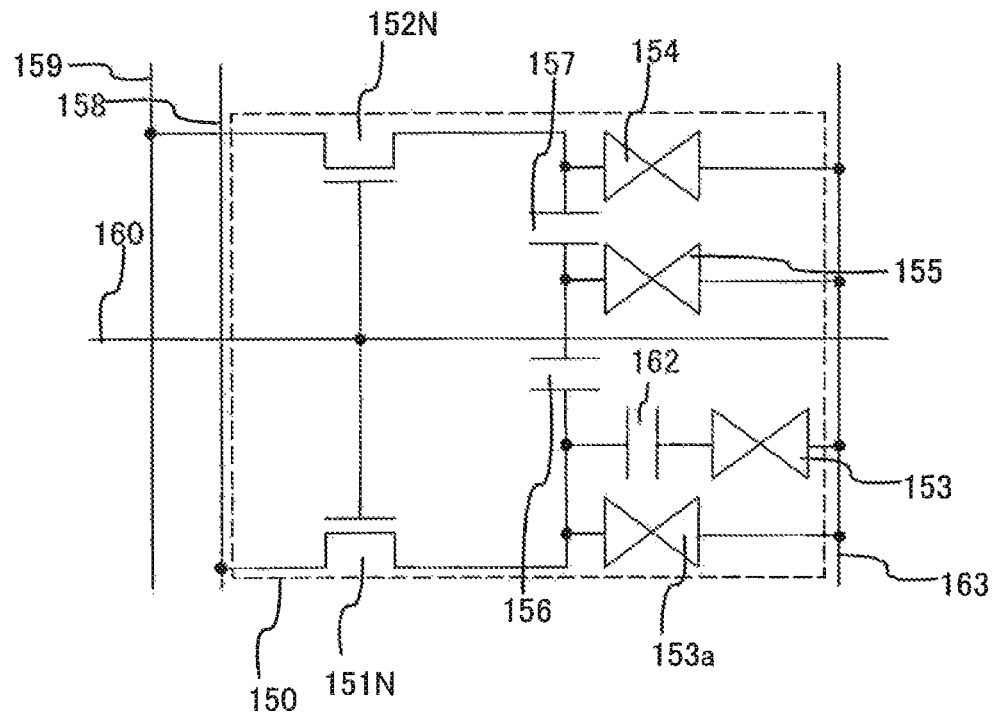

Note that although the third liquid crystal element 105 in FIGS. 1A to 1C is replaced with the third capacitor 161 and the third liquid crystal element 155 which are connected in series in FIGS. 2A and 2B, the present invention is not limited to this. Another liquid crystal element may be replaced with a capacitor and a liquid crystal element which are connected in series. For example, FIGS. 13A and 13B show the case where the first liquid crystal element 153 is replaced with a capacitor and a liquid crystal element which are connected in series. In this case, in a similar manner that in FIGS. 12A and 12B, the liquid crystal element may be divided into a plurality of elements as shown in FIGS. 14A and 14B.

Since FIGS. 2A and 2B show the case where the third liquid crystal element 105 in FIGS. 1A to 1C is replaced with the third capacitor 161 and the third liquid crystal element 155 in FIGS. 2A and 2B which are connected in series, transformation which is similar to transformation in FIGS. 1A to 1C can be performed. That is, a storage capacitor may be added to part of the liquid crystal elements as shown in FIGS. 7A and 7B, or storage capacitors may be added to all the liquid crystal elements as shown in FIGS. 16A and 16B. In addition, the number of scan lines may be two and the signal lines may be put into one signal line, as shown in FIGS. 8A and 8B or FIGS. 18A and 18B. Alternatively, the scan lines and the signal lines may be put into one scan line and one signal line, as shown in FIGS. 17A and 17B and FIGS. 19A and 19B.

As described above, when liquid crystal elements are aligned differently, the viewing angle can be widened.

Figure 3A:
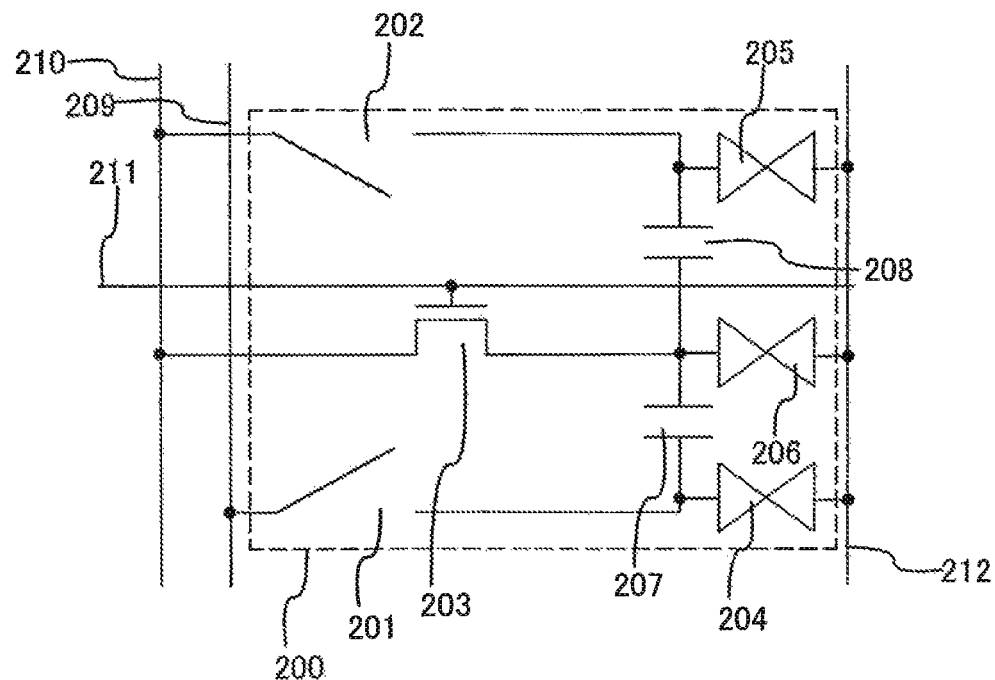
FIGS. 3A and 3B each illustrate a pixel circuit of a display device of the present invention.

FIG. 3A shows an example of the structure of a pixel circuit included in a liquid crystal display device of the present invention, which is different from other examples. A pixel 200 includes a first switch 201, a second switch 202, a transistor 203, a first liquid crystal element 204, a second liquid crystal element 205, a third liquid crystal element 206, a first capacitor 207, and a second capacitor 208.

A first wiring 209 is connected to a first electrode of the first liquid crystal element 204 and a first electrode of the first capacitor 207 through the first switch 201. A second wiring 210 is connected to a first electrode of the second liquid crystal element 205 and a first electrode of the second capacitor 208 through the second switch 202. Further, the second wiring 210 is connected to a first electrode of the third liquid crystal element 206 through the transistor 203. Gates of the first switch 201, the second switch 202, and the transistor 203 are connected to a third wiring 211. A second electrode of the first capacitor 207 is connected to a second electrode of the second capacitor 208 and the first electrode of the third liquid crystal element 206.

Note that the transistor 203 is operated as a switch having higher on resistance than on resistance of the first switch 201 and the second switch 202. That is, the transistor 203 can be handled in a similar manner that in a switch to which a resistor is connected in series. However, the present invention is not limited to this. The on resistance of the transistor 203 may be lower than the on resistance of the first switch 201 and the on resistance of the second switch 202.

Figure 3B:
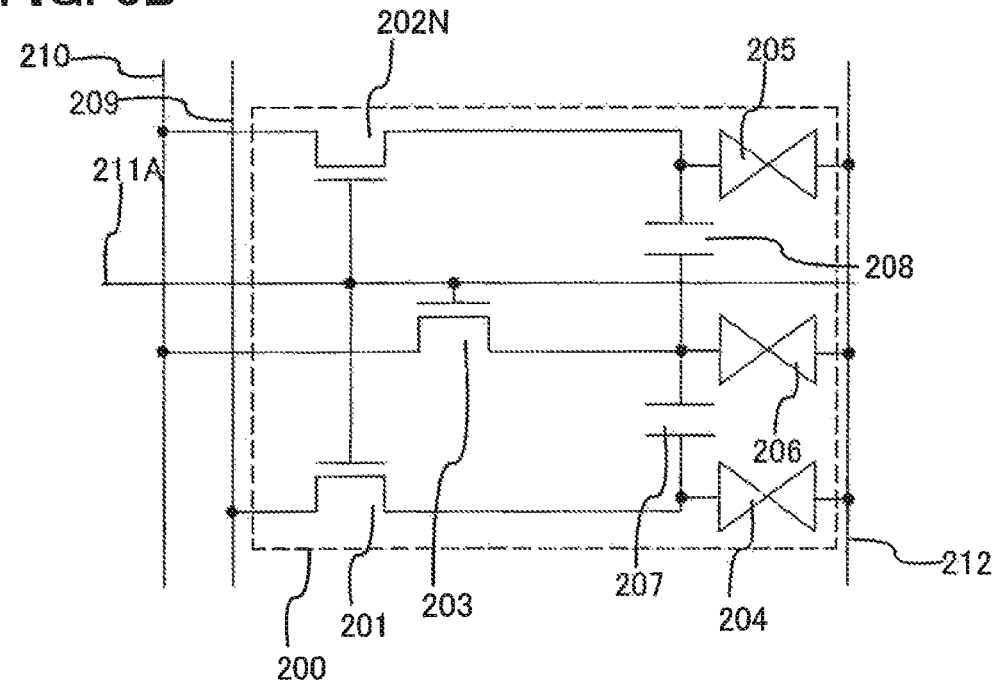

Note that although the transistor 203 is an N-channel transistor in FIGS. 3A and 3B, the present invention is not limited to this. That is, the transistor 203 may be a P-channel transistor.

Second electrodes of the first liquid crystal element 204, the second liquid crystal element 205, and the third liquid crystal element 206 are connected to a common electrode.

Each of the first wiring 209 and the second wiring 210 functions as a signal line. Therefore, an image signal is usually supplied to each of the first wiring 209 and the second wiring 210. Note that the present invention is not limited to this. A certain signal may be supplied regardless of an image. The third wiring 211 functions as a scan line.

Each of the first switch 201 and the second switch 202 is not particularly limited to a certain type as long as it functions as a switch. For example, a transistor can be used. The case where a transistor is used as each of the first switch 201 and the second switch 202 is described below. In the case of using a transistor, the transistor may be either a P-channel transistor or an N-channel transistor.

FIG. 3B shows the case where an N-channel transistor is used as a switch. In FIG. 3B, gates of a first switch 201N and a second switch 202N are connected to a third wiring 211A. The third wiring 211A functions as a scan line.

Note that in FIGS. 3A and 3B, the number of scan lines may be two in a similar manner that in FIGS. 1A to 1C, as shown in FIG. 49.

Note that a P-channel transistor can be used as a switch.

Note that a switch is not limited to a transistor. Various elements such as diodes can be used as a switch.

A video signal is input to the first wiring 209 and the second wiring 210. A scan signal is input to the third wiring 211. The scan signal is an H-level or L-level digital voltage signal. In the case where each of the first and second switches and the transistor 203 is an N-channel transistor, an H level of the scan signal is a potential which can turn on the first and second switches and the transistor 203 and an L level of the scan signal is a potential which can turn off the first and second switches and the transistor 203. Alternatively, in the case where each of the first and second switches and the transistor 203 is a P-channel transistor, an H level of the scan signal is a potential which can turn off the first and second switches and the transistor 203, and an L level of the scan signal is a potential which can turn on the first and second switches and the transistor 203. Note that the video signal has analog voltage. Note that the present invention is not limited to this, the video signal may have digital voltage. Alternatively, the video signal may be current. In addition, current of the video signal may be either analog or digital. A potential of the video signal is lower than the H level of the scan signal and higher than the L level of the scan signal.

That is, when FIGS. 3A and 3B are compared to FIGS. 1A to 1B, it can be said that FIGS. 3A and 3B correspond to the case where the transistor 203 which connects a pixel electrode of the third liquid crystal element 206 and the second wiring 210 are added to FIGS. 1A to 1C. In the case of FIGS. 1A to 1C, when some noise or leakage current enters a point where the first capacitor 207 and the second capacitor 208 are connected, electric charge is accumulated therein. Accordingly, there is a possibility that voltage applied to the liquid crystal elements is adversely affected, so that image quality is decreased. However, as shown in FIGS. 3A and 3B, when the transistor 203 is added, the accumulated electric charge can be extracted. Accordingly, defects in the image quality such as burn-in can be reduced.

Note that as described above, the on resistance of the transistor 203 is preferably higher than the on resistance of the first switch 201 and the on resistance of the second switch 202. High on resistance of a transistor corresponds to a small ratio of the channel width W to the channel length L (W/L). When the on resistance of the transistor is increased in this manner, a potential of a point where the first capacitor 207 and the second capacitor 208 are connected is determined by balance of leakage current or the like of each capacitor, each storage capacitor, or the like. Note that the present invention is not limited to this, and the first to third transistors may be formed with almost the same size and a resistor may be connected to the third transistor 203 in series.

Figure 4A:
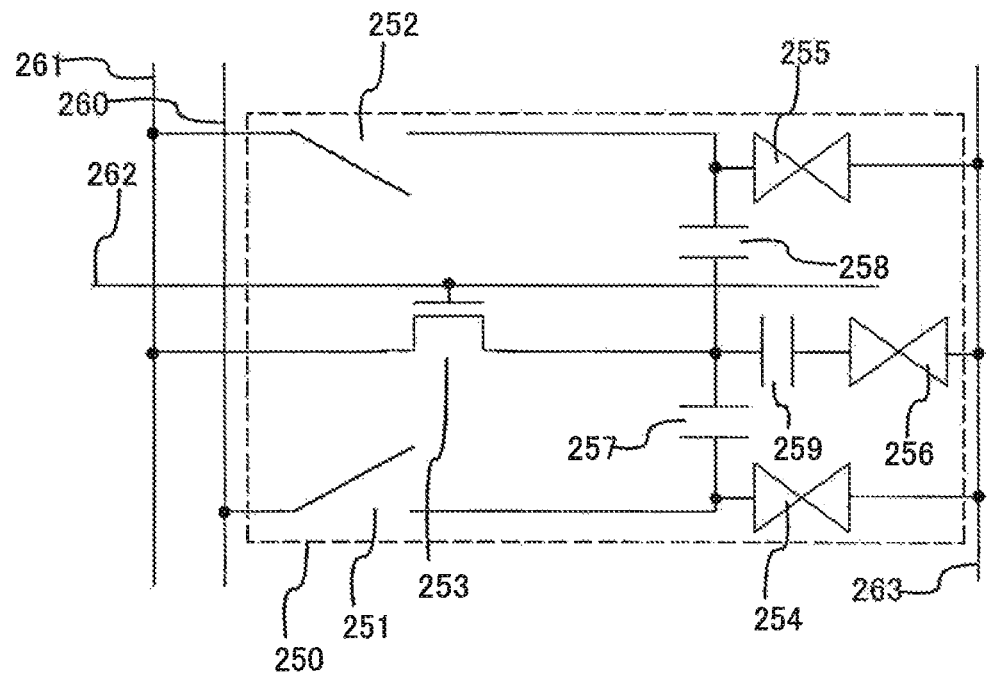
FIGS. 4A and 4B each illustrate a pixel circuit of a display device of the present invention.
Figure 4B:
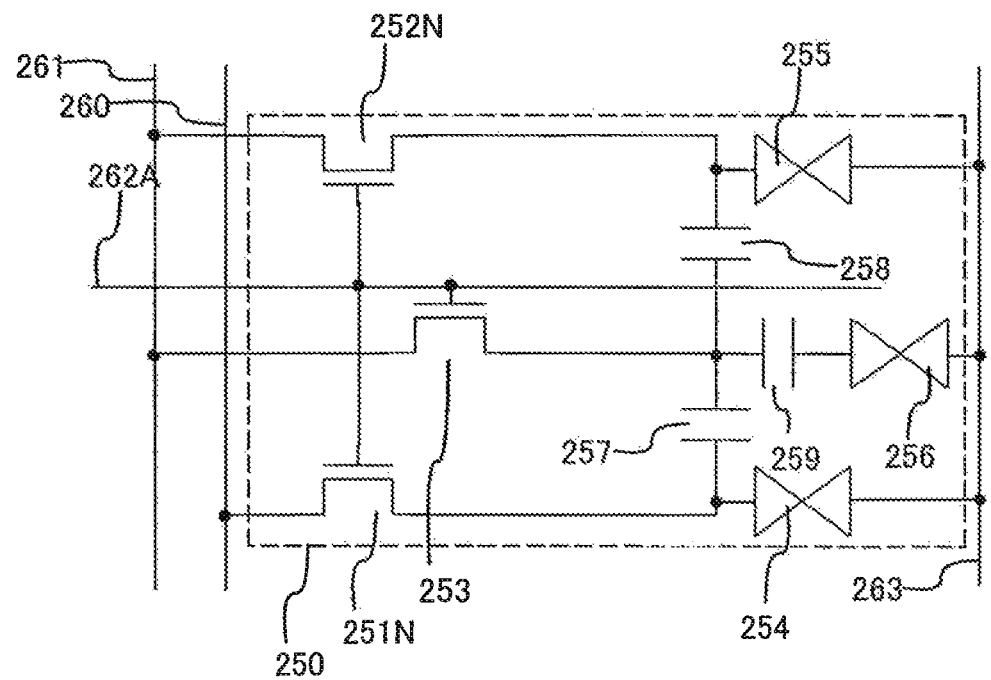

Therefore, the contents described in FIGS. 1A to 1C, FIGS. 2A and 2B, and the like can also be applied to FIGS. 3A and 3B. For example, FIGS. 4A and 4B show the case where the contents described in FIGS. 2A and 2B are applied to FIGS. 3A and 3B.

Note that although the first switch 201N (or a first switch 251N), the second switch 202N (or a second switch 252N), and the transistor 203 (or a transistor 253) are controlled by the third wiring 211 (or a third wiring 262) in FIGS. 3A and 3B, FIGS. 4A and 4B, and the like, the present invention is not limited to this. They may be connected to different wirings and controlled differently. Alternatively, part of them may be connected to another wiring.

Note that although the transistor 203 is connected to the second wiring 210 in FIGS. 3A and 3B, the transistor 203 may be connected to the first wiring 209. The same can be said for the case where the third transistor 203 is connected to the first wiring 209. Although the transistor 253 is connected to a second wiring 261 in FIGS. 4A and 4B in a similar manner that in FIGS. 3A and 3B, the transistor 253 may be connected to a first wiring 260.

Figure 5A:
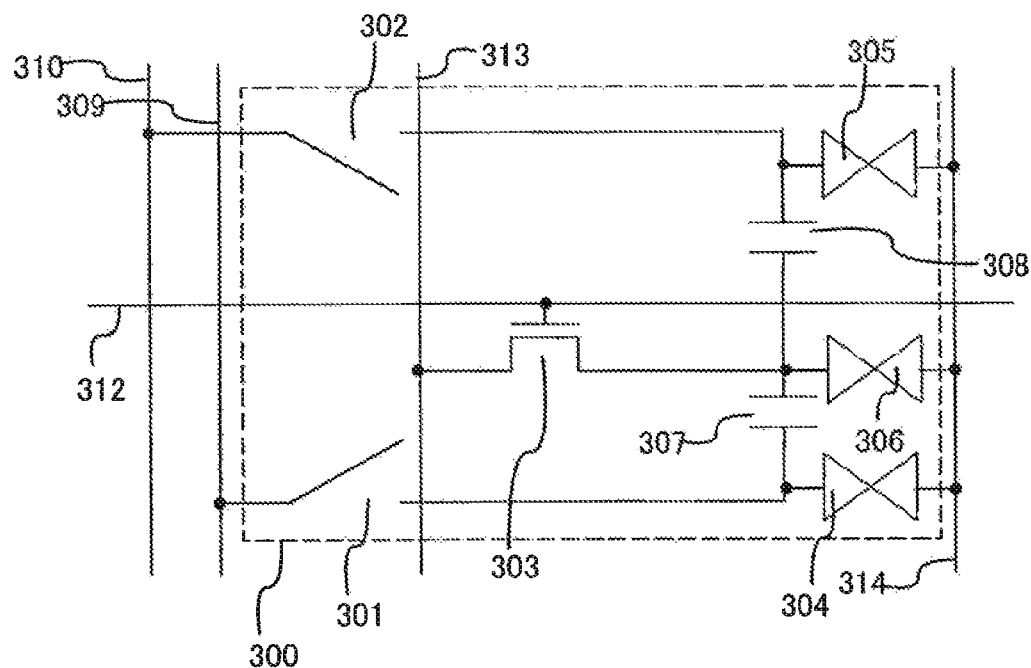
FIGS. 5A and 5B each illustrate a pixel circuit of a display device of the present invention.
Figure 5B:
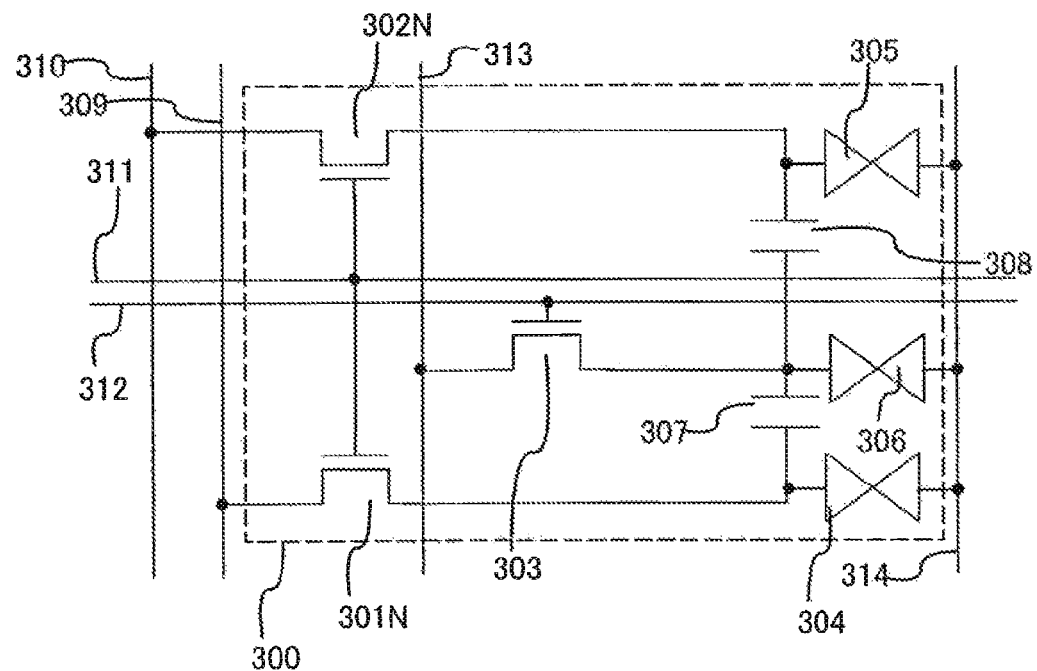
Figure 6A:
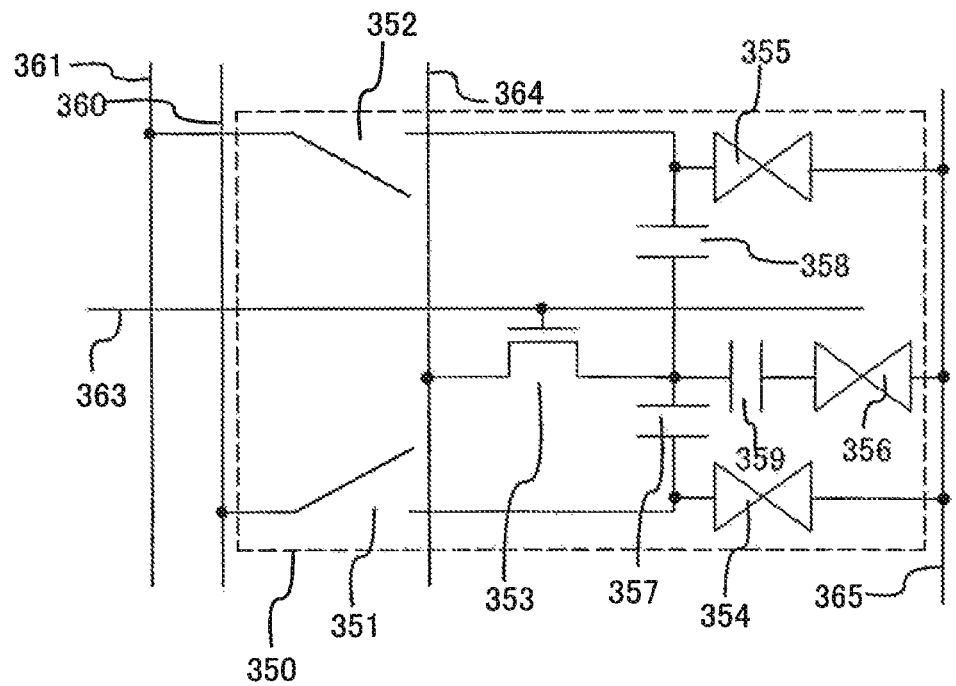
FIGS. 6A and 6B each illustrate a pixel circuit of a display device of the present invention.
Figure 6B:
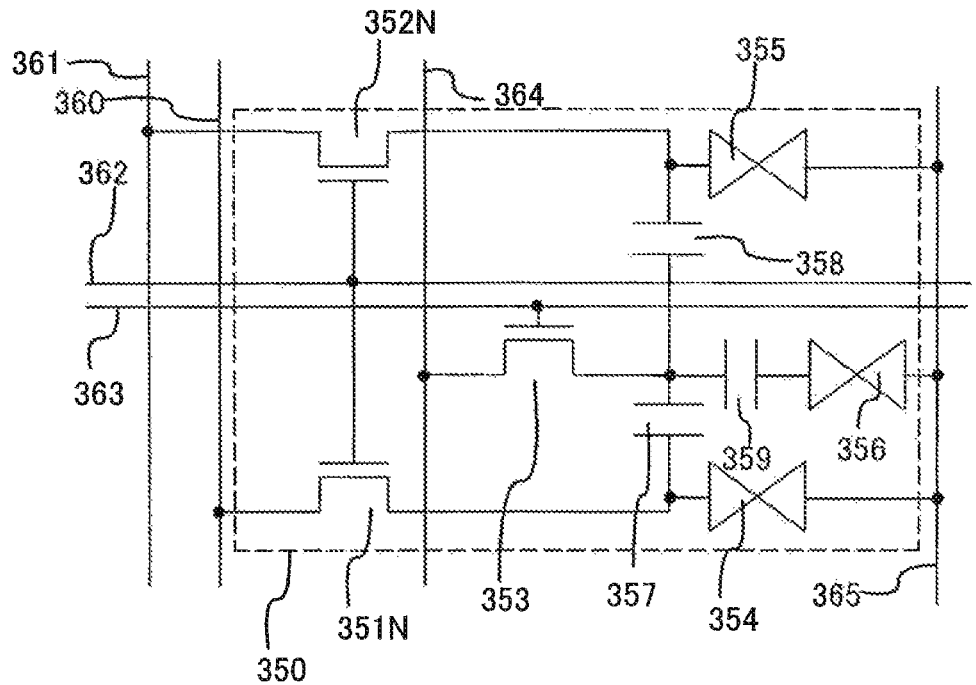

Alternatively, another wiring for connecting the transistor may be provided. FIGS. 5A and 5B, each show such a case. In FIG. 5B, the number of scan lines is two, and a scan line for controlling a first switch 301N and a second switch 302N is different from a scan line for controlling a transistor 303; however, the present invention is not limited to this. The first switch 301N, the second switch 302N, and the transistor 303 may be connected to the same scan line. Therefore, the contents described in drawings other than FIGS. 1A to 1C and the like can also be applied to FIG. 5B. For example, FIGS. 6A and 6B show the case where the contents described in FIG. 5B are applied to FIGS. 2A and 2B.

Note that although the transistor 303 is preferably turned on when a first switch 301 or a second switch 302 is off in FIG. 5A, the present invention is not limited to this. The transistor 303 may be turned on when the first switch 301 or the second switch 302 is on or in part of a period (preferably the first half of the period) during which the first switch 301 or the second switch 302 is on.

Note that although it is preferable that a potential of a fifth wiring 313 be almost equal to a potential of a common electrode, the present invention is not limited to this. The potential of the fifth wiring 313 can be almost equal to a potential of a first wiring 309 or a second wiring 310.

Note that the fifth wiring 313 can be shared with another wiring. For example, the fifth wiring 313 can be shared with a capacitor line, a scan line, or the like. Note that a wiring with which the fifth wiring 313 is shared may be a wiring in another pixel. Thus, the aperture ratio can be improved. Note that the contents described in drawings other than FIGS. 1A to 1C and the like can also be applied to FIGS. 5A and 5B. That is, at least one transistor may be a P-channel transistor, or liquid crystal elements may be divided into a plurality of elements.

Note that a transistor 353 is connected to a third capacitor 359 in FIGS. 6A and 6B, the present invention is not limited to this. The transistor 353 may be connected between a fifth wiring 364 and a contact point between the third capacitor 359 and a third liquid crystal element 356. Note that the contents described in drawings other than FIGS. 1A to 1C and the like can also be applied to FIGS. 6A and 6B.

Note that each of the first to third liquid crystal elements has transmittivity in accordance with a video signal.

As described above, when liquid crystal elements are aligned differently, the viewing angle can be widened.

Note that the case where the number of capacitors connected between the signal lines through the switch is two has been described heretofore, the present invention is not limited to this. Much more capacitors can be provided. When a capacitor is added, voltage applied to the liquid crystal elements can be further varied. In addition, when the voltage is applied to each of the liquid crystal elements, much more liquid crystal elements having different applied voltage can be provided. Accordingly, the viewing angle can be widened.

Figure 9A:
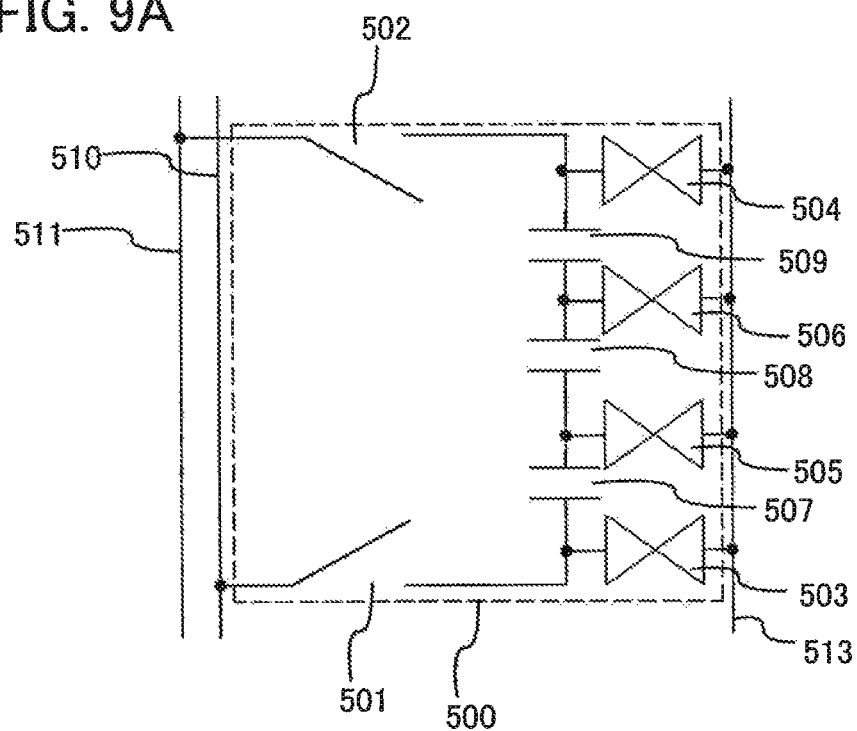
FIGS. 9A and 9B each illustrate a pixel circuit of a display device of the present invention.
Figure 9B:
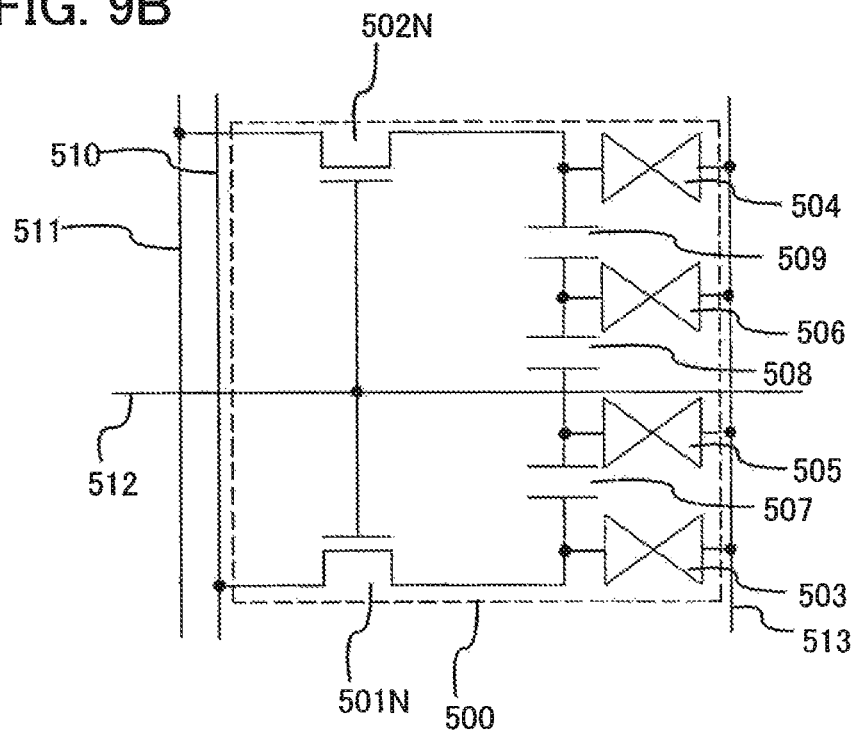
Figure 20A:
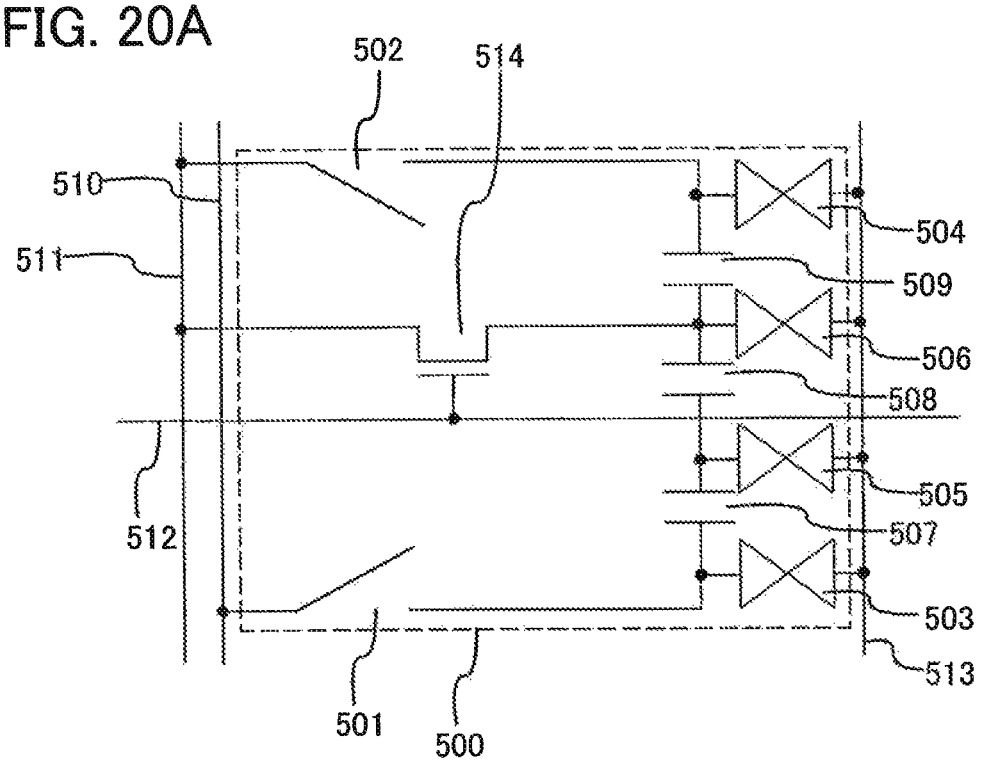
FIGS. 20A and 20B each illustrate a pixel circuit of a display device of the present invention.
Figure 20B:
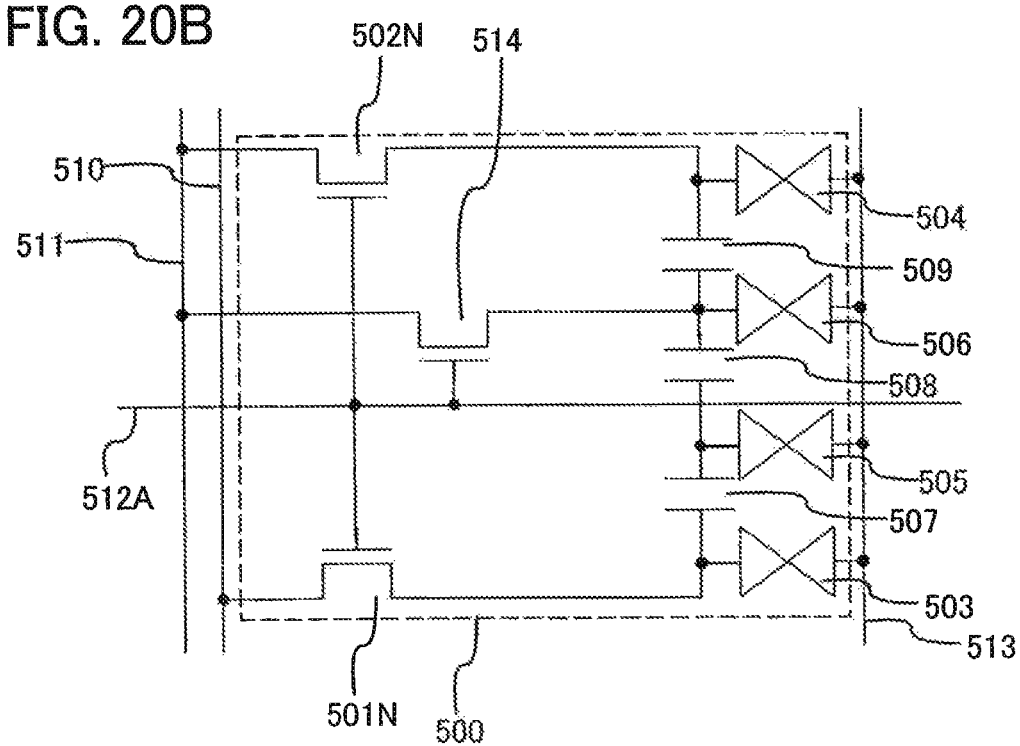

Then, FIGS. 9A and 9B show an example of the case where a capacitor and a liquid crystal element are further added to FIGS. 1A to 1C. In addition, FIGS. 20A and 20B show an example of the case where a capacitor and a liquid crystal element are further added to FIGS. 3A and 3B. Much more liquid crystal elements may be added. Further, similarly, a first liquid crystal 503 may be connected to a third liquid crystal element 505. Similarly, in the circuits shown in other drawings, a capacitor and a liquid crystal element can be added. Note that the contents described in other drawings can also be applied to FIGS. 9A and 9B and FIGS. 20A and 20B.

In FIG. 9A, a pixel 500 includes a first switch 501, a second switch 502, a first liquid crystal element 503, a second liquid crystal element 504, a third liquid crystal element 505, a fourth liquid crystal element 506, a first capacitor 507, a second capacitor 508, a third capacitor 509, a first wiring 510, a second wiring 511, and a third wiring 512.

A first wiring 510 is connected to a first electrode of the first liquid crystal element 503 and a first electrode of the first capacitor 507 through the first switch 501. A second wiring 511 is connected to a first electrode of the second liquid crystal element 504 and a first electrode of the third capacitor 509 through the second switch 502. A second electrode of the first capacitor 507 is connected to a first electrode of the second capacitor 508 and a first electrode of the third liquid crystal element 505. A second electrode of the second capacitor 508 is connected to a second electrode of the third capacitor 509 and a first electrode of the fourth liquid crystal element 506.

Second electrodes of the first liquid crystal element 503, the second liquid crystal element 504, the third liquid crystal element 505, and the fourth liquid crystal element 506 are connected to a common electrode.

Each of the first wiring 510 and the second wiring 511 functions as a signal line. Therefore, an image signal is usually supplied to each of the first wiring 510 and the second wiring 511. Note that the present invention is not limited to this. A certain signal may be supplied regardless of an image. The third wiring 512 functions as a scan line.

Each of the first switch 501 and the second switch 502 is not particularly limited to a certain type as long as it functions as a switch. For example, in the case of using a transistor, the transistor may be either a P-channel transistor or an N-channel transistor.

FIG. 9B shows the case where an N-channel transistor is used as a switch. In FIG. 9B, gates of a first switch 501N and a second switch 502N are connected to the third wiring 512. The third wiring 512 functions as a scan line.

Note that in FIGS. 9A and 9B, the number of scan lines may be two in a similar manner that in FIGS. 1A to 1C, as shown in FIG. 49.

Note that a P-channel transistor can be used as a switch.

Note that a switch is not limited to a transistor. Various elements such as diodes can be used as a switch.

Figure 11A:
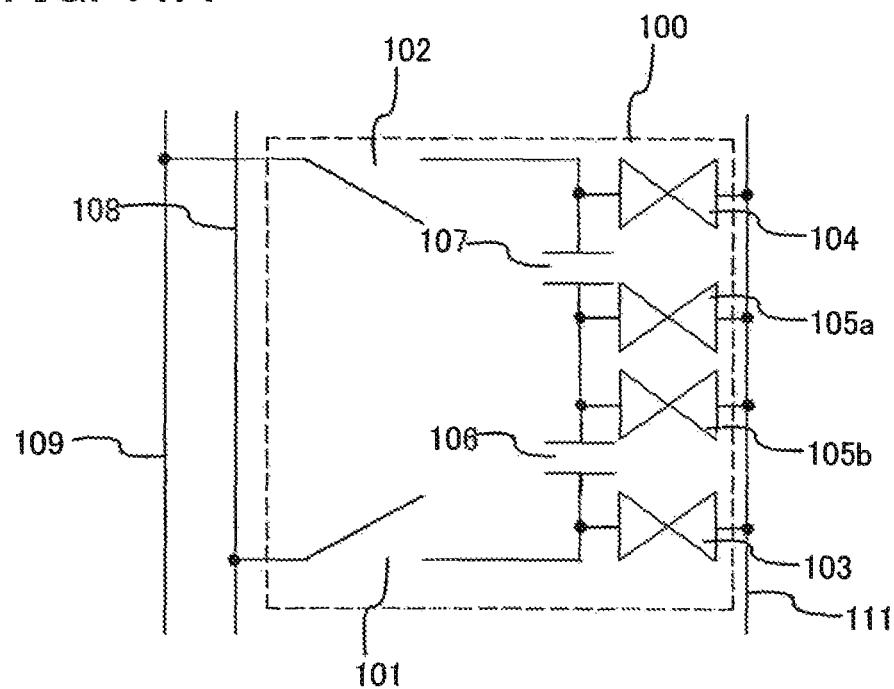
FIGS. 11A and 11B each illustrate a pixel circuit of a display device of the present invention.
Figure 11B:
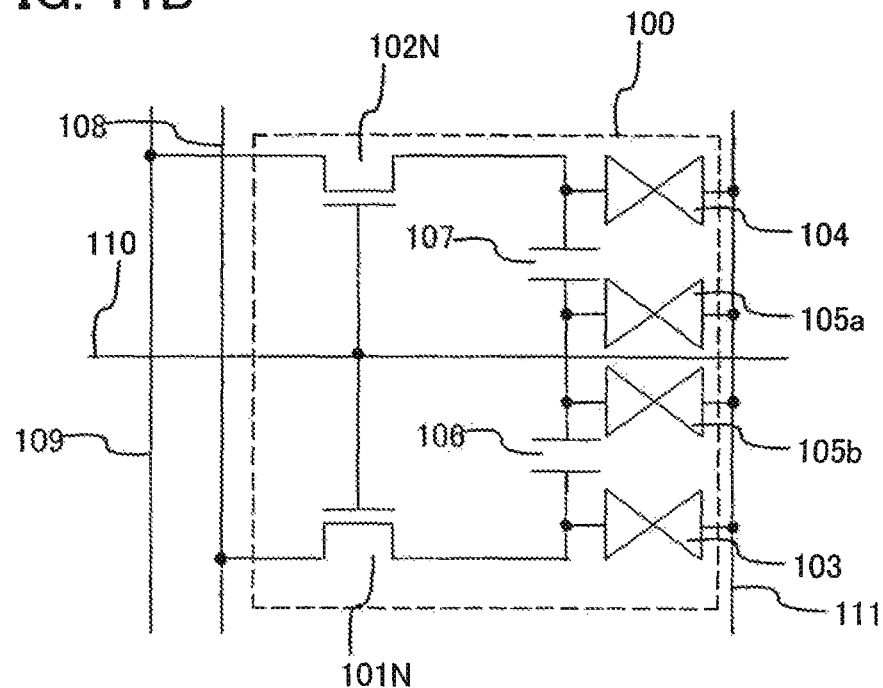

Further, the liquid crystal elements may be divided into a plurality of elements, as shown in FIGS. 11A and 11B and the like.

Note that each of the first liquid crystal element 503, the second liquid crystal element 504, the third liquid crystal element 505, and the fourth liquid crystal element 506 has transmittivity in accordance with a video signal.

As described above, the number of liquid crystal elements in each pixel can be four and the number of liquid crystal elements in each pixel can be further increased. When the number of liquid crystal elements in each pixel is increased, liquid crystal elements can be aligned differently, so that a liquid crystal display device having a wider viewing angle can be provided.

Figure 10A:
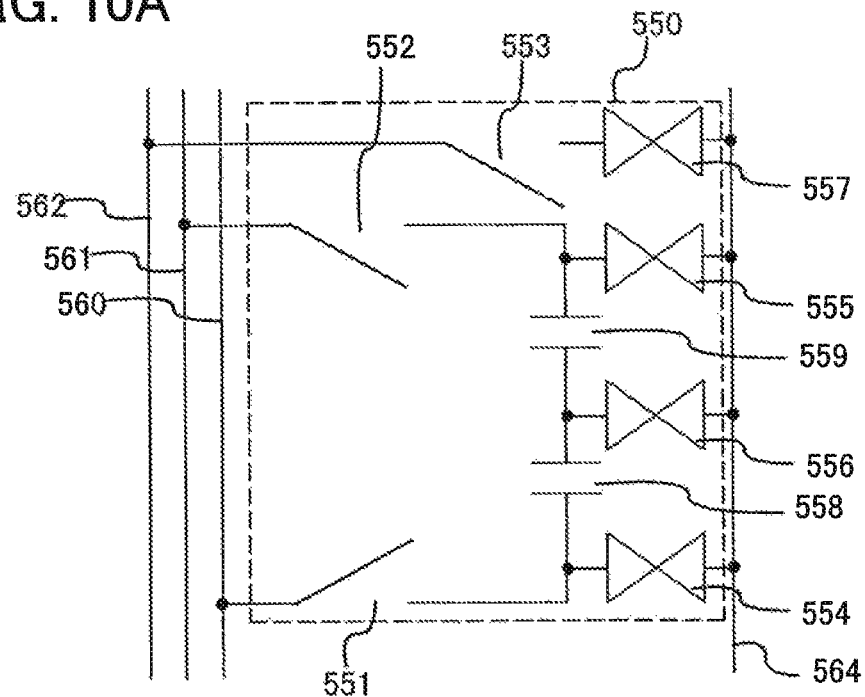
FIGS. 10A and 10B each illustrate a pixel circuit of a display device of the present invention.
Figure 10B:
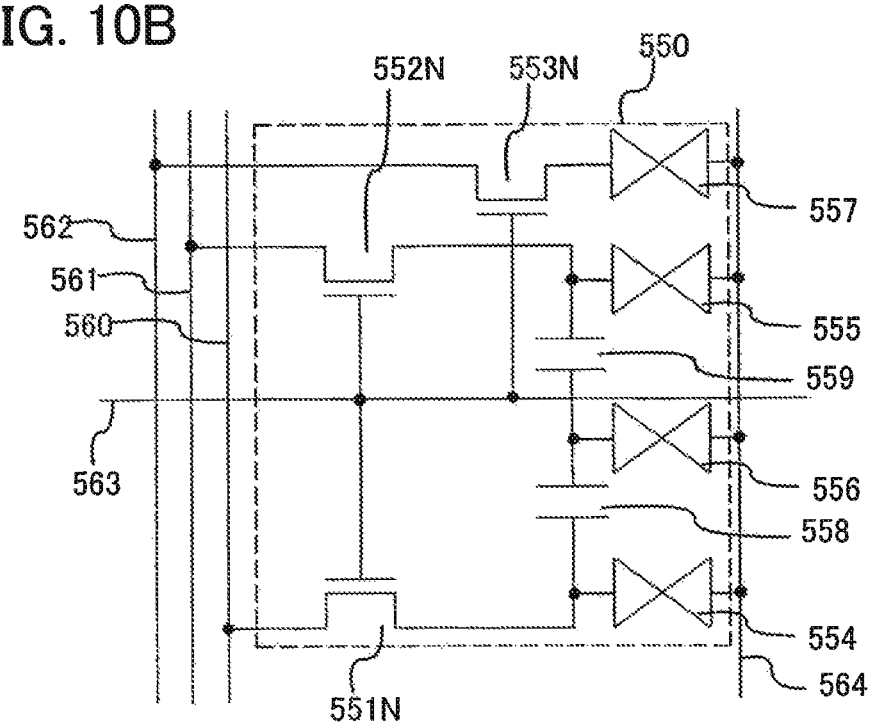
Figure 21A:
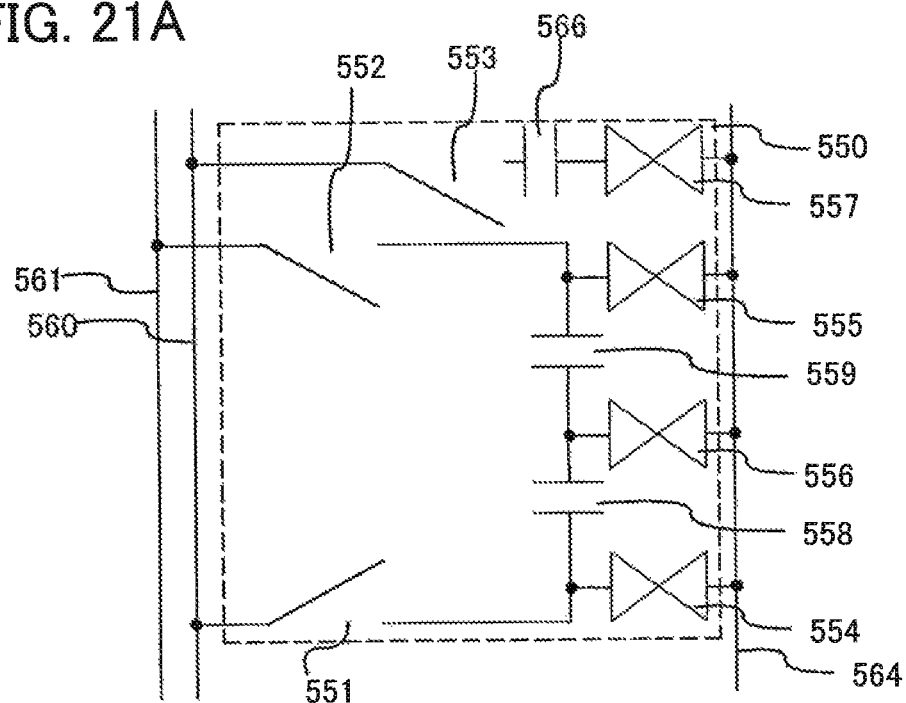
FIGS. 21A and 21B each illustrate a pixel circuit of a display device of the present invention.
Figure 21B:
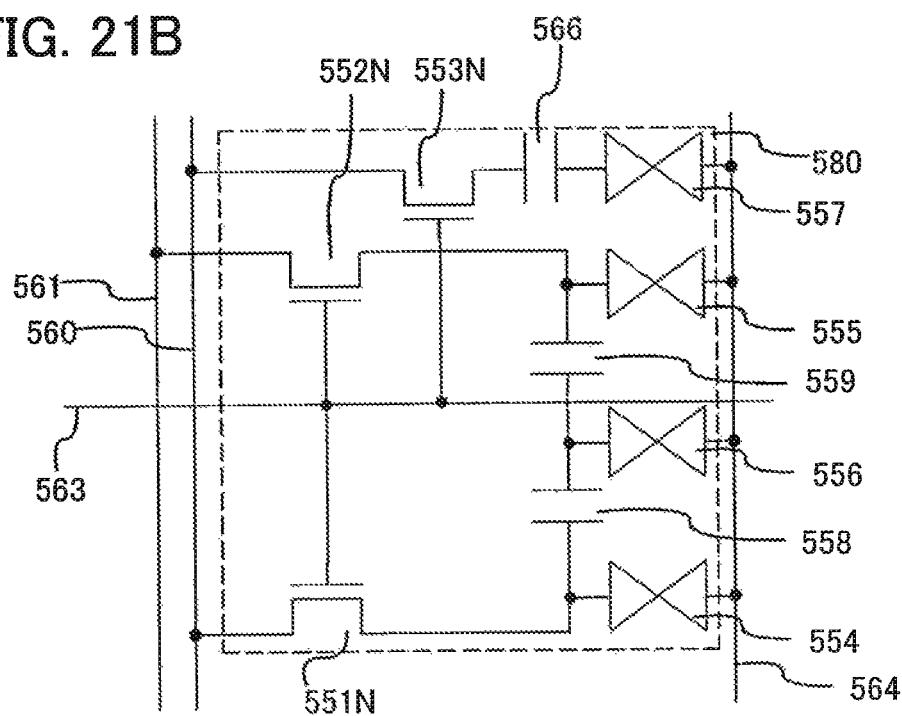
Figure 22A:
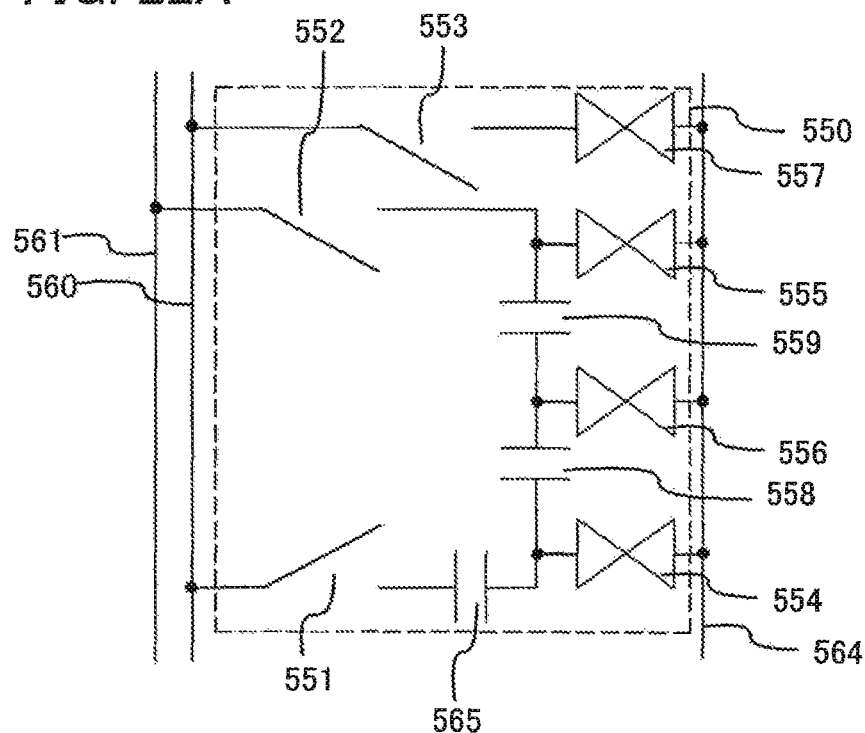
FIGS. 22A and 22B each illustrate a pixel circuit of a display device of the present invention.
Figure 22B:
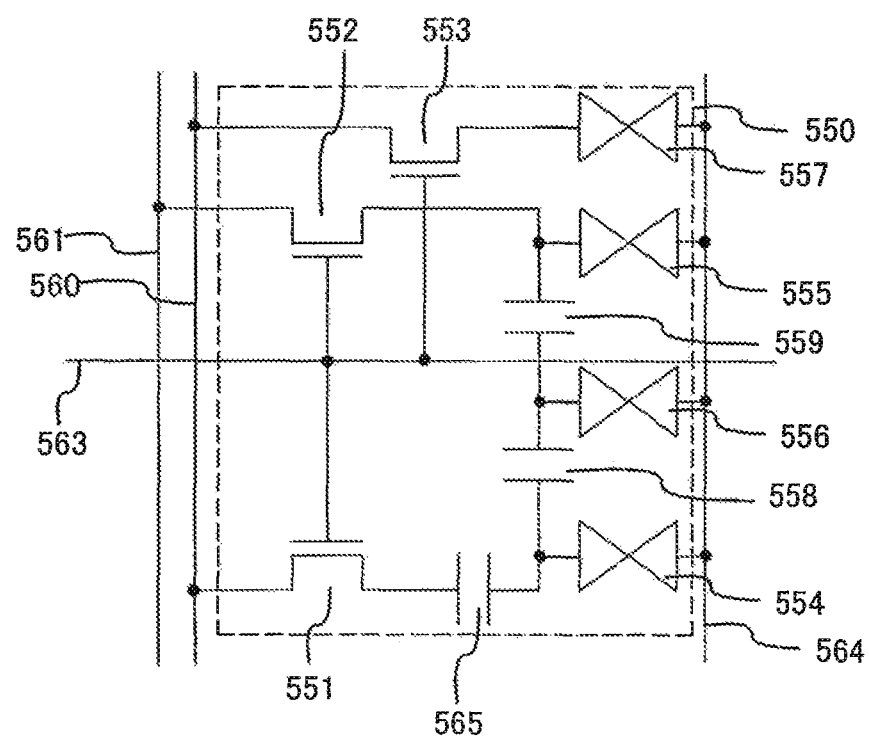

Note that in FIGS. 9A and 9B and FIGS. 20A and 20B, the case is described in which a liquid crystal element is added by adding a capacitor. Note that the present invention is not limited to this. When the number of transistors, signal lines, and the like is increased, the number of liquid crystal elements provided in one pixel can be increased. Thus, for example, FIGS. 10A and 10B show the case where a liquid crystal element is added to the circuits in FIGS. 1A to 1C by increasing the number of transistors and signal lines. Note that the present invention is not limited to this structure. Although a signal line is added without adding a scan line in FIGS. 10A and 10B, a scan line can be added without adding a signal line. FIGS. 21A and 21B show the case where a capacitor 566 is added without adding a signal line and is provided between a fourth liquid crystal element 557 and a signal line, so that a potential supplied from the signal line is divided. FIGS. 22A and 22B show the case where a capacitor is added without adding a signal line and a capacitor 572 is added between a signal line and a first liquid crystal element 554, so that a potential supplied from the signal line is divided. With the structures shown in FIGS. 21A and 21B and FIGS. 22A and 22B, different voltage can be applied to four liquid crystal elements without adding a signal line.

Note that although the fourth liquid crystal element 557 is connected to a first wiring 560 in FIGS. 21A and 21B and FIGS. 22A and 22B, the fourth liquid crystal element 557 may be connected to the second wiring 561.

Note that in a similar manner that in the case in FIGS. 1A to 1C, a liquid crystal element may be added to the circuits shown in other drawings. Note that the contents described in other drawings can also be applied to FIGS. 10A and 10B. That is, P-channel transistors may be used as the transistors, or the liquid crystal element may be divided into a plurality of elements.

In FIG. 10A, a pixel 550 includes a first switch 551, a second switch 552, a third switch 553, a first liquid crystal element 554, a second liquid crystal element 555, a third liquid crystal element 556, a fourth liquid crystal element 557, a first capacitor 558, and a second capacitor 559.

The first wiring 560 is connected to a first electrode of the first liquid crystal element 554 and a first electrode of the first capacitor 558 through the first switch 551. A second wiring 561 is connected to a first electrode of the second liquid crystal element 555 and a first electrode of the second capacitor 559. A third wiring 562 is connected to a first electrode of the fourth liquid crystal element 557 through the third switch 553. A second electrode of the first capacitor 558 is connected to one of a second electrode of the second capacitor 559 and a first electrode of the third liquid crystal element 556.

FIG. 10B shows the case where an N-channel transistor is used as a switch. In FIG. 10B, gates of a first switch 551N and a second switch 552N are connected to a fourth wiring 563. The fourth wiring 563 functions as a scan line.

Note that in FIGS. 10A and 10B, the number of scan lines may be two in a similar manner that in FIGS. 1A to 1C, as shown in FIG. 49.

Note that a P-channel transistor can be used as a switch.

Note that a switch is not limited to a transistor. Various elements such as diodes can be used as a switch.

Further, the liquid crystal element may be divided into a plurality of elements, as shown in FIGS. 11A and 11B and the like.

Second electrodes of the first liquid crystal element 554, the second liquid crystal element 555, the third liquid crystal element 556, and the fourth liquid crystal element 557 are connected to a common electrode.

Each of the first wiring 560, the second wiring 561, and the third wiring 562 functions as a signal line. Therefore, an image signal is usually supplied to each of first wiring 560, the second wiring 561, and the third wiring 562. Note that the present invention is not limited to this. A certain signal may be supplied regardless of an image. The fourth wiring 563 functions as a scan line.

Note that a capacitor may be provided between the liquid crystal element and the wiring functioning as a signal line. When a capacitor 566 is provided as shown in FIGS. 21A and 21B, voltage applied to the liquid crystal elements can be varied. Therefore, the first wiring 560 and the third wiring 562 in FIGS. 10A and 10B can be put into one wiring.

Note that the position to which a capacitor is added is not limited to the position between the fourth liquid crystal element and the signal line, and as shown in FIGS. 22A and 22B, a capacitor (e.g., a capacitor 565) may be provided between another liquid crystal element and a signal line. In this case, a plurality of signal lines can be put into one wiring.

As described above, the number of liquid crystal elements in each pixel can be four and the number of liquid crystal elements in each pixel can be further increased. When the number of liquid crystal elements in each pixel is increased, liquid crystal elements can be aligned differently, so that a liquid crystal display device having a wider viewing angle can be provided.

Figure 32:
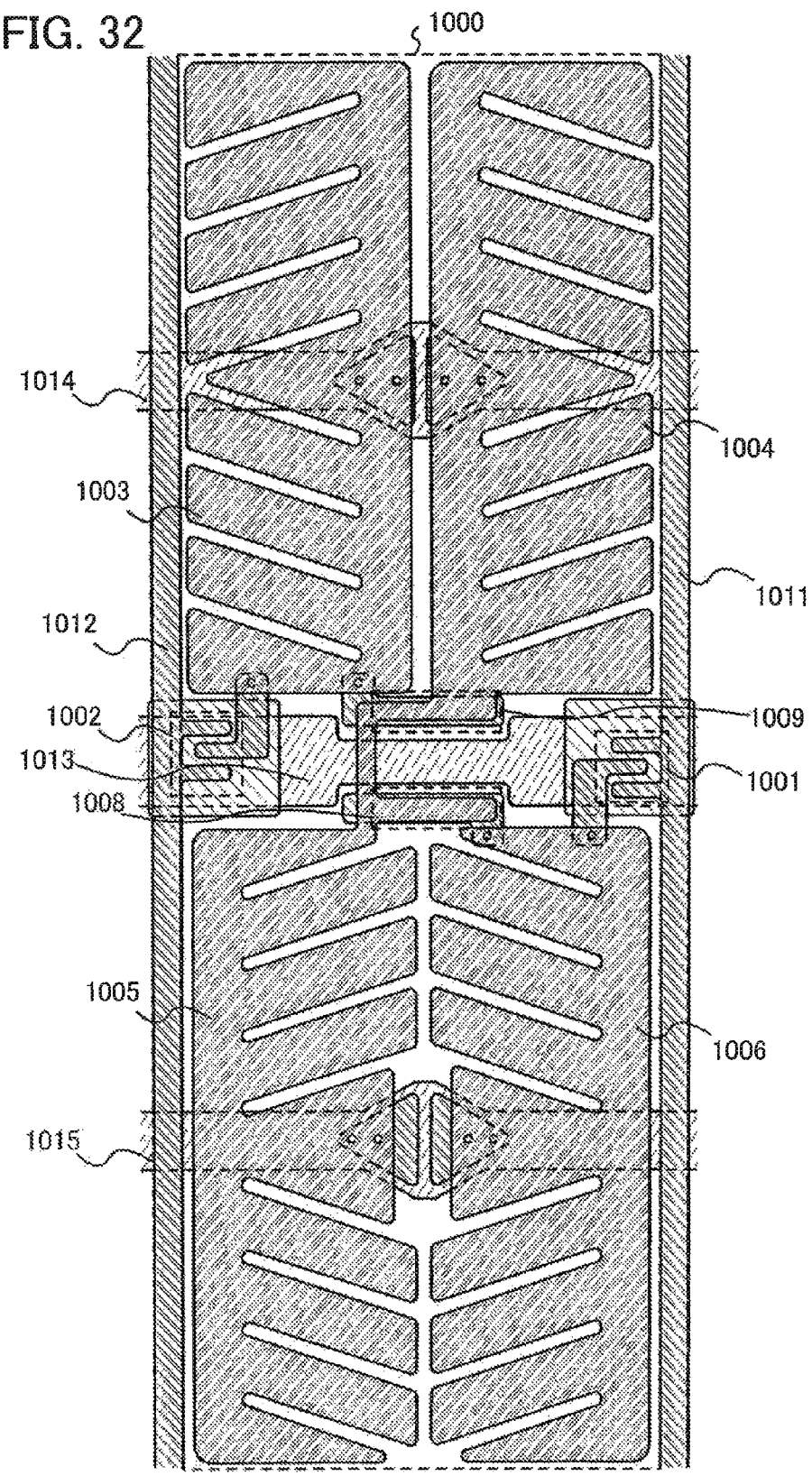
FIG. 32 illustrates an example of a top surface layout of a pixel included in a display device of the present invention.
Figure 33:
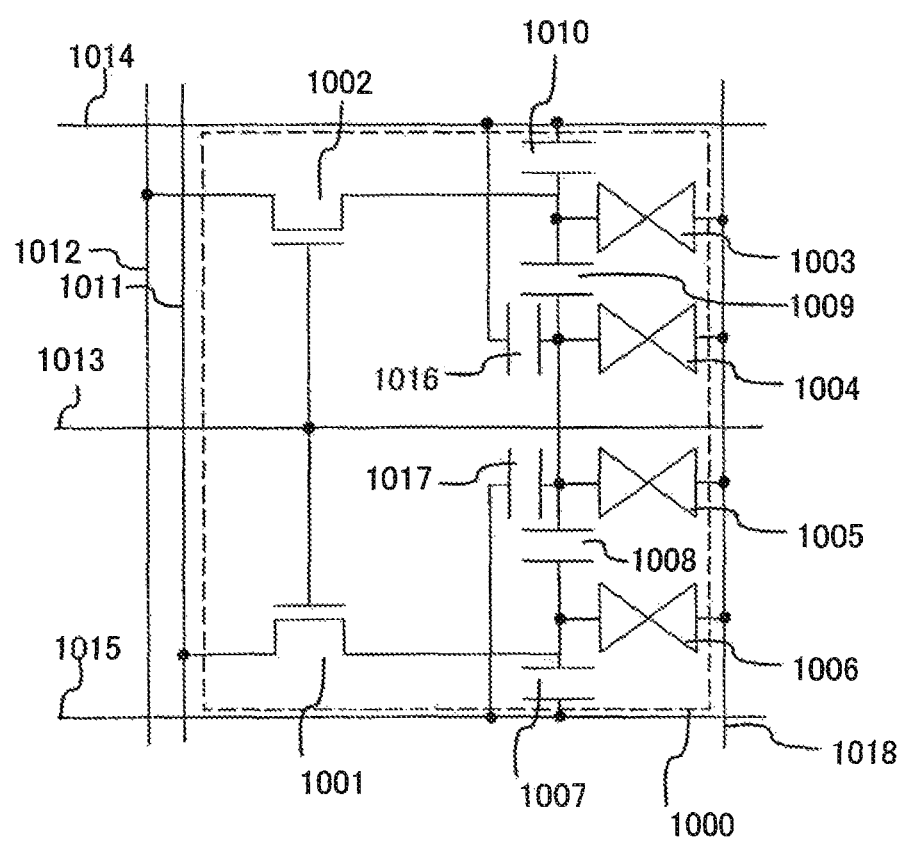
FIG. 33 illustrates a pixel circuit of a display device of the present invention.

FIG. 32 shows an example of a top view of a pixel of a liquid crystal display device to which the present invention is applied. In addition, FIG. 33 is a circuit diagram of FIG. 32. Note that corresponding portions between FIGS. 32 and 33 are denoted by the same reference numerals.

In a pixel 1000 shown in FIG. 32, a first insulating film (not shown) is provided over a first conductive layer (shown by a hatch pattern of a third wiring 1013) serving as a scan line and a capacitor line; a semiconductor film is provided over the first insulating film; a second conductive layer (shown by a hatch pattern of a first wiring 1011) is provided over the semiconductor film; a second insulating film (not shown) is provided over the second conductive layer; and a third conductive layer (shown by a hatch pattern of a first liquid crystal element 1003) is provided over the second insulating film.

In FIG. 33, the pixel 1000 includes a first transistor 1001, a second transistor 1002, a first liquid crystal element 1003, a second liquid crystal element 1004, a third liquid crystal element 1005, a first capacitor 1007, a second capacitor 1008, a third capacitor 1009, a fourth capacitor 1010, a fifth capacitor 1016, and a sixth capacitor 1017.

The first wiring 1011 is connected to a first electrode of the fourth liquid crystal element 1006 and first electrodes of the first capacitor 1007 and the second capacitor 1008 through the first transistor 1001. A second wiring 1012 is connected to a first electrode of the first liquid crystal element 1003 and first electrodes of the fourth capacitor 1010 and the third capacitor 1009 through the second transistor 1002. A second electrode of the second capacitor 1008 is connected to a second electrode of the third capacitor 1009, a first electrodes of the fifth capacitor 1016, a first electrode of the second liquid crystal element 1004, a first electrodes of the sixth capacitor 1017, and a first electrode of the third liquid crystal element 1005. A second electrode of the first capacitor 1007 and a second electrode of the sixth capacitor 1017 are connected to a fifth wiring 1015. A second electrode of the fifth capacitor 1016 and a second electrode of the fourth capacitor 1010 are connected to a fourth wiring 1014.

Note that FIG. 33 shows the case where each of the liquid crystal elements in FIG. 11B are provided with a storage capacitor. That is, FIG. 33 shows the case where the contents described in FIGS. 11B and 16B are combined. Therefore, structures which are similar to the structures in FIGS. 1A to 1C can be applied to FIG. 33. In other words, a wiring functioning as a capacitor line may be shared with a common electrode as shown in FIGS. 50A and 50B, the switches can be replaced with transistors, and either N-channel transistors or P-channel transistors may be used as the transistors.

Note that a switch is not limited to a transistor. Various elements such as diodes can be used as a switch.

Each of the first wiring 1011 and the second wiring 1012 functions as a signal line. Therefore, an image signal is usually supplied to each of the first wiring 1011 and the second wiring 1012. Note that the present invention is not limited to this. A certain signal may be supplied regardless of an image. The third wiring 1013 functions as a scan line. Each of the fourth wiring 1014 and the fifth wiring 1015 functions as a capacitor line.

When a pixel like the pixel shown in the top view in FIG. 32 is provided, liquid crystal elements can be aligned differently, so that a liquid crystal display device having a wider viewing angle can be provided.

Note that although the case in which all the transistors provided in one pixel have the same conductivity type is only described in this embodiment mode, the present invention is not limited to this. That is, the transistors provided in one pixel may have different conductivity types.

Further, various types of transistors can be used as the transistor in this embodiment mode, without particularly limiting to a certain type. Therefore, a thin film transistor (TFT) formed by using a crystalline semiconductor film, a thin film transistor formed by using a non-single crystal semiconductor film typified by amorphous silicon or polycrystalline silicon, a transistor formed by using a semiconductor substrate or an SOI substrate, a MOS transistor, a junction transistor, a bipolar transistor, a transistor formed by using a compound semiconductor such as ZnO or a-InGaZnO, a transistor formed by using an organic semiconductor or carbon nanotube, or other transistors can be employed. However, a transistor with smaller off-current is preferably used. Examples of a transistor with smaller off-current are a transistor provided with an LDD region, a transistor with a multi-gate structure, and the like. Alternatively a CMOS switch may be employed by using both N-channel and P-channel transistors.

Note that although this embodiment mode is described with reference to various drawings, part of or all the contents described in each drawing can be freely applied to, combined with, or replaced with part of or all the contents described in another drawing. Further, even more structures are possible when each part is combined with another part in the above-described drawings, and the description of this embodiment mode does not impede this.

Similarly, part of or all the contents described in each drawing of this embodiment mode can be freely applied to, combined with, or replaced with part of or all the contents described in a drawing in another embodiment mode. Further, even more drawings are possible when each part is combined with part of another embodiment mode in the drawings of this embodiment mode, and the description of this embodiment mode does not impede this.

Note that this embodiment mode shows an example of an embodied case of part of or all the contents described in other embodiment modes, an example of slight transformation thereof, an example of partial modification thereof, an example of improvement thereof, an example of detailed description thereof, an application example thereof, or an example of related part thereof. Therefore, the contents described in other embodiment modes can be freely applied to, combined with, or replaced with this embodiment mode.

(Embodiment Mode 2)

In Embodiment Mode 1, new voltage is produced by voltage division by using a capacitor and is supplied to a liquid crystal element. Note that an element for producing new voltage is not limited to a capacitor. Various elements such as a divider element, an element which converts current into voltage, a non-linear element, an element having a resistance component, an element having a capacitance component, an inductor, a diode, a transistor, a resistor, and a switch can be used. In addition, when these elements are connected in series or in parallel in combination, a desired circuit can be realized. Such an element is referred to as a divider element.

Figure 23A:
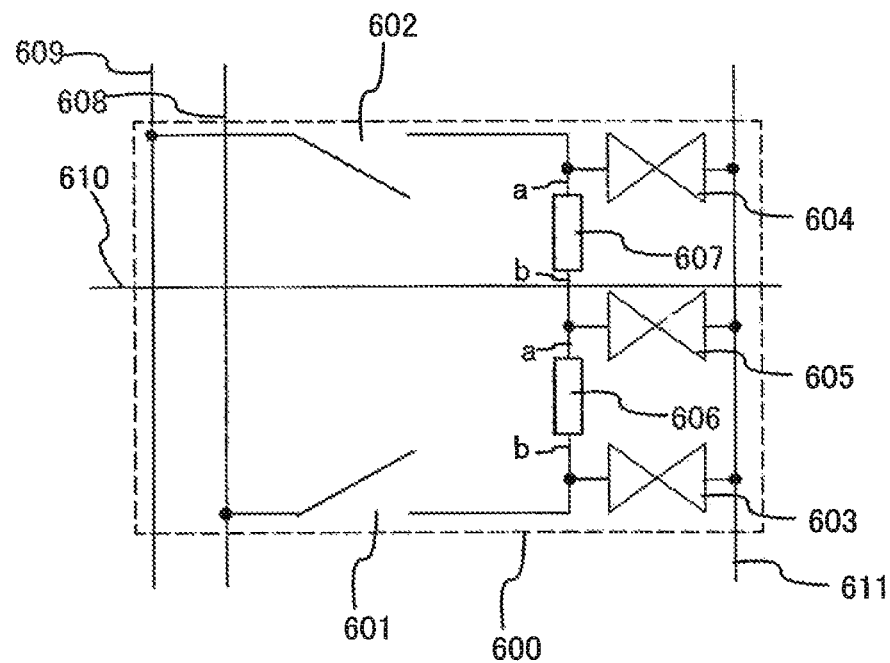
FIGS. 23A and 23B each illustrate a pixel circuit of a display device of the present invention.
Figure 23B:
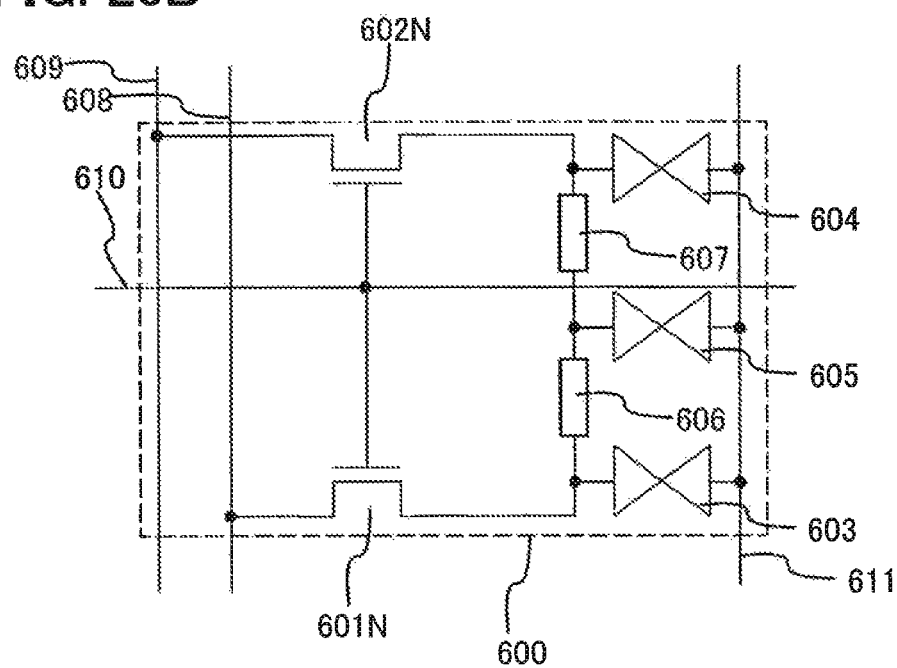

FIGS. 23A and 23B show the case where the capacitors in FIGS. 1A to 1C are generalized as divider elements. Therefore, the contents described in Embodiment Mode 1 can also be applied to FIGS. 23A and 23B.

FIG. 23A shows an example of a structure of a pixel circuit included in a liquid crystal display device of the present invention. A pixel 600 includes a first switch 601, a second switch 602, a first liquid crystal element 603, a second liquid crystal element 604, a third liquid crystal element 605, a first divider element 606, and a second divider element 607.

A first wiring 608 is connected to a first electrode of the first liquid crystal element 603 and one electrode of the first divider element 606 through the first switch 601. A second wiring 609 is connected to a first electrode of the second liquid crystal element 604 and one electrode of the second divider element 607 through the second switch 602. The first divider element 606 and the second divider element 607 are connected in series. A first electrode of the third liquid crystal element 605 is connected between the first divider element 606 and the second divider element 607.

Second electrodes of the first liquid crystal element 603, the second liquid crystal element 604, and the third liquid crystal element 605 are connected to a common electrode.

FIG. 23B shows the case where an N-channel transistor is used as a switch. In FIG. 23B, gates of a first switch 601N and a second switch 602N are connected to a third wiring 610. The third wiring 610 functions as a scan line.

Note that in FIGS. 23A and 23B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

Each of the first wiring 608 and the second wiring 609 functions as a signal line. Therefore, an image signal is usually supplied to each of the first wiring 608 and the second wiring 609. Note that the present invention is not limited to this. A certain signal may be supplied regardless of an image. The third wiring 610 functions as a scan line.

Note that each of the first liquid crystal element 603, the second liquid crystal element 604, and the third liquid crystal element 605 has transmittivity in accordance with a video signal.

As described above, when liquid crystal elements are aligned differently, the viewing angle can be widened.

Note that as the first divider element 606 and the second divider element 607, various elements as well as capacitors can be used. For example, any of a divider element, an element which converts current into voltage, a non-linear element, an element having a resistance component, an element having a capacitance component, an inductor, a diode, a transistor, a resistor, and a switch can be used as the divider elements. FIGS. 30A to 30 T show examples of divider elements.

First, as shown in FIGS. 30J and 30K, an N-channel transistor and a P-channel transistor can be used.

FIG. 30A shows a diode-connected N-channel transistor. FIG. 30B shows a diode-connected N-channel transistor shown in FIG. 30A, the connection direction of which is reversed. FIG. 30C shows the case where the elements shown in FIGS. 30A and 30B are connected in parallel.

FIGS. 30D and 30E show the case where the N-channel transistors shown in FIGS. 30A and 30B are replaced with P-channel transistors. The P-channel transistors may be connected in parallel, in a similar manner that in FIG. 30C. Alternatively, a P-channel transistor and an N-channel transistor may be connected in parallel, as shown in FIG. 30F.

FIGS. 30G and 30L each show a divider element in which a resistor and a capacitor are connected in series or in parallel.

In FIGS. 30H and 30I, a P-channel transistor or an N-channel transistor and a resistor are connected in series.

Note that wirings to which gates of transistors shown in FIGS. 30H, 30I, 30J, and 30K are connected are not particularly limited to certain wirings. The gates of the transistors shown in FIGS. 30H, 30I, 30J, and 30K may be connected to scan lines, capacitor lines, or signal lines. Alternatively, the gates of the transistors shown in FIGS. 30H, 30I, 30J, and 30K may be connected to scan lines or the like in a row which is adjacent to the pixel. When potentials of the gates are controlled, resistance values of the divider elements can be controlled.

FIGS. 30M and 30N each show a diode. There are various kinds of diodes, and diodes which can be used as the divider elements are not particularly limited to certain types. For example, a PN diode, PIN diode, a Schottky diode, an MIM diode, an MIS diode, or the like can be used. Alternatively, as shown in FIG. 30O, two diodes may be connected in parallel in a reverse direction.

Further alternatively, an inductor shown in FIG. 30P may be used, or a resistor may be used as shown in FIG. 30Q. As a resistor, a resistor having a variable resistance value may be used, as shown in FIG. 30R.

Therefore, in each of the structures described in Embodiment Mode 1, the capacitor is replaced with each of the divider elements shown in FIGS. 30A to 30T, so that a new circuit can be formed. Thus, the contents described in Embodiment Mode 1 can also be applied to FIGS. 23A and 23B and the circuit in which the capacitor is replaced with the divider element.

FIGS. 36A to 48B are circuit diagrams where the first divider element 606 and the second divider element 607 shown in FIGS. 23A and 23B are replaced with various elements shown in FIGS. 30A to 30S. Therefore, structures which are similar to the structures in FIGS. 1A to 1C can be applied to FIGS. 36A to 48B. That is, as shown in FIGS. 7A and 7B, the first electrodes of part of or all the liquid crystal elements may be connected to a capacitor line. The capacitor line may be shared with a common electrode, as shown in FIGS. 50A and 50B. The switches can be replaced with transistors, and either N-channel transistors or P-channel transistors may be used as transistors. In the case of using transistors, a gate of each transistor may be connected to the same scan line, or may be connected to different scan lines. In addition, as shown in FIGS. 11A and 11B, the liquid crystal element may be divided into a plurality of elements. The number of signal lines may be plural, or signal lines may be put into one signal line as shown in FIGS. 8A and 8B. Further, as shown in FIGS. 2A and 2B, FIGS. 12A and 12B, and the like, the divider elements may be provided in suitable positions as appropriate.

Note that a switch is not limited to a transistor. Various elements such as diodes can be used as a switch.

Note that resistance values of the divider elements are not necessarily constant, and the resistance values may be set to be varied in accordance with time or a pixel. In order to vary the resistance values, the divider elements may include transistors. In the case of using transistors, potentials of gates of the transistors may be varied in accordance with time or a pixel.

Figure 24A:
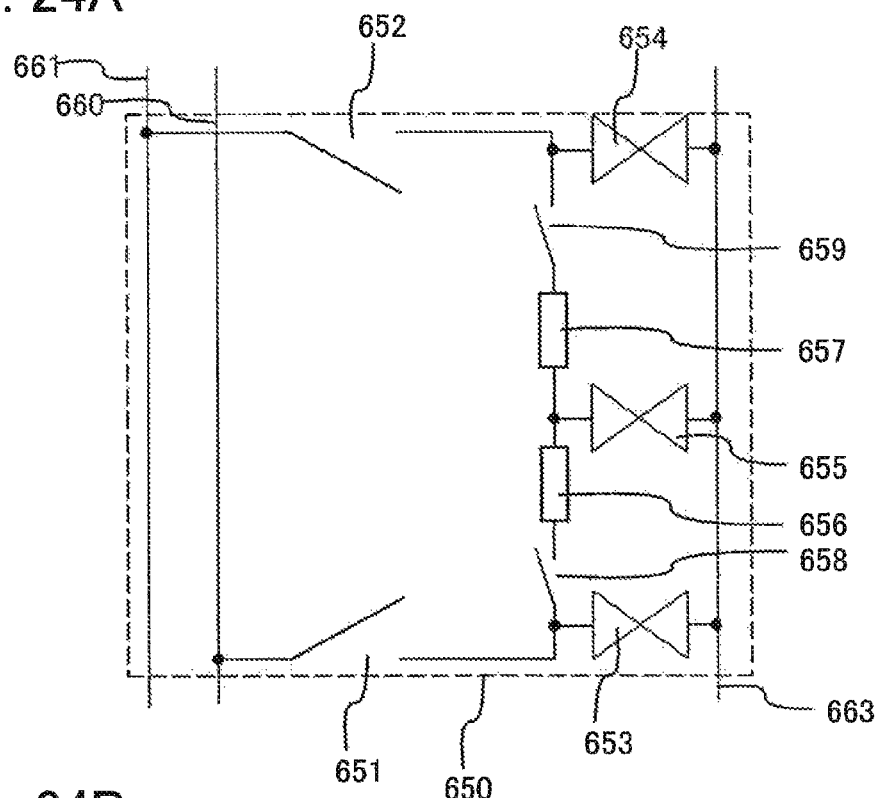
FIGS. 24A and 24B each illustrate a pixel circuit of a display device of the present invention.
Figure 24B:
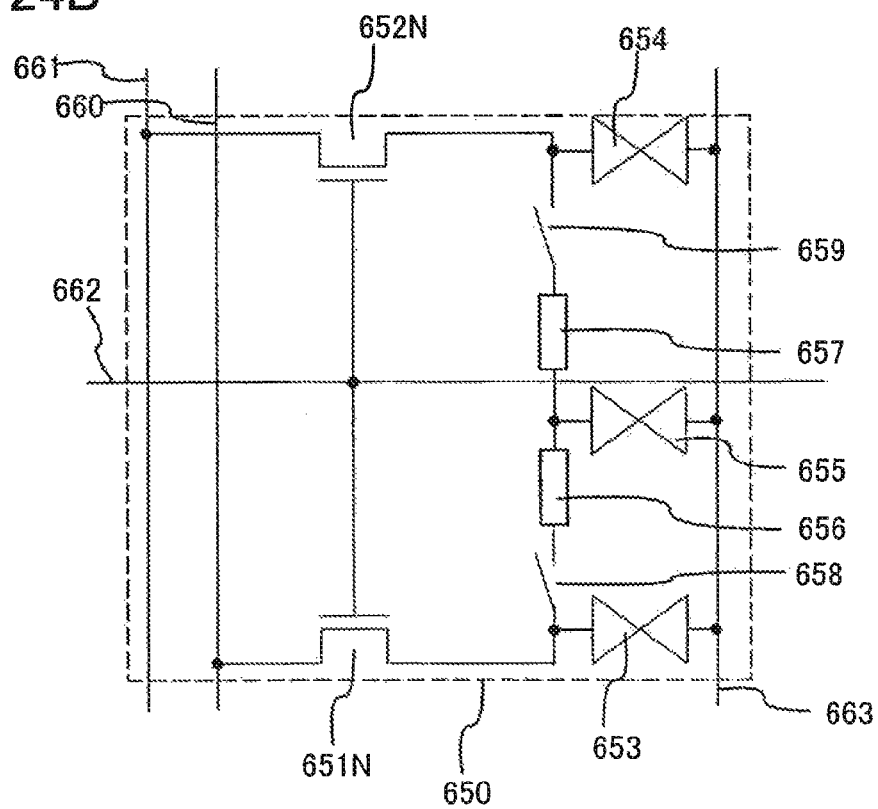

Note that when the divider element is connected between the liquid crystal elements, electric charge leaks between the respective liquid crystal elements in some cases when the signal line and the liquid crystal element are not connected. In order to prevent leakage of electric charge, the divider element and the switch are connected in series so that they may be connected between the respective liquid crystal elements. FIGS. 24A and 24B show such a case. Note that the divider element and the switch may be connected in reverse.

Note that although one divider element and one switch are provided between the liquid crystal elements, the present invention is not limited to this. A plurality of divider elements and a plurality of divider elements may be provided. Note that the contents described in Embodiment Mode 1 and FIGS. 23A and 23B can also be applied to FIGS. 24A and 24B.

A pixel 650 includes a first switch 651, a second switch 652, a first liquid crystal element 653, a second liquid crystal element 654, a third liquid crystal element 655, a first divider element 656, a second divider element 657, a third switch 658, and a fourth switch 659.

A first wiring 660 is connected to a first electrode of the first liquid crystal element 653 and one electrode of the third switch 658 through the first switch 651. A second wiring 661 is connected to a first electrode of the second liquid crystal element 654 and one electrode of the fourth switch 659. The third switch 658 and the fourth switch 659 are connected in series. The first divider element 656 and the second divider element 657 which are connected in series are provided between the third switch 658 and the fourth switch 659. A first electrode of the third liquid crystal element 655 is connected between the first divider element 656 and the second divider element 657.

Second electrodes of the first liquid crystal element 653, the second liquid crystal element 654, and the third liquid crystal element 655 are connected to a common electrode.

Each of the first wiring 660 and the second wiring 661 functions as a signal line. Therefore, an image signal is usually supplied to each of the first wiring 660 and the second wiring 661. Note that the present invention is not limited to this. A certain signal may be supplied regardless of an image. A third wiring 662 functions as a scan line.

Each of the first switch 651 and the second switch 652 is not particularly limited to a certain type as long as it functions as a switch. For example, a transistor can be used. In the case where a transistor is used as each of the first switch 651 and the second switch 652, the transistor may be either a P-channel transistor or an N-channel transistor.

Each of the third switch 658 and the fourth switch 659 is not particularly limited to a certain type as long as it functions as a switch. For example, a transistor can be used. A transistor which is used as each of the third switch 658 and the fourth switch 659 may be either a P-channel transistor or an N-channel transistor.

FIG. 24B shows the case where an N-channel transistor is used as a switch. In FIG. 24B, gates of a first switch 651N and a second switch 652N are connected to the third wiring 662. The third wiring 662 functions as a scan line.

Note that in FIGS. 24A and 24B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

Note that each of the first liquid crystal element 653, the second liquid crystal element 654, and the third liquid crystal element 655 has transmittivity in accordance with a video signal.

As described above, when liquid crystal elements are aligned differently, the viewing angle can be widened.

Next, a specific example of the case where the divider elements shown in FIGS. 30A to 30T are applied to FIGS. 23A and 23B and FIGS. 24A and 24B is described. First, the case where one of the divider elements shown in FIGS. 30A to 30T is used is described with reference to FIGS. 25A and 25B. Gates are connected to a scan line. FIGS. 23A and 23B and FIGS. 24A and 24B correspond to diagrams in which the first capacitor 106 and the second capacitor 107 in FIGS. 1A to 1C are replaced with transistors. Therefore, the contents described in Embodiment Mode 1, FIGS. 23A and 23B, and FIGS. 24A and 24B can also be applied to FIGS. 25A and 25B.

A pixel 700 includes a first switch 701, a second switch 702, a first liquid crystal element 703, a second liquid crystal element 704, a third liquid crystal element 705, a first transistor 706, and a second transistor 707.

A first wiring 708 is connected to a first electrode of the first liquid crystal element 703 and one of a source and a drain of the first transistor 706 through the first switch 701. A second wiring 709 is connected to a first electrode of the second liquid crystal element 704 and one of a source and a drain of the second transistor 707 through the second switch 702. The other of the source and the drain of the first transistor 706 and the other of the source and the drain of the second transistor 707 are connected to a first electrode of the third liquid crystal element 705. The first and second transistors are connected to a third wiring 710.

Second electrodes of the first liquid crystal element 703, the second liquid crystal element 704, and the third liquid crystal element 705 are connected to a common electrode.

Each of the first wiring 708 and the second wiring 709 functions as a signal line. Therefore, an image signal is usually supplied to each of the first wiring 708 and the second wiring 709. Note that the present invention is not limited to this. A certain signal may be supplied regardless of an image. The third wiring 710 functions as a scan line.

Each of the first switch 701 and the second switch 702 is not particularly limited to a certain type as long as it functions as a switch. For example, a transistor can be used. The case where a transistor is used as each of the first switch 701 and the second switch 702 is described below. In the case of using a transistor, the transistor may be either a F-channel transistor or an N-channel transistor.

Figure 25A:
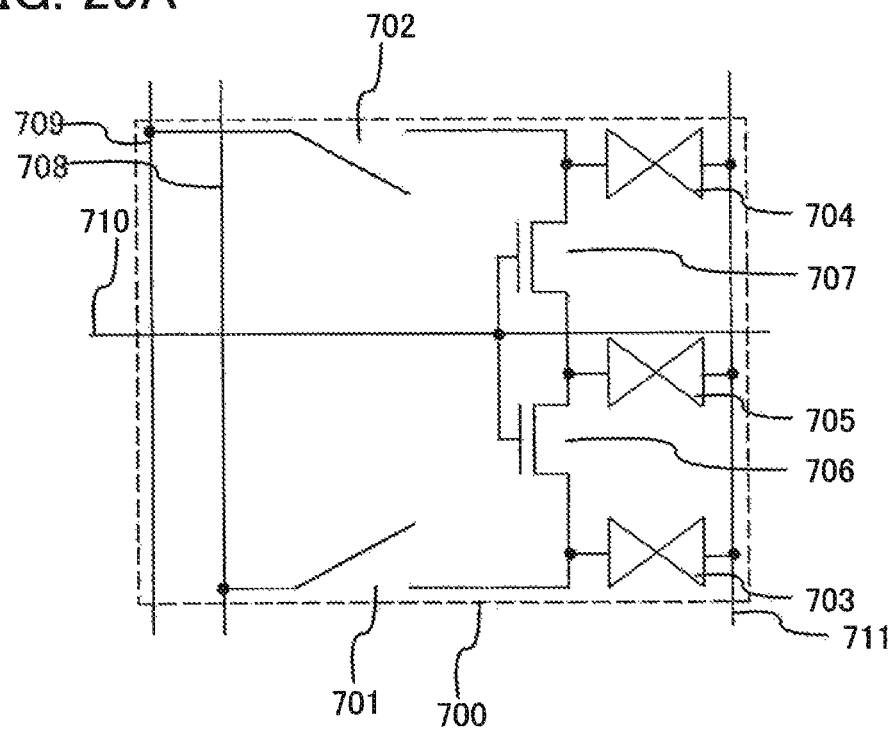
FIGS. 25A and 25B each illustrate a pixel circuit of a display device of the present invention.
Figure 25B:
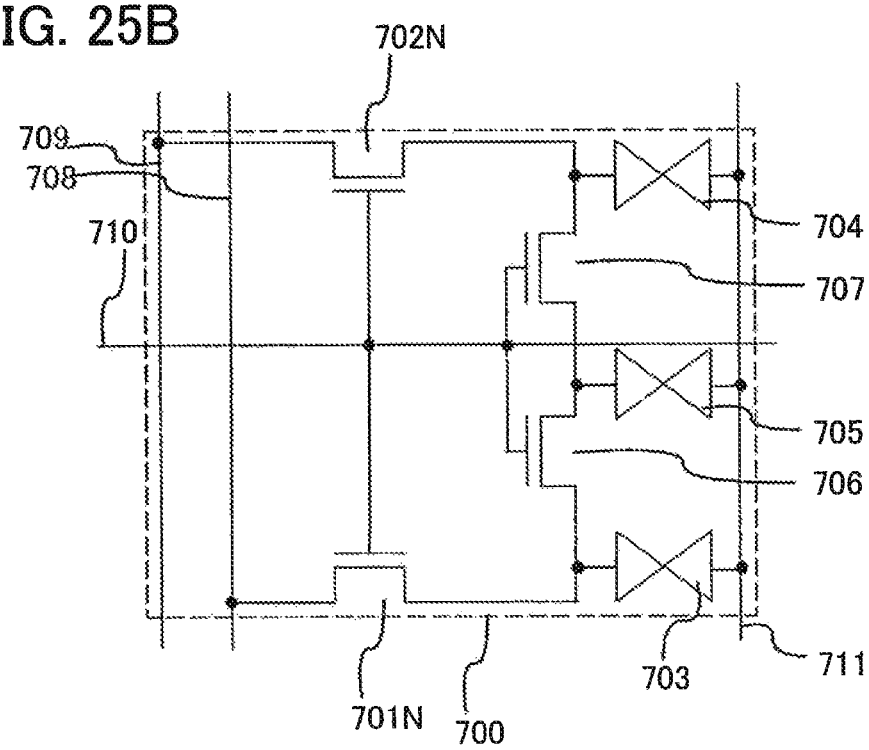

FIG. 25B shows the case where an N-channel transistor is used as a switch. In FIG. 25B, gates of a first switch 701N and a second switch 702N are connected to the third wiring 710. The third wiring 710 functions as a scan line.

Note that in FIGS. 25A and 25B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

It is acceptable as long as each of the first transistor 706 and the second transistor 707 functions as a divider element, and each of the first transistor 706 and the second transistor 707 may be either a P-channel transistor or an N-channel transistor.

Next, operations of the pixel 700 are described. First, when the third wiring 710 is selected, the first switch 701 and the second switch 702 are turned on. Then, video signals are supplied from the first wiring 708 and the second wiring 709. The first transistor 706 and the second transistor 707 are turned on at the same time as the first and second switches. Therefore, the first wiring 708 and the second wiring 709 are connected through the transistor. Then, since the transistors have resistance components (on resistance), voltage is divided in each transistor. At this time, when the on resistance of the first transistor 706 and the second transistor 707 is high, most of voltage is applied to the transistors.

Therefore, a potential which is almost equal to a potential of the first wiring 708 is applied to a pixel electrode of the first liquid crystal element 703. More precisely, a potential which is obtained by subtracting a potential of voltage drop by the first switch 701 from the potential of the first wiring 708 is applied to the pixel electrode of the first liquid crystal element 703. Similarly, a potential which is almost equal to a potential of the second wiring 709 is applied to a pixel electrode of the second liquid crystal element 704. More precisely, a potential which is obtained by subtracting a potential of voltage drop by the second switch 702 from the potential of the second wiring 709 is applied to the pixel electrode of the second liquid crystal element 704.

Then, the potential of the pixel electrode of the first liquid crystal element 703 and the potential of the pixel electrode of the second liquid crystal element 704 are divided by voltage of the first transistor 706 and voltage of the second transistor 707, and supplied to a pixel electrode of the third liquid crystal element 705. If the on resistance of the first transistor 706 is almost equal to the on resistance of the second transistor 707, the potential of the pixel electrode of the third liquid crystal element 705 is an intermediate potential between the potential of the pixel electrode of the first liquid crystal element 703 and the potential of the pixel electrode of the second liquid crystal element 704.

Note that when the on resistance of the first switch 701, the second switch 702, the first transistor 706, the second transistor 707, and the like is low, large current flows. Therefore, the on resistance of the first transistor 706 and the second transistor 707 for voltage division is preferably high. For example, the first switch 701 or the second switch 702 has preferably the smaller ratio of the channel width W to the channel length L (W/L) than that of the first transistor 706 or the second transistor 707. For example, the first transistor 706 or the second transistor 707 may have the longer channel length L with a multi-gate structure.

Note that it is preferable that the on resistance of the first transistor 706 and the on resistance of the second transistor 707 be almost equal. When the on resistance of the two transistors is almost equal, divided voltage has an intermediate potential. If there is difference in the on resistance, the potential is biased on one of potentials, so that the liquid crystal elements cannot be controlled uniformly. For example, it is preferable that the ratio of the channel width W to the channel length L (W/L) of the first transistor 706 and the ratio of the channel width W to the channel length L (W/L) of the second transistor 707 be almost equal. Note that the present invention is not limited to this.

When the third wiring 710 is not selected, the first switch 701, the second switch 702, the first transistor 706, and the second transistor 707 are turned off. Then, the voltage applied to each of the liquid crystal elements is held. With such operations, the voltage applied to each of the liquid crystal elements can be varied. Accordingly, the viewing angle can be widened. Note that the driving method is not limited to this. A variety of timing for turning on/off each transistor, potentials of a signal line, and the like can be controlled by using various methods.

Note that since the first transistor 706 and the second transistor 707 are turned off, electric charge does not leak between the respective liquid crystal elements. Therefore, it can also be said that each of the first transistor 706 and the second transistor 707 realizes the divider element and the switch in FIGS. 24A and 24B by one element.

Note that each of the first liquid crystal element 703, the second liquid crystal element 704, and the third liquid crystal element 705 has transmittivity in accordance with a video signal.

As described above, when liquid crystal elements are aligned differently, the viewing angle can be widened.

Note that the structures of the first transistor 706 and the second transistor 707 are not limited to the structures which are shown. For example, one of or both the first transistor 706 and the second transistor 707 may have a multi-gate structure. With a multi-gate structure, resistance values of the first transistor 706 and the second transistor 707 can be easily adjusted compared to the case of a single-gate structure. Further, on resistance of first transistor 706 and the second transistor 707 can be further increased compared to the case of a single-gate structure.

Note that the resistance values of the first transistor 706 and the second transistor 707 are not necessarily constant, and the resistance values may be set to be varied in accordance with time or a pixel. In order to vary the resistance values, potentials of gates of the first transistor 706 and the second transistor 707 which function as divider elements may be varied in accordance with time or a pixel.

Note that although storage capacitors are not shown in FIGS. 23A to 25B, storage capacitors may be provided, as shown in FIGS. 1A to 1C and the like. As an example, FIGS. 26A and 26B show the case where a storage capacitor is provided for each of the liquid crystal elements in FIGS. 25A and 25B.

Figure 26A:
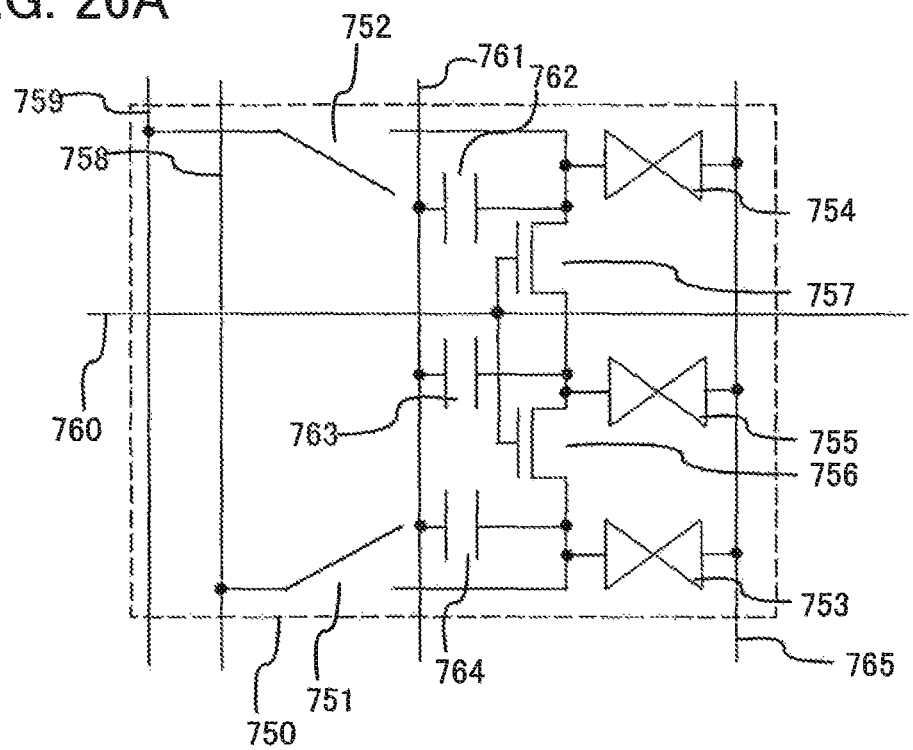
FIGS. 26A and 26B each illustrate a pixel circuit of a display device of the present invention.
Figure 26B:
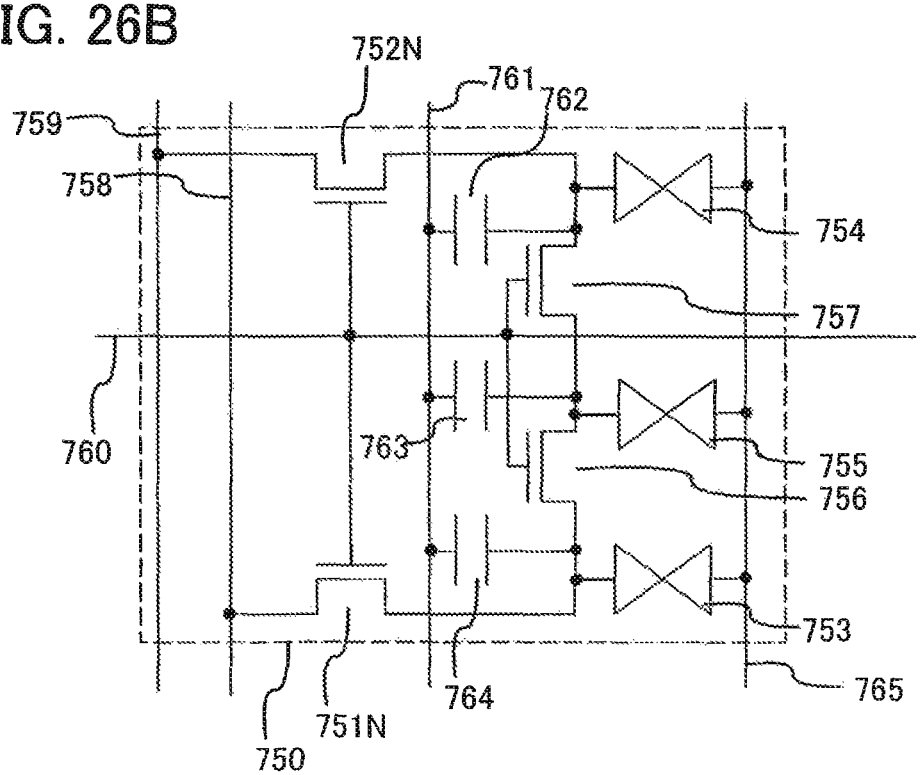

In FIG. 26A, a pixel 750 includes a first switch 751, a second switch 752, a first liquid crystal element 753, a second liquid crystal element 754, a third liquid crystal element 755, a first transistor 756, a second transistor 757, a first capacitor 762, a second capacitor 763, and a third capacitor 764.

A first wiring 758 is connected to a first electrode of the first liquid crystal element 753, one of a source and a drain of the first transistor 756, and a first electrode of the third capacitor 764 through the first switch 751. A second wiring 759 is connected to a first electrode of the second liquid crystal element 754, one of a source and a drain of the second transistor 757, and a first electrode of the first capacitor 762. The other of the source and the drain of the first transistor 756 and the other of the source and the drain of the second transistor 757 are connected to a first electrode of the third liquid crystal element 755 and a first electrode of the second capacitor 763. The first and second switches and the first and second transistors are connected to a third wiring 760. Second electrodes of the first capacitor 762, the second capacitor 763, and the third capacitor 764 are connected to a fourth wiring 761.

Second electrodes of the first liquid crystal element 753, the second liquid crystal element 754, and the third liquid crystal element 755 are connected to a common electrode.

Each of the first wiring 758 and the second wiring 759 functions as a signal line. The third wiring 760 functions as a scan line. The fourth wiring 761 functions as a capacitor line.

Each of the first switch 751 and the second switch 752 is not particularly limited to a certain type as long as it functions as a switch. For example, a transistor can be used. In the case where a transistor is used as each of the first switch 751 and the second switch 752, the transistor may be either a P-channel transistor or an N-channel transistor.

FIG. 26B shows the case where an N-channel transistor is used as a switch. In FIG. 26B, gates of a first switch 751N and a second switch 752N are connected to the third wiring 760. The third wiring 760 functions as a scan line.

Note that in FIGS. 26A and 26B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

It is acceptable as long as each of the first transistor 756 and the second transistor 757 functions as a divider element, and each of the first transistor 756 and the second transistor 757 may be either a P-channel transistor or an N-channel transistor.

Note that each of the first liquid crystal element 753, the second liquid crystal element 754, and the third liquid crystal element 755 has transmittivity in accordance with a video signal.

Note that resistance values of the first transistor 756 and the second transistor 757 are not necessarily constant, and the resistance values may be set to be varied in accordance with time or a pixel. In order to vary the resistance values, potentials of gates of the first transistor 756 and the second transistor 757 which function as resistors may be varied in accordance with time or a pixel.

As described above, when liquid crystal elements are aligned differently, the viewing angle can be widened.

Note that although the gates of the first and second transistors are connected to the scan line in FIGS. 25A and 25B and FIGS. 26A and 26B, the present invention is not limited to this. Another wiring may be provided and the first and second transistors may be connected to the wiring. Alternatively, a plurality of different wirings may be provided and the gates of the first and second transistors may be connected to different wirings. FIG. 27B shows the case where gates of a first transistor and a second transistor are connected to a fourth wiring in FIG. 27A. With such a structure, potentials of the gates of the first transistor and the second transistor can be controlled independently from first and second switches, so that on resistance of the first and second transistors can be easily controlled. For example, in the case of inputting a negative (a potential of a video signal is lower than a potential of a common electrode) video signal, gate-source voltage of the first and second transistors is extremely increased. Therefore, on resistance of the first and second transistors is decreased and much current flows, so that power consumption is increased in some cases. Then, when the first and second transistors are turned on to be divided, the potentials of the gates of the first and second transistors in the case of inputting a negative video signal are made lower than the potentials of the gates of the first and second transistors in the case of inputting a positive (a potential of a video signal is higher than a potential of the common electrode) video signal. Accordingly, much current can be prevented from flowing.

A pixel 800 includes a first switch 801, a second switch 802, a first transistor 803, a second transistor 804, a first liquid crystal element 805, a second liquid crystal element 806, and a third liquid crystal element 807.

A first wiring 808 is connected to a first electrode of the first liquid crystal element 805 and one of a source and a drain of the first transistor 803 through the first switch 801. A second wiring 809 is connected to a first electrode of the second liquid crystal element 806 and one of a source and a drain of the second transistor 804 through the second switch 802. The other of the source and the drain of the first transistor 803 and the other of the source and the drain of the second transistor 804 are connected to a first electrode of the third liquid crystal element 807. Gates of the first switch 801 and the second switch 802 are connected to a third wiring 810. Gates of the first transistor 803 and the second transistor 804 are connected to a fourth wiring 811.

Second electrodes of the first liquid crystal element 805, the second liquid crystal element 806, and the third liquid crystal element 807 are connected to a common electrode.

Each of the first wiring 808 and the second wiring 809 functions as a signal line. Therefore, an image signal is usually supplied to each of the first wiring 808 and the second wiring 809. Note that the present invention is not limited to this. A certain signal may be supplied regardless of an image. Each of the third wiring 810 and the fourth wiring 811 functions as a scan line.

Each of the first switch 801 and the second switch 802 is not particularly limited to a certain type as long as it functions as a switch. For example, a transistor can be used. In the case where a transistor is used as each of the first switch 801 and the second switch 802, the transistor may be either a P-channel transistor or an N-channel transistor.

FIG. 27B shows the case where an N-channel transistor is used as a switch. In FIG. 27B, gates of a first switch 801N and a second switch 802N are connected to the third wiring 810. The third wiring 810 functions as a scan line.

Figure 27A:
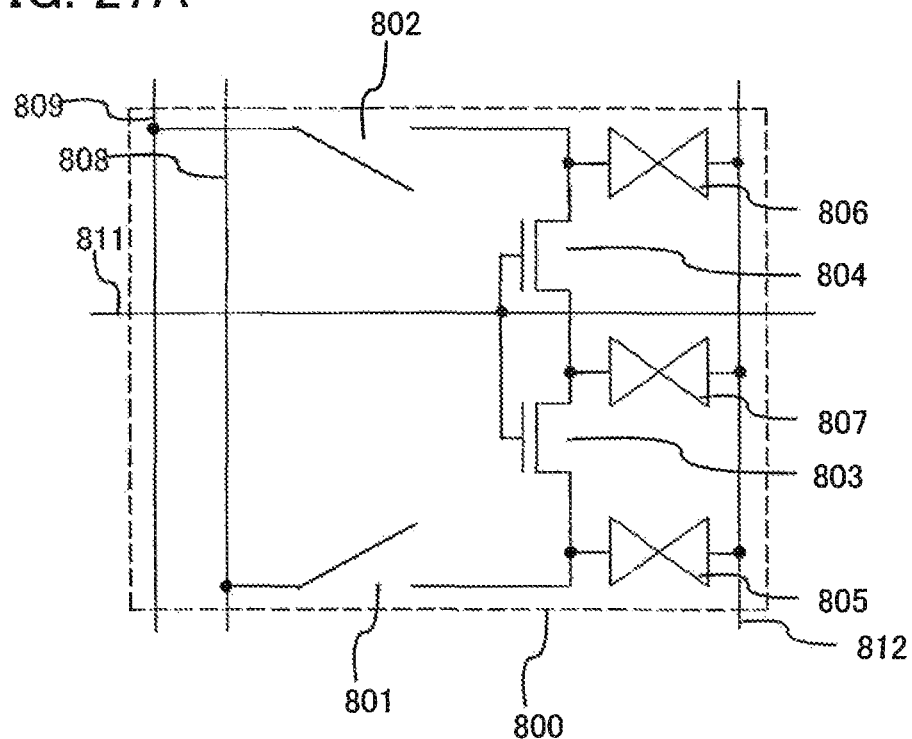
FIGS. 27A and 27B each illustrate a pixel circuit of a display device of the present invention.
Figure 27B:
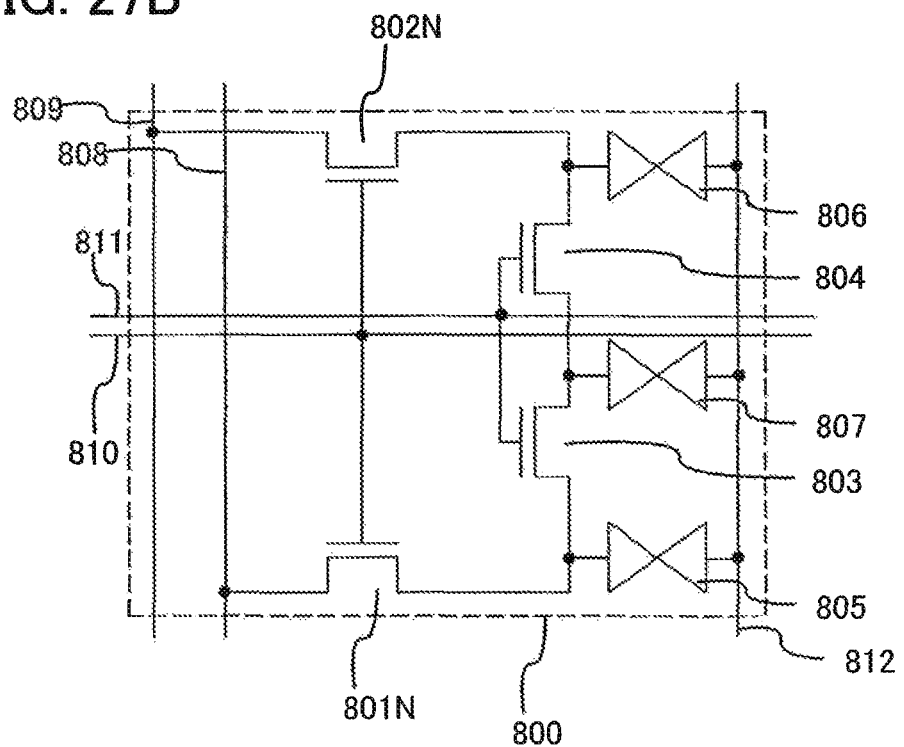

Note that in FIGS. 27A and 27B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

It is acceptable as long as each of the first transistor 803 and the second transistor 804 functions as a divider element, and each of the first transistor 803 and the second transistor 804 may be either a P-channel transistor or an N-channel transistor.

Note that when each of the first transistor 803 and the second transistor 804 is turned on to function as a divider element, each of the first transistor 803 and the second transistor 804 is preferably operated in a linear region. This is to have an appropriate value of on resistance in each of the first transistor 803 and the second transistor 804.

Note that it is preferable that timing for turning on/off the first switch 801 and the second switch 802 and timing for turning on/off the first transistor 803 and the second transistor 804 be almost the same. Note that the present invention is not limited to this. When the first switch 801 and the second switch 802 are turned on, the first transistor 803 and the second transistor 804 may be turned on a bit late. Thus, a period during which the first wiring 808 and the second wiring 809 are connected can be shortened. Therefore, electric charge can be easily input to the first liquid crystal element 805 and the second liquid crystal element 806.

As described above, when liquid crystal elements are aligned differently, the viewing angle can be widened.

Figure 28A:
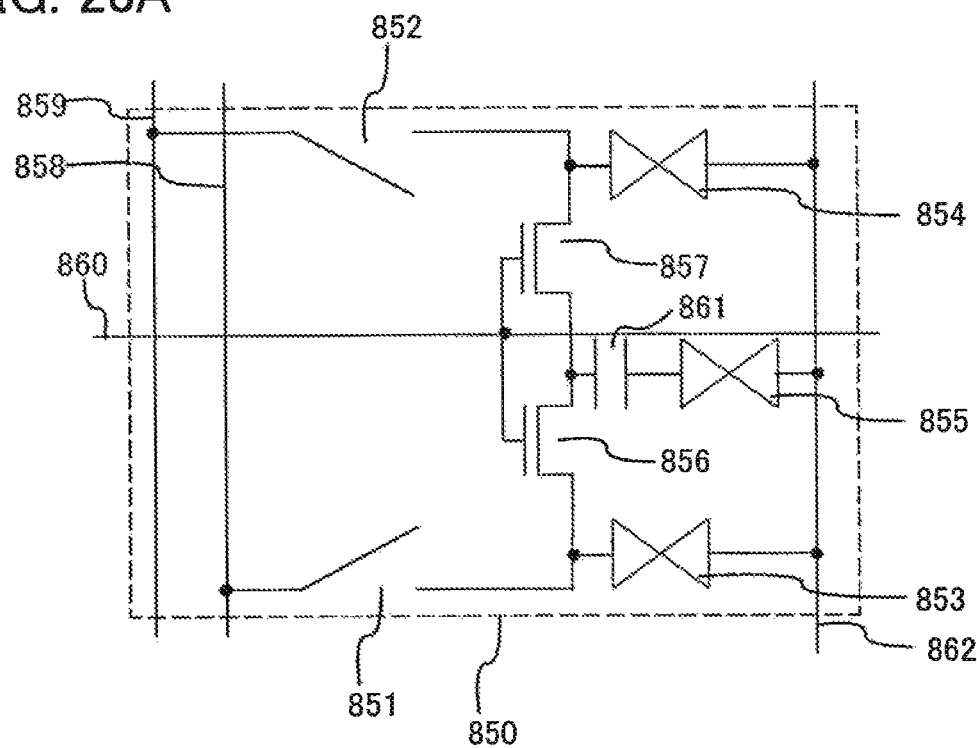
FIGS. 28A and 28B each illustrate a pixel circuit of a display device of the present invention.
Figure 28B:
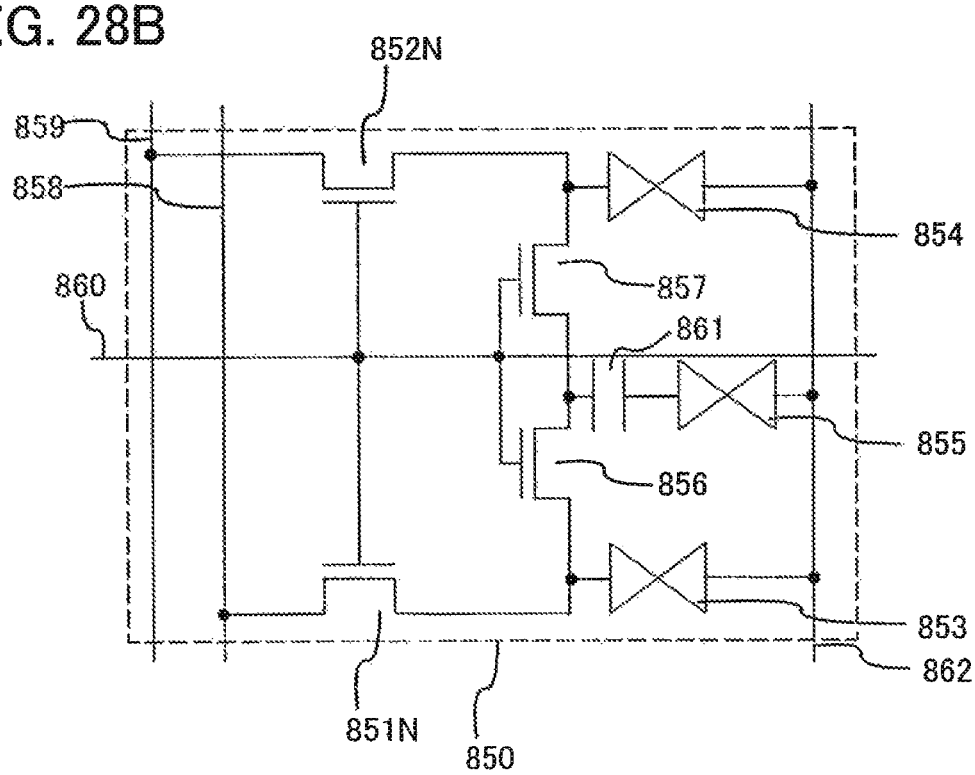

Next, an example is described in which the contents described in Embodiment Mode 1 is applied to FIGS. 25A and 25B. An example of a circuit is described in which the capacitors are replaced with the divider elements shown in FIGS. 30A to 30T. FIGS. 28A and 28B show the case where the first capacitor and the second capacitor in FIGS. 2A and 2B are replaced with the divider elements shown in FIG. 30J. At this time, gates of transistor of the divider elements are connected to a scan line. Note that the present invention is not limited to this. Therefore, the contents described in Embodiment Mode 1 can also be applied to FIGS. 28A and 28B.

A pixel 850 includes a first switch 851, a second switch 852, a first liquid crystal element 853, a second liquid crystal element 854, a third liquid crystal element 855, a first transistor 856, a second transistor 857, and a capacitor 861.

A first wiring 858 is connected to a first electrode of the first liquid crystal element 853 and one of a source and a drain of the first transistor 856 through the first switch 851. A second wiring 859 is connected to a first electrode of the second liquid crystal element 854 and one of a source and a drain of the second transistor 857. The other of the source and the drain of the first transistor 856 and the other of the source and the drain of the second transistor 857 are connected to a first electrode of the capacitor 861. A second electrode of the capacitor 861 is connected to a first electrode of the third liquid crystal element 855. The first and second transistors are connected to a third wiring 860.

Second electrodes of the first liquid crystal element 853, the second liquid crystal element 854, and the third liquid crystal element 855 are connected to a common electrode.

Each of the first wiring 858 and the second wiring 859 functions as a signal line. Therefore, an image signal is usually supplied to each of the first wiring 858 and the second wiring 859. Note that the present invention is not limited to this. A certain signal may be supplied regardless of an image. The third wiring 860 functions as a scan line.

Each of the first switch 851 and the second switch 852 is not particularly limited to a certain type as long as it functions as a switch. For example, a transistor can be used. In the case where a transistor is used as each of the first switch 851 and the second switch 852, the transistor may be either a P-channel transistor or an N-channel transistor.

FIG. 28B shows the case where an N-channel transistor is used as a switch. In FIG. 28B, gates of a first switch 851N and a second switch 852N are connected to the third wiring 860. The third wiring 860 functions as a scan line.

Note that in FIGS. 28A and 28B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

It is acceptable as long as each of the first transistor 856 and the second transistor 857 functions as a divider element, and each of the first transistor 856 and the second transistor 857 may be either a P-channel transistor or an N-channel transistor.

When the circuit structures shown in FIGS. 28A and 28B are used, a potential of the first electrode of the third liquid crystal element 855 can be lowered by a potential of the capacitor 861, in a similar manner that in FIGS. 2A and 2B and the like.

Note that the structures of the first transistor 856 and the second transistor 857 are not limited to the structures which are shown. For example, one of or both the first transistor 856 and the second transistor 857 may have a multi-gate structure.

Note that resistance values of the first transistor 856 and the second transistor 857 are not necessarily constant, and the resistance values may be set to be varied in accordance with time or a pixel. In order to vary the resistance values, potentials of gates of the first transistor 856 and the second transistor 857 functioning as resistors may be varied in accordance with time or a pixel.

Note that the structures of the first transistor 856 and the second transistor 857 are not limited to the structures which are shown. For example, one of or both the first transistor 856 and the second transistor 857 may have a multi-gate structure. With a multi-gate structure, on resistance of first transistor 856 and the second transistor 857 can be further increased compared to the case of a single-gate structure.

As described above, when liquid crystal elements are aligned differently, the viewing angle can be widened.

Note that although the case in which two divider elements are used is described in FIGS. 23A to 28B, the present invention is not limited to this. Much more divider elements are used so that viewing angle characteristics can be further improved. As an example, FIGS. 29A and 29B show an example of a circuit in the case where a divider element is added to the structures in FIGS. 25A and 25B or in the case where the capacitors in FIGS. 9A and 9B are replaced with two divider elements shown in FIG. 30J, which are connected in series.

Figure 29A:
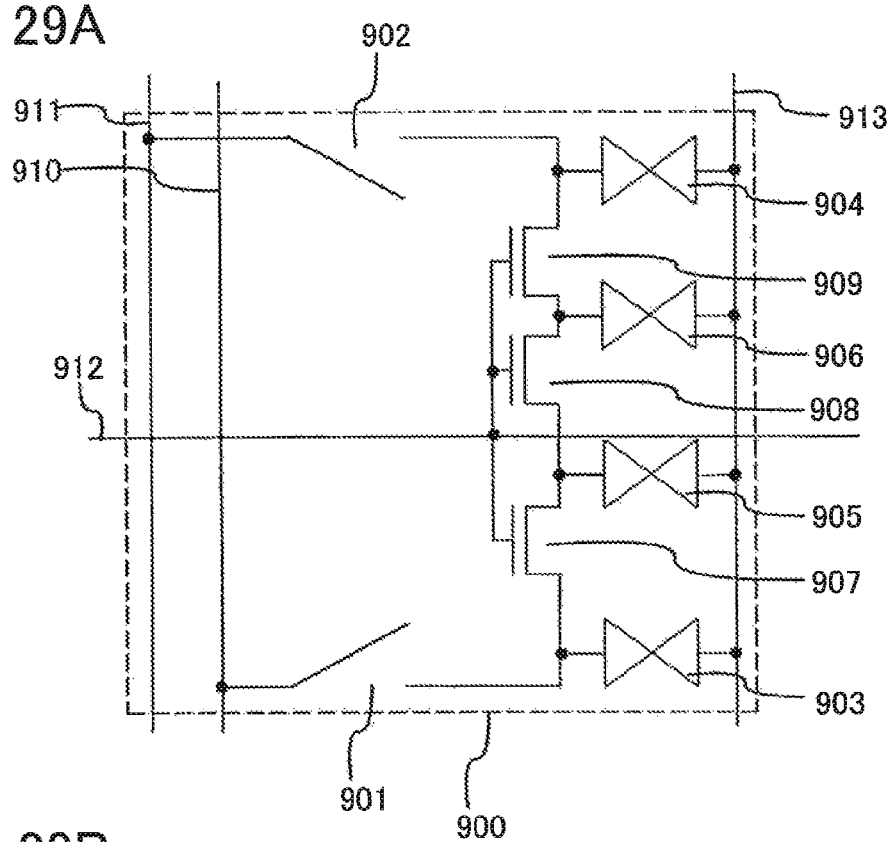
FIGS. 29A and 29B each illustrate a pixel circuit of a display device of the present invention.
Figure 29B:
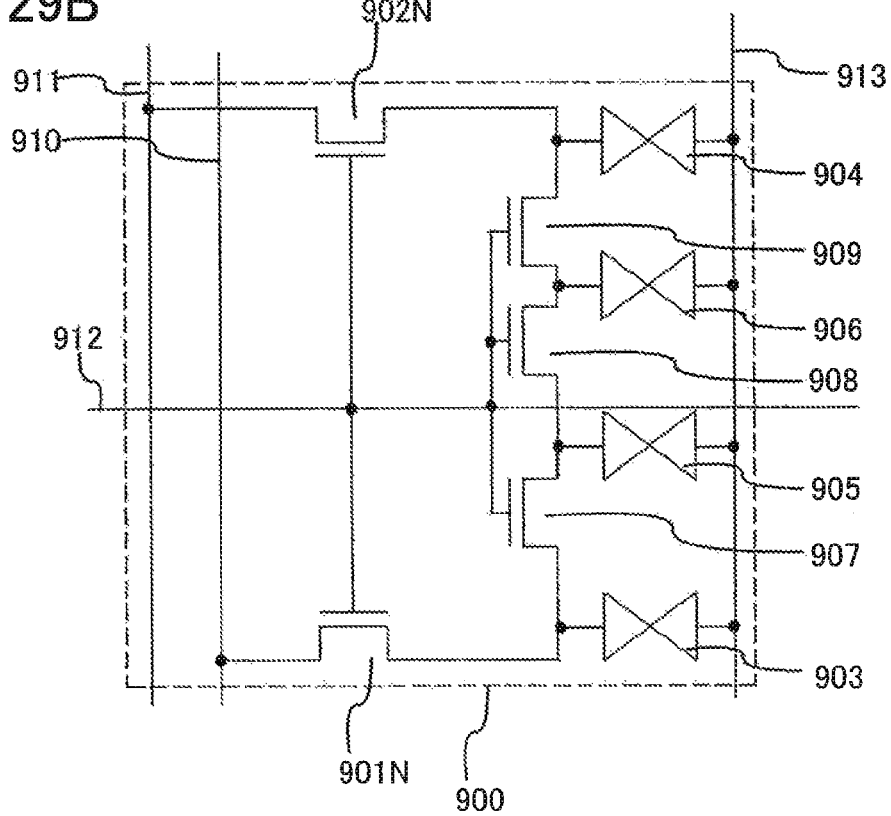

In FIG. 29A, a pixel 900 includes a first switch 901, a second switch 902, a first liquid crystal element 903, a second liquid crystal element 904, a third liquid crystal element 905, a fourth liquid crystal element 906, a first transistor 907, a second transistor 908, and a third transistor 909.

A first wiring 910 is connected to a first electrode of the first liquid crystal element 903 and one of a source and a drain of the first transistor 907 through the first switch 901. A second wiring 911 is connected to a first electrode of the second liquid crystal element 904 and one of a source and a drain of the third transistor 909 through the second switch 902. The other of the source and the drain of the first transistor 907 is connected to a first electrode of the third liquid crystal element 905 and one of a source and a drain of the second transistor 908. The other of the source and the drain of the third transistor 909 is connected to a first electrode of the fourth liquid crystal element 906 and the other of the source and the drain of the second transistor 908. Gates of the first and second switches 901 and 902 and the first transistor and second transistors are connected to a third wiring 912.

Second electrodes of the first liquid crystal element 903, the second liquid crystal element 904, and the third liquid crystal element 905 are connected to a common electrode.

Each of the first wiring 910 and the second wiring 911 functions as a signal line. Therefore, an image signal is usually supplied to each of the first wiring 910 and the second wiring 911. Note that the present invention is not limited to this. A certain signal may be supplied regardless of an image. The third wiring 912 functions as a scan line.

Each of the first switch 901 and the second switch 902 is not particularly limited to a certain type as long as it functions as a switch. For example, a transistor can be used. In the case where a transistor is used as each of the first switch 901 and the second switch 902, the transistor may be either a P-channel transistor or an N-channel transistor.

FIG. 29B shows the case where an N-channel transistor is used as a switch. In FIG. 29B, gates of a first switch 901N and a second switch 902N are connected to the third wiring 912. The third wiring 912 functions as a scan line.

Note that in FIGS. 29A and 29B, in a similar manner that in FIGS. 1A to 1C and the like, the number of scan lines may be two as shown in FIG. 49 and a P-channel transistor can be used as a switch. In addition, a liquid crystal element may be further divided into a plurality of elements, as shown in FIGS. 11A and 11B and the like.

Note that a switch is not limited to a transistor. Various elements such as diodes can be used as a switch.

It is acceptable as long as each of the first to third transistors functions as a divider element, and each of the first to third transistor may be either a P-channel transistor or an N-channel transistor. In FIGS. 28A and 28B, an N-channel transistor is used.

As shown in FIGS. 29A and 29B, only one of the first and second transistors may have a multi-gate structure in FIGS. 25A and 25B.

Note that although gates of the first to third transistors are connected to the third wiring which controls the first and second switches, the present invention is not limited to this. As described with reference to FIGS. 27A and 27B, the gates of the first to third transistors may be connected to a wiring which is different from the third wiring which controls the first and second switches.

As described above, when liquid crystal elements are aligned differently, the viewing angle can be widened.

Note that resistance values of the first transistor 907, the second transistor 908, and the third transistor 909 are not necessarily constant, and the resistance values may be set to be varied in accordance with time or a pixel. In order to vary the resistance values, potentials of gates of the third to fifth transistors which function as resistors may be varied in accordance with time or a pixel. Note that the structures of the first transistor 907 and the second transistor 908 are not limited to the structures which are shown.

As described above, when liquid crystal elements are aligned differently, the viewing angle can be widened.

Figure 34:
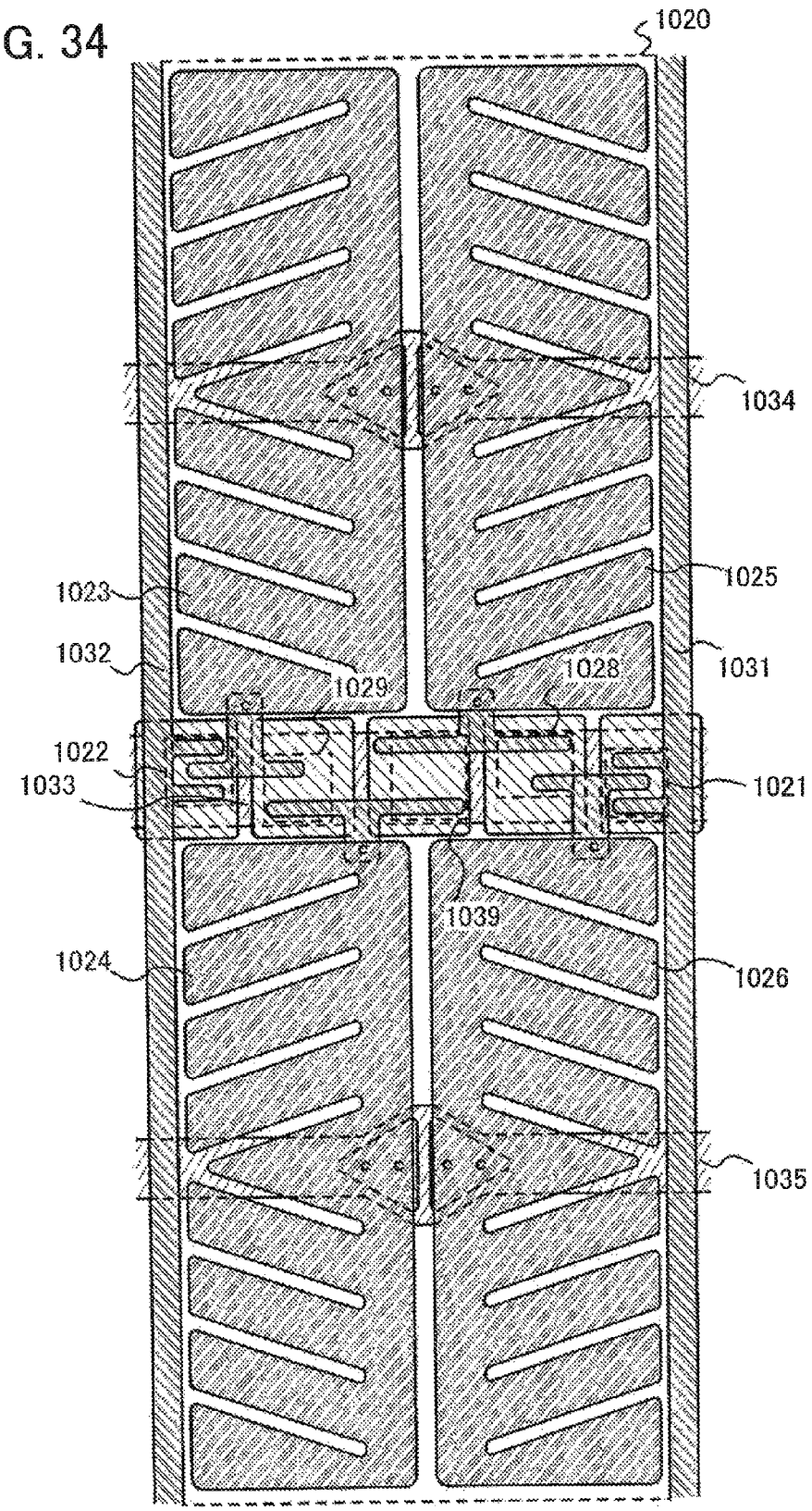
FIG. 34 illustrates an example of a top surface layout of a pixel included in a display device of the present invention.
Figure 35:
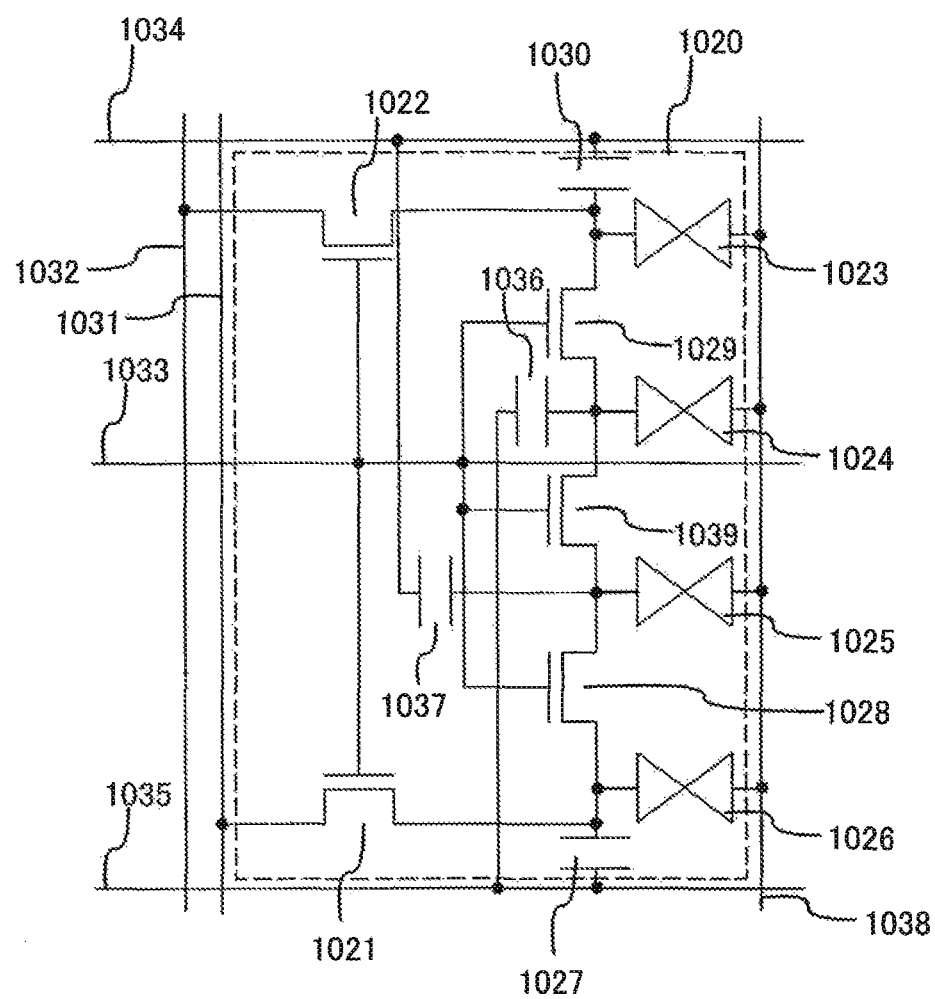
FIG. 35 illustrates a pixel circuit of a display device of the present invention.
Figure 36A:
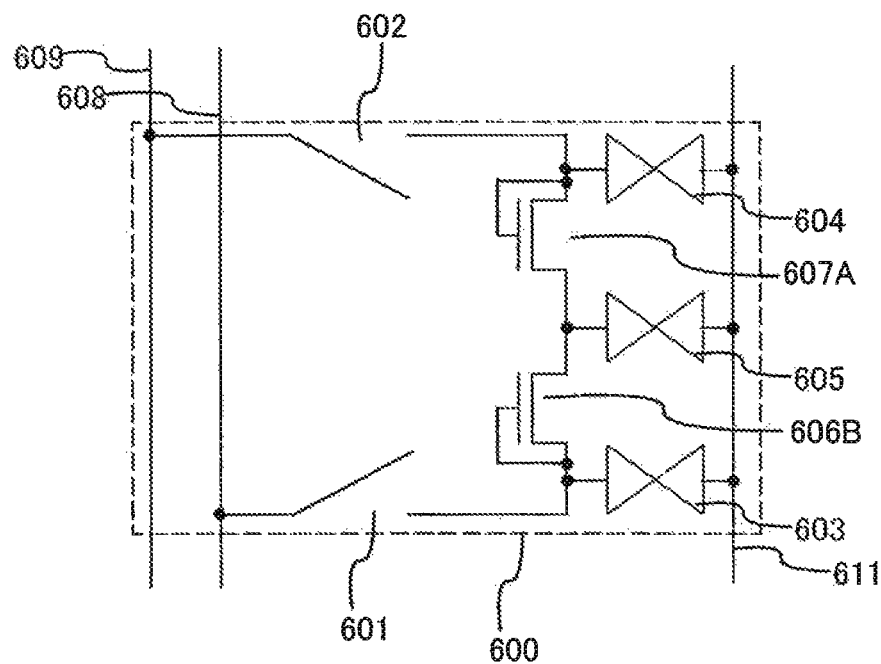
FIGS. 36A and 36B each illustrate a pixel circuit of a display device of the present invention.
Figure 36B:
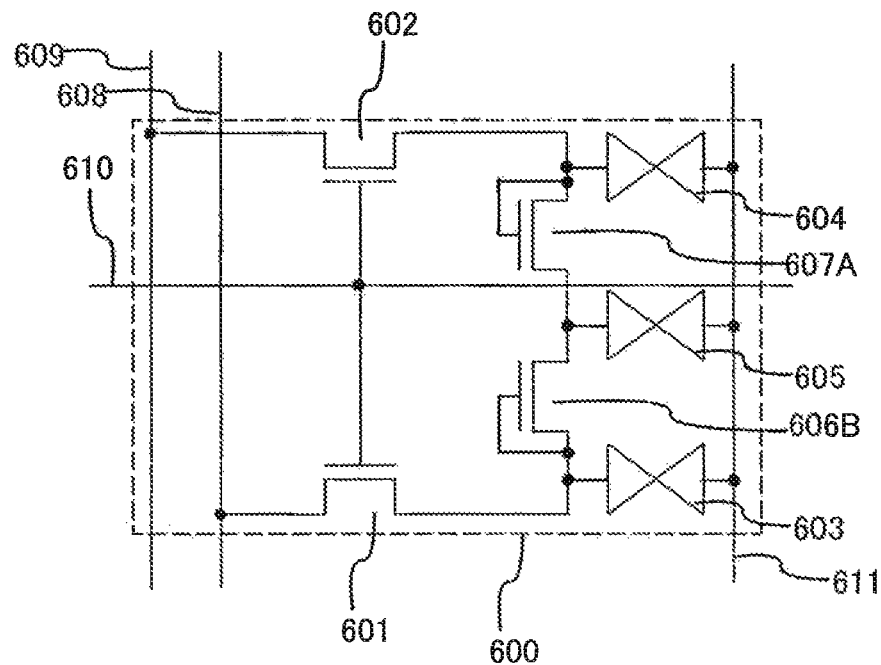
Figure 37A:
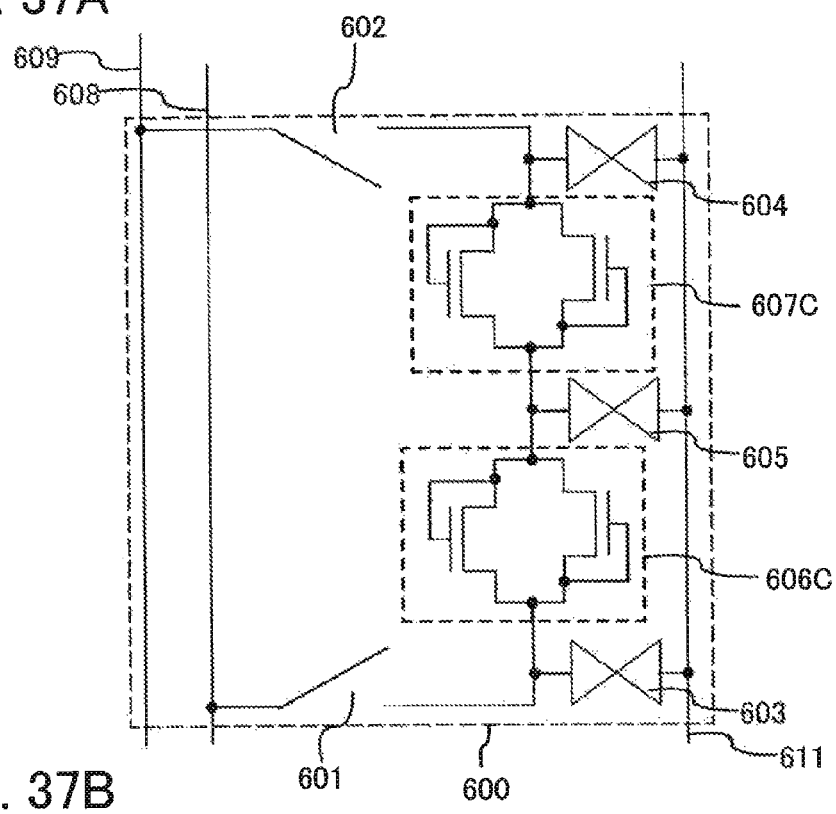
FIGS. 37A and 37B each illustrate a pixel circuit of a display device of the present invention.
Figure 37B:
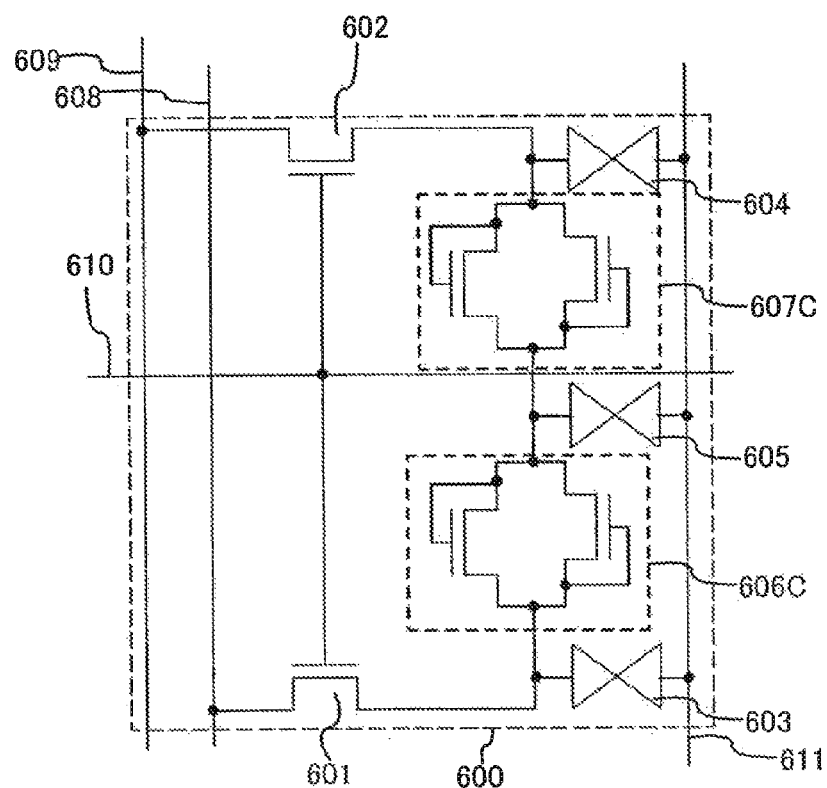
Figure 38A:
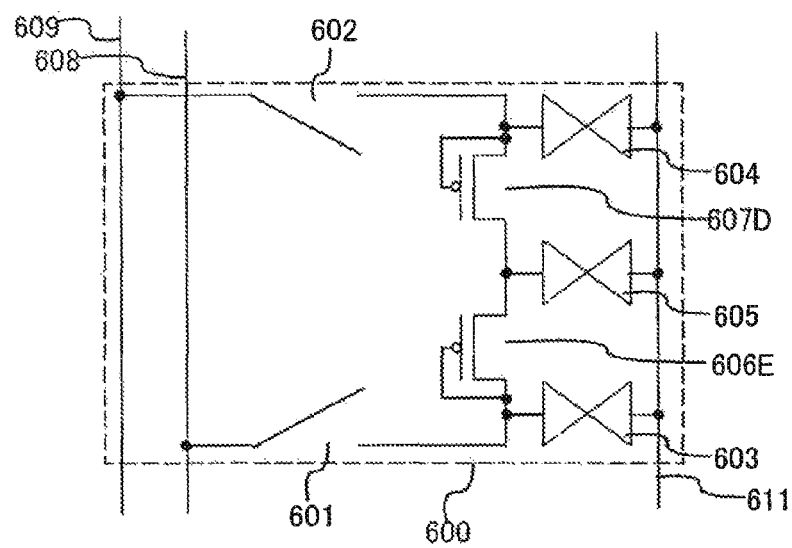
FIGS. 38A to 38C each illustrate a pixel circuit of a display device of the present invention.
Figure 38B:
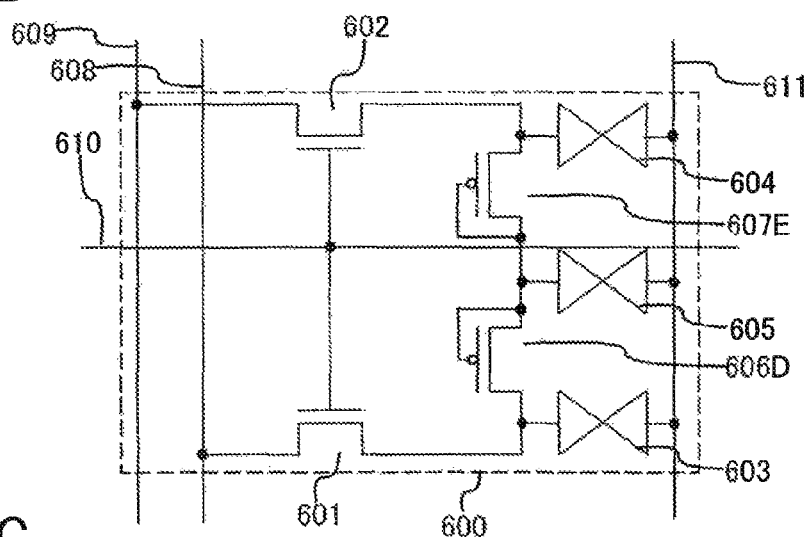
Figure 38C:
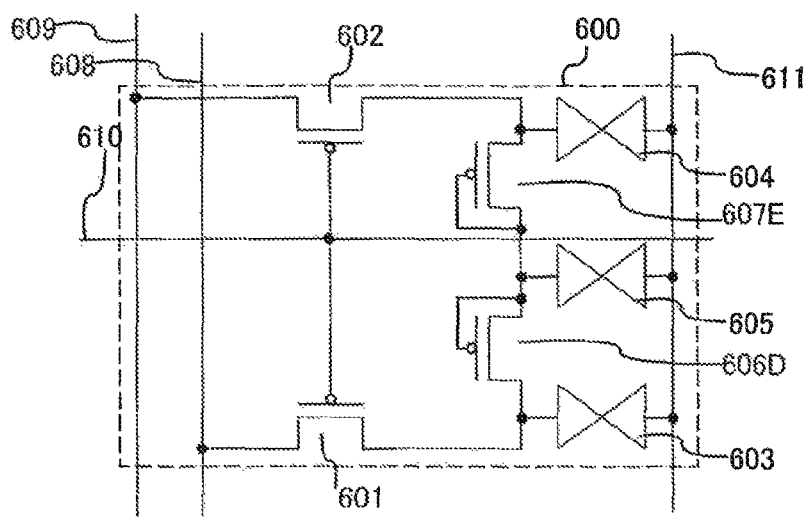
Figure 39A:
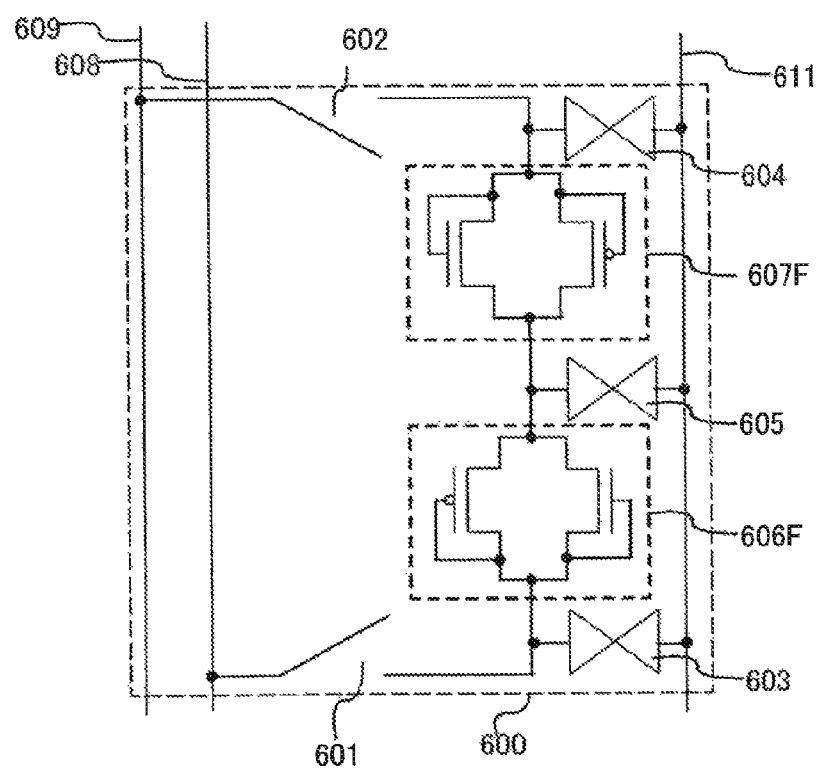
Figure 39B:
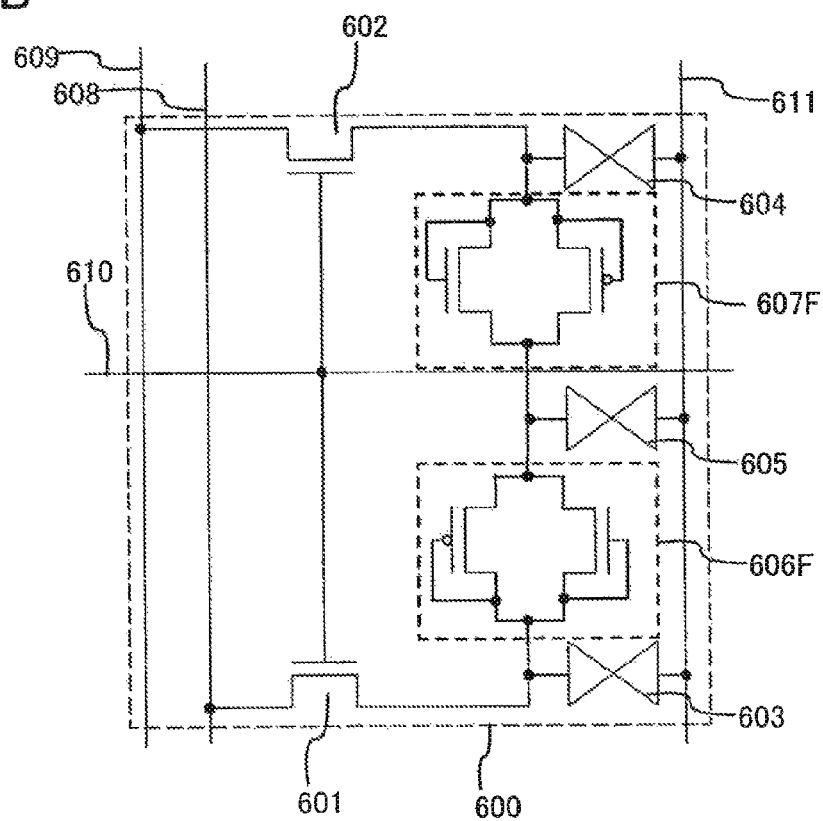
Figure 40A:
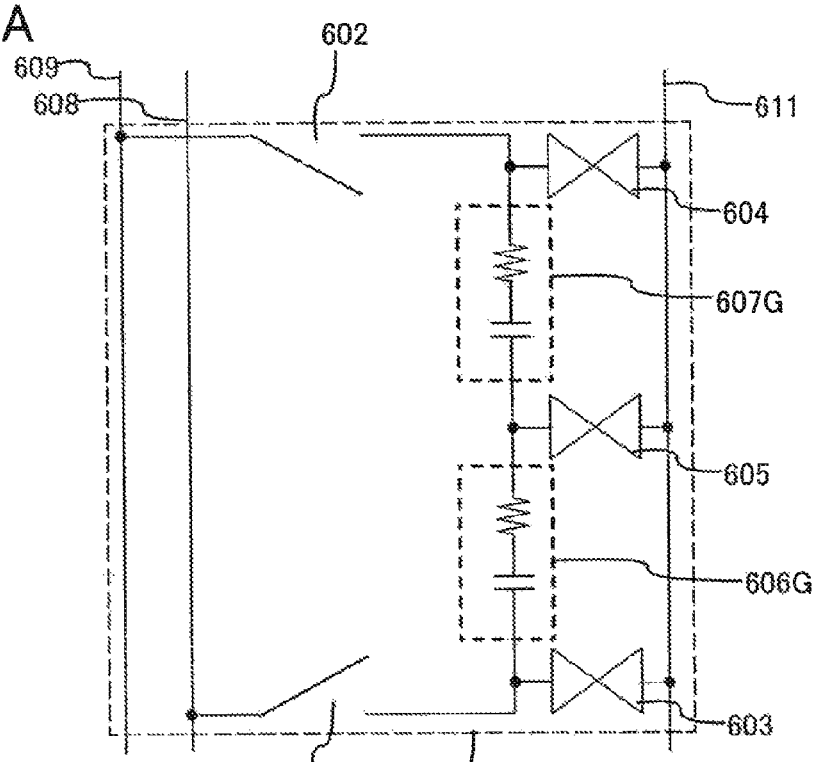
FIGS. 40A and 40B each illustrate a pixel circuit of a display device of the present invention.
Figure 40B:
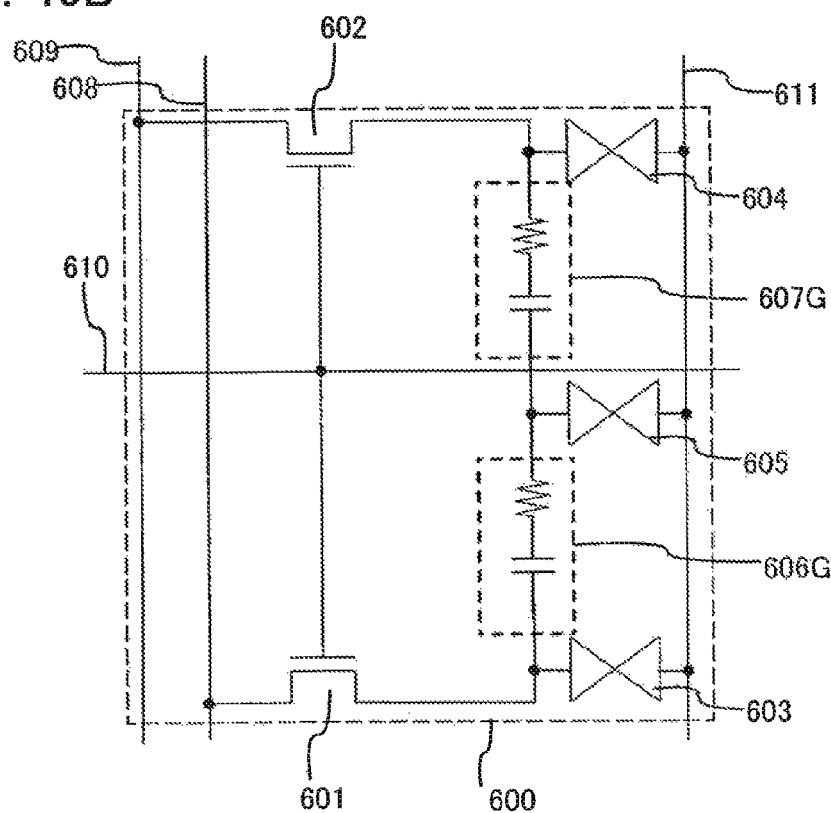
Figure 41A:
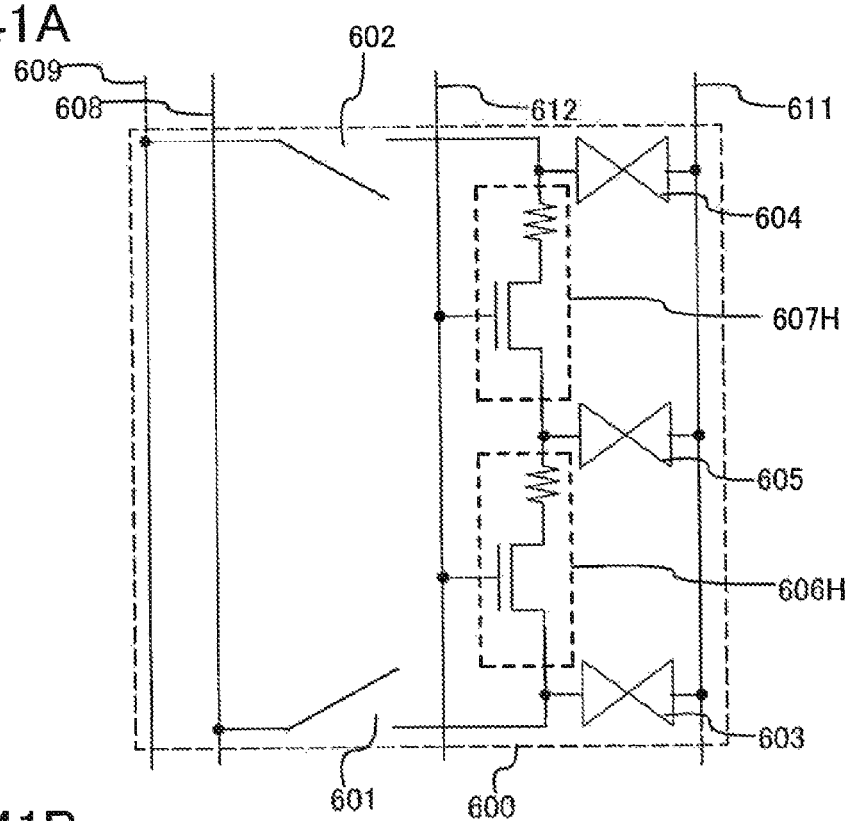
FIGS. 41A and 41B each illustrate a pixel circuit of a display device of the present invention.
Figure 41B:
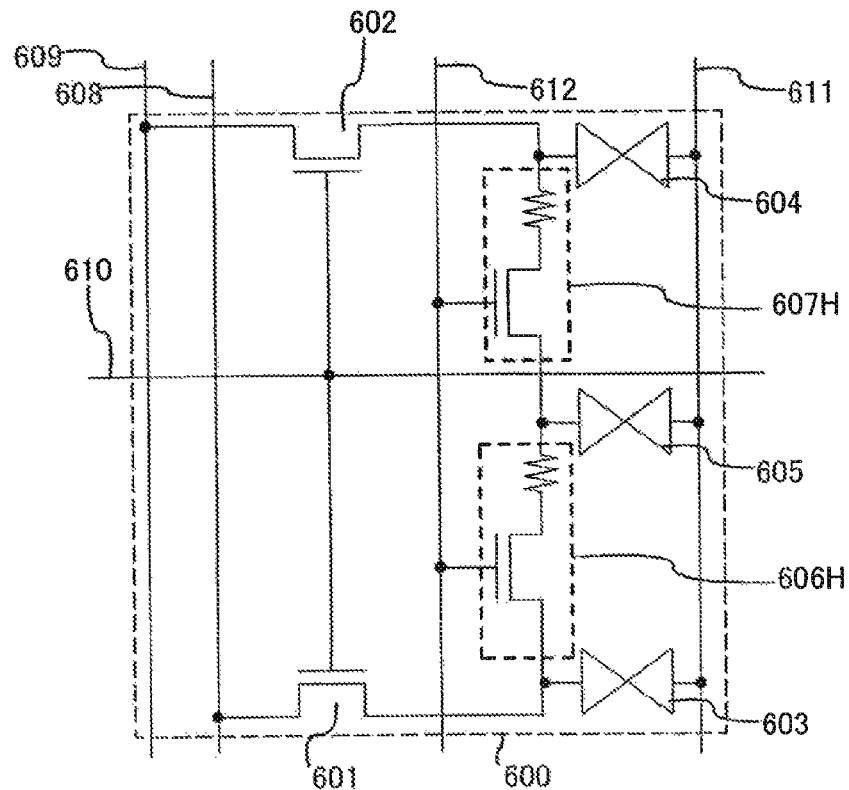
Figure 42A:
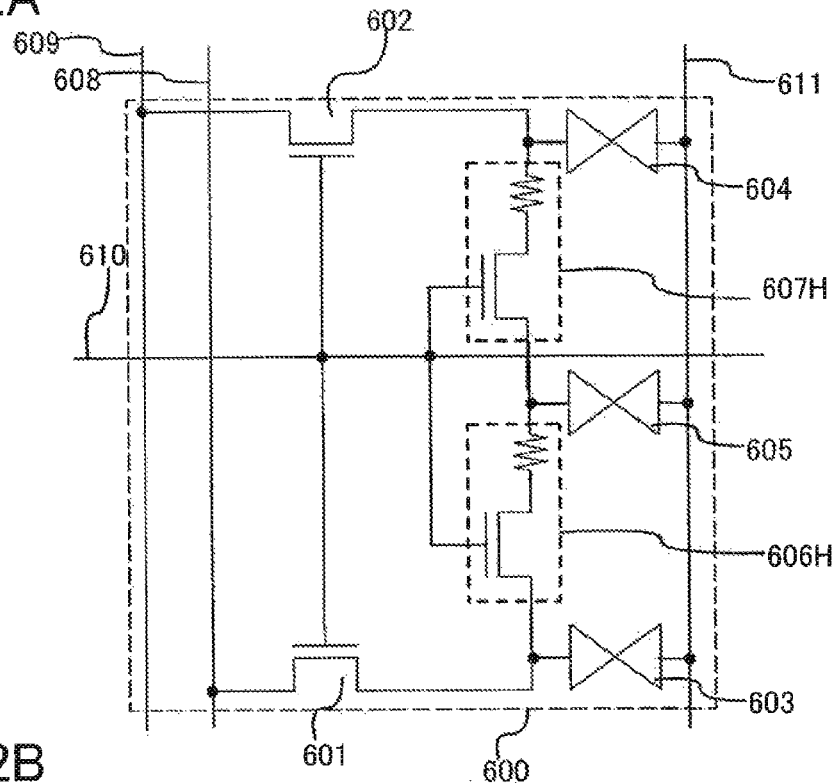
FIGS. 42A and 42B each illustrate a pixel circuit of a display device of the present invention.
Figure 42B:
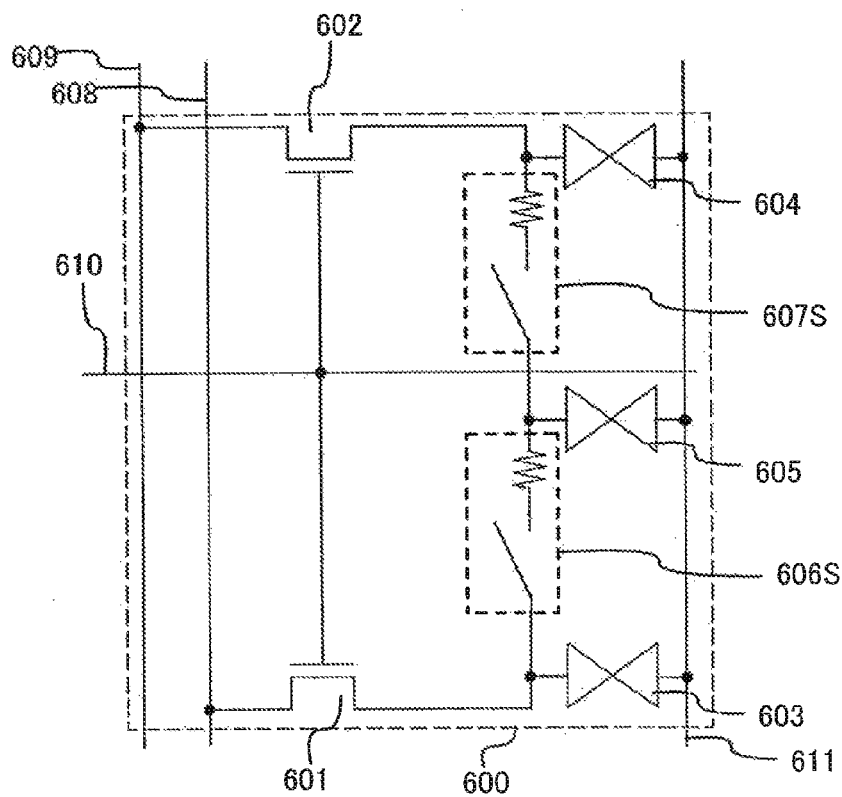
Figure 43A:
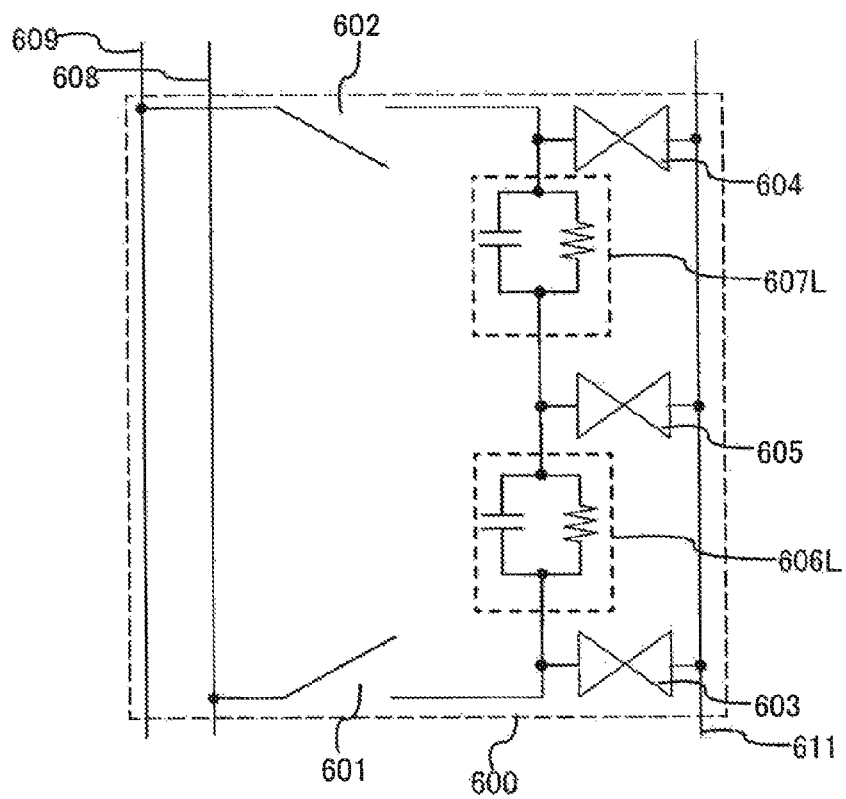
FIGS. 43A and 43B each illustrate a pixel circuit of a display device of the present invention.
Figure 43B:
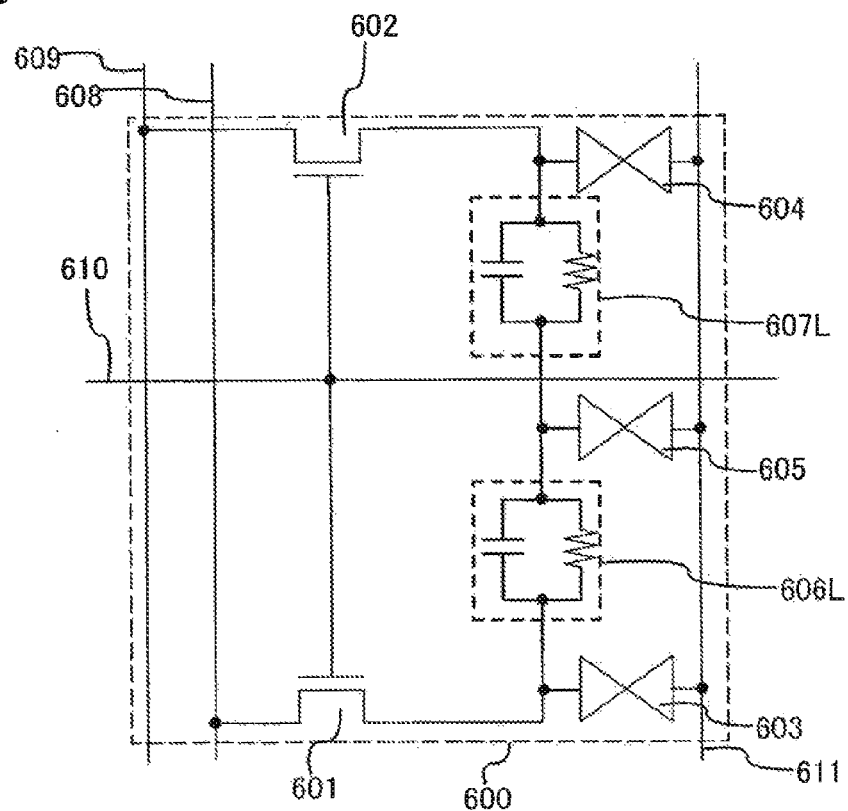
Figure 44A:
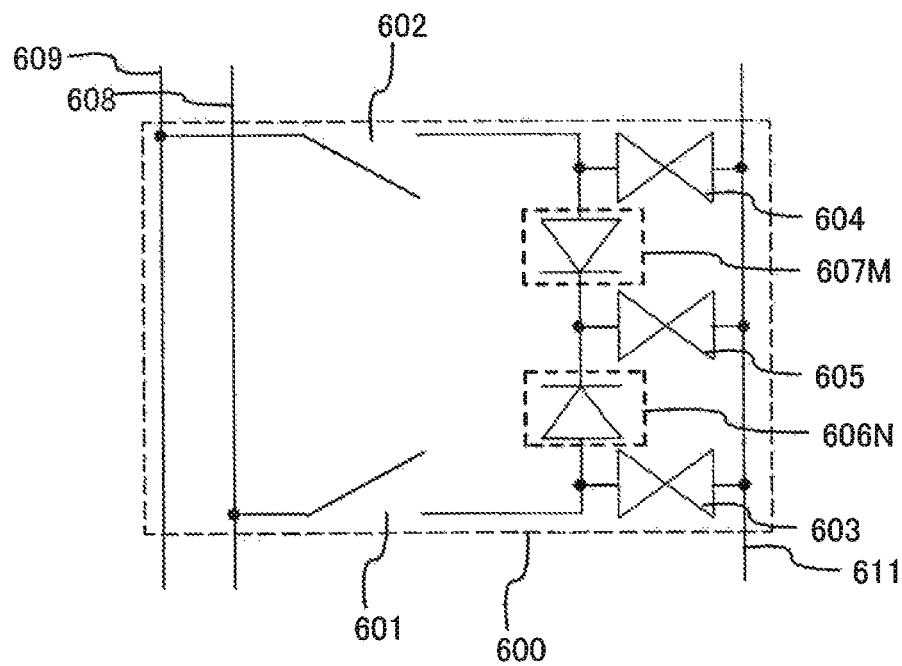
FIGS. 44A and 44B each illustrate a pixel circuit of a display device of the present invention.
Figure 44B:
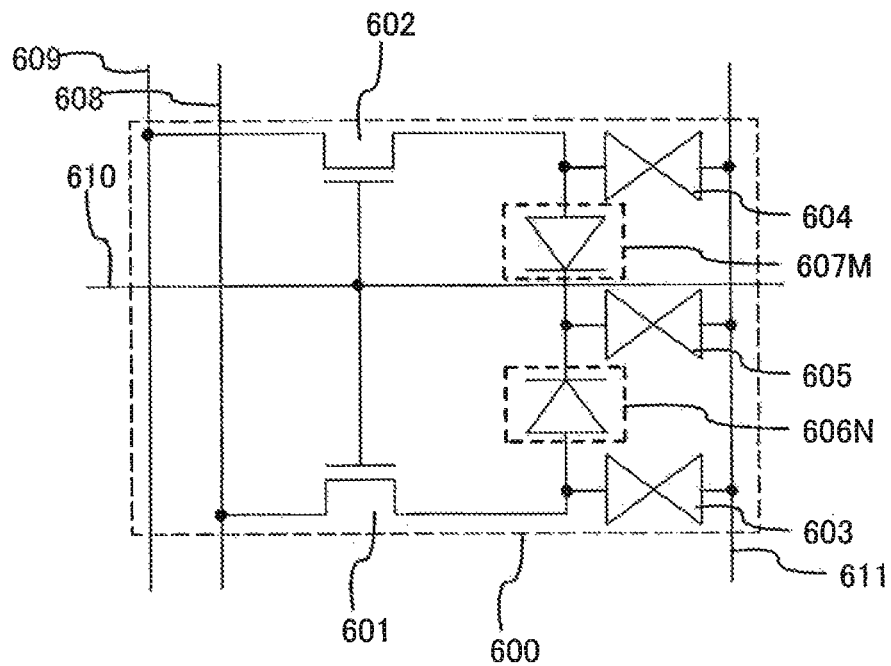
Figure 45A:
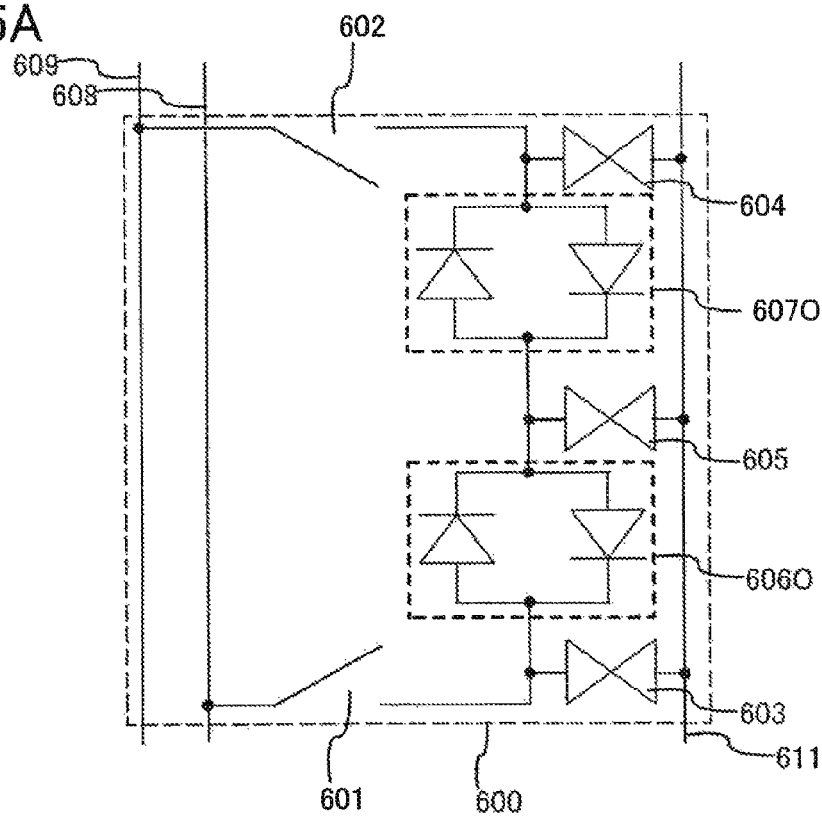
Figure 45B:
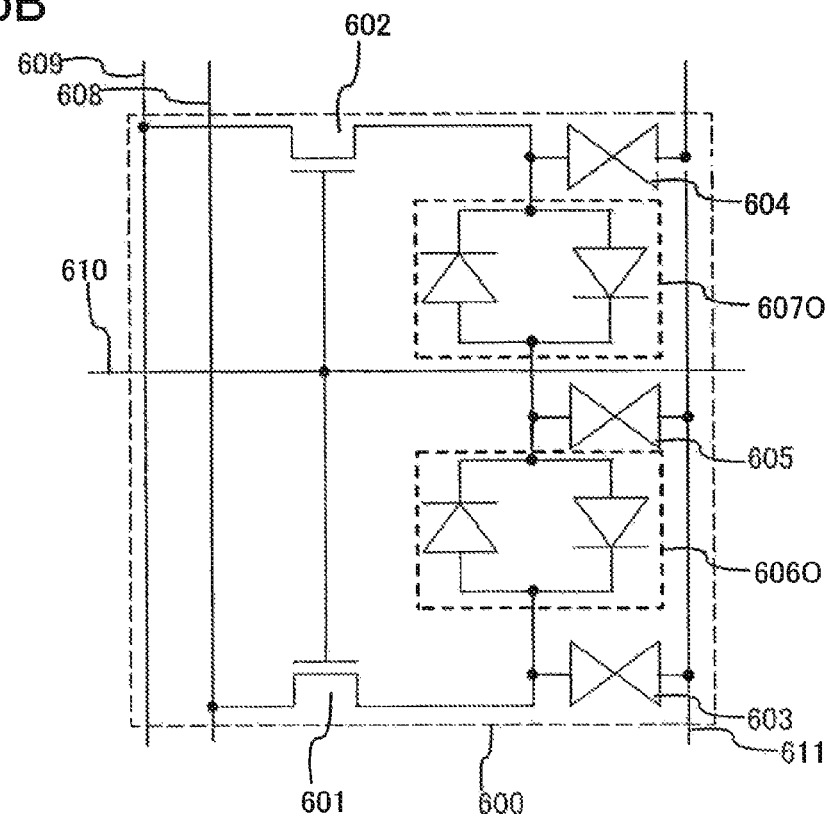
Figure 46A:
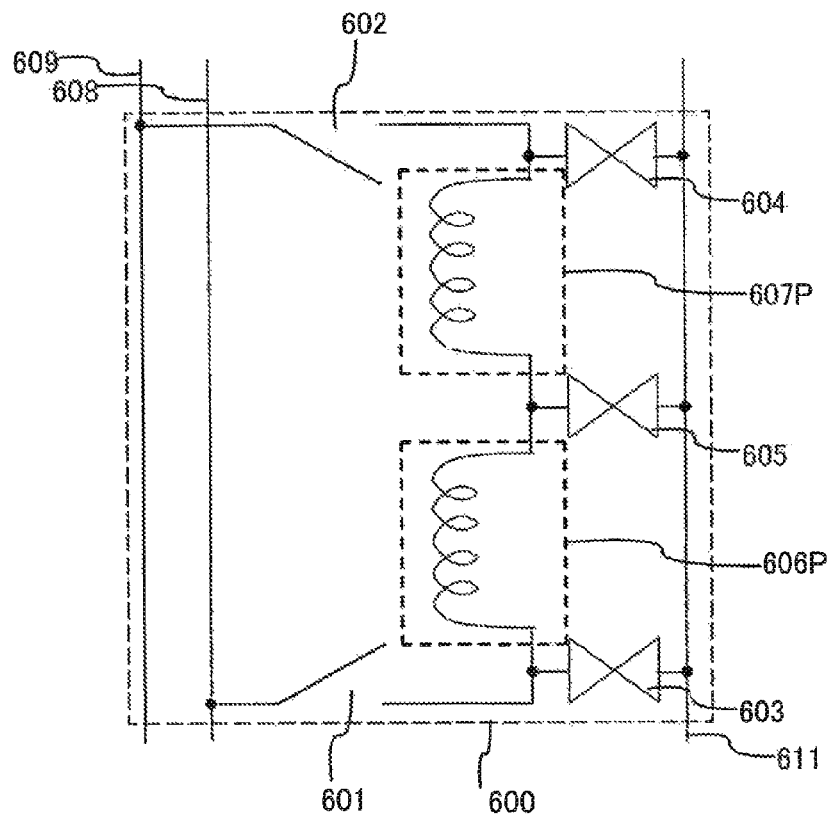
Figure 46B:
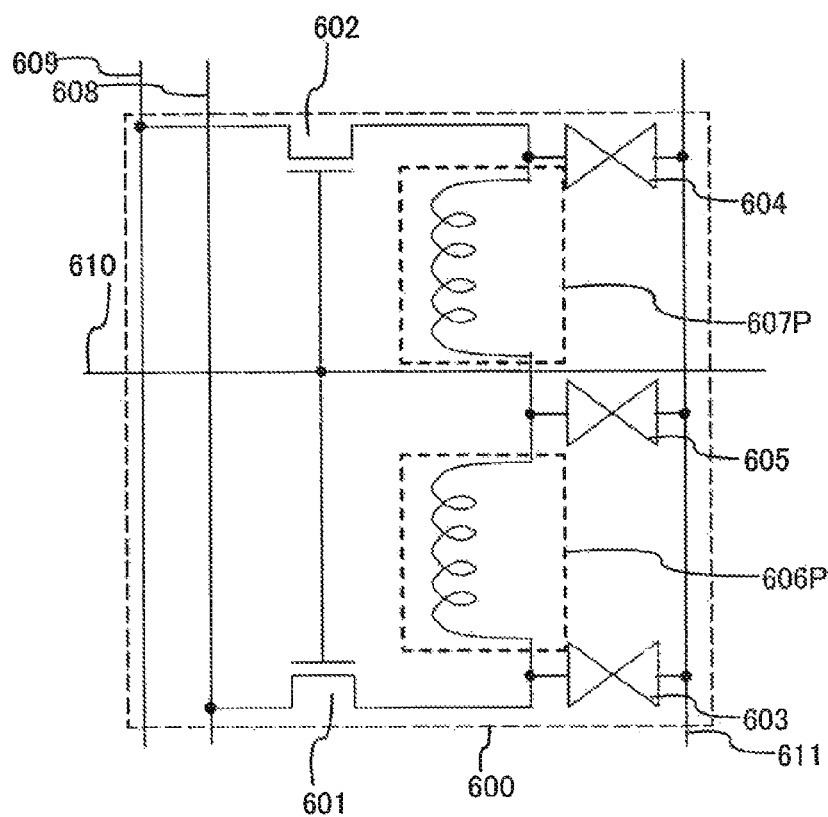
Figure 47A:
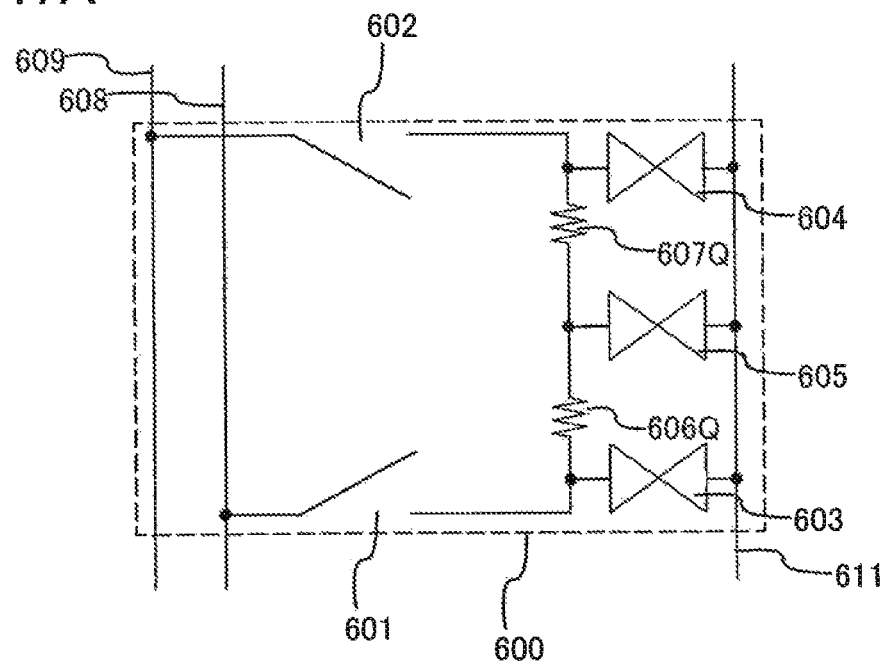
FIGS. 47A and 47B each illustrate a pixel circuit of a display device of the present invention.
Figure 47B:
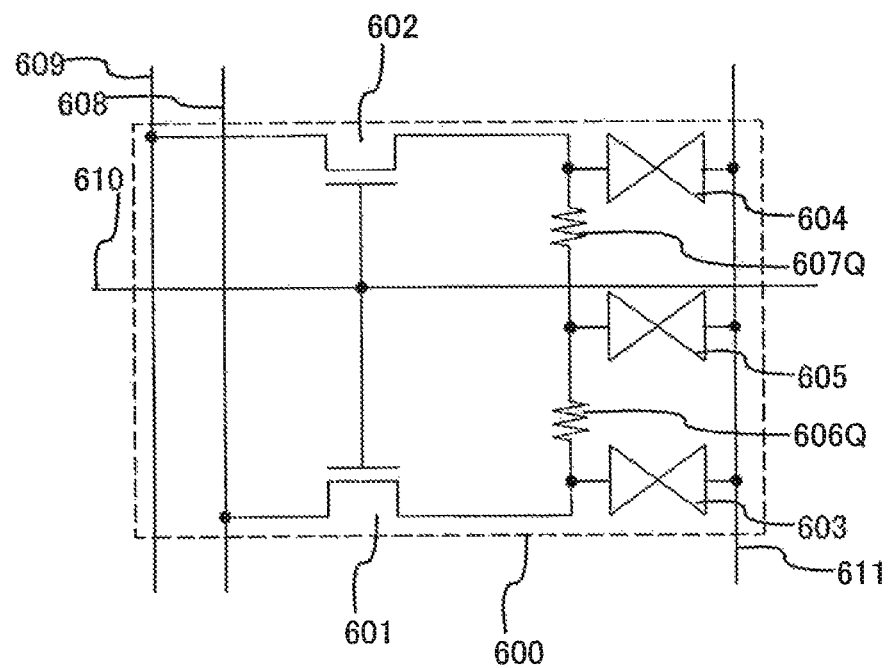
Figure 48A:
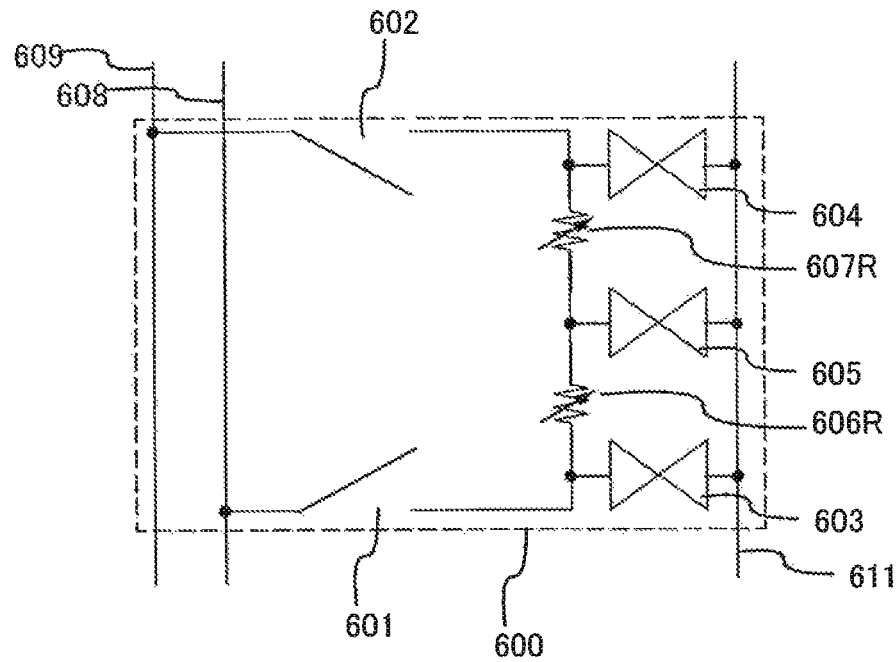
FIGS. 48A and 48B each illustrate a pixel circuit of a display device of the present invention.
Figure 48B:
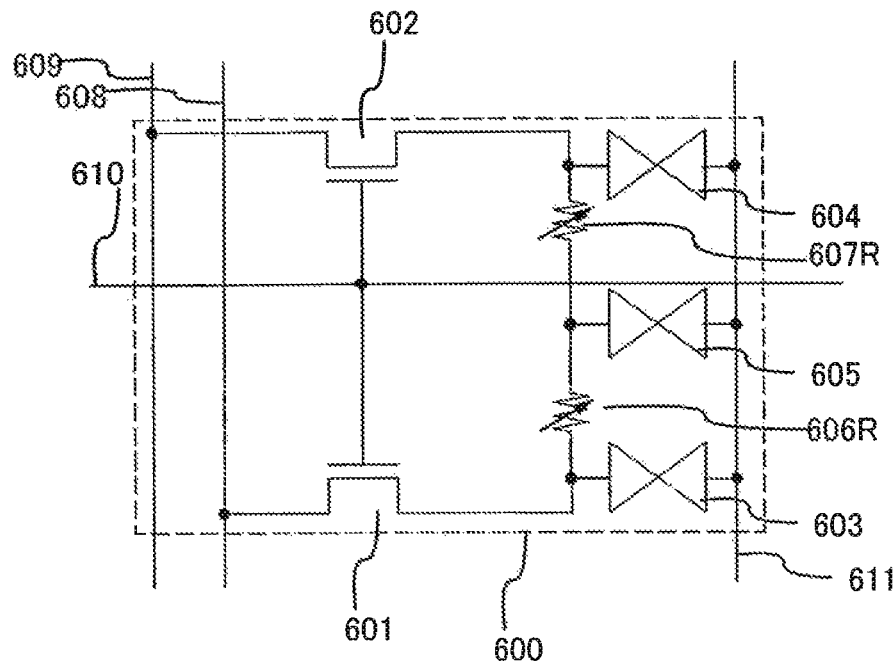

FIG. 34 shows an example of a top view of a pixel of a liquid crystal display device to which the present invention is applied. In addition, FIG. 35 is a circuit diagram of FIG. 34. Note that corresponding portions between FIGS. 34 and 35 are denoted by the same reference numerals.

In a pixel 1020 shown in FIG. 34, a first insulating film (not shown) is provided over a first conductive layer (shown by a hatch pattern of a third wiring 1033) serving as a scan line and a capacitor line; a semiconductor film is provided over the first insulating film, a second conductive film (shown by a hatch pattern of a first wiring 1031) is provided over the semiconductor film; a second insulating film (not shown) is provided over the second conductive layer; and a third conductive layer (shown by a hatch pattern of a first liquid crystal element 1023) is provided over the second insulating film.

In FIG. 35, the pixel 1020 includes a first transistor 1021 serving as a first switch, a second transistor 1022 serving as a second switch, the first liquid crystal element 1023, a second liquid crystal element 1024, a third liquid crystal element 1025, a fourth liquid crystal element 1026, a first capacitor 1027, a second capacitor 1030, a third capacitor 1036, a fourth capacitor 1037, a third transistor 1028, a fourth transistor 1029, and a fifth transistor 1039.

The first wiring 1031 is connected to a second wiring 1032 through the first to fifth transistors connected in series. First electrodes of the first to fourth liquid crystal elements are connected between the respective first to fifth transistors. The first to fourth liquid crystal elements are connected to first electrodes of the capacitors, second electrodes of which are connected to a fourth wiring 1034 or a fifth wiring 1035. Gates of the first to fifth liquid transistors are connected to the third wiring 1033.

Note that FIG. 35 shows the case where all the capacitors which function as divider elements in FIG. 9B are replaced with transistors and all the capacitors are provided with storage capacitors. That is, FIG. 35 shows the case where the contents described in FIGS. 9B and 16B are combined. Therefore, structures which are similar to the structures in FIGS. 1A to 1C can be applied to FIG. 35. In other words, a wiring which functions as a capacitor line may be shared with a common electrode as shown in FIGS. 50A and 50B, the switches can be replaced with transistors, and either N-channel transistors or P-channel transistors may be used as the transistors.

Each of the first wiring 1031 and the second wiring 1032 functions as a signal line. Therefore, an image signal is usually supplied to each of the first wiring 1031 and the second wiring 1032. Note that the present invention is not limited to this. A certain signal may be supplied regardless of an image. The third wiring 1033 functions as a scan line. Each of the fourth wiring 1034 and the fifth wiring 1035 functions as a capacitor line.

When a pixel like the pixel shown in the top view in FIG. 34 is provided, alignment of liquid crystal elements can be varied, so that a liquid crystal display device having a wider viewing angle can be provided.

Note that although this embodiment mode is described with reference to various drawings, part of or all the contents described in each drawing can be freely applied to, combined with, or replaced with part of or all the contents described in another drawing. Further, even more structures are possible when each part is combined with another part in the above-described drawings, and the description of this embodiment mode does not impede this.

Similarly, part of or all the contents described in each drawing of this embodiment mode can be freely applied to, combined with, or replaced with part of or all the contents described in a drawing in another embodiment mode. Further, even more drawings are possible when each part is combined with part of another embodiment mode in the drawings of this embodiment mode, and the description of this embodiment mode does not impede this.

Note that this embodiment mode shows an example of an embodied case of part of or all the contents described in other embodiment modes, an example of slight transformation thereof, an example of partial modification thereof, an example of improvement thereof, an example of detailed description thereof, an application example thereof, or an example of related part thereof. Therefore, the contents described in other embodiment modes can be freely applied to, combined with, or replaced with this embodiment mode.
(Embodiment Mode 3)

In this embodiment mode, a structure and a manufacturing method of a transistor are described.

FIGS. 51A to 51G are cross-sectional views showing examples of a structure and a manufacturing method of a transistor. FIG. 51A is a cross-sectional view showing a structural example of the transistor. FIGS. 51B to 51G are cross-sectional views showing an example of a manufacturing method of the transistor.

Note that the structure and the manufacturing method of the transistor are not limited to those shown in FIGS. 51A to 51G, and various structures and manufacturing methods can be used.

Figure 56A:
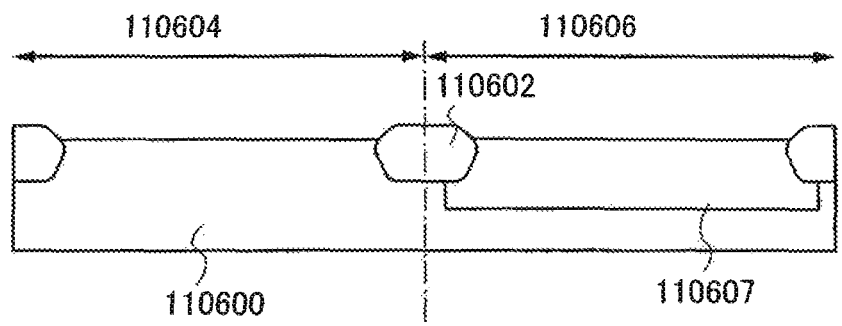
FIGS. 56A to 56C illustrate the present invention.

First, structural examples of transistors are described with reference to FIG. 51A. FIG. 51A is a cross-sectional view of a plurality of transistors each having a different structure. Here, in FIG. 51A, the plurality of transistors each having a different structure are arranged, which is for describing the structures of the transistors. Accordingly, it is not necessary to arrange the transistors actually as shown in FIG. 56A and can be separately formed as necessary.

Next, characteristics of each layer included in the transistor are described.

As a substrate 110111, a glass substrate such as a barium borosilicate glass substrate or an aluminoborosilicate glass substrate, a quartz substrate, a ceramic substrate, or a metal substrate including stainless steel, or the like can be used. Alternatively, a substrate formed using a flexible synthetic resin such as acrylic or plastic typified by polyethylene terephthalate (PET), polyethylene naphthalate (PEN), or polyethersulfone (PES) can be used. When such a flexible substrate is used, a semiconductor device which can be bent can be formed. Since a flexible substrate has no limitations on the area and the shape of a substrate, when a rectangular substrate with a side of one meter or more is used as the substrate 110111, for example, productivity can be significantly improved. Such a merit is greatly advantageous over the case of using a circular silicon substrate.

An insulating film 110112 functions as a base film. The insulating film 110112 is provided to prevent alkali metal such as Na or alkaline earth metal from the substrate 110111 from adversely affecting characteristics of a semiconductor element. The insulating film 110112 can have a single-layer structure or a stacked-layer structure of an insulating film including oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y). For example, when the insulating film 110112 is provided to have a two-layer structure, it is preferable that a silicon nitride oxide film be used as a first insulating film and a silicon oxynitride film be used as a second insulating film. As another example, when the insulating film 110112 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 1101143, 110114, and 110115 can be formed by using an amorphous semiconductor or a semi-amorphous semiconductor (SAS). Alternatively, a polycrystalline semiconductor film may be used. SAS is a semiconductor having an intermediate structure between amorphous and crystalline (including single-crystal and polycrystalline) structures and having a third state which is stable in free energy. Moreover, SAS includes a crystalline region with a short range order and lattice distortion. A crystalline region of 0.5 to 20 nm can be observed at least in part of an SAS film. When silicon is contained as a main component, Raman spectrum shifts to a wave number side lower than 520 $cm^{-1}$. The diffraction peaks of (111) and (220) which are thought to be derived from a silicon crystalline lattice are observed by X-ray diffraction. SAS contains hydrogen or halogen of at least 1 at. % or more to terminate dangling bonds. SAS is formed by glow discharge decomposition (plasma CVD) of a material gas. As the material gas, $Si_2H_6$, $SiH_2Cl_2$, $SiHCl_3$, $SiF_4$, $SiF_4$, or the like as well as $SiH_4$ can be used. Further, $GeF_4$ may be mixed. Alternatively, the material gas may be diluted with $H_2$, or $H_2$ and one or more kinds of rare gas elements selected from He, Ar, Kr, or Ne. The dilution ratio may be in the range of 2 to 1000 times, pressure may be in the range of approximately 0.1 to 133 Pa, a power supply frequency may be 1 to 120 MHz and preferably 13 to 60 MHz, and a substrate heating temperature may be 300° C. or lower. A concentration of impurities in atmospheric components such as oxygen, nitrogen, and carbon is preferably $1\times10^{20}$ $cm^{-1}$ or less as impurity elements in the film. In particular, an oxygen concentration is $5\times10^{19}/cm^3$ or less, and preferably $1\times10^{19}/cm^3$ or less. Here, an amorphous silicon film is formed using a material including silicon (Si) as a main component (e.g., $Si_xGe_{1-x}$) by sputtering, LPCVD, plasma CVD, or the like. Then, the amorphous silicon film is crystallized by a crystallization method such as a laser crystallization method, a thermal crystallization method using RTA or an annealing furnace, or a thermal crystallization method using a metal element which promotes crystallization.

An insulating film 110116 can have a single-layer structure or a stacked-layer structure of an insulating film including oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y).

A gate electrode 110117 can have a single-layer structure of a conductive film or a stacked-layer structure of two or three conductive films. As a material for the gate electrode 110117, a conductive film can be used. For example, a film of an element such as tantalum (Ta), titanium (Ti), molybdenum (Mo), tungsten (W), chromium (Cr), or silicon (Si); a nitride film including the element (typically a tantalum nitride film, a tungsten nitride film, or a titanium nitride film); an alloy film in which the elements are combined (typically a Mo—W alloy or a Mo—Ta alloy); a silicide film including the element (typically a tungsten silicide film or a titanium silicide film); and the like can be used. Note that the above-described film of such an element, nitride film, alloy film, silicide film, and the like can have a single-layer structure or a stacked-layer structure.

An insulating film 110118 can have a single-layer structure or a stacked-layer structure of an insulating film including oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y); or a film including carbon, such as a DLC (diamond like carbon), by sputtering, plasma CVD, or the like.

An insulating film 110119 can have a single-layer structure or a stacked-layer structure of a siloxane resin; an insulating film including oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y); or a film including carbon, such as a DLC (diamond like carbon); an organic material such as epoxy, polyimide, polyamide, polyvinyl phenol, benzocyclobutene, or acrylic. Note that a siloxane resin corresponds to a resin having Si—O—Si bonds. Siloxane includes a skeleton structure of a bond of silicon (Si) and oxygen (O). As a substituent, an organic group including at least hydrogen (e.g., an alkyl group or aromatic hydrocarbon) is used. Alternatively, a fluoro group, or a fluoro group and an organic group including at least hydrogen can be used as a substituent. Note that the insulating film 110119 can be directly provided so as to cover the gate electrode 110117 without providing the insulating film 110118.

As a conductive film 110123, a film of an element such as Al, Ni, C, W, Mo, Ti, Pt, Cu, Ta, Au, or Mn, a nitride film including the element, an alloy film in which the elements are combined, a silicide film including the element, or the like can be used. For example, as an alloy including some of such elements, an Al alloy including C and Ti, an Al alloy including Ni, an Al alloy including C and Ni, an Al alloy including C and Mn, or the like can be used. In the case of a stacked-layer structure, for example, a structure can be such that Al is interposed between Mo, Ti, or the like, so that resistance of Al to heat and chemical reaction can be improved.

Next, characteristics of each structure is described with reference to the cross-sectional view of the plurality of transistors each having a different structure in FIG. 51A.

A transistor 110101 is a single-drain transistor. Since the transistor 110101 can be formed by a simple method, it is advantageous in low manufacturing cost and high yield. Here, semiconductor layers 110113 and 110115 have different concentration of impurities, and the semiconductor layer 110113 is used as a channel region and the semiconductor layers 110115 are used as a source region and a drain region. When the amount of impurities is controlled in this manner, resistivity of the semiconductor layer can be controlled. Further, an electric connection state between the semiconductor layer and the conductive film 110123 can be closer to ohmic contact. Note that as a method for separately forming the semiconductor layers including different amount of impurities, a method where impurities are added to the semiconductor layer by using the gate electrode 110117 as a mask can be used.

A transistor 110102 is a transistor in which the gate electrode 110117 has a certain tapered angle or more. Since the transistor 110102 can be formed by a simple method, it is advantageous in low manufacturing cost and high yield. Here, the semiconductor layers 110113, 110114, and 10115 have different concentration of impurities. The semiconductor layer 110113 is used as a channel region, the semiconductor layers 110114 are used as lightly doped drain (LDD) regions, and the semiconductor layers 110115 are used as a source region and a drain region. When the amount of impurities is controlled in this manner, resistivity of the semiconductor layer can be controlled. Further, an electric connection state between the semiconductor layer and the conductive film 110123 can be closer to ohmic contact. Moreover, since the transistor includes the LDD region, high electric field is not easily applied to the transistor, deterioration of the element due to hot carriers can be suppressed. Note that as a method for separately forming the semiconductor layers including different amount of impurities, a method where impurities are added to the semiconductor layer by using the gate electrode 110117 as a mask can be used. In the transistor 110102, since the gate electrode 110117 has a certain tapered angle or more, gradient of the concentration of impurities added to the semiconductor layer through the gate electrode 110117 can be provided, and the LDD region can be easily formed.

A transistor 110103 is a transistor in which the gate electrode 110117 includes at least two layers and a lower gate electrode is longer than an upper gate electrode. In this specification, the shape of the upper gate electrode and the lower gate electrode is referred to as a hat shape. When the gate electrode 110117 has a hat shape, an LDD region can be formed without adding a photomask. Note that a structure where the LDD region overlaps with the gate electrode 110117, like the transistor 110103, is particularly referred to as a GOLD (gate overlapped LDD) structure. As a method for forming the gate electrode 110117 with a hat shape, the following method may be used.

First, when the gate electrode 110117 is patterned, the lower and upper gate electrodes are etched by dry etching so that side surfaces thereof are inclined (tapered). Then, the inclination of the upper gate electrode is processed to be almost perpendicular by anisotropic etching. Thus, the gate electrode is formed such that the cross section is hat-shaped. Then, doping of impurity elements is performed twice, so that the semiconductor layer 110113 used as a channel region, the semiconductor layers 110114 used as LDD regions, and the semiconductor layers 110115 used as a source electrode and a drain electrode are formed.

Note that a portion of the LDD region, which overlaps with the gate electrode 110117, is referred to as an $L_{ov}$ region, and a portion of the LDD region, which does not overlap with the gate electrode 110117, is referred to as an $L_{off}$ region. The $L_{off}$ region is highly effective in suppressing an off-current value, whereas it is not very effective in preventing deterioration in an on-current value due to hot carriers by relieving an electric field in the vicinity of the drain. On the other hand, the $L_{ov}$ region is highly effective in preventing deterioration in the on-current value by relieving the electric field in the vicinity of the drain, whereas it is not very effective in suppressing the off-current value. Thus, it is preferable to form a transistor having a structure corresponding to characteristics necessary for each of various circuits. For example, when the semiconductor device is used for a display device, a transistor having an $L_{off}$ region is preferably used as a pixel transistor in order to suppress the off-current value. On the other hand, as a transistor in a peripheral circuit, a transistor having an $L_{ov}$ region is preferably used in order to prevent deterioration in the on-current value by relieving the electric field in the vicinity of the drain.

A transistor 110104 is a transistor including a sidewall 110121 in contact with a side surface of the gate electrode 110117. When the transistor includes the sidewall 110121, a region overlapping with the sidewall 110121 can be formed as an LDD region.

A transistor 110105 is a transistor in which an LDD ($L_{off}$) region is formed by doping the semiconductor layer with an impurity element by using a mask 110122. Thus, the LDD region can be surely formed, and an off-current value of the transistor can be reduced.

A transistor 110106 is a transistor in which an LDD ($L_{off}$) region is formed by doping in the semiconductor layer by using a mask. Thus, the LDD region can be surely formed, and deterioration in an on-current value can be prevented by relieving the electric field in the vicinity of the drain of the transistor.

Next, an example of a manufacturing method of a transistor is described with reference to FIGS. 51B to 51G.

Note that a structure and a manufacturing method of a transistor are not limited to those in FIGS. 51A to 51G, and various structures and manufacturing methods can be used.

In this embodiment mode, a surface of the substrate 110111, a surface of the insulating film 110112, a surface of the semiconductor layer 110113, a surface of the semiconductor layer 110114, a surface of the semiconductor layer 110115, a surface of the insulating film 110116, a surface of the insulating film 110118, or a surface of the insulating film 110119 is oxidized or nitrided by using plasma treatment, so that the semiconductor layer or the insulating film can be oxidized or nitrided. When the semiconductor layer or the insulating film is oxidized or nitrided by plasma treatment in such a manner, the surface of the semiconductor layer or the insulating film is modified, and the insulating film can be formed to be denser than an insulating film formed by CVD or sputtering. Thus, a defect such as a pinhole can be suppressed, and characteristics and the like of the semiconductor device can be improved.

First, the surface of the substrate 110111 is washed by using hydrofluoric acid (HF), alkaline, or pure water. As the substrate 110111, a glass substrate such as a barium borosilicate glass substrate or an aluminoborosilicate glass substrate, a quartz substrate, a ceramic substrate, a metal substrate including stainless steel, or the like can be used. Alternatively, a substrate formed using plastics typified by polyethylene terephthalate (PET), polyethylene naphthalate (PEN), or polyethersulfone (PES), or a substrate formed using a flexible synthetic resin such as acrylic can be used. Here, the case where a glass substrate is used as the substrate 110111 is shown.

Here, an oxide film or a nitride film may be formed on the surface of the substrate 110111 by oxidizing or nitriding the surface of the substrate 110111 by plasma treatment (FIG. 51B). Hereinafter, an insulating film such as an oxide film or a nitride film formed by performing plasma treatment on the surface is also referred to as a plasma-treated insulating film. In FIG. 51B, an insulating film 110131 is a plasma-treated insulating film. In general, when a semiconductor element such as a thin film transistor is provided over a substrate formed of glass, plastic, or the like, an impurity element such as alkali metal (e.g., Na) or alkaline earth metal included in glass, plastic, or the like might be mixed into the semiconductor element so that the semiconductor element is contaminated; thus, characteristics of the semiconductor element may be adversely affected in some cases. However, nitridation of a surface of the substrate formed of glass, plastic, or the like can prevent an impurity element such as alkali metal (e.g., Na) or alkaline earth metal included in the substrate from being mixed into the semiconductor element.

When the surface is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor layer is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar can be used, for example. Alternatively, a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

It is preferable to perform plasma treatment in the atmosphere containing the aforementioned gas, with conditions of an electron density in the range of $1 \times 10^{11}$ to $1 \times 10^{13}$ cm$^{-3}$ and a plasma electron temperature in the range of 0.5 to 1.5 eV. Since the plasma electron density is high and the electron temperature in the vicinity of an object to be treated is low, damage by plasma to the object to be treated can be prevented. Since the plasma electron density is as high as $1 \times 10^{11}$ cm$^{-3}$ or more, an oxide film or a nitride film formed by oxidizing or nitriding the object to be treated by plasma treatment is superior in its uniformity of thickness and the like as well as being dense, as compared to a film formed by CVD, sputtering, or the like. Alternatively, since the plasma electron temperature is as low as 1 eV or less, oxidation or nitridation can be performed at a lower temperature as compared to conventional plasma treatment or thermal oxidation. For example, oxidation or nitridation can be performed sufficiently even when plasma treatment is performed at a temperature lower than a strain point of a glass substrate by 100 degrees or more. Note that as frequency for generating plasma, high frequency waves such as microwaves (2.45 GHz) can be used. Note that hereinafter, plasma treatment is performed by using the aforementioned conditions unless otherwise specified.

Note that although FIG. 51B shows the case where the plasma-treated insulating film is formed by performing plasma treatment on the surface of the substrate 110111, this embodiment mode includes the case where a plasma-treated insulating film is not formed on the surface of the substrate 110111.

Note that although a plasma-treated insulating film formed by performing plasma treatment on the surface of the object to be treated is not shown in FIGS. 51C to 51G, this embodiment mode includes the case where a plasma-treated insulating film formed by plasma treatment exists on the surface of the substrate 110111, the insulating film 110112, the semiconductor layers 110113, the semiconductor layer 110114, the semiconductor layer 110115, the insulating film 110116, the insulating film 110118, or the insulating film 110119.

Next, the insulating film 110112 is formed over the substrate 110111 by sputtering, LPCVD, plasma CVD, or the like (FIG. 51C). For the insulating film 110112, silicon oxide ($SiO_x$) or silicon oxynitride ($SiO_xN_y$) ($x>y$) can be used.

Here, a plasma-treated insulating film may be formed on the surface of the insulating film 110112 by oxidizing or nitriding the surface of the insulating film 110112 by plasma treatment. By oxidizing the surface of the insulating film 110112, the surface of the insulating film 110112 is modified, and a dense film with fewer defects such as a pinhole can be obtained. Further, by oxidizing the surface of the insulating film 110112, the plasma-treated insulating film containing a little amount of N atoms can be formed; thus, interface characteristics of the plasma-treated insulating film and a semiconductor layer are improved when the semiconductor layer is provided over the plasma-treated insulating film. The plasma-treated insulating film contains a rare gas (containing at least one of He, Ne, Ar, Kr, and Xe) used for the plasma treatment. Note that the plasma treatment can be performed in a similar manner under the aforementioned conditions.

Next, the island-shaped semiconductor layers 110113 and 110114 are formed over the insulating film 110112 (FIG. 51D). The island-shaped semiconductor layers 110113 and 110114 can be formed in such a manner that an amorphous semiconductor layer is formed over the insulating film 110112 by using a material containing silicon (Si) as its main component (e.g., $Si_xGe_{1-x}$) or the like by sputtering, LPCVD, plasma CVD, or the like, the amorphous semiconductor layer is crystallized, and the semiconductor layer is selectively etched. Note that crystallization of the amorphous semiconductor layer can be performed by a known crystallization method such as a laser crystallization method, a thermal crystallization method using RTA or an annealing furnace, a thermal crystallization method using a metal element which promotes crystallization, or a method in which these methods are combined. Here, end portions of the island-shaped semiconductor layers are provided with an angle of about 90° ($\theta$=85 to 100°). Alternatively, the semiconductor layer 110114 to be a low concentration drain region may be formed by doping impurities with the use of a mask.

Here, a plasma-treated insulating film may be formed on the surfaces of the semiconductor layers 110113 and 110114 by oxidizing or nitriding the surfaces of the semiconductor layers 110113 and 110114 by plasma treatment. For example, when Si is used for the semiconductor layers 110113 and 110114, silicon oxide ($SiO_x$) or silicon nitride ($SiN_x$) is formed as the plasma-treated insulating film. Alternatively, after being oxidized by plasma treatment, the semiconductor layers 110113 and 110114 may be nitrided by performing plasma treatment again. In this case, silicon oxide ($SiO_x$) is formed in contact with the semiconductor layers 110113 and 110114, and silicon nitride oxide ($SiN_xO_y$) (x>y) is formed on the surface of the silicon oxide. Note that when the semiconductor layer is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor layer is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar can be used, for example. Alternatively, a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

Next, the insulating film 110116 is formed (FIG. 51E). The insulating film 110116 can have a single-layer structure or a stacked-layer structure of an insulating film containing oxygen or nitrogen, such as silicon oxide ($SiO_x$), silicon nitride ($SiN_1$), silicon oxynitride ($SiO_xN_y$) (x>y), or silicon nitride oxide ($SiN_xO_y$) (x>y), by sputtering, LPCVD, plasma CVD, or the like. Note that when the plasma-treated insulating film is formed on the surfaces of the semiconductor layers 110113 and 110114 by performing plasma treatment on the surfaces of the semiconductor layers 110113 and 110114, the plasma-treated insulating film can be used as the insulating film 110116.

Here, the surface of the insulating film 110116 may be oxidized or nitrided by plasma treatment, so that a plasma-treated insulating film is formed on the surface of the insulating film 110116. Note that the plasma-treated insulating film contains a rare gas (containing at least one of He, Ne, Ar, Kr, and Xe) used for the plasma treatment. The plasma treatment can be performed in a similar manner under the aforementioned conditions.

Alternatively, after the insulating film 110116 is oxidized by performing plasma treatment once in an oxygen atmosphere, the insulating film 110116 may be nitrided by performing plasma treatment again in a nitrogen atmosphere. By oxidizing or nitriding the surface of the insulating film 110116 by plasma treatment in such a manner, the surface of the insulating film 110116 is modified, and a dense film can be formed. An insulating film obtained by plasma treatment is denser and has fewer defects such as a pinhole, as compared with an insulating film formed by CVD or sputtering. Thus, characteristics of a thin film transistor can be improved.

Next, the gate electrode 110117 is formed (FIG. 51F). The gate electrode 110117 can be formed by a sputtering, LPCVD, plasma CVD, or the like.

In the transistor 110101, the semiconductor layers 110115 used as the source region and the drain region can be formed by doping impurities after the gate electrode 110117 is formed.

In the transistor 110102, the semiconductor layers 110114 used as the LDD regions and the semiconductor layers 110115 used as the source region and the drain region can be formed by doping impurities after the gate electrode 110117 is formed.

In the transistor 110103, the semiconductor layers 110114 used as the LDD regions and the semiconductor layers 110115 used as the source region and the drain region can be formed by doping impurities after the gate electrode 110117 is formed.

In the transistor 110104, the semiconductor layers 110114 used as the LDD regions and the semiconductor layers 110115 used as the source region and the drain region can be formed by doping impurities after the sidewall 110121 is formed on the side surface of the gate electrode 110117.

Note that silicon oxide ($SiO_x$) or silicon nitride ($SiN_x$) can be used for the sidewall 110121. As a method for forming the sidewall 110121 on the side surface of the gate electrode 110117, a method can be used, for example, in which a silicon oxide ($SiO_x$) film or a silicon nitride ($SiN_x$) film is formed by a known method after the gate electrode 110117 is formed, and then, the silicon oxide ($SiO_x$) film or the silicon nitride ($SiN_x$) film is etched by anisotropic etching. Thus, the silicon oxide ($SiO_x$) film or the silicon nitride ($SiN_x$) film remains only on the side surface of the gate electrode 110117, so that the sidewall 110121 can be formed on the side surface of the gate electrode 110117.

In the transistor 110105, the semiconductor layers 110114 used as the LDD ($L_{off}$) regions and the semiconductor layer 110115 used as the source region and the drain region can be formed by doping impurities after a mask 110122 is formed to cover the gate electrode 110117.

In the transistor 110106, the semiconductor layers 110114 used as the LDD ($L_{ov}$) regions and the semiconductor layers 110115 used as the source region and the drain region can be formed by doping impurities after the gate electrode 110117 is formed.

Next, the insulating film 110118 is formed (FIG. 51G). The insulating film 110118 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$)(x>y), or silicon nitride oxide ($SiN_xO_y$)(x>y); or a film containing carbon, such as a DLC (diamond-like carbon), by sputtering, plasma CVD, or the like.

Here, the surface of the insulating film 110118 may be oxidized or nitrided by plasma treatment, so that a plasma-treated insulating film is formed on the surface of the insulating film 110118. Note that the plasma-treated insulating film contains a rare gas (containing at least one of He, Ne, Ar, Kr, and Xe) used for the plasma treatment. The plasma treatment can be performed in a similar manner under the aforementioned conditions.

Next, the insulating film 110119 is formed. The insulating film 110119 can have a single-layer structure or a stacked-layer structure of an organic material such as epoxy, polyimide, polyamide, polyvinyl phenol, benzocyclobutene, or acrylic; or a siloxane resin, in addition to an insulating film containing oxygen or nitrogen, such as silicon oxide ($SiO_x$), silicon nitride ($SiN_x$), silicon oxynitride ($SiO_xN_y$) (x>y), or silicon nitride oxide (SiN$_x$O$_y$) (x>y); or a film containing carbon, such as a DLC (diamond-like carbon), by sputtering, plasma CVD, or the like. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Note that the plasma-treated insulating film contains a rare gas (containing at least one of He, Ne, Ar, Kr, and Xe) used for the plasma treatment. For example, the plasma-treated insulating film contains Ar when Ar is used.

When an organic material such as polyimide, polyamide, polyvinyl phenol, benzocyclobutene, or acrylic, a siloxane resin, or the like is used for the insulating film 110119, the surface of the insulating film 110119 can be modified by oxidizing or nitriding the surface of the insulating film by plasma treatment. Modification of the surface improves strength of the insulating film 110119, and physical damage such as a crack generated when an opening is formed, for example, or film reduction in etching can be reduced. When the conductive film 110123 is formed over the insulating film 110119, modification of the surface of the insulating film 110119 improves adhesion to the conductive film. For example, when a siloxane resin is used for the insulating film 110119 and nitrided by plasma treatment, a plasma-treated insulating film containing nitrogen or a rare gas is formed by nitriding a surface of the siloxane resin, and physical strength is improved.

Next, contact holes are formed in the insulating films 110119, 110118, and 110116 in order to form the conductive film 110123 which is electrically connected to the semiconductor layer 110115. Note that the contact holes may have a tapered shape. Thus, coverage with the conductive film 110123 can be improved.

Figure 55:
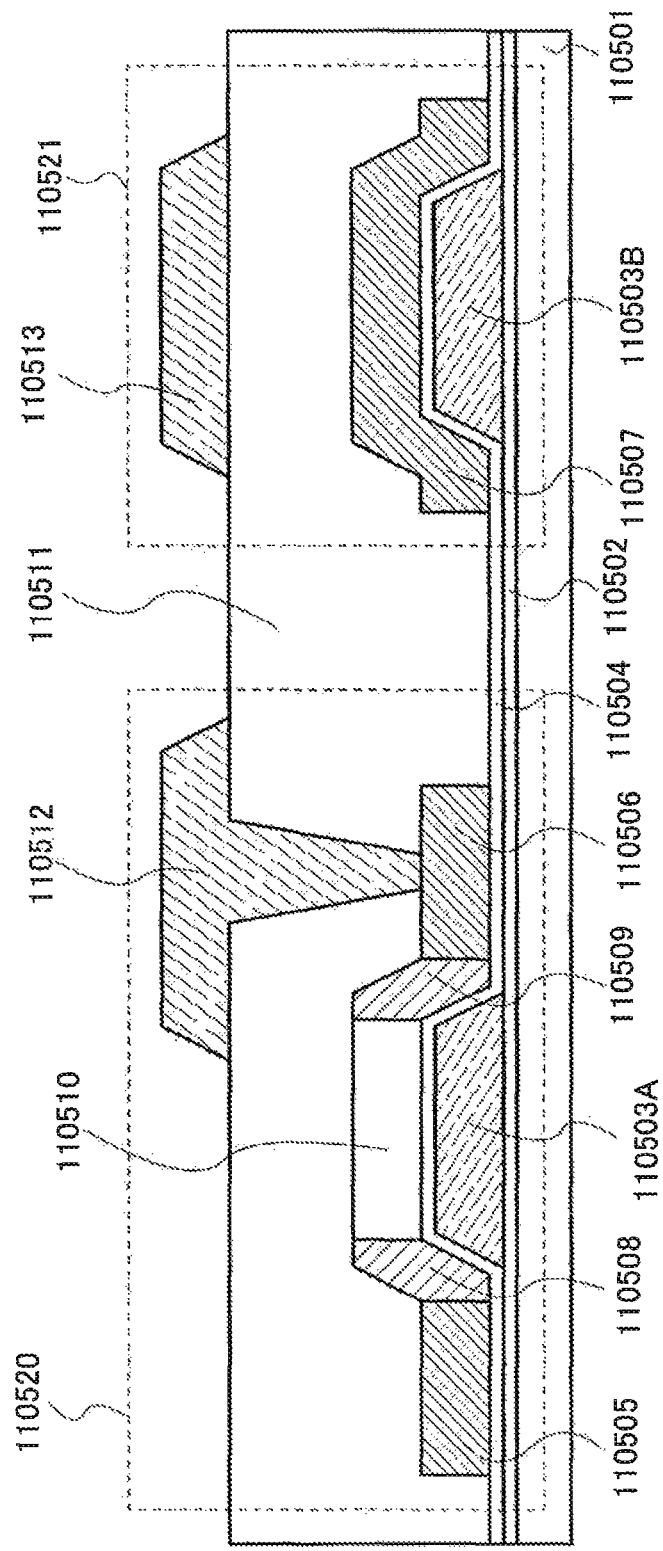
FIG. 55 illustrates the present invention.

FIG. 55 shows cross-sectional structures of a bottom-gate transistor and a capacitor.

A first insulating film (an insulating film 110502) is formed over the entire surface of a substrate 110501. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiO$_x$N$_y$), or the like can be used.

A first conductive layer (conductive layers 110503A and 110503B) is formed over the first insulating film. The conductive layer 110503A includes a portion functioning as a gate electrode of a transistor 110520. The conductive layer 110503B includes a portion functioning as a first electrode of a capacitor 110521. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A second insulating film (an insulating film 110504) is formed so as to cover at least the first conductive layer. The second insulating film functions as a gate insulating film. As the second insulating film, a single layer or a stacked layer of a silicon oxide film, a silicon nitride film, a silicon oxynitride film (SiO$_x$N$_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A semiconductor layer is formed in part of a portion over the second insulating film, which overlaps with the first conductive layer, by photolithography, an inkjet method, a printing method, or the like. Part of the semiconductor layer extends to a portion over the second insulating film, which does not overlap with the first conductive layer. The semiconductor layer includes a channel formation region (a channel formation region 110510), an LDD region (LDD regions 110508 and 110509), and an impurity region (impurity regions 110505, 110506, and 110507). The channel formation region 110510 functions as a channel formation region of the transistor 110520. The LDD regions 110508 and 110509 function as LDD regions of the transistor 110520. Note that the LDD regions 110508 and 110509 are not necessarily formed. The impurity region 110505 includes a portion functioning as one of a source electrode and a drain electrode of the transistor 110520. The impurity region 110506 includes a portion functioning as the other of the source electrode and the drain electrode of the transistor 110520. The impurity region 110507 includes a portion functioning as a second electrode of the capacitor 110521.

A third insulating film (an insulating film 110511) is formed over the entire surface. A contact hole is selectively formed in part of the third insulating film. The insulating film 110511 functions as an interlayer film. As the third insulating film, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material containing siloxane may be used. Note that siloxane is a material in which a skeleton structure is formed by a bond of silicon (Si) and oxygen (O). As a substitute, an organic group containing at least hydrogen (such as an alkyl group or aromatic hydrocarbon) is used. Alternatively, a fluoro group, or a fluoro group and an organic group containing at least hydrogen may be used as a substituent.

A second conductive layer (conductive layers 110512 and 110513) is formed over the third insulating film. The conductive layer 110512 is connected to the other of the source electrode and the drain electrode of the transistor 110520 through the contact hole formed in the third insulating film. Thus, the conductive layer 110512 includes a portion functioning as the other of the source electrode and the drain electrode of the transistor 110520. The conductive layer 110513 includes a portion functioning as the first electrode of the capacitor 110521. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Next, structures of a transistor and a capacitor are described in the case where an amorphous silicon (a-Si:H) film is used as a semiconductor layer of the transistor.

Figure 52:
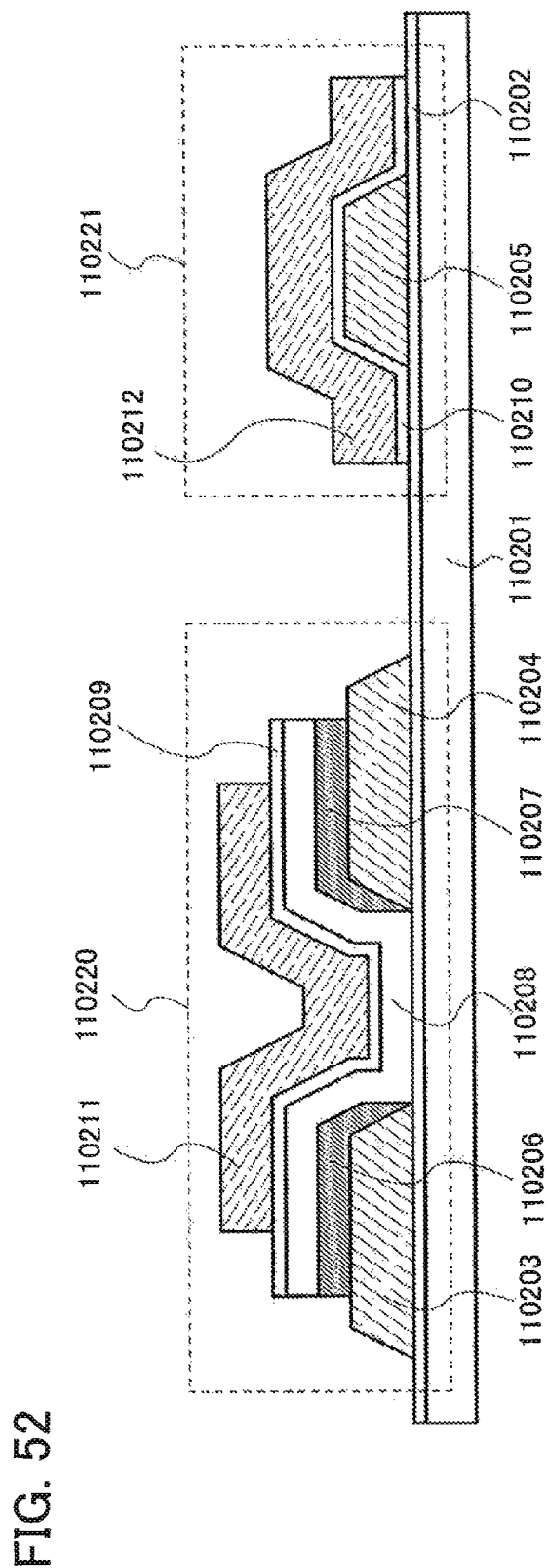
FIG. 52 illustrates the present invention.

FIG. 52 shows cross-sectional structures of a top-gate transistor and a capacitor.

A first insulating film (an insulating film 110202) is formed over the entire surface of a substrate 110201. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, yield can be improved.

A first conductive layer (conductive layers 110203, 110204, and 110205) is formed over the first insulating film. The conductive layer 110203 includes a portion functioning as one of a source electrode and a drain electrode of a transistor 110220. The conductive layer 110204 includes a portion functioning as the other of the source electrode and the drain electrode of the transistor 110220. The conductive layer 110205 includes a portion functioning as a first electrode of a capacitor 110221. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A first semiconductor layer (semiconductor layers 110206 and 110207) is formed above the conductive layers 110203 and 110204. The semiconductor layer 110206 includes a portion functioning as one of the source electrode and the drain electrode. The semiconductor layer 110207 includes a portion functioning as the other of the source electrode and the drain electrode. As the first semiconductor layer, silicon containing phosphorus or the like can be used, for example.

A second semiconductor layer (a semiconductor layer 110208) is formed over the first insulating film and between the conductive layer 110203 and the conductive layer 110204. Part of the semiconductor layer 110208 extends over the conductive layers 110203 and 110204. The semiconductor layer 110208 includes a portion functioning as a channel formation region of the transistor 110220. As the second semiconductor layer, a semiconductor layer having no crystallinity such as an amorphous silicon (a-Si:H) layer, a semiconductor layer such as a microcrystalline semiconductor (μ-Si:H) layer, or the like can be used.

A second insulating film (insulating films 110209 and 110210) is formed so as to cover at least the semiconductor layer 110208 and the conductive layer 110205. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the second semiconductor layer, a silicon oxide film is preferably used. This is because the trap level at the interface between the second semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A second conductive layer (conductive layers 110211 and 110212) is formed over the second insulating film. The conductive layer 110211 includes a portion functioning as a gate electrode of the transistor 110220. The conductive layer 110212 functions as a second electrode of the capacitor 110221 or a wiring. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Figure 53:
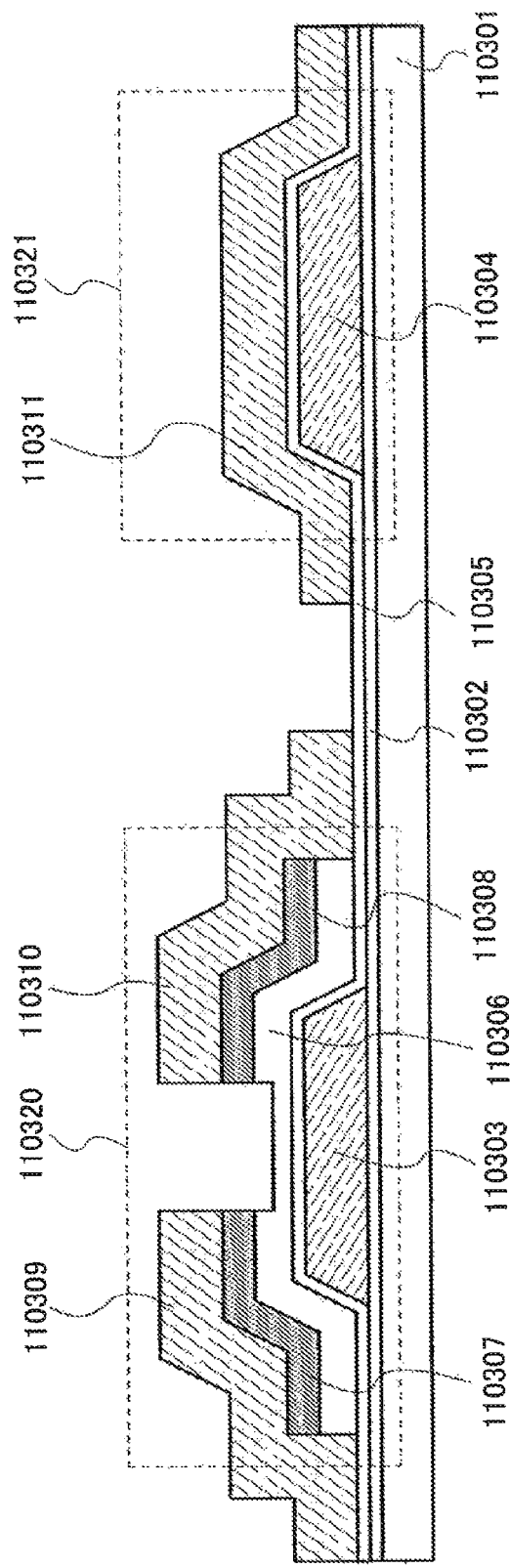
FIG. 53 illustrates the present invention.

FIG. 53 shows cross-sectional structures of an inversely staggered (bottom gate) transistor and a capacitor. In particular, the transistor shown in FIG. 53 has a channel-etched structure.

A first insulating film (an insulating film 110302) is formed over the entire surface of a substrate 110301. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, yield can be improved.

A first conductive layer (conductive layers 110303 and 110304) is formed over the first insulating film. The conductive layer 110303 includes a portion functioning as a gate electrode of a transistor 110320. The conductive layer 110304 includes a portion functioning as a first electrode of a capacitor 110321. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A second insulating film (an insulating film 110305) is formed so as to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 110306) is formed in part of a portion over the second insulating film, which overlaps with the first conductive layer, by photolithography, an inkjet method, a printing method, or the like. Part of the semiconductor layer 110306 extends to a portion over the second insulating film, which does not overlap with the first conductive layer. The semiconductor layer 110306 includes a portion functioning as a channel formation region of the transistor 110320. As the semiconductor layer 110306, a semiconductor layer having no crystallinity such as an amorphous silicon (a-Si:H) layer, a semiconductor layer such as a microcrystalline semiconductor (μ-Si:H) layer, or the like can be used.

A second semiconductor layer (semiconductor layers 110307 and 110308) is formed over part of the first semiconductor layer. The semiconductor layer 110307 includes a portion functioning as one of a source electrode and a drain electrode. The semiconductor layer 110308 includes a portion functioning as the other of the source electrode and the drain electrode. As the second semiconductor layer, silicon containing phosphorus or the like can be used, for example.

A second conductive layer (conductive layers 110309, 110310, and 110311) is formed over the second semiconductor layer and the second insulating film. The conductive layer 110309 includes a portion functioning as one of the source electrode and the drain electrode of the transistor 110320. The conductive layer 110310 includes a portion functioning as the other of the source electrode and the drain electrode of the transistor 110320. The conductive layer 110311 includes a portion functioning as a second electrode of the capacitor 110321. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Here, an example of a step which is characteristic of the channel-etched type transistor is described. The first semiconductor layer and the second semiconductor layer can be formed using the same mask. Specifically, the first semiconductor layer and the second semiconductor layer are continuously formed. Further, the first semiconductor layer and the second semiconductor layer are formed using the same mask.

Another example of a step which is characteristic of the channel-etched type transistor is described. The channel region of the transistor can be formed without using an additional mask. Specifically, after the second conductive layer is formed, part of the second semiconductor layer is removed using the second conductive layer as a mask. Alternatively, part of the second semiconductor layer is removed by using the same mask as the second conductive layer. The first semiconductor layer below the removed second semiconductor layer serves as the channel formation region of the transistor.

Figure 54:
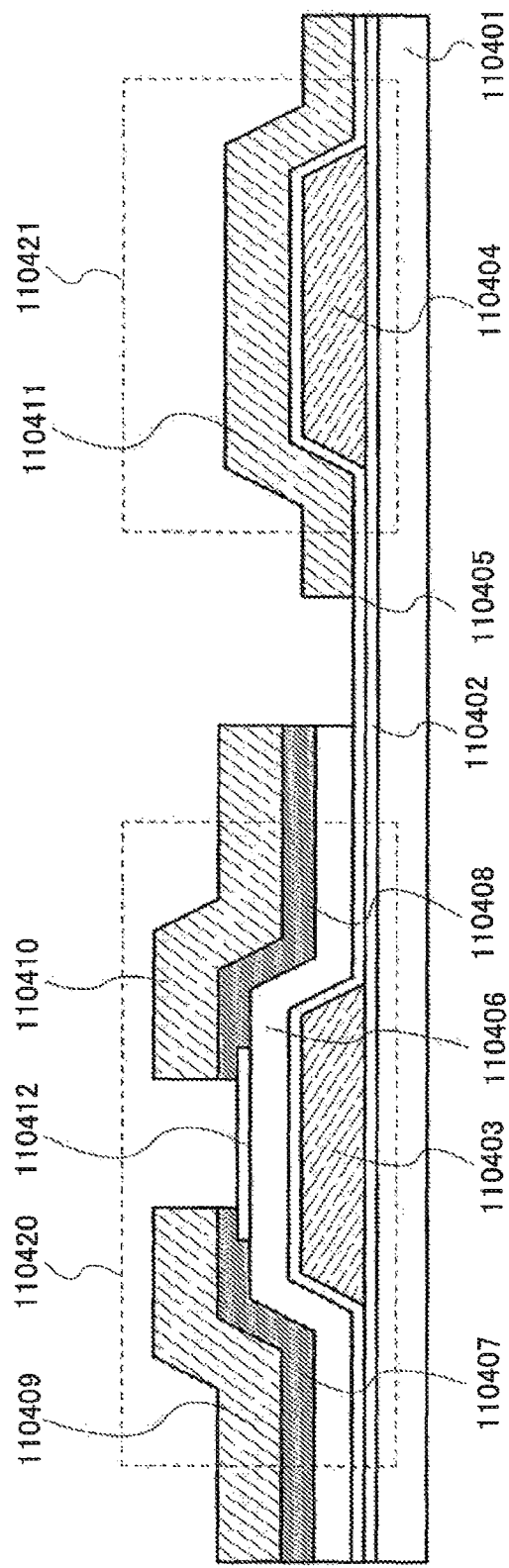
FIG. 54 illustrates the present invention.

FIG. 54 shows cross-sectional structures of an inversely staggered (bottom gate) transistor and a capacitor. In particular, the transistor shown in FIG. 54 has a channel protection (channel stop) structure.

A first insulating film (an insulating film 110402) is formed over the entire surface of a substrate 110401. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, yield can be improved.

A first conductive layer (conductive layers 110403 and 110404) is formed over the first insulating film. The conductive layer 110403 includes a portion functioning as a gate electrode of a transistor 110420. The conductive layer 110404 includes a portion functioning as a first electrode of a capacitor 110421. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A second insulating film (an insulating film 110405) is formed so as to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 110406) is formed in part of a portion over the second insulating film, which overlaps with the first conductive layer, by photolithography, an inkjet method, a printing method, or the like. Part of the semiconductor layer 110406 extends to a portion over the second insulating film, which does not overlap with the first conductive layer. The semiconductor layer 110406 includes a portion functioning as a channel formation region of the transistor 110420. As the semiconductor layer 110406, a semiconductor layer having no crystallinity such as an amorphous silicon (a-Si:H) layer, a semiconductor layer such as a microcrystalline semiconductor (μ-Si:H) layer, or the like can be used.

A third insulating film (an insulating film 110412) is formed over part of the first semiconductor layer. The insulating film 110412 prevents the channel region of the transistor 110420 from being removed by etching. That is, the insulating film 110412 functions as a channel protection film (a channel stop film). As the third insulating film, a single layer or a stacked layer of a silicon oxide film, a silicon nitride film, a silicon oxynitride film ($SiO_xN_y$), or the like can be used.

A second semiconductor layer (semiconductor layers 110407 and 110408) is formed over part of the first semiconductor layer and part of the third insulating film. The semiconductor layer 110407 includes a portion functioning as one of a source electrode and a drain electrode. The semiconductor layer 110408 includes a portion functioning as the other of the source electrode and the drain electrode. As the second semiconductor layer, silicon containing phosphorus or the like can be used, for example.

A second conductive layer (conductive layers 110409, 110410, and 110411) is formed over the second semiconductor layer. The conductive layer 110409 includes a portion functioning as one of the source electrode and the drain electrode of the transistor 110420. The conductive layer 110410 includes a portion functioning as the other of the source electrode and the drain electrode of the transistor 110420. The conductive layer 110411 includes a portion functioning as a second electrode of the capacitor 110421. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Here, an example of a step which is characteristic of the channel protection type transistor is described. The first semiconductor layer, the second semiconductor layer, and the second conductive layer can be formed using the same mask. At the same time, the channel formation region can be formed. Specifically, the first semiconductor layer is formed, and then, the third insulating film (i.e., the channel protection film or the channel stop film) is patterned using a mask. Next, the second semiconductor layer and the second conductive layer are continuously formed. Then, after the second conductive layer is formed, the first semiconductor layer, the second semiconductor layer, and the second conductive film are patterned using the same mask. Note that part of the first semiconductor layer below the third insulating film is protected by the third insulating film, and thus is not removed by etching. This part (a part of the first semiconductor layer over which the third insulating film is formed) serves as the channel region.

Next, an example where a semiconductor substrate is used as a substrate for a transistor is described. Since a transistor formed using a semiconductor substrate has high mobility, the size of the transistor can be decreased. Accordingly, the number of transistors per unit area can be increased (the degree of integration can be improved), and the size of the substrate can be decreased as the degree of integration is increased in the case of the same circuit structure. Thus, a manufacturing cost can be reduced. Further, since the circuit scale can be increased as the degree of integration is increased in the case of the same substrate size, more advanced functions can be provided without increase in manufacturing cost. Moreover, reduction in variations in characteristics can improve manufacturing yield. Reduction in operating voltage can reduce power consumption. High mobility can realize high-speed operation.

When a circuit which is formed by integrating transistors formed using a semiconductor substrate is mounted on a device in the form of an IC chip or the like, the device can be provided with a variety of functions. For example, when a peripheral driver circuit (e.g., a data driver (a source driver), a scan driver (a gate driver), a timing controller, an image processing circuit, an interface circuit, a power supply circuit, or an oscillation circuit) of a display device is formed by integrating transistors formed using a semiconductor substrate, a small peripheral circuit which can be operated with low power consumption and at high speed can be formed at low cost in high yield. Note that a circuit which is formed by integrating transistors formed using a semiconductor substrate may include a unipolar transistor. Thus, a manufacturing process can be simplified, so that manufacturing cost can be reduced.

A circuit which is formed by integrating transistors formed using a semiconductor substrate may also be used for a display panel, for example. More specifically, the circuit can be used for a reflective liquid crystal panel such as a liquid crystal on silicon (LCOS) device, a digital micromirror device (DMD) in which micromirrors are integrated, an EL panel, and the like. When such a display panel is formed using a semiconductor substrate, a small display panel which can be operated with low power consumption and at high speed can be formed at low cost in high yield. Note that the display panel may be formed over an element having a function other than a function of driving the display panel, such as a large-scale integration (LSI).

Hereinafter, a method for forming a transistor using a semiconductor substrate is described.

First, element isolation regions 110604 and 110606 (hereinafter, referred to as regions 110604 and 110606) are formed on a semiconductor substrate 110600 (see FIG. 56A). The regions 110604 and 110606 provided in the semiconductor substrate 110600 are isolated from each other by an insulating film 110602. The example shown here is the case where a single crystal Si substrate having n-type conductivity is used as the semiconductor substrate 110600, and a p-well 110607 is provided in the region 110606 of the semiconductor substrate 110600.

Any substrate can be used as the substrate 110600 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The regions 110604 and 110606 can be formed by a LOCOS (local oxidation of silicon) method, a trench isolation method, or the like as appropriate.

The p-well formed in the region 110606 of the semiconductor substrate 110600 can be formed by selective doping of the semiconductor substrate 110600 with a p-type impurity element. As the p-type impurity element, boron (B), aluminum (Al), gallium (Ga), or the like can be used.

Note that in this embodiment mode, although the region 110604 is not doped with an impurity element because a semiconductor substrate having n-type conductivity is used as the semiconductor substrate 110600, an n-well may be formed in the region 110604 by introduction of an n-type impurity element. As the n-type impurity element, phosphorus (P), arsenic (As), or the like can be used. In contrast, when a semiconductor substrate having p-type conductivity is used, the region 110604 may be doped with an n-type impurity element to form an n-well, whereas the region 110606 may be doped with no impurity element.

Figure 56B:
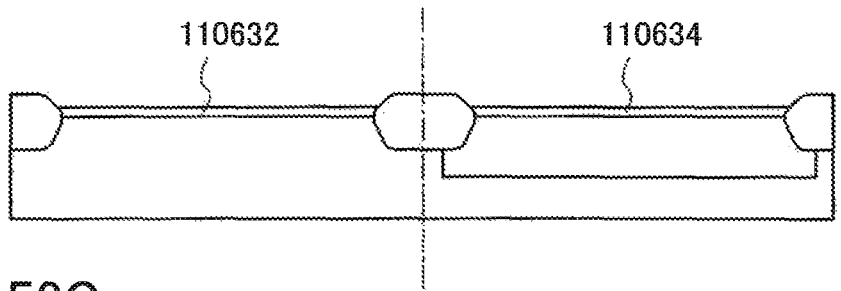

Next, insulating films 110632 and 110634 are formed so as to cover the regions 110604 and 110606, respectively (see FIG. 56B).

For example, surfaces of the regions 110604 and 110606 provided in the semiconductor substrate 110600 are oxidized by heat treatment, so that the insulating films 110632 and 110634 can be formed of silicon oxide films. Alternatively, the insulating films 110632 and 110634 may be formed to have a stacked-layer structure of a silicon oxide film and a film containing oxygen and nitrogen (a silicon oxynitride film) by forming a silicon oxide film by a thermal oxidation method and then nitriding the surface of the silicon oxide film by nitridation treatment.

Further alternatively, the insulating films 110632 and 110634 may be formed by plasma treatment as described above. For example, the insulating films 110632 and 110634 can be formed using a silicon oxide ($SiO_x$) film or a silicon nitride ($SiN_x$) film obtained by application of high-density plasma oxidation treatment or high-density plasma nitridation treatment to the surfaces of the regions 110604 and 110606 provided in the semiconductor substrate 110600. As another example, after application of high-density plasma oxidation treatment to the surfaces of the regions 110604 and 110606, high-density plasma nitridation treatment may be performed. In that case, silicon oxide films are formed on the surfaces of the regions 110604 and 110606, and then silicon oxynitride films are formed on the silicon oxide films. Thus, each of the insulating films 110632 and 110634 is formed to have a stacked-layer structure of the silicon oxide film and the silicon oxynitride film. As another example, after silicon oxide films are formed on the surfaces of the regions 110604 and 110606 by a thermal oxidation method, high-density plasma oxidation treatment or high-density nitridation treatment may be applied to the silicon oxide films.

The insulating films 110632 and 110634 formed over the regions 110604 and 110606 of the semiconductor substrate 110600 function as the gate insulating films of transistors which are completed later.

Figure 56C:
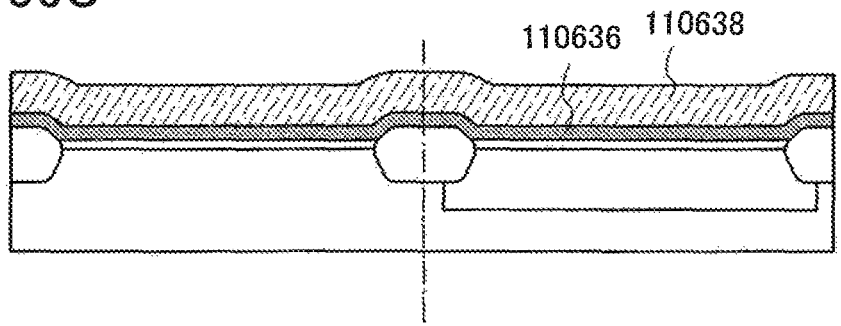

Next, a conductive film is formed so as to cover the insulating films 110632 and 110634 which are formed over the regions 110604 and 110606, respectively (see FIG. 56C). Here, an example is shown in which the conductive film is formed by sequentially stacking conductive films 110636 and 110638. Needless to say, the conductive film may be formed using a single-layer structure or a stacked-layer structure of three or more layers.

As a material of the conductive films 110636 and 110638, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Further alternatively, a semiconductor material typified by polycrystalline silicon doped with an impurity element such as phosphorus or silicide in which a metal material is introduced can be used.

In this case, a stacked-layer structure is employed in which tantalum nitride is used for the conductive film 110636 and tungsten is used for the conductive film 110638. Alternatively, it is also possible to form the conductive film 110636 using a single-layer film or a stacked-layer film of tungsten nitride, molybdenum nitride, and/or titanium nitride. For the conductive film 110638, it is possible to use a single-layer film or a stacked-layer film of tantalum, molybdenum, and/or titanium.

Figure 57A:
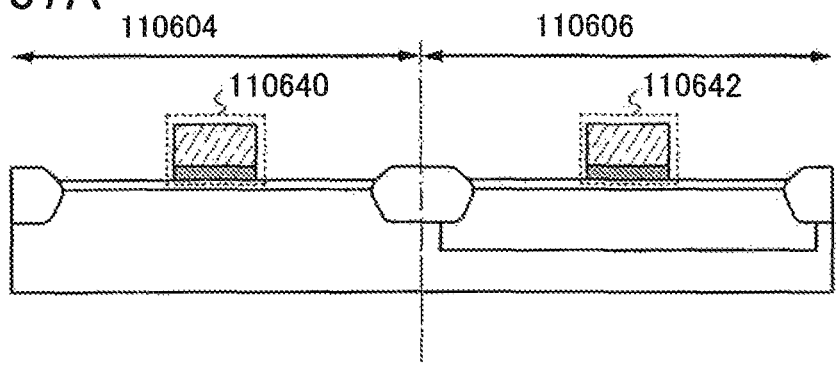
FIGS. 57A to 57D illustrate the present invention.

Next, the stacked conductive films 110636 and 110638 are selectively removed by etching, so that the conductive films 110636 and 110638 remain above part of the regions 110604 and 110606, respectively. Thus, gate electrodes 110640 and 110642 are formed (see FIG. 57A).

Figure 57B:
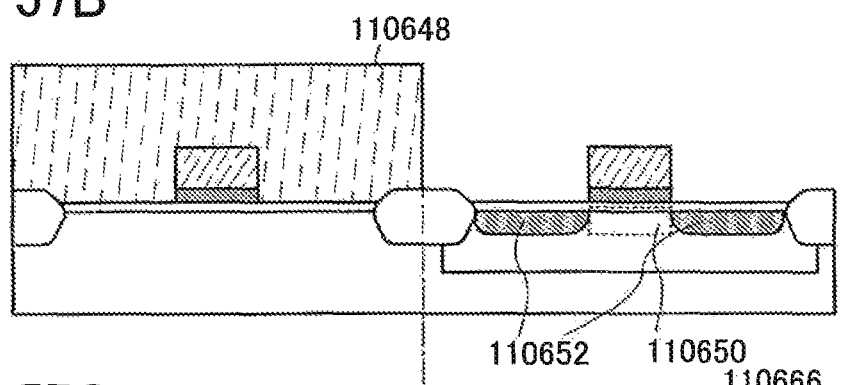

Next, a resist mask 110648 is selectively formed so as to cover the region 110604, and the region 110606 is doped with an impurity element by using the resist mask 110648 and the gate electrode 110642 as masks; thus, impurity regions 110652 are formed (see FIG. 57B). As an impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element. Note that after the impurity element is introduced, heat treatment may be performed in order to disperse the impurity element and to recover the crystalline structure.

In FIG. 57B, by introduction of an impurity element, impurity regions 110652 which form source and drain regions and a channel formation region 110650 are formed in the region 110606.

Figure 57C:
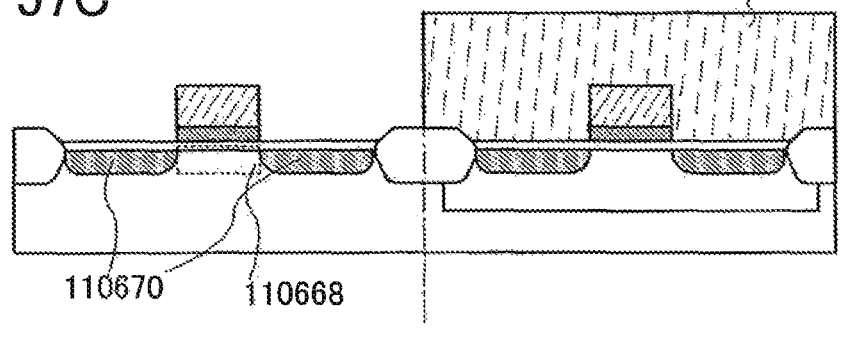

Next, a resist mask 110666 is selectively formed so as to cover the region 110606, and the region 110604 is doped with an impurity element by using the resist mask 110666 and the gate electrode 110640 as masks; thus, impurity regions 110670 are formed (see FIG. 57C). As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. At this time, an impurity element (e.g., boron (B)) of a conductivity type different from that of the impurity element introduced into the region 110606 in FIG. 57B is used. As a result, the impurity regions 110670 which form source and drain regions and a channel formation region 110668 are formed in the region 110604. Note that after the impurity element is introduced, heat treatment may be performed in order to disperse the impurity element and to recover the crystalline structure.

Figure 57D:
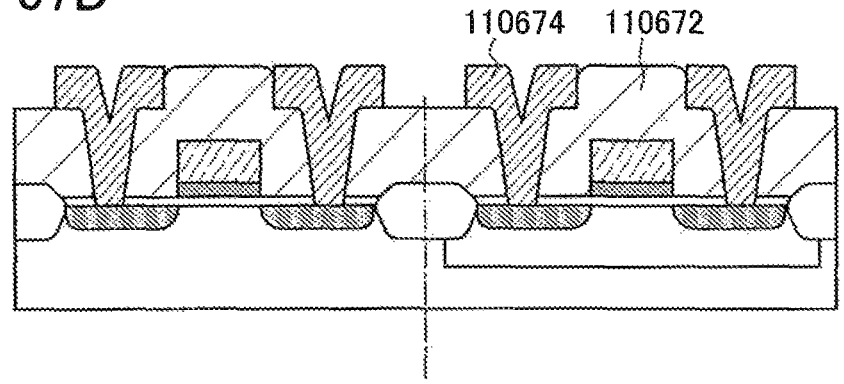

Next, a second insulating film 110672 is formed so as to cover the insulating films 110632 and 110634 and the gate electrodes 110640 and 110642. Further, wirings 110674 which are electrically connected to the impurity regions 110652 and 110670 formed in the regions 110606 and 110604 respectively are formed (see FIG. 57D).

The second insulating film 110672 can be formed to have a single-layer structure or a stacked-layer structure of an insulating film containing oxygen and/or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as DLC (diamond-like carbon); an organic material such as epoxy, polyimide, polyamide, polyvinyl phenol, benzocyclobutene, or acrylic; or a siloxane material such as a siloxane resin by CVD, sputtering, or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group, or both a fluoro group and an organic group containing at least hydrogen may be used as the substituent.

The wirings 110674 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by CVD, sputtering, or the like. An alloy material containing aluminum as its main component corresponds to, for example, a material which contains aluminum as its main component and also contains nickel, or a material which contains aluminum as its main component and also contains nickel and one or both of carbon and silicon. The wirings 110674 are preferably formed to have a stacked-layer structure of a barrier film, an aluminum-silicon (Al—Si) film, and a barrier film or a stacked-layer structure of a barrier film, an aluminum-silicon (Al—Si) film, a titanium nitride film, and a barrier film. Note that the barrier film corresponds to a thin film formed of titanium, titanium nitride, molybdenum, or molybdenum nitride. Aluminum and aluminum silicon are suitable materials for forming the wirings 110674 because they have high resistance values and are inexpensive. For example, when barrier layers are provided as the top layer and the bottom layer, generation of hillocks of aluminum or aluminum silicon can be prevented. For example, when a barrier film is formed of titanium which is an element having a high reducing property, even if a thin natural oxide film is formed on a crystalline semiconductor film, the natural oxide film can be reduced. As a result, the wirings 110674 can be connected to the crystalline semiconductor in an electrically and physically favorable condition.

Note that the structure of a transistor is not limited to that shown in the drawing. For example, a transistor with an inversely staggered structure, a FinFET structure, or the like can be used. A FinFET structure is preferable because it can suppress a short channel effect which occurs along with reduction in transistor size.

Next, another example in which a semiconductor substrate is used as a substrate for forming a transistor is described.

Figure 58A:
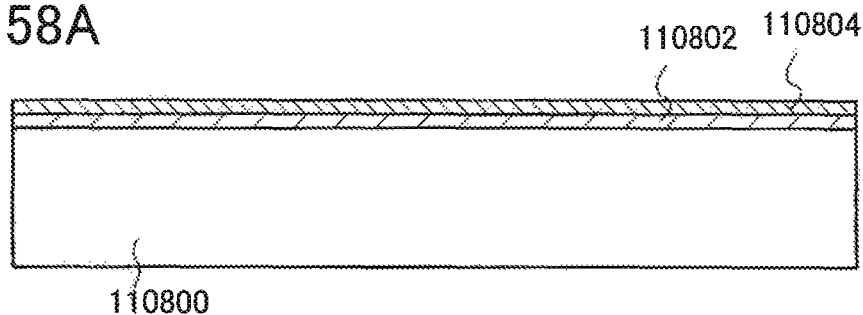
FIGS. 58A to 58C illustrate the present invention.

First, an insulating film is formed on a substrate 110800. Here, a single crystal Si having n-type conductivity is used for the substrate 110800, and insulating films 110802 and 110804 are formed on the substrate 110800 (see FIG. 58A). For example, silicon oxide ($SiO_x$) is formed for the insulating film 110802 by performing heat treatment on the substrate 110800. Moreover, silicon nitride ($SiN_x$) is formed by CVD or the like.

Any substrate can be used as the substrate 110800 as long as it is a semiconductor substrate. For example, a single-crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The insulating film 110804 may be provided by forming the insulating film 110802 and then nitriding the insulating film 110802 by high-density plasma treatment. Note that the insulating film may have a single-layer structure or a stacked-layer structure of three or more layers.

Figure 58B:
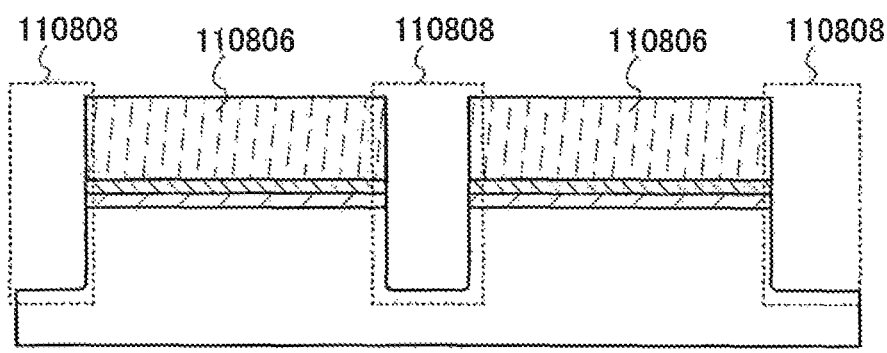

Next, a pattern of a resist mask 110806 is selectively formed. Then, etching is selectively performed using the resist mask 110806 as a mask, whereby depressed portions 110808 are selectively formed in the substrate 110800 (see FIG. 58B). The substrate 110800 and the insulating films 110802 and 110804 can be etched by dry etching using plasma.

Figure 58C:
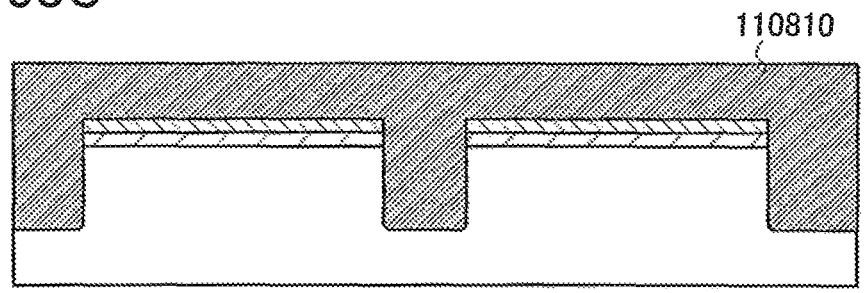

Next, after the pattern of the resist mask 110806 is removed, an insulating film 110810 is formed so as to fill the depressed portions 110808 formed in the substrate 110800 (see FIG. 58C).

The insulating film 110810 is formed using an insulating material such as silicon oxide, silicon nitride, silicon oxynitride ($SiO_xN_y$) (x>y>0), or silicon nitride oxide ($SiN_xO_y$) (x>y>0) by CVD, sputtering, or the like. Here, as the insulating film 110810, a silicon oxide film is formed using a tetraethyl orthosilicate (TEOS) gas by atmosphric pressure CVD or low pressure CVD.

Figure 59A:
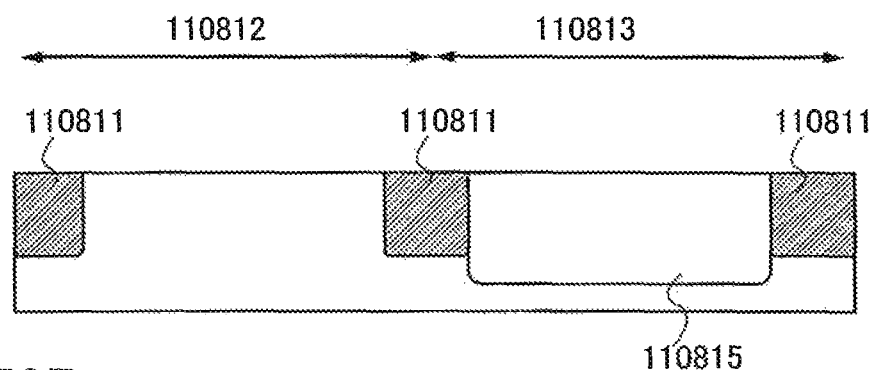
FIGS. 59A to 59D illustrate the present invention.

Next, a surface of the substrate 110800 is exposed when grinding treatment polishing treatment, or chemical mechanical polishing (CMP) treatment is performed. Then, the surface of the substrate 110800 is separated by insulating films 110810 formed in the depressed portions 110808 of the substrate 110800. Here, the separated regions are referred to as regions 110812 and 110813 (see FIG. 59A). Note that the insulating films 110810 are obtained by partial removal of the insulating films 110810 by grinding treatment, polishing treatment, or CMP treatment.

Subsequently, the p-well can be formed in the region 110813 of the semiconductor substrate 110800 by selective introduction of an impurity element having p-type conductivity. As the p-type impurity element, boron (B), aluminum (Al), gallium (Ga), or the like can be used. Here, as the impurity element, boron (B) is introduced into the region 110813. Note that after the impurity element is introduced, heat treatment may be performed in order to disperse the impurity element and to recover the crystalline structure.

Note that although an impurity element is not necessarily introduced into the region 110812 when a semiconductor substrate having n-type conductivity is used as the semiconductor substrate 110800, an n-well may be formed in the region 110812 by introduction of an n-type impurity element. As the n-type impurity element, phosphorus (P), arsenic (As), or the like can be used.

Meanwhile, when a semiconductor substrate having p-type conductivity is used, the region 110812 may be doped with an n-type impurity element to form an n-well, whereas the region 110813 may be doped with no impurity element.

Figure 59B:
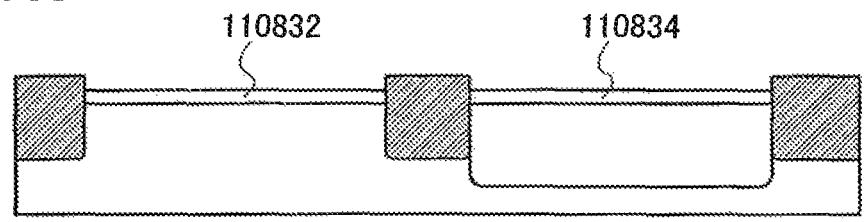

Next, insulating films 110832 and 110834 are formed, respectively, on the surfaces of the regions 110812 and 110813 of the substrate 110800 (see FIG. 59B).

For example, the surfaces of the regions 110812 and 110813 provided in the semiconductor substrate 110800 are oxidized by heat treatment, so that the insulating films 110832 and 110834 can be formed of silicon oxide films. Alternatively, the insulating films 110832 and 110834 may be formed to have a stacked-layer structure of a silicon oxide film and a film containing oxygen and nitrogen (a silicon oxynitride film) by the forming a silicon oxide film by a thermal oxidation method and then nitriding the surface of the silicon oxide film by nitridation treatment.

Further alternatively, the insulating films 110832 and 110834 may be formed by plasma treatment as described above. For example, the insulating films 110832 and 110834 can be formed using a silicon oxide ($SiO_x$) film or a silicon nitride ($SiN_x$) film obtained by application of high-density plasma oxidation treatment or high-density plasma nitridation treatment to the surfaces of the regions 110812 and 110813 provided in the substrate 110800. As another example, after application of high-density plasma oxidation treatment to the surfaces of the regions 110812 and 110813, high-density plasma nitridation treatment may be performed. In that case, silicon oxide films are formed on the surfaces of the regions 110812 and 110813, and then silicon oxynitride films are formed on the silicon oxide films. Thus, each of the insulating films 110832 and 110834 is formed to have a stacked-layer structure of the silicon oxide film and the silicon oxynitride film. As another example, after silicon oxide films are formed on the surfaces of the regions 110812 and 110813 by a thermal oxidation method, high-density plasma oxidation treatment or high-density nitridation treatment may be applied to the silicon oxide films.

The insulating films 110832 and 110834 formed over the regions 110812 and 110813 of the semiconductor substrate 110800 function as the gate insulating films of transistors which are completed later.

Figure 59C:
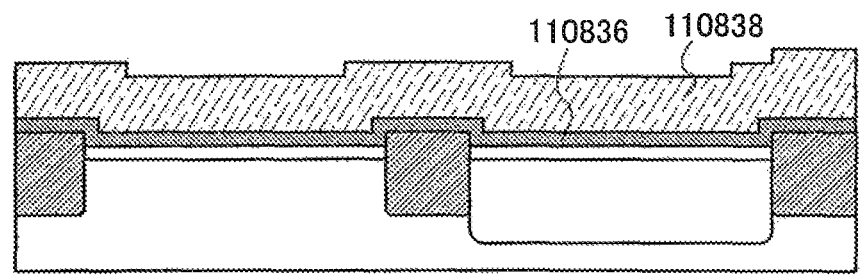

Next, a conductive film is formed so as to cover the insulating films 110832 and 110834 which are formed over the regions 110812 and 110813, respectively, provided in the substrate 110800 (see FIG. 59C). Here, an example is shown in which the conductive film is formed by sequentially stacking conductive films 110836 and 110838. It is needless to say that the conductive film may be formed using a single-layer structure or a stacked-layer structure of three or more layers.

For the conductive films 110836 and 110838, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Further alternatively, a semiconductor material typified by polycrystalline silicon doped with an impurity element such as phosphorus or silicide in which a metal material is introduced can be used.

In this case, a stacked-layer structure is employed in which tantalum nitride is used for the conductive film 110836 and tungsten is used for the conductive film 110838. Alternatively, it is also possible to form the conductive film 110836 using a single-layer film or a stacked-layer film of tantalum nitride, tungsten nitride, molybdenum nitride, and/or titanium nitride. For the conductive film 110838, it is possible to use a single-layer film or a stacked-layer film of tungsten, tantalum, molybdenum, and/or titanium.

Figure 59D:
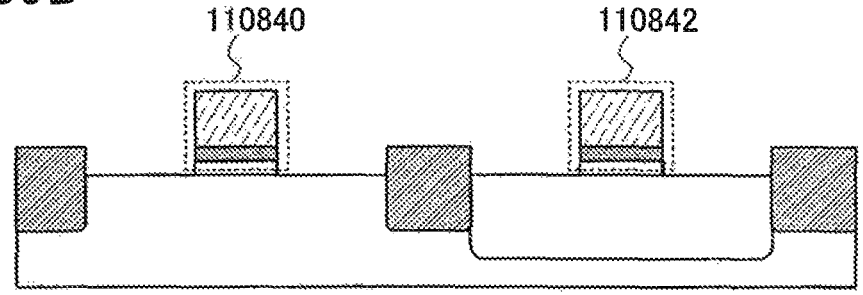

Next, the stacked conductive films 110836 and 110838 are selectively removed by etching, so that the conductive films 110836 and 110838 remain above part of the regions 110812 and 110813 of the substrate 110800, respectively. Thus, conductive films 110840 and 110842 functioning as gate electrodes are formed (see FIG. 59D). Here, the surface of the substrate 110800 is made to be exposed in the region which does not overlap with the conductive films 110840 and 110842.

Specifically, in the region 110812 of the substrate 110800, a portion of the insulating film 110832 which does not overlap with the conductive film 110840 is selectively removed, and an end portion of the conductive film 110840 and an end portion of the insulating film 110832 are made to roughly match. Further, in the region 110813 of the substrate 110800, part of the insulating film 110834 which does not overlap with the conductive film 110842 is selectively removed, and an end portion of the conductive film 110842 and an end portion of the insulating film 110834 are made to roughly match.

In this case, insulating films and the like of the portions which do not overlap with the conductive films 110840 and 110842 may be removed at the same time as formation of the conductive films 110840 and 110842. Alternatively, the insulating films and the like of the portions which do not overlap may be removed using the resist mask, which is left after the conductive films 110840 and 110842 are formed, or the conductive films 110840 and 110842 as masks.

Next, an impurity element is selectively introduced into the regions 110812 and 110813 of the substrate 110800 (see FIG. 30A). Here, an n-type impurity element having a low concentration is selectively introduced into the region 110813 at a low concentration by using the conductive film 110842 as a mask. On the other hand, a p-type impurity element is selectively introduced into the region 110812 at a low concentration by using the conductive film 110840 as a mask. As the n-type impurity element, phosphorus (P), arsenic (As), or the like can be used. As the p-type impurity element, boron (B), aluminum (Al), gallium (Ga), or the like can be used. Note that after the impurity element is introduced, heat treatment may be performed in order to disperse the impurity element and to recover the crystalline structure.

Next, sidewalls 110854 which are in contact with side surfaces of the conductive films 110840 and 110842 are formed. Specifically, the sidewalls are formed to have a single-layer structure or a stacked-layer structure of a film containing an inorganic material such as silicon, oxide of silicon, or nitride of silicon, or a film containing an organic material such as an organic resin by plasma CVD, sputtering, or the like. Then, the insulating films are selectively etched by anisotropic etching mainly in a perpendicular direction, so that the sidewalls are formed in contact with the side surfaces of the conductive films 110840 and 110842. Note that the sidewalls 110854 are used as masks for doping in forming LDD (lightly doped drain) regions. Here, the sidewalls 110854 are formed to be also in contact with side surfaces of the insulating films or floating gate electrodes formed under the conductive films 110840 and 110842.

Figure 60A:
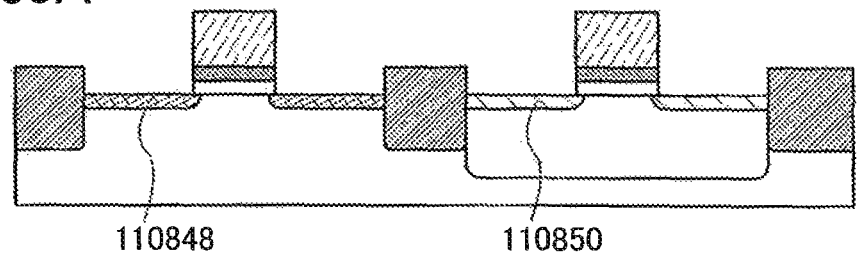
FIGS. 60A to 60D illustrate the present invention.
Figure 60B:
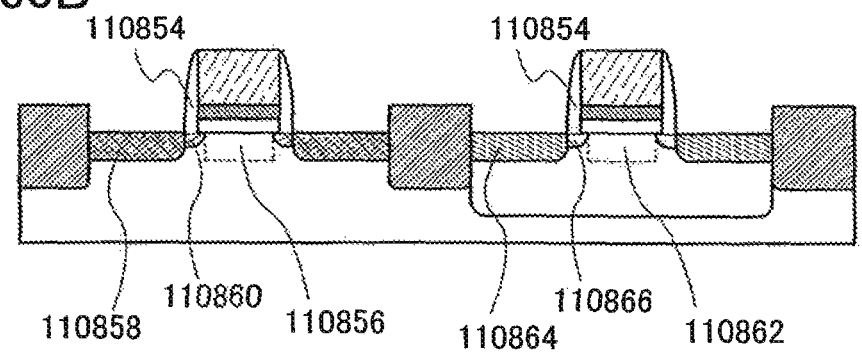

Subsequently, an impurity element is introduced into the regions 110812 and 110813 of the substrate 110800, using the sidewalls 110854 and the conductive films 110840 and 110842 as masks; thus, impurity regions functioning as source and drain regions are formed (see FIG. 60B). Here, an n-type impurity element is introduced into the region 110813 of the substrate 110800 at a high concentration by using the sidewalls 110854 and the conductive film 110842 as masks, and a p-type impurity element is introduced into the region 110812 at a high concentration by using the sidewalls 110854 and the conductive film 110840 as masks.

As a result, in the region 110812 of the substrate 110800, an impurity region 110858 forming a source or drain region, a low-concentration impurity region 110860 forming an LDD region, and a channel formation region 110856 are formed. Moreover, in the region 110813 of the substrate 110800, an impurity region 110864 forming a source or drain region, a low-concentration impurity region 110866 forming an LDD region, and a channel formation region 110862 are formed.

Note that although the example in which the LDD regions are formed using the sidewalls is described, the present invention is not limited to this. The LDD regions may be formed using a mask or the like without the use of the sidewalls, or is not necessarily formed. When the LDD regions are not formed, a manufacturing process can be simplified, so that manufacturing cost can be reduced.

Note that in this embodiment mode, impurity elements are introduced in a state where the surface of the substrate 110800 is exposed in the region which does not overlap with the conductive films 110840 and 110842. Accordingly, the channel formation regions 110856 and 110862 formed in the regions 110812 and 110813 respectively of the substrate 110800 can be formed in a self-aligned manner with the conductive films 110840 and 110842, respectively.

Figure 60C:
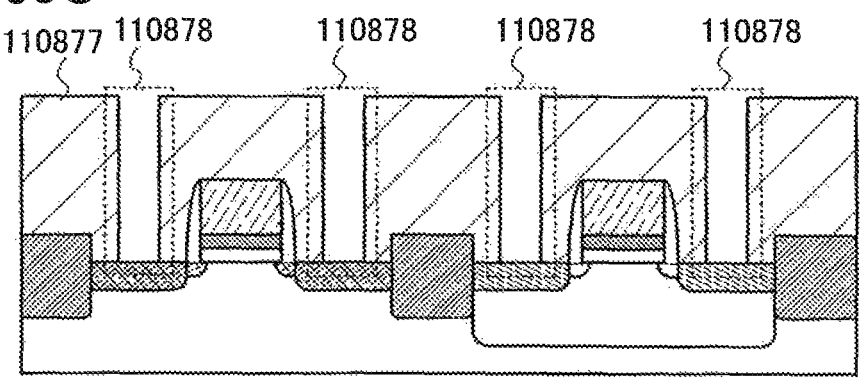

Next, a second insulating film 110877 is formed so as to cover the insulating films, conductive films, and the like provided over the regions 110812 and 110813 of the substrate 110800, and openings 110878 are formed in the insulating film 110877 (see FIG. 60C).

The second insulating film 110877 can be formed to have a single-layer structure or a stacked-layer structure of an insulating film containing oxygen and/or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as diamond-like carbon (DLC); an organic material such as epoxy, polyimide, polyamide, polyvinyl phenol, benzocyclobutene, or acrylic; or a siloxane material such as a siloxane resin by CVD, sputtering, or the like. A siloxane material corresponds to a material having a bond of Si—O—Si. Siloxane has a skeleton structure with the bond of silicon (Si) and oxygen (O). As a substituent of siloxane, an organic group containing at least hydrogen (for example, an alkyl group or aromatic hydrocarbon) is used. Alternatively, a fluoro group, or both a fluoro group and an organic group containing at least hydrogen may be used as the substituent.

Figure 60D:
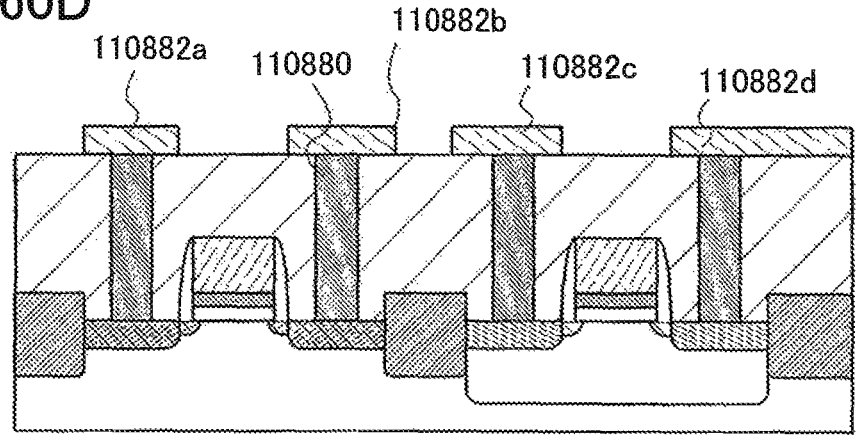

Next, a conductive film 110880 is formed in each of the openings 110878 by CVD, and conductive films 110882a to 110882d are selectively formed over the insulating film 110877 so as to be electrically connected to the conductive films 110880 (see FIG. 60D).

The conductive films 110880 and 110882a to 110882d are formed to have a single-layer structure or a stacked-layer structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by CVD, sputtering, or the like. An alloy material containing aluminum as its main component corresponds to, for example, a material which contains aluminum as its main component and also contains nickel, or a material which contains aluminum as its main component and also contains nickel and one or both of carbon and silicon. The conductive films 110880 and 110882*a* to 110882*d* are preferably formed to have a stacked-layer structure of a barrier film, an aluminum-silicon (Al—Si) film, and a barrier film or a stacked structure of a barrier film, an aluminum-silicon (Al—Si) film, a titanium nitride film, and a barrier film. Note that the barrier film corresponds to a thin film formed of titanium, titanium nitride, molybdenum, or molybdenum nitride. Aluminum and aluminum silicon are suitable materials for forming the conductive film 110880 because they have high resistance values and are inexpensive. For example, when barrier layers are provided as the top layer and the bottom layer, generation of hillocks of aluminum or aluminum silicon can be prevented. For example, when a barrier film is formed of titanium which is an element having a high reducing property, even if a thin natural oxide film is formed on the crystalline semiconductor film, the natural oxide film can be reduced, and a favorable contact between the conductive film and the crystalline semiconductor film can be obtained. Here, the conductive films 110880 can be formed by selective growth of tungsten (W) by CVD.

By the steps described above, a p-channel transistor formed in the region 110812 of the substrate 110800 and an n-channel transistor formed in the region 110813 of the substrate 1300 can be obtained.

Note that the structure of a transistor of the present invention is not limited to that shown in the drawing. For example, a transistor with an inversely staggered structure, a FinFET structure, or the like can be used. A FinFET structure is preferable because it can suppress a short channel effect which occurs along with reduction in transistor size.

Heretofore, the structures and the manufacturing methods of transistors have been described. In this embodiment mode, a wiring, an electrode, a conductive layer, a conductive film, a terminal, a via, a plug, and the like are preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon oxide (ITSO), zinc oxide (ZnO), tin oxide (SnO), cadmium tin oxide (CTO), aluminum neodymium (Al—Nd), magnesium silver (Mg—Ag), or molybdenum-niobium (Mo—Nb)); a substance in which these compounds are combined; or the like. Alternatively, they are preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Accordingly, such silicon can be utilized easily as a wiring, an electrode, or the like.

In addition, silicon having a variety of crystallinity, such as single-crystal silicon, polycrystalline silicon, or microcrystalline silicon can be used. Alternatively, silicon having no crystallinity, such as amorphous silicon can be used. When single-crystal silicon or polycrystalline silicon is used, resistance of a wiring, an electrode, a conductive layer, a conductive film, a terminal, or the like can be reduced. When amorphous silicon or microcrystalline silicon is used, a wiring or the like can be formed by a simple process.

Aluminum and silver have high conductivity, and thus can reduce signal delay. Moreover, since aluminum and silver can be easily etched, they are easily patterned and can be minutely processed.

Copper has high conductivity, and thus can reduce signal delay. When copper is used, a stacked-layer structure is preferably employed to improve adhesion.

Molybdenum and titanium are preferable because even if molybdenum or titanium is in contact with an oxide semiconductor (e.g., ITO or IZO) or silicon, molybdenum or titanium does not cause defects. Moreover, molybdenum and titanium are preferable because they are easily etched and has high heat resistance.

Tungsten is preferable because it has advantages such as high heat resistance.

Neodymium is preferable because it has advantages such as high heat resistance. In particular, an alloy of neodymium and aluminum is preferable because heat resistance is increased and aluminum dose not easily cause hillocks.

Silicon is preferable because it can be formed at the same time as a semiconductor layer included in a transistor and has high heat resistance.

Since ITO, IZO, ITSO, zinc oxide (ZnO), silicon (Si), tin oxide (SnO), and cadmium tin oxide (CTO) have light-transmitting properties, they can be used for a portion which transmits light. For example, they can be used for a pixel electrode or a common electrode.

IZO is preferable because it is easily etched and processed. In etching IZO, a residue is hardly left. Accordingly, when IZO is used for a pixel electrode, defects (such as short circuit or orientation disorder) of a liquid crystal element or a light-emitting element can be reduced.

A wiring, an electrode, a conductive layer, a conductive film, a terminal, a via, a plug, or the like may have a single-layer structure or a multi-layer structure. By employing a single-layer structure, each manufacturing process of a wiring, an electrode, a conductive layer, a conductive film, a terminal, or the like can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a stacked-layer structure in which a low heat-resistant material is interposed between high heat-resistant materials is employed, heat resistance of a wiring, an electrode, and the like can be increased, utilizing advantages of the low heat-resistance material. For example, it is preferable to employ a stacked-layer structure in which a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

Note that a wiring refers to a portion including a conductor. A wiring may extend linearly or be made to be short without extension. Therefore, an electrode is included in a wiring.

Note that a carbon nanotube may be used for a wiring, an electrode, a conductive layer, a conductive film, a terminal, a via, a plug, or the like. Since a carbon nanotube has a light-transmitting property, it can be used for a portion which transmits light. For example, a carbon nanotube can be used for a pixel electrode or a common electrode.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 4)

In this embodiment mode, a structure of a display device is described.

Figure 61A:
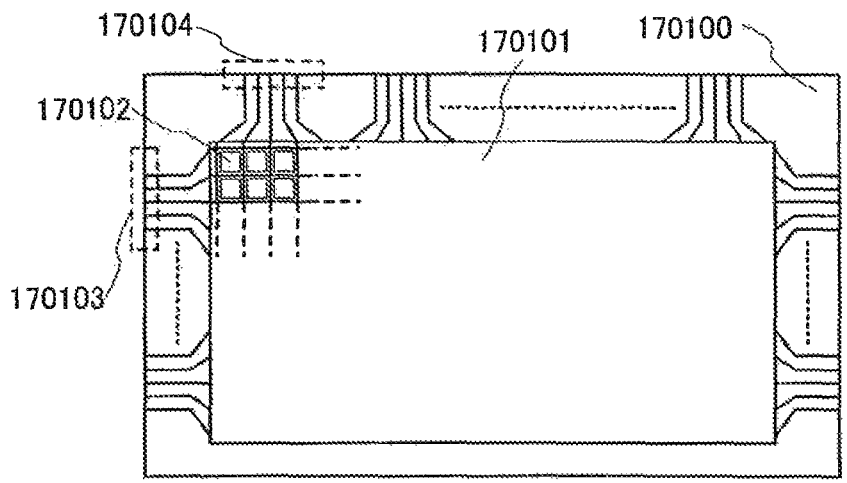
FIGS. 61A to 61C each illustrate the present invention.

A structure of a display device is described with reference to FIG. 61A. FIG. 61A is a top view of the display device.

A pixel portion 170101, a scan line input terminal 170103, and a signal line input terminal 170104 are formed over a substrate 170100. Scan lines extending in a row direction from the scan line input terminal 170103 are formed over the substrate 170100, and signal lines extending in a column direction from the signal line input terminal 170104 are formed over the substrate 170100. Pixels 170102 are arranged in matrix at each intersection of the scan lines and the signal lines in the pixel portion 170101.

The scan line side input terminal 170103 is formed on both sides of the row direction of the substrate 170100. Further, a scan line extending from one scan line side input terminal 170103 and a scan line extending from the other scan line side input terminal 170103 are alternately formed. In this case, since the pixels 170102 can be arranged with high density, a high-definition display device can be obtained. Note that the present invention is not limited to this, and the scan line side input terminal 170103 may be formed only on one side of the row direction of the substrate 170100. In this case, a frame of the display device can be made smaller. Moreover, the area of the pixel portion 170101 can be increased. As another example, the scan line extending from one scan line side input terminal 170103 and the scan line extending from the other scan line side input terminal 170103 may be used in common. In this case, the structure is suitable for display devices in which a load on a scan line is large, such as large-scale display devices. Note that signals are input from an external driver circuit to the scan line through the scan line side input terminal 170103.

The signal line side input terminal 170104 is formed on one side of the column direction of the substrate 170100. In this case, the frame of the display device can be made smaller. Moreover, the area of the pixel portion 170101 can be increased. Note that the present invention is not limited to this, and the signal line side input terminal 170104 may be formed on both sides of the column direction of the substrate 170100. In this case, the pixels 170102 are arranged with high density. Note that signals are input from an external driver circuit to the scan line through the signal line side input terminal 170104.

The pixel 170102 includes a switching element and a pixel electrode. In each pixel 170102, a first terminal of the switching element is connected to the signal line, and a second terminal of the switching element is connected to the pixel electrode. On/off of the switching element is controlled by the scan line. Note that the present invention is not limited to this structure, and a variety of structures can be employed. For example, the pixel 170102 may include a capacitor. In this case, a capacitor line is preferably formed over the substrate 170100. As another example, the pixel 170102 may include a current source such as a driving transistor. In this case, a power supply line is preferably formed over the substrate 170100.

As the substrate 170100, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, a substrate including a stainless steel foil, or the like can be used. Alternatively, a skin (e.g., surfaces of the skin or corium) or hypodermal tissue of an animal such as a human can be used as the substrate. Note that the substrate 170100 is not limited to those described above, and a variety of substrates can be used.

As the switching element included in the pixel 170102, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used. Note that the switching element is not limited to those described above, and a variety of switching elements can be used. Note that when a MOS transistor is used as the switching element included in the pixel 170102, a gate electrode is connected to the scan line, a first terminal is connected to the signal line, and a second terminal is connected to the pixel electrode.

Heretofore, the case in which a signal is input from an external driver circuit has been described. However, the present invention is not limited to this, and an IC chip can be mounted on a display device.

Figure 62A:
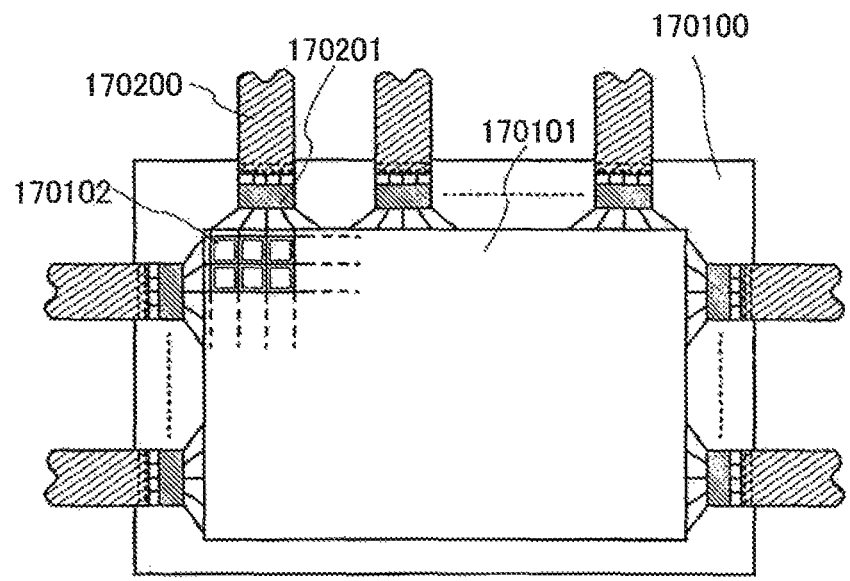
FIGS. 62A and 62B each illustrate the present invention.

For example, as shown in FIG. 62A, an IC chip 170111 can be mounted on the substrate 170100 by a COG (chip on glass) method. In this case, the IC chip 170111 can be examined before being mounted on the substrate 170100, so that improvement in yield and reliability of the display device can be realized. Note that portions which are common to those in FIG. 61A are denoted by common reference numerals, and description thereof is omitted.

Figure 62B:
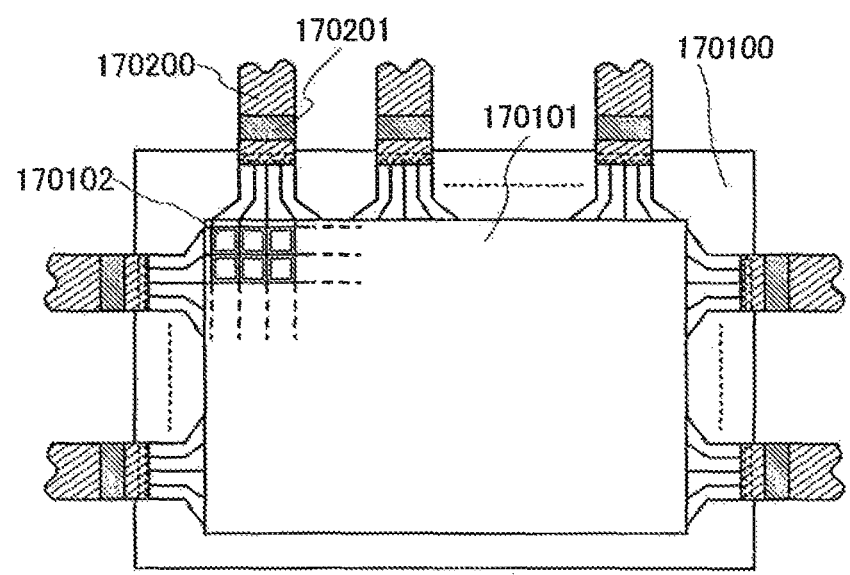

As another example, as shown in FIG. 62B, an IC chip 170201 can be mounted on an FPC (flexible printed circuit) 170200 by a TAB (tape automated bonding) method. In this case, the IC chip 170111 can be examined before being mounted on the FPC 170200, so that improvement in yield and reliability of the display device can be realized. Note that portions which are common to those in FIG. 61A are denoted by common reference numerals, and description thereof is omitted.

Not only the IC chip can be mounted on the substrate 170100, but also a driver circuit can be formed over the substrate 170100.

Figure 61B:
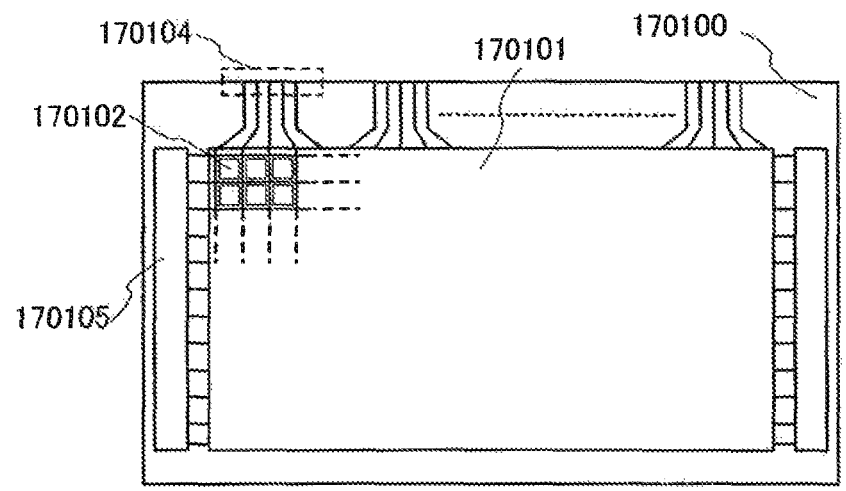

For example, as shown in FIG. 61B, a scan line driver circuit 170105 can be formed over the substrate 170100. In this case, cost can be reduced by reduction in number of components. Further, reliability can be improved by reduction in number of connection points between components. Since the driving frequency of the scan line driver circuit 170105 is low, the scan line driver circuit 170105 can be easily formed by using amorphous silicon or microcrystalline silicon as a semiconductor layer of a transistor. Note that an IC chip for outputting a signal to the signal line may be mounted on the substrate 170100 by a COG method. Alternatively, an FPC on which an IC chip for outputting a signal to the signal line is mounted by a TAB method may be provided on the substrate 170100. In addition, an IC chip for controlling the scan line driver circuit 170105 may be mounted on the substrate 170100 by COG. Alternatively, an FPC on which an IC chip for controlling the scan line driver circuit 170105 is mounted by a TAB method may be provided on the substrate 170100. Note that portions which are common to those in FIG. 61A are denoted by common reference numerals, and description thereof is omitted.

Figure 61C:
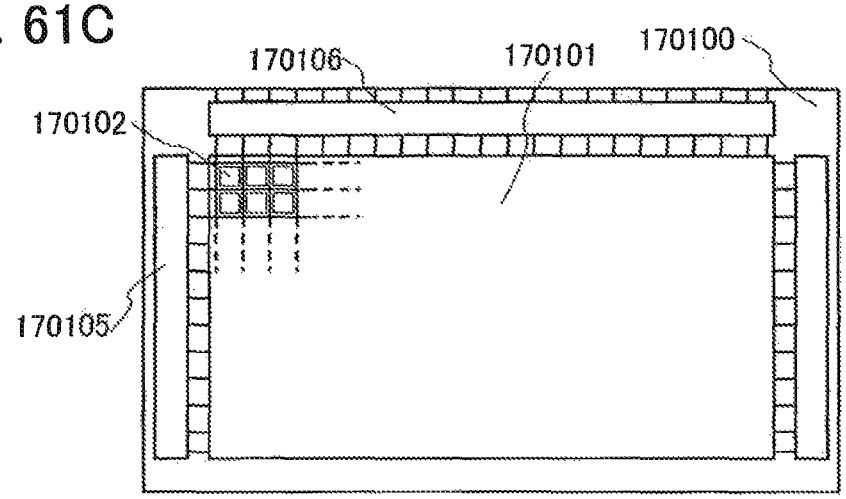

As another example, as shown in FIG. 61C, the scan line driver circuit 170105 and a signal line driver circuit 170106 can be formed over the substrate 170100. Thus, cost can be reduced by reduction in number of components. Further, reliability can be improved by reduction in number of connection points between components. Note that an IC chip for controlling the scan line driver circuit 170105 may be mounted on the substrate 170100 by COG. Alternatively, an FPC on which an IC chip for controlling the scan line driver circuit 170105 is mounted by a TAB method may be provided on the substrate 170100. In addition, an IC chip for controlling the signal line driver circuit 170106 may be mounted on the substrate 170100 by COG. Alternatively, an FPC on which an IC chip for controlling the signal line driver circuit 170106 is mounted by a TAB method may be provided on the substrate 170100. Note that portions which are common to those in FIG. 61A are denoted by common reference numerals, and description thereof is omitted.

Figure 63:
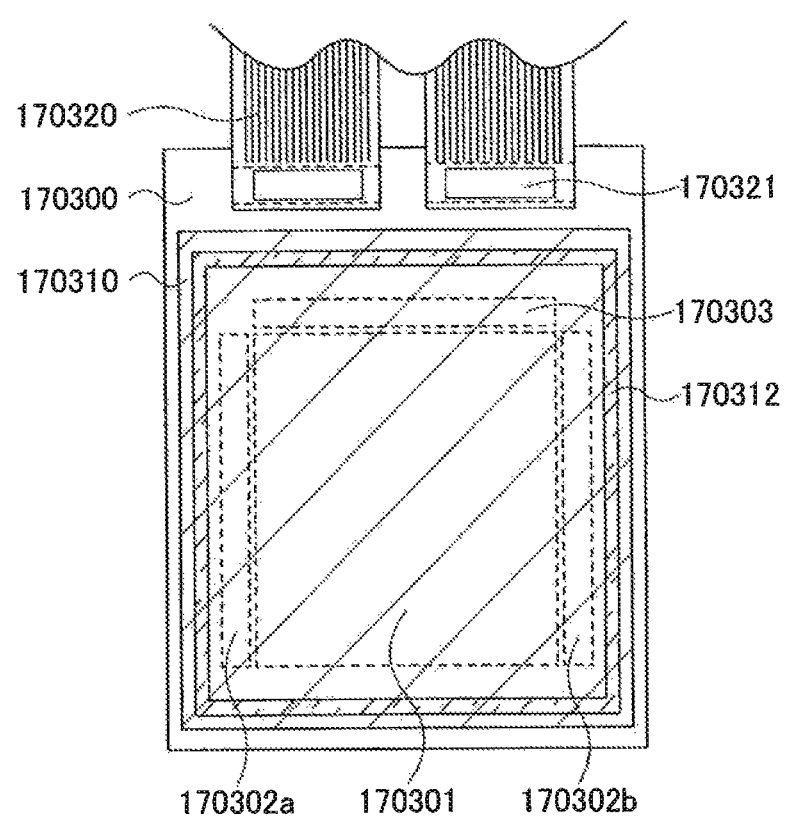
FIG. 63 illustrates the present invention.

Next, another structure of a display device is described with reference to FIG. 63. Specifically, the display device includes a TFT substrate, a counter substrate, and a display layer interposed between the TFT substrate and the counter substrate. FIG. 63 is a top view of the display device.

A pixel portion 170301, a scan line driver circuit 170302a, a scan line driver circuit 170302b, and a signal line driver circuit 170303 are formed over a substrate 170300. The scan line driver circuits 170302a and 170302b and the signal line driver circuit 170303 are sealed between the substrate 170300 and a substrate 170310 with a sealant 170321.

Further, an FPC 107320 is arranged on the substrate 170300. Moreover, an IC chip 107321 is mounted on the FPC 170320 by a TAB method.

A plurality of pixels are arranged in matrix in the pixel portion 170301. A scan line extending in the column direction from the scan line driver circuit 170302a is formed over the substrate 170300. A scan line extending in the row direction from the scan line driver circuit 170302b is formed over the substrate 170300. A signal line extending in the column direction from the signal line driver circuit 170303 is formed over the substrate 170300.

The scan line driver circuit 170302a is formed on one side of the row direction of the substrate 170300. The scan line driver circuit 170302b is formed on the other side of the row direction of the substrate 170300. Further, the scan line extending from the scan line driver circuit 170302a and the scan line extending from the scan line driver circuit 170302b are alternately formed. Accordingly, a high-definition display device can be obtained. Note that the present invention is not limited to this, and only one of the scan line driver circuits 170302a and 170302b may be formed over the substrate 170300. In this case, the frame of the display device can be made smaller. Moreover, the area of the pixel portion 170301 can be increased. As another example, the scan line extending from the scan line driver circuit 170302a and the scan line extending from the scan line driver circuit 170302b may be used in common. In this case, the structure is suitable for display devices in which a load on a scan line is large, such as large-scale display devices.

The signal line driver circuit 170303 is formed on one side of the column direction of the substrate 170300. Accordingly, the frame of the display device can be made smaller. Further, the area of the pixel portion 170301 can be increased. Note that the present invention is not limited to this, and the signal line driver circuit 170303 may be formed on both sides of the column direction of the substrate 170300. In this case, a high-definition display device can be obtained.

As the substrate 170300, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, a substrate including a stainless steel foil, or the like can be used. Alternatively, a skin (e.g., surfaces of the skin or corium) or hypodermal tissue of an animal such as a human can be used as the substrate. Note that the substrate 170300 is not limited to those described above, and a variety of substrates can be used.

As the switching element included in the display device, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used. Note that the switching element is not limited to those described above, and a variety of switching elements can be used.

Heretofore, the case in which a driver circuit and a pixel portion are formed over the same substrate has been described. However, the present invention is not limited to this case, and another substrate over which the driver circuit is partially or entirely formed may be made to be an IC chip so that the substrate is mounted on the substrate over which the pixel portion is formed.

Figure 64A:
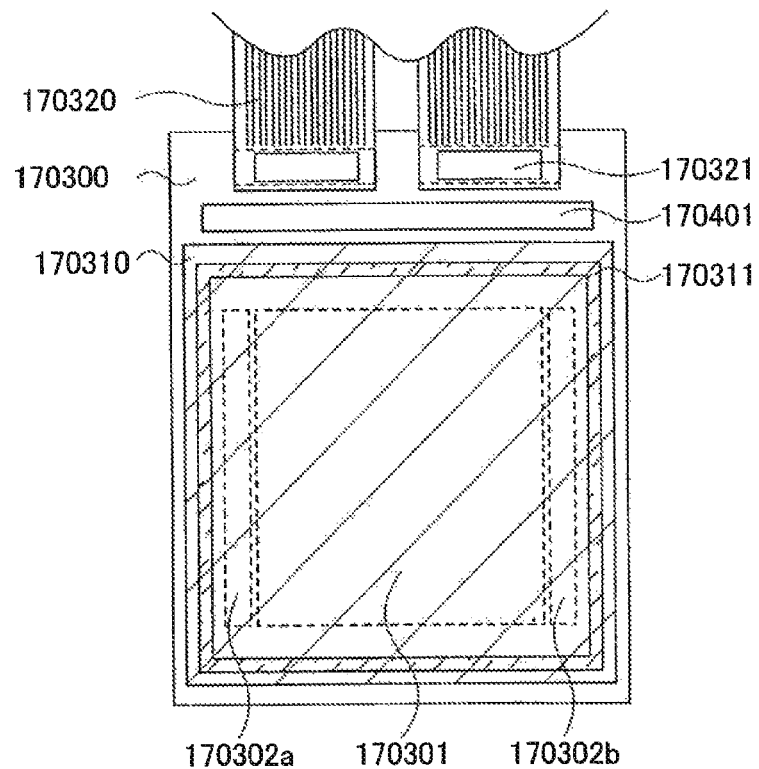
FIGS. 64A and 64B each illustrate the present invention.

For example, as shown in FIG. 64A, an IC chip 170401 instead of the signal line driver circuit can be mounted on the substrate 170300 by COG. In this case, increase in power consumption can be prevented by mounting of the IC chip 170401 instead of the signal line driver circuit on the substrate 170300 by COG. This is because the drive frequency of the signal line driver circuit is high and thus power consumption is increased. Since the IC chip 170401 can be examined before it is mounted on the substrate 170300, yield of a display device can be improved. Moreover, reliability can be improved. Since the drive frequency of the scan line driver circuits 170302a and 170302b is low, the scan line driver circuits 170302a and 170302b can be easily formed using amorphous silicon or microcrystalline silicon for a semiconductor layer of a transistor. Accordingly, a display device can be formed using a large substrate. Note that portions which are common to those in the structure of FIG. 63 are denoted by common reference numerals, and the description thereof is omitted.

Figure 64B:
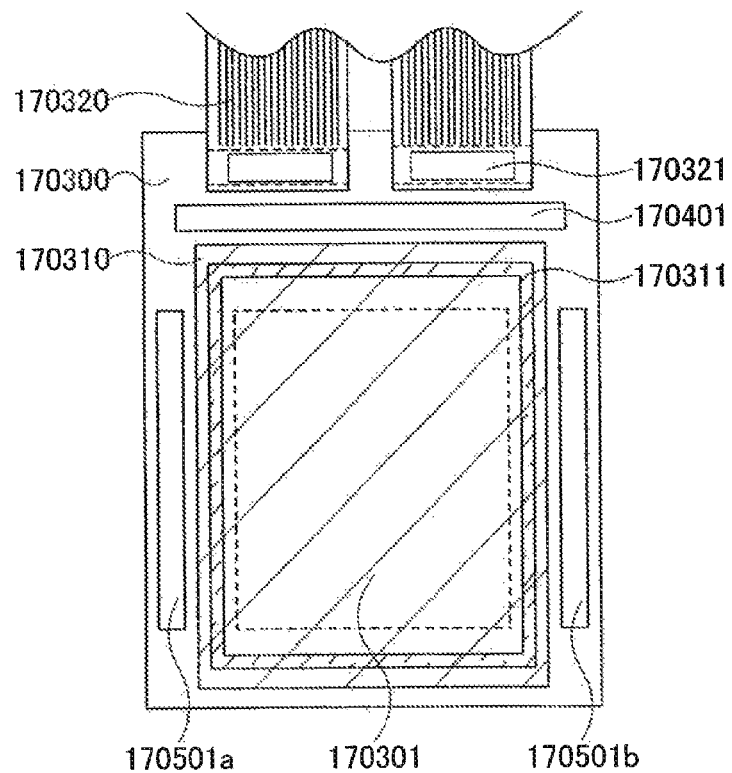

As another example, as shown in FIG. 64B, the IC chip 170401 instead of the signal line driver circuit may be mounted on the substrate 170300 by COQ an IC chip 170501a instead of the scan line driver circuit 170302a may be mounted on the substrate 170300 by COQ and an IC chip 170501b instead of the scan line driver circuit 170302b may be mounted on the substrate 170300 by COG. In this case, since the IC chips 170401, 170501a, and 170501b can be examined before they are mounted on the substrate 170300, yield of a display device can be improved. Moreover, reliability can be improved. Amorphous silicon or microcrystalline silicon can be easily used for a semiconductor layer of a transistor to be formed over the substrate 170300. Accordingly, a display device can be formed using a large substrate. Note that portions which are common to those in the structure of FIG. 63 are denoted by common reference numerals, and the description thereof is omitted.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 5)

In this embodiment mode, operations of a display device are described.

Figure 65:
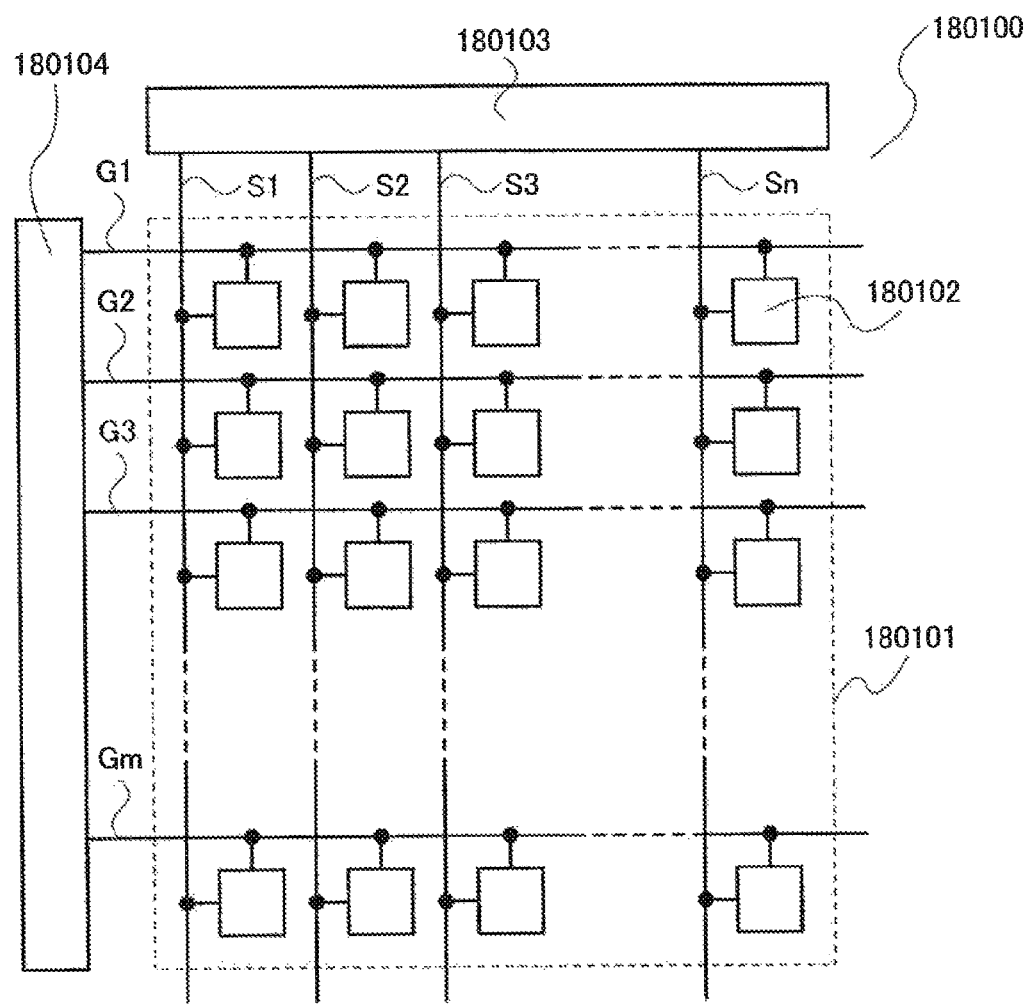
FIG. 65 illustrates the present invention.

FIG. 65 shows a structural example of a display device.

A display device 180100 includes a pixel portion 180101, a signal line driver circuit 180103, and a scan line driver circuit 180104. In the pixel portion 180101, a plurality of signal lines S1 to $S_n$ extend from the signal line driver circuit 180103 in a column direction. In the pixel portion 180101, a plurality of scan lines G1 to $G_m$ extend from the scan line driver circuit 180104 in a row direction. Pixels 180102 are arranged in matrix at each intersection of the plurality of signal lines S1 to $S_n$ and the plurality of scan lines G1 to $G_m$.

The signal line driver circuit 180103 has a function of outputting a signal to each of the signal lines S1 to $S_n$. This signal may be referred to as a video signal. The scan line driver circuit 180104 has a function of outputting a signal to each of the scan lines G1 to $G_m$. This signal may be referred to as a scan signal.

Note that the pixel 180102 includes at least a switching element connected to the signal line. On/off of the switching element is controlled by a potential of the scan line (a scan signal). When the switching element is on, the pixel 180102 is selected. On the other hand, when the switching element is off, the pixel 180102 is not selected.

When the pixel 180102 is selected (in a selection state), a video signal is input to the pixel 180102 from the signal line. The state (e.g., luminance, transmittivity, or voltage of a storage capacitor) of the pixel 180102 is changed in accordance with the input video signal.

When the pixel 180102 is not selected (in a non-selection state), the video signal is not input to the pixel 180102. Note that since the pixel 180102 holds a potential corresponding to the video signal which is input when selected, the pixel 180102 maintains the state (e.g., luminance, transmittivity, or voltage of a storage capacitor) in accordance with the video signal.

Note that the structure of the display device is not limited to that shown in HG 65. For example, a wiring (e.g., a scan line, a signal line, a power supply line, a capacitor line, or a common line) may be added in accordance with the structure of the pixel 180102. As another example, a circuit having various functions may be added.

Figure 66:
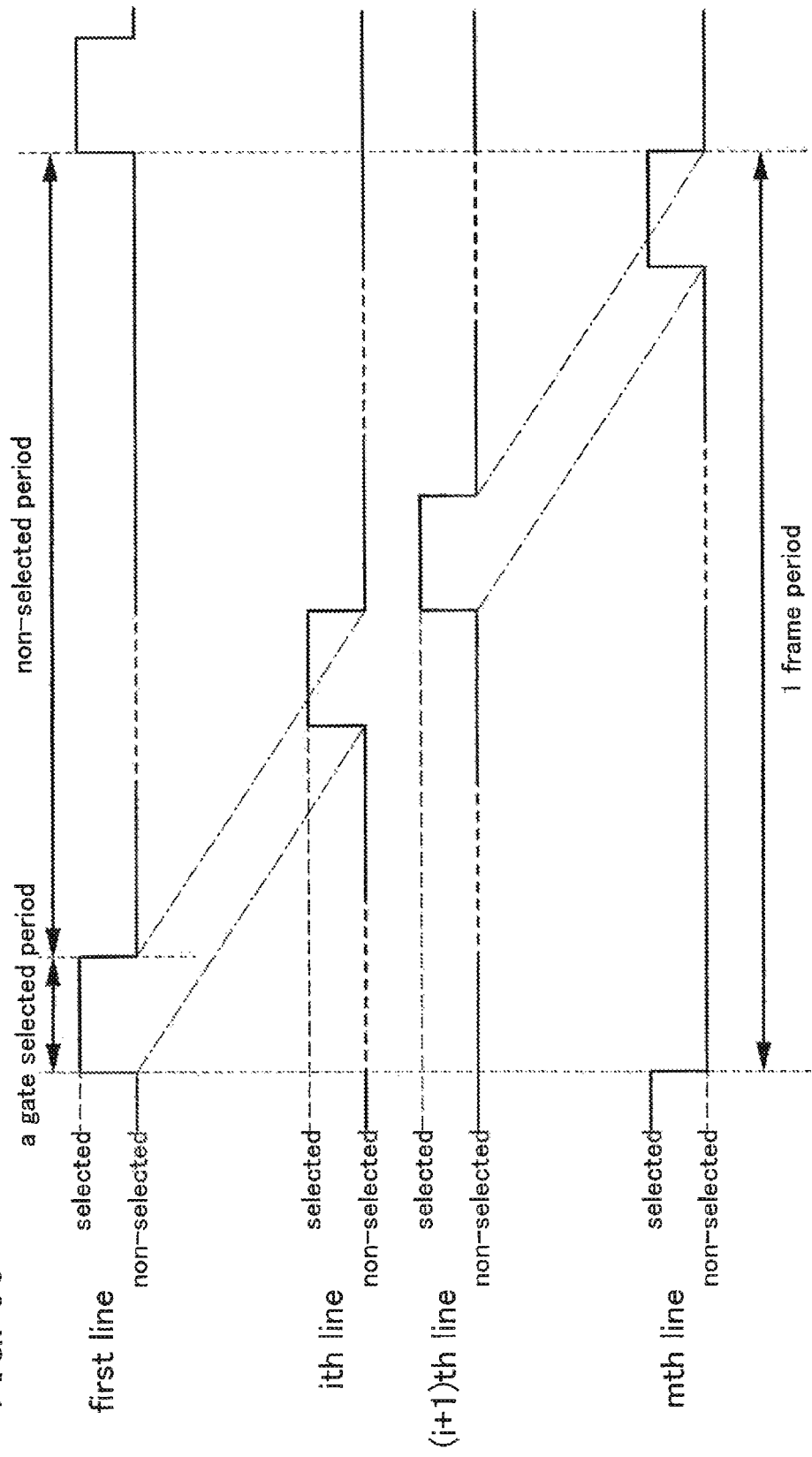
FIG. 66 illustrates the present invention.

FIG. 66 shows an example of a timing chart for describing operations of a display device.

The timing chart in FIG. 66 shows one frame period corresponding to a period for displaying an image for one screen. Although one frame period is not particularly limited to a certain period, it is at least preferable that one frame period be 1/60 second or less so that a person viewing an image does not perceive flickers.

The timing chart in FIG. 66 shows timing of selecting the scan line G1 in a first row, the scan line $G_i$ (one of the scan lines G1 to $G_m$) in an i-th row, the scan line $G_i+1$ in an (i+1)th row, and the scan line $G_m$ in an m-th row.

At the same time as the scan line is selected, the pixel 180102 connected to the scan line is also selected. For example, when the scan line $G_i$ in the i-th row is selected, the pixel 180102 connected to the scan line $G_i$ in the i-th row is also selected.

The scan lines G1 to $G_m$ are sequentially selected (hereinafter also referred to as scanned) from the scan line G1 in the first row to the scan line $G_m$ in the m-th row. For example, while the scan line $G_i$ in the i-th row is selected, the scan lines (G1 to $G_i-1$ and $G_i+1$ to $G_m$) other than the scan line $G_i$ in the i-th row are not selected. Then, during the next period, the scan line $G_i+1$ in the (i+1)th row is selected. Note that a period during which one scan line is selected is referred to as one gate selection period.

Accordingly, when a scan line in a certain row is selected, video signals from the signal lines S1 to $S_n$ are input to a plurality of pixels 180102 connected to the scan line, respectively. For example, while the scan line $G_i$ in the i-th row is selected, given video signals are input from the signal lines S1 to $S_n$ to a plurality of pixels 180102 connected to the scan line $G_i$ in the i-th row, respectively. Thus, each of the plurality of pixels 180102 can be controlled individually by the scan signal and the video signal.

Figure 67:
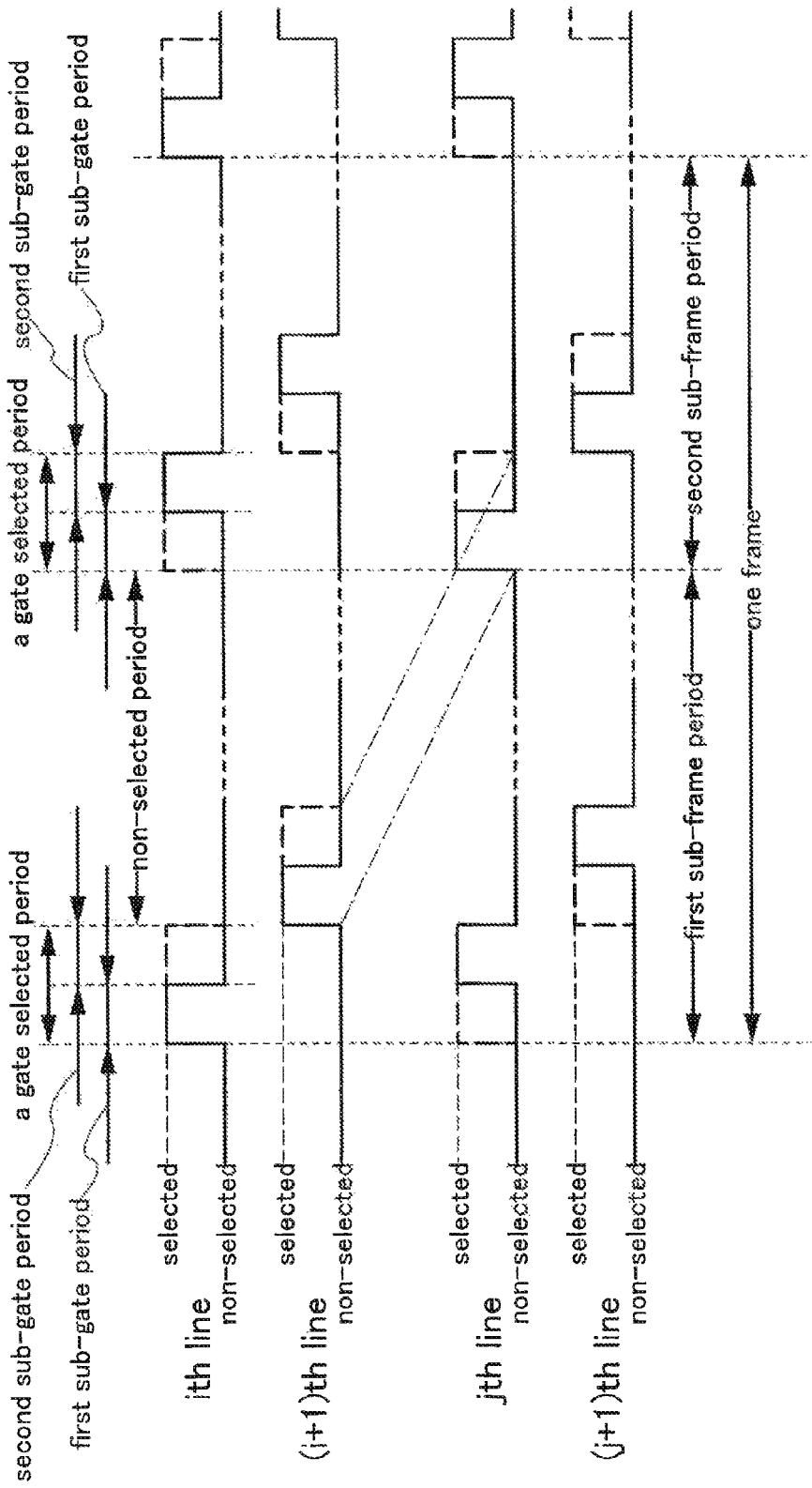
FIG. 67 illustrates the present invention.

Next, the case where one gate selection period is divided into a plurality of subgate selection periods is described. FIG. 67 is a timing chart in the case where one gate selection period is divided into two subgate selection periods (a first subgate selection period and a second subgate selection period).

Note that one gate selection period may be divided into three or more subgate selection periods.

The timing chart in FIG. 67 shows one frame period corresponding to a period for displaying an image for one screen. Although one frame period is not particularly limited to a certain period, it is at least preferable that one frame period be 1/60 second or less so that a person viewing an image does not perceive flickers.

Note that one frame is divided into two subframes (a first subframe and a second subframe).

The timing chart of FIG. 67 shows timing of selecting the scan line G, in the i-th row, the scan line $G_i+1$ in the (i+1)th row, the scan line $G_j$ (one of the scan lines $G_i+1$ to $G_m$) in the j-th row, and the scan line $G_j+1$ (one of the scan lines $G_i+1$ to $G_m$) in the (j+1)th row.

At the same time as the scan line is selected, the pixel 180102 connected to the scan line is also selected. For example, when the scan line $G_i$ in the i-th row is selected, the pixel 180102 connected to the scan line $G_i$ in the i-th row is also selected.

The scan lines G1 to $G_m$ are sequentially scanned in each subgate selection period. For example, in one gate selection period, the scan line $G_i$ in the i-th row is selected in the first subgate selection period, and the scan line $G_j$ in the j-th row is selected in the second subgate selection period. Thus, in one gate selection period, an operation can be performed as if scan signals for two rows are selected. At this time, different video signals are input to the signal lines S1 to $S_n$ in the first subgate selection period and the second subgate selection period. Therefore, different video signals can be input to a plurality of pixels 180102 connected to the i-th row and a plurality of pixels 180102 connected to the j-th row.

Next, a driving method for converting a frame rate of image data to be input (also referred to as input frame rate) and a frame rate of display (also referred to as a display frame rate) is described. Note that the frame rate is the number of frames per second, and its unit is Hz.

In this embodiment mode, the input frame rate does not necessarily correspond to the display frame rate. When the input frame rate and the display frame rate are different from each other, the frame rate can be converted by a circuit which converts a frame rate of image data (a frame rate conversion circuit). In such a manner, even when the input frame rate and the display frame rate are different from each other, display can be performed at a variety of display frame rates.

When the input frame rate is higher than the display frame rate, part of the image data to be input is discarded and the input frame rate is converted so that display is performed at a variety of display frame rates. In this case, the display frame rate can be reduced; thus, operating frequency of a driver circuit used for display can be reduced, and power consumption can be reduced. On the other hand, when the input frame rate is lower than the display frame rate, display can be performed at a variety of converted display frame rates by a method such as a method in which all or part of the image data to be input is displayed more than once, a method in which another image is generated from the image data to be input, or a method in which an image having no relation to the image data to be input is generated. In this case, quality of moving images can be improved by the display frame rate being increased.

In this embodiment mode, a frame rate conversion method in the case where the input frame rate is lower than the display frame rate is described in detail. Note that a frame rate conversion method in the case where the input frame rate is higher than the display frame rate can be realized by performing the frame rate conversion method in the case where the input frame rate is lower than the display frame rate in reverse order.

In this embodiment mode, an image displayed at the same frame rate as the input frame rate is referred to as a basic image. An image which is displayed at a frame rate different from that of the basic image and displayed to ensure that the input frame rate and the display frame rate are consistent to each other is referred to as an interpolation image. As the basic image, the same image as that of the image data to be input can be used. As the interpolation image, the same image as the basic image can be used. Further, an image different from the basic image can be generated, and the generated image can be used as the interpolation image.

In order to generate the interpolation image, the following methods can be used, for example: a method in which time change (movement of images) of the image data to be input is detected and an image in an intermediate state between the images is employed as the interpolation image, a method in which an image obtained by multiplication of luminance of the basic image by a coefficient is employed as the interpolation image, and a method in which a plurality of different images are generated from the image data to be input and the plurality of images are continuously displayed (one of the plurality of images is employed as the basic image and the other images are employed as interpolation images) so as to allow a viewer to perceive an image corresponding to the image data to be input. Examples of the method in which a plurality of different images are generated from the image data to be input include a method in which a gamma value of the image data to be input is converted and a method in which a gray scale value included in the image data to be input is divided.

Note that an image in an intermediate state (an intermediate image) refers to an image obtained by detection of time change (movement of images) of the image data to be input and interpolation of the detected movement. Obtaining an intermediate image by such a method is referred to as motion compensation.

Next, a specific example of a frame rate conversion method is described. With this method, frame rate conversion multiplied by a given rational number (n/m) can be realized. Here, each of n and m is an integer equal to or more than 1. A frame rate conversion method in this embodiment mode can be handled as being divided into a first step and a second step. The first step is a step in which a frame rate is converted by being multiplied by the given rational number (n/m). As the interpolation image, the intermediate image obtained by motion compensation or the basic image may be used. The second step is a step in which a plurality of different images (sub-images) are generated from the image data to be input or from images each of which frame rate is converted in the first step and the plurality of sub-images are continuously displayed. When a method of the second step is used, human eyes can be made to perceive display such that the display appears to be an original image, despite the fact that a plurality of different images are displayed.

Note that in the frame rate conversion method in this embodiment mode, both the first and second steps may be used, only the second step may be used with the first step omitted, or only the first step may be used with the second step omitted.

Figure 68:
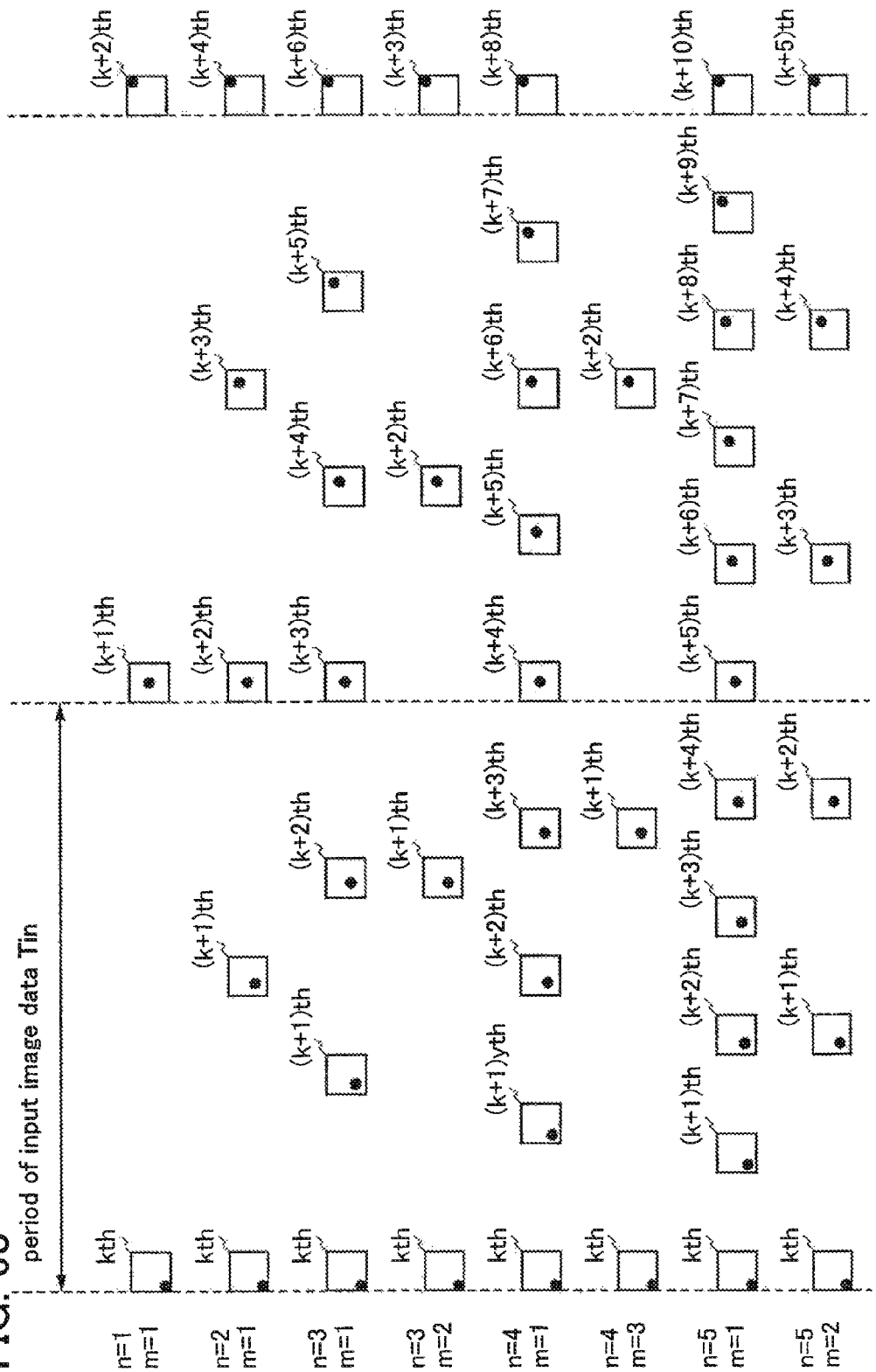
FIG. 68 illustrates the present invention.

First, as the first step, frame rate conversion multiplied by the given rational number (n/m) is described with reference to FIG. 68. In FIG. 68, the horizontal axis represents time, and the vertical axis represents cases for various combinations of n and m. Each pattern in FIG. 68 is a schematic diagram of an image to be displayed, and a horizontal position of the pattern represents timing of display. A dot in the pattern schematically represents movement of an image. Note that each of these images is an example for explanation, and an image to be displayed is not limited to one of these images. This method can be applied to a variety of images.

A period $T_{in}$ represents a cycle of input image data. The cycle of input image data corresponds to an input frame rate. For example, when the input frame rate is 60 Hz, the cycle of input image data is 1/60 seconds. Similarly, when the input frame rate is 50 Hz, the cycle of input image data is 1/50 seconds. Accordingly, the cycle (unit: second) of input image data is an inverse number of the input frame rate (unit: Hz). Note that a variety of input frame rates such as 24 Hz, 50 Hz, 60 Hz, 70 Hz, 48 Hz, 100 Hz, 120 Hz, and 140 Hz can be used. 24 Hz is a frame rate for movies on film, for example. 50 Hz is a frame rate for a video signal of the PAL standard, for example. 60 Hz is a frame rate for an image signal of the NTSC standard, for example. 70 Hz is a frame rate of a display input signal of a personal computer, for example. 48 Hz, 100 Hz, 120 Hz, and 140 Hz are twice as high as 24 Hz, 50 Hz, 60 Hz, and 70 Hz, respectively. Note that the frame rate can not only be doubled but also be multiplied by a variety of numbers. As described above, with the method shown in this embodiment mode, a frame rate can be converted with respect to an input signal of various standards.

Procedures of frame rate conversion multiplied by the given rational number (n/m) times in the first step are as follows. As a procedure 1, display timing of a k-th interpolation image (k is an integer equal to or more than 1, where the initial value is 1) with respect to a first basic image is determined. The display timing of the k-th interpolation image is at the timing of passage of a period obtained by multiplication of the cycle of input image data by k(m/n) after the first basic image is displayed. As a procedure 2, whether the coefficient k(m/n) used for deciding the display timing of the k-th interpolation image is an integer or not is determined. When the coefficient k is an integer, a (k(m/n)+1)th basic image is displayed at the display timing of the k-th interpolation image, and the first step is finished. When the coefficient k is not an integer, the operation proceeds to a procedure 3. As the procedure 3, an image used as the k-th interpolation image is determined. Specifically, the coefficient k(m/n) used for deciding the display timing of the k-th interpolation image is converted into the form (x+y/n)). Each of x and y is an integer, and y is smaller than n. When an intermediate image obtained by motion compensation is employed as the k-th interpolation image, an intermediate image which is an image corresponding to movement obtained by multiplication of the amount of movement from an (x+1)th basic image to an (x+2)th basic image by (y/n) is employed as the k-th interpolation image. When the k-th interpolation image is the same image as the basic image, the (x+1)th basic image can be used. Note that a method for obtaining an intermediate image as an image corresponding to movement obtained by multiplication of the amount of movement of the image by (yin) is described in detail later. As a procedure 4, a next interpolation image is set to be the objective interpolation image. Specifically, the value of k is increased by one, and the operation returns to the procedure 1.

Next, the procedures in the first step are described in detail using specific values of n and m.

Note that a mechanism for performing the procedures in the first step may be mounted on a device or determined in the design phase of the device in advance. When the mechanism for performing the procedures in the first step is mounted on the device, a driving method can be switched so that optimal operations depending on circumstances can be performed. Note that the circumstances here include contents of image data, environment inside and outside the device (e.g., temperature, humidity, barometric pressure, light, sound, electric field, the amount of radiation, altitude, acceleration, or movement speed), user settings, software version, and the like. On the other hand, when the mechanism for performing the procedures in the first step is determined in the design phase of the device in advance, driver circuits optimal for respective driving methods can be used. Moreover, since the mechanism is determined, reduction in manufacturing cost due to efficiency of mass production can be expected.

When n=1 and m=1, that is, when a conversion ratio (n/m) is 1 (where n=1 and m=1 in FIG. 68), an operation in the first step is as follows. When k=1, in the procedure 1, display timing of a first interpolation image with respect to the first basic image is determined. The display timing of the first interpolation image is at the timing of passage of a period obtained by multiplication of the length of the cycle of input image data by k(m/n), that is, 1 after the first basic image is displayed.

Next, in the procedure 2, whether the coefficient k(m/n) used for determining the display timing of the first interpolation image is an integer or not is judged. Here, the coefficient k(m/n) is 1, which is an integer. Consequently, the (k(m/n)+1)th basic image, that is, a second basic image is displayed at the display timing of the first interpolation image, and the first step is finished.

In other words, when the conversion ratio is 1, the k-th image is a basic image, the (k+1)th image is a basic image, and an image display cycle is equal to the cycle of input image data.

Specifically, in a driving method of a display device in which, when the conversion ratio is 1 (n=1), i-th image data (i is a positive integer) and (i+1)th image data are sequentially input as input image data in a certain cycle and the k-th image (k is a positive integer) and the (k+1)th image are sequentially displayed at an interval equal to the cycle of the input image data, the k-th image is displayed in accordance with the i-th image data, and the (k+1)th image is displayed in accordance with the (i+1)th image data.

Since the frame rate conversion circuit can be omitted when the conversion ratio is 1, manufacturing cost can be reduced. Further, when the conversion ratio is 1, quality of moving images can be improved compared to the case where the conversion ratio is less than 1. Moreover, when the conversion ratio is 1, power consumption and manufacturing cost can be reduced compared to the case where the conversion ratio is more than 1.

When n=2 and m=1, that is, when the conversion ratio (n/m) is 2 (where n=2 and in m=1 in FIG. 68), an operation in the first step is as follows. When k=1, in the procedure 1, display timing of the first interpolation image with respect to the first basic image is determined. The display timing of the first interpolation image is at the timing of passage of a period obtained by multiplication of the length of the cycle of input image data by k(m/n), that is, 1/2 after the first basic image is displayed.

Next, in the procedure 2, whether the coefficient k(m/n) used for determining the display timing of the first interpolation image is an integer or not is judged. Here, the coefficient k(m/n) is 1/2, which is not an integer. Consequently, the operation proceeds to the procedure 3.

In the procedure 3, an image used as the first interpolation image is determined. In order to decide the image, the coefficient 1/2 is converted into the form (x+(y/n)). In the case of the coefficient 1/2, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, 1/2 is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be determined. Next, in the procedure 4, the objective interpolation image is shifted from the first interpolation image to a second interpolation image. That is, k is changed from 1 to 2, and the operation returns to the procedure 1.

When k=2, in the procedure 1, display timing of the second interpolation image with respect to the first basic image is determined. The display timing of the second interpolation image is at the timing of passage of a period obtained by multiplication of the length of the cycle of input image data by k(m/n), that is, 1 after the first basic image is displayed.

Next, in the procedure 2, whether the coefficient k(m/n) used for determining the display timing of the second interpolation image is an integer or not is judged. Here, the coefficient k(m/n) is 1, which is an integer. Consequently, the (k(m/n)+1)th basic image, that is, the second basic image is displayed at the display timing of the second interpolation image, and the first step is finished.

In other words, when the conversion ratio is 2 (n/m=2), the k-th image is a basic image, the (k+1)th image is an interpolation image, a (k+2)th image is a basic image, and an image display cycle is half the cycle of input image data.

Specifically, in a driving method of a display device in which, when the conversion ratio is 2 (n/m=2), the i-th image data (1 is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/2, and the (k+2)th image is displayed in accordance with the (i+1)th image data.

Even specifically, in a driving method of a display device in which, when the conversion ratio is 2 (n/m=2) the i-th image data (i is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the i-th image data, the (k+1)th image is displayed in accordance with the i-th image data, and the (k+2)th image is displayed in accordance with the (i+1)th image data.

Specifically, when the conversion ratio is 2, driving is also referred to as double-frame rate driving. For example, when the input frame rate is 60 Hz, the display frame rate is 120 Hz (120 Hz driving). Accordingly, two images are continuously displayed with respect to one input image. At this time, when an interpolation image is an intermediate image obtained by motion compensation, the movement of moving images can be made smooth; thus, quality of the moving image can be significantly improved. Further, quality of moving images can be significantly improved particularly when the display device is an active matrix liquid crystal display device. This is related to a problem of lack of writing voltage due to change in the electrostatic capacity of a liquid crystal element by applied voltage, so-called dynamic capacitance. That is, when the display frame rate is made higher than the input frame rate, the frequency of a writing operation of image data can be increased; thus, defects such as an afterimage and a phenomenon of a moving image in which traces are seen due to lack of writing voltage because of dynamic capacitance can be reduced. Moreover, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced so as not to be perceived by human eyes.

When n=3 and m=1, that is, when the conversion ratio (n/m) is 3 (where n=3 and m=1 in FIG. 68), an operation in the first step is as follows. First, when k=1, in the procedure 1, display timing of the first interpolation image with respect to the first basic image is determined. The display timing of the first interpolation image is at the timing of passage of a period obtained by multiplication of the length of the cycle of input image data by k(m/n), that is, 1/3 after the first basic image is displayed.

Next, in the procedure 2, whether the coefficient k(m/n) used for determining the display timing of the first interpolation image is an integer or not is judged. Here, the coefficient k(m/n) is 1/3, which is not an integer. Consequently, the operation proceeds to the procedure 3.

In the procedure 3, an image used as the first interpolation image is determined. In order to decide the image, the coefficient 1/3 is converted into the form (x+(y/n)). In the case of the coefficient 1/3, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (yin), that is, 1/3is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be determined. Next, in the procedure 4, the objective interpolation image is shifted from the first interpolation image to the second interpolation image. That is, k is changed from 1 to 2, and the operation returns to the procedure 1.

When k=2, in the procedure 1, display timing of the second interpolation image with respect to the first basic image is determined. The display timing of the second interpolation image is at the timing of passage of a period obtained by multiplication of the length of the cycle of input image data by k(m/n), that is, 2/3 after the first basic image is displayed.

Next, in the procedure 2, whether the coefficient k(m/n) used for determining the display timing of the second interpolation image is an integer or not is judged. Here, the coefficient k(m/n) is 2/3, which is not an integer. Consequently, the operation proceeds to the procedure 3.

In the procedure 3, an image used as the second interpolation image is determined. In order to decide the image, the coefficient 2/3 is converted into the form (x+(y/n)). In the case of the coefficient 2/3, x=0 and y=2. When an intermediate image obtained by motion compensation is employed as the second interpolation image, an intermediate image corresponding to movement obtained by multiplication of the amount of movement from the (x+1)th basic image, that is, the first basic image to the (x+2)th basic image, that is, the second basic image by (yin), that is, 2/3is employed as the second interpolation image. When the second interpolation image is the same image as the basic image, the (x+1)th basic image, that is, the first basic image can be used.

According to the procedures performed up to this point, the display timing of the second interpolation image and the image displayed as the second interpolation image can be determined. Next, in the procedure 4, the objective interpolation image is shifted from the second interpolation image to a third interpolation image. That is, k is changed from 2 to 3, and the operation returns to the procedure 1.

When k=3, in the procedure 1, display timing of the third interpolation image with respect to the first basic image is determined. The display timing of the third interpolation image is at the timing of passage of a period obtained by multiplication of the length of the cycle of input image data by k(m/n), that is, 1 after the first basic image is displayed.

Next, in the procedure 2, whether the coefficient k(m/n) used for determining the display timing of the third interpolation image is an integer or not is judged. Here, the coefficient k(m/n) is 1, which is an integer. Consequently, the (k(m/n)+1)th basic image, that is, the second basic image is displayed at the display timing of the third interpolation image, and the first step is finished.

In other words, when the conversion ratio is 3 (n/m=3), the k-th image is a basic image, the (k+1)th image is an interpolation image, the (k+2)th image is an interpolation image, a (k+3)th image is a basic image, and an image display cycle is 1/3times the cycle of input image data.

Specifically, in a driving method of a display device in which, when the conversion ratio is 3 (n/m=3), the i-th image data (i is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is 1/3times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/3, the (k+2)th image is displayed in accordance with image data corresponding to movement obtained by multiplication of the amount of movement from the i-th image data to the (i+1)th image data by 2/3, and the (k+3)th image is displayed in accordance with the (i+1)th image data.

Even specifically, in a driving method of a display device in which, when the conversion ratio is 3 (n/m=3), the i-th image data (i is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is 1/3times the cycle of the input image data, the k-th image is displayed in accordance with the i-th image data, the (k+1)th image is displayed in accordance with the i-th image data, the (k+2)th image is displayed in accordance with the i-th image data, and the (k+3)th image is displayed in accordance with the (i+1)th image data.

When the conversion ratio is 3, quality of moving images can be improved compared to the case where the conversion ratio is less than 3. Moreover, when the conversion ratio is 3, power consumption and manufacturing cost can be reduced compared to the case where the conversion ratio is more than 3.

Specifically, when the conversion ratio is 3, driving is also referred to as triple-frame rate driving. For example, when the input frame rate is 60 Hz, the display frame rate is 180 Hz (180 Hz driving). Accordingly, three images are continuously displayed with respect to one input image. At this time, when an interpolation image is an intermediate image obtained by motion compensation, the movement of moving images can be made smooth; thus, quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 45 Hz, 90 Hz, 180 Hz, or 360 Hz), flickers which appear in alternating-current driving can be reduced so as not to be perceived by human eyes.

When n=3 and m=2, that is, when the conversion ratio (n/m) is 3/2 (where n=3 and m=2 in FIG. 68), an operation in the first step is as follows. When k=1, in the procedure 1, the display timing of the first interpolation image with respect to the first basic image is determined. The display timing of the first interpolation image is at the timing of passage of a period obtained by multiplication of the length of the cycle of input image data by k(m/n), that is, 2/3 after the first basic image is displayed.

Next, in the procedure 2, whether the coefficient k(m/n) used for determining the display timing of the first interpolation image is an integer or not is judged. Here, the coefficient k(m/n) is 2/3 , which is not an integer. Consequently, the operation proceeds to the procedure 3.

In the procedure 3, an image used as the first interpolation image is determined. In order to decide the image, the coefficient 2/3 is converted into the form (x+(y/n)). In the case of the coefficient 2/3 , x=0 and y=2. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, 2/3 is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be determined. Next, in the procedure 4, the objective interpolation image is shifted from the first interpolation image to the second interpolation image. That is, k is changed from 1 to 2, and the operation returns to the procedure 1.

When k=2, in the procedure 1, the display timing of the second interpolation image with respect to the first basic image is determined. The display timing of the second interpolation image is at the timing of passage of a period obtained by multiplication of the length of the cycle of input image data by k(m/n), that is, 4/3 after the first basic image is displayed.

Next, in the procedure 2, whether the coefficient k(m/n) used for determining the display timing of the second interpolation image is an integer or not is judged. Here, the coefficient k(m/n) is 4/3, which is not an integer. Consequently, the operation proceeds to the procedure 3.

In the procedure 3, an image used as the second interpolation image is determined. In order to decide the image, the coefficient 4/3 is converted into the form (x+(y/n)). In the case of the coefficient 4/3, x=1 and y=1. When an intermediate image obtained by motion compensation is employed as the second interpolation image, an intermediate image corresponding to movement obtained by multiplication of the amount of movement from the (x+1)th basic image, that is, the second basic image to the (x+2)th basic image, that is, a third basic image by (y/n), that is, 1/3 is employed as the second interpolation image. When the second interpolation image is the same image as the basic image, the (x+1)th basic image, that is, the second basic image can be used.

According to the procedures performed up to this point, the display timing of the second interpolation image and the image displayed as the second interpolation image can be determined. Next, in the procedure 4, the objective interpolation image is shifted from the second interpolation image to the third interpolation image. That is, k is changed from 2 to 3, and the operation returns to the procedure 1.

When k=3, in the procedure 1, the display timing of the third interpolation image with respect to the first basic image is determined. The display timing of the third interpolation image is at the timing of passage of a period obtained by multiplication of the length of the cycle of input image data by k(m/n), that is, 2 after the first basic image is displayed.

Next, in the procedure 2, whether the coefficient k(m/n) used for determining the display timing of the third interpolation image is an integer or not is judged. Here, the coefficient k(m/n) is 2, which is an integer. Consequently, the (k(m/n)+1)th basic image, that is, the third basic image is displayed at the display timing of the third interpolation image, and the first step is finished.

In other words, when the conversion ratio is 3/2 (n/m=3/2), the k-th image is a basic image, the (k+1)th image is an interpolation image, the (k+2)th image is an interpolation image, the (k+3)th image is a basic image, and an image display cycle is 2/3 times the cycle of input image data.

Specifically, in a driving method of a display device in which, when the conversion ratio is 3/2 (n/m=3/2), the i-th image data (1 is a positive integer), the (i+1)th image data, and (i+2)th image data are sequentially input as input image data in a certain cycle and the k-th image (k is a positive integer), the (k+1)th image, the (k+2)th image, and the (k+3)th image are sequentially displayed at an interval which is 2/3 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 2/3, the (k+2)th image is displayed in accordance with image data corresponding to movement obtained by multiplication of the amount of movement from the (i+1)th image data to the (i+2)th image data by 1/3, and the (k+3)th image is displayed in accordance with the (i+2)th image data.

Even specifically, in a driving method of a display device in which, when the conversion ratio is 3/2 (n/m=3/2), the i-th image data (i is a positive integer), the (i+1)th image data, and the (i+2)th image data are sequentially input as input image data in a certain cycle and the k-th image (k is a positive integer), the (k+1)th image, the (k+2)th image, and the (k+3)th image are sequentially displayed at an interval which is 2/3 times the cycle of the input image data, the k-th image is displayed in accordance with the i-th image data, the (k+1)th image is displayed in accordance with the i-th image data, the (k+2)th image is displayed in accordance with the (i+1)th image data, and the (k+3)th image is displayed in accordance with the (i+2)th image data.

When the conversion ratio is 3/2, quality of moving images can be improved compared with the case where the conversion ratio is less than 3/2. Moreover, when the conversion ratio is 3/2, power consumption and manufacturing cost can be reduced compared with the case where the conversion ratio is more than 3/2.

Specifically, when the conversion ratio is 3/2, driving is also referred to as 3/2-fold frame rate driving or 1.5-fold frame rate driving. For example, when the input frame rate is 60 Hz, the display frame rate is 90 Hz (90 Hz driving). Accordingly, three images are continuously displayed with respect to two input images. At this time, when an interpolation image is an intermediate image obtained by motion compensation, the movement of moving images can be made smooth; thus, quality of the moving image can be significantly improved. Moreover, operating frequency of a circuit used for obtaining an intermediate image by motion compensation can be reduced, in particular, compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 90 Hz driving and alternating-current driving of a liquid crystal display device is effective. That is, when driving frequency of the liquid crystal display device is 90 Hz and frequency of alternating-current driving is an integer multiple of 90 Hz or a unit fraction of 90 Hz (e.g., 30 Hz, 45 Hz, 90 Hz, or 180 Hz), flickers which appear in alternating-current driving can be reduced so as not to be perceived by human eyes.

Detailed description of procedures for positive integers n and m other than those described above is omitted. A conversion ratio can be set as a given rational number (n/m) in accordance with the procedures of frame rate conversion in the first step. Note that among combinations of the positive integers n and m, a combination in which a conversion ratio (n/m) can be reduced to its lowest term can be treated the same as a conversion ratio that is already reduced to its lowest term.

For example, when n=4 and m=1, that is, when the conversion ratio (n/m) is 4 (where n=4 and m=1 in FIG. 68), the k-th image is a basic image, the (k+1)th image is an interpolation image, the (k+2)th image is an interpolation image, the (k+3)th image is an interpolation image, a (k+4)th image is a basic image, and an image display cycle is 1/4 times the cycle of input image data.

Specifically, in a driving method of a display device in which, when the conversion ratio is 4 (n/m=4), the i-th image data (i is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is 1/4 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/4, the (k+2)th image is displayed in accordance with image data corresponding to movement obtained by multiplication of the amount of movement from the i-th image data to the (i+1)th image data by 1/2, the (k+3)th image is displayed in accordance with image data corresponding to movement obtained by multiplication of the amount of movement from the i-th image data to the (i+1)th image data by 3/4, and the (k+4)th image is displayed in accordance with the (i+1)th image data.

Even specifically, in a driving method of a display device in which, when the conversion ratio is 4 (n/m=4), the i-th image data (I is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is 1/4 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, and the (k+4)th image is displayed in accordance with the (i+1)th image data.

When the conversion ratio is 4, quality of moving images can be improved compared with the case where the conversion ratio is less than 4. Moreover, when the conversion ratio is 4, power consumption and manufacturing cost can be reduced compared with the case where the conversion ratio is more than 4.

Specifically, when the conversion ratio is 4, driving is also referred to as quadruple-frame rate driving. For example, when the input frame rate is 60 Hz, the display frame rate is 240 Hz (240 Hz driving). Accordingly, four images are continuously displayed with respect to one input image. At this time, when an interpolation image is an intermediate image obtained by motion compensation, the movement of moving images can be made smooth; thus, quality of the moving image can be significantly improved. Moreover, an interpolation image obtained by more accurate motion compensation can be used, in particular, compared with a driving method with low driving frequency, such as 120 Hz driving (double-frame rate driving) or 180 Hz driving (triple-frame rate driving); thus, the movement of moving images can be made smoother, and quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 40 Hz, 60 Hz, or 120 Hz), flickers which appear in alternating-current driving can be reduced so as not to be perceived by human eyes.

Moreover, when n=4 and m=3, that is, when the conversion ratio (m/n) is 4/3 (where n=4 and m=3 in FIG. 68), the k-th image is a basic image, the (k+1)th image is an interpolation image, the (k+2)th image is an interpolation image, the (k+3)th image is an interpolation image, the (k+4)th image is a basic image, and the length of an Image Display Cycle is 3/4 Times the Cycle of Input Image Data.

As further specific description, in a driving method of a display device in which when the conversion ratio is 4/3 (n/m=4/3), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, and the (k+4)th image are sequentially displayed at an interval which is 3/4 times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by 3/4, the (k+2)th image is displayed in accordance with image data corresponding to movement obtained by multiplying the amount of movement from the (i+1)th image data to the (i+2)th image data by 1/2, the (k+3)th image is displayed in accordance with image data corresponding to movement obtained by multiplying the amount of movement from the (i+2)th image data to the (i+3)th image data by 1/4, and the (k+4)th image is displayed in accordance with the (i+3)th image data.

As further specific description, in a driving method of a display device in which when the conversion ratio is 4/3 (n/m=4/3), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, and the (k+4)th image are sequentially displayed at an interval which is 3/4 times the cycle of the input image data, the k-th image is displayed in accordance with the i-th image data, the (k+1)th image is displayed in accordance with the image data, the (k+2)th image is displayed in accordance with the (i+1)th image data, the (k+3)th image is displayed in accordance with the (i+2)th image data, and the (k+4)th image is displayed in accordance with the (i+3)th image data.

When the conversion ratio is 4/3, quality of moving images can be improved compared to the case where the conversion ratio is less than 4/3. Moreover, when the conversion ratio is 4/3, power consumption and manufacturing cost can be reduced compared to the case where the conversion ratio is more than 4/3.

Specifically, when the conversion ratio is 4/3, driving is also referred to as 4/3-fold frame rate driving or 1.25-fold frame rate driving. For example, when the input frame rate is 60 Hz, the display frame rate is 80 Hz (80 Hz driving). Four images are continuously displayed with respect to three input images. At this time, when an interpolation image is an intermediate image obtained by motion compensation, motion of moving images can be made smooth; thus, quality of the moving image can be significantly improved. Moreover, operating frequency of a circuit for obtaining an intermediate image by motion compensation can be reduced particularly as compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 80 Hz driving and alternating-current driving of a liquid crystal display device is effective. That is, when driving frequency of the liquid crystal display device is 80 Hz and frequency of alternating-current driving is an integer multiple of 80 Hz or a unit fraction of 80 Hz (e.g., 40 Hz, 80 Hz, 160 Hz, or 240 Hz), flickers which appear in alternating-current driving can be reduced so as not to be perceived by human eyes.

Moreover, when n=5 and m=1, that is, when the conversion ratio (n/m) is 5 (where n=5 and m=1 in FIG. 68), the k-th image is a basic image, the (k+1)th image is an interpolation image, the (k+2)th image is an interpolation image, the (k+3)th image is an interpolation image, a (k+4)th image is an interpolation image, a (k+5)th image is a basic image, and the length of an image display cycle is 1/5 times the cycle of input image data.

As further specific description, in a driving method of a display device in which when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is 1/5 times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by 1/5, the (k+2)th image is displayed in accordance with image data corresponding to movement obtained by multiplying the amount of movement from the i-th image data to the (i+1)th image data by 2/5, the (k+3)th image is displayed in accordance with image data corresponding to movement obtained by multiplying the amount of movement from the i-th image data to the (i+1)th image data by 3/5, the (k+4)th image is displayed in accordance with image data corresponding to movement obtained by multiplying the amount of movement from the i-th image data to the (i+1)th image data by 4/5, and the (k+5)th image is displayed in accordance with the (i+1)th image data.

As further specific description, in a driving method of a display device in which when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is 1/5 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, the (k+4)th image is displayed in accordance with the i-th image data, and the (k+5)th image is displayed in accordance with the (i+1)th image data.

When the conversion ratio is 5, quality of moving images can be improved compared to the case where the conversion ratio is less than 5. Moreover, when the conversion ratio is 5, power consumption and manufacturing cost can be reduced compared to the case where the conversion ratio is more than 5.

Specifically, when the conversion ratio is 5, driving is also referred to as 5-fold frame rate driving. For example, when the input frame rate is 60 Hz, the display frame rate is 300 Hz (300 Hz driving). Five images are continuously displayed with respect to one input image. At this time, when an interpolation image is an intermediate image obtained by motion compensation, motion of moving images can be made smooth; thus, quality of the moving image can be significantly improved. Moreover, an intermediate image obtained by more accurate motion compensation can be used as the interpolation image particularly as compared with a driving method with low driving frequency, such as 120 Hz driving (double-frame rate driving) or 180 Hz driving (triple-frame rate driving); thus, motion of moving images can be made smoother, and quality of the moving image can be significantly improved. Further, when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced so as not to be perceived by human eyes.

Moreover, when n=5 and m=2, that is, when the conversion ratio (n/m) is 5/2 (where n=5 and m=2 in FIG. 68), the k-th image is a basic image, the (k+1)th image is an interpolation image, the (k+2)th image is an interpolation image, the (k+3)th image is an interpolation image, a (k+4)th image is an interpolation image, the (k+5)th image is a basic image, and the length of an image display cycle is 2/5 times the cycle of input image data.

As further specific description, in a driving method of a display device in which when the conversion ratio is 5/2 (n/m=5/2), the i-th image data (i is a positive integer), the (i+1)th image data, and the (i+2)th image data are sequentially input as input image data in a certain cycle and the k-th image (k is a positive integer), the (k 1)th image, the (k+2)th image, the (k+3)th image, the (k+4)th image, and the (k+5)th image are sequentially displayed at an interval whose length is 2/5 times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by 2/5, the (k+2)th image is displayed in accordance with image data corresponding to movement obtained by multiplying the amount of movement from the i-th image data to the (i+1)th image data by 4/5, the (k+3)th image is displayed in accordance with image data corresponding to movement obtained by multiplying the amount of movement from the (i+1)th image data to the (i+2)th image data by 1/5, the (k+4)th image is displayed in accordance with image data corresponding to movement obtained by multiplying the amount of movement from the (i+1)th image data to the (i+2)th image data by 3/5, and the (k+5)th image is displayed in accordance with the (i+2)th image data.

As further specific description, in a driving method of a display device in which when the conversion ratio is 5/2 (n/m=5/2), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is 2/5 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the (i+1)th image data, the (k+4)th image is displayed in accordance with the (i+1)th image data, and the (k+5)th image is displayed in accordance with the (i+2)th image data.

When the conversion ratio is 5/2, quality of moving images can be improved compared with the case where the conversion ratio is less than 5/2. Moreover, when the conversion ratio is 5/2, power consumption and manufacturing cost can be reduced compared with the case where the conversion ratio is more than 5/2.

Specifically, when the conversion ratio is 5/2, driving is also referred to as 5/2-fold frame rate driving or 2.5-fold frame rate driving. For example, when the input frame rate is 60 Hz, the display frame rate is 150 Hz (150 Hz driving). Five images are continuously displayed with respect to two input images. At this time, when an interpolation image is an intermediate image obtained by motion compensation, motion of moving images can be made smooth; thus, quality of the moving image can be significantly improved. Moreover, an intermediate image obtained by more accurate motion compensation can be used as the interpolation image particularly as compared with a driving method with low driving frequency, such as 120 Hz driving (double-frame rate driving); thus, motion of moving images can be made smoother, and quality of the moving image can be significantly improved. Further, operating frequency of a circuit for obtaining an intermediate image by motion compensation can be reduced particularly as compared with a driving method with high driving frequency, such as 180 Hz driving (triple-frame rate driving); thus, an inexpensive circuit can be used, and manufacturing cost and power consumption can be reduced. Furthermore, when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 150 Hz driving and alternating-current driving of a liquid crystal display device is effective. That is, when driving frequency of the liquid crystal display device is 150 Hz and frequency of alternating-current driving is an integer multiple of 150 Hz or a unit fraction of 150 Hz (e.g., 30 Hz, 50 Hz, 75 Hz, or 150 Hz), flickers which appear in alternating-current driving can be reduced so as not to be perceived by human eyes.

In this manner, by setting positive integers n and m to be various numbers, the conversion ratio can be set to be a given rational number (n/m). Although detailed description is omitted, when n is 10 or less, combinations listed below can be possible: n=1, m=1, that is, the conversion ratio is (n/m)=1 (one-times frame rate driving, 60 Hz), n=2, m=1, that is, the conversion ratio is (n/m)=2 (double-frame rate driving, 120 Hz), n=3, m=1, that is, the conversion ratio is (n/m)=3 (triple-frame rate driving, 180 Hz), n=3, m=2, that is, the conversion ratio is (n/m)=3/2 (3/2-fold frame rate driving, 90 Hz), a=4, m=1, that is, the conversion ratio is (n/m)=4 (quadruple-frame rate driving, 240 Hz), n=4, m=3, that is, the conversion ratio is (n/m)=4/3 (4/3-fold frame rate driving, 80 Hz), n=5, m=1, that is, the conversion ratio is (n/m)=5/1 (5-fold frame rate driving, 300 Hz), n=5, m=2, that is, the conversion ratio is (n/m)=5/2 (5/2-fold frame rate driving, 150 Hz), n=5, m=3, that is, the conversion ratio is (n/m)=5/3 (5/3-fold frame rate driving, 100 Hz), n=5, m=4, that is, the conversion ratio is (n/m)=5/4 (5/4-fold frame rate driving, 75 Hz), n=6, m=1, that is, the conversion ratio is (n/m)=6 (6-fold frame rate driving, 360 Hz), n=6, m=5, that is, the conversion ratio is (n/m)=6/5 (6/5-fold frame rate driving, 72 Hz), n=7, m=1, that is, the conversion ratio is (n/m)=7 (7-fold frame rate driving, 420 Hz), n=7, m=2, that is, the conversion ratio is (n/m)=7/2 (7/2-fold frame rate driving, 210 Hz), n=7, m=3, that is, the conversion ratio is (n/m)=7/3 (7/3-fold frame rate driving, 140 Hz), n=7, m=4, that is, the conversion ratio is (n/m)=7/4 (7/4-fold frame rate driving, 105 Hz), n=7, m=5, that is, the conversion ratio is (n/m)=7/5 (7/5-fold frame rate driving, 84 Hz), n=7, m=6, that is, the conversion ratio is (n/m)=7/6 (7/6-fold frame rate driving, 70 Hz), n=8, m=1, that is, the conversion ratio is (n/m)=8 (8-fold frame rate driving, 480 Hz), n=8, m=3, that is, the conversion ratio is (n/m)=8/3 (8/3-fold frame rate driving, 160 Hz), n=8, m=5, that is, the conversion ratio is (n/m)=8/5 (8/5-fold frame rate driving, 96 Hz), n=8, m=7, that is, the conversion ratio is (n/m)=8/7 (8/7-fold frame rate driving, 68.6 Hz), n=9, m=1, that is, the conversion ratio is (n/m)=9 (9-fold frame rate driving, 540 Hz), n=9, m=2, that is, the conversion ratio is (n/m)=9/2 (9/2-fold frame rate driving, 270 Hz), n=9, m=4, that is, the conversion ratio is (n/m)=9/4 (9/4-fold frame rate driving, 135 Hz), n=9, m=5, that is, the conversion ratio is (n/m)=9/5 (9/5-fold frame rate driving, 108 Hz), n=9, m=7, that is, the conversion ratio is (n/m)=9/7 (9/7-fold frame rate driving, 77.1 Hz), n=9, m=8, that is, the conversion ratio is (n/m)=9/8 (9/8-fold frame rate driving, 67.5 Hz), n=10, in =1, that is, the conversion ratio is (n/m)=10 (10-fold frame rate driving, 600 Hz), n=10, m=3, that is, the conversion ratio is (n/m)=10/3 (10/3-fold frame rate driving, 200 Hz), n=10, m=7, that is, the conversion ratio is (n/m)=10/7 (10/7-fold frame rate driving, 85.7 Hz), and n=10, m=9, that is, the conversion ratio is (n/m)=10/9 (10/9-fold frame rate driving, 66.7 Hz). Note that these frequencies are examples in the case where the input frame rate is 60 Hz. With regard to other frame rates, a product obtained by multiplication of each conversion ratio and an input frame rate can be a driving frequency.

In the case where n is an integer more than 10, although specific numbers for n and in are not stated here, the procedure of frame rate conversion in the first step can be obviously applied to various n and m.

Note that depending on how many images which can be displayed without motion compensation to the input image data are included in the displayed images, the conversion ratio can be determined. Specifically, the smaller m becomes, the higher the proportion of images which can be displayed without motion compensation to the input image data becomes. When motion compensation is performed less frequently, power consumption can be reduced because a circuit which performs motion compensation operates less frequently. In addition, the likelihood of generation of an image (an intermediate image which does not correctly reflect motion of an image) including an error by motion compensation can be decreased, so that image quality can be improved. For example, as such a conversion ratio, in the case where n is 10 or less, 1, 2, 3, 3/2, 4, 5, 5/2, 6, 7, 7/2, 8, 9, 9/2, or 10 is possible. By employing such a conversion ratio, especially when an intermediate image obtained by motion compensation is used as an interpolation image, the image quality can be improved and power consumption can be reduced because the number (half the total number of images input) of images, which can be displayed without motion compensation to the input image data, is comparatively large and motion compensation is performed less frequently in the case where m is 2; and because the number (equal to the total number of images input) of images which can be displayed without motion compensation to the input image data is large and motion compensation cannot be performed in the case where m is 1. On the other hand, the larger m becomes, the smoother motion of images can be made because an intermediate image which is generated by motion compensation with high accuracy is used.

Note that in the case where a display device is a liquid crystal display device, the conversion ratio can be determined in accordance with a response time of a liquid crystal element. Here, the response time of the liquid crystal element is the time from when a voltage applied to the liquid crystal element is changed until when the liquid crystal element responds. When the response time of the liquid crystal element differs depending on the amount of change of the voltage applied to the liquid crystal element, an average of the response times of plural typical voltage changes can be used. Alternatively, the response time of the liquid crystal element can be defined as MRPT (moving picture response time). Then, by frame rate conversion, the conversion ratio which enables the length of the image display cycle to be near the response time of the liquid crystal element can be determined. Specifically, the response time of the liquid crystal element is preferably the time from the value obtained by multiplication of the cycle of input image data and the inverse number of the conversion ratio, to approximately half that value. In this manner, the image display cycle can be made to correspond to the response time of the liquid crystal element, so that the image quality is improved. For example, when the response time of the liquid crystal element is more than or equal to 4 milliseconds and less than or equal to 8 milliseconds, double-frame rate driving (120 Hz driving) can be employed. This is because the image display cycle of 120 Hz driving is approximately 8 milliseconds and the half of the image display cycle of 120 Hz driving is approximately 4 milliseconds. Similarly, for example, when the response time of the liquid crystal element is more than or equal to 3 milliseconds and less than or equal to 6 milliseconds, triple-frame rate driving (180 Hz driving) can be employed; when the response time of the liquid crystal element is more than or equal to 5 milliseconds and less than or equal to 11 milliseconds, 1.5-fold frame rate driving (90 Hz driving) can be employed; when the response time of the liquid crystal element is more than or equal to 2 milliseconds and less than or equal to 4 milliseconds, quadruple-frame rate driving (240 Hz driving) can be employed; and when the response time of the liquid crystal element is more than or equal to 6 milliseconds and less than or equal to 12 milliseconds, 1.25-fold frame rate driving (80 Hz driving) can be employed. Note that this is similar to the case of other driving frequencies.

Note that the conversion ratio can also be determined by a tradeoff between the quality of the moving image, and power consumption and manufacturing cost. That is, the quality of the moving image can be improved by increasing the conversion ratio while power consumption and manufacturing cost can be reduced by decreasing the conversion ratio. Therefore, when n is 10 or less, each conversion ratio has an advantage described below.

When the conversion ratio is 1, the quality of the moving image can be improved compared to the case where the conversion ratio is less than 1, and power consumption and manufacturing cost can be further reduced compared to the case where the conversion ratio is more than 1. Moreover, since m is small, power consumption can be reduced while high image quality is obtained. Further, by applying the conversion ratio of 1 to a liquid crystal display device in which the response time of the liquid crystal elements is approximately 1 times the cycle of input image data, the image quality can be improved.

When the conversion ratio is 2, the quality of the moving image can be further improved compared to the case where the conversion ratio is less than 2, and power consumption and manufacturing cost can be further reduced compared to the case where the conversion ratio is more than 2. Moreover, since m is small, power consumption can be reduced while high image quality is obtained. Further, by applying the conversion ratio of 2 to a liquid crystal display device in which the response time of the liquid crystal elements is approximately 1/2 times the cycle of input image data, the image quality can be improved.

When the conversion ratio is 3, the quality of the moving image can be further improved compared to the case where the conversion ratio is less than 3, and power consumption and manufacturing cost can be further reduced compared to the case where the conversion ratio is more than 3. Moreover, since m is small, power consumption can be reduced while high image quality is obtained. Further, by applying the conversion ratio of 3 to a liquid crystal display device in which the response time of the liquid crystal elements is approximately 1/3 times the cycle of input image data, the image quality can be improved.

When the conversion ratio is 3/2, the quality of the moving image can be further improved compared to the case where the conversion ratio is less than 3/2, and power consumption and manufacturing cost can be further reduced compared to the case where the conversion ratio is more than 3/2. Moreover, since m is small, power consumption can be reduced while high image quality is obtained. Further, by applying the conversion ratio of 3/2 to a liquid crystal display device in which the response time of the liquid crystal elements is approximately 2/3 times the cycle of input image data, the image quality can be improved.

When the conversion ratio is 4, the quality of the moving image can be further improved compared to the case where the conversion ratio is less than 4, and power consumption and manufacturing cost can be further reduced compared to the case where the conversion ratio is more than 4. Moreover, since in is small, power consumption can be reduced while high image quality is obtained. Further, by applying the conversion ratio of 4 to a liquid crystal display device in which the response time of the liquid crystal elements is approximately 1/4 times the cycle of input image data, the image quality can be improved.

When the conversion ratio is 4/3, the quality of the moving image can be further improved compared to the case where the conversion ratio is less than 4/3, and power consumption and manufacturing cost can be further reduced compared to the case where the conversion ratio is more than 4/3. Moreover, since m is large, motion of the image can be made smoother. Further, by applying the conversion ratio of 4/3 to a liquid crystal display device in which the response time of the liquid crystal elements is approximately 3/4 times the cycle of input image data, the image quality can be improved.

When the conversion ratio is 5, the quality of the moving image can be further improved compared to the case where the conversion ratio is less than 5, and power consumption and manufacturing cost can be further reduced compared to the case where the conversion ratio is more than 5. Moreover, since in is small, power consumption can be reduced while high image quality is obtained. Further, by applying the conversion ratio of 5 to a liquid crystal display device in which the response time of the liquid crystal elements is approximately 1/5 times the cycle of input image data, the image quality can be improved.

When the conversion ratio is 5/2, the quality of the moving image can be further improved compared to the case where the conversion ratio is less than 5/2, and power consumption and manufacturing cost can be further reduced compared to the case where the conversion ratio is more than 5/2. Moreover, since m is small, power consumption can be reduced while high image quality is obtained. Further, by applying the conversion ratio of 5/2 to a liquid crystal display device in which the response time of the liquid crystal elements is approximately 2/5 times the cycle of input image data, the image quality can be improved.

When the conversion ratio is 5/3, the quality of the moving image can be further improved compared to the case where the conversion ratio is less than 5/3, and power consumption and manufacturing cost can be further reduced compared to the case where the conversion ratio is more than 5/3. Moreover, since in is large, motion of the image can be made smoother. Further, by applying the conversion ratio of 5/3 to a liquid crystal display device in which the response time of the liquid crystal elements is approximately 3/5 times the cycle of input image data, the image quality can be improved.

When the conversion ratio is 5/4, the quality of the moving image can be further improved compared to the case where the conversion ratio is less than 5/4, and power consumption and manufacturing cost can be further reduced compared to the case where the conversion ratio is more than 5/4. Moreover, since m is large, motion of the image can be made smoother. Further, by applying the conversion ratio of 5/4 to a liquid crystal display device in which the response time of the liquid crystal elements is approximately 4/5 times the cycle of input image data, the image quality can be improved.

When the conversion ratio is 6, the quality of the moving image can be further improved compared to the case where the conversion ratio is less than 6, and power consumption and manufacturing cost can be further reduced compared to the case where the conversion ratio is more than 6. Moreover, since m is small, power consumption can be reduced while high image quality is obtained. Further, by applying the conversion ratio of 6 to a liquid crystal display device in which the response time of the liquid crystal elements is approximately 1/6 times the cycle of input image data, the image quality can be improved.

When the conversion ratio is 6/5, the quality of the moving image can be further improved compared to the case where the conversion ratio is less than 6/5, and power consumption and manufacturing cost can be further reduced compared to the case where the conversion ratio is more than 6/5. Moreover, since m is large, motion of the image can be made smoother. Further, by applying the conversion ratio of 6/5 to a liquid crystal display device in which the response time of the liquid crystal elements is approximately 5/6 times the cycle of input image data, the image quality can be improved.

When the conversion ratio is 7, the quality of the moving image can be further improved compared to the case where the conversion ratio is less than 7, and power consumption and manufacturing cost can be further reduced compared to the case where the conversion ratio is more than 7. Moreover, since m is small, power consumption can be reduced while high image quality is obtained. Further, by applying the conversion ratio of 7 to a liquid crystal display device in which the response time of the liquid crystal elements is approximately 1/7 times the cycle of input image data, the image quality can be improved.

When the conversion ratio is 7/2, the quality of the moving image can be further improved compared to the case where the conversion ratio is less than 7/2, and power consumption and manufacturing cost can be further reduced compared to the case where the conversion ratio is more than 7/2. Moreover, since m is small, power consumption can be reduced while high image quality is obtained. Further, by applying the conversion ratio of 7/2 to a liquid crystal display device in which the response time of the liquid crystal elements is approximately 2/7 times the cycle of input image data, the image quality can be improved.

When the conversion ratio is 7/3, the quality of the moving image can be further improved compared to the case where the conversion ratio is less than 7/3, and power consumption and manufacturing cost can be further reduced compared to the case where the conversion ratio is more than 7/3. Moreover, since m is large, motion of the image can be made smoother. Further, by applying the conversion ratio of 7/3 to a liquid crystal display device in which the response time of the liquid crystal elements is approximately 3/7 times the cycle of input image data, the image quality can be improved.

When the conversion ratio is 7/4, the quality of the moving image can be further improved compared to the case where the conversion ratio is less than 7/4, and power consumption and manufacturing cost can be further reduced compared to the case where the conversion ratio is more than 7/4. Moreover, since m is large, motion of the image can be made smoother. Further, by applying the conversion ratio of 7/4 to a liquid crystal display device in which the response time of the liquid crystal elements is approximately 4/7 times the cycle of input image data, the image quality can be improved.

When the conversion ratio is 7/5, the quality of the moving image can be further improved compared to the case where the conversion ratio is less than 7/5, and power consumption and manufacturing cost can be further reduced compared to the case where the conversion ratio is more than 7/5. Moreover, since m is large, motion of the image can be made smoother. Further, by applying the conversion ratio of 7/5 to a liquid crystal display device in which the response time of the liquid crystal elements is approximately 5/7 times the cycle of input image data, the image quality can be improved.

When the conversion ratio is 7/6, the quality of the moving image can be further improved compared to the case where the conversion ratio is less than 7/6, and power consumption and manufacturing cost can be further reduced compared to the case where the conversion ratio is more than 7/6. Moreover, since in is large, motion of the image can be made smoother. Further, by applying the conversion ratio of 7/6 to a liquid crystal display device in which the response time of the liquid crystal elements is approximately 6/7 times the cycle of input image data, the image quality can be improved.

When the conversion ratio is 8, the quality of the moving image can be further improved compared to the case where the conversion ratio is less than 8, and power consumption and manufacturing cost can be further reduced compared to the case where the conversion ratio is more than 8. Moreover, since m is small, power consumption can be reduced while high image quality is obtained. Further, by applying the conversion ratio of 8 to a liquid crystal display device in which the response time of the liquid crystal elements is approximately 1/8 times the cycle of input image data, the image quality can be improved.

When the conversion ratio is 8/3, the quality of the moving image can be further improved compared to the case where the conversion ratio is less than 8/3, and power consumption and manufacturing cost can be further reduced compared to the case where the conversion ratio is more than 8/3. Moreover, since m is large, motion of the image can be made smoother. Further, by applying the conversion ratio of 8/3 to a liquid crystal display device in which the response time of the liquid crystal elements is approximately 3/8 times the cycle of input image data, the image quality can be improved.

When the conversion ratio is 8/5, the quality of the moving image can be further improved compared to the case where the conversion ratio is less than 8/5, and power consumption and manufacturing cost can be further reduced compared to the case where the conversion ratio is more than 8/5. Moreover, since m is large, motion of the image can be made smoother. Further, by applying the conversion ratio of 8/5 to a liquid crystal display device in which the response time of the liquid crystal elements is approximately 5/8 times the cycle of input image data, the image quality can be improved.

When the conversion ratio is 8/7, the quality of the moving image can be further improved compared to the case where the conversion ratio is less than 8/7, and power consumption and manufacturing cost can be further reduced compared to the case where the conversion ratio is more than 8/7. Moreover, since m is large, motion of the image can be made smoother. Further, by applying the conversion ratio of 8/7 to a liquid crystal display device in which the response time of the liquid crystal elements is approximately 7/8 times the cycle of input image data, the image quality can be improved.

When the conversion ratio is 9, the quality of the moving image can be further improved compared to the case where the conversion ratio is less than 9, and power consumption and manufacturing cost can be further reduced compared to the case where the conversion ratio is more than 9. Moreover, since m is small, power consumption can be reduced while high image quality is obtained. Further, by applying the conversion ratio of 9 to a liquid crystal display device in which the response time of the liquid crystal elements is approximately 1/9 times the cycle of input image data, the image quality can be improved.

When the conversion ratio is 9/2, the quality of the moving image can be further improved compared to the case where the conversion ratio is less than 9/2, and power consumption and manufacturing cost can be further reduced compared to the case where the conversion ratio is more than 9/2. Moreover, since m is small, power consumption can be reduced while high image quality is obtained. Further, by applying the conversion ratio of 9/2 to a liquid crystal display device in which the response time of the liquid crystal elements is approximately 2/9 times the cycle of input image data, the image quality can be improved.

When the conversion ratio is 9/4, the quality of the moving image can be further improved compared to the case where the conversion ratio is less than 9/4, and power consumption and manufacturing cost can be further reduced compared to the case where the conversion ratio is more than 9/4. Moreover, since m is large, motion of the image can be made smoother. Further, by applying the conversion ratio of 9/4 to a liquid crystal display device in which the response time of the liquid crystal elements is approximately 4/9 times the cycle of input image data, the image quality can be improved.

When the conversion ratio is 9/5, the quality of the moving image can be further improved compared to the case where the conversion ratio is less than 9/5, and power consumption and manufacturing cost can be further reduced compared to the case where the conversion ratio is more than 9/5. Moreover, since m is large, motion of the image can be made smoother. Further, by applying the conversion ratio of 9/5 to a liquid crystal display device in which the response time of the liquid crystal elements is approximately 5/9 times the cycle of input image data, the image quality can be improved.

When the conversion ratio is 9/7, the quality of the moving image can be further improved compared to the case where the conversion ratio is less than 9/7, and power consumption and manufacturing cost can be further reduced compared to the case where the conversion ratio is more than 9/7. Moreover, since m is large, motion of the image can be made smoother. Further, by applying the conversion ratio of 9/7 to a liquid crystal display device in which the response time of the liquid crystal elements is approximately 7/9 times the cycle of input image data, the image quality can be improved.

When the conversion ratio is 9/8, the quality of the moving image can be further improved compared to the case where the conversion ratio is less than 9/8, and power consumption and manufacturing cost can be further reduced compared to the case where the conversion ratio is more than 9/8. Moreover, since m is large, motion of the image can be made smoother. Further, by applying the conversion ratio of 9/8 to a liquid crystal display device in which the response time of the liquid crystal elements is approximately 8/9 times the cycle of input image data, the image quality can be improved.

When the conversion ratio is 10, the quality of the moving image can be further improved compared to the case where the conversion ratio is less than 10, and power consumption and manufacturing cost can be further reduced compared to the case where the conversion ratio is more than 10. Moreover, since m is small, power consumption can be reduced while high image quality is obtained. Further, by applying the conversion ratio of 10 to a liquid crystal display device in which the response time of the liquid crystal elements is approximately 1/10 times the cycle of input image data, the image quality can be improved.

When the conversion ratio is 10/3, the quality of the moving image can be further improved compared to the case where the conversion ratio is less than 10/3, and power consumption and manufacturing cost can be further reduced compared to the case where the conversion ratio is more than 10/3. Moreover, since m is large, motion of the image can be made smoother. Further, by applying the conversion ratio of 10/3 to a liquid crystal display device in which the response time of the liquid crystal elements is approximately 3/10 times the cycle of input image data, the image quality can be improved.

When the conversion ratio is 10/7, the quality of the moving image can be further improved compared to the case where the conversion ratio is less than 10/7, and power consumption and manufacturing cost can be further reduced compared to the case where the conversion ratio is more than 10/7. Moreover, since m is large, motion of the image can be made smoother. Further, by applying the conversion ratio of 10/7 to a liquid crystal display device in which the response time of the liquid crystal elements is approximately 7/10 times the cycle of input image data, the image quality can be improved.

When the conversion ratio is 10/9, the quality of the moving image can be further improved compared to the case where the conversion ratio is less than 10/9, and power consumption and manufacturing cost can be further reduced compared to the case where the conversion ratio is more than 10/9. Moreover, since m is large, motion of the image can be made smoother. Further, by applying the conversion ratio of 10/9 to a liquid crystal display device in which the response time of the liquid crystal elements is approximately 9/10 times the cycle of input image data, the image quality can be improved.

Note that it is obvious that each conversion ratio where n is more than 10 also has a similar advantage.

Next, as the second step, a method is described in which a plurality of different images (sub-images) are generated from an image based on input image data or each image (hereinafter referred to as an original image) whose frame rate is converted by a given rational number (n/m) times in the first step, and the plurality of sub-images are displayed in temporal succession. In this manner, a method of the second step can make human eyes perceive as if one original image were displayed in appearance, despite the fact that a plurality of different images are displayed.

Here, among the sub-images generated from one original image, a sub-image which is displayed first is referred to as a first sub-image. The timing when the first sub-image is displayed is the same as the timing when the original image determined in the first step is displayed. On the other hand, a sub-image which is displayed after that is referred to as a second sub-image. The timing when the second sub-image is displayed can be determined as appropriate regardless of the timing when the original image determined in the first step is displayed. Note that an image which is actually displayed is an image generated from the original image by a method in the second step.

Various images can be used for the original image for generating sub-images. The number of sub-images is not limited to two and more than two sub-images are also possible. In the second step, the number of sub-images is represented as J (J is an integer of 2 or more). At this time, a sub-image which is displayed at the same timing as the timing when the original image determined in the first step is displayed is referred to as a first sub-image. Sub-images which are sequentially displayed are referred to as a second sub-image, a third sub image . . . and J-th sub-image in order from a sub-image which is displayed.

There are many methods for generating a plurality of sub-images from one original image. As main ones, the following methods can be given. The first one is a method in which the original image is used as it is as the sub-image. The second one is a method in which brightness of the original image is distributed to the plurality of sub-images. The third one is a method in which an intermediate image obtained by motion compensation is used as the sub-image.

Here, a method for distributing brightness of the original image to the plurality of sub-images can be further divided into some methods. As main ones, the following methods can be given. The first one is a method in which at least one sub-image is a black image (hereinafter referred to as black data insertion). The second one is a method in which the brightness of the original image is distributed to a plurality of ranges and just one sub-image among all the sub-images is used to control the brightness in the ranges (hereinafter referred to as time-division gray scale control). The third one is a method in which one sub-image is a bright image which is made by changing a gamma value of the original image, and the other sub-image is a dark image which is made by changing the gamma value of the original image (hereinafter referred to as gamma complement).

Some of the methods described above are briefly described. In the method in which the original image is used as it is as the sub-image, the original image is used as it is as the first sub-image. Further, the original image is used as it is as the second sub-image. By using this method, a circuit which newly generates a sub-image does not need to operate, or the circuit itself is not necessary, so that power consumption and manufacturing cost can be reduced. Particularly in a liquid crystal display device, this method is preferably used after frame rate conversion using an intermediate image obtained by motion compensation in the first step as an interpolation image. This is because defects such as traces and afterimages of a moving image attributed to shortage of writing voltage due to dynamic capacitance of the liquid crystal elements can be reduced by using the intermediate image obtained by motion compensation as the interpolation image to make motion of the moving image smooth and displaying the same image repeatedly.

Next, in the method in which the brightness of the original image is distributed to the plurality of sub-images, a method for setting the brightness of the image and the length of a period when the sub-images are displayed is specifically described. Note that J is the number of sub-images, and an integer of 2 or more. The lower case j and capital J are distinguished. The lower case j is an integer of more than or equal to 1 and less than or equal to J. The brightness of a pixel in normal hold driving is L, the cycle of original image data is T, the brightness of a pixel in a j-th sub-image is $L_j$, and the length of a period when the j-th sub-image is displayed is $T_j$. The total sum of products of $L_j$ and $T_j$ where j=1 to where j=J (L1T1+L2T2+ . . . +LJTJ) is preferably equal to a product of L and T (LT) (brightness is unchangeable). Further, the total sum of $T_j$ where j=1 to where j=J is preferably equal to T (a display cycle of the original image is maintained). Here, unchangeableness of brightness and maintenance of the display cycle of the original image is referred to as sub-image distribution condition.

In the methods for distributing brightness of the original image to a plurality of sub-images, black data insertion is a method in which at least one sub-image is made a black image. In this manner, a display method can be made close to pseudo impulse display so that deterioration of quality of moving image due to hold-type display method can be prevented. In order to prevent decrease in brightness due to black data insertion, sub-image distribution condition is preferably satisfied. However, in the situation that decrease in brightness of the displayed image is acceptable (dark surrounding or the like) or in the ease where decrease in brightness of the displayed image is set to be acceptable by the user, sub-image distribution condition is not necessarily satisfied. For example, one sub-image may be the same as the original image and the other sub-image can be a black image. In this case, power consumption can be reduced compared to the case where sub-image distribution condition is satisfied. Further, in a liquid crystal display device, when one sub-image is made by increasing the whole brightness of the original image without limitation of the maximum brightness, sub-image distribution condition can be satisfied by increasing brightness of a backlight. In this case, since sub-image distribution condition can be satisfied without controlling the voltage value which is applied to a pixel, operation of an image processing circuit can be omitted, so that power consumption can be reduced.

Note that a feature of black data insertion is to make $L_j$ of all pixels 0 in any one of sub-images. In this manner, a display method can be made close to pseudo impulse display, so that deterioration of quality of a moving image due to a hold-type display method can be prevented.

In the methods for distributing the brightness of the original image to a plurality of sub-images, time-division gray scale control is a method in which brightness of the original image is divided into a plurality of ranges and brightness in that range is controlled by just one sub-image among all sub-images. In this manner, a display method can be made close to pseudo impulse display without decrease in brightness. Therefore, deterioration of quality of moving image due to a hold-type display method can be prevented.

As a method for dividing the brightness of the original image into a plurality of ranges, a method in which the maximum brightness ($L_{max}$) is divided into the number of sub-images can be given. This method is described with a display device which can adjust brightness of 0 to $L_{max}$ by 256 grades (from the grade 0 to 255) in the case where two sub-images are provided. When the grade 0 to 127 is displayed, brightness of one sub-image is adjusted in a range of the grade 0 to 255 while brightness of the other sub-image is set to be the grade 0. When the grade 128 to 255 is displayed, the brightness of on sub-image is set to be 255 while brightness of the other sub-image is adjusted in a range of the grade 0 to 255. In this manner, this method can make human eyes perceive as if an original image is displayed and make a display method close to pseudo impulse display, so that deterioration of quality of an moving image due to a hold-type display method can be prevented. Note that more than two sub-images can be provided. For example, if three sub-images are provided, the grade (grade 0 to 255) of brightness of an original image is divided into three. In some cases, the number of grades of brightness is not divisible by the number of sub-images, depending on the number of grades of brightness of the original image and the number of sub-images; however, the number of grades of brightness which is included in a range of each divided brightness can be distributed as appropriate even if the number of grades of brightness is not just the same as the number of sub-images.

In the case of time-division gray scale control, by satisfying sub-image distribution condition, the same image as the original image can be displayed without decrease in brightness or the like, which is preferable.

In the methods for distributing brightness of the original image to a plurality of sub-images, gamma complement is a method in which one sub-image is made a bright image by changing the gamma characteristic of the original image while the other sub-image is made a dark image by changing the gamma characteristic of the original image. In this manner, a display method can be made close to pseudo impulse display without a decrease in brightness. Therefore, deterioration of quality of moving image due to a hold-type display method can be prevented. Here, a gamma characteristic is a degree of brightness with respect to a grade (gray scale) of brightness. In general, a line of the gamma characteristic is adjusted so as to be close to a linear shape. This is because a smooth gray scale can be obtained if change in brightness is proportion to one gray scale in the grade of brightness. In gamma complement, the curve of the gamma characteristic of one sub-image is deviated from the linear shape so that the one sub-image is brighter than a sub-image in the linear shape in a region of intermediate brightness (halftone) (the image in halftone is brighter than as it usually is). Further, a line of the gamma characteristic of the other sub-image is also deviated from the linear shape so that the other sub-image is darker than the sub-image in the linear shape in a region of intermediate brightness (the image in halftone is darker than as it usually is). Here, the amount of change for brightening the one sub-image than that in the linear shape, and the amount of change for darkening the other sub-image than the sub-image in the linear shape, are preferably almost the same. This method can make human eyes perceive as if an original image is displayed and a decrease in quality of a moving image due to a hold-type display method can be prevented. Note that more than two sub-images can be provided. For example, if three sub-images are provided, each gamma characteristic of three sub-images are adjusted and the sum of the amounts of change for brightening sub-images, and the sum of the amounts of change for darkening sub-images are almost the same.

Note that also in the case of gamma complement, by satisfying sub-image distribution condition, the same image as the original image can be displayed without decrease in brightness or the like, which is preferable. Further, in gamma complement, since change in brightness $L_j$ of each sub-image with respect to gray scale follows a gamma curve, the gray scale of each sub-image can be displayed smoothly by itself. Therefore, there is an advantage that image quality to be perceived by human eyes is improved.

A method in which an intermediate image obtained by motion compensation is used as a sub-image is a method in which one sub-image is an intermediate image obtained by motion compensation using previous and next images. In this manner, motion of images can be made smooth and quality of a moving image can be improved.

The relation between the timing when a sub-image is displayed and a method of generating a sub-image is described. Although the timing when the first sub-image is displayed is the same as that when the original image determined in the first step is displayed, and the timing when the second sub-image is displayed can be decided as appropriate regardless of the timing when the original image determined in the first step is displayed, the sub-image itself may be changed in accordance with the timing when the second sub-image is displayed. In this manner, even if the timing when the second sub-image is displayed is changed variously, human eyes can be made to perceive as if the original image is displayed. Specifically, if the timing when the second sub-image is displayed is earlier, the first sub-image can be brighter and the second sub-image can be darker. Further, if the timing when the second sub-image is displayed is later, the first sub-image may be darker and the second sub-image may be brighter. This is because brightness perceived by human eyes changes in accordance with the length of a period when an image is displayed. More specifically, the longer the length of the period when an image is displayed becomes, the higher brightness perceived by human eyes becomes while the shorter the length of the period when an image is displayed becomes, the lower brightness perceived by human eyes becomes. That is, by making the timing when the second sub-image is displayed earlier, the length of the period when the first sub-image is displayed becomes shorter and the length of period when the second sub-image is displayed becomes longer. This means human eyes perceive as if the first sub-image is dark and the second sub-image is bright. As a result, a different image from the original image is perceived by human eyes. In order to prevent this, the first sub-image can be made much brighter and the second sub-image can be made much darker. Similarly, by making the timing when the second sub-image is displayed later, the length of the period when the first sub-image is displayed becomes longer, and the length of the period when the second sub-image is displayed becomes shorter; in such a case, the first sub-image can be made much darker and the second sub-image can be made much brighter.

In accordance with the above description, procedures in the second step is shown below. As a procedure 1, a method for generating a plurality of sub-images from one original image is decided. More specifically, a method for generating a plurality of sub-images can be selected from a method in which an original image is used as it is as a sub-image, a method in which brightness of an original image is distributed to a plurality of sub-images, and a method in which an intermediate image obtained by motion compensation is used as a sub-image. As a procedure 2, the number 1 of sub-images is decided. Note that 0.1 is an integer of 2 or more. As a procedure 3, the brightness $L_j$ of a pixel in j-th sub-image and the length of the period $T_j$ when the j-th sub-image is displayed are decided in accordance with the method shown in the procedure 1. Through the procedure 3, the length of a period when each sub-image is displayed and the brightness of each pixel included in each sub-image are specifically decided. As a procedure 4, the original image is processed in accordance with what decided in respective procedures 1 to 3 to actually perform display. As a procedure 5, the objective original image is shifted to the next original image and the operation returns to the procedure 1.

Note that a mechanism for performing the procedures in the second step may be mounted on a device or decided in the design phase of the device in advance. When the mechanism for performing the procedures in the second step is mounted on the device, a driving method can be switched so that an optimal operation depending on circumstances can be performed. Note that the circumstances here include contents of image data, environment inside and outside the device (e.g., temperature, humidity, barometric pressure, light, sound, an electromagnetic field, an electric field, radiation quantity, an altitude, acceleration, or movement speed), user setting, a software version, and the like. On the other hand, when the mechanism for performing the procedures in the second step is decided in the design phase of the device in advance, driver circuits optimal for respective driving methods can be used. Further, since the mechanism is determined, reduction in manufacturing cost due to efficiency of mass production can be expected.

Next, various driving methods are employed depending on the procedures in the second step and are described in detail, specifically showing values of n and m in the first step.

In the procedure 1 in the second step, in the case where a method using an original image as it is as a sub-image is selected, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The j-th (j is an integer equal to or more than 1, and equal to or less than J) sub-image is formed by arranging the plurality of pixels each having unique brightness $L_j$, and is an image displayed only during the j-th sub-image display period T. The aforementioned L, T, $L_j$, and $T_j$ satisfy the sub-image distribution condition. In all values of j, the brightness $L_j$ of each pixel which is included in the j-th sub-image is equal to L. Here, as image data which are prepared sequentially in a constant cycle T, the original image data which is formed in the first step can be used. That is, all display patterns given in the description of the first step can be combined with the above mentioned driving method.

Figure 69:
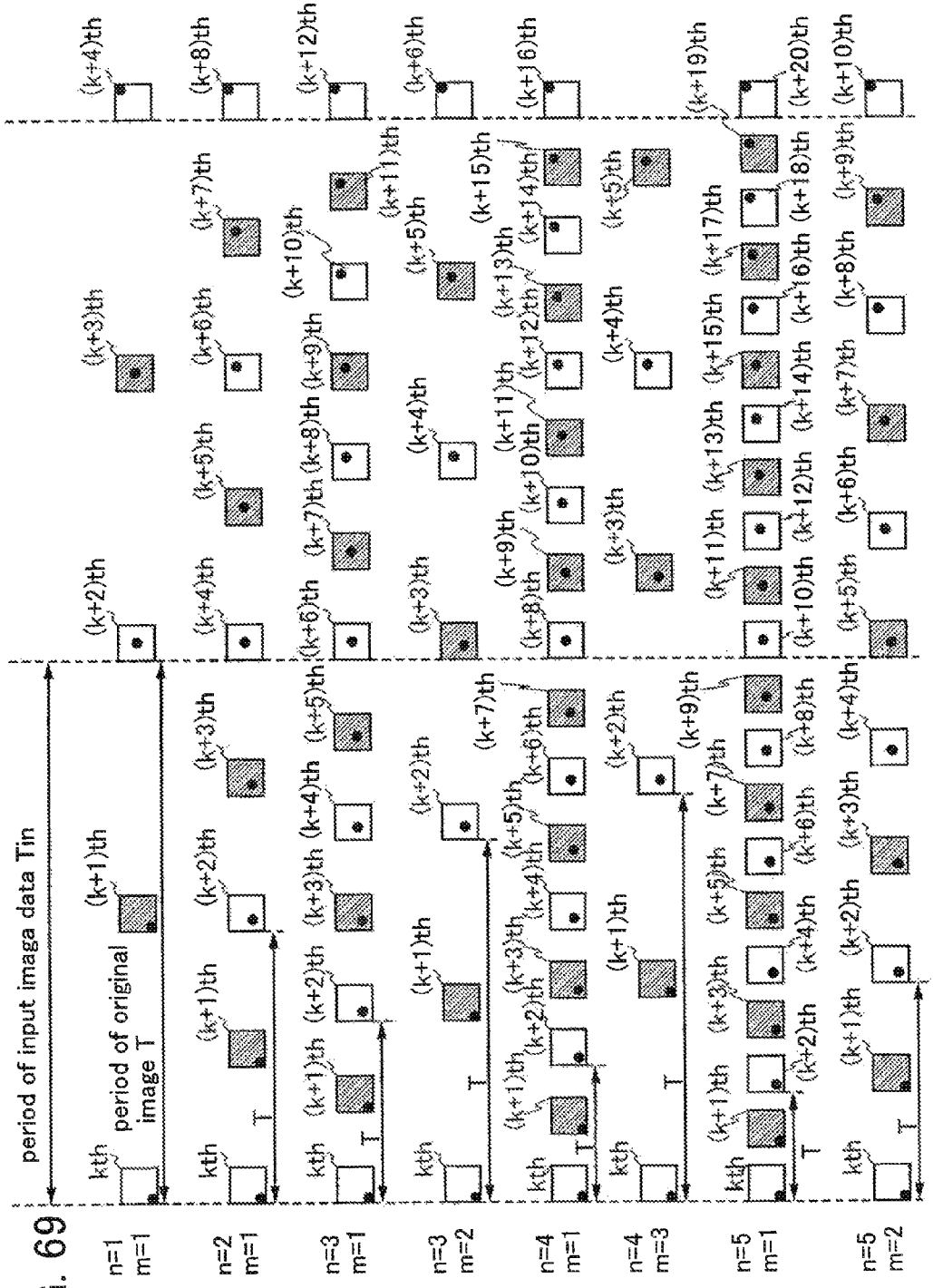
FIG. 69 illustrates the present invention.
Figure 70:
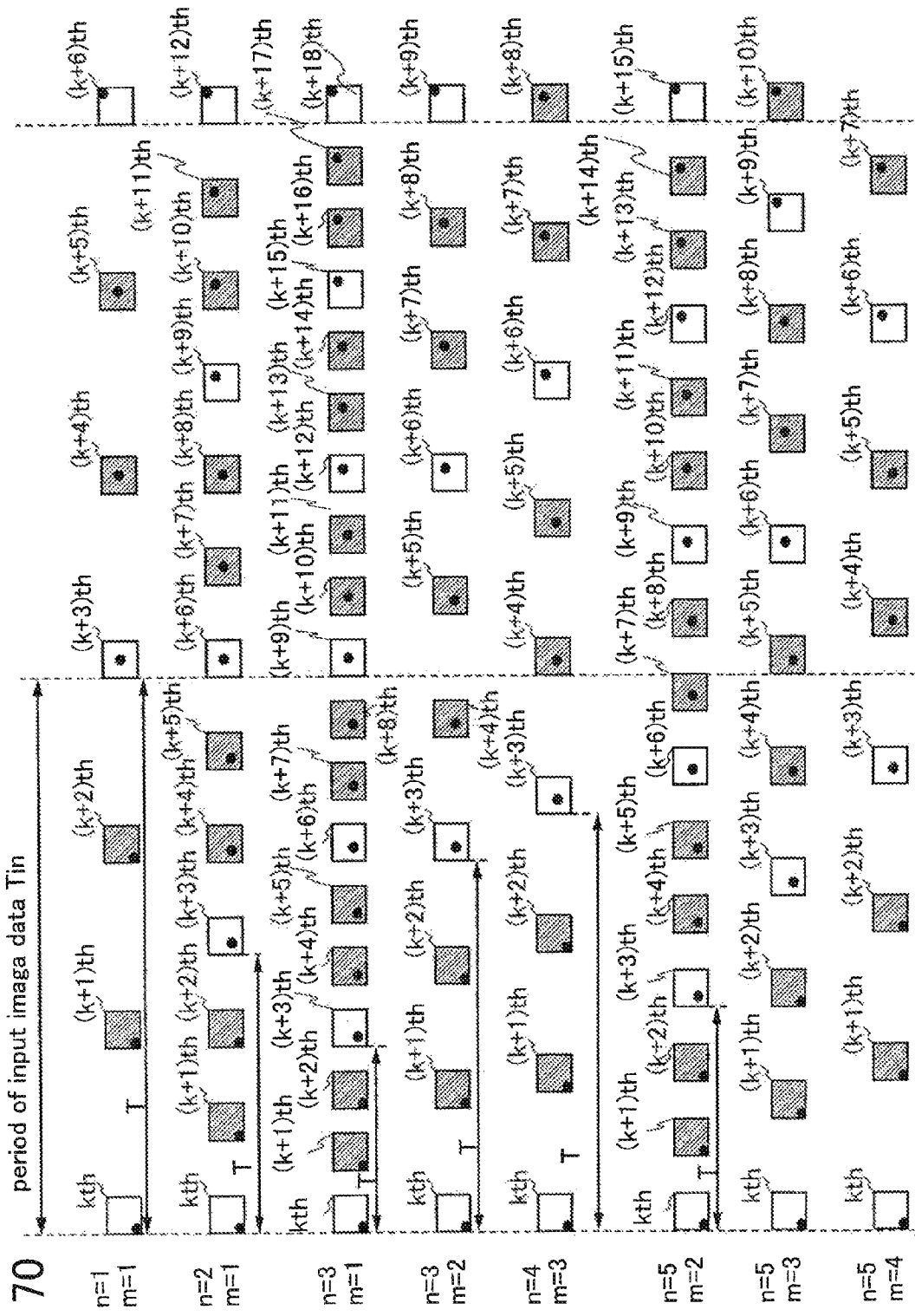
FIG. 70 illustrates the present invention.

Then, in the case where the number of sub-images J is determined to be 2 in the procedure 2 in the second step, and it is determined that $T_1=T_2=T/2$ in the procedure 3, the above-mentioned driving method is as shown in FIG. 69. In FIG. 69, the horizontal axis indicates time, and the vertical axis indicates cases which are classified with respect to various values of n and m used in the first step.

For example, in the first step, in the case of n=1 and in 1, that is, when the conversion ratio (n/m) is 1, a driving method as shown in the case of n=1 and m=1 in FIG. 69 is employed. At this time, the display frame rate is twice (double-frame rate driving) as high as the frame rate of input image data. Specifically, for example, when the input frame rate is 60 Hz, the display frame rate is 120 Hz (120 Hz driving). Then, two images are continuously displayed with respect to one piece of input image data. Here, in the case of double-frame rate driving, quality of moving images can be improved compared to the case where the frame rate is lower than that of the double-frame rate driving, and power consumption and manufacturing cost can be reduced compared to the case where the frame rate is higher than that of the double-frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 120 Hz driving and alternating-current driving of a liquid crystal display device is effective. That is, when the driving frequency of the liquid crystal display device is 120 Hz and the frequency of alternating-current driving is an integer multiple of 120 Hz or a unit fraction of 120 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately half the cycle of input image data.

Further, for example, in the first step, in the case of n=2 and m=1, that is, when the conversion ratio (n/m) is 2, a driving method as shown in the case of n=2 and m=1 in FIG. 69 is employed. At this time, the display frame rate is 4-fold (quadruple-frame rate driving) as high as the frame rate of input image data. Specifically, for example, when the input frame rate is 60 Hz, the display frame rate is 240 Hz (240 Hz driving). Then, four images are continuously displayed with respect to one piece of input image data. At this time, when an interpolated image in the first step is an intermediate image obtained by motion compensation, motion of moving images can be made smooth; thus, quality of moving images can be significantly improved. In the case of quadruple-frame rate driving, quality of moving images can be improved compared to the case where the frame rate is lower than that of the quadruple-frame rate driving, and power consumption and manufacturing cost can be reduced compared to the case where the frame rate is higher than that of the quadruple-frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particularly, such as a phenomenon of a moving image in which traces are seen and an afterimage are reduced. Moreover, a combination of 240 Hz driving and alternating-current driving of a liquid crystal display device is effective. That is, when the driving frequency of the liquid crystal display device is 240 Hz and the frequency of alternating-current driving is an integer multiple of 240 Hz or a unit fraction of 240 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately quarter the cycle of input image data.

Further, for example, in the first step, in the case of n=3 and m=1, that is, when the conversion ratio (n/m) is 3, a driving method as shown in the case of n=3 and m=1 in FIG. 69 is employed. At this time, the display frame rate is 6-fold (6-fold frame rate driving) as high as the frame rate of input image data. Specifically, for example, when the input frame rate is 60 Hz, the display frame rate is 360 Hz (360 Hz driving). Then, six images are continuously displayed with respect to one piece of input image data. At this time, when an interpolated image in the first step is an intermediate image obtained by motion compensation, motion of moving images can be made smooth; thus, quality of moving images can be significantly improved. In the case of 6-fold frame rate driving, quality of moving images can be improved compared to the case where the frame rate is lower than that of the 6-fold frame rate driving, and power consumption and manufacturing cost can be reduced compared to the case where the frame rate is higher than that of the 6-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 360 Hz driving and alternating-current driving of a liquid crystal display device is effective. That is, when the driving frequency of the liquid crystal display device is 360 Hz and the frequency of alternating-current driving is an integer multiple of 360 Hz or a unit fraction of 360 Hz (e.g., 30 Hz, 60 Hz, 120 Hz, or 180 Hz), flickers which appear by alternating-current driving can be reduced so as not to be perceived by human eyes. Moreover, image quality can be improved by applying the driving method to the liquid crystal display device in which the response time of the liquid crystal element is approximately 1/6 times the cycle of input image data.

Further, for example, in the first step, in the case of n=3 and m=2, that is, when the conversion ratio (n/m) is 3/2, a driving method as shown in the case of n=3 and m=2 in FIG. 69 is employed. At this time, the display frame rate is triple (triple frame rate driving) as high as the frame rate of input image data. Specifically, for example, when the input frame rate is 60 Hz, the display frame rate is 180 Hz (180 Hz driving). Then, three images are continuously displayed with respect to one piece of input image data. At this time, when an interpolated image in the first step is an intermediate image obtained by motion compensation, motion of moving images can be made smooth; thus, quality of moving images can be significantly improved. In the case of triple frame rate driving, quality of moving images can be improved compared to the case where the frame rate is lower than that of the triple frame rate driving, and power consumption and manufacturing cost can be reduced compared to the case where the frame rate is higher than that of the triple frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 180 Hz driving and alternating-current driving of a liquid crystal display device is effective. That is, when the driving frequency of the liquid crystal display device is 180 Hz and the frequency of alternating-current driving is an integer multiple of 180 Hz or a unit fraction of 180 Hz (e.g., 30 Hz, 60 Hz, 120 Hz, or 180 Hz), flickers which appear by alternating-current driving can be reduced so as not to be perceived by human eyes. Moreover, image quality can be improved by applying the driving method to the liquid crystal display device in which the response time of the liquid crystal element is approximately 1/3 times the cycle of input image data.

Further, for example, in the first step, in the case of n=4 and m=1, that is, when the conversion ratio (n/m) is 4, a driving method as shown in the case of n=4 and m=1 in FIG. 69 is employed. At this time, the display frame rate is 8-fold (8-fold frame rate driving) as high as the frame rate of input image data. Specifically, for example, when the input frame rate is 60 Hz, the display frame rate is 480 Hz (480 Hz driving). Then, eight images are continuously displayed with respect to one piece of input image data. At this time, when an interpolated image in the first step is an intermediate image obtained by motion compensation, motion of moving images can be made smooth; thus, quality of moving images can be significantly improved. In the case of 8-fold frame rate driving, quality of moving images can be improved compared to the case where the frame rate is lower than that of the 8-fold frame rate driving, and power consumption and manufacturing cost can be reduced compared to the case where the frame rate is higher than that of the 8-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 480 Hz driving and alternating-current driving of a liquid crystal display device is effective. That is, when the driving frequency of the liquid crystal display device is 480 Hz and the frequency of alternating-current driving is an integer multiple of 480 Hz or a unit fraction of 480 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately 1/8 times the cycle of input image data.

Further, for example, in the first step, in the case of n=4 and m=3, that is, when the conversion ratio (n/m) is 4/3, a driving method as shown in the case of n=4 and m=3 in FIG. 69 is employed. At this time, the display frame rate is 8/3 times (8/3-fold frame rate driving) as high as the frame rate of input image data. Specifically, for example, when the input frame rate is 60 Hz, the display frame rate is 160 Hz (160 Hz driving). Then, eight images are continuously displayed with respect to three pieces of input image data. At this time, when an interpolated image in the first step is an intermediate image obtained by motion compensation, motion of moving images can be made smooth; thus, quality of moving images can be significantly improved. In the case of 8/3-fold frame rate driving, quality of moving images can be improved compared to the case where the frame rate is lower than that of the 8/3-fold frame rate driving, and power consumption and manufacturing cost can be reduced compared to the case where the frame rate is higher than that of the 8/3-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 160 Hz driving and alternating-current driving of a liquid crystal display device is effective. That is, when the driving frequency of the liquid crystal display device is 160 Hz and the frequency of alternating-current driving is an integer multiple of 160 Hz or a unit fraction of 160 Hz (e.g., 40 Hz, 80 Hz, 160 Hz, or 320 Hz), flickers which appear by alternating-current driving can be reduced so as not to be perceived by human eyes. Moreover, image quality can be improved by applying the driving method to the liquid crystal display device in which the response time of the liquid crystal element is approximately 3/8 times the cycle of input image data.

Further, for example, in the first step, in the case of n=5 and m=1, that is, when the conversion ratio (n/m) is 5, a driving method as shown in the case of n=5 and m=1 in FIG. 69 is employed. At this time, the display frame rate is 10-fold (10-fold frame rate driving) as high as the frame rate of input image data. Specifically, for example, when the input frame rate is 60 Hz, the display frame rate is 600 Hz (600 Hz driving). Then, ten images are continuously displayed with respect to one piece of input image data. At this time, when an interpolated image in the first step is an intermediate image obtained by motion compensation, motion of moving images can be made smooth; thus, quality of moving images can be significantly improved. In the case of 10-fold frame rate driving, quality of moving images can be improved compared to the case where the frame rate is lower than that of the 10-fold frame rate driving, and power consumption and manufacturing cost can be reduced compared to the case where the frame rate is higher than that of the 10-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 600 Hz driving and alternating-current driving of a liquid crystal display device is effective. That is, when the driving frequency of the liquid crystal display device is 600 Hz and the frequency of alternating-current driving is an integer multiple of 600 Hz or a unit fraction of 600 Hz (e.g., 30 Hz, 60 Hz, 100 Hz, or 120 Hz), flickers which appear by alternating-current driving can be reduced so as not to be perceived by human eyes. Moreover, image quality can be improved by applying the driving method to the liquid crystal display device in which the response time of the liquid crystal element is approximately 1/10 times the cycle of input image data.

Further, for example, in the first step, in the case of n=5 and m=2, that is, when the conversion ratio (n/m) is 5/2, a driving method as shown in the case of n=5 and m=2 in FIG. 69 is employed. At this time, the display frame rate is 5-fold (5-fold frame rate driving) as high as the frame rate of input image data. Specifically, for example, when the input frame rate is 60 Hz, the display frame rate is 300 Hz (300 Hz driving). Then, five images are continuously displayed with respect to one piece of input image data. At this time, when an interpolated image in the first step is an intermediate image obtained by motion compensation, motion of moving images can be made smooth; thus, quality of moving images can be significantly improved. In the case of 5-fold frame rate driving, quality of moving images can be improved compared to the case where the frame rate is lower than that of the 5-fold frame rate driving, and power consumption and manufacturing cost can be reduced compared to the case where the frame rate is higher than that of the 5-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 300 Hz driving and alternating-current driving of a liquid crystal display device is effective. That is, when the driving frequency of the liquid crystal display device is 300 Hz and the frequency of alternating-current driving is an integer multiple of 300 Hz or a unit fraction of 300 Hz (e.g., 30 Hz, 50 Hz, 60 Hz, or 100 Hz), flickers which appear by alternating-current driving can be reduced so as not to be perceived by human eyes. Moreover, image quality can be improved by applying the driving method to the liquid crystal display device in which the response time of the liquid crystal element is approximately 1/5 times the cycle of input image data.

As described above, when a method in which an original image is used as it is as a sub-image is selected the procedure 1 in the second step; the number of sub-images is determined to be 2 in the procedure 2 in the second step; when it is determined that $T_1=T_2=T/2$ in the procedure 3 in the second step, the display frame rate can be double of the display frame rate obtained by the frame rate conversion using a conversion ratio determined by the values of n and m in the first step; thus, quality of moving images can be further improved. Further, the quality of moving images can be improved compared to the case where a display frame rate is lower than the display frame rate, and power consumption and manufacturing cost can be reduced compared to the case where a display frame rate is higher than the display frame rate. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Furthermore, when the driving frequency of the liquid crystal display device is made high and the frequency of alternating-current driving is an integer multiple or a unit fraction, flickers which appear by alternating-current driving can be reduced so as not to be perceived by human eyes. Moreover, image quality can be improved by applying the driving method to the liquid crystal display device in which the response time of the liquid crystal element is approximately (1/(double the conversion ratio)) times the cycle of input image data.

Note that it is obvious that there are similar advantages in the case of using a conversion ratio than those described above, though detailed description is omitted. For example when n is 10 or less, the following combinations are possible in addition to the above mentioned cases: n=5, m=3, that is, the conversion ratio (n/m)=5/3 (10/3-fold frame rate driving, 200 Hz), n=5, m=4, that is, the conversion ratio (n/m)=5/4 (5/2-fold frame rate driving, 150 Hz), n=6, m=1, that is, the conversion ratio (n/m)=6 (12-fold frame rate driving, 720 Hz), n=6, m=5, that is, the conversion ratio (n/m)=6/5 (12/5-fold frame rate driving, 144 Hz), n=7, m=1, that is, the conversion ratio (n/m)=7 (14-fold frame rate driving, 840 Hz), n=7, m=2, that is, the conversion ratio (n/m)=7/2 (7-fold frame rate driving, 420 Hz), n=7, m=3, that is, the conversion ratio (n/m)=7/3 (14/3-fold frame rate driving, 280 Hz), n=7, m=4, that is, the conversion ratio (n/m)=7/4 (7/2-fold frame rate driving, 210 Hz), n=7, m=5, that is, the conversion ratio (n/m)=7/5 (14/5-fold frame rate driving, 168 Hz), n=7, m=6, that is, the conversion ratio (n/m)=7/6 (7/3-fold frame rate driving, 140 Hz), n=8, m=1, that is, the conversion ratio (n/m)=8 (16-fold frame rate driving, 960 Hz), n=8, in =3, that is, the conversion ratio (n/m)=8/3 (16/3-fold frame rate driving, 320 Hz), n=8, m=5, that is, the conversion ratio (n/m)=8/5 (16/5-fold frame rate driving, 192 Hz), n=8, m=7, that is, the conversion ratio (n/m)=8/7 (16/7-fold frame rate driving, 137 Hz), n=9, m=1, that is, the conversion ratio (n/m)=9 (18-fold frame rate driving, 1080 Hz), n=9, m=2, that is, the conversion ratio (n/m)=9/2 (9-fold frame rate driving, 540 Hz), n=9, m=4, that is, the conversion ratio (n/m)=9/4 (9/2-fold frame rate driving, 270 Hz), n=9, m=5, that is, the conversion ratio (n/m)=9/5 (18/5-fold frame rate driving, 216 Hz), n=9, m=7, that is, the conversion ratio (n/m)=9/7 (18/7-fold frame rate driving, 154 Hz), n=9, m=8, that is, the conversion ratio (n/m)=9/8 (9/4-fold frame rate driving, 135 Hz), n=10, m=1, that is, the conversion ratio (n/m)=10 (20-fold frame rate driving, 1200 Hz), n=10, m=3, that is, the conversion ratio (n/m)=10/3 (20/3-fold frame rate driving, 400 Hz), n=10, m=7, that is, the conversion ratio (n/m)=10/7 (20/7-fold frame rate driving, 171 Hz), and a=10, m=9, that is, the conversion ratio (n/m)=10/9 (20/9-fold frame rate driving, 133 Hz). Note that these frequencies are examples in the case where the input frame rate is 60 Hz. As for other frame rates, the product of an input frame rate multiplied by double of conversion ratio in each case is a driving frequency.

Although specific numbers for n and in in the case where n is an integer more than 10 are not described here, the procedure in the second step can be obviously applied to various values of n and m.

Note that in the case of J=2, it is particularly effective that the conversion ratio in the first step is larger than 2. This is because when the number of sub-images is comparatively smaller like J=2 in the second step, the conversion ratio in the first step can be higher. Such a conversion ratio includes 3, 4, 5, 5/2, 6, 7, 7/2, 7/3, 8, 8/3, 9, 9/2, 9/4, 10, and 10/3, when n is equal to or less than 10. When display frame rate after the first step is such a value, by setting the value of J at 3 or more balance between an advantage (e.g., reduction in power consumption and manufacturing cost) by the number of sub-images in the second step being small and an advantage (e.g., increase of moving image quality, reduction of flickers) by the final display frame rate being high can be achieved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, display method can be made close to pseudo impulse driving, while the original image can be perceived by human eyes; therefore, quality of moving images can be improved. Note that when a method in which an original image is used as it is as a sub-image is selected in the procedure 1 as the case of the above-mentioned driving method, the sub-image can be directly displayed without changing the brightness of the sub-image. This is because an image which is used as a sub-image is the same as in this case, and the original image can be displayed adequately regardless of display timing of the sub-image.

Further, it is obvious that the number of sub-images J may be another value instead of 2 in the procedure 2. In this case, the display frame rate can be J times as high as the display frame rate obtained by the frame rate conversion using a conversion ratio determined by the values of n and m in the first step; thus, quality of moving images can be further improved. Further, the quality of moving images can be improved compared to the case where a display frame rate is lower than the display frame rate, and power consumption and manufacturing cost can be reduced compared to the case where a display frame rate is higher than the display frame rate. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and manufacturing cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an after-image are reduced. Furthermore, when the driving frequency of the liquid crystal display device is made high and the frequency of alternating-current driving is an integer multiple or a unit fraction, flickers which appear by alternating-current driving can be reduced so as not to be perceived by human eyes. Moreover, image quality can be improved by applying the driving method to the liquid crystal display device in which the response time of the liquid crystal element is approximately (1/(J times the conversion ratio)) of the cycle of input image data.

For example, in the case of J=3, particularly there is advantages that the quality of moving images can be improved compared to the case where the number of sub-images is smaller than 3, and that power consumption and manufacturing cost can be reduced compared to the case where the number of sub-images is larger than 3. Moreover, image quality can be improved by applying the driving method to the liquid crystal display device in which the response time of the liquid crystal element is approximately (1/(three times the conversion ratio)) of the cycle of input image data.

For example, in the case of J=4, particularly there is advantages that the quality of moving images can be improved compared to the case where the number of sub-images is smaller than 4, and that power consumption and manufacturing cost can be reduced compared to the case where the number of sub-images is larger than 4. Moreover, image quality can be improved by applying the driving method to the liquid crystal display device in which the response time of the liquid crystal element is approximately (1/(four times the conversion ratio)) of the cycle of input image data.

For example, in the case of J=5, particularly there is advantages that the quality of moving images can be improved compared to the case where the number of sub-images is smaller than 5, and that power consumption and manufacturing cost can be reduced compared to the case where the number of sub-images is larger than 5. Moreover, image quality can be improved by applying the driving method to the liquid crystal display device in which the response time of the liquid crystal element is approximately (1/(five times the conversion ratio)) of the cycle of input image data.

Furthermore, there are similar advantages even in the case where the number of J is any number other than the above mentioned numbers.

Note that in the case of J=3 or more, the conversion ratio in the first step can be various values. The case of J=3 or more is effective particularly when the conversion ratio in the first step is relatively small (equal to or less than 2). This is because when the display frame rate after the first step is relatively lower, J can be larger in the second step. Such a conversion ratio includes 1, 2, 3/2, 4/3, 5/3, 5/4, 6/5, 7/4, 7/5, 7/6, 8/7, 9/5, 9/7, 9/8, 10/7, and 10/9 when n is equal to or less than 10. FIG. 72 shows the case where the conversion ratio is 1, 2, 3/2, 4/3, 5/3, and 5/4 among the above-described conversion ratios. As described above, when the display frame rate after the first step is a relatively small value, by setting the value of J at 3 or more balance between an advantage (e.g., reduction in power consumption and manufacturing cost) by the number of sub-images in the first step being small and an advantage (e.g., increase of moving image quality, reduction of flickers) by the final display frame rate being high can be achieved.

Next, another example of the driving method determined by the procedure in the second step is described.

In the procedure 1 in the second step, when black data insertion is selected among methods in which brightness of the original image is distributed to a plurality of sub-images, the driving method is as follows.

One feature of a driving method of the display device is that i-th (i is a positive integer) image data and (i+1)th image data are sequentially prepared in a constant cycle T. The cycle T is divided into J is an integer equal to or more than 2) sub-image display periods. The i-th image data is data which can make each of a plurality of pixels have unique brightness L. The j-th (j is an integer equal to or more than 1, and equal to or less than J) sub-image is formed by arranging a plurality of pixels each having unique brightness $L_j$, and is an image which is displayed only during the j-th sub-image display period $T_j$. The aforementioned L, T, $L_j$, and $T_j$ satisfy the sub-image distribution condition. In at least one value of j, the brightness $L_j$ of all pixels which are included in the j-th sub-image is equal to 0. Here, as image data which are prepared sequentially in a constant cycle T, the original image data which is formed in the first step can be used. That is, all display patterns given in the description of the first step can be combined with the above mentioned driving method.

It is obvious that the driving method can be implemented by combining various values of n and m which are used in the first step.

Then, when the number of sub-images J is determined to be 2 in the procedure 2 in the second step, and it is determined that $T_1=T_2=T/2$ in the procedure 3, the driving method can be as shown in FIG. 69. Since features and advantages of the driving method (display timing using various values of n and m) shown in FIG. 69 have already been described, detailed description is omitted here. In the procedure 1 in the second step, even when black data insertion is selected among methods in which brightness of the original image is distributed to a plurality of sub-images, it is obvious that similar advantages can be obtained. For example, when an interpolated image in the first step is an intermediate image obtained by motion compensation, motion of a moving image can be made smooth; thus, quality of moving images can be significantly improved. The quality of moving images can be improved when the display frame rate is high, and power consumption and manufacturing cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Flickers which appear by alternating-current driving can be reduced so as not to be perceived by human eyes.

In the procedure 1 in the second step, as a typical advantage of selecting black data insertion among methods in which brightness of the original image is distributed to a plurality of sub-images, a circuit operation which produces an intermediate image by motion compensation can be stopped, or the circuit itself can be omitted from the device, whereby power consumption and manufacturing cost of the device can be reduced. Further, the display method can be made close to pseudo impulse driving regardless of the gray scale value included in the image data; therefore, quality of a moving image can be improved.

Note that the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be pseudo impulse driving, while the original image can be perceived by human eyes; therefore, quality of moving images can be improved. Note that as in the case of the above-mentioned driving method, when black data insertion is selected among methods in which brightness of the original image is distributed to a plurality of sub-images in the procedure 1, the sub-image may be directly displayed without changing the brightness of the sub-image. This is because when the brightness of the sub-image is not changed, the original image is merely displayed in such a manner that entire brightness of the original image is low. That is, when this method is positively used for controlling the brightness of the display device, brightness can be controlled and the quality of moving images increases at the same time.

Further, it is obvious that the number of sub-images J may be another value instead of 2 in the procedure 2. Since advantages in that case have been already described, detailed description is omitted here. In the procedure 1 in the second step, even when black data insertion is selected among methods in which brightness of the original image is distributed to a plurality of sub-images, it is obvious that similar advantages can be obtained. For example, image quality can be improved by applying the driving method to the liquid crystal display device in which the response time of the liquid crystal element is approximately (1/(J times the conversion ratio)) of the cycle of input image data.

Next, another example of the driving method determined by the procedure in the second step is described.

In the procedure 1 in the second step, when a time ratio gray scale controlling method is selected among methods in which brightness of the original image is distributed to a plurality of sub-images, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The maximum value of the unique brightness L is $L_{max}$. The j-th (j is an integer equal to or more than 1, and equal to or less than J) sub-image is formed by arranging a plurality of pixels each having unique brightness $L_j$ and is an image which is displayed only during the j-th sub-image display period $T_j$. The aforementioned L, T, $L_j$, and $T_j$ satisfy the sub-image distribution condition. When the unique brightness L is displayed, the brightness is adjusted in the range of from $(j-1) \times L_{max}/J$ to $J \times L_{max}/J$ by adjusting brightness in only one sub-image display period among the J sub-image display periods. Here, as image data which are prepared sequentially in a constant cycle T, the original image data which is formed in the first step can be used. That is, all display patterns given in the description of the first step can be combined with the above mentioned driving method.

It is obvious that the driving method can be implemented by combining various values of n and m which are used in the first step.

Then, when the number of sub-images J is determined to be 2 in the procedure 2 in the second step, and it is determined that $T_1=T_2=T/2$ in the procedure 3, the driving method can be as shown in FIG. 69. Since features and advantages of the driving method (display timing using various values of n and m) shown in FIG. 69 have already been described, detailed description is omitted here. In the procedure 1 in the second step, even when the time ratio gray scale controlling method is selected among methods in which brightness of the original image is distributed to a plurality of sub-images, it is obvious similar advantages can be obtained. For example, when an interpolated image in the first step is an intermediate image obtained by motion compensation, motion of a moving image can be made smooth; thus, quality of moving images can be significantly improved. The quality of moving images can be improved when the display frame rate is high, and power consumption and manufacturing cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Flickers which appear by alternating-current driving can be reduced so as not to be perceived by human eyes.

In the procedure 1 in the second step, as a typical advantage of selecting the time ratio gray scale controlling method among methods in which brightness of the original image is distributed to a plurality of sub-images, a circuit operation which produces an intermediate image by motion compensation can be stopped, or the circuit itself can be omitted from the device, whereby power consumption and manufacturing cost of the device can be reduced. Further, since the display method can be pseudo impulse driving, quality of a moving image can be improved, and since brightness of the display device does not become lower, power consumption can be further reduced.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be made close to pseudo impulse driving, while the original image can be perceived by human eyes; therefore, quality of moving image can be improved.

Further, it is obvious that the number of sub-images J may be another value instead of 2 in the procedure 2. Since advantages in that case have been already described, detailed description is omitted here. In the procedure 1 in the second step, even when the time ratio gray scale controlling method is selected among methods in which brightness of the original image is distributed to a plurality of sub-images, it is obvious similar advantages can be obtained. For example, image quality can be improved by applying the driving method to the liquid crystal display device in which the response time of the liquid crystal element is approximately (1/(J times the conversion ratio)) of the cycle of input image data.

Next, another example of the driving method determined by the procedure in the second step is described.

In the procedure 1 in the second step, when gamma complement is selected among methods in which brightness of the original image is distributed to a plurality of sub-images, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The j-th (j is an integer equal to or more than 1, and equal to or less than J) sub-image is formed by arranging a plurality of pixels each having unique brightness $L_j$, and is an image which is displayed only during the j-th sub-image display period $T_j$. The aforementioned L, T, $L_j$, and $T_j$ satisfy the sub-image distribution condition. In each sub-image, characteristics of a change of brightness with respect to the gray scale is changed from the linear shape, and total amount of brightness which is changed to a blighter area from the linear shape and the total amount of brightness which is changed to a darker area from the linear shape are almost the same in all gray scale. Here, as image data which are prepared sequentially in a constant cycle T, the original image data which is formed in the first step can be used. That is, all display patterns given in the description of the first step can be combined with the above-mentioned driving method.

It is obvious that the driving method can be implemented by combining various values of n and m which are used in the first step.

Then, when the number of sub-images J is determined to be 2 in the procedure 2 in the second step, and it is determined that $T_1=T_2=T/2$ in the procedure 3, the driving method can be as shown in FIG. 69. Since features and advantages of the driving method (display timing using various values of n and m) shown in FIG. 69 have already been described, detailed description is omitted here. In the procedure 1 in the second step, even when gamma complement is selected among methods in which brightness of the original image is distributed to a plurality of sub-images, it is obvious similar advantages can be obtained. For example, when an interpolated image in the first step is an intermediate image obtained by motion compensation, motion of moving images can be made smooth; thus, quality of moving images can be significantly improved. The quality of moving images can be improved when the display frame rate is high, and power consumption and manufacturing cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Flickers which appear by alternating-current driving can be reduced so as not to be perceived by human eyes.

In the procedure 1 in the second step, as a typical advantage of selecting gamma complement among methods in which brightness of the original image is distributed to a plurality of sub-images, a circuit operation which produces, an intermediate image by motion compensation can be stopped, or the circuit itself can be omitted from the device, whereby power consumption and manufacturing cost of the device can be reduced. Further, since the display method can be made close to pseudo impulse driving regardless of the gray scale value included in the image data, quality of a moving image can be improved. Moreover, image data may be directly subjected to gamma conversion to obtain a sub-image. In this case, there is an advantage in that the gamma value can be controlled variously by the amount of movement of a moving image. Further, without the image data being directly subjected to gamma conversion, a sub-image whose gamma value is changed may be obtained by change of the reference voltage of a digital-to-analog converter circuit (DAC). In this case, since the image data is not directly subjected to gamma conversion, a circuit operation for gamma conversion can be stopped, or the circuit itself can be omitted from the device, whereby power consumption and manufacturing cost of the device can be reduced. Further, in gamma complement, since the change of the brightness $L_j$ of each sub-image with respect to gray scale follows a gamma curve, the gray scale of each sub-image can be displayed smoothly by itself; therefore, there is an advantage in that image quality to be perceived in the end by human eyes is improved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be made close to pseudo impulse driving, while the original image can be perceived by human eyes; therefore, quality of moving images can be improved. In the procedure 1, when gamma complement is selected among methods in which brightness of the original image is distributed to a plurality of sub-images as in the case of the above-mentioned driving method, the gamma value may be changed in the case where brightness of the sub-image is changed. That is, the gamma value may be determined in accordance with display timing of the second sub-image. Accordingly, the operation of a circuit for changing brightness of the entire image can be stopped, or the circuit itself can be omitted from the device, whereby power consumption and manufacturing cost of the device can be reduced.

Further, it is obvious that the number of sub-images J may be another value instead of 2 in the procedure 2. Since advantages in that case have been already described, detailed description is omitted here. In the procedure 1 in the second step, even when gamma complement is selected among methods in which brightness of the original image is distributed to a plurality of sub-images, it is obvious similar advantages can be obtained. For example, image quality can be improved by applying the driving method to the liquid crystal display device in which the response time of the liquid crystal element is approximately (1/(J times the conversion ratio)) of the cycle of input image data.

Next, another example of the driving method determined by the procedure in the second step is described in detail.

When a method in which an intermediate image obtained by motion compensation is used as a sub-image is selected in the procedure 1 in the second step; when the number of sub-images is determined to be 2 in the procedure 2 in the second step; and when it is determined that $T_1=T_2=T/2$ in the procedure 3 in the second step, the driving method determined by the procedures in the second step can be as follows.

One feature of a driving method of the display device is that i-th (i is a positive integer) image data and (i+1)th image data are sequentially prepared in a constant cycle T. A k-th (k is a positive integer) image, a (k+1)th image, and a (k+2)th image are sequentially displayed at half interval of the period of the original image data. The k-th image is displayed in accordance with the i-th image data. The (k+1)th image is displayed in accordance with the image data which corresponds to half amount of the movement of from the i-th image data to the (i+1)th image data. The (k+2)th image is displayed in accordance with the (i+1)th image data. Here, as the image data which are prepared sequentially in a constant cycle T, the original image data which is formed in the first step can be used. That is, all display patterns given in the description of the first step can be combined with the above-mentioned driving method.

It is obvious that the driving method can be implemented by combining various values of n and m which are used in the first step.

In the procedure 1 in the second step, a typical advantage of selecting a method in which an intermediate image obtained by motion compensation is used as a sub-image is that a method for obtaining an intermediate image employed in the first step can be similarly used in the second step when an intermediate image obtained by motion compensation is an interpolated image. That is, a circuit for obtaining an intermediate image by motion compensation can be used not only in the first step, but also in the second step, whereby the circuit can be used efficiently and treatment efficiency can be increased. In addition, motion of moving images can be made further smooth; thus, quality of moving images can be further improved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be made close to pseudo impulse driving, while the original image can be perceived by human eyes; therefore, quality of moving images can be improved. Note that as in the case of the above-mentioned driving method, when a method in which an intermediate image obtained by motion compensation is used as a sub-image is selected in the procedure 2, it is not necessary that brightness of the sub-image is changed. This is because the image in an intermediate state is completed as an image in itself, and even when display timing of the second sub-image is changed, the image which is perceived by human eyes is not changed. In this case, the operation of a circuit for changing brightness of the entire image can be stopped, or the circuit itself can be omitted from the device, whereby power consumption and manufacturing cost of the device can be reduced.

Further, it is obvious that the number of sub-images J may be another value instead of 2 in the procedure 2. Since advantages in that case have been already described, detailed description is omitted here. In the procedure 1 in the second step, even when a method in which an intermediate image obtained by motion compensation is used as a sub-image is selected, it is obvious similar advantages can be obtained. For example, image quality can be improved by applying the driving method to the liquid crystal display device in which the response time of the liquid crystal element is approximately (1/(J times the conversion ratio)) of the cycle of input image data.

Next, specific examples of a method for converting the frame rate when the input frame rate and the display frame rate are different are described with reference to FIGS. 71A to 71C. In methods shown in FIGS. 71A to 71C, circular regions in images are changed from frame to frame, and triangle regions in the images are hardly changed from frame to frame. Note that the images are just examples for explanation, and the images to be displayed are not limited to these examples. The methods shown in FIGS. 71A to 71C can be applied to various images.

Figure 71A:
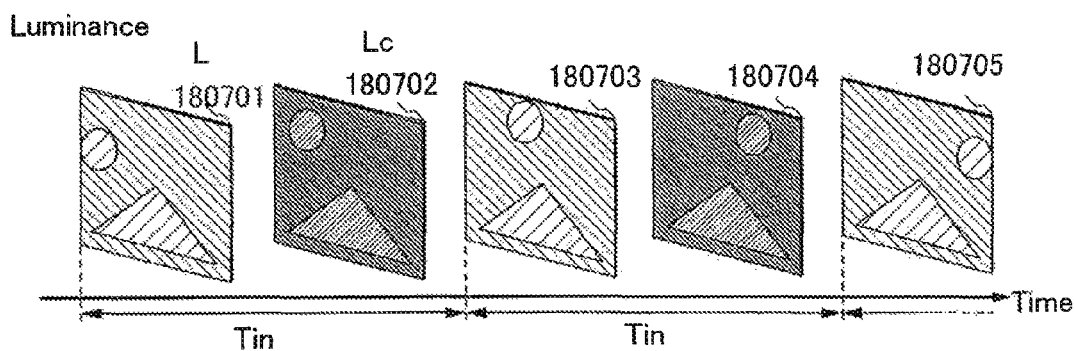
FIGS. 71A to 71C each illustrate the present invention.

FIG. 71A shows the case where the display frame rate is twice as high as the input frame rate (the conversion ratio is 2). When the conversion ratio is 2, there is an advantage in that quality of moving images can be improved compared to the case where the conversion ratio is less than 2. Further, when the conversion ratio is 2, there is an advantage in that power consumption and manufacturing cost can be reduced compared to the case where the conversion ratio is more than 2. FIG. 71A schematically shows time change in images to be displayed with time represented by the horizontal axis. Here, a focused image is referred to as a p-th image (p is a positive integer). An image displayed after the focused image is referred to as a (p+1)th image, and an image displayed before the focused image is referred to as a (p−1)th image, for example. Thus, how far an image to be displayed is apart from the focused image is described for convenience. An image 180701 is the p-th image; an image 180702 is the (p+1)th image; an image 180703 is a (p+2)th image; an image 180704 is a (p+3)th image; and an image 180705 is a (p+4)th image. The period $T_{in}$ shows a cycle of input image data. Note that since FIG. 71A shows the case where the conversion ratio is 2, the period $T_{in}$ is twice as long as a period after the p-th image is displayed until the (p+1)th image is displayed.

Here, the (p+1)th image 180702 may be an image which is made to be in an intermediate state between the p-th image 180701 and the (p+2)th image 180703 by detecting the amount of change in the images from the p-th image 180701 to the (p+2)th image 180703. FIG. 71A shows an image in an intermediate state by a region whose position is changed from frame to frame (the circular region) and a region whose position is hardly changed from frame to frame (the triangle region). In other words, the position of the circular region in the (p+1)th image 180702 is an intermediate position between the positions of the circular regions in the p-th image 180701 and the (p+2)th image 180703. That is, as for the (p+1)th image 180702, image data is interpolated by motion compensation. When motion compensation is performed on a moving object on the image in this manner to interpolate the image data, smooth display can be performed.

Further, the (p+1)th image 180702 may be an image which is made to be in an intermediate state between the p-th image 180701 and the (p+2)th image 180703 and may be an image, luminance of which is controlled by a certain rule. As the certain rule, for example, $L > L_c$ may be satisfied when typical luminance of the p-th image 180701 is denoted by L and typical luminance of the (p+1)th image 180702 is denoted by $L_c$, as shown in FIG. 71A. Preferably, 0.1 $L < L_c < 0.8$ L is satisfied, and more preferably 0.2 $L < L_c < 0.5$ L is satisfied. Alternatively, $L < L_c$ may be satisfied, preferably 0.1 $L_c < L < 0.8 L_c$ is satisfied, and more preferably 0.2 $L_c < L < 0.5 L_c$ is satisfied. In this manner, display can be made close to pseudo impulse display, so that an afterimage perceived by human eyes can be suppressed.

Note that typical luminance of the images is described later in detail with reference to FIGS. 72A to 72E.

When two different causes of motion blur (non-smoothness in movement of images and an afterimage perceived by human eyes) are removed at the same time in this manner, motion blur can be considerably reduced.

Moreover, the (p+3)th image 180704 may also be formed from the (p+2)th image 180703 and the (p+4)th image 180705 by using a similar method. That is, the (p+3)th image 180704 may be an image which is made to be in an intermediate state between the (p+2)th image 180703 and the (p+4)th image 180705 by detecting the amount of change in the images from the (p+2)th image 180703 to the (p+4)th image 180705 and may be an image, luminance of which is controlled by a certain rule.

Figure 71B:
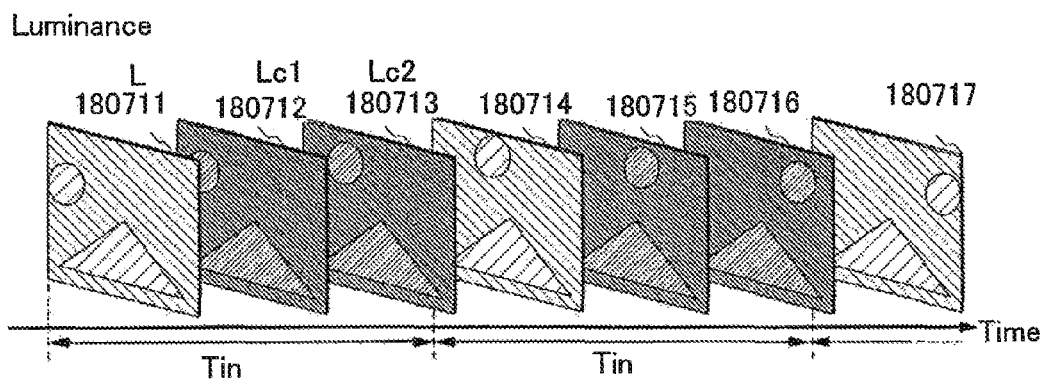

FIG. 71B shows the case where the display frame rate is three times as high as the input frame rate (the conversion ratio is 3). FIG. 71B schematically shows time change in images to be displayed with time represented by the horizontal axis. An image 180711 is the p-th image; an image 180712 is the (p+1)th image; an image 180713 is a (p+2)th image; an image 180714 is a (p+3)th image; an image 180715 is a (p+4)th image; an image 180716 is a (p+5)th image; and an image 180717 is a (p+6)th image. The period $T_{in}$ shows a cycle of input image data. Note that since FIG. 71B shows the case where the conversion ratio is 3, the period $T_{in}$ is three times as long as a period after the p-th image is displayed until the (p+1)th image is displayed.

Here, each of the (p+1)th image 180712 and the (p+2)th image 180713 may be an image which is made to be in an intermediate state between the p-th image 180711 and the (p+3)th image 180714 by detecting the amount of change in the images from the p-th image 180711 to the (p+3)th image 180714. FIG. 71B shows an image in an intermediate state by a region whose position is changed from frame to frame (the circular region) and a region whose position is hardly changed from frame to frame (the triangle region). That is, the position of the circular region in each of the (p+1)th image 180712 and the (p+2)th image 180713 is an intermediate position between the positions of the circular regions in the p-th image 180711 and the (p+3)th image 180714. Specifically, when the amount of movement of the circular regions detected from the p-th image 180711 and the (p+3)th image 180714 is denoted by X, the position of the circular region in the (p+1)th image 180712 may be displaced by approximately (⅓)× from the position of the circular region in the p-th image 180711. Further, the position of the circular region in the (p+2)th image 180713 may be displaced by approximately (⅔)× from the position of the circular region in the p-th image 180711. That is, as for each of the (p+1)th image 180712 and the (p+2)th image 180713, image data is interpolated by motion compensation. When motion compensation is performed on a moving object on the image in this manner to interpolate the image data, smooth display can be performed.

Further, each of the (p+1)th image 180712 and the (p+2)th image 180713 may be an image which is made to be in an intermediate state between the p-th image 180711 and the (p+3)th image 180714 and may be an image, luminance of which is controlled by a certain rule. As the certain rule, for example, $L > L_c1$, $L > L_c2$, or $L_c1 = L_c2$ may be satisfied when typical luminance of the p-th image 180711 is denoted by L, typical luminance of the (p+1)th image 180712 is denoted by $L_c1$, and typical luminance of the (p+2)th image 180713 is denoted by $L_c2$, as shown in FIG. 71B. Preferably, 0.1

$L<L_c1=L_c2<0.8$ L is satisfied, and more preferably $0.2 L>L_c1=L_c2<0.5$ L is satisfied. Alternatively, $L<L_c1$, $L<L_c2$, or $L_c1=L_c2$ may be satisfied, preferably $0.1 L_c1=0.1 L_c2<L<0.8 L_c1=0.8 L_c2$ is satisfied, and more preferably $0.2 L_c1=0.2 L_c2<L<0.5 L_c1=0.5 L_c2$ is satisfied. In this manner, display can be made close to pseudo impulse display, so that an afterimage perceived by human eyes can be suppressed. Alternatively, images, luminance of which is changed, may be made to appear alternately. In this manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Moreover, each of the (p+4)th image 180715 and the (p+5)th image 180716 may also be formed from the (p+3)th image 180714 and the (p+6)th image 180717 by using a similar method. That is, each of the (p+4)th image 180715 and the (p+5)th image 180716 may be an image which is made to be in an intermediate state between the (p+3)th image 180714 and the (p+6)th image 180717 by detecting the amount of change in the images from the (p+3)th image 180714 to the (p+6)th image 180717 and may be an image, luminance of which is controlled by a certain rule.

Note that when the method shown in FIG. 71B is used, the display frame rate is so high that movement of the image can follow movement of human eyes, so that movement of the image can be displayed smoothly. Therefore, motion blur can be considerably reduced.

Figure 71C:
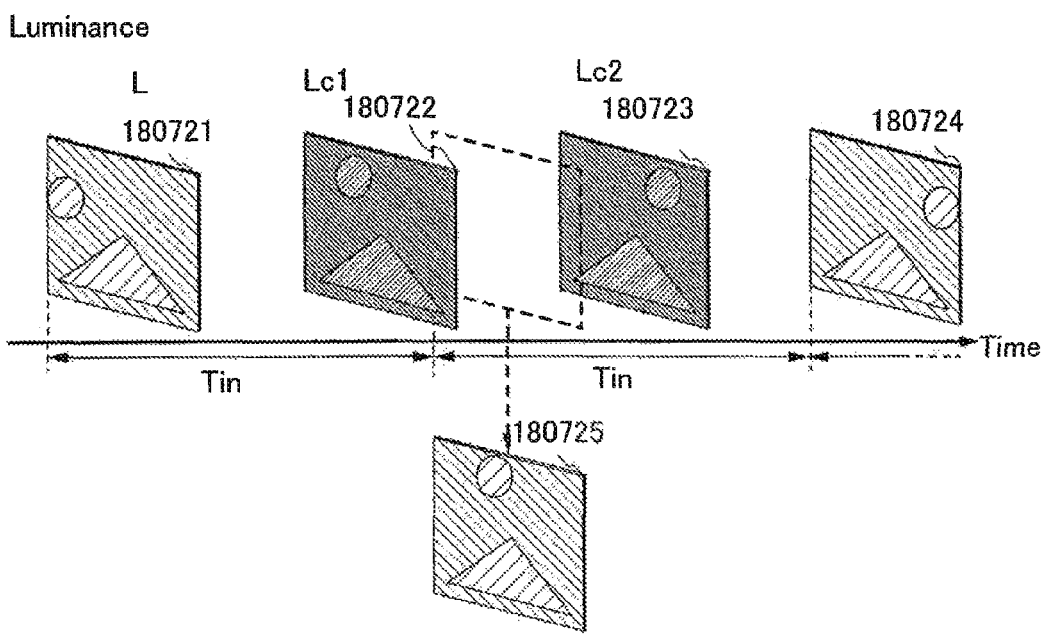

FIG. 71C shows the case where the display frame rate is 1.5 times as high as the input frame rate (the conversion ratio is 1.5). FIG. 71C schematically shows time change in images to be displayed with time represented by the horizontal axis. An image 180721 is the p-th image; an image 180722 is the (p+1)th image; an image 180723 is the (p+2)th image; and an image 180724 is the (p+3)th image. Note that although not necessarily displayed actually, an image 180725, which is input image data, may be used to form the (p+1)th image 180722 and the (p+2)th image 180723. The period $T_{in}$ shows a cycle of input image data. Note that since FIG. 71C shows the case where the conversion ratio is 1.5, the period $T_{in}$ is 1.5 times as long as a period after the p-th image is displayed until the (p+1)th image is displayed.

Here, each of the (p+1)th image 180722 and the (p+2)th image 180723 may be an image which is made to be in an intermediate state between the p-th image 180721 and the (p+3)th image 180724 by detecting the amount of change in the images from the p-th image 180721 to the (p+3)th image 180724 via the image 180725. FIG. 71C shows an image in an intermediate state by a region whose position is changed from frame to frame (the circular region) and a region whose position is hardly changed from frame to frame (the triangle region). That is, the position of the circular region in each of the (p+1)th image 180722 and the (p+2)th image 180723 is an intermediate position between the positions of the circular regions in the p-th image 180721 and the (p+3)th image 180724. That is, as for each of the (p+1)th image 180722 and the (p+2)th image 180723, image data is interpolated by motion compensation. When motion compensation is performed on a moving object on the image in this manner to interpolate the image data, smooth display can be performed.

Further, each of the (p+1)th image 180722 and the (p+2)th image 180723 may be an image which is made to be in an intermediate state between the p-th image 180721 and the (p+3)th image 180724 and may be an image, luminance of which is controlled by a certain rule. As the certain rule, for example, $L>L_c1$, $L>L_c2$, or $L_c1=L_c2$ is satisfied when typical luminance of the p-th image 180721 is denoted by L, typical luminance of the (p+1)th image 180722 is denoted by $L_c1$, and typical luminance of the (p+2)th image 180723 is denoted by $L_c2$, as shown in FIG. 71C. Preferably, $0.1 L<L_c1=L_c2<0.8$ L is satisfied, and more preferably $0.2 L<L_c1=L_c2<0.5$ L is satisfied. Alternatively, $L<L_c1$, $L<L_c2$, or $L_c1=L_c2$ may be satisfied, preferably $0.1 L_c1=0.1 L_c2<L<0.8 L_c1=0.8 L_c2$ is satisfied, and more preferably $0.2 L_c1=0.2 L_c2<L<0.5 L_c1=0.5 L_c2$ is satisfied. In this manner, display can be made close to pseudo impulse display, so that an afterimage perceived by human eyes can be suppressed. Alternatively, images, luminance of which is changed, may be made to appear alternately. In this manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Note that when the method shown in FIG. 71C is used, the display frame rate is so low that time for writing a signal to a display device can be increased. Therefore, clock frequency of the display device can be made lower, so that power consumption can be reduced. Further, processing speed of motion compensation can be decreased, so that power consumption can be reduced.

Next, typical luminance of images is described with reference to FIGS. 72A to 72E. FIGS. 72A to 72D each schematically show time change in images to be displayed with time represented by the horizontal axis. FIG. 72E shows an example of a method for measuring luminance of an image in a certain region.

An example of a method for measuring luminance of an image is a method for individually measuring luminance of each pixel which forms the image. With this method, luminance in every detail of the image can be strictly measured.

Note that since a method for individually measuring luminance of each pixel which forms the image needs much energy, another method may be used. An example of another method for measuring luminance of an image is a method for measuring average luminance of a region in an image, which is focused. With this method, luminance of an image can be easily measured. In this embodiment mode, luminance measured by a method for measuring average luminance of a region in an image is referred to as typical luminance of an image for convenience.

Then, which region in an image is focused in order to measure typical luminance of the image is described below.

Figure 72A:
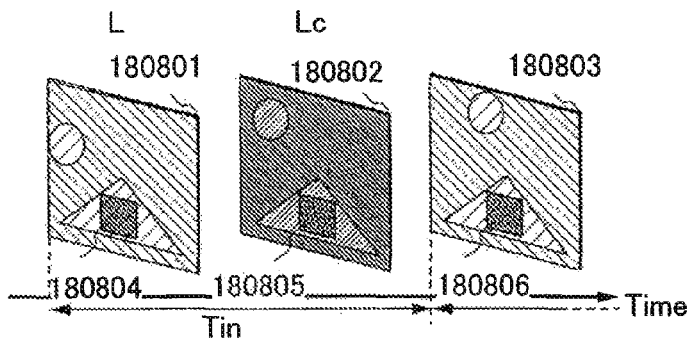
FIGS. 72A to 72E each illustrate the present invention.

FIG. 72A shows an example of a measuring method in which luminance of a region whose position is hardly changed with respect to change in an image (the triangle region) is typical luminance of the image. The period $T_{in}$ shows a cycle of input image data; an image 180801 is the p-th image; an image 180802 is the (p+1)th image; an image 180803 is the (p+2)th image; a first region 180804 is a luminance measurement region in the p-th image 180801; a second region 180805 is a luminance measurement region in the (p+1)th image 180802; and a third region 180806 is a luminance measurement region in the (p+2)th image 180803. Here, the first to third regions may be provided in almost the same spatial positions in a device. That is, when typical luminance of the images is measured in the first to third regions, time change in typical luminance of the images can be calculated.

When the typical luminance of the images is measured, whether display is made close to pseudo impulse display or not can be judged. For example, if $L_c<L$ is satisfied when luminance measured in the first region 180804 is denoted by L and luminance measured in the second region 180805 is denoted by $L_c$, it can be said that display is made close to pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 180804 and the second region 180805 can be the ratio of lower luminance to higher luminance; relative luminance between the second region 180805 and the third region 180806 can be the ratio of lower luminance to higher luminance; and relative luminance between the first region 180804 and the third region 180806 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 72B:
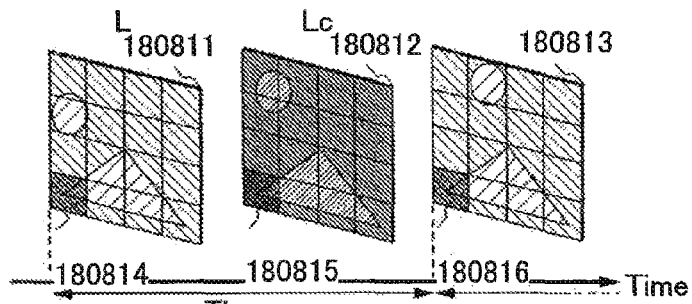

FIG. 72B shows an example of a method in which luminance of regions which are divided into tiled shapes is measured and an average value thereof is typical luminance of an image. The period $T_{in}$ shows a cycle of input image data; an image 180811 is the p-th image; an image 180812 is the (p+1)th image; an image 180813 is the (p+2)th image; a first region 180814 is a luminance measurement region in the p-th image 180811; a second region 180815 is a luminance measurement region in the (p+1)th image 180812; and a third region 180816 is a luminance measurement region in the (p+2)th image 180813. Here, the first to third regions may be provided in almost the same spatial positions in a device. That is, when typical luminance of the images is measured in the first to third regions, time change in typical luminance of the images can be measured.

When the typical luminance of the images is measured, whether display is made close to pseudo impulse display or not can be judged. For example, if $L_c<L$ is satisfied when luminance measured in the first region 180814 is denoted by L and luminance measured in the second region 180815 is denoted by Lc, it can be said that display is made close to pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 180814 and the second region 180815 can be the ratio of lower luminance to higher luminance; relative luminance between the second region 180815 and the third region 180816 can be the ratio of lower luminance to higher luminance; and relative luminance between the first region 180814 and the third region 180816 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 72C:
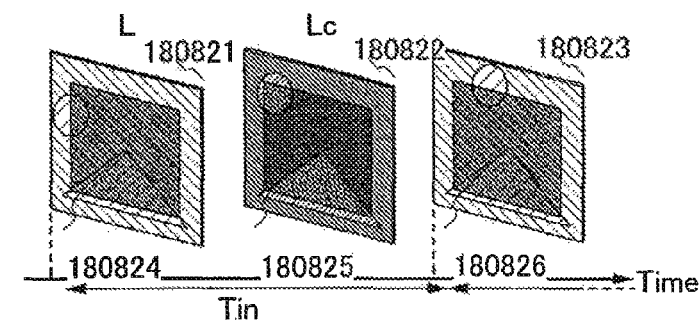

FIG. 72C shows an example of a method in which luminance of a center region in an image is measured and an average value thereof is typical luminance of the image. The period $T_{in}$ shows a cycle of input image data; an image 180821 is the p-th image; an image 180822 is the (p+1)th image; an image 180823 is the (p+2)th image; a first region 180824 is a luminance measurement region in the p-th image 180821; a second region 180825 is a luminance measurement region in the (p+1)th image 180822; and a third region 180826 is a luminance measurement region in the (p+2)th image 180823.

When the typical luminance of the images is measured, whether display is made close to pseudo impulse display or not can be judged. For example, if $L_c<L$ is satisfied when luminance measured in the first region 180824 is denoted by L and luminance measured in the second region 180825 is denoted by $L_c$, it can be said that display is made close to pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 180824 and the second region 180825 can be the ratio of lower luminance to higher luminance; relative luminance between the second region 180825 and the third region 180826 can be the ratio of lower luminance to higher luminance; and relative luminance between the first region 180824 and the third region 180826 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 72D:
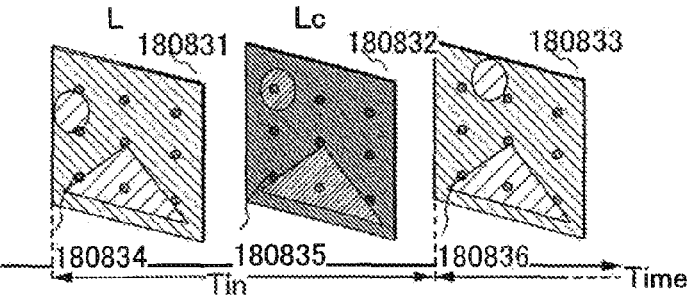
Figure 72E:
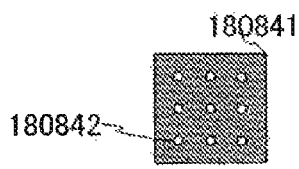

FIG. 72D shows an example of a method in which luminance of a plurality of points sampled from the entire image is measured and an average value thereof is typical luminance of the image. The period $T_{in}$ shows a cycle of input image data; an image 180831 is the p-th image; an image 180832 is the (p+1)th image; an image 180833 is the (p+2)th image; a first region 180834 is a luminance measurement region in the p-th image 180831; a second region 180835 is a luminance measurement region in the (p+1)th image 180832; and a third region 180836 is a luminance measurement region in the (p+2)th image 180833.

When the typical luminance of the images is measured, whether display is made close to pseudo impulse display or not can be judged. For example, if $L_c<L$ is satisfied when luminance measured in the first region 180834 is denoted by L and luminance measured in the second region 180835 is denoted by $L_c$, it can be said that display is made close to pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 180834 and the second region 180835 can be the ratio of lower luminance to higher luminance; relative luminance between the second region 180835 and the third region 180836 can be the ratio of lower luminance to higher luminance; and relative luminance between the first region 180834 and the third region 180836 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

FIG. 72E shows a measurement method in the luminance measurement regions shown in FIGS. 72A to 72D. A region 180841 is a focused luminance measurement region, and a point 180842 is a luminance measurement point in the region 180841. In a luminance measurement apparatus having high time resolution, a measurement range thereof is small in some cases. Therefore, in the case where the region 180841 is large, unlike the case of measuring the whole region, a plurality of points in the region 180841 may be measured uniformly by dots and an average value thereof may be the luminance of the region 18084, as shown in FIG. 72E.

Note that in the case where the image is formed using combination of three primary colors of R, G, and B, luminance to be measured may be luminance of R, G, and B, luminance of R and G, luminance of G and B, luminance of B and R, or each luminance of R, G, and B.

Next, a method for producing an image in an intermediate state by detecting movement of an image, which is included in input image data, and a method for controlling a driving method in accordance with movement of an image, which is included in input image data, or the like are described.

Figure 73A:
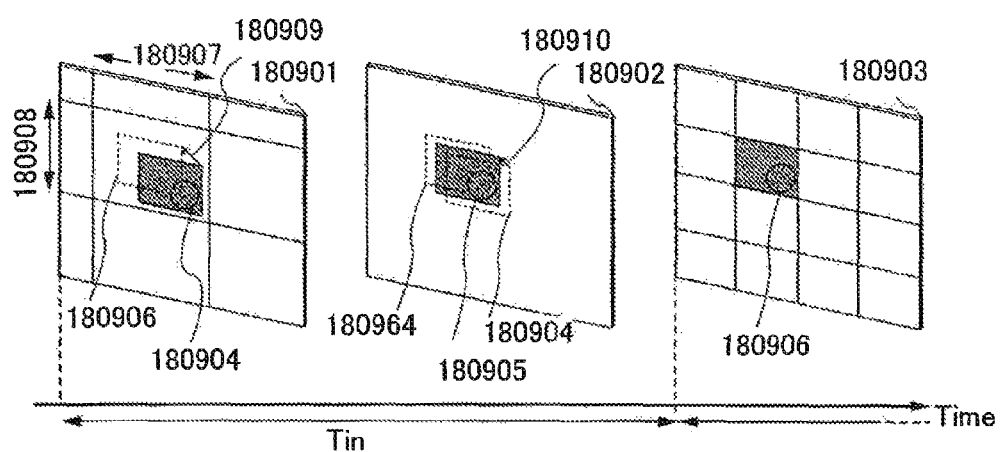
FIGS. 73A and 73B each illustrate the present invention.

A method for producing an image in an intermediate state by detecting movement of an image, which is included in input image data, is described with reference to FIGS. 73A and 73B. FIG. 73A shows the case where the display frame rate is twice as high as the input frame rate (the conversion ratio is 2). FIG. 73A schematically shows a method for detecting movement of an image with time represented by the horizontal axis. The period $T_{in}$ shows a cycle of input image data; an image 180901 is the p-th image; an image 180902 is the (p+1)th image; and an image 180903 is the (p+2)th image. Further, as regions which are independent of time, a first region 180904, a second region 180905, and a third region 180906 are provided in images.

First, in the (p+2)th image 180903, the image is divided into a plurality of tiled regions, and image data in the third region 180906 which is one of the regions is focused.

Next, in the p-th image 180901, a region which uses the third region 180906 as the center and is larger than the third region 180906 is focused. Here, the region which uses the third region 180906 as the center and is larger than the third region 180906 corresponds to a data retrieval region. In the data retrieval region, a range in a horizontal direction (an X direction) is denoted by 180907 and a range in a perpendicular direction (a Y direction) is denoted by 180908. Note that the range in the horizontal direction 180907 and the range in the perpendicular direction 180908 may be ranges in which each of a range in a horizontal direction and a range in a perpendicular direction of the third region 180906 is enlarged by approximately 15 pixels.

Then, in the data retrieval region, a region having image data which is most similar to the image data in the third region 180906 is retrieved. As a retrieval method, a least-squares method or the like can be used. As a result of retrieval, it is assumed that the first region 180904 be derived as the region having the most similar image data.

Next, as an amount which shows positional difference between the derived first region 180904 and the third region 180906, a vector 180909 is derived. Note that the vector 180909 is referred to as a motion vector.

Then, in the (p+1)th image 180902, the second region 180905 is formed by a vector calculated from the motion vector 180909, the image data in the third region 180906 in the (p+2)th image 180903, and image data in the first region 180904 in the p-th image 180901.

Here, the vector calculated from the motion vector 180909 is referred to as a displacement vector 180910. The displacement vector 180910 has a function of determining a position in which the second region 180905 is formed. The second region 180905 is formed in a position which is apart from the third region 180906 by the displacement vector 180910. Note that the amount of the displacement vector 180910 may be an amount which is obtained by multiplying the motion vector 180909 by a coefficient (1/2).

Image data in the second region 180905 in the (p+1)th image 180902 may be determined by the image data in the third region 180906 in the (p+2)th image 180903 and the image data in the first region 180904 in the p-th image

180901. For example, the image data in the second region 180905 in the (p+1)th image 180902 may be an average value between the image data in the third region 180906 in the (p+2)th image 180903 and the image data in the first region 180904 in the p-th image 180901.

In this manner, the second region 180905 in the (p+1)th image 180902, which corresponds to the third region 180906 in the (p+2)th image 180903, can be formed. Note that when the above-described treatment is also performed on other regions in the (p+2)th image 180903, the (p+1)th image 180902 which is made to be in an intermediate state between the (p+2)th image 180903 and the p-th image 180901 can be formed.

Figure 73B:
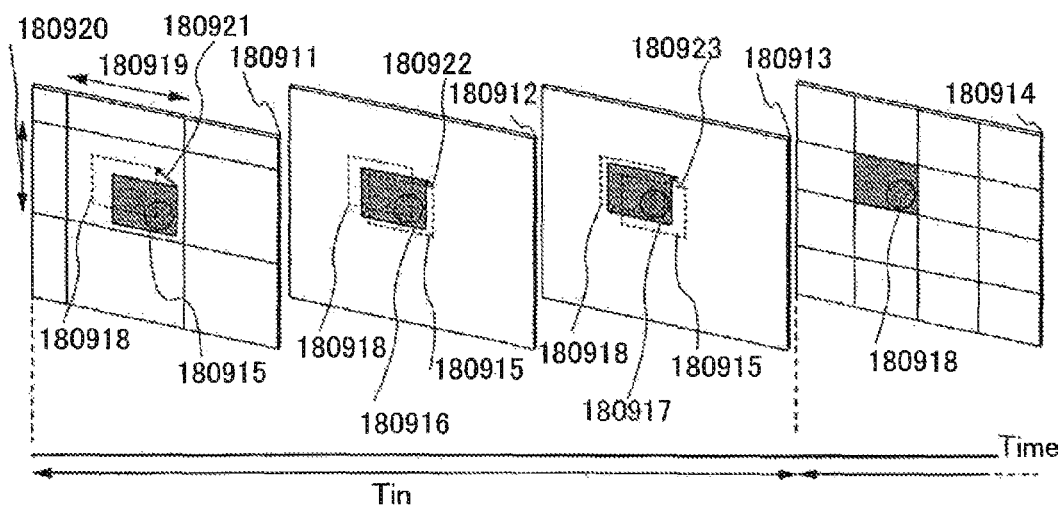

FIG. 73B shows the case where the display frame rate is three times as high as the input frame rate (the conversion ratio is 3). FIG. 73B schematically shows a method for detecting movement of an image with time represented by the horizontal axis. The period $T_{in}$ shows a cycle of input image data; an image 180911 is the p-th image; an image 180912 is the (p+1)th image; an image 180913 is the (p+2)th image; and an image 180914 is the (p+3)th image. Further, as regions which are independent of time, a first region 180915, a second region 180916, a third region 180917, and a fourth region 180918 are provided in images.

First, in the (p+3)th image 180914, the image is divided into a plurality of tiled regions, and image data in the fourth region 180918 which is one of the regions is focused.

Next, in the p-th image 180911, a region which uses the fourth region 180918 as the center and is larger than the fourth region 180918 is focused. Here, the region which uses the fourth region 180911 as the center and is larger than the fourth region 180918 corresponds to a data retrieval region. In the data retrieval region, a range in a horizontal direction (an X direction) is denoted by 180919 and a range in a perpendicular direction (a Y direction) is denoted by 180920. Note that the region in the horizontal direction 180919 and the range in the perpendicular direction 180920 may be ranges in which each of a range in a horizontal direction and a range in a perpendicular direction of the fourth region 180918 is enlarged by approximately 15 pixels.

Then, in the data retrieval region, a region having image data which is most similar to the image data in the fourth region 180918 is retrieved. As a retrieval method, a least-squares method or the like can be used. As a result of retrieval, it is assumed that the first region 180915 be derived as the region having the most similar image data.

Next, as an amount which shows positional difference between the derived first region 180915 and the fourth region 180918, a vector is derived. Note that the vector is referred to as a motion vector 180921.

Then, in each of the (p+1)th image 180912 and the (p+2)th image 180913, the second region 1809016 and the third region 180917 are formed by a first vector and a second vector calculated from the motion vector 180921, the image data in the fourth region 180918 in the (p+3)th image 180914, and image data in the first region 180915 in the p-th image 180911.

Here, the first vector calculated from the motion vector 180921 is referred to as a first displacement vector 180922. In addition, the second vector is referred to as a second displacement vector 180923. The first displacement vector 180922 has a function of determining a position in which the second region 180916 is formed. The second region 180916 is formed in a position which is apart from the fourth region 180918 by the first displacement vector 180922. Note that the first displacement vector 180922 may be an amount which is obtained by multiplying the motion vector 180921 by a coefficient (1/3). Further, the second displacement vector 180923 has a function of determining a position in which the third region 180917 is formed. The third region 180917 is formed in a position which is apart from the fourth region 180918 by the second displacement vector 180923. Note that the second displacement vector 180923 may be an amount which is obtained by multiplying the motion vector by a coefficient (2/3).

Image data in the second region 180916 in the (p+1)th image 180912 may be determined by the image data in the fourth region 180918 in the (p+3)th image 180914 and the image data in the first region 180915 in the p-th image 180911. For example, the image data in the second region 180916 in the (p+1)th image 180912 may be an average value between the image data in the fourth region 180918 in the (p+3)th image 180914 and the image data in the first region 180915 in the p-th image 180911.

Image data in the third region 180917 in the (p+2)th image 180913 may be determined by the image data in the fourth region 180918 in the (p+3)th image 180914 and the image data in the first region 180915 in the p-th image 180911. For example, the image data in the third region 180917 in the (p+2)th image 180913 may be an average value between the image data in the fourth region 180918 in the (p+3)th image 180914 and the image data in the first region 180915 in the p-th image 180911.

In this manner, the second region 180916 in the (p+1)th image 180912 and the third region 180917 in the (p+2)th image 180913 which correspond to the fourth region 180918 in the (p+3)th image 180914 can be formed. Note that when the above-described treatment is also performed on other regions in the (p+3)th image 180914, the (p+1)th image 180912 and the (p+2)th image 180913 which are made to be in an intermediate state between the (p+3)th image 180914 and the p-th image 180911 can be formed.

Figure 74A:
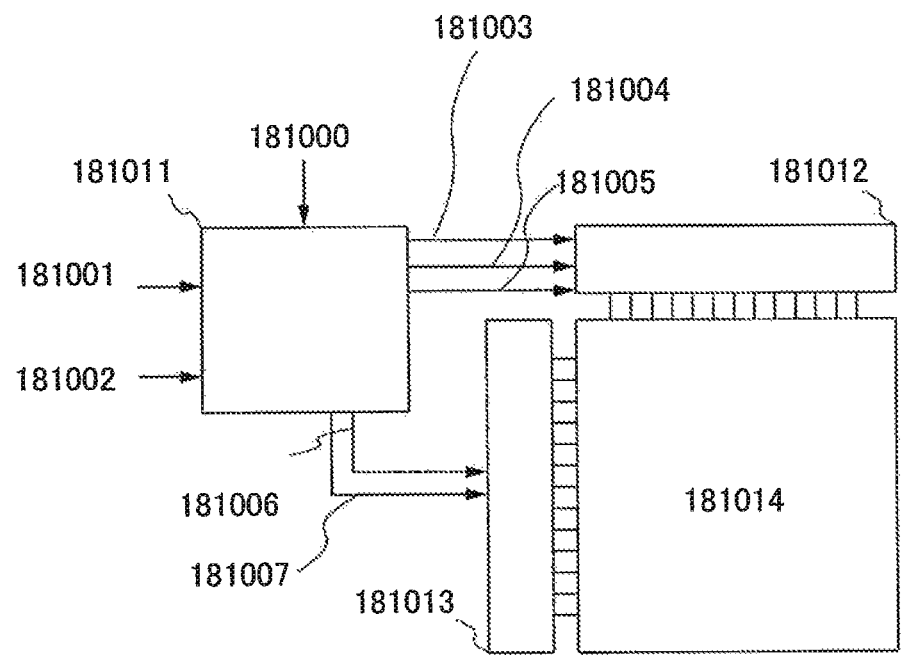
FIGS. 74A to 74D each illustrate the present invention.
Figure 74B:
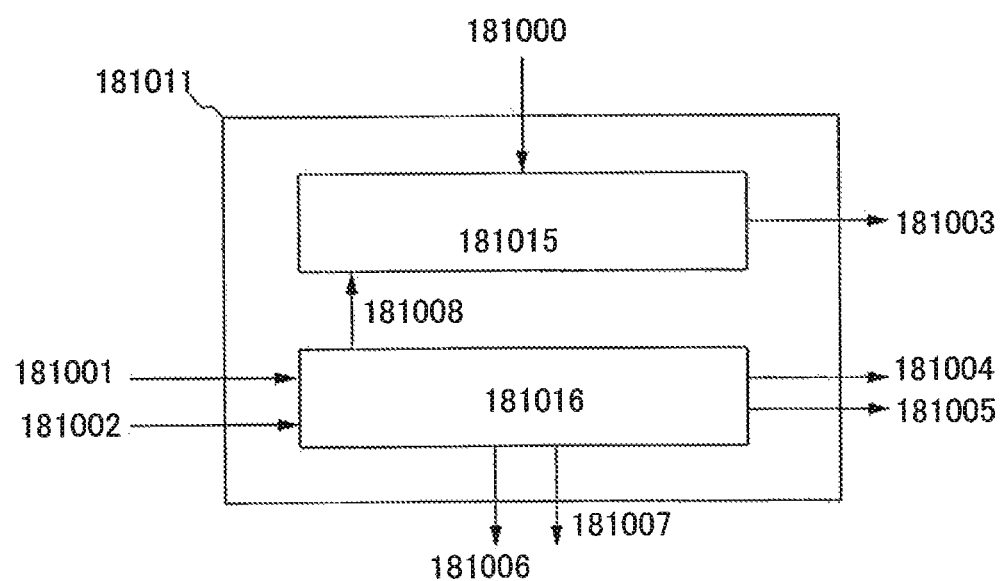
Figure 74C:
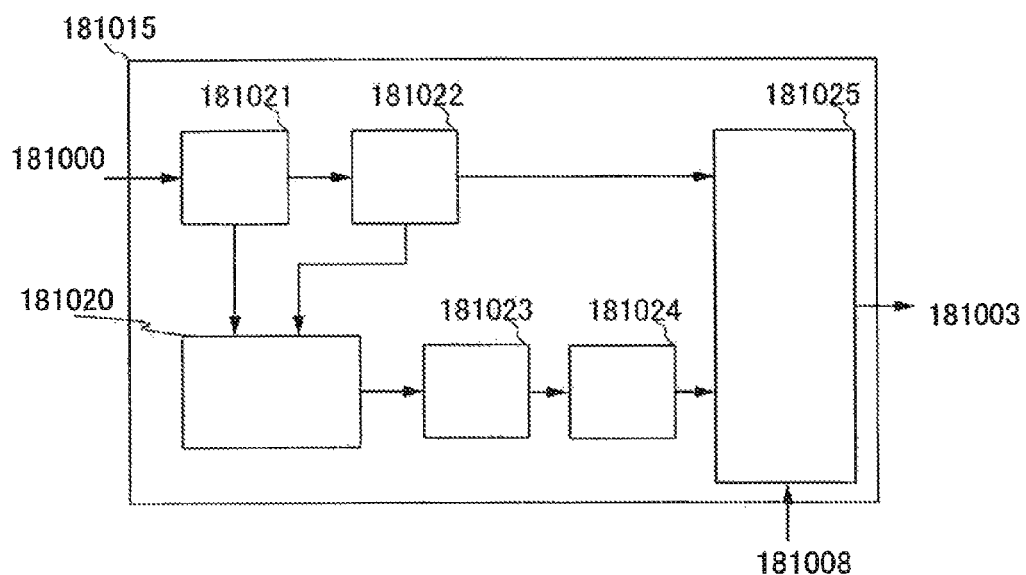
Figure 74D:
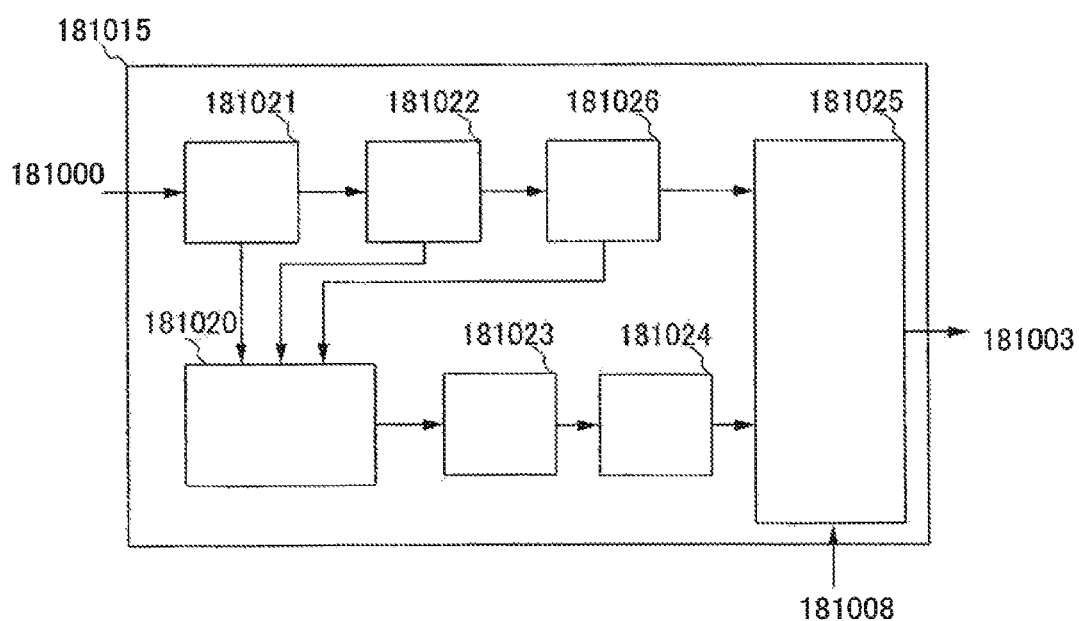

Next, an example of a circuit which produces an image in an intermediate state by detecting movement of an image, which is included in input image data, is described with reference to FIGS. 74A to 74D. FIG. 74A shows a connection relation between a peripheral driver circuit including a source driver and a gate driver for displaying an image on a display region, and a control circuit for controlling the peripheral driver circuit. FIG. 74B shows an example of a specific circuit structure of the control circuit. FIG. 74C shows an example of a specific circuit structure of an image processing circuit included in the control circuit. FIG. 74D shows another example of the specific circuit structure of the image processing circuit included in the control circuit.

As shown in FIG. 74A, a device in this embodiment mode may include a control circuit 181011, a source driver 181012, a gate driver 181013, and a display region 181014.

Note that the control circuit 181011, the source driver 181012, and the gate driver 181013 may be formed over the same substrate as the display region 181014.

Note that part of the control circuit 181011, the source driver 181012, and the gate driver 181013 may be formed over the same substrate as the display region 181014, and other circuits may be formed over a different substrate from that of the display region 181014. For example, the source driver 181012 and the gate driver 181013 may be formed over the same substrate as the display region 181014, and the control circuit 181011 may be formed over a different substrate as an external IC. Similarly, the gate driver 181013 may be formed over the same substrate as the display region 181014, and other circuits may be formed over a different substrate as an external IC. Similarly, part of the source driver 181012, the gate driver 181013, and the control circuit 181011 may be formed over the same substrate as the display region 181014, and other circuits may be formed over a different substrate as an external IC.

The control circuit 181011 may have a structure to which an external image signal 181000, a horizontal synchronization signal 181001, and a vertical synchronization signal 181002 are input and an image signal 181003, a source start pulse 181004, a source clock 181005, a gate start pulse 181006, and a gate clock 181007 are output.

The source driver 181012 may have a structure in which the image signal 181003, the source start pulse 181004, and the source clock 181005 are input and voltage or current in accordance with the image signal 181003 is output to the display region 181014.

The gate driver 181013 may have a structure to which the gate start pulse 181006 and the gate clock 181007 are input and a signal which specifies timing for writing a signal output from the source driver 181012 to the display region 181014 is output.

In the case where frequency of the external image signal 181000 is different from frequency of the image signal 181003, a signal for controlling timing for driving the source driver 181012 and the gate driver 181013 is also different from frequency of the horizontal synchronization signal 181001 and the vertical synchronization signal 181002 which are input. Therefore, in addition to processing of the image signal 181003, it is necessary to process the signal for controlling timing for driving the source driver 181012 and the gate driver 181013. The control circuit 181011 may have a function of processing the signal for controlling timing for driving the source driver 181012 and the gate driver 181013. For example, in the case where the frequency of the image signal 181003 is twice as high as the frequency of the external image signal 181000, the control circuit 181011 generates the image signal 181003 having twice frequency by interpolating an image signal included in the external image signal 181000 and controls the signal for controlling timing so that the signal also has twice frequency.

Further, as shown in FIG. 74B, the control circuit 181011 may include an image processing circuit 181015 and a timing generation circuit 181016.

The image processing circuit 181015 may have a structure to which the external image signal 181000 and a frequency control signal 181008 are input and the image signal 181003 is output.

The timing generation circuit 181016 may have a structure to which the horizontal synchronization signal 181001 and the vertical synchronization signal 181002 are input, and the source start pulse 181004, the source clock 181005, the gate start pulse 181006, the gate clock 181007, and the frequency control signal 181008 are output. Note that the timing generation circuit 181016 may have a memory, a register, or the like for holding data for specifying the state of the frequency control signal 181008. Alternatively, the timing generation circuit 181016 may have a structure to which a signal for specifying the state of the frequency control signal 181008 is input from outside.

As shown in FIG. 74C, the image processing circuit 181015 may include a motion detection circuit 181020, a first memory 181021, a second memory 181022, a third memory 181023, a luminance control circuit 181024, and a high-speed processing circuit 181025.

The motion detection circuit 181020 may have a structure in which a plurality of pieces of image data are input, movement of an image is detected, and image data which is in an intermediate state of the plurality of pieces of image data is output.

The first memory 181021 may have a structure in which the external image signal 181000 is input, the external image signal 181000 is held for a certain period, and the external image signal 181000 is output to the motion detection circuit 181020 and the second memory 181022.

The second memory 181022 may have a structure in which image data output from the first memory 181021 is input, the image data is held for a certain period, and the image data is output to the motion detection circuit 181020 and the high-speed processing circuit 181025.

The third memory 181023 may have a structure in which image data output from the motion detection circuit 181020 is input, the image data is held for a certain period, and the image data is output to the luminance control circuit 181024.

The high-speed processing circuit 181025 may have a structure in which image data output from the second memory 181022, image data output from the luminance control circuit 181024, and a frequency control signal 181008 are input and the image data is output as the image signal 181003.

In the case where the frequency of the external image signal 181000 is different from the frequency of the image signal 181003, the image signal 181003 may be generated by interpolating the image signal included in the external image signal 181000 by the image processing circuit 181015. The input external image signal 181000 is once held in the first memory 181021. At that time, image data which is input in the previous frame is held in the second memory 181022. The motion detection circuit 181020 may read the image data held in the first memory 181021 and the second memory 181022 as appropriate to detect a motion vector by difference between the both pieces of image data and to generate image data in an intermediate state. The generated image data in an intermediate state is held in the third memory 181023.

When the motion detection circuit 181020 generates the image data in an intermediate state, the high-speed processing circuit 181025 outputs the image data held in the second memory 181022 as the image signal 181003. After that, the image data held in the third memory 181023 is output through the luminance control circuit 181024 as the image signal 181003. At this time, frequency which is updated by the second memory 181022 and the third memory 181023 is the same as the external image signal 181000; however, the frequency of the image signal 181003 which is output through the high-speed processing circuit 181025 may be different from the frequency of the external image signal 181000. Specifically, for example, the frequency of the image signal 181003 is 1.5 times, twice, or three times as high as the frequency of the external image signal 181000. However, the present invention is not limited to this, and a variety of frequency can be used. Note that the frequency of the image signal 181003 may be specified by the frequency control signal 181008.

The structure of the image processing circuit 181015 shown in FIG. 74D is obtained by adding a fourth memory 181026 to the structure of the image processing circuit 181015 shown in FIG. 74C. When image data output from the fourth memory 181026 is also output to the motion detection circuit 181020 in addition to the image data output from the first memory 181021 and the image data output from the second memory 181022 in this manner, movement of an image can be detected adequately.

Note that in the case where image data to be input has already included a motion vector for data compression or the like, for example, the image data to be input is image data which is based on an MPEG (moving picture expert group) standard, an image in an intermediate state may be generated as an interpolated image by using this image data. At this time, a portion which generates a motion vector included in the motion detection circuit 181020 is not necessary. Further, since encoding and decoding processing of the image signal 181003 is simplified, power consumption can be reduced.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 6)

In this embodiment mode, a peripheral portion of a liquid crystal panel is described.

Figure 75:
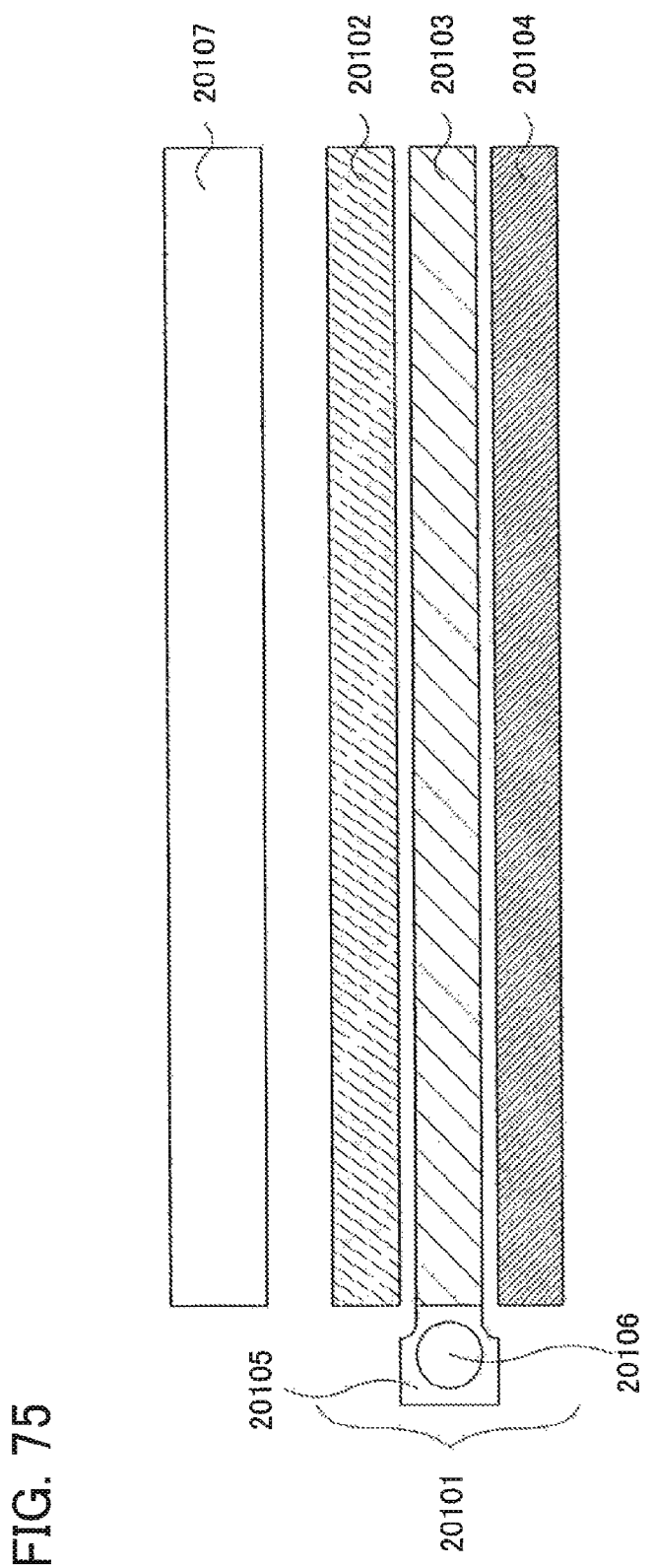
FIG. 75 illustrates the present invention.

FIG. 75 shows an example of a liquid crystal display device including a so-called edge-light type backlight unit 20101 and a liquid crystal panel 20107. An edge-light type corresponds to a type in which a light source is provided at an end of a backlight unit and fluorescence of the light source is emitted from the entire light-emitting surface. The edge-light type backlight unit is thin and can save power.

The backlight unit 20101 includes a diffusion plate 20102, a light guide plate 20103, a reflection plate 20104, a lamp reflector 20105, and a light source 20106.

The light source 20106 has a function of emitting light as necessary. For example, as the light source 20106, a cold cathode fluorescent lamp, a hot cathode fluorescent lamp, a light-emitting diode, an inorganic EL element, an organic EL element, or the like is used. The lamp reflector 20105 has a function of efficiently guiding fluorescence from the light source 20106 to the light guide plate 20103. The light guide plate 20103 has a function of guiding light to the entire surface by total reflection of fluorescence. The diffusion plate 20102 has a function of reducing variations in brightness. The reflection plate 20104 has a function of reflecting light which is leaked from the light guide plate 20103 downward (a direction which is opposite to the liquid crystal panel 20107) to be reused.

Note that a control circuit for controlling luminance of the light source 20106 is connected to the backlight unit 20101. When this control circuit is used, luminance of the light source 20106 can be controlled.

FIGS. 76A to 76D each show a detailed structure of the edge-light type backlight unit. Note that description of a diffusion plate, a light guide plate, a reflection plate, and the like is omitted.

Figure 76A:
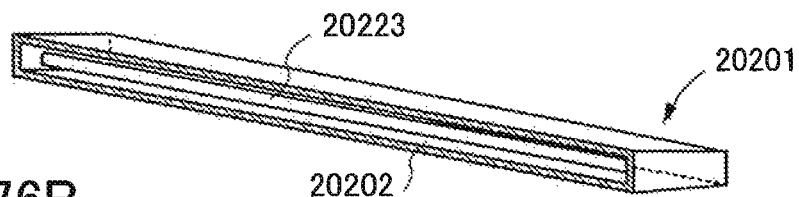
FIGS. 76A to 76D each illustrate the present invention.

A backlight unit 20201 shown in FIG. 76A has a structure in which a cold cathode fluorescent lamp 20203 is used as a light source. In addition, a lamp reflector 20202 is provided to efficiently reflect light from the cold cathode fluorescent lamp 20203. Such a structure is often used for a large display device because luminance of light from the cold cathode fluorescent lamp 20203 is high.

Figure 76B:
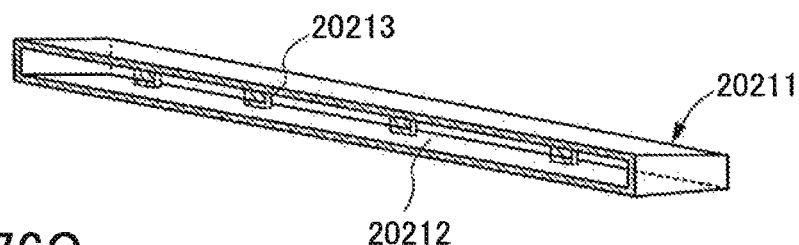

A backlight unit 20211 shown in FIG. 76B has a structure in which light-emitting diodes (LEDs) 20213 are used as light sources. For example, the light-emitting diodes (LEDs) 20213 which emit white light are provided at a predetermined interval. In addition, a lamp reflector 20212 is provided to efficiently reflect light from the light-emitting diodes (LEDs) 20213.

Since luminance of light-emitting diodes is high, a structure using light-emitting diodes is suitable for a large display device. Since light-emitting diodes are superior in color reproductivity, an image which is closer to the real object can be displayed. Since the size of chips of LEDs is small, the arrangement area can be reduced. Therefore, a frame of a display device can be narrowed.

Note that in the case where light-emitting diodes are mounted on a large display device, the light-emitting diodes can be provided on a back side of the substrate. The light-emitting diodes of R, G, and B are sequentially provided at a predetermined interval. When the light-emitting diodes are provided, color reproductivity can be improved.

Figure 76C:
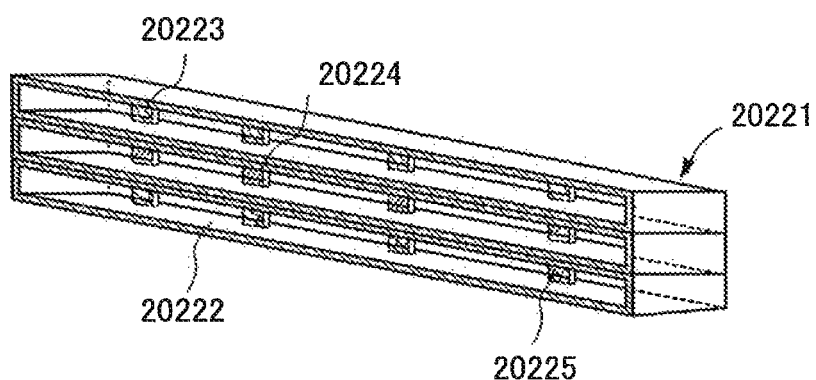

A backlight unit 20221 shown in FIG. 76C has a structure in which light-emitting diodes (LEDs) 20223, light-emitting diodes (LEDs) 20224, and light-emitting diodes (LEDs) 20225 of R, G, and B are used as light sources. The light-emitting diodes (LEDs) 20223, the light-emitting diodes (LEDs) 20224, and the light-emitting diodes (LEDs) 20225 of R, G, and B are each provided at a predetermined interval. When the light-emitting diodes (LEDs) 20223 are used, the light-emitting diodes (LEDs) 20224, and the light-emitting diodes (LEDs) 20225 of R, G, and B, color reproductivity can be improved. In addition, a lamp reflector 20222 is provided to efficiently reflect light from the light-emitting diodes.

Since luminance of light-emitting diodes is high, a structure in which light-emitting diodes of R, G, and B are used as light sources is suitable for a large display device. Since light-emitting diodes are superior in color reproductivity, an image which is closer to the real object can be displayed. Since the size of chips of LEDs is small, the arrangement area can be reduced. Therefore, a frame of a display device can be narrowed.

When the light-emitting diodes of R, G, and B are made sequentially emit light in accordance with time, color display can be performed. This is a so-called field sequential mode.

Note that a light-emitting diode which emits white light can be combined with the light-emitting diodes (LEDs) 20223, the light-emitting diodes (LEDs) 20224, and the light-emitting diodes (LEDs) 20225 of R, G, and B.

Note that in the case where light-emitting diodes are mounted on a large display device, the light-emitting diodes can be provided on a back side of the substrate. The light-emitting diodes of R, G, and B are sequentially provided at a predetermined interval. When the light-emitting diodes are provided, color reproducibility can be improved.

Figure 76D:
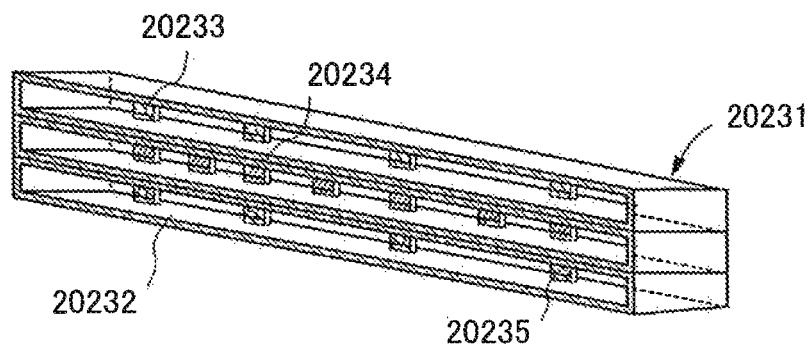

A backlight unit 20231 shown in FIG. 76D has a structure in which light-emitting diodes (LEDs) 20233, light-emitting diodes (LEDs) 20234, and light-emitting diodes (LEDs) 20235 of R, G, and B are used as light sources. For example, among the light-emitting diodes (LEDs) 20233, the light-emitting diodes (LEDs) 20234, and the light-emitting diodes (LEDs) 20235 of R, G, and B, a plurality of the light-emitting diodes of a color with low emission intensity (e.g., green) are provided. By using the light-emitting diodes (LEDs) 20233, the light-emitting diodes (LEDs) 20234, and the light-emitting diodes (LEDs) 20235 of R, G, and B, color reproductivity can be improved. In addition, a lamp reflector 20232 is provided to efficiently reflect light from the light-emitting diodes.

Since luminance of light-emitting diodes is high, a structure in which light-emitting diodes of R, G, and B are used as light sources is suitable for a large display device. Since light-emitting diodes are superior in color reproducibility, an image which is closer to the real object can be displayed. Since the size of chips of LEDs is small, the arrangement area can be reduced. Therefore, a frame of a display device can be narrowed.

When the light-emitting diodes of R, G, and B are made sequentially emit light in accordance with time, color display can be performed. This is a so-called field sequential mode.

Note that a light-emitting diode which emits white light can be combined with the light-emitting diodes (LEDs) 20233, the light-emitting diodes (LEDs) 20234, and the light-emitting diodes (LEDs) 20235 of R, G, and B.

Note that in the case where light-emitting diodes are mounted on a large display device, the light-emitting diodes can be provided on a back side of the substrate. The light-emitting diodes of R, G, and B are sequentially provided at a predetermined interval. When the light-emitting diodes are provided, color reproducibility can be improved.

FIG. 79A shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20500 includes a diffusion plate 20501, a light-shielding plate 20502, a lamp reflector 20503, and a light source 20504.

Light emitted from the light source 20504 is gathered on one surface of the backlight unit 20500 by the lamp reflector 20503. That is, the backlight unit has a surface on which light is emitted intensely and a surface on which light is hardly emitted. At this time, when a liquid crystal panel 20505 is provided on the side of the surface of the backlight unit 20500, on which light is emitted intensely, light emitted from the light source 20504 can be efficiently delivered to the liquid crystal panel 20505.

The light source 20504 has a function of emitting light as necessary. For example, as the light source 20504, a cold cathode fluorescent lamp, a hot cathode fluorescent lamp, a light-emitting diode, an inorganic EL element, an organic EL element, or the like is used. The lamp reflector 20503 has a function of efficiently guiding fluorescence from the light source 20504 to the diffusion plate 20501 and the light-shielding plate 20502. The light-shielding plate 20502 has a function of reducing variations in brightness by shielding much light as light becomes intenser in accordance with provision of the light source 20504. The diffusion plate 20501 also has a function of reducing variations in brightness.

A control circuit for controlling luminance of the light source 20504 is connected to the backlight unit 20500. When this control circuit is used, luminance of the light source 20504 can be controlled.

FIG. 79B shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20510 includes a diffusion plate 20511; a light-shielding plate 20512; a lamp reflector 20513; and a light source (R) 20514a, a light source (G) 20514b, and a light source (B) 20514c of R, G, and B.

Light emitted from the light source (R) 20514a, the light source (G) 20514b, and the light source (B) 20514c is gathered on one surface of the backlight unit 20510 by the lamp reflector 20513. That is, the backlight unit has a surface on which light is emitted intensely and a surface on which light is hardly emitted. At this time, when a liquid crystal panel 20515 is provided on the side of the surface of the backlight unit 20510, on which light is emitted intensely, light emitted from the light source (R) 20514a, the light source (G) 20514b, and the light source (B) 20514c can be efficiently delivered to the liquid crystal panel 20515.

Each of the light source (R) 20514a, the light source (G) 20514b, and the light source (B) 20514c of R, G, and B has a function of emitting light as necessary. For example, as each of the light source (R) 20514a, the light source (G) 20514b, and the light source (B) 20514c, a cold cathode fluorescent lamp, a hot cathode fluorescent lamp, a light-emitting diode, an inorganic EL element, an organic EL element, or the like is used. The lamp reflector 20513 has a function of efficiently guiding fluorescence from the light sources 20514a to 20514c to the diffusion plate 20511 and the light-shielding plate 20512. The light-shielding plate 20512 has a function of reducing variations in brightness by shielding much light as light becomes intenser in accordance with provision of the light sources 20514a to 20514c. The diffusion plate 20511 also has a function of reducing variations in brightness.

A control circuit for controlling luminance of the light source (R) 20514a, the light source (G) 20514b, and the light source (B) 20514c of R, G, and B is connected to the backlight unit 20510. When this control circuit is used, luminance of the light source (R) 20514a, the light source (G) 20514b, and the light source (B) 20514c of R, G, and B can be controlled.

Figure 77:
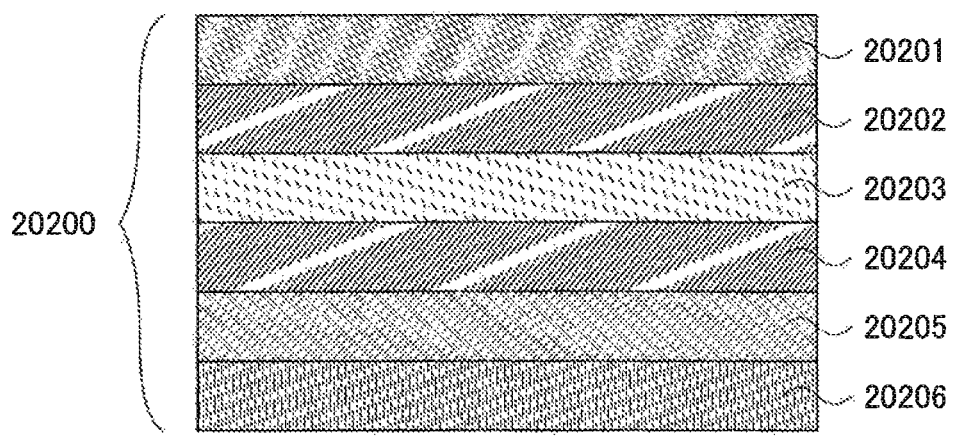
FIG. 77 illustrates the present invention.

FIG. 77 shows an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a mold release film 20306.

The PVA polarizing film 20303 has a function of generating light in only a certain vibration direction (linear polarized light). Specifically, the PVA polarizing film 20303 includes molecules (polarizers) in which lengthwise electron density and widthwise electron density are greatly different from each other. The PVA polarizing film 20303 can generate linear polarized light by uniforming directions of the molecules in which lengthwise electron density and widthwise electron density are greatly different from each other.

For example, a high molecular film of poly vinyl alcohol is doped with an iodine compound and a PVA film is pulled in a certain direction, so that a film in which iodine molecules are aligned in a certain direction can be obtained as the PVA polarizing film 20303. Then, light which is parallel to a major axis of the iodine molecule is absorbed by the iodine molecule. Note that a dichroic dye may be used instead of iodine for high durability use and high heat resistance use. Note that it is preferable that the dye be used for a liquid crystal display device which needs to have durability and heat resistance, such as an in-car LCD or an LCD for a projector.

When the PVA polarizing film 20303 is sandwiched by films to be base materials (the substrate film 20302 and the substrate film 20304) from both sides, reliability can be improved. Note that the PVA polarizing film 20303 may be sandwiched by triacetylcellulose (TAC) films with high light-transmitting properties and high durability. Note that each of the substrate films and the TAC films function as protective films of polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The mold release film 20306 (a separate film) is provided to the adhesive layer 20305.

The protective film 20301 is provided to the other of the substrates films (the substrate film 20302).

A hard coating scattering layer (an anti-glare layer) may be provided on a surface of the polarizing film 20300. Since the surface of the hard coating scattering layer has minute unevenness formed by AG treatment and has an anti-glare function which scatters external light, reflection of external light in the liquid crystal panel can be prevented. Surface reflection can also be prevented.

Note that treatment in which plurality of optical thin film layers having different refractive indexes are layered (also referred to as anti-reflection treatment or AR treatment) may be performed on the surface of the polarizing film 20300. The plurality of layered optical thin film layers having different refractive indexes can reduce reflectivity on the surface by an interference effect of light.

Figure 78A:
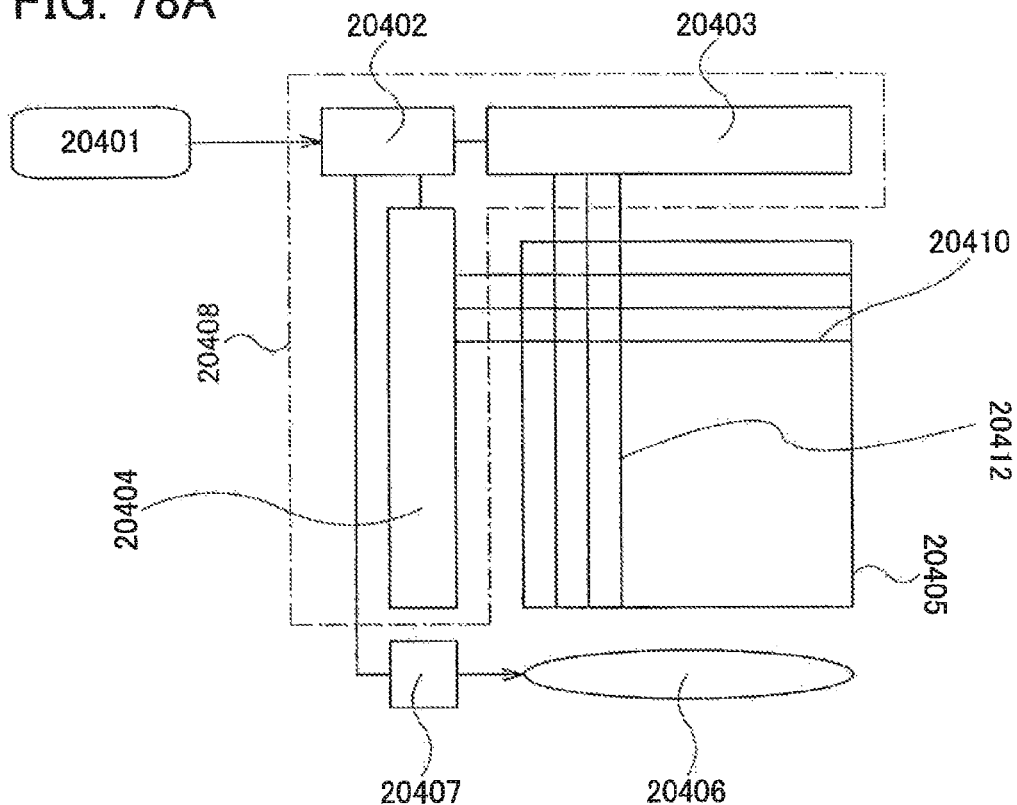
FIGS. 78A to 78C each illustrate the present invention.
Figure 78B:
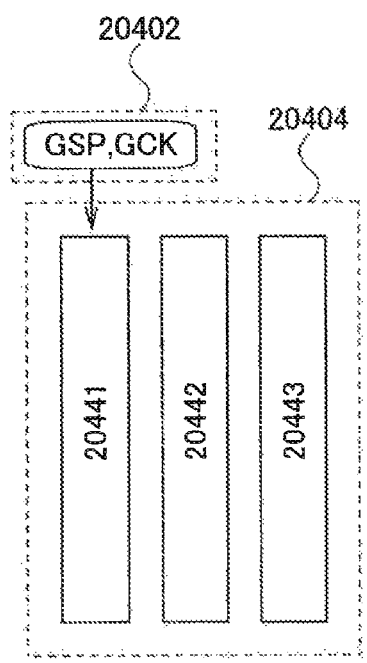
Figure 78C:
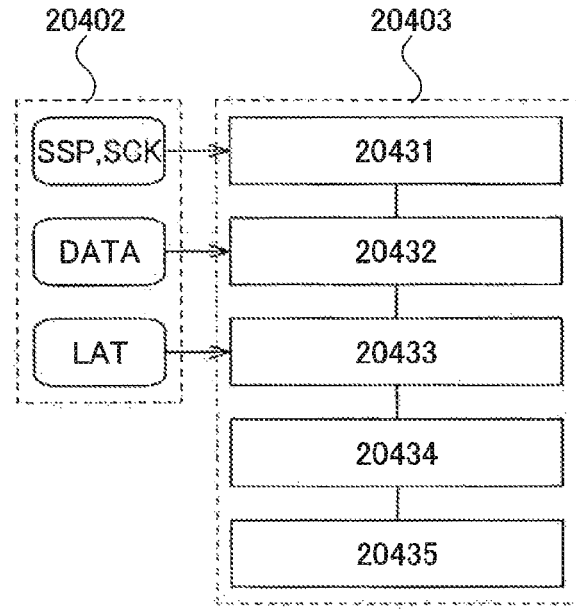

FIGS. 78A to 78C each show an example of a system block of the liquid crystal display device.

In a pixel portion 20405, signal lines 20412 which extend from a signal line driver circuit 20403 are provided. In addition, in the pixel portion 20405, scan lines 20410 which extend from a scan line driver circuit 20404 are also provided. In addition, a plurality of pixels are arranged in matrix in cross regions of the signal lines 20412 and the scan lines 20410. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active matrix type. Note that the present invention is not limited to such an active matrix type and a structure of a passive matrix type may be used. Since the passive matrix type does not have a switching element in each pixel, a process is simple.

A driver circuit portion 20408 includes a control circuit 20402, the signal line driver circuit 20403, and the scan line driver circuit 20404. An image signal 20401 is input to the control circuit 20402. The signal line driver circuit 20403 and the scan line driver circuit 20404 are controlled by the control circuit 20402 in accordance with this image signal 20401. That is, the control circuit 20402 inputs a control signal to each of the signal line driver circuit 20403 and the scan line driver circuit 20404. Then, in accordance with this control signal, the signal line driver circuit 20403 inputs a video signal to each of the signal lines 20412 and the scan line driver circuit 20404 inputs a scan signal to each of the scan lines 20410. Then, the switching element included in the pixel is selected in accordance with the scan signal and the video signal is input to a pixel electrode of the pixel.

Note that the control circuit 20402 also controls a power source 20407 in accordance with the image signal 20401. The power source 20407 includes a unit for supplying power to a lighting unit 20406. As the lighting unit 20406, an edge-light type backlight unit or a direct-type backlight unit can be used. Note that a front light may be used as the lighting unit 20406. A front light corresponds to a plate-like lighting unit including a luminous body and a light conducting body, which is attached to the front surface side of a pixel portion and illuminates the whole area. When such a lighting unit is used, the pixel portion can be uniformly illuminated at low power consumption.

As shown in FIG. 78B, the scan line driver circuit 20404 includes a shift register 20441, a level shifter 20442, and a circuit functioning as a buffer 20443. A signal such as a gate start pulse (GSP) or a gate clock signal (GCK) is input to the shift register 20441.

As shown in FIG. 78C, the signal line driver circuit 20403 includes a shift register 20431, a first latch 20432, a second latch 20433, a level shifter 20434, and a circuit functioning as a buffer 20435. The circuit functioning as the buffer 20435 corresponds to a circuit which has a function of amplifying a weak signal and includes an operational amplifier or the like. A signal such as a source start pulse (SSP) is input to the level shifter 20434 and data (DATA) such as a video signal is input to the first latch 20432. A latch (LAT) signal can be temporally held in the second latch 20433 and is simultaneously input to the pixel portion 20405. This is referred to as line sequential driving. Therefore, when a pixel is used in which not line sequential driving but dot sequential driving is performed, the second latch can be omitted.

Note that in this embodiment mode, a known liquid crystal panel can be used for the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, a counter electrode, an alignment film, or the like is provided on the other of the substrates. A polarizing plate or a retardation plate may be provided on the surface opposite to a top surface of the other of the substrates. The color filter and the black matrix may be formed over the top surface of the one of the substrates. Note that three-dimensional display can be performed by providing a slit (a grid) on the top surface side of the one of the substrates or the surface opposite to the top surface side of the one of the substrates.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 7)

In this embodiment mode, a pixel structure and an operation of a pixel which can be applied to a liquid crystal display device are described.

In this embodiment mode, as an operation mode of a liquid crystal element, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Figure 131A:
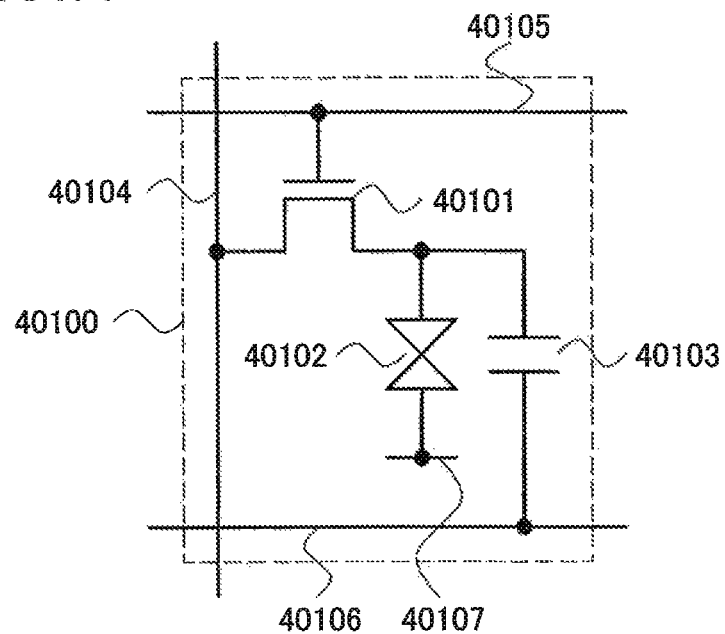
FIGS. 131A and 131B each illustrate the present invention.

FIG. 131A shows an example of a pixel structure which can be applied to the liquid crystal display device.

A pixel 40100 includes a transistor 40101, a liquid crystal element 40102, and a capacitor 40103. A gate of the transistor 40101 is connected to a wiring 40105. A first terminal of the transistor 40101 is connected to a wiring 40104. A second terminal of the transistor 40101 is connected to a first electrode of the liquid crystal element 40102 and a first electrode of the capacitor 40103. A second electrode of the liquid crystal element 40102 corresponds to a counter electrode 40107. A second electrode of the capacitor 40103 is connected to a wiring 40106.

The wiring 40104 functions as a signal line. The wiring 40105 functions as a scan line. The wiring 40106 functions as a capacitor line. The transistor 40101 functions as a switch. The capacitor 40103 functions as a storage capacitor.

It is acceptable as long as the transistor 40101 functions as a switch, and the transistor 40101 may be either a P-channel transistor or an N-channel transistor.

A video signal is input to the wiring 40104. A scan signal is input to the wiring 40105. A constant potential is supplied to the wiring 40106. Note that the scan signal is an H-level or L-level digital voltage signal. In the case where the transistor 40101 is an N-channel transistor, an H level of the scan signal is a potential which can turn on the transistor 40101 and an L level of the scan signal is a potential which can turn off the transistor 40101. Alternatively, in the case where the transistor 40101 is a P-channel transistor, the H level of the scan signal is a potential which can turn off the transistor 40101 and the L level of the scan signal is a potential which can turn on the transistor 40101. Note that the video signal has analog voltage. Note that the present invention is not limited to this, the video signal may have digital voltage. Alternatively, the video signal may be current. In addition, current of the video signal may be either analog or digital. The video signal has a potential which is lower than the H level of the scan signal and higher than the L level of the scan signal. Note that the constant potential supplied to the wiring 40106 is preferably equal to a potential of the counter electrode 40107.

Operations of the pixel 40100 are described by dividing the whole operations into the case where the transistor 40101 is on and the case where the transistor 40101 is off.

In the case where the transistor 40101 is on, the wiring 40104 is electrically connected to the first electrode (a pixel electrode) of the liquid crystal element 40102 and the first electrode of the capacitor 40103. Therefore, the video signal is input to the first electrode (the pixel electrode) of the liquid crystal element 40102 and the first electrode of the capacitor 40103 from the wiring 40104 through the transistor 40101. In addition, the capacitor 40103 holds a potential difference between a potential of the video signal and the potential supplied to the wiring 40106.

In the case where the transistor 40101 is off, the wiring 40104 is not electrically connected to the first electrode (the pixel electrode) of the liquid crystal element 40102 and the first electrode of the capacitor 40103. Therefore, each of the first electrode of the liquid crystal element 40102 and the first electrode of the capacitor 40103 is set in a floating state. Since the capacitor 40103 holds the potential difference between the potential of the video signal and the potential supplied to the wiring 40106, each of the first electrode of the liquid crystal element 40102 and the first electrode of the capacitor 40103 holds a potential which is the same as (corresponds to) the video signal. Note that the liquid crystal element 40102 has transmittivity in accordance with the video signal.

Figure 131B:
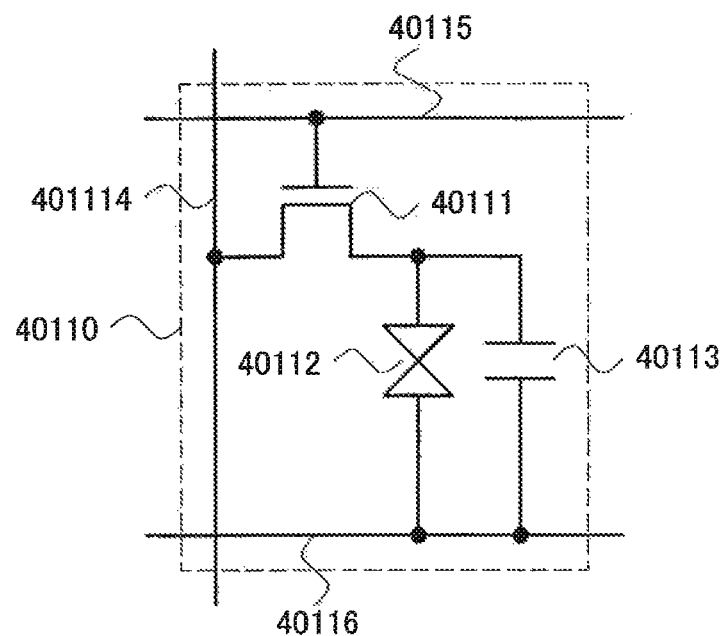

FIG. 131B shows an example of a pixel structure which can be applied to the liquid crystal display device. In particular, FIG. 131B shows an example of a pixel structure which can be applied to a liquid crystal display device suitable for a horizontal electric field mode (including an IPS mode and an FFS mode).

A pixel 40110 includes a transistor 40111, a liquid crystal element 40112, and a capacitor 40113. A gate of the transistor 40111 is connected to a wiring 40115. A first terminal of the transistor 40111 is connected to a wiring 40114. A second terminal of the transistor 40111 is connected to a first electrode of the liquid crystal element 40112 and a first electrode of the capacitor 40113. A second electrode of the liquid crystal element 40112 is connected to a wiring 40116. A second electrode of the capacitor 40103 is connected to the wiring 40116.

The wiring 40114 functions as a signal line. The wiring 40115 functions as a scan line. The wiring 40116 functions as a capacitor line. The transistor 40111 functions as a switch. The capacitor 40113 functions as a storage capacitor.

It is acceptable as long as the transistor 40111 functions as a switch, and the transistor 40111 may be either a P-channel transistor or an N-channel transistor.

A video signal is input to the wiring 40114. A scan signal is input to the wiring 40115. A constant potential is supplied to the wiring 40116. Note that the scan signal is an H-level or L-level digital voltage signal. In the case where the transistor 40111 is an N-channel transistor, an H level of the scan signal is a potential which can turn on the transistor 40111 and an L level of the scan signal is a potential which can turn off the transistor 40111. Alternatively, in the case where the transistor 40111 is a P-channel transistor, the H level of the scan signal is a potential which can turn off the transistor 40111 and the L level of the scan signal is a potential which can turn on the transistor 40111. Note that the video signal has analog voltage. Note that the present invention is not limited to this, the video signal may have digital voltage. Alternatively, the video signal may be current. In addition, current of the video signal may be either analog or digital. The video signal has a potential which is lower than the H level of the scan signal and higher than the L level of the scan signal.

Operations of the pixel 40110 are described by dividing the whole operations into the case where the transistor 40111 is on and the case where the transistor 40111 is off.

In the case where the transistor 40111 is on, the wiring 40114 is electrically connected to the first electrode (a pixel electrode) of the liquid crystal element 40112 and the first electrode of the capacitor 40113. Therefore, the video signal is input to the first electrode (the pixel electrode) of the liquid crystal element 40112 and the first electrode of the capacitor 40113 from the wiring 40114 through the transistor 40111. In addition, the capacitor 40113 holds a potential difference between a potential of the video signal and the potential supplied to the wiring 40116.

In the case where the transistor 40111 is off, the wiring 40114 is not electrically connected to the first electrode (the pixel electrode) of the liquid crystal element 40112 and the first electrode of the capacitor 40113. Therefore, each of the first electrode of the liquid crystal element 40112 and the first electrode of the capacitor 40113 is set in a floating state. Since the capacitor 40113 holds the potential difference between the potential of the video signal and the potential supplied to the wiring 40116, each of the first electrode of the liquid crystal element 40112 and the first electrode of the capacitor 40113 holds a potential which is the same as (corresponds to) the video signal. Note that the liquid crystal element 40112 has transmittivity in accordance with the video signal.

Figure 132:
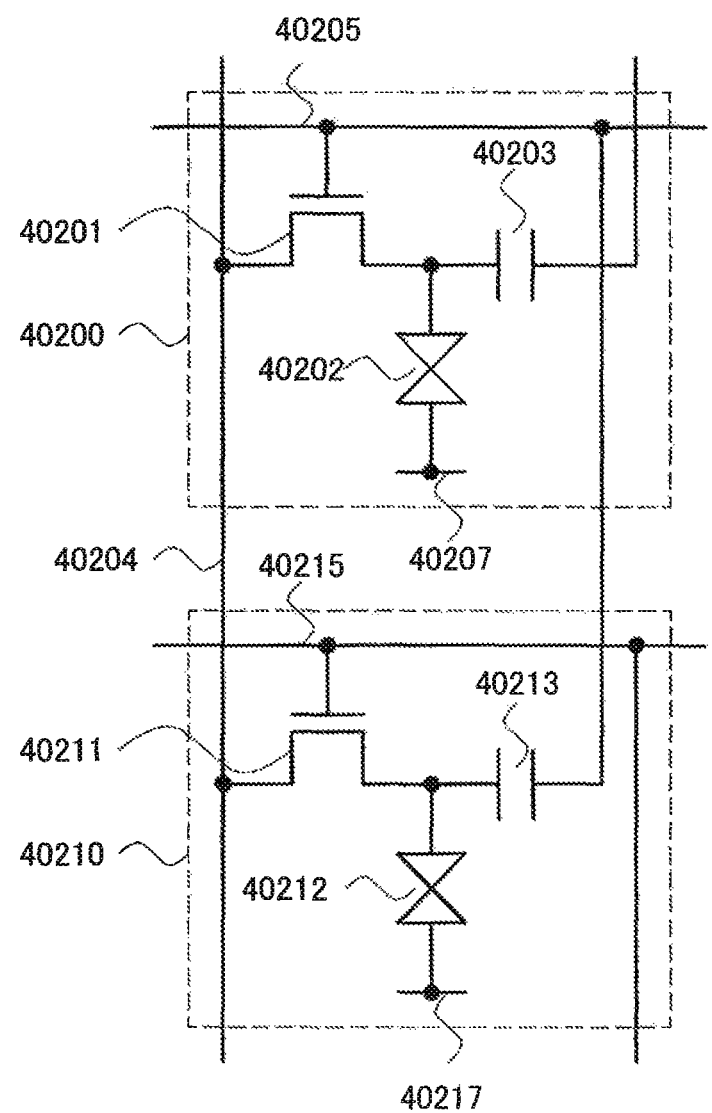
FIG. 132 illustrates the present invention.

FIG. 132 shows an example of a pixel structure which can be applied to the liquid crystal display device. In particular, FIG. 132 shows an example of a pixel structure in which the aperture ratio of a pixel can be increased by reducing the number of wirings.

FIG. 132 shows two pixels which are provided in the same column direction (a pixel 40200 and a pixel 40210). For example, when the pixel 40200 is provided in an N-th row, the pixel 40210 is provided in an (N+1)th row.

A pixel 40200 includes a transistor 40201, a liquid crystal element 40202, and a capacitor 40203. A gate of the transistor 40201 is connected to a wiring 40205. A first terminal of the transistor 40201 is connected to a wiring 40204. A second terminal of the transistor 40201 is connected to a first electrode of the liquid crystal element 40202 and a first electrode of the capacitor 40203. A second electrode of the liquid crystal element 40202 corresponds to a counter electrode 40207. A second electrode of the capacitor 40203 is connected to a wiring which is the same as a wiring connected to a gate of a transistor of the previous row.

A pixel 40210 includes a transistor 40211, a liquid crystal element 40212, and a capacitor 40213. A gate of the transistor 40211 is connected to a wiring 40215. A first terminal of the transistor 40211 is connected to the wiring 40204. A second terminal of the transistor 40211 is connected to a first electrode of the liquid crystal element 40212 and a first electrode of the capacitor 40213. A second electrode of the liquid crystal element 40212 corresponds to a counter electrode 40217. A second electrode of the capacitor 40213 is connected to the wiring which is the same as the wiring connected to the gate of the transistor of the previous row (the wiring 40205).

The wiring 40204 functions as a signal line. The wiring 40205 functions as a scan line of the N-th row. The wiring 40205 also functions as a scan line of the (N+1)th row. The transistor 40201 functions as a switch. The capacitor 40203 functions as a storage capacitor.

The wiring 40215 functions as a scan line of the (N+1)th row. The wiring 40215 also functions as a scan line of the (N+2)th row. The transistor 40211 functions as a switch. The capacitor 40213 functions as a storage capacitor.

It is acceptable as long as each of the transistor 40201 and the transistor 40211 functions as a switch, and each of the transistor 40201 and the transistor 40211 may be either a P-channel transistor or an N-channel transistor.

A video signal is input to the wiring 40204. A scan signal (of an N-th row) is input to the wiring 40205. A scan signal (of an (N+1)th row) is input to the wiring 40215.

The scan signal is an H-level or L-level digital voltage signal. In the case where the transistor 40201 (or the transistor 40211) is an N-channel transistor, an H level of the scan signal is a potential which can turn on the transistor 40201 (or the transistor 40211) and an L level of the scan signal is a potential which can turn off the transistor 40201 (or the transistor 40211). Alternatively, in the case where the transistor 40201 (or the transistor 40211) is a P-channel transistor, the H level of the scan signal is a potential which can turn off the transistor 40201 (or the transistor 40211) and the L level of the scan signal is a potential which can turn on the transistor 40201 (or the transistor 40211). Note that the video signal has analog voltage. Note that the present invention is not limited to this, the video signal may have digital voltage. Alternatively, the video signal may be current. In addition, current of the video signal may be either analog or digital. The video signal has a potential which is lower than the H level of the scan signal and higher than the L level of the scan signal.

Operations of the pixel 40200 are described by dividing the whole operations into the case where the transistor 40201 is on and the case where the transistor 40201 is off.

In the case where the transistor 40201 is on, the wiring 40204 is electrically connected to the first electrode (a pixel electrode) of the liquid crystal element 40202 and the first electrode of the capacitor 40203. Therefore, the video signal is input to the first electrode (the pixel electrode) of the liquid crystal element 40202 and the first electrode of the capacitor 40203 from the wiring 40204 through the transistor 40201. In addition, the capacitor 40203 holds a potential difference between a potential of the video signal and a potential supplied to the wiring which is the same as the wiring connected to the gate of the transistor of the previous row.

In the case where the transistor 40201 is off, the wiring 40204 is not electrically connected to the first electrode (the pixel electrode) of the liquid crystal element 40202 and the first electrode of the capacitor 40203. Therefore, each of the first electrode of the liquid crystal element 40202 and the first electrode of the capacitor 40203 is set in a floating state. Since the capacitor 40203 holds the potential difference between the potential of the video signal and the potential of the wiring which is the same as the wiring connected to the gate of the transistor of the previous row, each of the first electrode of the liquid crystal element 40202 and the first electrode of the capacitor 40203 holds a potential which is the same as (corresponds to) the video signal. Note that the liquid crystal element 40202 has transmittivity in accordance with the video signal.

Operations of the pixel 40210 are described by dividing the whole operations into the case where the transistor 40211 is on and the case where the transistor 40211 is off.

In the case where the transistor 40211 is on, the wiring 40214 is electrically connected to the first electrode (a pixel electrode) of the liquid crystal element 40212 and the first electrode of the capacitor 40213. Therefore, the video signal is input to the first electrode (the pixel electrode) of the liquid crystal element 40212 and the first electrode of the capacitor 40213 from the wiring 40214 through the transistor 40211. In addition, the capacitor 40213 holds a potential difference between a potential of the video signal and a potential supplied to a wiring which is the same as the wiring connected to the gate of the transistor of the previous row (the wiring 40205).

In the case where the transistor 40211 is off, the wiring 40214 is not electrically connected to the first electrode (the pixel electrode) of the liquid crystal element 40212 and the first electrode of the capacitor 40213. Therefore, each of the first electrode of the liquid crystal element 40212 and the first electrode of the capacitor 40213 is set in a floating state. Since the capacitor 40103 holds the potential difference between the potential of the video signal and the potential of the wiring which is the same as the wiring connected to the gate of the transistor of the previous row (the wiring 40215), each of the first electrode (the pixel electrode) of the liquid crystal element 40212 and the first electrode of the capacitor 40213 holds a potential which is the same as (corresponds to) the video signal. Note that the liquid crystal element 40212 has transmittivity in accordance with the video signal.

Figure 133:
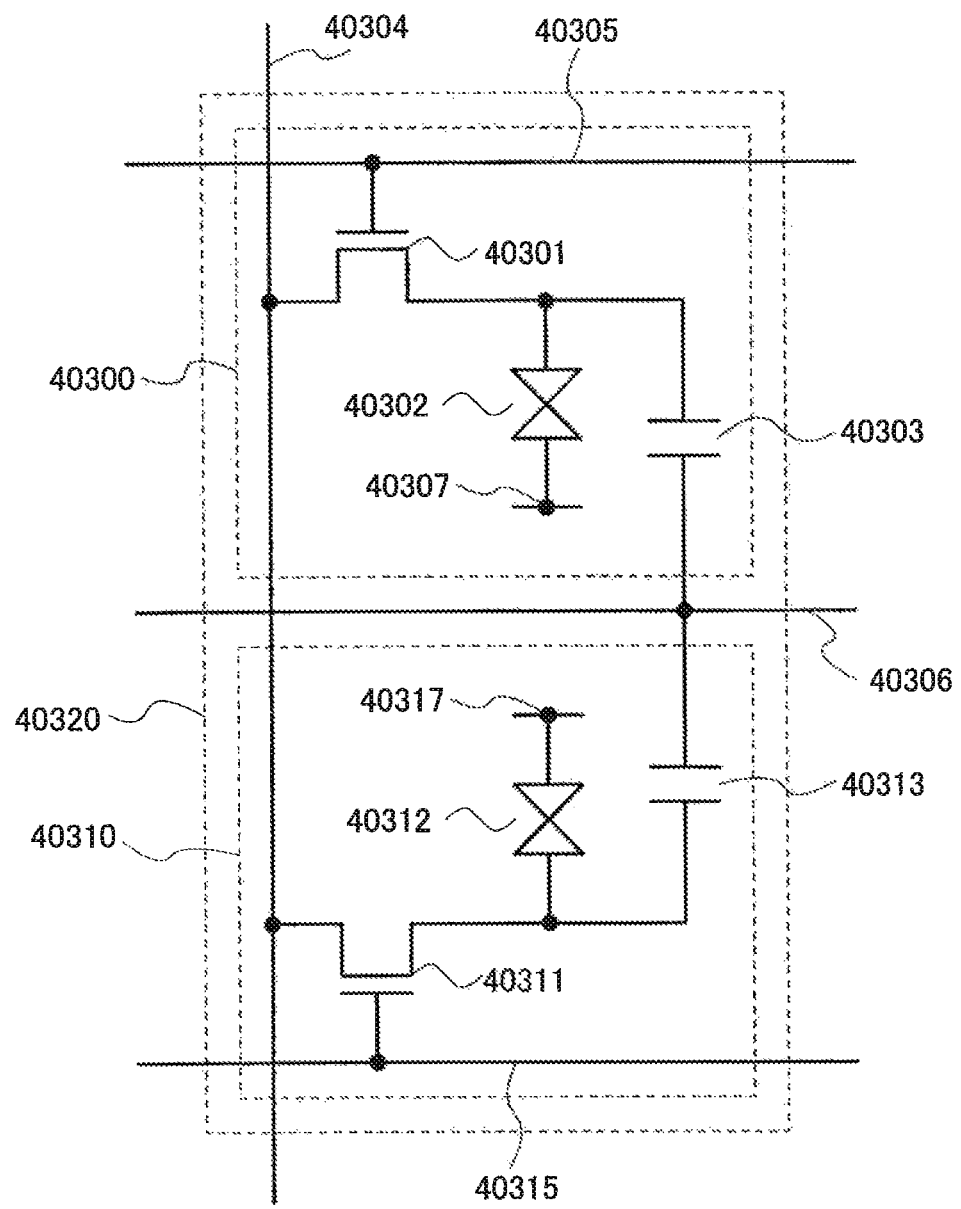
FIG. 133 illustrates the present invention.

FIG. 133 shows an example of a pixel structure which can be applied to the liquid crystal display device. In particular, MG, 133 shows an example of a pixel structure in which the viewing angle can be improved by using a subpixel.

A pixel 40320 includes a subpixel 40300 and a subpixel 40310. Although the case in which the pixel 40320 includes two subpixels is described, the pixel 40320 may include three or more subpixels.

The subpixel 40300 includes a transistor 40301, a liquid crystal element 40302, and a capacitor 40303. A gate of the transistor 40301 is connected to a wiring 40305. A first terminal of the transistor 40301 is connected to a wiring 40304. A second terminal of the transistor 40301 is connected to a first electrode of the liquid crystal element 40302 and a first electrode of the capacitor 40303. A second electrode of the liquid crystal element 40302 corresponds to a counter electrode 40307. A second electrode of the capacitor 40303 is connected to a wiring 40306.

The subpixel 40310 includes a transistor 40311, a liquid crystal element 40312, and a capacitor 40313. A gate of the transistor 40311 is connected to a wiring 40315. A first terminal of the transistor 40311 is connected to the wiring 40304. A second terminal of the transistor 40311 is connected to a first electrode of the liquid crystal element 40312 and a first electrode of the capacitor 40313. A second electrode of the liquid crystal element 40312 corresponds to a counter electrode 40317. A second electrode of the capacitor 40313 is connected to a wiring 40306.

The wiring 40304 functions as a signal line. The wiring 40305 functions as a scan line. The wiring 40315 functions as a signal line. The wiring 40306 functions as a capacitor line. Each of the transistor 40301 and the transistor 40311 functions as a switch. Each of the capacitor 40303 and the capacitor 40313 functions as a storage capacitor.

It is acceptable as long as each of the transistor 40301 and the transistor 40311 functions as a switch, and each of the transistor 40301 and the transistor 40311 may be either a P-channel transistor or an N-channel transistor.

A video signal is input to the wiring 40304. A scan signal is input to the wiring 40305. A scan signal is input to the wiring 40315. A constant potential is supplied to the wiring 40306.

The scan signal is an H-level or L-level digital voltage signal. In the case where the transistor 40301 (or the transistor 40311) is an N-channel transistor, an H level of the scan signal is a potential which can turn on the transistor 40301 (or the transistor 40311) and an L level of the scan signal is a potential which can turn off the transistor 40301 (or the transistor 40311). Alternatively, in the case where the transistor 40301 (or the transistor 40311) is a P-channel transistor, the H level of the scan signal is a potential which can turn off the transistor 40301 (or the transistor 40311) and the L level of the scan signal is a potential which can turn on the transistor 40301 (or the transistor 40311). Note that the video signal has analog voltage. Note that the present invention is not limited to this, the video signal may have digital voltage. Alternatively, the video signal may be current. In addition, current of the video signal may be either analog or digital. The video signal has a potential which is lower than the H level of the scan signal and higher than the L level of the scan signal. Note that the constant potential supplied to the wiring 40306 is preferably equal to a potential of the counter electrode 40307.

Operations of the pixel 40320 are described by dividing the whole operations into the case where the transistor 40301 is on and the transistor 40311 is off, the case where the transistor 40301 is off and the transistor 40311 is on, and the case where the transistor 40301 and the transistor 40311 are off.

In the case where the transistor 40301 is on and the transistor 40311 is off, the wiring 40304 is electrically connected to the first electrode (a pixel electrode) of the liquid crystal element 40302 and the first electrode of the capacitor 40303 in the subpixel 40300. Therefore, the video signal is input to the first electrode (the pixel electrode) of the liquid crystal element 40302 and the first electrode of the capacitor 40303 from the wiring 40304 through the transistor 40301. In addition, the capacitor 40303 holds a potential difference between a potential of the video signal and a potential supplied to the wiring 40306. At this time, the wiring 40304 is not electrically connected to the first electrode (the pixel electrode) of the liquid crystal element 40312 and the first electrode of the capacitor 40313 in the subpixel 40310. Therefore, the video signal is not input to the subpixel 40310.

In the case where the transistor 40301 is off and the transistor 40311 is on, the wiring 40304 is not electrically connected to the first electrode (the pixel electrode) of the liquid crystal element 40302 and the first electrode of the capacitor 40303 in the subpixel 40300. Therefore, each of the first electrode of the liquid crystal element 40302 and the first electrode of the capacitor 40303 is set in a floating state. Since the capacitor 40303 holds the potential difference between the potential of the video signal and the potential supplied to the wiring 40306, each of the first electrode of the liquid crystal element 40302 and the first electrode of the capacitor 40303 holds a potential which is the same as (corresponds to) the video signal. At this time, the wiring 40304 is electrically connected to the first electrode (the pixel electrode) of the liquid crystal element 40312 and the first electrode of the capacitor 40313 in the subpixel 40310. Therefore, the video signal is input to the first electrode (the pixel electrode) of the liquid crystal element 40312 and the first electrode of the capacitor 40313 from the wiring 40304 through the transistor 40311. In addition, the capacitor 40313 holds a potential difference between a potential of the video signal and a potential supplied to the wiring 40306.

In the case where the transistor 40301 and the transistor 40311 are off, the wiring 40304 is not electrically connected to the first electrode (the pixel electrode) of the liquid crystal element 40302 and the first electrode of the capacitor 40303 in the subpixel 40300. Therefore, each of the first electrode of the liquid crystal element 40302 and the first electrode of the capacitor 40303 is set in a floating state. Since the capacitor 40303 holds the potential difference between the potential of the video signal and the potential supplied to the wiring 40306, each of the first electrode of the liquid crystal element 40302 and the first electrode of the capacitor 40303 holds a potential which is the same as (corresponds to) the video signal. Note that the liquid crystal element 40302 has transmittivity in accordance with the video signal. At this time, the wiring 40304 is not electrically connected to the first electrode (the pixel electrode) of the liquid crystal element 40312 and the first electrode of the capacitor 40313 similarly in the subpixel 40310. Therefore, each of the first electrode of the liquid crystal element 40312 and the first electrode of the capacitor 40313 is set in a floating state. Since the capacitor 40313 holds the potential difference between the potential of the video signal and the potential of the wiring 40316, each of the first electrode of the liquid crystal element 40312 and the first electrode of the capacitor 40313 holds a potential which is the same as (corresponds to) the video signal. Note that the liquid crystal element 40312 has transmittivity in accordance with the video signal.

A video signal input to the subpixel 40300 may be a value which is different from that of a video signal input to the subpixel 40310. In this case, the viewing angle can be widened because alignment of liquid crystal molecules of the liquid crystal element 40302 and alignment of liquid crystal molecules of the liquid crystal element 40312 can be varied from each other.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 8)

In this embodiment mode, a driving method of a display device is described. In particular, a driving method of a liquid crystal display device is described.

A liquid crystal display panel which can be used for the liquid crystal display device described in this embodiment mode has a structure in which a liquid crystal material is sandwiched between two substrates. An electrode for controlling an electric field applied to the liquid crystal material is provided in each of the two substrates. A liquid crystal material corresponds to a material, optical and electrical properties of which, is changed by an electric field applied from outside. Therefore, a liquid crystal panel corresponds to a device in which desired optical and electrical properties can be obtained by controlling voltage applied to the liquid crystal material using the electrode included in each of the two substrates. In addition, a large number of electrodes are arranged in a planar manner, each of the electrodes corresponds to a pixel, and voltages applied to the pixels are individually controlled. Therefore, a liquid crystal display panel which can display a clear image can be obtained.

Here, response time of the liquid crystal material with respect to change in an electric field depends on a gap between the two substrates (a cell gap) and a type or the like of the liquid crystal material, and is generally several milli-seconds to several ten milli-seconds. Further, in the case where the amount of change in the electric field is small, the response time of the liquid crystal material is further lengthened. This characteristic causes a defect in image display such as an after image, a phenomenon in which traces can be seen, or decrease in contrast when the liquid crystal panel displays a moving image. In particular, when a half tone is changed into another half tone (change in the electric field is small), the degree of the above-described defect becomes noticeable.

Meanwhile, as a particular problem of a liquid crystal panel using an active matrix method, fluctuation in writing voltage due to constant electric charge driving is given. Constant electric charge driving in this embodiment mode is described below.

A pixel circuit using an active matrix method includes a switch which controls writing and a capacitor which holds an electric charge. A method for driving the pixel circuit using the active matrix method corresponds to a method in which predetermined voltage is written to a pixel circuit with a switch in an on state, and immediately after that, an electric charge in the pixel circuit is held (a hold state) with the switch in an off state. At the time of hold state, exchange of the electric charge between inside and outside of the pixel circuit is not performed (a constant electric charge). Usually, a period in which the switch is in an off state is approximately several hundreds of times (the number of scan lines) longer than a period in which the switch is in an on state. Therefore, it may be considered that the switch of the pixel circuit be almost always in an off state. As described above, constant electric charge driving in this embodiment mode corresponds to a driving method in which a pixel circuit is in a hold state in almost all periods in driving a liquid crystal panel.

Next, electrical properties of the liquid crystal material are described. A dielectric constant as well as optical properties of the liquid crystal material are changed when an electric field applied from outside is changed. That is, when it is considered that each pixel of the liquid crystal panel be a capacitor (a liquid crystal element) sandwiched between two electrodes, the capacitor corresponds to a capacitor, capacitance of which is changed in accordance with applied voltage. This phenomenon is called dynamic capacitance.

When a capacitor, capacitance of which is changed in accordance with applied voltage in this manner, is driven by constant electric charge driving, the following problem occurs. When capacitance of a liquid crystal element is changed in a hold state in which an electric charge is not moved, applied voltage is also changed. This is not difficult to understand from the fact that the amount of electric charges is constant in a relational expression of (the amount of electric charges)=(capacitance)×(applied voltage).

Figure 83A:
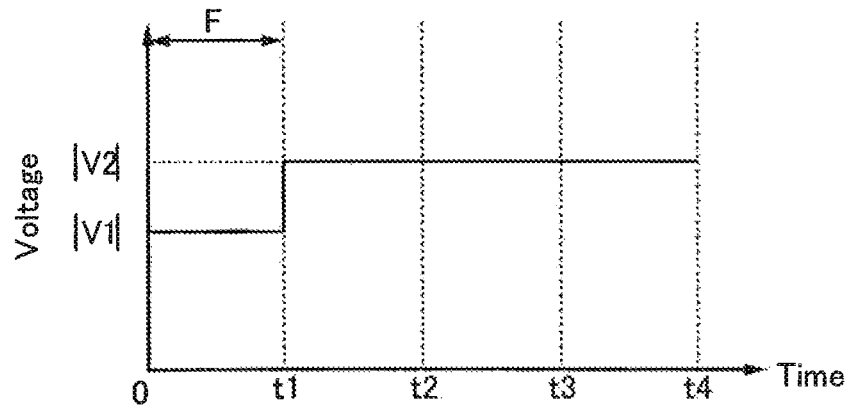
FIGS. 83A to 83C each illustrate the present invention.
Figure 83B:
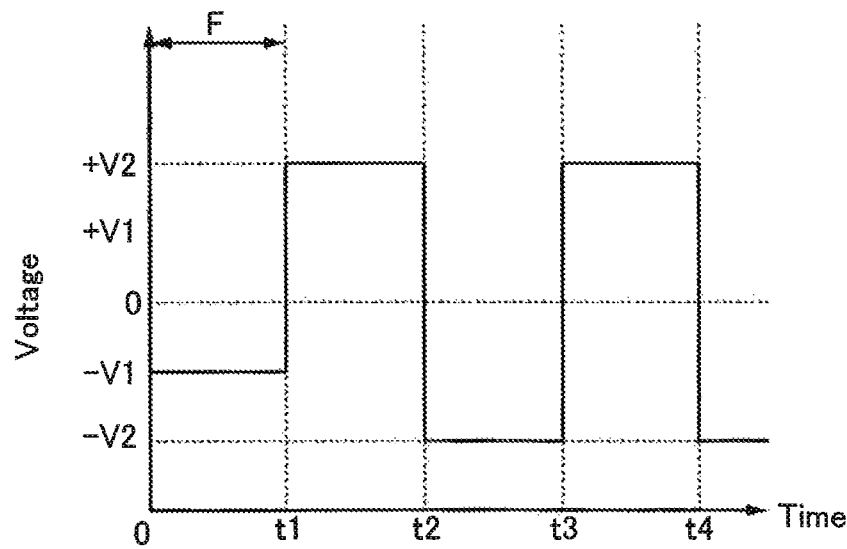
Figure 83C:
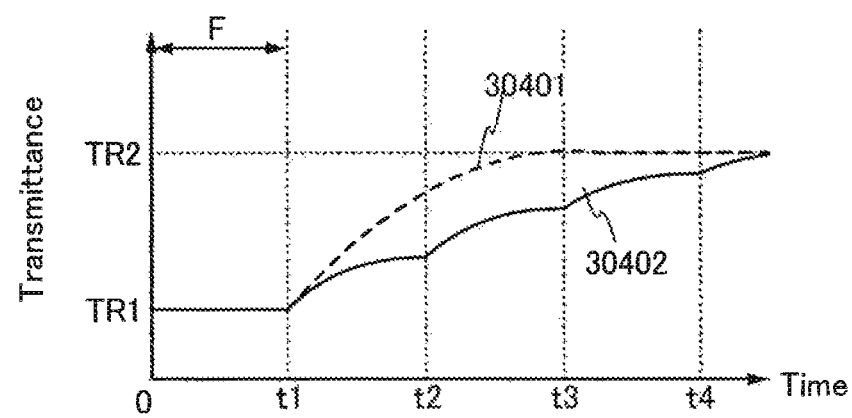

Because of the above-described reasons, voltage at the time of a hold state is changed from voltage at the time of writing because constant electric charge driving is performed in a liquid crystal panel using an active matrix method. Accordingly, change in transmittivity of the liquid crystal element is different from change in transmittivity of a liquid crystal element in a driving method which does not take a hold state. FIGS. 83A to 83C show this state. FIG. 83A shows an example of controlling voltage written to a pixel circuit in the case where time is represented by the horizontal axis and the absolute value of the voltage is represented by the vertical axis. FIG. 83B shows an example of controlling voltage written to the pixel circuit in the case where time is represented by the horizontal axis and the voltage is represented by the vertical axis. FIG. 83C shows time change in transmittivity of the liquid crystal element in the case where the voltage shown in FIG. 83A or 83B is written to the pixel circuit when time is represented by the horizontal axis and transmittivity of the liquid crystal element is represented by the vertical axis. In each of FIGS. 83A to 83C, a period F shows a period for rewriting the voltage and time for rewriting the voltage is described as $t_1$, $t_2$, $t_3$, and $t_4$.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, and $t_4$ (see FIG. 83A).

Note that polarity of the writing voltage corresponding to image data input to the liquid crystal display device may be switched periodically (inversion driving: see FIG. 83B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and frequency of writing voltage can be decreased by changing the polarity.

FIG. 83C shows time change in transmittivity of the liquid crystal element in the case where voltage as shown in FIG. 83A or 83B is applied to the liquid crystal element. Here, the voltage $|V_1|$ is applied to the liquid crystal element and transmittivity of the liquid crystal element after time passes sufficiently corresponds to $TR_1$. Similarly, the voltage $|V_2|$ is applied to the liquid crystal element and transmittivity of the liquid crystal element after time passes sufficiently corresponds to $TR_2$. When the voltage applied to the liquid crystal element is changed from $|V_1|$ to $|V_2|$ at the time of $t_1$, transmittivity of the liquid crystal element does not immediately become $TR_2$ as shown by a dashed line 30401 but slowly changes. For example, when the period of rewriting voltage is the same as a frame period of an image signal of 60 Hz (16.7 milli-seconds), time for several frames is necessary until transmittivity is changed to $TR_2$.

Note that smooth time change in transmittivity as shown in the dashed line 30401 corresponds to time change in transmittivity when the voltage $|V_2|$ is accurately applied to the liquid crystal element. In an actual liquid crystal panel, for example, a liquid crystal panel using an active matrix method, transmittivity of the liquid crystal does not have time change as shown by the dashed line 30401 but has gradual time change as shown by a solid line 30402 because voltage at the time of a hold state is changed from voltage at the time of writing due to constant electric charge driving. This is because the voltage is changed due to constant electric charge driving, so that it is impossible to reach intended voltage only by one writing. Accordingly, the response time of transmittivity of the liquid crystal element becomes further longer than original response time (the dashed line 30401) in appearance, so that a defect in image display such as an after image, a phenomenon in which traces can be seen, or decrease in contrast occurs.

Figure 84A:
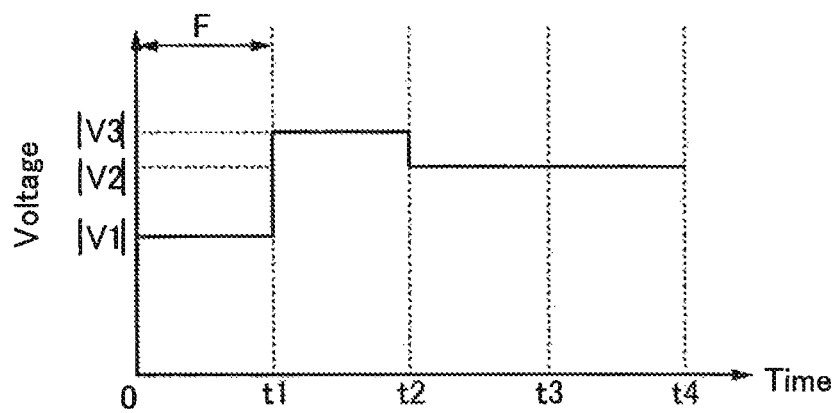
FIGS. 84A to 84C each illustrate the present invention.
Figure 84B:
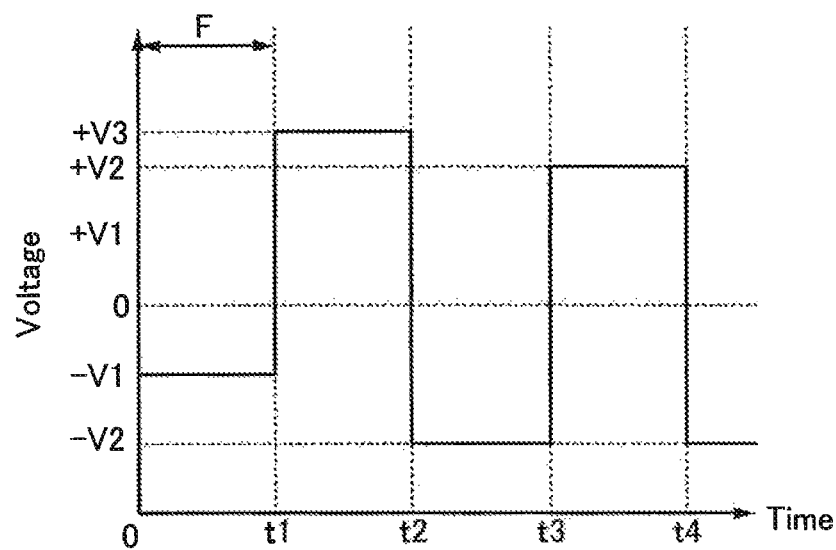
Figure 84C:
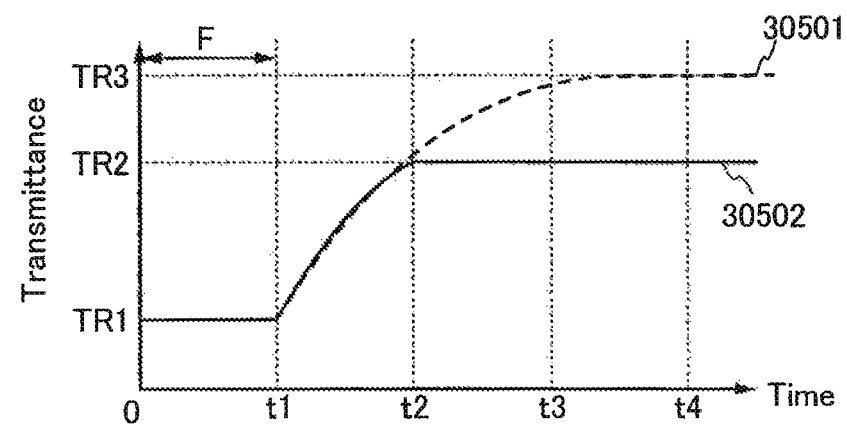

When overdriving is used, it is possible to solve a phenomenon in which the response time in appearance becomes further longer because of shortage of writing by dynamic capacitance and constant electric charge driving as well as length of the original response time of the liquid crystal element. FIGS. 84A to 84C show this state. FIG. 84A shows an example of controlling voltage written to a pixel circuit in the case where time is represented by the horizontal axis and the absolute value of the voltage is represented by the vertical axis. FIG. 84B shows an example of controlling voltage written to the pixel circuit in the case where time is represented by the horizontal axis and the voltage is represented by the vertical axis. FIG. 84C shows time change in transmittivity of the liquid crystal element in the case where the voltage shown in FIG. 84A or 84B is written to the pixel circuit when time is represented by the horizontal axis and transmittivity of the liquid crystal element is represented by the vertical axis. In each of FIGS. 84A to 84C, a period F shows a period for rewriting the voltage and time for rewriting the voltage is described as $t_1$, $t_2$, $t_3$, and $t_4$.

Here, writing voltage corresponding to image data input to the liquid crystal display device corresponds to in rewriting at the time of 0, corresponds to $|V_3|$ in rewriting at the time of $t_1$, and corresponds to $|V_3|$ in writing at the time of $t_2$, $t_3$, and $t_4$ (see FIG. 84A).

Note that polarity of the writing voltage corresponding to image data input to the liquid crystal display device may be switched periodically (inversion driving: see FIG. 84B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and frequency of writing voltage can be decreased by changing the polarity.

FIG. 84C shows time change in transmittivity of the liquid crystal element in the case where voltage as shown in FIG. 84A or 84B is applied to the liquid crystal element. Here, the voltage $|V_1|$ is applied to the liquid crystal element and transmittivity of the liquid crystal element after time passes sufficiently corresponds to $TR_1$. Similarly, the voltage $|V_2|$ is applied to the liquid crystal element and transmittivity of the liquid crystal element after time passes sufficiently corresponds to $TR_2$. Similarly, the voltage $|V_3|$ is applied to the liquid crystal element and transmittivity of the liquid crystal element after time passes sufficiently corresponds to $TR_3$. When the voltage applied to the liquid crystal element is changed from $|V_1|$ to $|V_3|$ at the time of $t_1$, transmittivity of the liquid crystal element is tried to be changed to $TR_3$ for several frames as shown by a dashed line 30501. However, application of the voltage $|V_3|$ is terminated at the time $t_2$ and the voltage $|V_2|$ is applied after the time $t_2$. Therefore, transmittivity of the liquid crystal element does not become as shown by the dashed line 30501 but becomes as shown by a solid line 30502. Here, it is preferable that a value of the voltage $|V_3|$ be set so that transmittivity is approximately $TR_2$ at the time of $t_2$. Here, the voltage $|V_3|$ is also referred to as overdriving voltage.

That is, the response time of the liquid crystal element can be controlled to some extent by changing $|V_3|$ which is the overdriving voltage. This is because the response time of the liquid crystal element is changed by strength of an electric field. Specifically, the response time of the liquid crystal element becomes shorter as the electric field is strong, and the response time of the liquid crystal element becomes longer as the electric field is weak.

Note that it is preferable that $|V_3|$ which is the overdriving voltage be changed in accordance with the amount of change in the voltage, i.e., the voltage $|V_1|$ and the voltage $|V_2|$ which supply intended transmittivity $TR_1$ and $TR_2$. This is because appropriate response time can be always obtained by changing $|V_3|$ which is the overdriving voltage in accordance with change in the response time of the liquid crystal element even when the response time of the liquid crystal element is changed by the amount of change in the voltage.

Note that it is preferable that $|V_3|$ which is the overdriving voltage be changed by a mode of the liquid crystal element such as a TN mode, a VA mode, an IPS mode, or an OCB mode. This is because appropriate response time can be always obtained by changing $|V_3|$ which is the overdriving voltage in accordance with change in the response time of the liquid crystal element even when the response time of the liquid crystal element is changed by the mode of the liquid crystal element.

Note that the voltage rewriting period F may be the same as a frame period of an input signal. In this case, a liquid crystal display device with low manufacturing cost can be obtained because a peripheral driver circuit of the liquid crystal display device can be simplified.

Note also that the voltage rewriting period F may be shorter than the frame period of the input signal. For example, the voltage rewriting period F may be one half the frame period of the input signal, one third the frame period of the input signal, or one third or less the frame period of the input signal. It is effective to combine this method with a countermeasure against deterioration in quality of moving images caused by hold driving of the liquid crystal display device such as black data insertion driving, backlight blinking, backlight scanning, or intermediate image insertion driving by motion compensation. That is, since required response time of the liquid crystal element is short in the countermeasure against deterioration in quality of moving images caused by hold driving of the liquid crystal display device, the response time of the liquid crystal element can be relatively shortened easily by using overdriving described in this embodiment mode. Although the response time of the liquid crystal element can be essentially shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method such as overdriving.

Note that the voltage rewriting period F may be longer than the frame period of the input signal. For example, the voltage rewriting period F may be twice the frame period of the input signal, three times the frame period of the input signal, or three times or more the frame period of the input signal. It is effective to combine this method with a unit (a circuit) which determines whether voltage is not rewritten for a long period or not. That is, when the voltage is not rewritten for a long period, an operation of the circuit can be stopped during a period where no voltage is rewritten without performing a rewriting operation itself of the voltage. Therefore, a liquid crystal display device with low power consumption can be obtained.

Next, a specific method for changing $|V_3|$ which is the overdriving voltage in accordance with the voltage $|V_1|$ and the voltage $|V_2|$ which supply intended transmittivity $TR_1$ and $TR_2$ is described.

Since an overdriving circuit corresponds to a circuit for appropriately controlling $|V_3|$ which is the overdriving voltage in accordance with the voltage $|V_1|$ and the voltage $|V_2|$ which supply intended transmittivity $TR_1$ and $TR_2$, signals input to the overdriving circuit are a signal which is related to the voltage $|V_1|$ which supplies intended transmittivity $TR_1$ and a signal which is related to the voltage $|V_2|$ which supplies intended transmittivity $TR_2$, and a signal output from the overdriving circuit is a signal which is related to $|V_3|$ which is the overdriving voltage. Here, each of these signals may have an analog voltage value such as the voltage applied to the liquid crystal element (e.g., $|V_1|$, $|V_2|$, or $|V_3|$) or may be a digital signal for supplying the voltage applied to the liquid crystal element. Here, the signal which is related to the overdriving circuit is described as a digital signal.

Figure 80A:
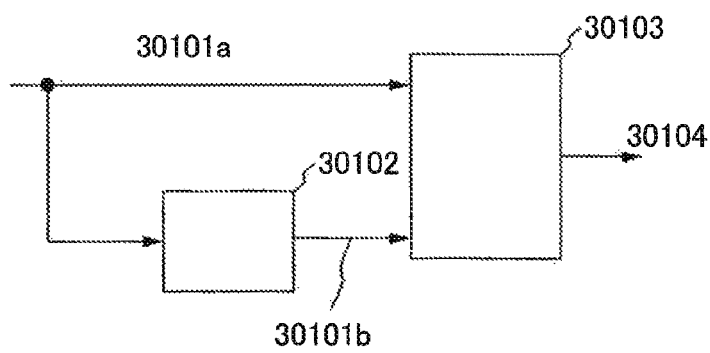
FIGS. 80A to 80E each illustrate the present invention.

First, a general structure of the overdriving circuit is described with reference to FIG. 80A. Here, input image signals 30101a and 30101b are used as signals for controlling the overdriving voltage. As a result of processing these signals, an output image signal 30104 is to be output as a signal which supplies the overdriving voltage.

Here, since the voltage $|V_1|$ and the voltage $|V_2|$ which supply intended transmittivity $TR_1$ and $TR_2$ are image signals in adjacent frames, it is preferable that the input image signals 30101a and 30101b be similarly image signals in adjacent frames. In order to obtain such signals, the input image signal 30101a is input to a delay circuit 30102 in FIG. 80A and a signal which is consequently output can be used as the input image signal 30101b. For example, a memory can be given as the delay circuit 30102. That is, the input image signal 30101a is stored in the memory in order to delay the input image signal 30101a for one frame; a signal stored in the previous frame is taken out from the memory as the input image signal 30101b at the same time; and the input image signal 30101a and the input image signal 30101b are simultaneously input to a correction circuit 30103. Therefore, the image signals in adjacent frames can be handled. When the image signals in adjacent frames are input to the correction circuit 30103, the output image signal 30104 can be obtained. Note that when a memory is used as the delay circuit 30102, a memory having capacity for storing an image signal for one frame in order to delay the input image signal 30101a for one frame (i.e., a frame memory) can be obtained. Thus, the memory can have a function as a delay circuit without causing excess and deficiency of memory capacity.

Next, the delay circuit 30102 formed mainly for reducing memory capacity is described. Since memory capacity can be reduced by using such a circuit as the delay circuit 30102, manufacturing cost can be reduced.

Figure 80B:
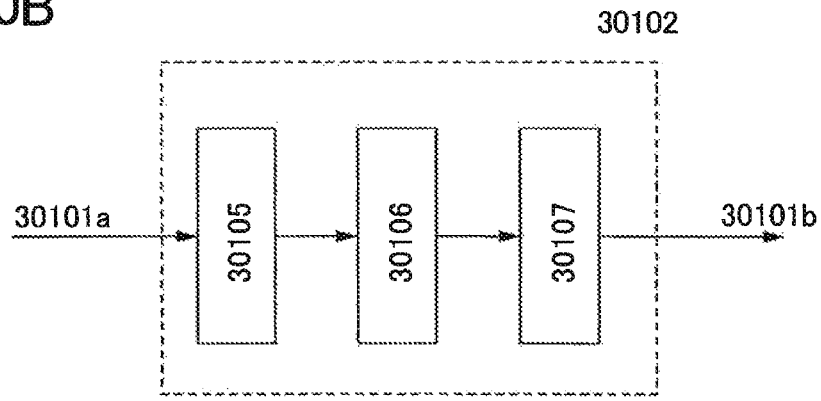

Specifically, a delay circuit as shown in FIG. 80B can be used as the delay circuit 30102 having such characteristics. The delay circuit shown in FIG. 80B includes an encoder 30105, a memory 30106, and a decoder 30107.

Operations of the delay circuit 30102 shown in FIG. 80B are as follows. First, compression treatment is performed by the encoder 30105 before the input image signal 30101a is stored in the memory 30106. Thus, the size of data to be stored in the memory 30106 can be reduced. Accordingly, since memory capacity can be reduced, manufacturing cost can also be reduced. Then, a compressed image signal is transferred to the decoder 30107 and extension treatment is performed here. Thus, the previous signal which is compressed by the encoder 30105 can be restored. Here, compression and extension treatment which is performed by the encoder 30105 and the decoder 30107 may be reversible treatment. Thus, since the image signal does not deteriorate even after compression and extension treatment is performed, memory capacity can be reduced without causing deterioration of quality of an image, which is finally displayed on a device. Further, compression and extension treatment which is performed by the encoder 30105 and the decoder 30107 may be non-reversible treatment. Thus, since the size of data of the compressed image signal can be extremely made small, memory capacity can be significantly reduced.

Note that as a method for reducing memory capacity, various methods as well as the above-described method can be used. A method in which color information included in an image signal is reduced (e.g., tone reduction from 2.6 hundred thousand colors to 65 thousand colors is performed) or the amount of data is reduced (e.g., resolution is made smaller) without performing image compression by an encoder, or the like can be used.

Figure 80C:
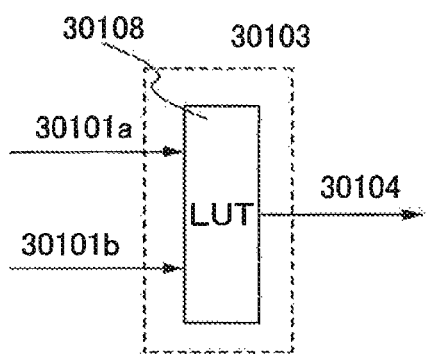
Figure 80E:
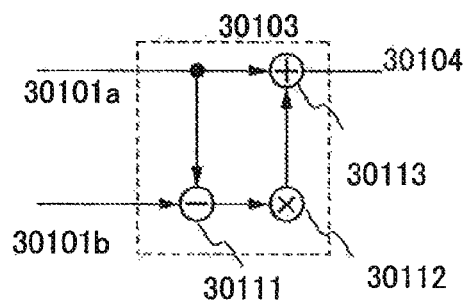
Figure 80D:
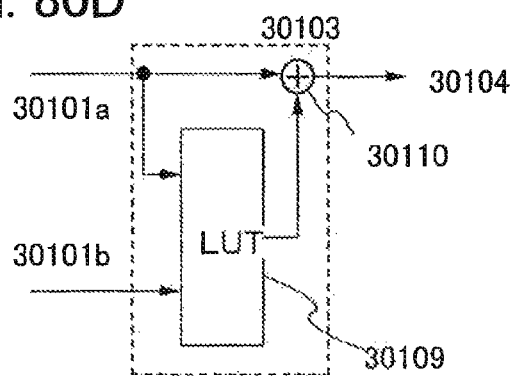

Next, specific examples of the correction circuit 30103 are described with reference to FIGS. 80C to 80E. The correction circuit 30103 corresponds to a circuit for outputting an output image signal having a certain value from two input image signals. Here, when relation between the two input image signals and the output image signal is non-linear and it is difficult to calculate the relation by simple operation, a look up table (a LUT) may be used as the correction circuit 30103. Since the relation between the two input image signals and the output image signal is calculated in advance by measurement in a LUT, the output image signal corresponding to the two input image signals can be calculated only by seeing the LUT (see FIG. 80C). When a LUT 30108 is used as the correction circuit 30103, the correction circuit 30103 can be realized without performing complicated circuit design or the like.

Here, since the LUT is one of memories, it is preferable to reduce memory capacity as much as possible in order to reduce manufacturing cost. As an example of the correction circuit 30103 for realizing reduction in memory capacity, a circuit shown in FIG. 80D can be given. The correction circuit 30103 shown in FIG. 80D includes a LUT 30109 and an adder 30110. Data of difference between the input image signal 30101a and the output image signal 30104 to be output is stored in the LUT 30109. That is, corresponding difference data from the input image signal 30101a and the input image signal 30101b is taken out from the LUT 30109 and taken out difference data and the input image signal 30101a are added by the adder 30110, so that the output image signal 30104 can be obtained. Note that when data stored in the LUT 30109 is difference data, memory capacity of the LUT can be reduced. This is because data size of difference data is smaller than data size of the output image signal 30104 itself, so that memory capacity necessary for the LUT 30109 can be made smaller.

In addition, when the output image signal can be calculated by simple operation such as four arithmetic operations of the two input image signals, the correction circuit 30103 can be realized by combination of simple circuits such as an adder, a subtracter, and a multiplier. Accordingly, it is not necessary to use the LUT, so that manufacturing cost can be significantly reduced. As such a circuit, a circuit shown in FIG. 80E can be given. The correction circuit 30103 shown in FIG. 80E includes a subtracter 30111, a multiplier 30112, and an adder 30113. First, difference between the input image signal 30101a and the input image signal 30101b is calculated by the subtracter 30111. After that, a differential value is multiplied by an appropriate coefficient by using the multiplier 30112. Then, when the differential value multiplied by an appropriate coefficient is added to the input image signal 30101a by the adder 30113, the output image signal 30104 can be obtained. When such a circuit is used, it is not necessary to use the LUT. Therefore, manufacturing cost can be significantly reduced.

Note that when the correction circuit 30103 shown in FIG. 88E is used under a certain condition, output of the inappropriate output image signal 30104 can be prevented. The condition is as follows. The output image signal 30104 which supplies the overdriving voltage and a differential value between the input image signals 30101a and 30101b have linearity. In addition, the differential value corresponds to a coefficient multiplied by inclination of this linearity by using the multiplier 30112. That is, it is preferable that the correction circuit 30103 shown in FIG. 80E be used for a liquid crystal element having such properties. As a liquid crystal element having such properties, an IPS-mode liquid crystal element in which response time has low dependency on a gray scale can be given. For example, when the correction circuit 30103 shown in FIG. 80E is used for an IPS-mode liquid crystal element in this manner, manufacturing cost can be significantly reduced and an overdriving circuit which can prevent output of the inappropriate output image signal 30104 can be obtained.

Note that operations which are similar to those of the circuit shown in FIGS. 80A to 80E may be realized by software processing. As for the memory used for the delay circuit, another memory included in the liquid crystal display device, a memory included in a device which transfers an image displayed on the liquid crystal display device (e.g., a video card or the like included in a personal computer or a device similar to the personal computer) can be used. Thus, intensity of overdriving, availability, or the like can be selected in accordance with user's preference in addition to reduction in manufacturing cost.

Figure 81A:
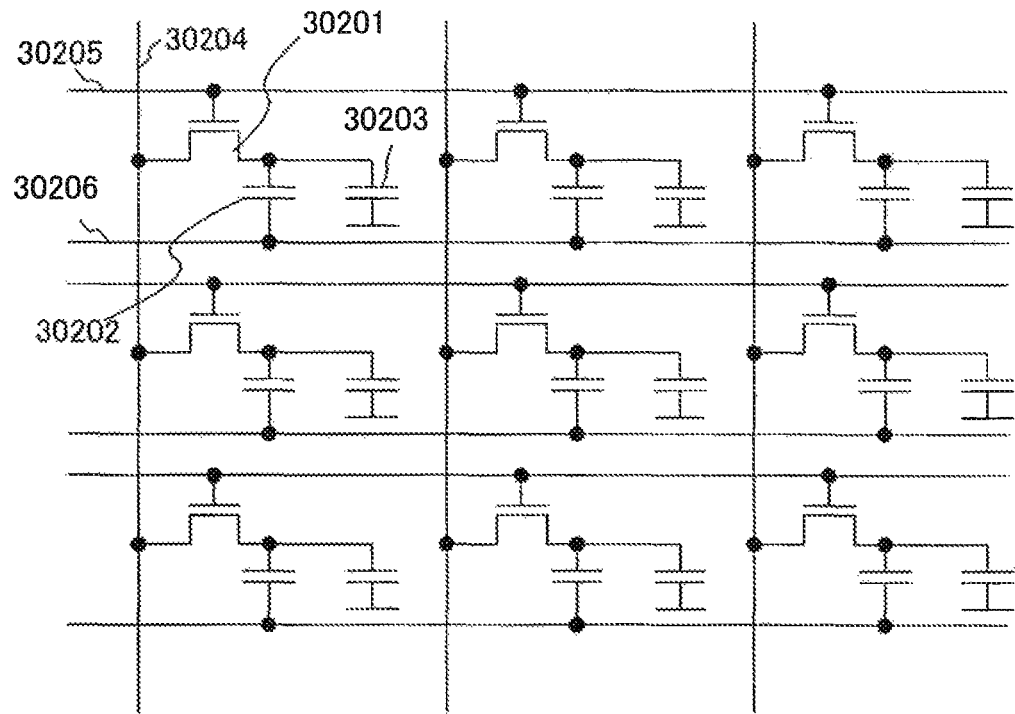
FIGS. 81A and 81B each illustrate the present invention.

Driving which controls a potential of a common line is described with reference to FIGS. 81A and 81B. FIG. 81A is a diagram showing a plurality of pixel circuits in which one common line is provided with respect to one scan line in a display device using a display element which has capacitive properties like a liquid crystal element. Each of the pixel circuits shown in FIG. 81A includes a transistor

30201, an auxiliary capacitor 30202, a display element 30203, a video signal line 30204, a scan line 30205, and a common line 30206.

A gate electrode of the transistor 30201 is electrically connected to the scan line 30205; one of a source electrode and a drain electrode of the transistor 30201 is electrically connected to the video signal line 30204; and the other of the source electrode and the drain electrode of the transistor 30201 is electrically connected to one of electrodes of the auxiliary capacitor 30202 and one of electrodes of the display element 30203. In addition, the other of the electrodes of the auxiliary capacitor 30202 is electrically connected to the common line 30206.

First, in each of pixels selected by the scan line 30205, voltage corresponding to an image signal is applied to the display element 30203 and the auxiliary capacitor 30202 through the video signal line 30204 because the transistor 30201 is turned on. At this time, when the image signal is a signal which makes all pixels connected to the common line 30206 display a minimum gray scale or when the image signal is a signal which makes all the pixels connected to the common line 30206 display a maximum gray scale, it is not necessary that the image signal be written to each of the pixels through the video signal line 30204. Voltage applied to the display element 30203 can be changed by changing a potential of the common line 30206 instead of writing the image signal through the video signal line 30204.

Figure 81B:
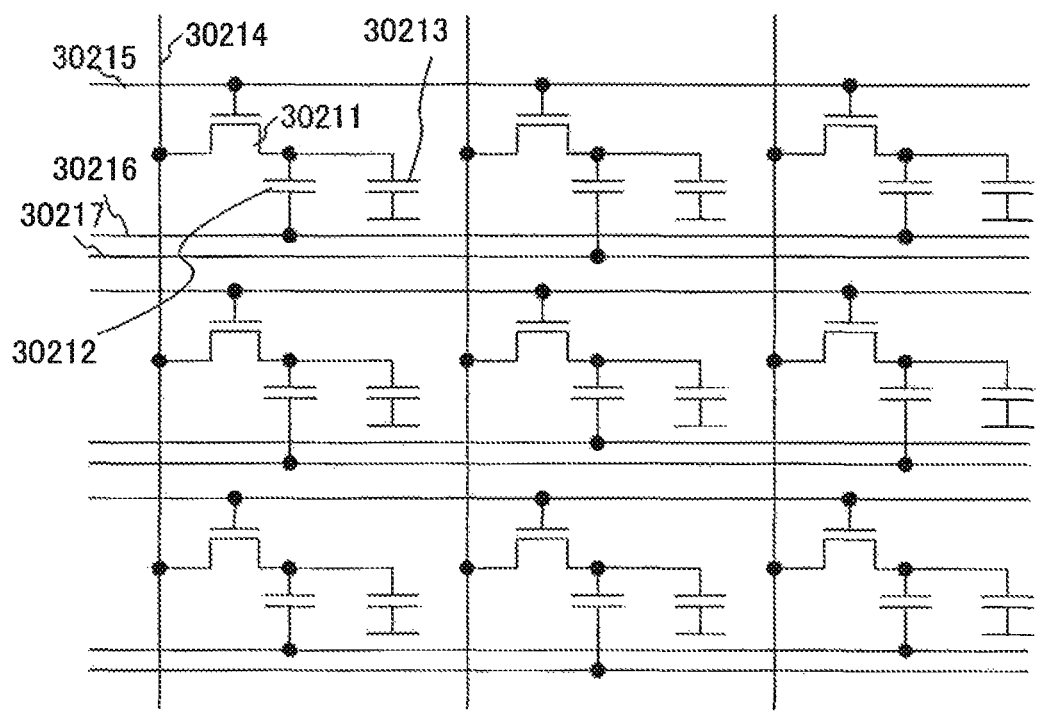

Next, FIG. 81B is a diagram showing a plurality of pixel circuits in which two common lines are provided with respect to one scan line in a display device using a display element which has capacitive properties like a liquid crystal element. Each of the pixel circuits shown in FIG. 81B includes a transistor 30211, an auxiliary capacitor 30212, a display element 30213, a video signal line 30214, a scan line 30215, a first common line 30216, and a second common line 30217.

A gate electrode of the transistor 30211 is electrically connected to the scan line 30215; one of a source electrode and a drain electrode of the transistor 30211 is electrically connected to the video signal line 30214; and the other of the source electrode and the drain electrode of the transistor 30211 is electrically connected to one of electrodes of the auxiliary capacitor 30212 and one of electrodes of the display element 30213. In addition, the other of the electrodes of the auxiliary capacitor 30212 is electrically connected to the first common line 30216. Further, in a pixel which is adjacent to the pixel, the other of the electrodes of the auxiliary capacitor 30212 is electrically connected to the second common line 30217.

In the pixel circuits shown in FIG. 81B, the number of pixels which are electrically connected to one common line is small. Therefore, when a potential of the first common line 30216 or the second common line 30217 is changed instead of writing an image signal through the video signal line 30214, frequency of changing voltage applied to the display element 30213 is significantly increased. In addition, source inversion driving or dot inversion driving can be performed. When source inversion driving or dot inversion driving is performed, reliability of the element can be improved and a flicker can be suppressed.

Figure 82A:
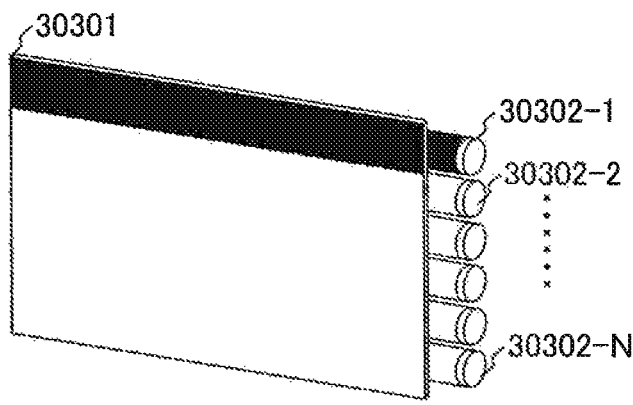
FIGS. 82A to 82C each illustrate the present invention.

A scanning backlight is described with reference to FIGS. 82A to 82C. FIG. 82A shows a scanning backlight in which cold cathode fluorescent lamps are arranged.

The scanning backlight shown in FIG. 82A includes a diffusion plate 30301 and N pieces of cold cathode fluorescent lamps 30302-1 to 30302-N. The N pieces of the cold cathode fluorescent lamps 30302-1 to 30302-N are arranged on the back side of the diffusion plate 30301, so that the N pieces of the cold cathode fluorescent lamps 30302-1 to 30302-N can be scanned while luminance thereof is changed.

Change in luminance of each of the cold cathode fluorescent lamps in scanning is described with reference to FIG. 82C. First, luminance of the cold cathode fluorescent lamp 30302-1 is changed for a certain period. After that, luminance of the cold cathode fluorescent lamp 30302-2 which is provided adjacent to the cold cathode fluorescent lamp 30302-1 is changed for the same period. In this manner, luminance is changed sequentially from the cold cathode fluorescent lamp 30302-1 to the cold cathode fluorescent lamp 30302-N. Although luminance which is changed for a certain period is set to be lower than original luminance in FIG. 82C, it may also be higher than original luminance. In addition, although scanning is performed from the cold cathode fluorescent lamps 30302-1 to 30302-N, scanning may also be performed from the cold cathode fluorescent lamps 30302-N to 30302-1, which is in a reversed order.

Figure 82B:
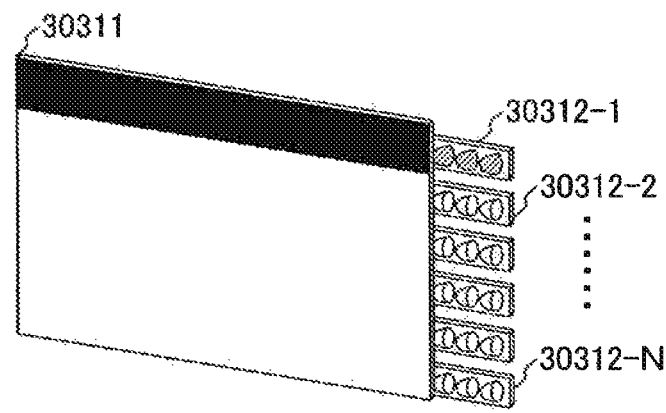
Figure 82C:
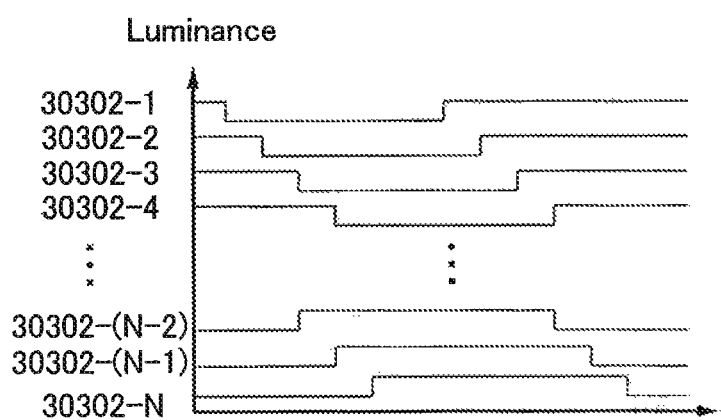

When driving is performed as in FIGS. 82A to 82C, average luminance of the backlight can be decreased. Therefore, power consumption of the backlight, which mainly takes up power consumption of the liquid crystal display device, can be reduced.

Note that an LED may be used as a light source of the scanning backlight. The scanning backlight in that case is as shown in FIG. 82B. The scanning backlight shown in FIG. 82B includes a diffusion plate 30311 and light sources 30312-1 to 30312-N, in each of which LEDs are arranged. When the LED is used as the light source of the scanning backlight, there is an advantage in that the backlight can be thin and lightweight. In addition, there is also an advantage that a color reproduction area can be widened. Further, since the LEDs which are arranged in each of the light sources 30312-1 to 30312-N can be similarly scanned, a dot scanning backlight can also be obtained. When the dot scanning backlight is used, image quality of moving images can be further improved.

Note that when the LED is used as the light source of the backlight, driving can be performed by changing luminance, as shown in FIG. 82C.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 9)

In this embodiment mode, various liquid crystal modes are described.

First, various liquid crystal modes are described with reference to cross-sectional views.

Figure 134A:
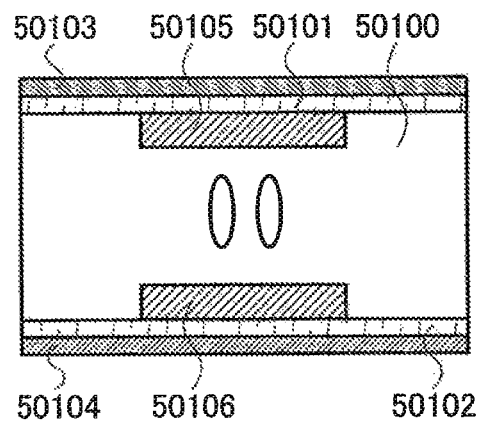
FIGS. 134A and 134B each illustrate the present invention.
Figure 134B:
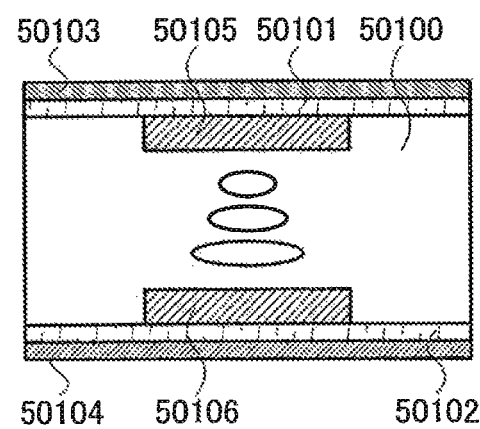

FIGS. 134A and 134B are schematic views of cross sections of a TN mode.

A liquid crystal layer 50100 is held between a first substrate 50101 and a second substrate 50102 which are provided so as to be opposite to each other. A first electrode 50105 is formed on a top surface of the first substrate 50101. A second electrode 50106 is formed on a top surface of the second substrate 50102. A first polarizing plate 50103 is provided on a surface of the first substrate 50101, which does not face the liquid crystal layer. A second polarizing plate 50104 is provided on a surface of the second substrate 50102, which does not face the liquid crystal layer. Note that the first polarizing plate 50103 and the second polarizing plate 50104 are provided so as to be in a cross nicol state.

The first polarizing plate 50103 may be provided on the top surface of the first substrate 50101. The second polarizing plate 50104 may be provided on the top surface of the second substrate 50102.

It is acceptable as long as at least one of or both the first electrode 50105 and the second electrode 50106 have light-transmitting properties (a transmissive or reflective liquid crystal display device). Alternatively, both the first electrode 50105 and the second electrode 50106 may have light-transmitting properties, and part of one of the electrodes may have reflectivity (a semi-transmissive liquid crystal display device).

FIG. 134A is a schematic view of a cross section in the case where voltage is applied to the first electrode 50105 and the second electrode 50106 (referred to as a vertical electric field mode). Since liquid crystal molecules are aligned longitudinally, light emitted from a backlight is not affected by birefringence of the liquid crystal molecules. In addition, since the first polarizing plate 50103 and the second polarizing plate 50104 are provided so as to be in a cross nicol state, light emitted from the backlight cannot pass through the substrate. Therefore, black display is performed.

Note that when voltage applied to the first electrode 50105 and the second electrode 50106 is controlled, conditions of the liquid crystal molecules can be controlled. Therefore, since the amount of light emitted from the backlight passing through the substrate can be controlled, predetermined image display can be performed.

FIG. 134B is a schematic view of a cross section in the case where voltage is not applied to the first electrode 50105 and the second electrode 50106. Since the liquid crystal molecules are aligned laterally and rotated in a plane, light emitted from a backlight is affected by birefringence of the liquid crystal molecules. In addition, since the first polarizing plate 50103 and the second polarizing plate 50104 are provided so as to be in a cross nicol state, light emitted from the backlight passes through the substrate. Therefore, white display is performed. This is a so-called normally white mode.

A liquid crystal display device having the structure shown in FIG. 134A or FIG. 134B can perform full-color display by being provided with a color filter. The color filter can be provided on a first substrate 50101 side or a second substrate 50102 side.

It is acceptable as long as a known material is used for a liquid crystal material used for a TN mode.

Figure 135A:
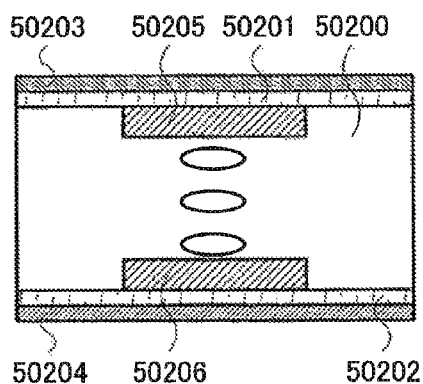
FIGS. 135A to 135D each illustrate the present invention.
Figure 135B:
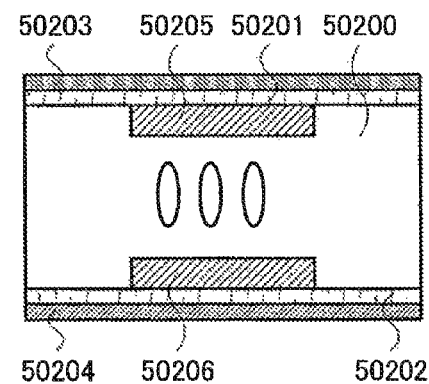

FIGS. 135A and 135B are schematic views of cross sections of a VA mode. In the VA mode, liquid crystal molecules are aligned such that they are vertical to a substrate when there is no electric field.

A liquid crystal layer 50200 is held between a first substrate 50201 and a second substrate 50202 which are provided so as to be opposite to each other. A first electrode 50205 is formed on a top surface of the first substrate 50201. A second electrode 50206 is formed on a top surface of the second substrate 50202. A first polarizing plate 50203 is provided on a surface of the first substrate 50201, which does not face the liquid crystal layer. A second polarizing plate 50204 is provided on a surface of the second substrate 50202, which does not face the liquid crystal layer. Note that the first polarizing plate 50203 and the second polarizing plate 50204 are provided so as to be in a cross nicol state.

The first polarizing plate 50203 may be provided on the top surface of the first substrate 50201. The second polarizing plate 50204 may be provided on the top surface of the second substrate 50202.

It is acceptable as long as at least one of or both the first electrode 50205 and the second electrode 50206 have light-transmitting properties (a transmissive or reflective liquid crystal display device). Alternatively, both the first electrode 50205 and the second electrode 50206 may have light-transmitting properties, and part of one of the electrodes may have reflectivity (a semi-transmissive liquid crystal display device).

FIG. 135A is a schematic view of a cross section in the case where voltage is applied to the first electrode 50205 and the second electrode 50206 (referred to as a vertical electric field mode). Since liquid crystal molecules are aligned laterally, light emitted from a backlight is affected by birefringence of the liquid crystal molecules. In addition, since the first polarizing plate 50203 and the second polarizing plate 50204 are provided so as to be in a cross nicol state, light emitted from the backlight passes through the substrate. Therefore, white display is performed.

Note that when voltage applied to the first electrode 50205 and the second electrode 50206 is controlled, conditions of the liquid crystal molecules can be controlled. Therefore, since the amount of light emitted from the backlight passing through the substrate can be controlled, predetermined image display can be performed.

FIG. 135B is a schematic view of a cross section in the case where voltage is not applied to the first electrode 50205 and the second electrode 50206. Since liquid crystal molecules are aligned longitudinally, light emitted from a backlight is not affected by birefringence of the liquid crystal molecules. In addition, since the first polarizing plate 50203 and the second polarizing plate 50204 are provided so as to be in a cross nicol state, light emitted from the backlight does not pass through the substrate. Therefore, black display is performed. This is a so-called normally black mode.

A liquid crystal display device having the structure shown in FIG. 135A or FIG. 135B can perform full-color display by being provided with a color filter. The color filter can be provided on a first substrate 50201 side or a second substrate 50202 side.

It is acceptable as long as a known material is used for a liquid crystal material used for a VA mode.

Figure 135C:
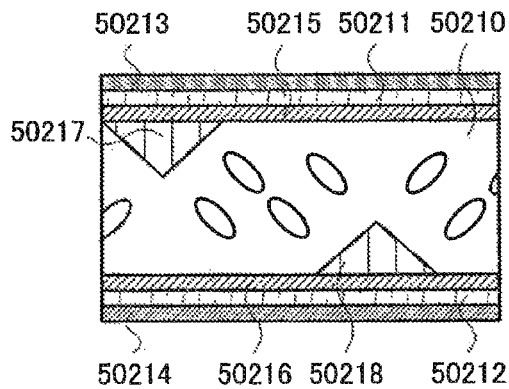
Figure 135D:
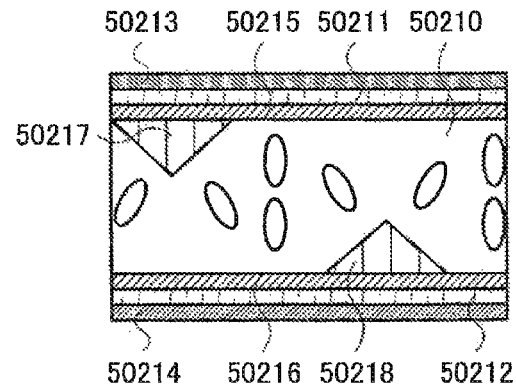

FIGS. 135C and 135D are schematic views of cross sections of an MVA mode. In the MVA mode, viewing angle dependency of each portion is compensated by each other.

A liquid crystal layer 50210 is held between a first substrate 50211 and a second substrate 50212 which are provided so as to be opposite to each other. A first electrode 50215 is formed on a top surface of the first substrate 50211. A second electrode 50216 is formed on a top surface of the second substrate 50212. A first protrusion 50217 for controlling alignment is formed on the first electrode 50215. A second protrusion 50218 for controlling alignment is formed over the second electrode 50216. A first polarizing plate 50213 is provided on a surface of the first substrate 50211, which does not face the liquid crystal layer. A second polarizing plate 50214 is provided on a surface of the second substrate 50212, which does not face the liquid crystal layer. Note that the first polarizing plate 50213 and the second polarizing plate 50214 are provided so as to be in a cross nicol state.

The first polarizing plate 50213 may be provided on the top surface of the first substrate 50211. The second polarizing plate 50214 may be provided on the top surface of the second substrate 50212.

Ii is acceptable as long as at least one of or both the first electrode 50215 and the second electrode 50216 have light-transmitting properties (a transmissive or reflective liquid crystal display device). Alternatively, both the first electrode 50215 and the second electrode 50216 may have light-transmitting properties, and part of one of the electrodes may have reflectivity (a semi-transmissive liquid crystal display device).

FIG. 135C is a schematic view of a cross section in the case where voltage is applied to the first electrode 50215 and the second electrode 50216 (referred to as a vertical electric field mode). Since liquid crystal molecules are aligned so as to tilt toward the first protrusion 50217 and the second protrusion 50218, light emitted from a backlight is affected by birefringence of the liquid crystal molecules. In addition, since the first polarizing plate 50213 and the second polarizing plate 50214 are provided so as to be in a cross nicol state, light emitted from the backlight passes through the substrate. Therefore, white display is performed.

Note that when voltage applied to the first electrode 50215 and the second electrode 50216 is controlled, conditions of the liquid crystal molecules can be controlled. Therefore, since the amount of light emitted from the backlight passing through the substrate can be controlled, predetermined image display can be performed.

FIG. 135D is a schematic view of a cross section in the case where voltage is not applied to the first electrode 50215 and the second electrode 50216. Since liquid crystal molecules are aligned longitudinally, light emitted from a backlight is not affected by birefringence of the liquid crystal molecules. In addition, since the first polarizing plate 50213 and the second polarizing plate 50214 are provided so as to be in a cross nicol state, light emitted from the backlight does not pass through the substrate. Therefore, black display is performed. This is a so-called normally black mode.

A liquid crystal display device having the structure shown in FIG. 135C or FIG. 135D can perform full-color display by being provided with a color filter. The color filter can be provided on a first substrate 50211 side or a second substrate 50212 side.

It is acceptable as long as a known material is used for a liquid crystal material used for an MVA mode.

Figure 136A:
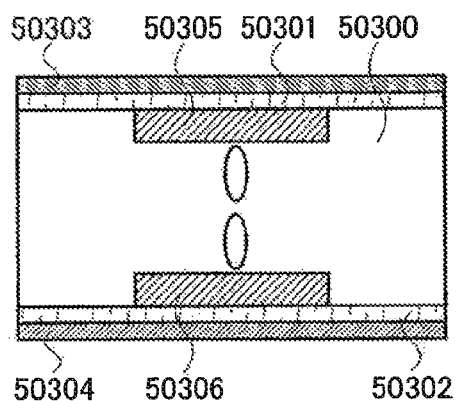
FIGS. 136A to 136D each illustrate the present invention.
Figure 136B:
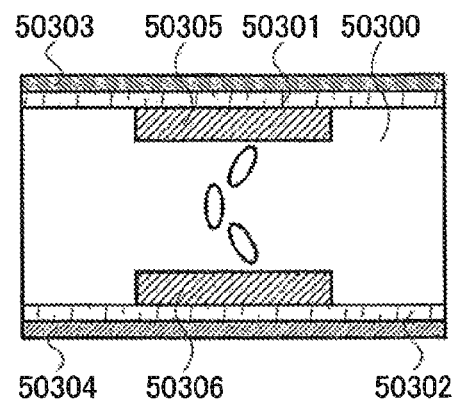

FIGS. 136A and 136B are schematic views of cross sections of an OCB mode. In the OCB mode, viewing angle dependency is low because alignment of liquid crystal molecules in a liquid crystal layer can be optically compensated. This state of the liquid crystal molecules is referred to as bend alignment.

A liquid crystal layer 50300 is held between a first substrate 50301 and a second substrate 50302 which are provided so as to be opposite to each other. A first electrode 50305 is formed on a top surface of the first substrate 50301. A second electrode 50306 is formed on a top surface of the second substrate 50302. A first polarizing plate 50303 is provided on a surface of the first substrate 50301, which does not face the liquid crystal layer. A second polarizing plate 50304 is provided on a surface of the second substrate 50302, which does not face the liquid crystal layer. Note that the first polarizing plate 50303 and the second polarizing plate 50304 are provided so as to be in a cross nicol state.

The first polarizing plate 50303 may be provided on the top surface of the first substrate 50301. The second polarizing plate 50304 may be provided on the top surface of the second substrate 50302.

It is acceptable as long as at least one of or both the first electrode 50305 and the second electrode 50306 have light-transmitting properties (a transmissive or reflective liquid crystal display device). Alternatively, both the first electrode 50305 and the second electrode 50306 may have light-transmitting properties, and part of one of the electrodes may have reflectivity (a semi-transmissive liquid crystal display device).

FIG. 136A is a schematic view of a cross section in the case where voltage is applied to the first electrode 50305 and the second electrode 50306 (referred to as a vertical electric field mode). Since liquid crystal molecules are aligned longitudinally, light emitted from a backlight is not affected by birefringence of the liquid crystal molecules. In addition, since the first polarizing plate 50303 and the second polarizing plate 50304 are provided so as to be in a cross nicol state, light emitted from the backlight does not pass through the substrate. Therefore, black display is performed.

Note that when voltage applied to the first electrode 50305 and the second electrode 50306 is controlled, conditions of the liquid crystal molecules can be controlled. Therefore, since the amount of light emitted from the backlight passing through the substrate can be controlled, predetermined image display can be performed.

FIG. 136B is a schematic view of a cross section in the case where voltage is not applied to the first electrode 50305 and the second electrode 50306. Since liquid crystal molecules are in a bend alignment state, light emitted from a backlight is affected by birefringence of the liquid crystal molecules. In addition, since the first polarizing plate 50303 and the second polarizing plate 50304 are provided so as to be in a cross nicol state, light emitted from the backlight passes through the substrate. Therefore, white display is performed. This is a so-called normally white mode.

A liquid crystal display device having the structure shown in FIG. 136A or FIG. 136B can perform full-color display by being provided with a color filter. The color filter can be provided on a first substrate 50301 side or a second substrate 50302 side.

It is acceptable as long as a known material is used for a liquid crystal material used for an QCB mode.

Figure 136C:
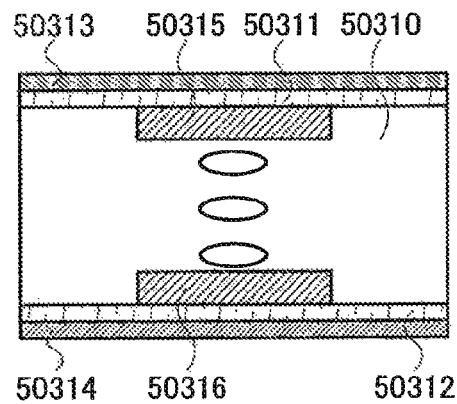
Figure 136D:
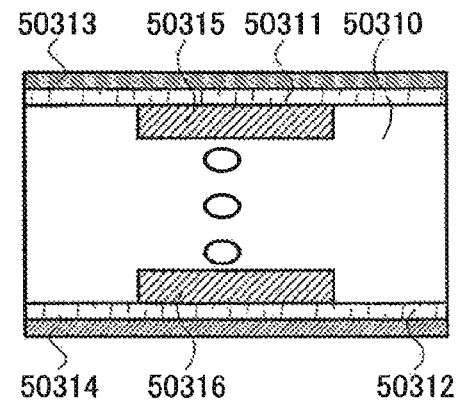

FIGS. 136C and 136D are schematic views of cross sections of an FLC mode or an AFLC mode.

A liquid crystal layer 50310 is held between a first substrate 50311 and a second substrate 50312 which are provided so as to be opposite to each other. A first electrode 50315 is formed on a top surface of the first substrate 50311. A second electrode 50316 is formed on a top surface of the second substrate 50312. A first polarizing plate 50313 is provided on a surface of the first substrate 50311, which does not face the liquid crystal layer. A second polarizing plate 50314 is provided on a surface of the second substrate 50312, which does not face the liquid crystal layer. Note that the first polarizing plate 50313 and the second polarizing plate 50314 are provided so as to be in a cross nicol state.

The first polarizing plate 50313 may be provided on the top surface of the first substrate 50311. The second polarizing plate 50314 may be provided on the top surface of the second substrate 50312.

It is acceptable as long as at least one of or both the first electrode 50315 and the second electrode 50316 have light-transmitting properties (a transmissive or reflective liquid crystal display device). Alternatively, both the first electrode 50315 and the second electrode 50316 may have light-transmitting properties, and part of one of the electrodes may have reflectivity (a semi-transmissive liquid crystal display device).

FIG. 136C is a schematic view of a cross section in the case where voltage is applied to the first electrode 50315 and the second electrode 50316 (referred to as a vertical electric field mode). Since liquid crystal molecules are aligned laterally in a direction which is deviated from a rubbing direction, light emitted from a backlight is affected by birefringence of the liquid crystal molecules. In addition, since the first polarizing plate 50313 and the second polarizing plate 50314 are provided so as to be in a cross nicol state, light emitted from the backlight passes through the substrate. Therefore, white display is performed.

Note that when voltage applied to the first electrode 50315 and the second electrode 50316 is controlled, conditions of the liquid crystal molecules can be controlled. Therefore, since the amount of light emitted from the backlight passing through the substrate can be controlled, predetermined image display can be performed.

FIG. 136D is a schematic view of a cross section in the case where voltage is not applied to the first electrode 50315 and the second electrode 50316. Since liquid crystal molecules are aligned laterally in a rubbing direction, light emitted from a backlight is not affected by birefringence of the liquid crystal molecules. In addition, since the first polarizing plate 50313 and the second polarizing plate 50314 are provided so as to be in a cross nicol state, light emitted from the backlight does not pass through the substrate. Therefore, black display is performed. This is a so-called normally black mode.

A liquid crystal display device having the structure shown in FIG. 136C or FIG. 136D can perform full-color display by being provided with a color filter. The color filter can be provided on a first substrate 50311 side or a second substrate 50312 side.

It is acceptable as long as a known material is used for a liquid crystal material used for an FLC mode or an AFLC mode.

Figure 137A:
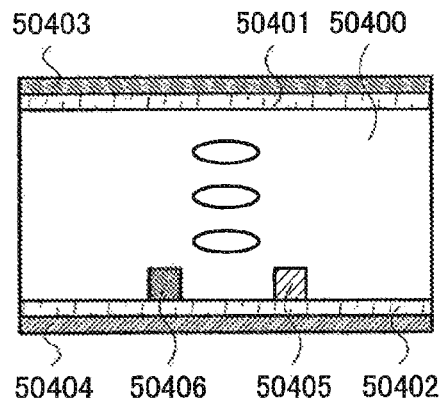
FIGS. 137A to 137D each illustrate the present invention.
Figure 137B:
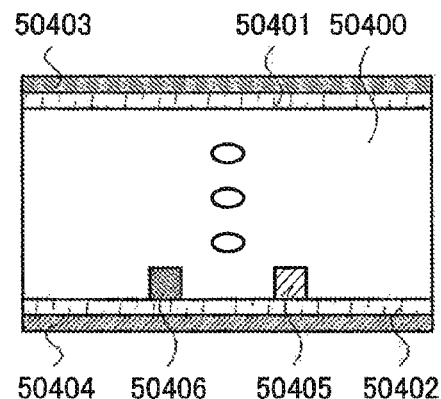

FIGS. 137A and 137B are schematic views of cross sections of an IPS mode. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50400 is held between a first substrate 50401 and a second substrate 50402 which are provided so as to be opposite to each other. A first electrode 50405 and a second electrode 50406 are formed on a top surface of the second substrate 50402. A first polarizing plate 50403 is provided on a surface of the first substrate 50401, which does not face the liquid crystal layer. A second polarizing plate 50404 is provided on a surface of the second substrate 50402, which does not face the liquid crystal layer. Note that the first polarizing plate 50403 and the second polarizing plate 50404 are provided so as to be in a cross nicol state.

The first polarizing plate 50403 may be provided on the top surface of the first substrate 50401. The second polarizing plate 50404 may be provided on the top surface of the second substrate 50402.

It is acceptable as long as both the first electrode 50405 and the second electrode 50406 have light-transmitting properties. Alternatively, part of one of the first electrode 50405 and the second electrode 50406 may have reflectivity.

FIG. 137A is a schematic view of a cross section in the case where voltage is applied to the first electrode 50405 and the second electrode 50406 (referred to as a horizontal electric field mode). Since liquid crystal molecules are aligned along a line of electric force which is deviated from a rubbing direction, light emitted from a backlight is affected by birefringence of the liquid crystal molecules. In addition, since the first polarizing plate 50403 and the second polarizing plate 50404 are provided so as to be in a cross nicol state, light emitted from the backlight passes through the substrate. Therefore, white display is performed.

Note that when voltage applied to the first electrode 50405 and the second electrode 50406 is controlled, conditions of the liquid crystal molecules can be controlled. Therefore, since the amount of light emitted from the backlight passing through the substrate can be controlled, predetermined image display can be performed.

FIG. 137B is a schematic view of a cross section in the case where voltage is not applied to the first electrode 50405 and the second electrode 50406. Since liquid crystal molecules are aligned laterally in a rubbing direction, light emitted from a backlight is not affected by birefringence of the liquid crystal molecules. In addition, since the first polarizing plate 50403 and the second polarizing plate 50404 are provided so as to be in a cross nicol state, light emitted from the backlight does not pass through the substrate. Therefore, black display is performed. This is a so-called normally black mode.

A liquid crystal display device having the structure shown in FIG. 137A or FIG. 137B can perform full-color display by being provided with a color filter. The color filter can be provided on a first substrate 50401 side or a second substrate 50402 side.

It is acceptable as long as a known material is used for a liquid crystal material used for an IPS mode.

Figure 137C:
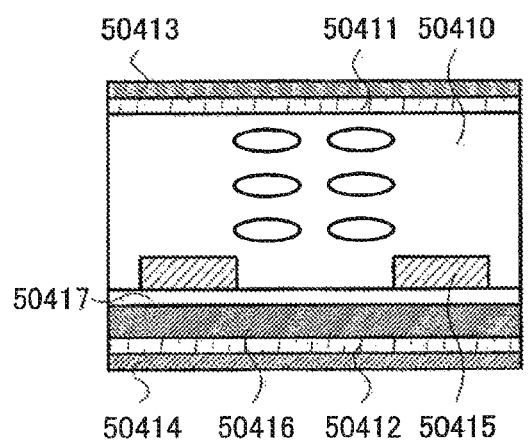
Figure 137D:
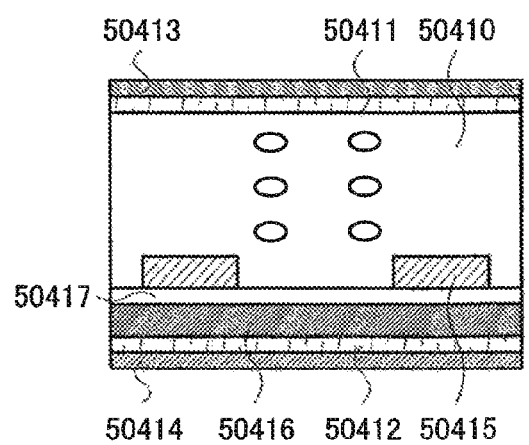

FIGS. 137C and 137D are schematic views of cross sections of an FFS mode. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50410 is held between a first substrate 50411 and a second substrate 50412 which are provided so as to be opposite to each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on a surface of the first substrate 50411, which does not face the liquid crystal layer. A second polarizing plate 50414 is provided on a surface of the second substrate 50412, which does not face the liquid crystal layer. Note that the first polarizing plate 50413 and the second polarizing plate 50414 are provided so as to be in a cross nicol state.

The first polarizing plate 50413 may be provided on the top surface of the first substrate 50411. The second polarizing plate 50414 may be provided on the top surface of the second substrate 50412.

It is acceptable as long as both the first electrode 50415 and the second electrode 50416 have light-transmitting properties. Alternatively, part of one of the electrodes may have reflectivity.

FIG. 137C is a schematic view of a cross section in the case where voltage is applied to the first electrode 50415 and the second electrode 50416 (referred to as a horizontal electric field mode). Since liquid crystal molecules are aligned along a line of electric force which is deviated from a rubbing direction, light emitted from a backlight is affected by birefringence of the liquid crystal molecules. In addition, since the first polarizing plate 50413 and the second polarizing plate 50414 are provided so as to be in a cross nicol state, light emitted from the backlight passes through the substrate. Therefore, white display is performed.

Note that when voltage applied to the first electrode 50415 and the second electrode 50416 is controlled, conditions of the liquid crystal molecules can be controlled. Therefore, since the amount of light emitted from the backlight passing through the substrate can be controlled, predetermined image display can be performed.

FIG. 137D is a schematic view of a cross section in the case where voltage is not applied to the first electrode 50415 and the second electrode 50416. Since liquid crystal molecules are aligned laterally in a rubbing direction, light emitted from the backlight is not affected by birefringence of the liquid crystal molecules. In addition, since the first polarizing plate 50413 and the second polarizing plate 50414 are provided so as to be in a cross nicol state, light emitted from the backlight does not pass through the substrate. Therefore, black display is performed. This is a so-called normally black mode.

A liquid crystal display device having the structure shown in FIG. 137C or FIG. 137D can perform full-color display by being provided with a color filter. The color filter can be provided on a first substrate 50411 side or a second substrate 50412 side.

It is acceptable as long as a known material is used for a liquid crystal material used for an FFS mode.

Next, various liquid crystal modes are described with reference to top views.

Figure 138:
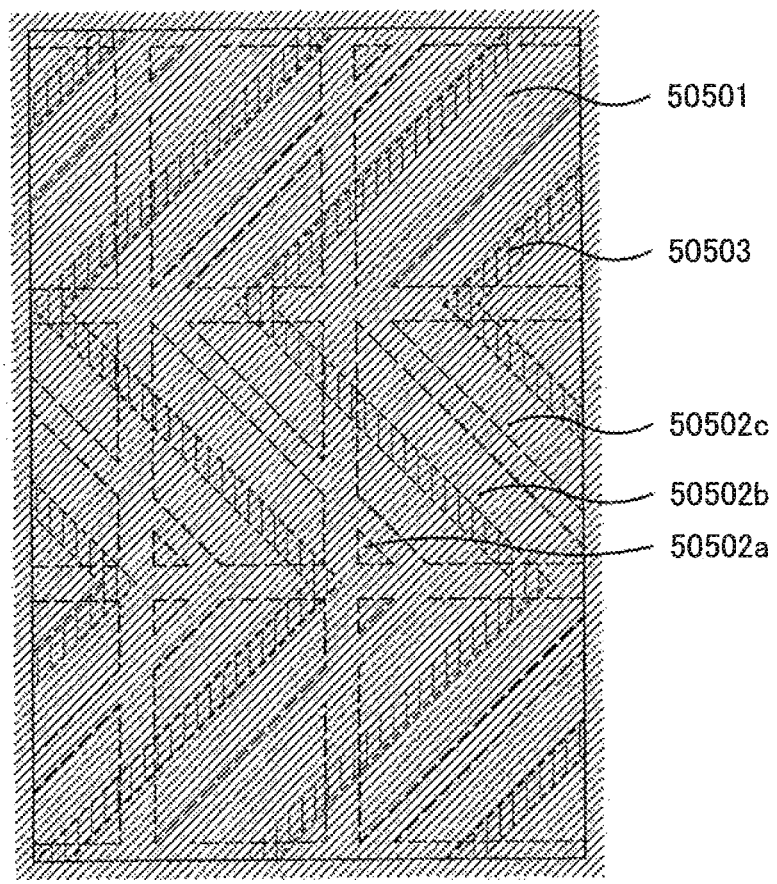
FIG. 138 illustrates the present invention.

FIG. 138 is a top view of a pixel portion to which an MVA mode is applied. In the MVA mode, viewing angle dependency of each portion is compensated by each other.

FIG. 138 shows a first pixel electrode 50501, second pixel electrodes (50502a, 50502b, and 50502c), and a protrusion 50503. The first pixel electrode 50501 is formed over the entire surface of a counter substrate. The protrusion 50503 is formed so as to be a dogleg shape. In addition, the second pixel electrodes (50502a, 50502b, and 50502c) are formed over the first pixel electrode 50501 so as to have shapes corresponding to the protrusion 50503.

Opening portions of the second pixel electrodes (50502a, 50502b, and 50502c) function like protrusions.

In the case where voltage is applied to the first pixel electrode 50501 and the second pixel electrodes (50502a, 50502b, and 50502c) (referred to as a vertical electric field mode), liquid crystal molecules are aligned so as to tilt toward the opening portions of the second pixel electrodes (50502a, 50502b, and 50502c) and the protrusion 50503. Since light emitted from a backlight passes through a substrate when a pair of polarizing plates is provided so as to be in a cross nicol state, white display is performed.

Note that when voltage applied to the first pixel electrode 50501 and the second pixel electrodes (50502a, 50502b, and 50502c) is controlled, conditions of the liquid crystal molecules can be controlled. Therefore, since the amount of light emitted from the backlight passing through the substrate can be controlled, predetermined image display can be performed.

In the case where voltage is not applied to the first pixel electrode 50501 and the second pixel electrodes (50502a, 50502b, and 50502c), the liquid crystal molecules are aligned longitudinally. Since light emitted from the backlight does not pass through a panel when the pair of polarizing plates is provided so as to be in the cross nicol state, black display is performed. This is a so-called normally black mode.

It is acceptable as long as a known material is used for a liquid crystal material used for an MVA mode.

FIGS. 139A to 139D are top views of a pixel portion to which an IPS mode is applied. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

In the IPS mode, a pair of electrodes is formed so as to have different shapes.

Figure 139A:
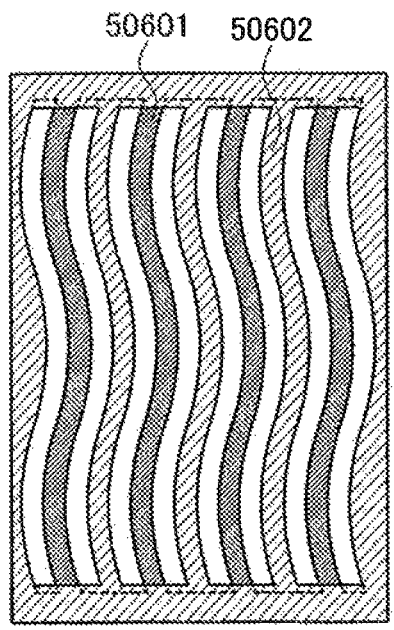
FIGS. 139A to 139D each illustrate the present invention.

FIG. 139A shows a first pixel electrode 50601 and a second pixel electrode 50602. The first pixel electrode 50601 and the second pixel electrode 50602 are wavy shapes.

Figure 139B:
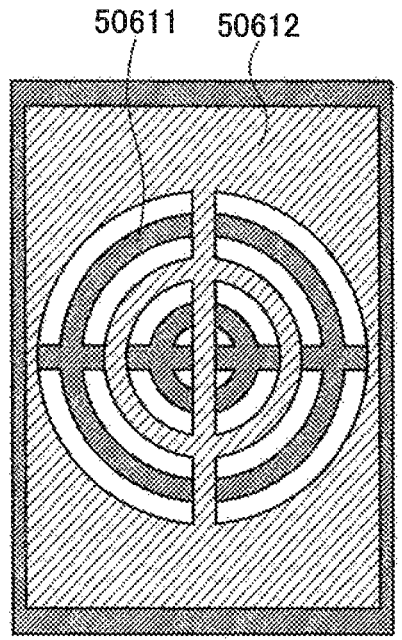

FIG. 139B shows a first pixel electrode 50611 and a second pixel electrode 50612. The first pixel electrode 50611 and the second pixel electrode 50612 have shapes having concentric openings.

Figure 139C:
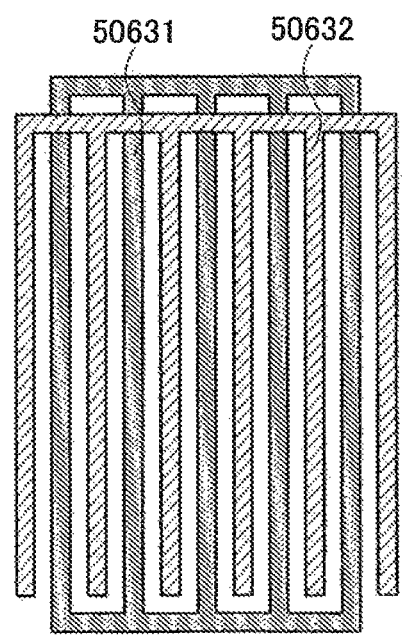

FIG. 139C shows a first pixel electrode 50631 and a second pixel electrode 50632. The first pixel electrode 50631 and the second pixel electrode 50632 are comb shapes and partially overlap with each other.

Figure 139D:
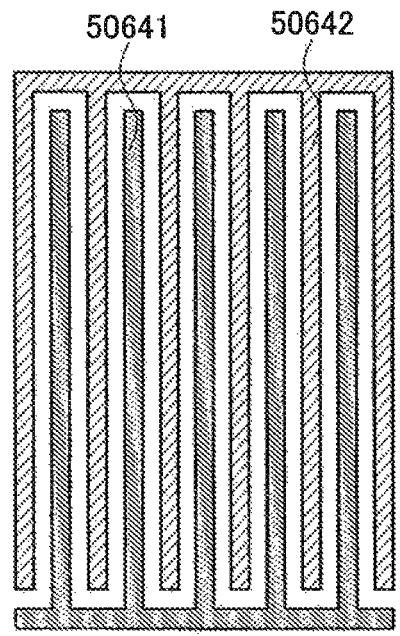

FIG. 139D shows a first pixel electrode 50641 and a second pixel electrode 50642. The first pixel electrode 50641 and the second pixel electrode 50642 are comb shapes in which electrodes engage with each other.

In the case where voltage is applied to the first pixel electrodes (50601, 50611, 50621, and 50631) and the second pixel electrodes (50602, 50612, 50622, and 50623) (referred to as a horizontal electric field mode), liquid crystal molecules are aligned along a line of electric force which is deviated from a rubbing direction. Since light emitted from a backlight passes through a substrate when a pair of polarizing plates is provided so as to be in a cross nicol state, white display is performed.

Note that when voltage applied to the first pixel electrodes (50601, 50611, 50621, and 50631) and the second pixel electrodes (50602, 50612, 50622, and 50623) is controlled, conditions of the liquid crystal molecules can be controlled. Therefore, since the amount of light emitted from the backlight passing through the substrate can be controlled, predetermined image display can be performed.

In the case where voltage is not applied to the first pixel electrodes (50601, 50611, 50621, and 50631) and the second pixel electrodes (50602, 50612, 50622, and 50623), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

It is acceptable as long as a known material be used for a liquid crystal material used for an IPS mode.

FIGS. 140A to 140D are top views of a pixel portion to which an FFS mode is applied. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

In the FFS mode, a first electrode is formed over a top surface of a second electrode so as to be various shapes.

Figure 140A:
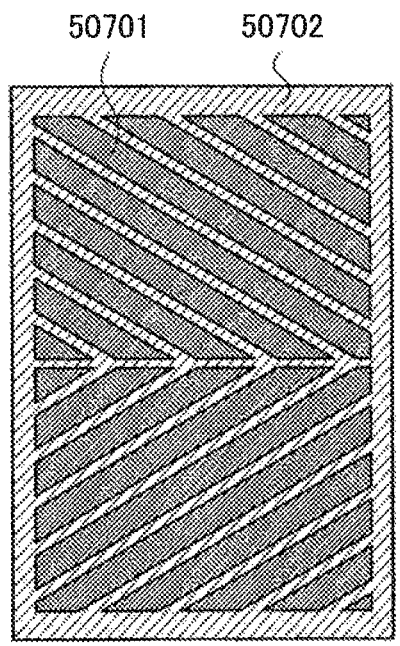
FIGS. 140A to 140D each illustrate the present invention.

FIG. 140A shows a first pixel electrode 50701 and a second pixel electrode 50702. The first pixel electrode 50701 is a bent dogleg shape. The second pixel electrode 50702 is not necessarily patterned.

Figure 140B:
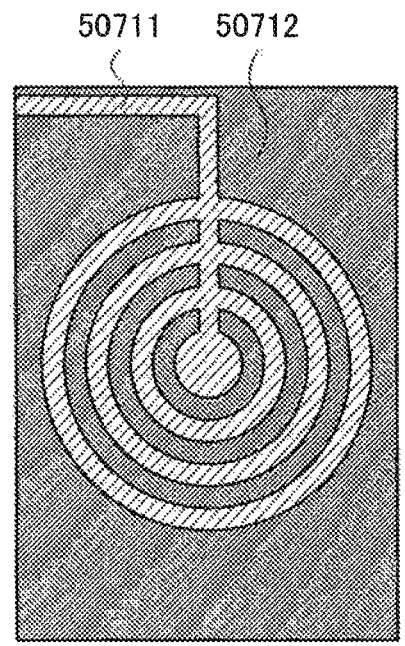

FIG. 140B shows a first pixel electrode 50711 and a second pixel electrode 50712. The first pixel electrode 50711 is a concentric shape. The second pixel electrode 50712 is not necessarily patterned.

Figure 140C:
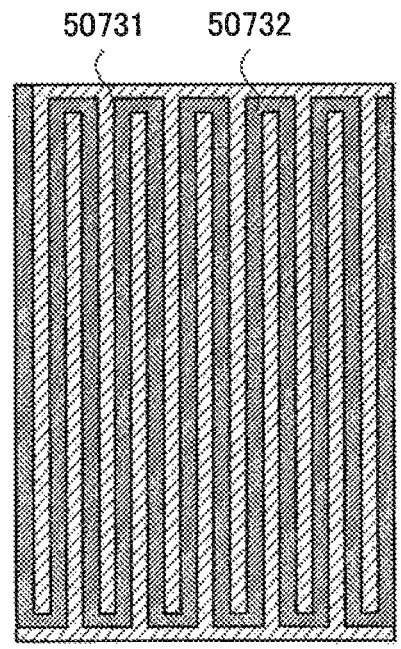

FIG. 140C shows a first pixel electrode 50731 and a second pixel electrode 50732. The first pixel electrode 50731 is a comb shape in which electrodes engage with each other. The second pixel electrode 50732 is not necessarily patterned.

Figure 140D:
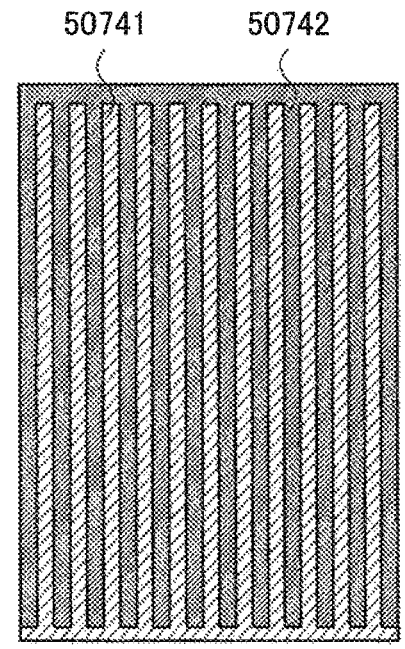

FIG. 140D shows a first pixel electrode 50741 and a second pixel electrode 50742. The first pixel electrode 50741 is a comb shape. The second pixel electrode 50742 is not necessarily patterned.

In the case where voltage is applied to the first pixel electrodes (50701, 50711, 50721, and 50731) and the second pixel electrodes (50702, 50712, 50722, and 50723) (referred to as a horizontal electric field mode), liquid crystal molecules are aligned along a line of electric force which is deviated from a rubbing direction. Since light emitted from a backlight passes through a substrate when a pair of polarizing plates is provided so as to be in a cross nicol state, white display is performed.

Note that when voltage applied to the first pixel electrodes (50701, 50711, 50721, and 50731) and the second pixel electrodes (50702, 50712, 50722, and 50723) is controlled, conditions of the liquid crystal molecules can be controlled. Therefore, since the amount of light emitted from the backlight passing through the substrate can be controlled, predetermined image display can be performed.

In the case where voltage is not applied to the first pixel electrodes (50701, 50711, 50721, and 50731) and the second pixel electrodes (50702, 50712, 50722, and 50723), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

It is acceptable as long as a known material is used for a liquid crystal material used for an FFS mode.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 10)

In this embodiment mode, a pixel structure of a display device is described. In particular, a pixel structure of a liquid crystal display device is described.

A pixel structure in the case where each liquid crystal mode and a transistor are combined is described with reference to cross-sectional views of a pixel.

Note that as the transistor, a thin film transistor (TFT) or the like including a non-single-crystal semiconductor layer typified by amorphous silicon, polycrystalline silicon, micro crystalline (also referred to as semi-amorphous) silicon, or the like can be used.

As the structure of the transistor, a top-gate structure, a bottom-gate structure, or the like can be used. Note that a channel-etched transistor, a channel-protective transistor, or the like can be used as a bottom-gate transistor.

Figure 85:
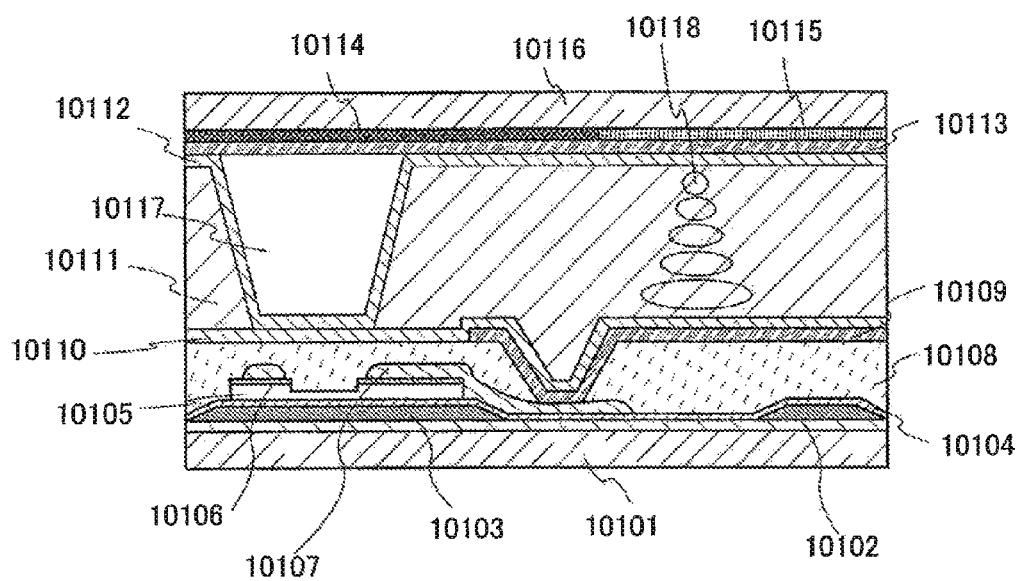
FIG. 85 illustrates the present invention.

FIG. 85 is an example of a cross-sectional view of a pixel in the case where a TN mode and a transistor are combined. When the pixel structure shown in FIG. 85 is applied to a liquid crystal display device, a liquid crystal display device can be formed at low cost.

Features of the pixel structure shown in FIG. 85 are described. Liquid crystal molecules 10118 shown in FIG. 85 are long and narrow molecules each having a major axis and a minor axis. In FIG. 85, a direction of each of the liquid crystal molecules 10118 is expressed by the length thereof. That is, the direction of the major axis of the liquid crystal molecule 10118, which is expressed as long, is parallel to the page, and as the liquid crystal molecule 10118 is expressed to be shorter, the direction of the major axis becomes closer to a normal direction of the page. That is, among the liquid crystal molecules 10118 shown in FIG. 85, the direction of the major axis of the liquid crystal molecule 10118 which is close to the first substrate 10101 and the direction of the major axis of the liquid crystal molecule 10118 which is close to the second substrate 10116 are different from each other by 90 degrees, and the directions of the major axes of the liquid crystal molecules 10118 located therebetween are arranged so as to link the above two directions smoothly. That is, the liquid crystal molecules 10118 shown in FIG. 85 are aligned to be twisted by 90 degrees between the first substrate 10101 and the second substrate 10116.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several μm therebetween, and a liquid crystal material is injected into a space between the two substrates. In FIG. 85, the two substrates correspond to the first substrate 10101 and the second substrate 10116. A transistor and a pixel electrode are formed over the first substrate. A light-shielding film 10114, a color filter 10115, a fourth conductive layer 10113, a spacer 10117, and a second alignment film 10112 are formed on the second substrate.

The light-shielding film 10114 is not necessarily formed on the second substrate 10116. When the light-shielding film 10114 is not formed, the number of steps is reduced, so that manufacturing cost can be reduced. In addition, since the structure is simple, yield can be improved. Alternatively, when the light-shielding film 10114 is formed, a display device with little light leakage at the time of black display can be obtained.

The color filter 10115 is not necessarily formed on the second substrate 10116. When the color filter 10115 is not formed, the number of steps is reduced, so that manufacturing cost can be reduced. In addition, since the structure is simple, yield can be improved. Note that even when the color filter 10115 is not formed, a display device which can perform color display can be obtained by field sequential driving. Alternatively, when the color filter 10115 is formed, a display device which can perform color display can be obtained.

Spherical spacers may be dispersed on the second substrate 10116 instead of forming the spacer 10117. When the spherical spacers are dispersed, the number of steps is reduced, so that manufacturing cost can be reduced. In addition, since the structure is simple, yield can be improved. Alternatively, when the spacer 10117 is formed, a distance between the two substrates can be uniform because a position of the spacer is not varied, so that a display device with little display unevenness can be obtained.

A process to be performed on the first substrate 10101 is described.

First, a first insulating film 10102 is formed over the first substrate 10101 by sputtering, a printing method, a coating method, or the like. Note that the first insulating film 10102 is not necessarily formed. The first insulating film 10102 has a function of preventing change in characteristics of the transistor due to an impurity from the substrate, which affects a semiconductor layer.

Next, a first conductive layer 10103 is formed over the first insulating film 10102 by photolithography, a laser direct writing method, an inkjet method, or the like.

Next, a second insulating film 10104 is formed over the entire surface by sputtering, a printing method, a coating method, or the like. The second insulating film 10104 has a function of preventing change in characteristics of the transistor due to an impurity from the substrate, which affects the semiconductor layer.

Next, a first semiconductor layer 10105 and a second semiconductor layer 10106 are formed. Note that the first semiconductor layer 10105 and the second semiconductor layer 10106 are formed sequentially and shapes thereof are processed at the same time.

Next, a second conductive layer 10107 is formed by photolithography, a laser direct writing method, an inkjet method, or the like. Note that as a method for etching which is performed at the time of processing the shape of the second conductive layer 10107, dry etching is preferable. Note that either a light-transmitting material or a reflective material may be used for the second conductive layer 10107.

Next, a channel region of the transistor is formed. Here, an example of a step thereof is described. The second semiconductor layer 10106 is etched by using the second conductive layer 10107 as a mask. Alternatively, the second semiconductor layer 10106 is etched by using a mask for processing the shape of the second conductive layer 10107. Then, the first conductive layer 10103 at a position where the second semiconductor layer 10106 is removed serves as the channel region of the transistor. Thus, the number of masks can be reduced, so that manufacturing cost can be reduced.

Next, a third insulating film 10108 is formed and a contact hole is selectively formed in the third insulating film 10108. Note that a contact hole may be formed also in the second insulating film 10104 at the same time as forming the contact hole in the third insulating film 10108. Note that the surface of the third insulating film 10108 is preferably as even as possible. This is because alignment of the liquid crystal molecules are affected by unevenness of a surface with which the liquid crystal is in contact.

Next, a third conductive layer 10109 is formed by photolithography, a laser direct writing method, an inkjet method, or the like.

Next, a first alignment film 10110 is formed. Note that after the first alignment film 10110 is formed, rubbing may be performed so as to control the alignment of the liquid crystal molecules. Rubbing is a step of forming stripes on an alignment film by rubbing the alignment film with a cloth. When rubbing is performed, the alignment film can have alignment properties.

The first substrate 10101 which is manufactured as described above and the second substrate 10116 on which the light-shielding film 10114, the color filter 10115, the fourth conductive layer 10113, the spacer 10117, and the second alignment film 10112 are formed are attached to each other by a sealant with a gap of several μm therebetween. Then, a liquid crystal material is injected into a space between the two substrates. Note that in the TN mode, the fourth conductive layer 10113 is formed over the entire surface of the second substrate 10116.

Figure 86A:
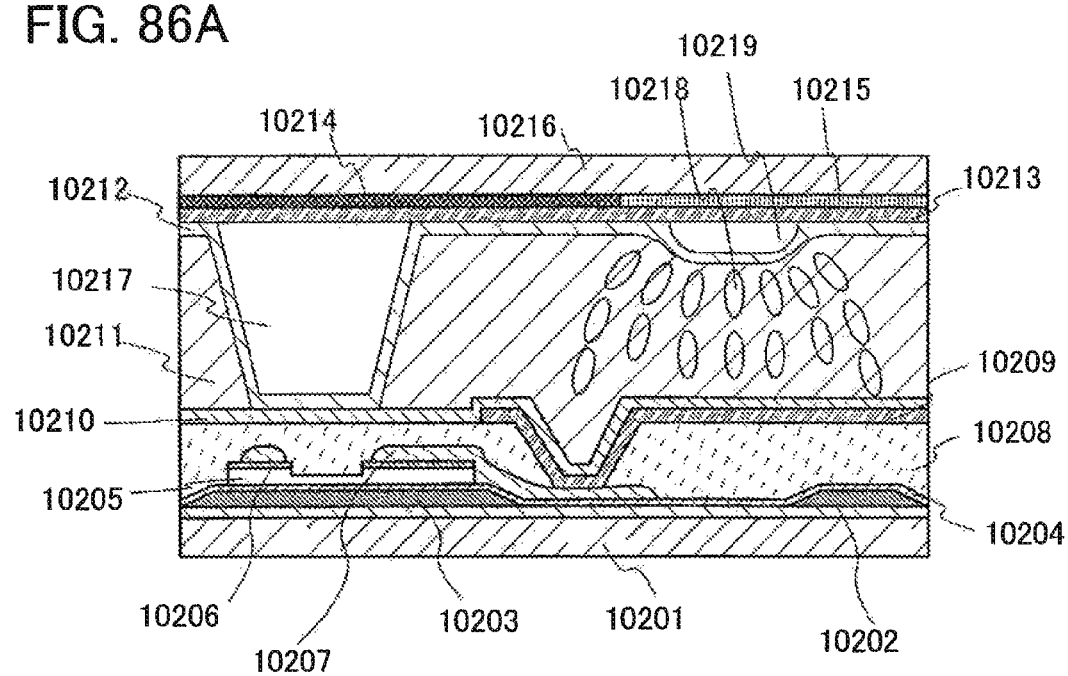
FIGS. 86A and 86B each illustrate the present invention.

FIG. 86A is an example of a cross-sectional view of a pixel in the case where an MVA (multi-domain vertical alignment) mode and a transistor are combined. When the pixel structure shown in FIG. 86A is applied to a liquid crystal display device, a liquid crystal display device having a wide viewing angle, high response speed, and high contrast can be obtained.

Features of the pixel structure shown in FIG. 86A are described. Liquid crystal molecules 10218 shown in FIG. 86A are long and narrow molecules each having a major axis and a minor axis. In FIG. 86A, a direction of each of the liquid crystal molecules 10218 is expressed by the length thereof. That is, the direction of the major axis of the liquid crystal molecule 10218, which is expressed as long, is parallel to the page, and as the liquid crystal molecule 10218 is expressed to be shorter, the direction of the major axis becomes closer to a normal direction of the page. That is, each of the liquid crystal molecules 10218 shown in FIG. 86A is aligned such that the direction of the major axis is normal to the alignment film. Thus, the liquid crystal molecules 10218 at a position where an alignment control protrusion 10219 is formed are aligned radially with the alignment control protrusion 10219 as a center. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several therebetween, and a liquid crystal material is injected into a space between the two substrates. In FIG. 86A, the two substrates correspond to the first substrate 10201 and the second substrate 10216. A transistor and a pixel electrode are formed over the first substrate. A light-shielding film 10214, a color filter 10215, a fourth conductive layer 10213, a spacer 10217, a second alignment film 10212, and an alignment control protrusion 10219 are formed on the second substrate.

The light-shielding film 10214 is not necessarily formed on the second substrate 10216. When the light-shielding film 10214 is not formed, the number of steps is reduced, so that manufacturing cost can be reduced. In addition, since the structure is simple, yield can be improved. Alternatively, when the light-shielding film 10214 is formed, a display device with little light leakage at the time of black display can be obtained.

The color filter 10215 is not necessarily formed on the second substrate 10216. When the color fitter 10215 is not formed, the number of steps is reduced, so that manufacturing cost can be reduced. In addition, since the structure is simple, yield can be improved. Note that even when the color filter 10215 is not formed, a display device which can perform color display can be obtained by field sequential driving. Alternatively, when the color filter 10215 is formed, a display device which can perform color display can be obtained.

Spherical spacers may be dispersed on the second substrate 10216 instead of forming the spacer 10217. When the spherical spacers are dispersed, the number of steps is reduced, so that manufacturing cost can be reduced. In addition, since the structure is simple, yield can be improved. Alternatively, when the spacer 10217 is formed, a distance between the two substrates can be uniform because a position of the spacer is not varied, so that a display device with little display unevenness can be obtained.

A process to be performed on the first substrate 10201 is described.

First, a first insulating film 10202 is formed over the first substrate 10201 by sputtering, a printing method, a coating method, or the like. Note that the first insulating film 10202 is not necessarily formed. The first insulating film 10202 has a function of preventing change in characteristics of the transistor due to an impurity from the substrate, which affects a semiconductor layer.

Next, a first conductive layer 10203 is formed over the first insulating film 10202 by photolithography, a laser direct writing method, an inkjet method, or the like.

Next, a second insulating film 10204 is formed over the entire surface by sputtering, a printing method, a coating method, or the like. The second insulating film 10204 has a function of preventing change in characteristics of the transistor due to an impurity from the substrate, which affects the semiconductor layer.

Next, a first semiconductor layer 10205 and a second semiconductor layer 10206 are formed. Note that the first semiconductor layer 10205 and the second semiconductor layer 10206 are formed sequentially and shapes thereof are processed at the same time.

Next, a second conductive layer 10207 is formed by photolithography, a laser direct writing method, an inkjet method, or the like. Note that as a method for etching which is performed at the time of processing the shape of the second conductive layer 10207, dry etching is preferable. Note that as the second conductive layer 10207, either a light-transmitting material or a reflective material may be used.

Next, a channel region of the transistor is formed. Here, an example of a step thereof is described. The second semiconductor layer 10206 is etched by using the second conductive layer 10207 as a mask. Alternatively, the second semiconductor layer 10206 is etched by using a mask for processing the shape of the second conductive layer 10207. Then, the first conductive layer 10203 at a position where the second semiconductor layer 10206 is removed serves as the channel region of the transistor. Thus, the number of masks can be reduced, so that manufacturing cost can be reduced.

Next, a third insulating film 10208 is formed and a contact hole is selectively formed in the third insulating film 10208. Note that a contact hole may be formed also in the second insulating film 10204 at the same time as forming the contact hole in the third insulating film 10208.

Next, a third conductive layer 10209 is formed by photolithography, a laser direct writing method, an inkjet method, or the like.

Next, a first alignment film 10210 is formed. Note that after the first alignment film 10210 is formed, rubbing may be performed so as to control the alignment of the liquid crystal molecules. Rubbing is a step of forming stripes on an alignment film by rubbing the alignment film with a cloth. When rubbing is performed, the alignment film can have alignment properties.

The first substrate 10201 which is manufactured as described above and the second substrate 10216 on which the light-shielding film 10214, the color filter 10215, the fourth conductive layer 10213, the spacer 10217, and the second alignment film 10212 are manufactured are attached to each other by a sealant with a gap of several μm therebetween. Then, a liquid crystal material is injected into a space between the two substrates. Note that in the MVA mode, the fourth conductive layer 10213 is formed over the entire surface of the second substrate 10216. Note that the alignment control protrusion 10219 is formed so as to be in contact with the fourth conductive layer 10213. The alignment control protrusion 10219 preferably has a shape with a smooth curved surface. Thus, alignment of the adjacent liquid crystal molecules 10218 is extremely similar, so that an alignment defect can be reduced. Further, a defect of the alignment film caused by breaking of the alignment film can be reduced.

Figure 86B:
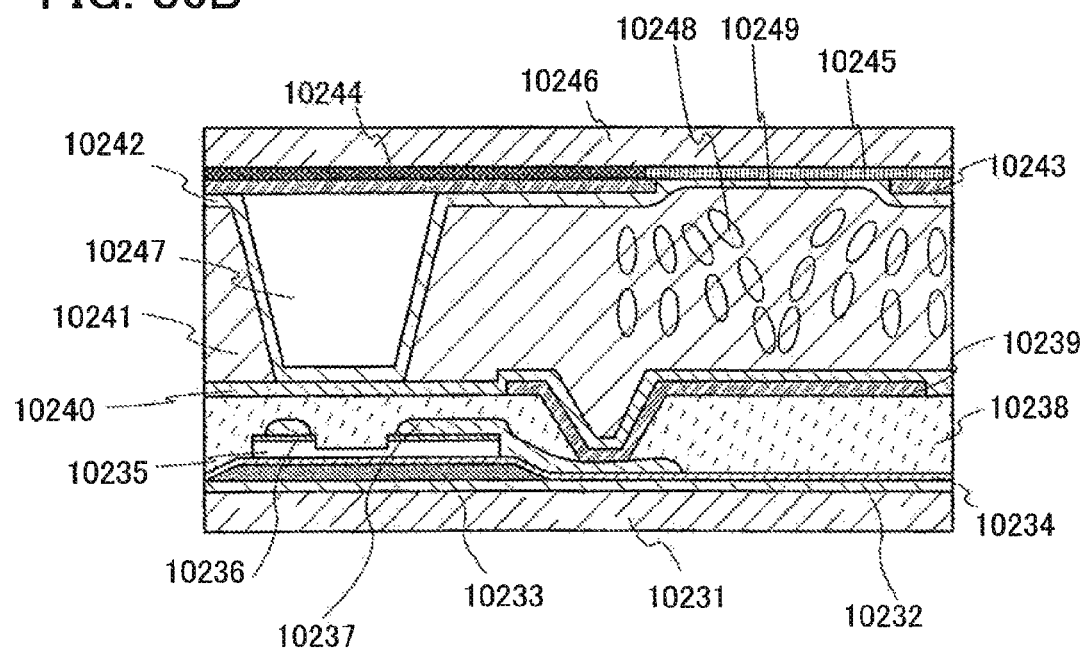

FIG. 86B is an example of a cross-sectional view of a pixel in the case where a PVA (patterned vertical alignment) mode and a transistor are combined. When the pixel structure shown in FIG. 86B is applied to a liquid crystal display device, a liquid crystal display device having a wide viewing angle, high response speed, and high contrast can be obtained.

Features of the pixel structure shown in FIG. 86B are described. Liquid crystal molecules 10248 shown in FIG. 86B are long and narrow molecules each having a major axis and a minor axis. In FIG. 86B, direction of each of the liquid crystal molecules 10248 is expressed by the length thereof. That is, the direction of the major axis of the liquid crystal molecule 10248, which is expressed as long, is parallel to the page, and as the liquid crystal molecule 10248 is expressed to be shorter, the direction of the major axis becomes closer to a normal direction of the page. That is, each of the liquid crystal molecules 10248 shown in FIG. 86B is aligned such that the direction of the major axis is normal to the alignment film. Thus, the liquid crystal molecules 10248 at a position where an electrode notch portion 10249 is formed are aligned radially with a boundary of the electrode notch portion 10249 and the fourth conductive layer 10243 as a center. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several μm therebetween, and a liquid crystal material is injected into a space between the two substrates. In FIG. 23B, the two substrates correspond to the first substrate 10231 and the second substrate 10246. A transistor and a pixel electrode are formed over the first substrate. A light-shielding film 10244, a color filter 10245, a fourth conductive layer 10243, a spacer 10247, and a second alignment film 10242 are formed on the second substrate.

The light-shielding film 10244 is not necessarily formed on the second substrate 10246. When the light-shielding film 10244 is not formed, the number of steps is reduced, so that manufacturing cost can be reduced. In addition, since the structure is simple, yield can be improved. Alternatively, when the light-shielding film 10244 is formed, a display device with little light leakage at the time of black display can be obtained.

The color filter 10245 is not necessarily formed on the second substrate 10246. When the color filter 10245 is not formed, the number of steps is reduced, so that manufacturing cost can be reduced. In addition, since the structure is simple, yield can be improved. Note that even when the color filter 10245 is not formed, a display device which can perform color display can be obtained by field sequential driving. Alternatively, when the color filter 10245 is formed, a display device which can perform color display can be obtained.

Spherical spacers may be dispersed on the second substrate 10246 instead of forming the spacer 10247. When the spherical spacers are dispersed, the number of steps is reduced, so that manufacturing cost can be reduced. In addition, since the structure is simple, yield can be improved. Alternatively, when the spacer 10247 is formed, a distance between the two substrates can be uniform because a position of the spacer is not varied, so that a display device with little display unevenness can be obtained.

A process to be performed on the first substrate 10231 is described.

First, a first insulating film 10232 is formed over the first substrate 10231 by sputtering, a printing method, a coating method, or the like. Note that the first insulating film 10232 is not necessarily formed. The first insulating film 10232 has a function of preventing change in characteristics of the transistor due to an impurity from the substrate, which affects a semiconductor layer.

Next, a first conductive layer 10233 is formed over the first insulating film 10232 by photolithography, a laser direct writing method, an inkjet method, or the like.

Next, a second insulating film 10234 is formed over the entire surface by sputtering, a printing method, a coating method, or the like. The second insulating film 10234 has a function of preventing change in characteristics of the transistor due to an impurity from the substrate, which affects the semiconductor layer.

Next, a first semiconductor layer 10235 and a second semiconductor layer 10236 are formed. Note that the first semiconductor layer 10235 and the second semiconductor layer 10236 are formed sequentially and shapes thereof are processed at the same time.

Next, a second conductive layer 10237 is formed by photolithography, a laser direct writing method, an inkjet method, or the like. Note that as a method for etching which is performed at the time of processing a shape of the second conductive layer 10237, dry etching is preferable. Note that as the second conductive layer 10237, either a light-transmitting material or a reflective material may be used.

Next, a channel region of the transistor is formed. Here, an example of a step thereof is described. The second semiconductor layer 10236 is etched by using the second conductive layer 10237 as a mask. Alternatively, the second semiconductor layer 10236 is etched by using a mask for processing the shape of the second conductive layer 10237. Then, the first conductive layer 10233 at a position where the second semiconductor layer 10236 is removed serves as the channel region of the transistor. Thus, the number of masks can be reduced, so that manufacturing cost can be reduced.

Next, a third insulating film 10238 is formed and a contact hole is selectively formed in the third insulating film 10238. Note that a contact hole may be formed also in the second insulating film 10234 at the same time as forming the contact hole in the third insulating film 10238. Note that the surface of the third insulating film 10238 is preferably as even as possible. This is because alignment of the liquid crystal molecules are affected by unevenness of a surface with which the liquid crystal is in contact.

Next, a third conductive layer 10239 is formed by photolithography, a laser direct writing method, an inkjet method, or the like.

Next, a first alignment film 10240 is formed. Note that after the first alignment film 10240 is formed, rubbing may be performed so as to control the alignment of the liquid crystal molecules. Rubbing is a step of forming stripes on an alignment film by rubbing the alignment film with a cloth. When rubbing is performed, the alignment film can have alignment properties.

The first substrate 10231 which is manufactured as described above and the second substrate 10246 on which the light-shielding film 10244, the color filter 10245, the fourth conductive layer 10243, the spacer 10247, and the second alignment film 10242 are manufactured are attached to each other by a sealant with a gap of several μm therebetween. Then, a liquid crystal material is injected into a space between the two substrates. Note that in the PVA mode, the fourth conductive layer 10243 is patterned and is provided with the electrode notch portion 10249. Although the shape of the electrode notch portion 10249 is not particularly limited to a certain shape, the electrode notch portion 10249 preferably has a shape in which a plurality of rectangles having different directions are combined. Thus, a plurality of regions having different alignment can be formed, so that a liquid crystal display device having a wide viewing angle can be obtained. Note that the fourth conductive layer 10243 at the boundary between the electrode notch portion 10249 and the fourth conductive layer 10243 preferably has a shape with a smooth curved surface. Thus, alignment of the adjacent liquid crystal molecules 10248 is extremely similar, so that an alignment defect is reduced. Further, a defect of the alignment film caused by breaking of the second alignment film 10242 by the electrode notch portion 10249 can be prevented.

Figure 87A:
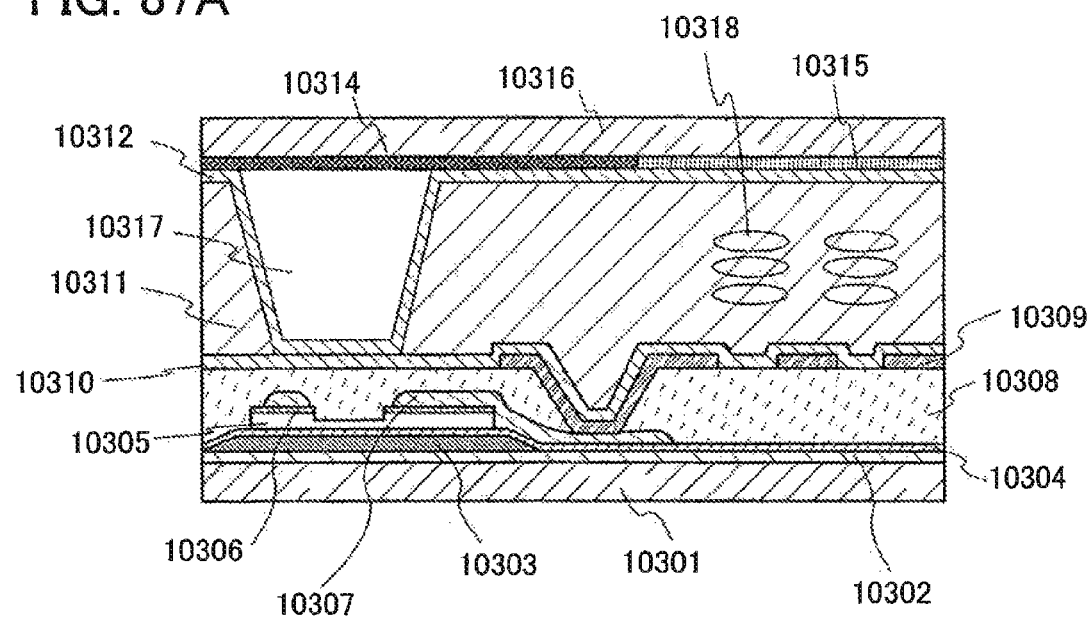
FIGS. 87A and 87B each illustrate the present invention.

FIG. 87A is an example of a cross-sectional view of a pixel in the case where an IPS (in-plane-switching) mode and a transistor are combined. When the pixel structure shown in FIG. 87A is applied to a liquid crystal display device, a liquid crystal display device theoretically having a wide viewing angle and response speed which has low dependency on a gray scale can be obtained.

Features of the pixel structure shown in FIG. 87A are described. Liquid crystal molecules 10318 shown in FIG. 87A are long and narrow molecules each having a major axis and a minor axis. In FIG. 87A, a direction of each of the liquid crystal molecules 10318 is expressed by the length thereof. That is, the direction of the major axis of the liquid crystal molecule 10318, which is expressed as long, is parallel to the page, and as the liquid crystal molecule 10318 is expressed to be shorter, the direction of the major axis becomes closer to a normal direction of the page. That is, each of the liquid crystal molecules 10318 shown in FIG. 87A is aligned so that the direction of the major axis thereof is always horizontal to the substrate. Although FIG. 87A shows alignment with no electric field, when an electric field is applied to each of the liquid crystal molecules 10318, each of the liquid crystal molecules 10318 rotates in a horizontal plane as the direction of the major axis thereof is always horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several μm therebetween, and a liquid crystal material is injected into a space between the two substrates. In FIG. 87A, the two substrates correspond to the first substrate 10301 and the second substrate 10316. A transistor and a pixel electrode are formed over the first substrate. A light-shielding film 10314, a color filter 10315, a fourth conductive layer 10313, a spacer 10317, and a second alignment film 10312 are formed on the second substrate.

The light-shielding film 10314 is not necessarily formed on the second substrate 10316. When the light-shielding film 10314 is not formed, the number of steps is reduced, so that manufacturing cost can be reduced. In addition, since the structure is simple, yield can be improved. Alternatively, when the light-shielding film 10314 is formed, a display device with little light leakage at the time of black display can be obtained.

The color filter 10315 is not necessarily formed on the second substrate 10316. When the color filter 10315 is not formed, the number of steps is reduced, so that manufacturing cost can be reduced. In addition, since the structure is simple, yield can be improved. Note that even when the color filter 10315 is not formed, a display device which can perform color display can be obtained by field sequential driving. Alternatively, when the color filter 10315 is formed, a display device which can perform color display can be obtained.

Spherical spacers may be dispersed on the second substrate 10316 instead of forming the spacer 10317. When the spherical spacers are dispersed, the number of steps is reduced, so that manufacturing cost can be reduced. In addition, since the structure is simple, yield can be improved. Alternatively, when the spacer 10317 is formed, a distance between the two substrates can be uniform because a position of the spacer is not varied, so that a display device with little display unevenness can be obtained.

A process to be performed on the first substrate 10301 is described.

First, a first insulating film 10302 is formed over the first substrate 10301 by sputtering, a printing method, a coating method, or the like. Note that the first insulating film 10302 is not necessarily formed. The first insulating film 10302 has a function of preventing change in characteristics of the transistor due to an impurity from the substrate, which affects a semiconductor layer.

Next, a first conductive layer 10303 is formed over the first insulating film 10302 by photolithography, a laser direct writing method, an inkjet method, or the like.

Next, a second insulating film 10304 is formed over the entire surface by sputtering, a printing method, a coating method, or the like. The second insulating film 10304 has a function of preventing change in characteristics of the transistor due to an impurity from the substrate, which affects the semiconductor layer.

Next, a first semiconductor layer 10305 and a second semiconductor layer 10306 are formed. Note that the first semiconductor layer 10305 and the second semiconductor layer 10306 are formed sequentially and shapes thereof are processed at the same time.

Next, a second conductive layer 10307 is formed by photolithography, a laser direct writing method, an inkjet method, or the like. Note that as a method for etching which is performed at the time of processing the shape of the second conductive layer 10307, dry etching is preferable. Note that as the second conductive layer 10307, either a light-transmitting material or a reflective material may be used.

Next, a channel region of the transistor is formed. Here, an example of a step thereof is described. The second semiconductor layer 10106 is etched by using the second conductive layer 10307 as a mask. Alternatively, the second semiconductor layer 10306 is etched by using a mask for processing the shape of the second conductive layer 10307. Then, the first conductive layer 10303 at a position where the second semiconductor layer 10306 is removed serves as the channel region of the transistor. Thus, the number of masks can be reduced, so that manufacturing cost can be reduced.

Next, a third insulating film 10308 is formed and a contact hole is selectively formed in the third insulating film 10308. Note that a contact hole may be formed also in the second insulating film 10304 at the same time as forming the contact hole in the third insulating film 10308.

Next, a third conductive layer 10309 is formed by photolithography, a laser direct writing method, an inkjet method, or the like. Here, the third conductive layer 10309 has a shape in which two comb-shaped electrodes engage with each other. One of the comb-shaped electrodes is electrically connected to one of a source electrode and a drain electrode of the transistor, and the other of the comb-shaped electrodes is electrically connected to a common electrode. Thus, a horizontal electric field can be effectively applied to the liquid crystal molecules 10318.

Next, a first alignment film 10310 is formed. Note that after the first alignment film 10310 is formed, rubbing may be performed so as to control the alignment of the liquid crystal molecules. Rubbing is a step of forming stripes on an alignment film by rubbing the alignment film with a cloth. When rubbing is performed, the alignment film can have alignment properties.

The first substrate 10301 which is manufactured as described above and the second substrate 10316 on which the light-shielding film 10314, the color filter 10315, the spacer 10317, and the second alignment film 10312 are formed are attached to each other by a sealant with a gap of several μm therebetween. Then, a liquid crystal material is injected into a space between the two substrates.

Figure 87B:
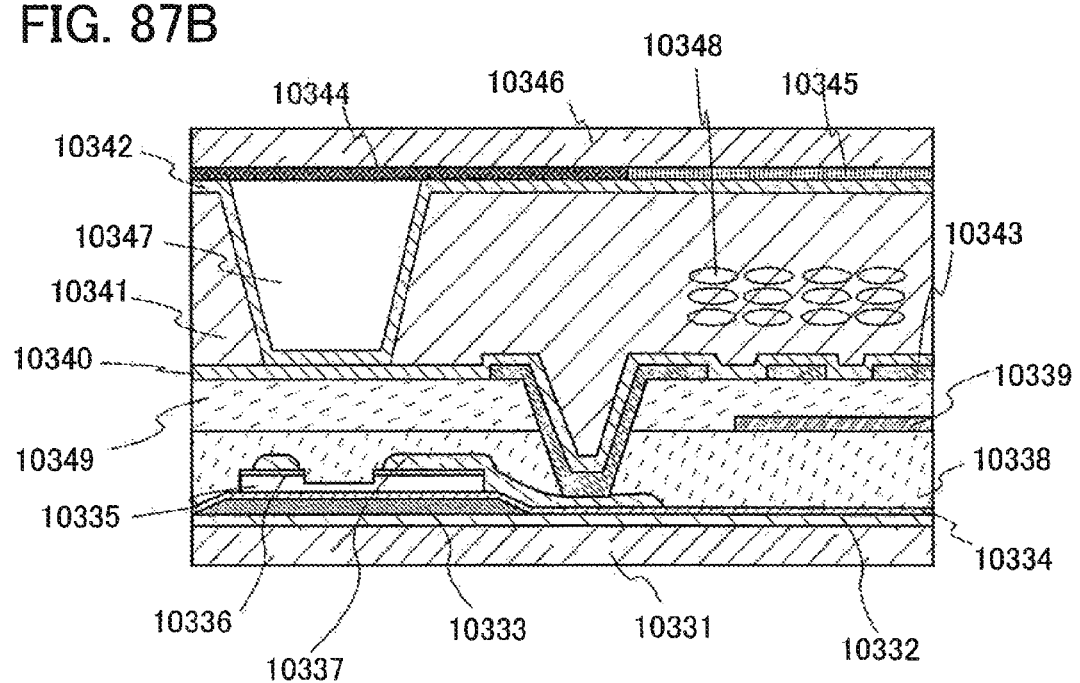

FIG. 87B is an example of a cross-sectional view of a pixel in the case where an FFS (fringe field switching) mode and a transistor are combined. When the pixel structure shown in FIG. 87B is applied to a liquid crystal display device, a liquid crystal display device theoretically having a wide viewing angle and response speed which has low dependency on a gray scale can be obtained.

Features of the pixel structure shown in FIG. 87B are described. Liquid crystal molecules 10348 shown in FIG. 87B are long and narrow molecules each having a major axis and a minor axis. In FIG. 87B, direction of each of the liquid crystal molecules 10348 is expressed by the length thereof. That is, the direction of the major axis of the liquid crystal molecule 10348, which is expressed as long, is parallel to the page, and as the liquid crystal molecule 10348 is expressed to be shorter, the direction of the major axis becomes closer to a normal direction of the page. That is, each of the liquid crystal molecules 10348 shown in FIG. 87B is aligned so that the direction of the major axis thereof is always horizontal to the substrate. Although FIG. 87B shows alignment with no electric field, when an electric field is applied to each of the liquid crystal molecules 10348, each of the liquid crystal molecules 10348 rotates in a horizontal plane as the direction of the major axis thereof is always horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several μm therebetween, and a liquid crystal material is injected into a space between the two substrates. In FIG. 87B, the two substrates correspond to the first substrate 10331 and the second substrate 10346. A transistor and a pixel electrode are formed over the first substrate. A light-shielding film 10344, a color filter 10345, a fourth conductive layer 10343, a spacer 10347, and a second alignment film 10342 are formed on the second substrate.

The light-shielding film 10344 is not necessarily formed on the second substrate 10346. When the light-shielding film 10344 is not formed, the number of steps is reduced, so that manufacturing cost can be reduced. In addition, since the structure is simple, yield can be improved. Alternatively, when the light-shielding film 10344 is formed, a display device with little light leakage at the time of black display can be obtained.

The color filter 10345 is not necessarily formed on the second substrate 10346. When the color filter 10345 is not formed, the number of steps is reduced, so that manufacturing cost can be reduced. In addition, since the structure is simple, yield can be improved. Note that even when the color filter 10345 is not formed, a display device which can perform color display can be obtained by field sequential driving. Alternatively, when the color filter 10345 is formed, a display device which can perform color display can be obtained.

Spherical spacers may be dispersed on the second substrate 10346 instead of forming the spacer 10347. When the spherical spacers are dispersed, the number of steps is reduced, so that manufacturing cost can be reduced. In addition, since the structure is simple, yield can be improved. Alternatively, when the spacer 10347 is formed, a distance between the two substrates can be uniform because a position of the spacer is not varied, so that a display device with little display unevenness can be obtained.

A process to be performed on the first substrate 10331 is described.

First, a first insulating film 10332 is formed over the first substrate 10331 by sputtering, a printing method, a coating method, or the like. Note that the first insulating film 10332 is not necessarily formed. The first insulating film 10332 has a function of preventing change in characteristics of the transistor due to an impurity from the substrate, which affects a semiconductor layer.

Next, a first conductive layer 10333 is formed over the first insulating film 10332 by photolithography, a laser direct writing method, an inkjet method, or the like.

Next, a second insulating film 10334 is formed over the entire surface by sputtering, a printing method, a coating method, or the like. The second insulating film 10334 has a function of preventing change in characteristics of the transistor due to an impurity from the substrate, which affects the semiconductor layer.

Next, a first semiconductor layer 10335 and a second semiconductor layer 10336 are formed. Note that the first semiconductor layer 10335 and the second semiconductor layer 10336 are formed sequentially and shapes thereof are processed at the same time.

Next, a second conductive layer 10337 is formed by photolithography, a laser direct writing method, an inkjet method, or the like. Note that as a method for etching which is performed at the time of processing the shape of the second conductive layer 10337, dry etching is preferable. Note that as the second conductive layer 10337, either a light-transmitting material or a reflective material may be used.

Next, a channel region of the transistor is formed. Here, an example of a step thereof is described. The second semiconductor layer 10106 is etched by using the second conductive layer 10337 as a mask. Alternatively, the second semiconductor layer 10336 is etched by using a mask for processing the shape of the second conductive layer 10337. Then, the first conductive layer 10333 at a position where the second semiconductor layer 10336 is removed serves as the channel region of the transistor. Thus, the number of masks can be reduced, so that manufacturing cost can be reduced.

Next, a third insulating film 10338 is formed and a contact hole is selectively formed in the third insulating film 10338.

Next, a fourth conductive layer 10343 is formed by photolithography, a laser direct writing method, an inkjet method, or the like.

Next, a fourth insulating film 10349 is formed and a contact hole is selectively formed in the fourth insulating film 10349. Note that the surface of the fourth insulating film 10349 is preferably as even as possible. This is because alignment of the liquid crystal molecules are affected by unevenness of a surface with which the liquid crystal is in contact.

Next, a third conductive layer 10339 is formed by photolithography, a laser direct writing method, an inkjet method, or the like. Here, the third conductive layer 10339 is comb-shaped.

Next, a first alignment film 10340 is formed. Note that after the first alignment film 10340 is formed, rubbing may be performed so as to control the alignment of the liquid crystal molecules. Rubbing is a step of forming stripes on an alignment film by rubbing the alignment film with a cloth. When rubbing is performed, the alignment film can have alignment properties.

The first substrate 10331 which is manufactured as described above and the second substrate 10346 on which the light-shielding film 10344, the color filter 10345, the spacer 10347, and the second alignment film 10342 are formed are attached to each other by a sealant with a gap of several μm therebetween. Then, a liquid crystal material is injected into a space between the two substrates. Therefore, a liquid crystal panel can be manufactured.

Here, materials which can be used for conductive layers or insulating films are described.

As the first insulating film 10102 in FIG. 85, the first insulating film 10202 in FIG. 86A, the first insulating film 10232 in FIG. 86B, the first insulating film 10302 in FIG. 87A, or the first insulating film 10332 in FIG. 87B, an insulating film such as a silicon oxide film, a silicon nitride film, or a silicon oxynitride ($SiO_xN_y$) film can be used. Alternatively, an insulating film having a stacked-layer structure in which two or more of a silicon oxide film, a silicon nitride film, a silicon oxynitride ($SiO_xN_y$) film, and the like are combined can be used as.

As the first conductive layer 10103 in FIG. 85, the first conductive layer 10203 in FIG. 86A, the first conductive layer 10233 in FIG. 86B, the first conductive layer 10303 in FIG. 87A, or the first conductive layer 10333 in FIG. 87B, Mo, Ti, Al, Nd, Cr, or the like can be used. Alternatively, a stacked-layer structure in which two or more of Mo, Ti, Al, Nd, Cr, and the like are combined can be used.

As the second insulating film 10104 in FIG. 85, the second insulating film 10204 in FIG. 86A, the second insulating film 10234 in FIG. 86B, the second insulating film 10304 in FIG. 87A, or the second insulating film 10334 in FIG. 87B, a thermal oxide film, a silicon oxide film, a silicon nitride film, a silicon oxynitride film, or the like can be used. Alternatively, a stacked-layer structure in which two or more of a thermal oxide film, a silicon oxide film, a silicon nitride film, a silicon oxynitride film, and the like are combined can be used. Note that a silicon oxide film is preferable in a portion which is in contact with a semiconductor layer. This is because a trap level at an interface with the semiconductor layer decreases when a silicon oxide film is used. Note that a silicon nitride film is preferable in a portion which is in contact with Mo. This is because a silicon nitride film does not oxidize Mo.

As the first semiconductor layer 10105 in FIG. 85, the first semiconductor layer 10205 in FIG. 86A, the first semiconductor layer 10235 in FIG. 86B, the first semiconductor layer 10305 in FIG. 87A, or the first semiconductor layer 10335 in FIG. 87B, silicon, silicon germanium (SiGe), or the like can be used.

As the second semiconductor layer 10106 in FIG. 85, the second semiconductor layer 10206 in FIG. 86A, the second semiconductor layer 10236 in FIG. 86B, the second semiconductor layer 10306 in FIG. 87A, or the second semiconductor layer 10336 in FIG. 87B, silicon or the like including phosphorus can be used, for example.

As a light-transmitting material of the second conductive layer 10107 and the third conductive layer 10109 in FIG. 85; the second conductive layer 10207 and the third conductive layer 10209 in FIG. 86A; the second conductive layer 10237 and the third conductive layer 10239 in FIG. 86B; the second conductive layer 10307 and the third conductive layer 10309 in FIG. 87A; or the second conductive layer 10337, the third conductive layer 10339, and a fourth conductive layer 10343 in FIG. 87B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO is a light-transmitting conductive material formed by sputtering using a target in which zinc oxide (ZnO) is mixed into ITO at 2 to 20 wt %.

As a reflective material of the second conductive layer 10107 and the third conductive layer 10109 in FIG. 85; the second conductive layer 10207 and the third conductive layer 10209 in FIG. 86A; the second conductive layer 10237 and the third conductive layer 10239 in FIG. 86B; the second conductive layer 10307 and the third conductive layer 10309 in FIG. 87A; or the second conductive layer 10337, the third conductive layer 10339, and the fourth conductive layer 10343 in FIG. 87B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 10108 in FIG. 85, the third insulating film 10208 in FIG. 86A, the third insulating film 10238 in FIG. 23B, the third conductive layer 10239 in FIG. 86B, the third insulating film 10308 in FIG. 87A, or the third insulating film 10338 and the fourth insulating film 10349 in FIG. 87B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substituent, an organic group including at least hydrogen (e.g., an alkyl group or aromatic hydrocarbon) is used. Alternatively, a fluoro group may be used as the substituent. Further alternatively, the organic group including at least hydrogen and the fluoro group may be used as the substituent.

As the first alignment film 10110 in FIG. 85, the first alignment film 10210 in FIG. 86A, the first alignment film 10240 in FIG. 86B, the first alignment film 10310 in FIG. 87A, or the first alignment film 10340 in FIG. 87B, a film of a high molecular compound such as polyimide can be used.

Next, the pixel structure in the case where each liquid crystal mode and the transistor are combined is described with reference to a top view (a layout diagram) of the pixel.

Note that as a liquid crystal mode, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

As the transistor, a thin film transistor (TFT) including a non-single-crystal semiconductor layer typified by amorphous silicon, polycrystalline silicon, microcrystalline (also referred to as semi-amorphous) silicon, or the like can be used.

Note that as the structure of the transistor, a top-gate structure, a bottom-gate structure, or the like can be used. A channel-etched transistor, a channel-protective transistor, or the like can be used as a bottom-gate transistor.

Figure 88:
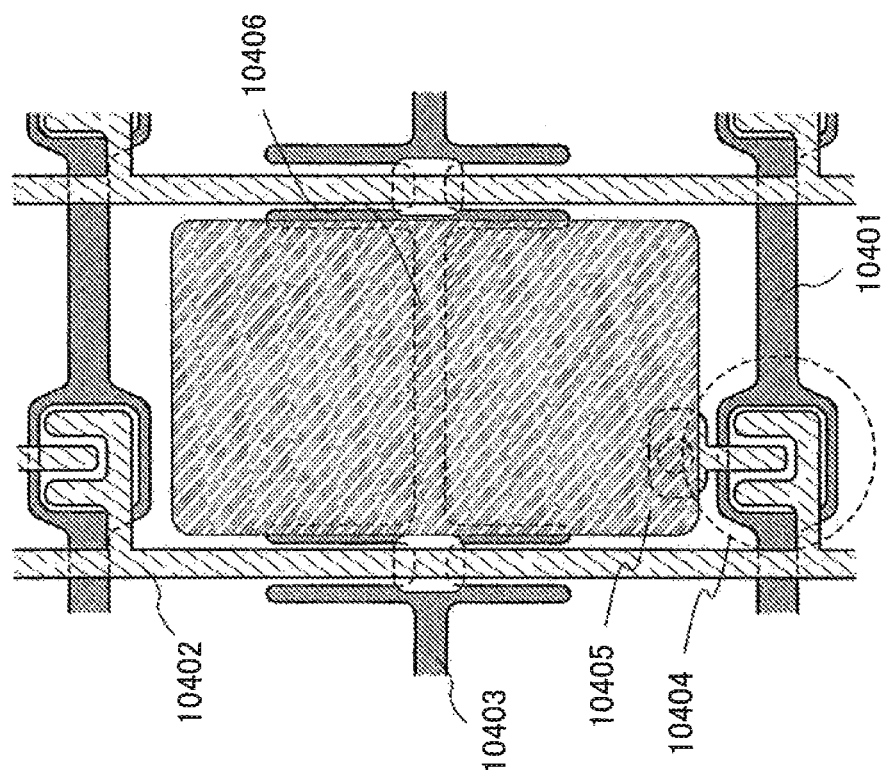
FIG. 88 illustrates the present invention.

FIG. 88 is an example of a top view of a pixel in the case where a TN mode and a transistor are combined. When the pixel structure shown in FIG. 88 is applied to a liquid crystal display device, a liquid crystal display device can be formed at low cost.

The pixel shown in FIG. 88 includes a scan line 10401, an image signal line 10402, a capacitor line 10403, a transistor 10404, a pixel electrode 10405, and a pixel capacitor 10406.

The scan line 10401 has a function of transmitting a signal (a scan signal) to the pixel. The image signal line 10402 has a function for transmitting a signal (an image signal) to the pixel. Note that since the scan line 10401 and the image signal line 10402 are arranged in matrix, they are formed using conductive layers in different layers. Note that a semiconductor layer may be provided at an intersection of the scan line 10401 and the image signal line 10402. Thus, intersection capacitance formed between the scan line 10401 and the image signal line 10402 can be reduced.

The capacitor line 10403 is provided in parallel to the pixel electrode 10405. A portion where the capacitor line 10403 and the pixel electrode 10405 overlap with each other corresponds to the pixel capacitor 10406. Note that part of the capacitor line 10403 is extended along the image signal line 10402 so as to surround the image signal line 10402. Thus, crosstalk can be reduced. Crosstalk is a phenomenon in which a potential of an electrode, which should hold the potential, is changed in accordance with change in potential of the image signal line 10402. Note that intersection capacitance can be reduced by providing a semiconductor layer between the capacitor line 10403 and the image signal line 10402. Note that the capacitor line 10403 is formed using a material which is similar to that of the scan line 10401.

The transistor 10404 has a function as a switch which turns on the image signal line 10402 and the pixel electrode 10405. Note that one of a source region and a drain region of the transistor 10404 is provided so as to be surrounded by the other of the source region and the drain region of the transistor 10404. Thus, the channel width of the transistor 10404 increases, so that switching capability can be improved. Note that a gate electrode of the transistor 10404 is provided so as to surround the semiconductor layer.

The pixel electrode 10405 is electrically connected to one of a source electrode and a drain electrode of the transistor 10404. The pixel electrode 10405 is an electrode for applying signal voltage which is transmitted by the image signal line 10402 to a liquid crystal element. Note that the pixel electrode 10405 is rectangular. Thus, the aperture ratio can be improved. Note that as the pixel electrode 10405, a light-transmitting material or a reflective material may be used. Alternatively, the pixel electrode 10405 may be formed by combining a light-transmitting material and a reflective material.

FIG. 89A is an example of a top view of a pixel in the case where an MVA mode and a transistor are combined. When the pixel structure shown in FIG. 89A is applied to a liquid crystal display device, a liquid crystal display device having a wide viewing angle, high response speed, and high contrast can be obtained.

The pixel shown in FIG. 89A includes a scan line 10501, a video signal line 10502, a capacitor line 10503, a transistor 10504, a pixel electrode 10505, a pixel capacitor 10506, and an alignment control protrusion 10507.

The scan line 10501 has a function of transmitting a signal (a scan signal) to the pixel. The image signal line 10502 has a function for transmitting a signal (an image signal) to the pixel. Note that since the scan line 10501 and the image signal line 10502 are arranged in matrix, they are formed using conductive layers in different layers. Note that a semiconductor layer may be provided at an intersection of the scan line 10501 and the image signal line 10502. Thus, intersection capacitance formed between the scan line 10501 and the image signal line 10502 can be reduced.

The capacitor line 10503 is provided in parallel to the pixel electrode 10505. A portion where the capacitor line 10503 and the pixel electrode 10505 overlap with each other corresponds to the pixel capacitor 10506. Note that part of the capacitor line 10503 is extended along the image signal line 10502 so as to surround the image signal line 10502. Thus, crosstalk can be reduced. Crosstalk is a phenomenon in which a potential of an electrode, which should hold the potential, is changed in accordance with change in potential of the image signal line 10502. Note that intersection capacitance can be reduced by providing a semiconductor layer between the capacitor line 10503 and the image signal line 10502. Note that the capacitor line 10503 is formed using a material which is similar to that of the scan line 10501.

The transistor 10504 has a function as a switch which turns on the image signal line 10502 and the pixel electrode 10505. Note that one of a source region and a drain region of the transistor 10504 is provided so as to be surrounded by the other of the source region and the drain region of the transistor 10504. Thus, the channel width of the transistor 10504 increases, so that switching capability can be improved. Note that a gate electrode of the transistor 10504 is provided so as to surround the semiconductor layer.

The pixel electrode 10505 is electrically connected to one of a source electrode and a drain electrode of the transistor 10504. The pixel electrode 10505 is an electrode for applying signal voltage which is transmitted by the image signal line 10502 to a liquid crystal element. Note that the pixel electrode 10505 is rectangular. Thus, the aperture ratio can be improved. Note that as the pixel electrode 10505, a light-transmitting material or a reflective material may be used. Alternatively, the pixel electrode 10505 may be formed by combining a light transmitting material and a reflective material.

The alignment control protrusion 10507 is formed on a counter substrate. The alignment control protrusion 10507 has a function of aligning liquid crystal molecules radially. Note that a shape of the alignment control protrusion 10507 is not particularly limited. For example, the alignment control protrusion 10507 may be a dogleg shape. Thus, a plurality of regions having different alignment of the liquid crystal molecules can be formed, so that the viewing angle can be improved.

FIG. 89B is an example of a top view of a pixel in the case where a PVA mode and a transistor are combined. When the pixel structure shown in FIG. 89B is applied to a liquid crystal display device, a liquid crystal display device having a wide viewing angle, high response speed, and high contrast can be obtained.

The pixel shown in FIG. 89B includes a scan line 10511, a video signal line 10512, a capacitor line 10513, a transistor 10514, a pixel electrode 10515, a pixel capacitor 10516, and an electrode notch portion 10517.

The scan line 10511 has a function of transmitting a signal (a scan signal) to the pixel. The image signal line 10512 has a function for transmitting a signal (an image signal) to the pixel. Note that since the scan line 10511 and the image signal line 10512 are arranged in matrix, they are formed using conductive layers in different layers. Note that a semiconductor layer may be provided at an intersection of the scan line 10511 and the image signal line 10512. Thus, intersection capacitance formed between the scan line 10511 and the image signal line 10512 can be reduced.

The capacitor line 10513 is provided in parallel to the pixel electrode 10515. A portion where the capacitor line 10513 and the pixel electrode overlap with each other corresponds to the pixel capacitor 10516. Note that part of the capacitor line 10513 is extended along the image signal line 10512 so as to surround the image signal line 10512. Thus, crosstalk can be reduced. Crosstalk is a phenomenon in which a potential of an electrode, which should hold the potential, is changed in accordance with change in potential of the image signal line 10512. Note that intersection capacitance can be reduced by providing a semiconductor layer between the capacitor line 10513 and the image signal line 10512. Note that the capacitor line 10513 is formed using a material which is similar to that of the scan line 10511.

The transistor 10514 has a function as a switch which turns on the image signal line 10512 and the pixel electrode 10515. Note that one of a source region and a drain region of the transistor 10514 is provided so as to be surrounded by the other of the source region and the drain region of the transistor 10514. Thus, the channel width of the transistor 10514 increases, so that switching capability can be improved. Note that a gate electrode of the transistor 10514 is provided so as to surround the semiconductor layer.

The pixel electrode 10515 is electrically connected to one of a source electrode and a drain electrode of the transistor 10514. The pixel electrode 10515 is an electrode for applying signal voltage which is transmitted by the image signal line 10512 to a liquid crystal element. Note that the pixel electrode 10515 has a shape which is formed in accordance with a shape of the electrode notch portion 10517. Specifically, the pixel electrode 10515 has a shape in which a portion where the pixel electrode 10515 is notched is formed in a portion where the electrode notch portion 10517 is not formed. Thus, a plurality of regions having different alignment of the liquid crystal molecules can be formed, so that the viewing angle can be improved. Note that as the pixel electrode 10515, a light-transmitting material or a reflective material may be used. Alternatively, the pixel electrode 10515 may be formed by combining a light-transmitting material and a reflective material.

FIG. 90A is an example of a top view of a pixel in the case where an IPS mode and a transistor are combined. When the pixel structure shown in FIG. 90A is applied to a liquid crystal display device, a liquid crystal display device theoretically having a wide viewing angle and response speed which has low dependency on a gray scale can be obtained.

The pixel shown in FIG. 90A includes a scan line 10601, a video signal line 10602, a common electrode 10603, a transistor 10604, and a pixel electrode 10605.

The scan line 10601 has a function of transmitting a signal (a scan signal) to the pixel. The image signal line 10602 has a function of transmitting a signal (an image signal) to the pixel. Note that since the scan line 10601 and the image signal line 10602 are arranged in matrix, they are formed using conductive layers in different layers. Note that a semiconductor layer may be provided at an intersection of the scan line 10601 and the image signal line 10602. Thus, intersection capacitance formed between the scan line 10601 and the image signal line 10602 can be reduced. Note that the image signal line 10602 is formed in accordance with a shape of the pixel electrode 10605.

The common electrode 10603 is provided in parallel to the pixel electrode 10605. The common electrode 10603 is an electrode for generating a horizontal electric field. Note that the common electrode 10603 is bent comb-shaped. Note that part of the common electrode 10603 is extended along the image signal line 10602 so as to surround the image signal line 10602. Thus, crosstalk can be reduced. Crosstalk is a phenomenon in which a potential of an electrode, which should hold the potential, is changed in accordance with change in potential of the image signal line 10602. Note that intersection capacitance can be reduced by providing a semiconductor layer between the common electrode 10603 and the image signal line 10602. Par of the common electrode 10603, which is provided in parallel to the scan line 10601, is formed using a material which is similar to that of the scan line 10601. Part of the common electrode 10603, which is provided in parallel to the pixel electrode 10605, is formed using a material which is similar to that of the pixel electrode 10605.

The transistor 10604 has a function as a switch which turns on the image signal line 10602 and the pixel electrode 10605. Note that one of a source region and a drain region of the transistor 10604 is provided so as to be surrounded by the other of the source region and the drain region of the transistor 10604. Thus, the channel width of the transistor 10604 increases, so that switching capability can be improved. Note that a gate electrode of the transistor 10604 is provided so as to surround the semiconductor layer.

The pixel electrode 10605 is electrically connected to one of a source electrode and a drain electrode of the transistor 10604. The pixel electrode 10605 is an electrode for applying signal voltage which is transmitted by the image signal line 10602 to a liquid crystal element. Note that the pixel electrode 10605 is bent comb-shaped. Thus, a horizontal electric field can be applied to liquid crystal molecules. In addition, since a plurality of regions having different alignment of the liquid crystal molecules can be formed, the viewing angle can be improved. Note that as the pixel electrode 10605, a light-transmitting material or a reflective material may be used. Alternatively, the pixel electrode 10605 may be formed by combining a light-transmitting material and a reflective material.

Note that a comb-shaped portion in the common electrode 10603 and the pixel electrode 10605 may be formed using different conductive layers. For example, the comb-shaped portion in the common electrode 10603 may be formed using a conductive layer which is the same as that of the scan line 10601 or the image signal line 10602. Similarly, the pixel electrode 10605 may be formed using a conductive layer which is the same as that of the scan line 10601 or the image signal line 10602.

FIG. 90B is a top view of a pixel in the case where an FFS mode and a transistor are combined. When the pixel structure shown in FIG. 90B is applied to a liquid crystal display device, a liquid crystal display device theoretically having a wide viewing angle and response speed which has low dependency on a gray scale can be obtained.

The pixel shown in FIG. 90B may include a scan line 10611, a video signal line 10612, a common electrode 10613, a transistor 10614, and a pixel electrode 10615.

The scan line 10611 has a function of transmitting a signal (a scan signal) to the pixel. The image signal line 10612 has a function of transmitting a signal (an image signal) to the pixel. Note that since the scan line 10611 and the image signal line 10612 are arranged in matrix, they are formed using conductive layers in different layers. Note that a semiconductor layer may be provided at an intersection of the scan line 10611 and the image signal line 10612. Thus, intersection capacitance formed between the scan line 10611 and the image signal line 10612 can be reduced. Note that the image signal line 10612 is formed in accordance with a shape of the pixel electrode 10615.

The common electrode 10613 is formed uniformly below the pixel electrode 10615 and below and between the pixel electrodes 10615. Note that as the common electrode 10613, either a light-transmitting material or a reflective material may be used. Alternatively, the common electrode 10613 may be formed by combining a material in which a light-transmitting material and a reflective material.

The transistor 10614 has a function as a switch which turns on the image signal line 10612 and the pixel electrode 10615. Note that one of a source region and a drain region of the transistor 10614 is provided so as to be surrounded by the other of the source region and the drain region of the transistor 10614. Thus, the channel width of the transistor 10614 increases, so that switching capability can be improved. Note that a gate electrode of the transistor 10614 is provided so as to surround the semiconductor layer.

The pixel electrode 10615 is electrically connected to one of a source electrode and a drain electrode of the transistor 10614. The pixel electrode 10615 is an electrode for applying signal voltage which is transmitted by the image signal line 10612 to a liquid crystal element. Note that the pixel electrode 10615 is bent comb-shaped. The comb-shaped pixel electrode 10615 is provided to be closer to a liquid crystal layer than a uniform portion of the common electrode 10613. Thus, a horizontal electric field can be applied to liquid crystal molecules. In addition, a plurality of regions having different alignment of the liquid crystal molecules can be formed, so that the viewing angle can be improved. Note that as the pixel electrode 10615, a light-transmitting material or a reflective material may be used. Alternatively, the pixel electrode 10615 may be formed by combining a light-transmitting material and a reflective material.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 11)

In this embodiment mode, steps of manufacturing a liquid crystal cell (also referred to as a liquid crystal panel) are described.

Steps of manufacturing a liquid crystal cell in the case where a vacuum injection method is used as a method for filling with liquid crystals are described with reference to FIGS. 91A to 91E and 92A to 92C.

Figure 92A:
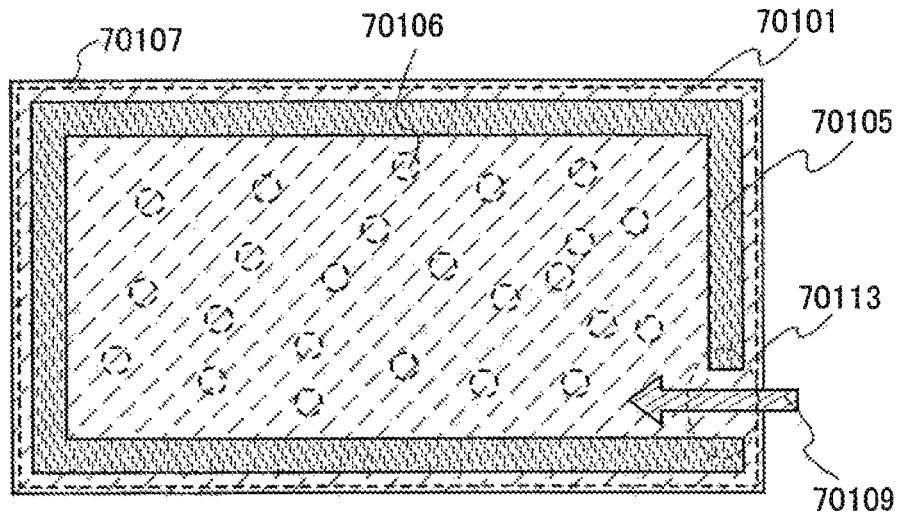
FIGS. 92A to 92C illustrate the present invention.
Figure 92B:
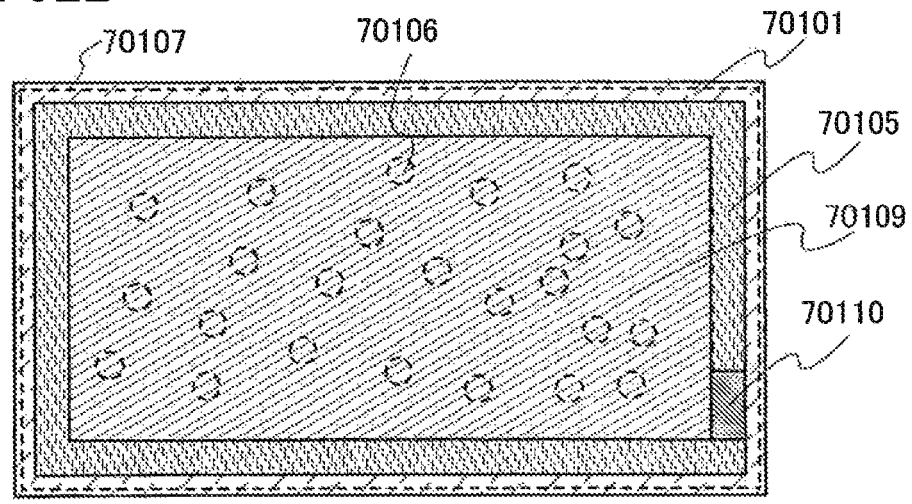
Figure 92C:
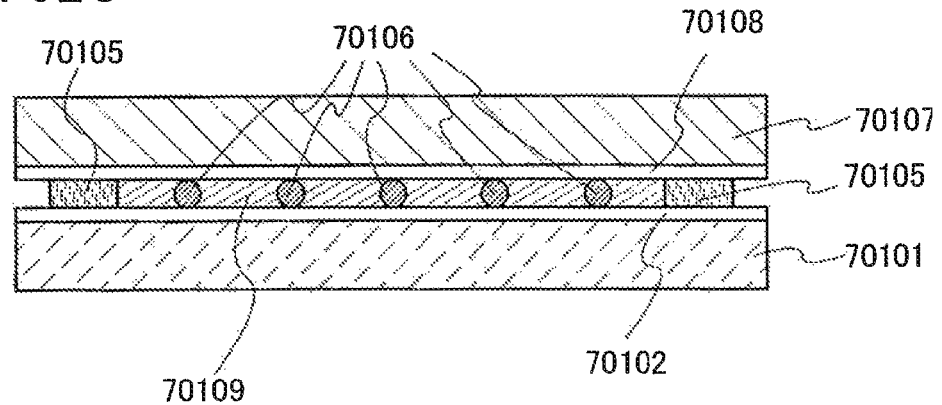

FIG. 92C is a cross-sectional view of a liquid crystal cell. A first substrate 70101 and a second substrate 70107 are attached with spacers 70106 and a sealant 70105 interposed therebetween. Liquid crystals 70109 are arranged between the first substrate 70101 and the second substrate 70107. Note that an alignment film 70102 is formed over the first substrate 70101, and an alignment film 70108 is formed on the second substrate 70107.

The first substrate 70101 is provided with a plurality of pixels arranged in matrix. Each of the plurality of pixels may include a transistor. Note that the first substrate 70101 may be referred to as a TFT substrate, an array substrate, or a TFT array substrate. As the first substrate 70101, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, and a substrate including stainless steel foil can be used. Alternatively, a skin (e.g., epidermis or corium) or hypodermal tissue of an animal such as a human may be used as the substrate. Note that the present invention is not limited to this, and various substrates can be used.

A common electrode, a color filter, a black matrix, and the like are provided on the second substrate 70107. Note that the second substrate 70107 may be referred to as a counter substrate or a color filter substrate.

The alignment film 70102 has a function of aligning liquid crystal molecules in a certain direction. For the alignment film 70102, a polyimide resin or the like can be used. Note that the present invention is not limited to this, and various materials can be used. Note that the alignment film 70108 is similar to the alignment film 70102.

The sealant 70105 has a function of bonding the first substrate 70101 and the second substrate 70107 so that the liquid crystals 70109 do not leak. That is, the sealant 70105 functions as a sealant.

The spacer 70106 has a function of maintaining a fixed space between the first substrate 70101 and the second substrate 70107 (a cell gap of the liquid crystal). As the spacer 70106, a granular spacer or a columnar spacer can be used. Examples of the granular spacer are a fiber-shaped spacer and a spherical spacer. Examples of a material for the granular spacer are plastic and glass. Note that a spherical spacer formed by using plastic is referred to as a plastic bead and is widely used. A fiber-shaped spacer formed by using glass is referred to as a glass fiber and mixed in a sealant when used.

Figure 91A:
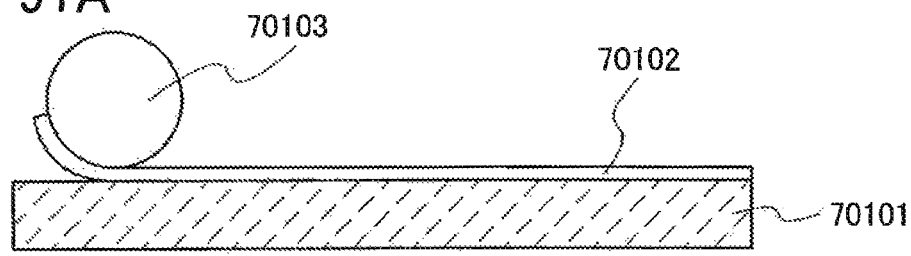
FIGS. 91A to 91E illustrate the present invention.

FIG. 91A is a cross-sectional view of a step of forming the alignment film 70102 over the first substrate 70101. The alignment film 70102 is formed over the first substrate 70101 by a roller coating method using a roller 70103. Note that other than a roller coating method, an offset printing method, a dip coating method, an air-knife method, a curtain coating method, a wire-bar coating method, a gravure coating method, an extrusion coating method, or the like can be used. After that, pre-baking and main-baking are sequentially performed on the alignment film 70102.

Figure 91B:
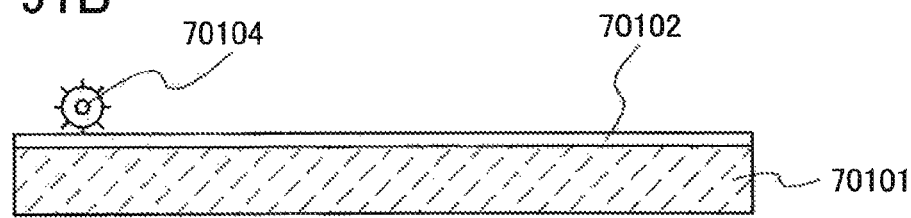

FIG. 91B is a cross-sectional view of a step of performing rubbing treatment on the alignment film 70102. The rubbing treatment is performed by rotating a roller 70104 for rubbing, in which a cloth is wrapped around a drum, to rub the alignment film 70102. When the rubbing treatment is performed on the alignment film 70102, a groove for aligning liquid crystal molecules in a certain direction is formed in the alignment film 70102. Note that the present invention is not limited to this, and a groove may be formed in the alignment film by using an ion beam. After that, water washing treatment is performed on the first substrate 70101. Accordingly, contaminant, dirt, or the like on a surface of the first substrate 70101 can be removed.

Note that although not shown, in a similar manner that in the first substrate 70101, the alignment film 70108 is formed on the second substrate 70107, and rubbing treatment is performed on the alignment film 70108. Note that the present invention is not limited to this, and a groove may be formed in the alignment film by using an ion beam.

Figure 91C:
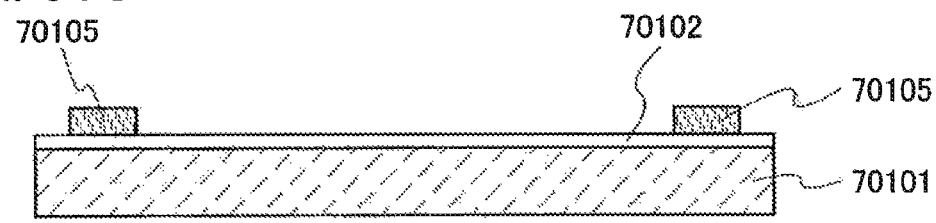

FIG. 91C is a cross-sectional view of a step of forming the sealant 70105 over the alignment film 70102. The sealant 70105 is applied by a lithography device, screen printing, or the like, and a seal pattern is formed. The seal pattern is formed along the periphery of the first substrate 70101, and a liquid crystal inlet is provided in part of the seal pattern. A UV resin for temporal fixing is spot-applied to a region other than a display region of the first substrate 70101 by a dispenser or the like.

Note that the sealant 70105 may be provided for the second substrate 70107.

Figure 91D:
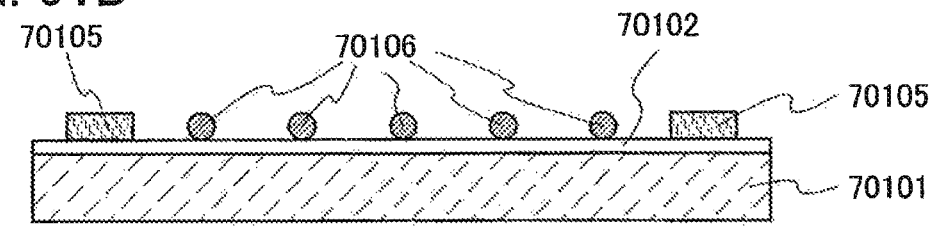

FIG. 91D is a cross-sectional view of a step of dispersing the spacers 70106 over the first substrate 70101. The spacers 70106 are ejected by a nozzle together with a compressed gas and dispersed (dry dispersion). Alternatively, the spacers 70106 are mixed in a volatile liquid, and the liquid is sprayed so as to be dispersed (wet dispersion). By such dry dispersion or wet dispersion, the spacers 70106 can be uniformly dispersed over the first substrate 70101.

In this embodiment mode, the case where the spherical spacer of the granular spacer is used as the spacer 70106 is described. However, the present invention is not limited to this, and a columnar spacer may be used. The columnar spacer may be provided for either the first substrate 70101 or the second substrate 70107. Alternatively, part of the spacers may be provided for the first substrate 70101 and the other part thereof may be provided for the second substrate 70107.

Note that a spacer may be mixed in the sealant. Accordingly, the cell gap of the liquid crystal can be maintained constant more easily.

Figure 91E:
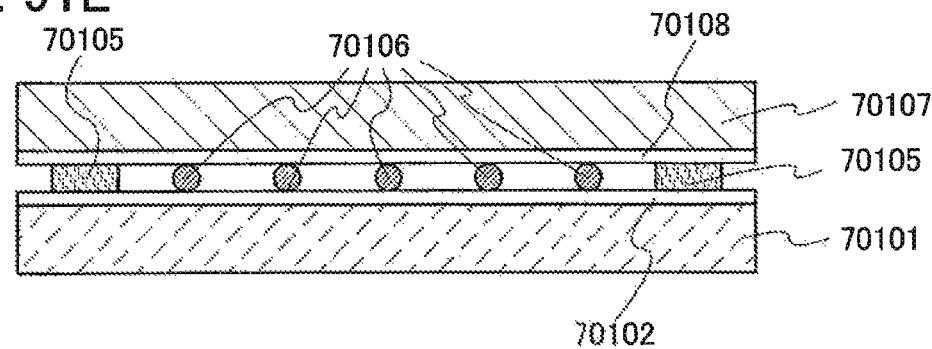

FIG. 91E is a cross-sectional view of a step of attaching the first substrate 70101 and the second substrate 70107. The first substrate 70101 and the second substrate 70107 are attached in the atmosphere. Then, the first substrate 70101 and the second substrate 70107 are pressurized so that a gap between the first substrate 70101 and the second substrate 70107 is constant. After that, ultraviolet ray irradiation or heat treatment is performed on the sealant 70105, so that the sealant 70105 is hardened.

FIGS. 92A and 92B are top views of steps of filling a cell with liquid crystals. A cell in which the first substrate 70101 and the second substrate 70107 are attached (also referred to as an empty cell) is placed in a vacuum chamber. After that, the pressure in the vacuum chamber is reduced, and then, a liquid crystal inlet 70113 of the empty cell is immersed in liquid crystals. Then, when the vacuum chamber is opened to the atmosphere, the empty cell is filled with the liquid crystals 70109 due to pressure difference and capillary action.

When the empty cell is filled with the needed amount of liquid crystals 70109, the liquid crystal inlet is sealed by a resin 70110. Then, extra liquid crystals attached to the empty cell are washed out. After that, realignment treatment is performed on the liquid crystals 70109 by annealing treatment. Accordingly, the liquid crystal cell is completed.

Next, steps of manufacturing a liquid crystal cell in the case where a dropping method is used as a method for filling with liquid crystals are described with reference to FIGS. 93A to 93D and 94A to 94C.

Figure 94A:
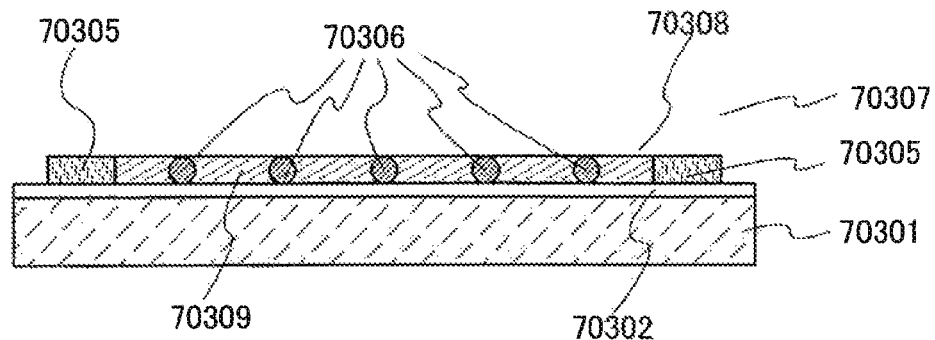
FIGS. 94A to 94C illustrate the present invention.
Figure 94B:
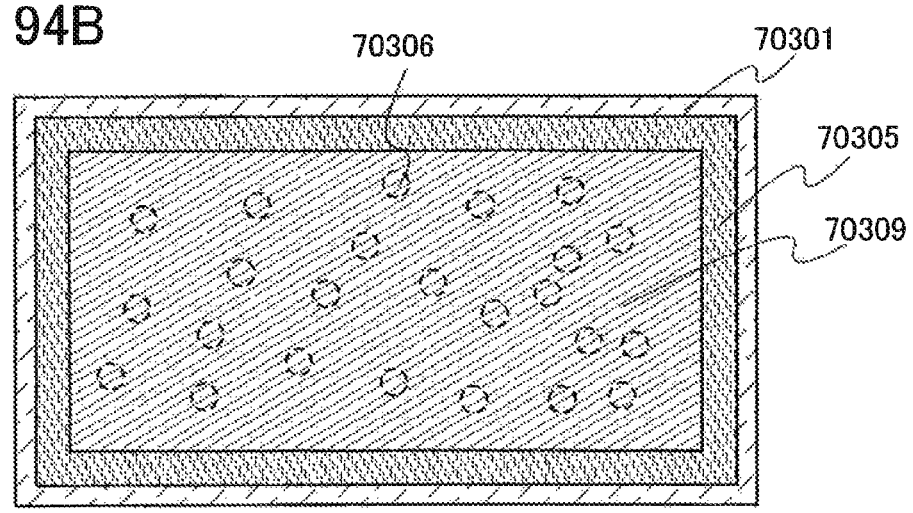
Figure 94C:
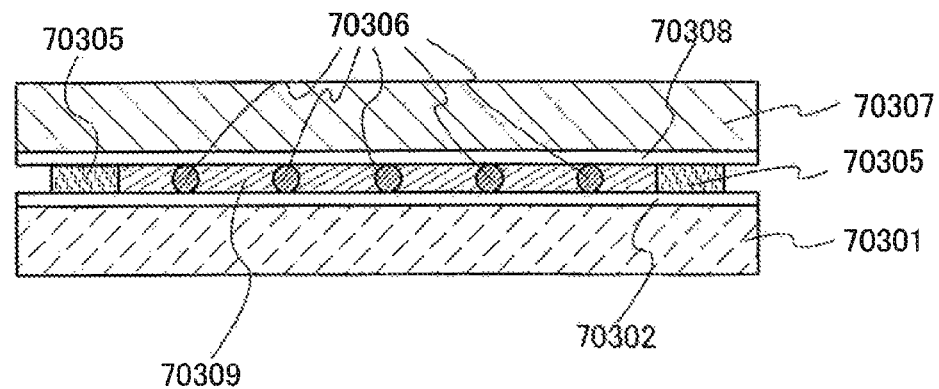

FIG. 94C is a cross-sectional view of a liquid crystal cell. A first substrate 70301 and a second substrate 70307 are attached with spacers 70306 and a sealant 70305 interposed therebetween. Liquid crystals 70309 are arranged between the first substrate 70301 and the second substrate 70307. Note that an alignment film 70302 is formed over the first substrate 70301, and an alignment film 70308 is formed on the second substrate 70307.

The first substrate 70301 is provided with a plurality of pixels arranged in matrix. Each of the plurality of pixels may include a transistor. Note that the first substrate 70301 may be referred to as a TFT substrate, an array substrate, or a TFT array substrate. As the first substrate 70301, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, and a substrate including stainless steel foil can be used. Alternatively, a skin (e.g., epidermis or corium) or hypodermal tissue of an animal such as a human may be used as the substrate. Note that the present invention is not limited to this, and various substrates can be used.

A common electrode, a color filter, a black matrix, and the like are provided on the second substrate 70307. Note that the second substrate 70307 may be referred to as a counter substrate or a color filter substrate.

The alignment film 70302 has a function of aligning liquid crystal molecules in a certain direction. As the alignment film 70302, a polyimide resin or the like can be used. Note that the present invention is not limited to this, and various materials can be used. Note that the alignment film 70308 is similar to the alignment film 70302.

The sealant 70305 has a function of bonding the first substrate 70301 and the second substrate 70307 so that the liquid crystals 70309 do not leak. That is, the sealant 70305 functions as a sealant.

The spacer 70306 has a function of maintaining a fixed space between the first substrate 70301 and the second substrate 70307 (a cell gap of the liquid crystal). As the spacer 70306, a granular spacer or a columnar spacer can be used. Examples of the granular spacer are a fiber-shaped spacer and a spherical spacer. Examples of a material for the granular spacer are plastic and glass. A spherical spacer formed by using plastic is referred to as a plastic bead and has been widely used. A fiber-shaped spacer formed by using glass is referred to as a glass fiber and mixed in a sealant when used.

Figure 93A:
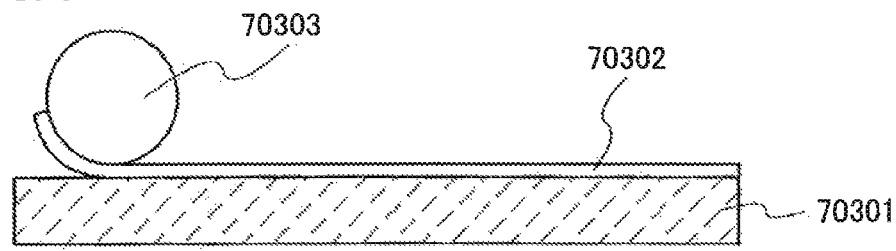
FIGS. 93A to 93D illustrate the present invention.

FIG. 93A is a cross-sectional view of a step of forming the alignment film 70302 over the first substrate 70301. The alignment film 70302 is formed over the first substrate 70301 by a roller coating method using a roller 70303. Note that other than a roller coating method, an offset printing method, a dip coating method, an air-knife method, a curtain coating method, a wire-bar coating method, a gravure coating method, an extrusion coating method, or the like can be used. After that, pre-baking and main-baking are sequentially performed on the alignment film 70302.

Figure 93B:
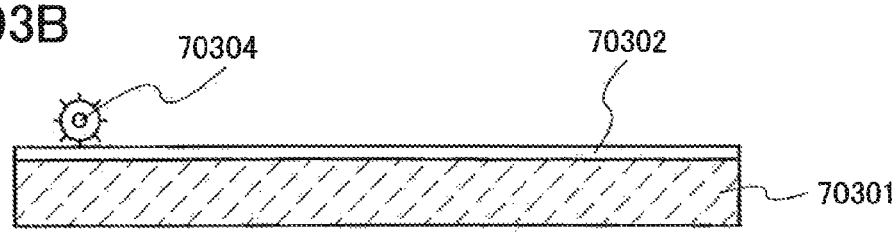

FIG. 93B is a cross-sectional view of a step of performing rubbing treatment on the alignment film 70302. The rubbing treatment is performed by rotating a roller 70304 for rubbing, in which a cloth is wrapped around a drum, to rub the alignment film 70302. When the rubbing treatment is performed on the alignment film 70302, a groove for aligning liquid crystal molecules in a certain direction is formed in the alignment film 70302. Note that the present invention is not limited to this, and a groove may be formed in the alignment film by using an ion beam. After that, water washing treatment is performed on the first substrate 70301. Accordingly, contaminant, dirt, or the like on a surface of the first substrate 70301 can be removed.

Note that although not shown, in a similar manner that in the first substrate 70301, the alignment film 70308 is formed on the second substrate 70307, and rubbing treatment is performed on the alignment film 70308. Note that the present invention is not limited to this, and a groove may be formed in the alignment film by using an ion beam.

Figure 93C:
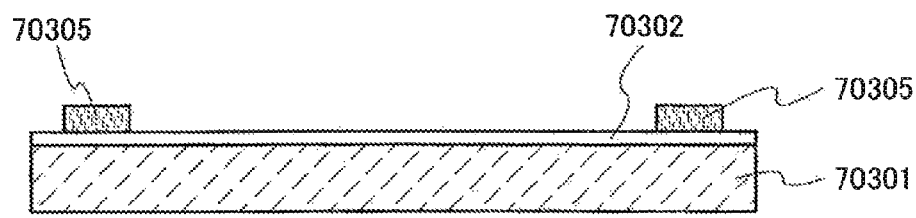

FIG. 93C is a cross-sectional view of a step of forming the sealant 70305 over the alignment film 70302. The sealant 70305 is applied by a lithography device, screen printing, or the like, and a seal pattern is formed. The seal pattern is formed along the periphery of the first substrate 70301. In this embodiment mode, a radical UV resin or a cationic UV resin is used for the sealant 70305. Then, a conductive resin is spot-applied by a dispenser.

Note that the sealant 70305 may be provided for the second substrate 70307.

Figure 93D:
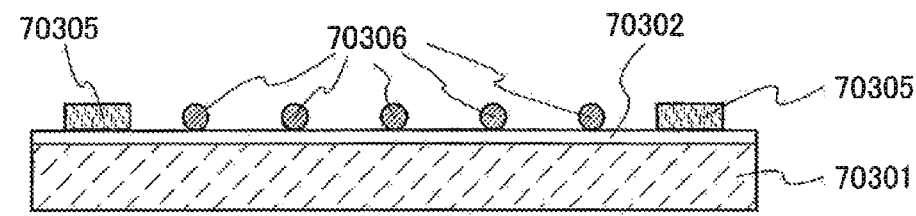

FIG. 93D is a cross-sectional view of a step of dispersing the spacers 70306 over the first substrate 70301. The spacers 70306 are ejected by a nozzle together with a compressed gas and dispersed (dry dispersion). Alternatively, the spacers 70306 are mixed in a volatile liquid, and the liquid is sprayed so as to be dispersed (wet dispersion). By such dry dispersion or wet dispersion, the spacer 70306 can be uniformly dispersed over the first substrate 70301.

In this embodiment mode, the case where the spherical spacer of the granular spacer is used as the spacer 70306 is described. However, the present invention is not limited to this, and a columnar spacer may be used. The columnar spacer may be provided for the first substrate 70301 or the second substrate 70307. Alternatively, a part of the spacers may be provided for the first substrate 70301 and the other part thereof may be provided for the second substrate 70307.

Note that a spacer may be mixed in the sealant. Accordingly, the cell gap of the liquid crystal can be maintained constant more easily.

FIG. 94A is a cross-sectional view of a step of dropping the liquid crystals 70309. Defoaming treatment is performed on the liquid crystals 70309, and then, the liquid crystals 70309 are dropped inside the sealant 70305.

FIG. 94B is a top view after the liquid crystals 70309 are dropped. Since the sealant 70305 is formed along the periphery of the first substrate 70301, the liquid crystals 70309 do not leak.

FIG. 94C is a cross-sectional view of a step of attaching the first substrate 70301 and the second substrate 70307. The first substrate 70301 and the second substrate 70307 are attached in a vacuum chamber. Then, the first substrate 70301 and the second substrate 70307 are pressurized so that a gap between the first substrate 70301 and the second substrate 70307 is constant. After that, ultraviolet ray irradiation is performed on the sealant 70305, so that the sealant 70305 is hardened. It is preferable to perform ultraviolet ray irradiation on the sealant 70305 while a display portion is covered with a mask because deterioration of the liquid crystals 70309 due to ultraviolet rays can be prevented. After that, realignment treatment is performed on the liquid crystals 70309 by annealing treatment. Accordingly, the liquid crystal cell is completed.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 12)

In this embodiment mode, a structure and an operation of a pixel in a display device are described.

Figures 95A, 95B:
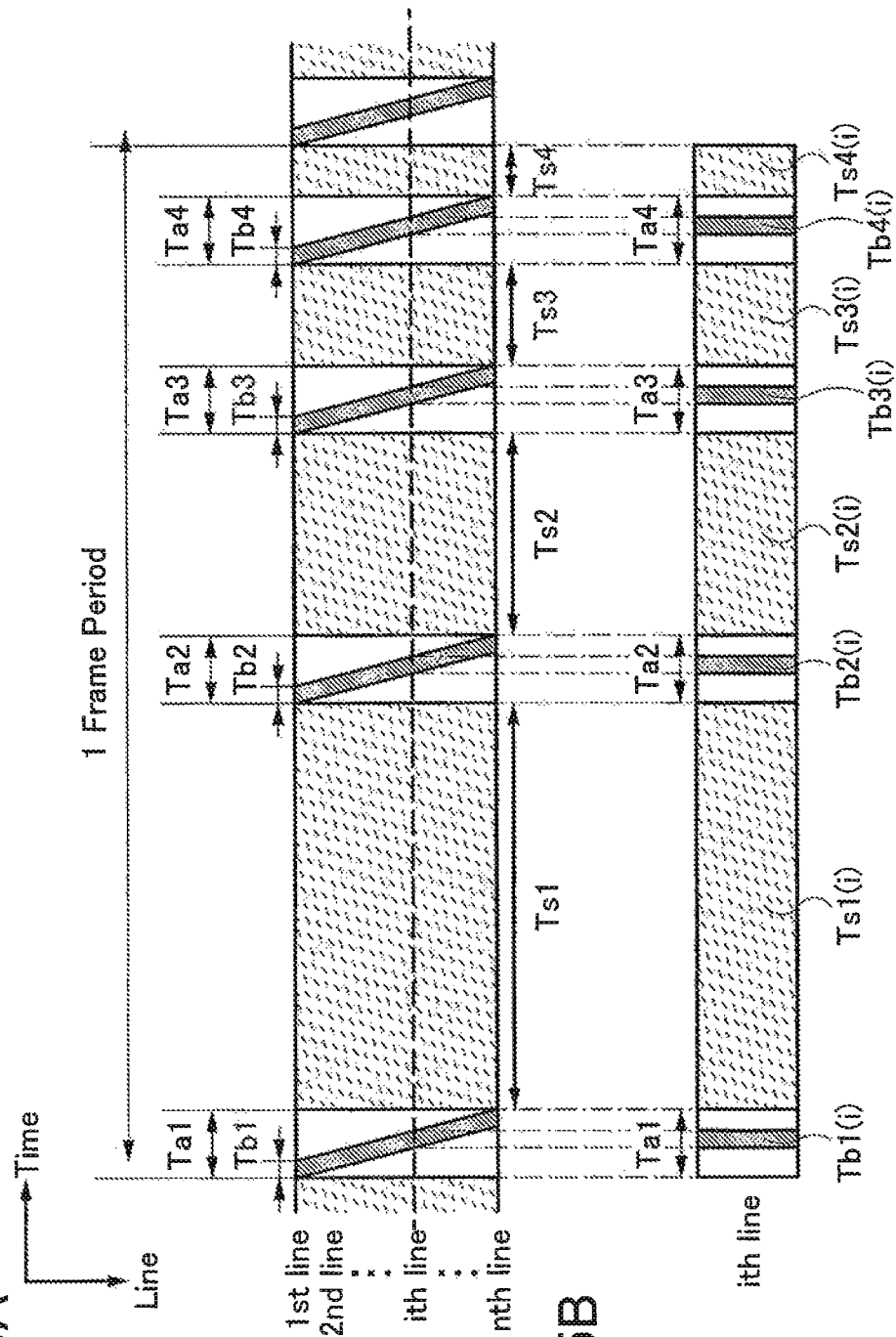
FIGS. 95A and 95B illustrate the present invention.

FIGS. 95A and 95B are timing charts showing an example of digital time gray scale driving. The timing chart of FIG. 95A shows a driving method in the case where a signal writing period (an address period) to a pixel and a light-emitting period (a sustain period) are separated.

One frame period refers to a period for fully displaying an image for one display region. One frame period includes a plurality of subframe periods, and one subframe period includes an address period and a sustain period. Address periods $T_a1$ to $T_a4$ indicate time for writing signals to pixels in all rows, and periods Tb1 to Tb4 indicate time for writing signals to pixels in one row (or one pixel). Sustain periods $T_s1$ to $T_s4$ indicate time for maintaining a lighting state or a non-lighting state in accordance with a video signal written to the pixel, and a ratio of the length of the sustain periods is set to satisfy $T_s1:T_s2:T_s3:T_s4=2^3:2^2:2^1:2^0=8:4:2:1$. A gray scale is expressed depending on in which sustain period light emission is performed.

Operations are described. First, in the address period $T_a1$, pixel selection signals are sequentially input to scan lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of each pixel in the sustain period $T_s1$ are controlled by the written video signal. Similarly, in the address periods $T_a2$, $T_a3$, and $T_a4$, a video signal is input to pixels, and lighting and non-lighting of each pixel in the sustain periods $T_s2$, $T_s3$, and $T_s4$ are controlled by the video signal. Then, in each subframe period, a pixel to which a signal for not lighting in the address period and for lighting when the sustain period starts after the address period ends is written is lit.

Here, the i-th pixel row is described with reference to FIG. 95B. First, in the address period Ta1, pixel selection signals are input to scan lines from a first row, and in a period $T_b1(i)$ in the address period $T_a1$, a pixel in the i-th row is selected. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period Ts1 are controlled by the written video signal. Similarly, in the address periods $T_a2$, $T_a3$, and $T_a4$, a video signal is input to the pixel in the i-th row, and lighting and non-lighting of the pixel in the i-th row in the sustain periods $T_s2$, $T_s3$, and $T_s4$ are controlled by the video signal. Then, in each subframe period, a pixel to which a signal for not lighting in the address period and for lighting when the sustain period starts after the address period ends is written is lit.

Here, the case where a 4-bit gray scale is expressed is described here; however, the number of bits and the number of gray scales are not limited thereto. Note that lighting is not needed to be performed in order of $T_s1$, $T_s2$, $T_s3$, and $T_s4$, and the order may be random or light may be emitted by dividing the whole period into a plurality of periods. The ratio of lighting time of $T_s1$, $T_s2$, $T_s3$, and $T_s4$ is not needed to be a power of two, and may be the same length or slightly different from a power of two.

Next, a driving method in the case where a period for writing a signal to a pixel (an address period) and a light-emitting period (a sustain period) are not separated is described. That is, a pixel in a row in which a writing operation of a video signal is completed maintains the signal until another signal is written to the pixel (or the signal is erased). A period between the writing operation and writing of another signal to the pixel is referred to as data holding time. In the data holding time, the pixel is lit or not lit in accordance with the video signal written to the pixel. The same operations are performed until the last row, and the address period ends. Then, an operation proceeds to a signal writing operation of the next subframe period sequentially from a row in which the data holding time ends.

As described above, in the case of a driving method in which a pixel is lit or not lit in accordance with a video signal written to the pixel immediately after the signal writing operation is completed and the data holding time starts, signals cannot be input to two rows at the same time. Accordingly, address periods need to be prevented from overlapping. Therefore, the data holding time cannot be made shorter than the address period. As a result, it becomes difficult to perform high-level gray scale display.

Thus, the data holding time is set to be shorter than the address period by providing an erasing period. A driving method in the case where the data holding time shorter than the address period is set by providing an erasing period is described with reference to FIG. 96A.

First, in the address period Ta1, pixel scan signals are input to scan lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of the pixel in the sustain period $T_s1$ are controlled by the written video signal. In a row in which a writing operation of a video signal is completed, a pixel is immediately lit or not lit in accordance with the written video signal. The same operations are performed until the last row, and the address period $T_a1$ ends. Then, an operation proceeds to a signal writing operation of the next subframe period sequentially from a row in which the data holding time ends. Similarly, in the address periods $T_a2$, $T_a4$, and $T_a4$, a video signal is input to the pixel, and lighting and non-lighting of the pixel in the sustain periods $T_s2$, $T_s3$, and $T_s4$ are controlled by the video signal. The end of the sustain period Ts4 is set by the start of an erasing operation. This is because when a signal written to a pixel is erased in an erasing time Te of each row, the pixel is forced to be not lit regardless of the video signal written to the pixel in the address period until another signal is written to the pixel. That is, the data holding time ends from a pixel in which the erasing time $T_e$ starts.

Figures 96A, 96B:
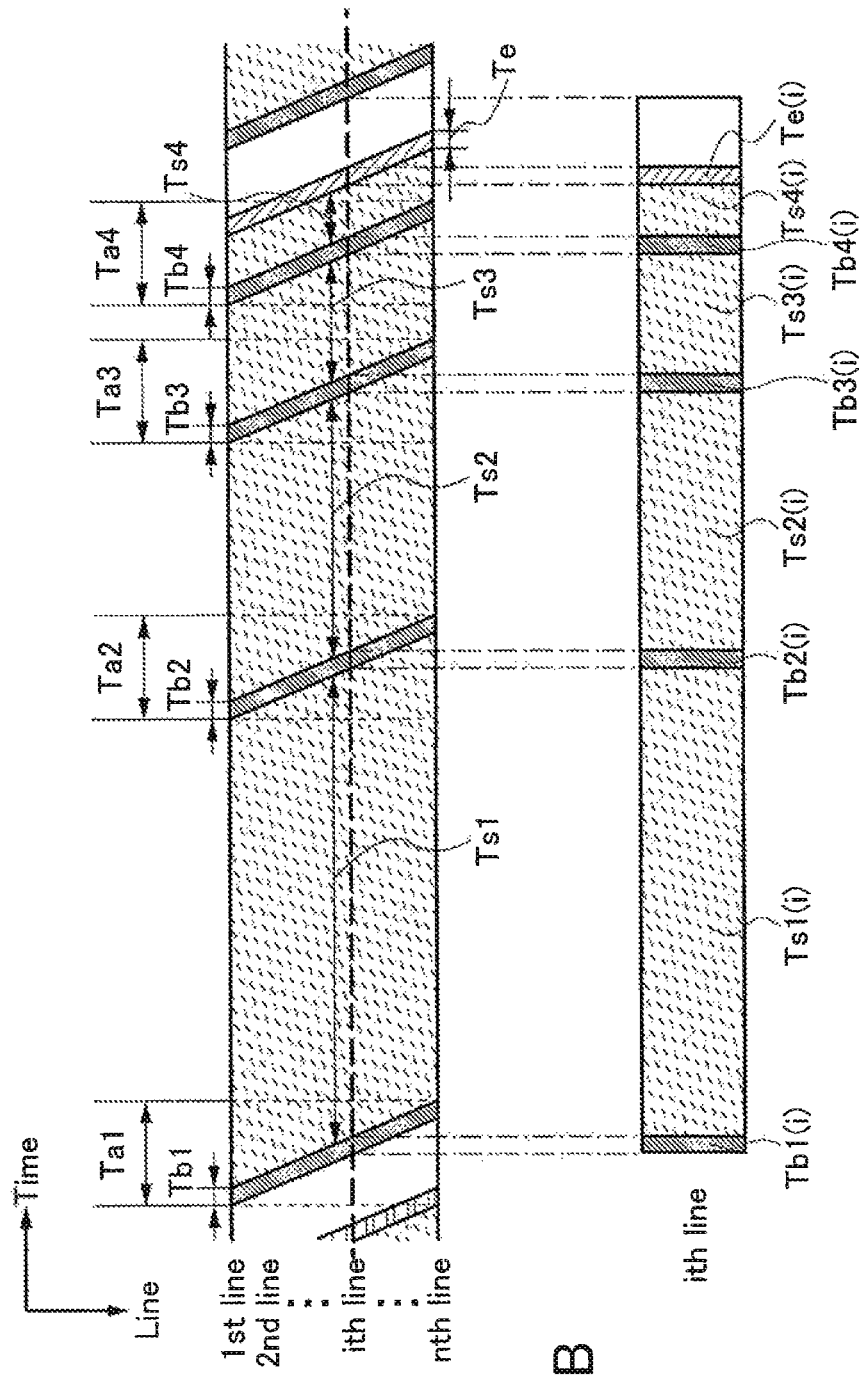
FIGS. 96A and 96B illustrate the present invention.

Here, the i-th pixel row is described with reference to FIG. 96B. In the address period $T_a1$, pixel scan signals are input to scan lines from a first row, and a pixel is selected. Then, in the period $T_b1(i)$, while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in a sustain period $T_s1(i)$ are controlled by the written video signal. That is, the pixel in the i-th row is immediately lit or not lit in accordance with the video signal written to the pixel after the writing operation of the video signal to the i-th row is completed. Similarly, in the address periods $T_a2$, $T_a3$, and $T_a4$, a video signal is input to the pixel in the i-th row, and lighting and non-lighting of the pixel in the i-th row in the sustain periods $T_s2$, $T_s3$, and $T_s4$ are controlled by the video signal. The end of a sustain period $T_s4(i)$ is set by the start of an erasing operation. This is because the pixel is forced to be not lit regardless of the video signal written to the pixel in the i-th row in an erasing time $T_e(i)$ in the i-th row. That is, the data holding time of the pixel in the i-th row ends when the erasing time $T_e(i)$ starts.

Thus, a display device with a high-level gray scale and a high duty ratio (a ratio of a lighting period in one frame period) can be provided, in which data holding time is shorter than an address period without separating the address period and a sustain period. Since instantaneous luminance can be lowered, reliability of a display element can be improved.

Here, the case where a 4-bit gray scale is expressed is described here; however, the number of bits and the number of gray scales are not limited thereto. Note that lighting is not needed to be performed in order of $T_s1$, $T_s2$, $T_s3$, and $T_s4$, and the order may be random or light may be emitted by dividing the whole period into a plurality of periods. The ratio of lighting time of $T_s1$, $T_s2$, $T_s3$, and $T_s4$ is not needed to be a power of two, and may be the same length or slightly different from a power of two.

Next, a structure and an operation of a pixel to which digital time gray scale driving can be applied are described.

Figure 97:
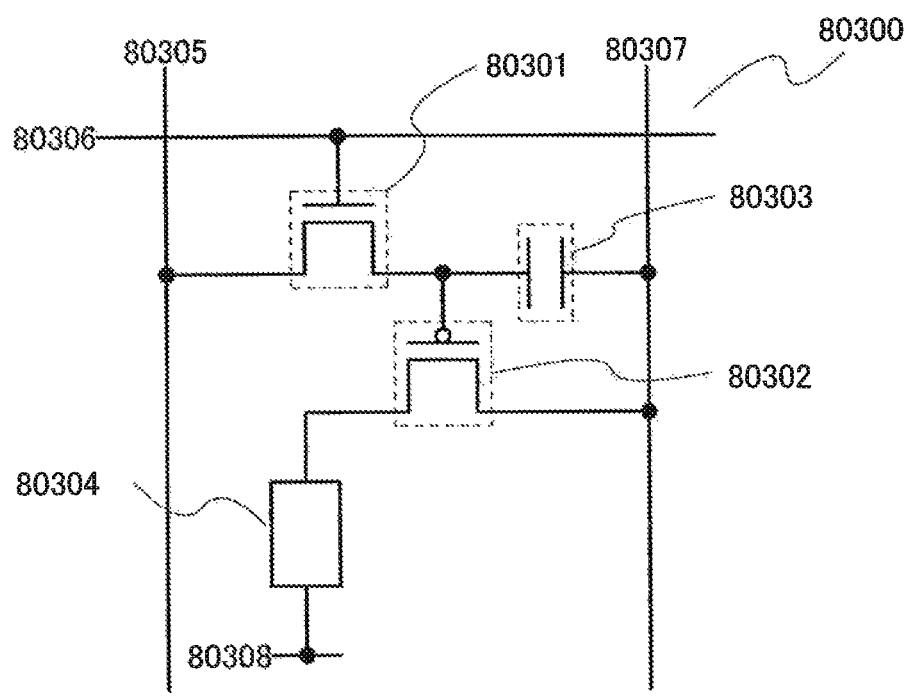
FIG. 97 illustrates the present invention.

FIG. 97 shows an example of a pixel structure to which digital time gray scale driving can be applied.

A pixel 80300 includes a switching transistor 80301, a driving transistor 80302, a light-emitting element 80304, and a capacitor 80303. A gate of the switching transistor 80301 is connected to a scan line 80306; a first electrode (one of a source electrode and a drain electrode) of the switching transistor 80301 is connected to a signal line 80305; and a second electrode (the other of the source electrode and the drain electrode) of the switching transistor 80301 is connected to a gate of the driving transistor 80302. The gate of the driving transistor 80302 is connected to a power supply line 80307 through the capacitor 80303; a first electrode of the driving transistor 80302 is connected to the power supply line 80307; and a second electrode of the driving transistor 80302 is connected to a first electrode (a pixel electrode) of the light-emitting element 80304. A second electrode of the light-emitting element 80304 corresponds to a common electrode 80308.

Note that the second electrode (the common electrode 80308) of the light-emitting element 80304 is set to have a low power supply potential. A low power supply potential refers to a potential satisfying (the low power supply potential)<(a high power supply potential) based on the high power supply potential set to the power supply line 80307. As the low power supply potential, GND, 0 V, or the like may be set, for example. In order to make the light-emitting element 80304 emit light by applying a potential difference between the high power supply potential and the low power supply potential to the light-emitting element 80304 so that current is supplied to the light-emitting element 80304, each of the potentials is set so that the potential difference between the high power supply potential and the low power supply potential is equal to or higher than forward threshold voltage.

Note that gate capacitance of the driving transistor 80302 may be used as a substitute for the capacitor 80303, so that the capacitor 80303 can be omitted. The gate capacitance of the driving transistor 80302 may be formed in a region where a source region, a drain region, an LDD region, or the like overlaps with the gate electrode. Alternatively, capacitance may be formed between a channel region and the gate electrode.

When a pixel is selected by the scan line 80306, that is, when the switching transistor 80301 is on, a video signal is input to the pixel from the signal line 80305. Then, charge for voltage corresponding to the video signal is stored in the capacitor 80303, and the capacitor 80303 maintains the voltage. The voltage is voltage between the gate and the first electrode of the driving transistor 80302 and corresponds to gate-source voltage $V_{gs}$ of the driving transistor 80302.

In general, an operation region of a transistor can be divided into a linear region and a saturation region. When drain-source voltage is denoted by $V_{ds}$, gate-source voltage is denoted by $V_{gs}$, and threshold voltage is denoted by Vth, a boundary between the linear region and the saturation region sets so as to satisfy $(V_{gs}-Vth)=V_{ds}$. When $(V_{gs}-Vth)>V_{ds}$, the transistor operates in a linear region, and a current value is determined in accordance with the level of Vds and Vgs. On the other hand, when $(V_{gs}-Vth)<V_{ds}$, the transistor operates in a saturation region and ideally, a current value hardly changes even when Vds changes. That is, the current value is determined only by the level of Vgs.

Here, in the case of a voltage-input voltage driving method, a video signal is input to the gate of the driving transistor 80302 so that the driving transistor 80302 is in either of two states of being sufficiently turned on and turned off. That is, the driving transistor 80302 operates in a linear region.

Thus, when a video signal which makes the driving transistor 80302 turned on is input, a power supply potential $V_{DD}$ set to the power supply line 80307 without change is ideally set to the first electrode of the light-emitting element 80304.

That is, ideally, constant voltage is applied to the light-emitting element 80304 to obtain constant luminance from the light-emitting element 80304. Then, a plurality of subframe periods are provided in one frame period. A video signal is written to a pixel in each subframe period, lighting and non-lighting of the pixel are controlled in each subframe period, and a gray scale is expressed by the sum of lighting subframe periods.

Note that when the video signal by which the driving transistor 80302 operates in a saturation region is input, current can be supplied to the light-emitting element 80304. When the light-emitting element 80304 is an element luminance of which is determined in accordance with current, luminance decay due to deterioration of the light-emitting element 80304 can be suppressed. Further, when the video signal is an analog signal, current in accordance with the video signal can be supplied to the light-emitting element 80304. In this case, analog gray scale driving can be performed.

Figure 98:
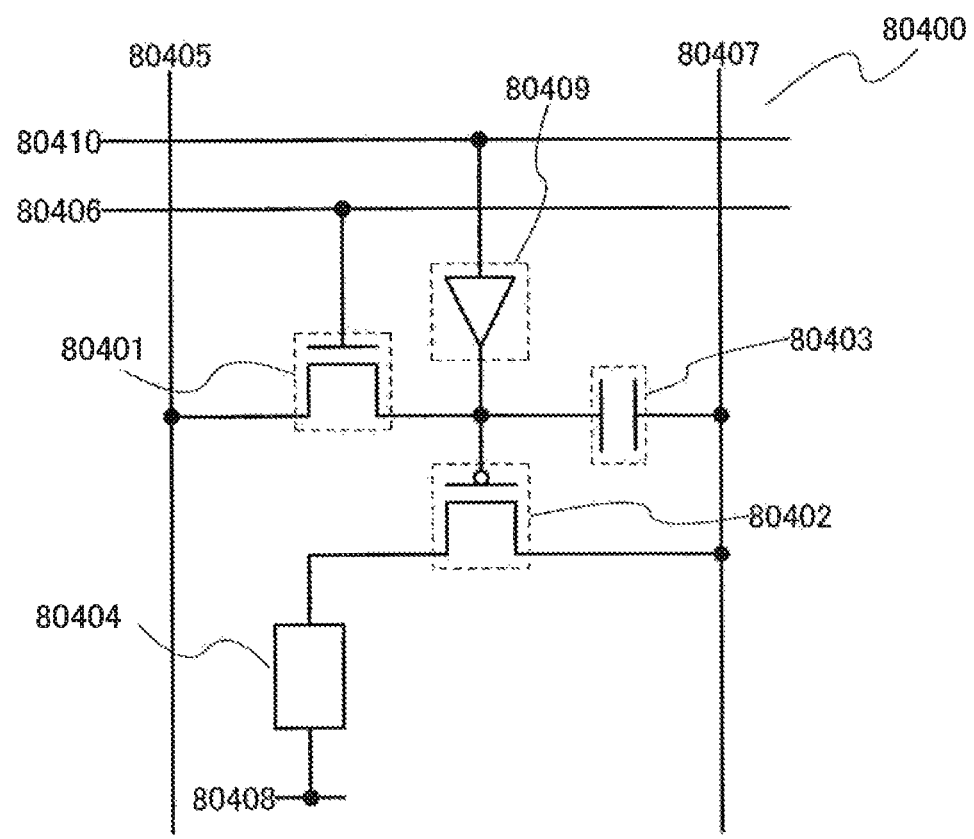
FIG. 98 illustrates the present invention.

FIG. 98 shows another example of a pixel structure to which digital time gray scale driving can be applied.

A pixel 80400 includes a switching transistor 80401, a driving transistor 80402, a capacitor 80403, a light-emitting element 80404, and a rectifier element 80409. A gate of the switching transistor 80401 is connected to a first scan line 80406; a first electrode (one of a source electrode and a drain electrode) of the switching transistor 80401 is connected to a signal line 80405; and a second electrode (the other of the source electrode and the drain electrode) of the switching transistor 80401 is connected to a gate of the driving transistor 80402. The gate of the driving transistor 80402 is connected to a power supply line 80407 through the capacitor 80403, and is also connected to a second scan line 80410 through the rectifier element 80409. A first electrode of the driving transistor 80402 is connected to the power supply line 80407, and a second electrode of the driving transistor 80402 is connected to a first electrode (a pixel electrode) of the light-emitting element 80404. A second electrode of the light-emitting element 80404 corresponds to a common electrode 80408.

The second electrode (the common electrode 80408) of the light-emitting element 80404 is set to have a low power supply potential. Note that a low power supply potential refers to a potential satisfying (the low power supply potential)<(a high power supply potential) based on the high power supply potential set to the power supply line 80407. As the low power supply potential, GND, 0 V, or the like may be set, for example. In order to make the light-emitting element 80404 emit light by applying a potential difference between the high power supply potential and the low power supply potential to the light-emitting element 80404 so that current is supplied to the light-emitting element 80404, each of the potentials is set so that the potential difference between the high power supply potential and the low power supply potential is equal to or higher than forward threshold voltage.

Note that gate capacitance of the driving transistor 80402 may be used as a substitute for the capacitor 80403, so that the capacitor 80403 can be omitted. The gate capacitance of the driving transistor 80402 may be formed in a region where a source region, a drain region, an LDD region, or the like overlaps with the gate electrode. Alternatively, capacitance may be formed between a channel region and the gate electrode.

As the rectifier element 80409, a diode-connected transistor can be used. A PN junction diode, a PIN junction diode, a Schottky diode, a diode formed using a carbon nanotube, or the like may be used other than a diode-connected transistor. A diode-connected transistor may be either an n-channel transistor or a p-channel transistor.

The pixel 80400 is such that the rectifier element 80409 and the second scan line 80410 are added to the pixel shown in FIG. 97. Accordingly, the switching transistor 80401, the driving transistor 80402, the capacitor 80403, the light-emitting element 80404, the signal line 80405, the first scan line 80406, the power supply line 80407, and the common electrode 80408 shown in FIG. 98 correspond to the switching transistor 80301, the driving transistor 80302, the capacitor 80303, the light-emitting element 80304, the signal line 80305, the scan line 80306, the power supply line 80307, and the common electrode 80308 shown in FIG. 97. Accordingly, a writing operation and a light-emitting operation in FIG. 98 are similar to those described in FIG. 97, so that description thereof is omitted.

An erasing operation is described. In the erasing operation, an H-level signal is input to the second scan line 80410. Thus, current is supplied to the rectifier element 80409, and a gate potential of the driving transistor 80402 held by the capacitor 80403 can be set to a certain potential. That is, the potential of the gate of the driving transistor 80402 is set to a certain value, and the driving transistor 80402 can be forcibly turned off regardless of a video signal written to the pixel.

Note that an L-level signal input to the second scan line 80410 has a potential such that current is not supplied to the rectifier element 80409 when a video signal for non-lighting is written to a pixel. An H-level signal input to the second scan line 80410 has a potential such that a potential to turn off the driving transistor 80302 can be set to the gate regardless of a video signal written to a pixel.

As the rectifier element 80409, a diode-connected transistor can be used. A PN junction diode, a PIN junction diode, a Schottky diode, a diode formed using a carbon nanotube, or the like may be used other than a diode-connected transistor. A diode-connected transistor may be either an n-channel transistor or a p-channel transistor.

Figure 99:
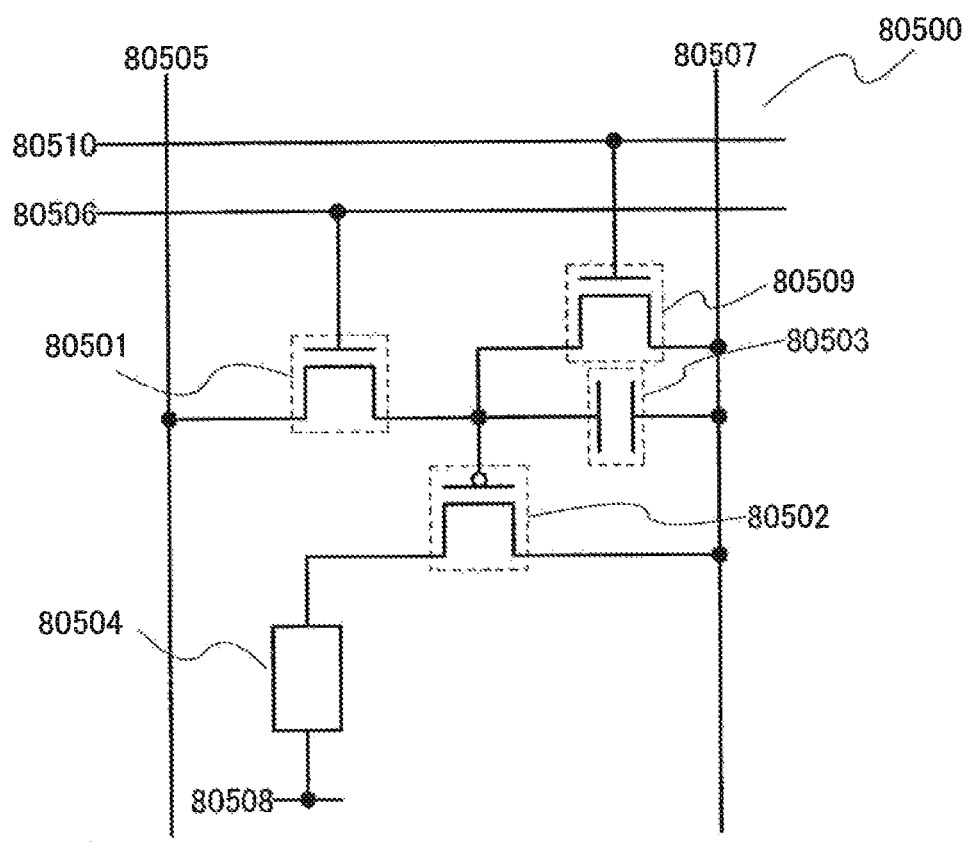
FIG. 99 illustrates the present invention.

FIG. 99 shows another example of a pixel structure to which digital time gray scale driving can be applied.

A pixel 80500 includes a switching transistor 80501, a driving transistor 80502, a capacitor 80503, a light-emitting element 80504, and an erasing transistor 80509. A gate of the switching transistor 80501 is connected to a first scan line 80506, a first electrode (one of a source electrode and a drain electrode) of the switching transistor 80501 is connected to a signal line 80505, and a second electrode (the other of the source electrode and the drain electrode) of the switching transistor 80501 is connected to a gate of the driving transistor 80502. The gate of the driving transistor 80502 is connected to a power supply line 80507 through the capacitor 80503, and is also connected to a first electrode of the erasing transistor 80509. A first electrode of the driving transistor 80502 is connected to the power supply line 80507, and a second electrode of the driving transistor 80502 is connected to a first electrode (a pixel electrode) of the light-emitting element 80504. A gate of the erasing transistor 80509 is connected to a second scan line 80510, and a second electrode of the erasing transistor 80509 is connected to the power supply line 80507. A second electrode of the light-emitting element 80504 corresponds to a common electrode 80508.

The second electrode (the common electrode 80508) of the light-emitting element 80504 is set to have a low power supply potential. Note that a low power supply potential refers to a potential satisfying (the low power supply potential)<(a high power supply potential) based on the high power supply potential set to the power supply line 80507. As the low power supply potential, GND, 0 V, or the like may be set, for example. In order to make the light-emitting element 80504 emit light by applying a potential difference between the high power supply potential and the low power supply potential to the light-emitting element 80504 so that current is supplied to the light-emitting element 80504, each of the potentials is set so that the potential difference between the high power supply potential and the low power supply potential is equal to or higher than forward threshold voltage.

Note that gate capacitance of the driving transistor 80502 may be used as a substitute for the capacitor 80503, so that the capacitor 80503 can be omitted. The gate capacitance of the driving transistor 80502 may be formed in a region where a source region, a drain region, an LDD region, or the like overlaps with the gate electrode. Alternatively, capacitance may be formed between a channel region and the gate electrode.

The pixel 80500 is such that the erasing transistor 80509 and the second scan line 80510 are added to the pixel shown in FIG. 97. Accordingly, the switching transistor 80501, the driving transistor 80502, the capacitor 80503, the light-emitting element 80504, the signal line 80505, the first scan line 80506, the power supply line 80507, and the common electrode 80508 shown in FIG. 99 correspond to the switching transistor 80301, the driving transistor 80302, the capacitor 80303, the light-emitting element 80304, the signal line 80305, the scan line 80306, the power supply line 80307, and the common electrode 80308 shown in FIG. 97. Accordingly, a writing operation and a light-emitting operation in FIG. 99 are similar to those described in FIG. 97, so that description thereof is omitted.

An erasing operation is described. In the erasing operation, an H-level signal is input to the second scan line 80510. Thus, the erasing transistor 80509 is turned on, and the gate and the first electrode of the driving transistor 80502 can be made to have the same potential. That is, Vgs of the driving transistor 80502 can be 0 V. Accordingly, the driving transistor 80502 can be forcibly turned off.

Next, a structure and an operation of a pixel called a threshold voltage compensation pixel are described. A threshold voltage compensation pixel can be applied to digital time gray scale driving and analog gray scale driving.

Figure 100:
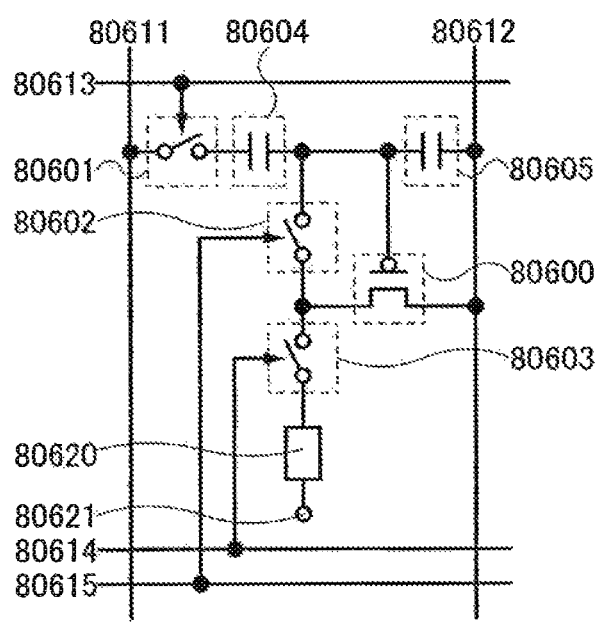
FIG. 100 illustrates the present invention.

FIG. 100 shows an example of a structure of a pixel called a threshold voltage compensation pixel.

The pixel shown in FIG. 100 includes a driving transistor 80600, a first switch 80601, a second switch 80602, a third switch 80603, a first capacitor 80604, a second capacitor 80605, and a light-emitting element 80620. A gate of the driving transistor 80600 is connected to a signal line 80611 through the first capacitor 80604 and the first switch 80601 in that order. Further, the gate of the driving transistor 80600 is connected to a power supply line 80612 through the second capacitor 80605. A first electrode of the driving transistor 80600 is connected to the power supply line 80612. A second electrode of the driving transistor 80600 is connected to a first electrode of the light-emitting element 80620 through the third switch 80603. Further, the second electrode of the driving transistor 80600 is connected to the gate of the driving transistor 80600 through the second switch 80602. A second electrode of the light-emitting element 80620 corresponds to a common electrode 80621.

The second electrode of the light-emitting element 80620 is set to a low power supply potential. Note that a low power supply potential refers to a potential satisfying (the low power supply potential)<(a high power supply potential) based on the high power supply potential set to the power supply line 80612. As the low power supply potential, GND, 0 V, or the like may be set, for example. In order to make the light-emitting element 80620 emit light by applying a potential difference between the high power supply potential and the low power supply potential to the light-emitting element 80620 so that current is supplied to the light-emitting element 80620, each of the potentials is set so that the potential difference between the high power supply potential and the low power supply potential is equal to or higher than forward threshold voltage. Note that gate capacitance of the driving transistor 80600 may be used as a substitute for the second capacitor 80605, so that the second capacitor 80605 can be omitted. The gate capacitance of the driving transistor 80600 may be formed in a region where a source region, a drain region, an LDD region, or the like overlaps with the gate electrode. Alternatively, capacitance may be formed between a channel formation region and the gate electrode. Note that on/off of the first switch 80601, the second switch 80602, and the third switch 80603 is controlled by a first scan line 80613, a second scan line 80614, and a third scan line 80615, respectively.

A method for driving the pixel shown in FIG. 100 is described by dividing an operation period into an initialization period, a data writing period, a threshold acquiring period, and a light-emitting period.

In the initialization period, the second switch 80602 and the third switch 80603 are turned on. Then, a potential of the gate of the driving transistor 80600 is lower than at least a potential of the power supply line 80612. At this time, the first switch 80601 may be either on or off. Note that the initialization period is not necessarily required.

In the threshold acquiring period, a pixel is selected by the first scan line 80613. That is, the first switch 80601 is turned on, and constant voltage is input from the signal line 80611. At this time, the second switch 80602 is turned on and the third switch 80603 is turned off. Accordingly, the driving transistor 80600 is diode-connected, and the second electrode and the gate of the driving transistor 80600 are set in a floating state. Then, a potential of the gate of the driving transistor 80600 is a value obtained by subtracting threshold voltage of the driving transistor 80600 from the potential of the power supply line 80612. Thus, the threshold voltage of the driving transistor 80600 is held in the first capacitor 80604. A potential difference between the potential of the gate of the driving transistor 80600 and the constant voltage input from the signal line 80611 is held in the second capacitor 80605.

In the data writing period, a video signal (voltage) is input from the signal line 80611. At this time, the first switch 80601 is kept on, the second switch 80602 is turned off, and the third switch 80603 is kept off. Since the gate of the driving transistor 80600 is in a floating state, the potential of the gate of the driving transistor 80600 changes depending on a potential difference between the constant voltage input from the signal line 80611 in the threshold acquiring period and the video signal input from the signal line 80611 in the data writing period. For example, when (a capacitance value of the first capacitor 80604)<<(a capacitance value of the second capacitor 80605) is satisfied, the potential of the gate of the driving transistor 80600 in the data writing period is approximately equal to the sum of a potential difference (the amount of change) between the potential of the signal line 80611 in the threshold acquiring period and the potential of the signal line 80611 in the data writing period; and a value obtained by subtracting the threshold voltage of the driving transistor 80600 from the potential of the power supply line 80612. That is, the potential of the gate of the driving transistor 80600 becomes a potential obtained by correcting the threshold voltage of the driving transistor 80600.

In the light-emitting period, current in accordance with a potential difference ($V_{gs}$) between the gate of the driving transistor 80600 and the power supply line 80612 is supplied to the light-emitting element 80620. At this time, the first switch 80601 is turned off, the second switch 80602 is kept off, and the third switch 80603 is turned on. Note that current flowing to the light-emitting element 80620 is constant regardless of the threshold voltage of the driving transistor 80600.

Note that a pixel structure of the present invention is not limited to the pixel structure shown in FIG. 100. For example, a switch, a resistor, a capacitor, a transistor, a logic circuit, or the like may be added to the pixel shown in FIG. 100. For example, the second switch 80602 may include a p-channel transistor or an n-channel transistor, the third switch 80603 may include a transistor with polarity different from that of the second switch 80602, and the second switch 80602 and the third switch 80603 may be controlled by the same scan line.

A structure and an operation of a pixel called a current input pixel are described. A current input pixel can be applied to digital gray scale driving and analog gray scale driving.

Figure 101:
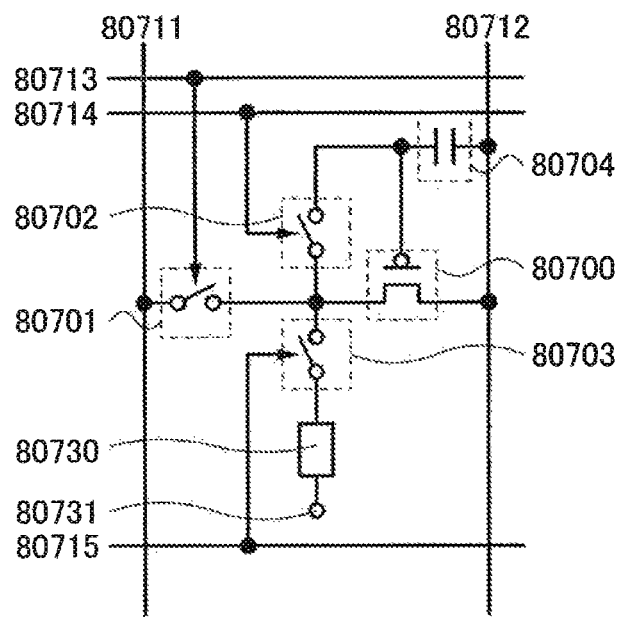
FIG. 101 illustrates the present invention.

FIG. 101 shows an example of a structure of a current input pixel.

The pixel shown in FIG. 101 includes a driving transistor 80700, a first switch 80701, a second switch 80702, a third switch 80703, a capacitor 80704, and a light-emitting element 80730. A gate of the driving transistor 80700 is connected to a signal line 80711 through the second switch 80702 and the first switch 80701 in this order. Further, the gate of the driving transistor 80700 is connected to a power supply line 80712 through the capacitor 80704. A first electrode of the driving transistor 80700 is connected to the power supply line 80712. A second electrode of the driving transistor 80700 is connected to the signal line 80711 through the first switch 80701. Further, the second electrode of the driving transistor 80700 is connected to a first electrode of the light-emitting element 80730 through the third switch 80703. A second electrode of the light-emitting element 80730 corresponds to a common electrode 80731.

The second electrode of the light-emitting element 80730 is set to a low power supply potential. Note that a low power supply potential refers to a potential satisfying (the low power supply potential)<(a high power supply potential) based on the high power supply potential set to the power supply line 80712. As the low power supply potential, GND, 0 V, or the like may be set, for example. In order to make the light-emitting element 80730 emit light by applying a potential difference between the high power supply potential and the low power supply potential to the light-emitting element 80730 so that current is supplied to the light-emitting element 80730, each of the potentials is set so that the potential difference between the high power supply potential and the low power supply potential is equal to or higher than forward threshold voltage. Note that gate capacitance of the driving transistor 80700 may be used as a substitute for the capacitor 80704, so that the capacitor 80704 can be omitted.

The gate capacitance of the driving transistor 80700 may be formed in a region where a source region, a drain region, an LDD region, or the like overlaps with the gate electrode. Alternatively, capacitance may be formed between a channel region and the gate electrode. Note that on/off of the first switch 80701, the second switch 80702, and the third switch 80703 is controlled by a first scan line 80713, a second scan line 80714, and a third scan line 80715, respectively.

A method for driving the pixel shown in FIG. 101 is described by dividing an operation period into a data writing period and a light-emitting period.

In the data writing period, a pixel is selected by the first scan line 80713. That is, the first switch 80701 is turned on, and current is input as a video signal from the signal line 80711. At this time, the second switch 80702 is turned on and the third switch 80703 is turned off. Accordingly, a potential of the gate of the driving transistor 80700 becomes a potential in accordance with the video signal. That is, voltage between the gate electrode and the source electrode of the driving transistor 80700, which is such that the driving transistor 80700 supplies the same current as the video signal, is held in the capacitor 80704.

Next, in the light-emitting period, the first switch 80701 and the second switch 80702 are turned off, and the third switch 80703 is turned on. Thus, current with the same value as the video signal is supplied to the light-emitting element 80730.

Note that the present invention is not limited to the pixel structure shown in FIG. 101. For example, a switch, a resistor, a capacitor, a transistor, a logic circuit, or the like may be added to the pixel shown in FIG. 101. For example, the first switch 80701 may include a p-channel transistor or an n-channel transistor, the second switch 80702 may include a transistor with the same polarity as that of the first switch 80701, and the first switch 80701 and the second switch 80702 may be controlled by the same scan line. The second switch 80702 may be provided between the gate of the driving transistor 80700 and the signal line 80711.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 13)

In this embodiment mode, a pixel structure of a display device is described. In particular, a pixel structure of a display device using an organic EL element is described.

Figure 102A:
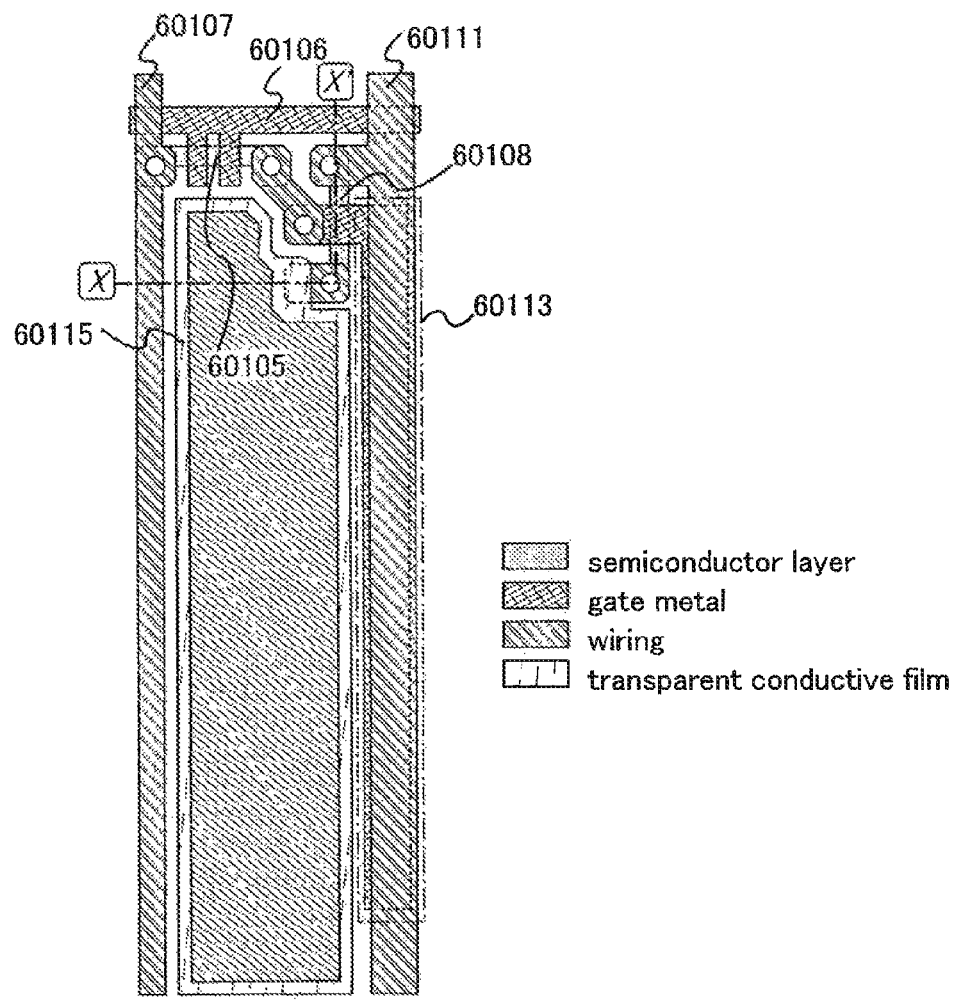
FIGS. 102A and 102B illustrate the present invention.
Figure 102B:
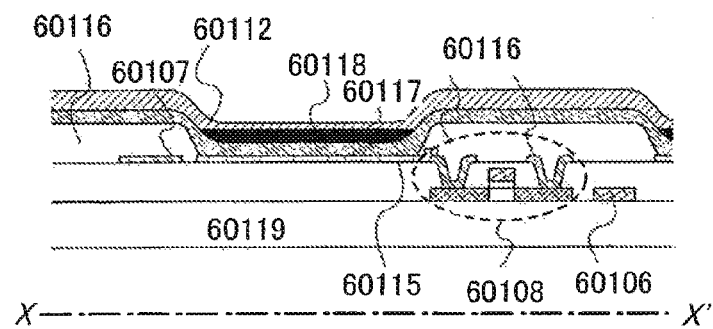

FIG. 102A shows an example of a top plan view (a layout diagram) of a pixel including two transistors. FIG. 102B shows an example of a cross-sectional view along X-X' in FIG. 102A.

FIGS. 102A and 102B show a first transistor 60105, a first wiring 60106, a second wiring 60107, a second transistor 60108, a third wiring 60111, a counter electrode 60112, a capacitor 60113, a pixel electrode 60115, a partition wall 60116, an organic conductive film 60117, an organic thin film 60118, and a substrate 60119. Note that it is preferable that the first transistor 60105 be used as a switching transistor, the first wiring 60106 as a gate signal line, the second wiring 60107 as a source signal line, the second transistor 60108 as a driving transistor, and the third wiring 60111 as a current supply line.

A gate electrode of the first transistor 60105 is electrically connected to the first wiring 60106. One of a source electrode and a drain electrode of the first transistor 60105 is electrically connected to the second wiring 60107. The other of the source electrode and the drain electrode of the first transistor 60105 is electrically connected to a gate electrode of the second transistor 60108 and one electrode of the capacitor 60113. Note that the gate electrode of the first transistor 60105 includes a plurality of gate electrodes. Accordingly, leakage current in the off state of the first transistor 60105 can be reduced.

One of a source electrode and a drain electrode of the second transistor 60108 is electrically connected to the third wiring 60111, and the other of the source electrode and the drain electrode of the second transistor 60108 is electrically connected to the pixel electrode 60115. Accordingly, current flowing through the pixel electrode 60115 can be controlled by the second transistor 60108.

The organic conductive film 60117 is provided over the pixel electrode 60115, and the organic thin film 60118 (an organic compound layer) is provided thereover. The counter electrode 60112 is provided over the organic thin film 60118 (the organic compound layer). Note that the counter electrode 60112 may be formed without patterning so as to be connected to all the pixels in common, or may be patterned using a shadow mask or the like.

Light emitted from the organic thin film 60118 (the organic compound layer) is transmitted through either, the pixel electrode 60115 or the counter electrode 60112.

In FIG. 102B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60115 be formed of a light-transmitting conductive film. On the other hand, in the case of top emission, it is preferable that the counter electrode 60112 be formed of a light-transmitting conductive film.

In a light-emitting device for color display, EL elements having respective light emission colors of R, G, and B may be separately formed, or an EL element with a single color may be formed without patterning and light emission of R, G, and B can be obtained by using a color filter.

Note that the structures shown in FIGS. 102A and 102B are examples, and various structures can be employed for a pixel layout, a cross-sectional structure, a stacking order of electrodes of an EL element, and the like, other than the structures shown in FIGS. 102A and 102B. Further, for a light-emitting layer, various elements such as a crystalline element such as an LED, and an element formed using an inorganic thin film as well as the element formed using the organic thin film shown in the drawing can be used.

Figure 103A:
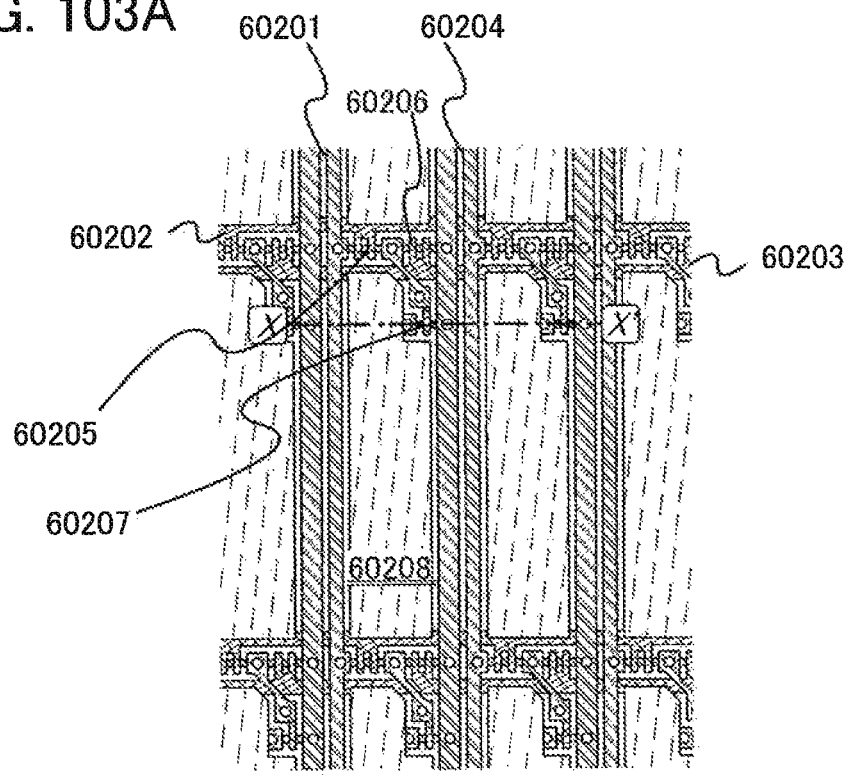
FIGS. 103A and 103B illustrate the present invention.
Figure 103B:
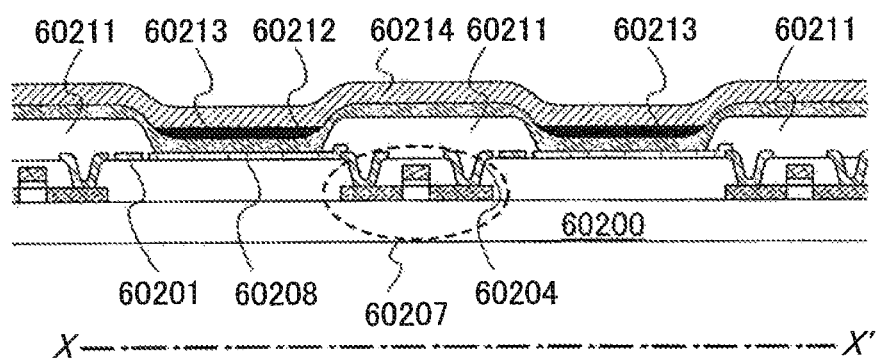

FIG. 103A shows an example of a top plan view (a layout diagram) of a pixel including three transistors. FIG. 103B shows an example of a cross-sectional view along X-X' in FIG. 103A.

FIGS. 103A and 103B show a substrate 60200, a first wiring 60201, a second wiring 60202, a third wiring 60203, a fourth wiring 60204, a first transistor 60205, a second transistor 60206, a third transistor 60207, a pixel electrode 60208, a partition wall 60211, an organic conductive film 60212, an organic thin film 60213, and a counter electrode 60214. Note that it is preferable that the first wiring 60201 be used as a source signal line, the second wiring 60202 as a gate signal line for writing, the third wiring 60203 as a gate signal line for erasing, the fourth wiring 60204 as a current supply line, the first transistor 60205 as a switching transistor, the second transistor 60206 as an erasing transistor, and the third transistor 60207 as a driving transistor.

A gate electrode of the first transistor 60205 is electrically connected to the second wiring 60202. One of a source electrode and a drain electrode of the first transistor 60205 is electrically connected to the first wiring 60201. The other of the source electrode and the drain electrode of the first transistor 60205 is electrically connected to a gate electrode of the third transistor 60207. Note that the gate electrode of the first transistor 60205 includes a plurality of gate electrodes. Accordingly, leakage current in the off state of the first transistor 60205 can be reduced.

A gate electrode of the second transistor 60206 is electrically connected to the third wiring 60203. One of a source electrode and a drain electrode of the second transistor 60206 is electrically connected to the fourth wiring 60204. The other of the source electrode and the drain electrode of the second transistor 60206 is electrically connected to the gate electrode of the third transistor 60207. Note that the gate electrode of the second transistor 60206 includes a plurality of gate electrodes. Accordingly, leakage current in the off state of the second transistor 60206 can be reduced.

One of a source electrode and a drain electrode of the third transistor 60207 is electrically connected to the fourth wiring 60204, and the other of the source electrode and the drain electrode of the third transistor 60207 is electrically connected to the pixel electrode 60208. Accordingly, current flowing through the pixel electrode 60208 can be controlled by the third transistor 60207.

The organic conductive film 60212 is provided over the pixel electrode 60208, and the organic thin film 60213 (an organic compound layer) is provided thereover.

The counter electrode 60214 is provided over the organic thin film 60213 (the organic compound layer). Note that the counter electrode 60214 may be formed without patterning so as to be connected to all the pixels in common, or may be patterned using a shadow mask or the like.

Light emitted from the organic thin film 60213 (the organic compound layer) is transmitted through either the pixel electrode 60208 or the counter electrode 60214.

In FIG. 103B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60208 be formed of a light-transmitting conductive film. On the other hand, in the case of top emission, it is preferable that the counter electrode 60214 be formed of a light-transmitting conductive film.

In a light-emitting device for color display, EL elements having respective light emission colors of R, G, and B may be separately formed, or an EL element with a single color may be formed without patterning and light emission of R, G, and B can be obtained by using a color filter.

Note that the structures shown in FIGS. 103A and 103B are examples, and various structures can be employed for a pixel layout, a cross-sectional structure, a stacking order of electrodes of an EL element, and the like, other than the structures shown in FIGS. 103A and 103B. Further, as a light-emitting layer, various elements such as a crystalline element such as an LED, and an element formed using an inorganic thin film as well as the element formed using the organic thin film shown in the drawing can be used.

Figure 104A:
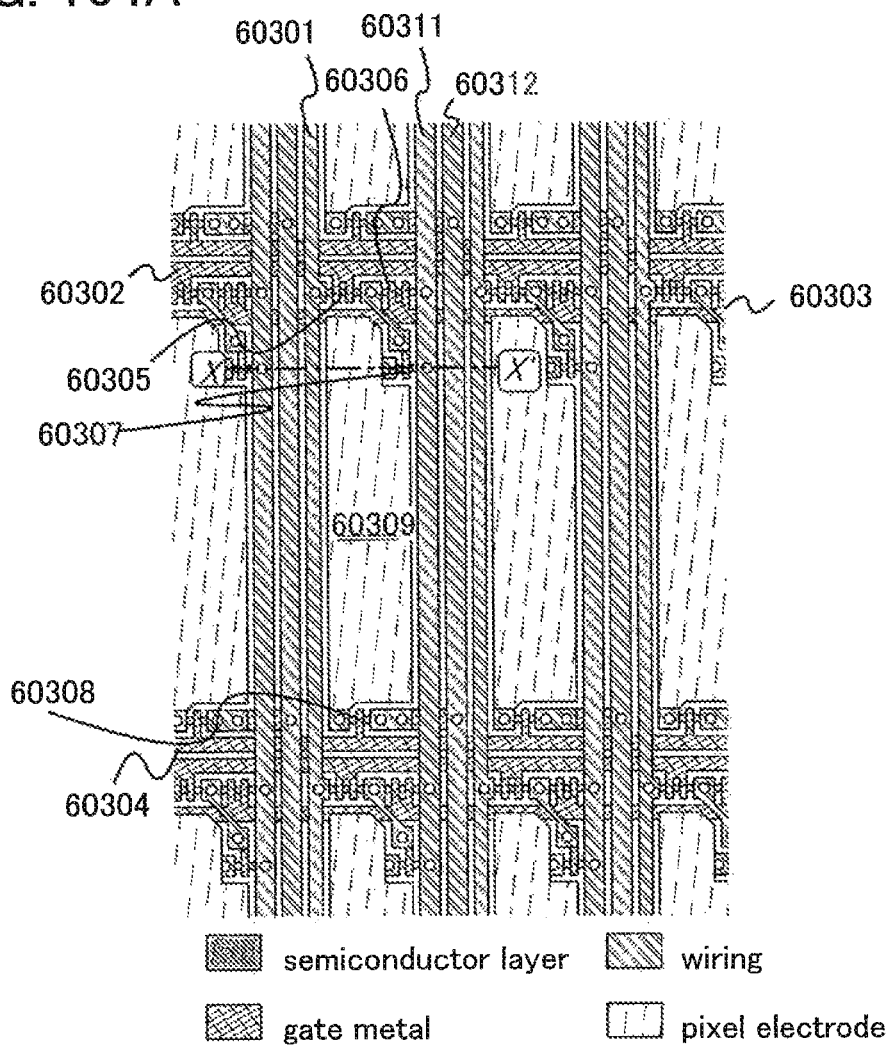
FIGS. 104A and 104B illustrate the present invention.
Figure 104B:
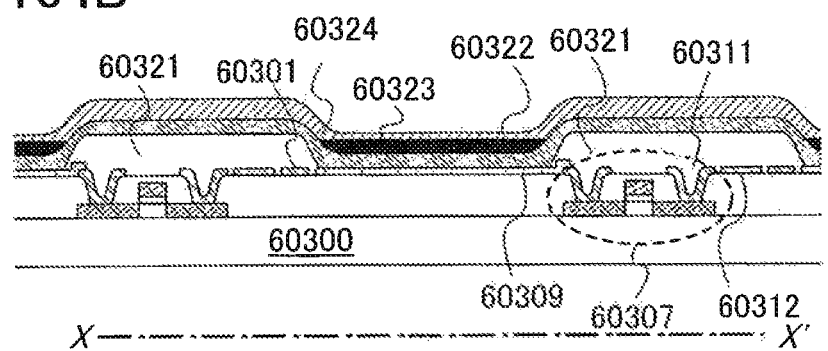

FIG. 104A shows an example of a top plan view (a layout diagram) of a pixel including four transistors. FIG. 104B shows an example of a cross-sectional view along X-X' in FIG. 104A.

FIGS. 104A and 104B show a substrate 60300, a first wiring 60301, a second wiring 60302, a third wiring 60303, a fourth wiring 60304, a first transistor 60305, a second transistor 60306, a third transistor 60307, a fourth transistor 60308, a pixel electrode 60309, a fifth wiring 60311, a sixth wiring 60312, a partition wall 60321, an organic conductive film 60322, an organic thin film 60323, and a counter electrode 60324. Note that it is preferable that the first wiring 60301 be used as a source signal line, the second wiring 60302 as a gate signal line for writing, the third wiring 60303 as a gate signal line for erasing, the fourth wiring 60304 as a signal line for reverse bias, the first transistor 60305 as a switching transistor, the second transistor 60306 as an erasing transistor, the third transistor 60307 as a driving transistor, the fourth transistor 60308 as a transistor for reverse bias, the fifth wiring 60311 as a current supply line, and the sixth wiring 60312 as a power supply line for reverse bias.

A gate electrode of the first transistor 60305 is electrically connected to the second wiring 60302. One of a source electrode and a drain electrode of the first transistor 60305 is electrically connected to the first wiring 60301. The other of the source electrode and the drain electrode of the first transistor 60305 is electrically connected to a gate electrode of the third transistor 60307. Note that the gate electrode of the first transistor 60305 includes a plurality of gate electrodes. Accordingly, leakage current in the off state of the first transistor 60305 can be reduced.

A gate electrode of the second transistor 60306 is electrically connected to the third wiring 60303. One of a source electrode and a drain electrode of the second transistor 60306 is electrically connected to the fifth wiring 60311. The other of the source electrode and the drain electrode of the second transistor 60306 is electrically connected to the gate electrode of the third transistor 60307. Note that the gate electrode of the second transistor 60306 includes a plurality of gate electrodes. Accordingly, leakage current in the off state of the second transistor 60306 can be reduced.

One of a source electrode and a drain electrode of the third transistor 60307 is electrically connected to the fifth wiring 60311, and the other of the source electrode and the drain electrode of the third transistor 60307 is electrically connected to the pixel electrode 60309. Accordingly, current flowing through the pixel electrode 60309 can be controlled by the third transistor 60307.

A gate electrode of the fourth transistor 60308 is electrically connected to the fourth wiring 60304. One of a source electrode and a drain electrode of the fourth transistor 60308 is electrically connected to the sixth wiring 60312. The other of the source electrode and the drain electrode of the fourth transistor 60308 is electrically connected to the pixel electrode 60309. Accordingly, a potential of the pixel electrode 60309 can be controlled by the fourth transistor 60308, so that reverse bias can be applied to the organic conductive film 60322 and the organic thin film 60323. When reverse bias is applied to a light-emitting element including the organic conductive film 60322, the organic thin film 60323, and the like, reliability of the light-emitting element can be significantly improved.

The organic conductive film 60322 is provided over the pixel electrode 60309, and the organic thin film 60323 (an organic compound layer) is provided thereover.

The counter electrode 60324 is provided over the organic thin film 60213 (the organic compound layer). Note that the counter electrode 60324 may be formed without patterning so as to be connected to all the pixels in common, or may be patterned using a shadow mask or the like.

Light emitted from the organic thin film 60323 (the organic compound layer) is transmitted through either the pixel electrode 60309 or the counter electrode 60324.

In FIG. 104B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60309 be formed of a light-transmitting conductive film. On the other hand, in the case of top emission, it is preferable that the counter electrode 60324 be formed of a light-transmitting conductive film.

In a light-emitting device for color display, EL elements having respective light emission colors of R, Q and B may be separately formed, or an EL element with a single color may be formed without patterning and light emission of R, G, and B can be obtained by using a color filter.

Note that the structures shown in FIGS. 104A and 104B are examples, and various structures can be employed for a pixel layout, a cross-sectional structure, a stacking order of electrodes of an EL element, and the like, other than the structures shown in FIGS. 104A and 104B. Further, as a light-emitting layer, various elements such as a crystalline element such as an LED, and an element formed using an inorganic thin film as well as the element formed using the organic thin film shown in the drawing can be used.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 14)

In this embodiment mode, a structure of an EL element is described. In particular, a structure of an organic EL element is described.

A structure of a mixed junction EL element is described. As an example, a structure is described, which includes a layer (a mixed layer) in which a plurality of materials among a hole injecting material, a hole transporting material, a light-emitting material, an electron transporting material, an electron injecting material, and the like are mixed (hereinafter referred to as a mixed junction type EL element), which is different from a stacked-layer structure where a hole injecting layer formed of a hole injecting material, a hole transporting layer formed of a hole transporting material, a light-emitting layer formed of a light-emitting material, an electron transporting layer formed of an electron transporting material, an electron injecting layer formed of an electron injecting material, and the like are clearly distinguished.

FIGS. 105A to 105E are schematic views each showing a structure of a mixed junction type EL element. Note that a layer interposed between an anode 190101 and a cathode 190102 corresponds to an EL layer.

Figure 105A:
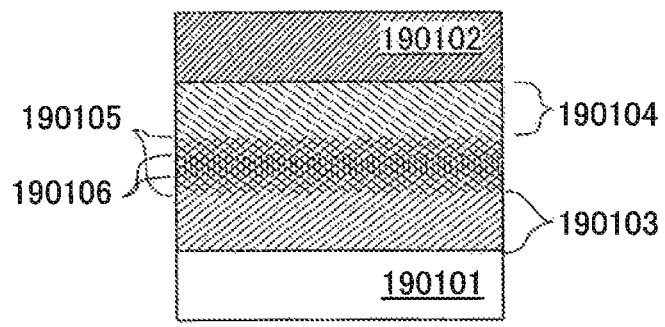
FIGS. 105A and 105E each illustrate the present invention.

FIG. 105A shows a structure in which an EL layer includes a hole transporting region 190103 formed of a hole transporting material and an electron transporting region 190104 formed of an electron transporting material. The hole transporting region 190103 is closer to the anode than the electron transporting region 190104. A mixed region 190105 including both the hole transporting material and the electron transporting material is provided between the hole transporting region 190103 and the electron transporting region 190104.

In a direction from the anode 190101 to the cathode 190102, a concentration of the hole transporting material in the mixed region 190105 is decreased and a concentration of the electron transporting material in the mixed region 190105 is increased.

Note that a concentration gradient can be freely set. For example, a ratio of concentrations of each functional material may be changed (a concentration gradient may be formed) in the mixed region 190105 including both the hole transporting material and the electron transporting material, without including the hole transporting region 190103 formed of only the hole transporting material. Alternatively, a ratio of concentrations of each functional material may be changed (a concentration gradient may be formed) in the mixed region 190105 including both the hole transporting material and the electron transporting material, without including the hole transporting region 190103 formed of only the hole transporting material and the electron transporting region 190104 formed of only the electron transporting material. Further alternatively, a ratio of concentrations may be changed depending on a distance from the anode or the cathode. Note that the ratio of concentrations may be changed continuously.

A region 190106 to which a light-emitting material is added is included in the mixed region 190105. A light emission color of the EL element can be controlled by the light-emitting material. Further, carriers can be trapped by the light-emitting material. As the light-emitting material, various fluorescent dyes as well as a metal complex having a quinoline skeleton, a benzoxazole skeleton, or a benzothiazole skeleton can be used. The light emission color of the EL element can be controlled by adding the light-emitting material.

As the anode 190101, an electrode material having a high work function is preferably used in order to inject holes efficiently. For example, a transparent electrode formed using indium tin oxide (ITO), indium zinc oxide (IZO), ZnO, $SnO_2$, $In_2O_3$, or the like can be used. When a light-transmitting property is not needed, the anode 190101 may be formed using an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum ($Alq_3$)), or the like can be used.

As the cathode 190102, an electrode material having a low work function is preferably used in order to inject electrons efficiently. A metal such as aluminum, indium, magnesium, silver, calcium, barium, or lithium can be used by itself. Alternatively, an alloy of the aforementioned metal or an alloy of the aforementioned metal and another metal may be used.

Figure 105B:
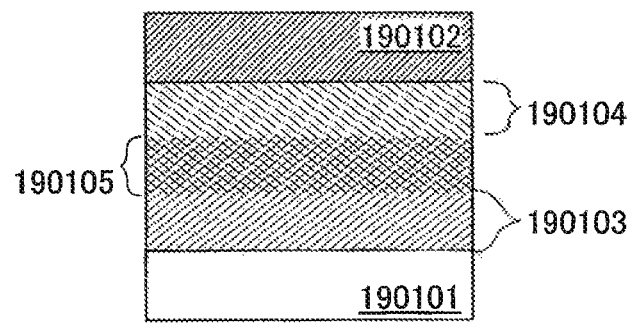

FIG. 105B is the schematic view of the structure of the EL element, which is different from that of FIG. 105A. Note that the same portions as those in FIG. 105A are denoted by the same reference numerals, and description thereof is omitted.

In FIG. 105B, a region to which a light-emitting material is added is not included. However, when a material (electron-transporting and light-emitting material) having both an electron transporting property and a light-emitting property, for example, tris(8-quinolinolato)aluminum ($Alq_3$) is used as a material added to the electron transporting region 190104, light emission can be performed.

Alternatively, as a material added to the hole transporting region 190103, a material (a hole-transporting and light-emitting material) having both a hole transporting property and a light-emitting property may be used.

Figure 105C:
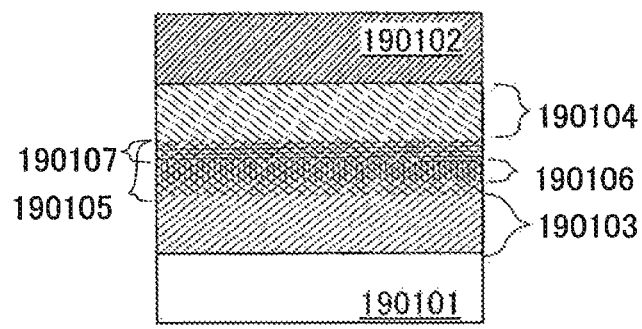

FIG. 105C is the schematic view of the structure of the EL element, which is different from those of FIGS. 105A and 105B. Note that the same portions as those in FIGS. 105A and 105B are denoted by the same reference numerals, and description thereof is omitted.

In FIG. 105C, a region 190107 included in the mixed region 190105 is provided, to which a hole blocking material having a larger energy difference between the highest occupied molecular orbital and the lowest unoccupied molecular orbital than the hole transporting material is added. The region 190107 to which the hole blocking material is added is provided closer to the cathode 190102 than the region 190106 in the mixed region 190105, to which the light-emitting material is added; thus, a recombination rate of carriers can be increased, and light emission efficiency can be increased. The structure provided with the region 190107 to which the hole blocking material is added is especially effective in an EL element which utilizes light emission (phosphorescence) by a triplet exciton.

Figure 105D:
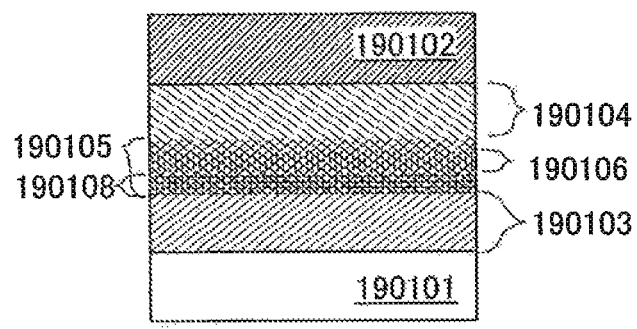

FIG. 105D is the schematic view of the structure of the EL element, which is different from those of FIGS. 105A to 105C. Note that the same portions as those in FIGS. 105A to 105C are denoted by the same reference numerals, and description thereof is omitted.

In FIG. 105D, a region 190108 included in the mixed region 190105 is provided, to which an electron blocking material having a larger energy difference between the highest occupied molecular orbital and the lowest unoccupied molecular orbital than the electron transporting material is added. The region 190108 to which the electron blocking material is added is provided closer to the anode 190101 than the region 190106 in the mixed region 190105, to which the light-emitting material is added; thus, a recombination rate of carriers can be increased, and light emission efficiency can be increased. The structure provided with the region 190108 to which the electron blocking material is added is especially effective in an EL element which utilizes light emission (phosphorescence) by a triplet exciton.

Figure 105E:
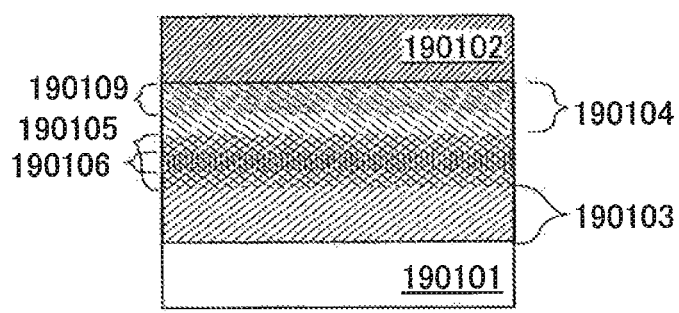

FIG. 105E is the schematic view of the structure of the mixed junction type EL element, which is different from those of FIGS. 105A to 105D. FIG. 105E shows an example of a structure where a region 190109 to which a metal material is added is included in part of an EL layer in contact with an electrode of the EL element. In FIG. 105E, the same portions as those in FIGS. 105A to 105D are denoted by the same reference numerals, and description thereof is omitted. In the structure shown in FIG. 105E, MgAg (an Mg—Ag alloy) may be used as the cathode 190102, and the region 190109 to which an Al (aluminum) alloy is added may be included in a region of the electron transporting region 190104 to which the electron transporting material is added, which is in contact with the cathode 190102, for example. With the aforementioned structure, oxidation of the cathode can be prevented, and electron injection efficiency from the cathode can be increased. Accordingly, the lifetime of the mixed junction type EL element can be extended. Further, driving voltage can be lowered.

As a method for forming the mixed junction type EL element, a co-evaporation method or the like can be used.

In the mixed junction type EL elements as shown in FIGS. 105A to 105E, a clear interface between the layers does not exist, and charge accumulation can be reduced. Accordingly, the lifetime of the EL element can be extended. Further, driving voltage can be lowered.

Note that the structures shown in FIGS. 105A to 105E can be implemented in free combination with each other.

In addition, a structure of the mixed junction type EL element is not limited to those described above. A known structure can be freely used.

An organic material which forms an EL layer of an EL element may be a low molecular material or a high molecular material. Alternatively, both the materials may be used. When a low molecular material is used for an organic compound material, a film can be formed by an evaporation method. When a high molecular material is used for the EL layer, the high molecular material is dissolved in a solvent and a film can be formed by a spin coating method or an inkjet method.

The EL layer may be formed using a middle molecular material. In this specification, a middle molecule organic light-emitting material refers to an organic light-emitting material without a sublimation property and with a polymerization degree of approximately 20 or less. When a middle molecular material is used for the EL layer, a film can be formed by an inkjet method or the like.

Note that a low molecular material, a high molecular material, and a middle molecular material may be used in combination.

An EL element may utilize either light emission (fluorescence) by a singlet exciton or light emission (phosphorescence) by a triplet exciton.

Next, an evaporation device for manufacturing a display device is described with reference to the drawings.

A display device may be manufactured to include an EL layer. The EL layer is formed including at least partially a material which exhibits electroluminescence. The EL layer may be formed of a plurality of layers having different functions. In this case, the EL layer may be formed of a combination of layers having different functions, which are also referred to as a hole injecting and transporting layer, a light-emitting layer, an electron injecting and transporting layer, and the like.

Figure 106:
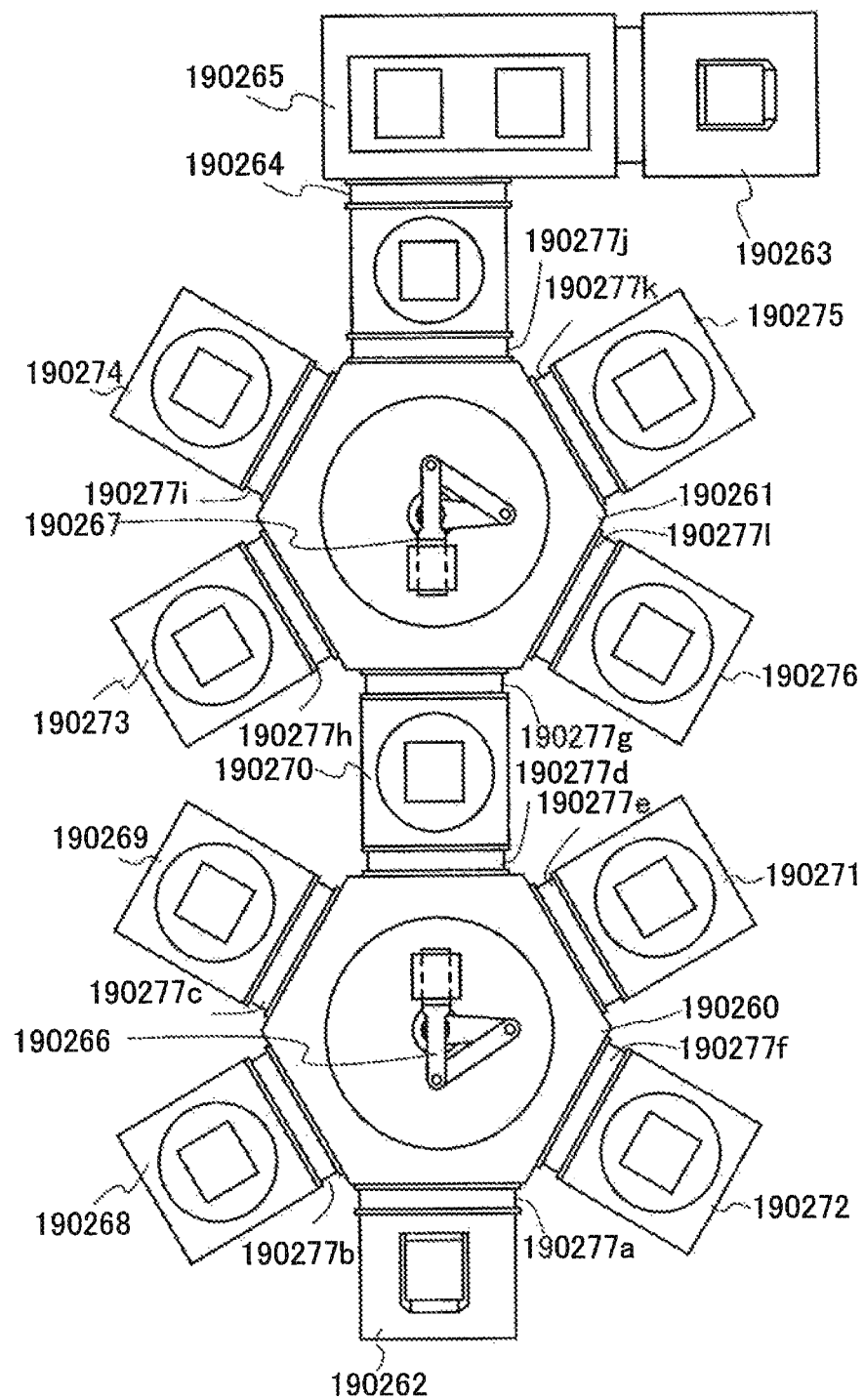
FIG. 106 illustrates the present invention.

FIG. 106 shows a structure of an evaporation device for forming an EL layer over an element substrate provided with a transistor. In the evaporation device, a plurality of treatment chambers are connected to transfer chambers 190260 and 190261. Each treatment chamber includes a loading chamber 190262 for supplying a substrate, an unloading chamber 190263 for collecting the substrate, a heat treatment chamber 190268, a plasma treatment chamber 190272, deposition treatment chambers 190269 to 190275 for depositing an EL material, and a deposition treatment chamber 190276 for forming a conductive film which is formed of aluminum or contains aluminum as its main component as one electrode of an EL element. Gate valves 190277a to 190277m are provided between the transfer chambers and the treatment chambers, so that the pressure in each treatment chamber can be controlled independently, and cross contamination between the treatment chambers is prevented.

A substrate introduced into the transfer chamber 190260 from the loading chamber 190262 is transferred to a predetermined treatment chamber by an arm type transfer means 190266 capable of rotating. The substrate is transferred from a certain treatment chamber to another treatment chamber by the transfer means 190266. The transfer chambers 190260 and 190261 are connected by the deposition treatment chamber 190270 at which the substrate is transported by the transfer means 190266 and a transfer means 190267.

Each treatment chamber connected to the transfer chambers 190260 and 190261 is maintained in a reduced pressure state. Accordingly, in the evaporation device, deposition treatment of an EL layer is continuously performed without exposing the substrate to the room air. A display panel in which formation of the EL layer is finished is deteriorated due to moisture or the like in some cases. Accordingly, in the evaporation device, a sealing treatment chamber 190265 for performing sealing treatment before exposure to the room air in order to maintain the quality is connected to the transfer chamber 190261. Since the sealing treatment chamber 190265 is under atmospheric pressure or reduced pressure near atmospheric pressure, an intermediate treatment chamber 190264 is also provided between the transfer chamber 190261 and the sealing treatment chamber 190265. The intermediate treatment chamber 190264 is provided for transporting the substrate and buffering the pressure between the chambers.

An exhaust means is provided in the loading chamber, the unloading chamber, the transfer chamber, and the deposition treatment chamber in order to maintain reduced pressure in the chamber. As the exhaust means, various vacuum pumps such as a dry pump, a turbo-molecular pump, and a diffusion pump can be used.

In the evaporation device in FIG. 106, the number of treatment chambers connected to the transfer chambers 190260 and 190261 and structures thereof can be combined as appropriate in accordance with a stacked-layer structure of the EL element. An example of a combination is described below.

In the heat treatment chamber 190268, degasification treatment is performed by heating a substrate over which a lower electrode, an insulating partition wall, or the like is formed. In the plasma treatment chamber 190272, a surface of the lower electrode is treated with a rare gas or oxygen plasma. This plasma treatment is performed for cleaning the surface, stabilizing a surface state, or stabilizing a physical or chemical state (e.g., a work function) of the surface.

The deposition treatment chamber 190269 is for forming an electrode buffer layer which is in contact with one electrode of the EL element. The electrode buffer layer has a carrier injection property (hole injection or electron injection) and suppresses generation of a short-circuit or a black spot defect of the EL element. Typically, the electrode buffer layer is formed of an organic-inorganic hybrid material, has a resistivity of $5\times10^4$ to $1\times10^6$ Ωcm, and is formed having a thickness of 30 to 300 nm. Note that the deposition treatment chamber 190271 is for forming a hole transporting layer.

A light-emitting layer in an EL element has a different structure between the case of emitting single color light and the case of emitting white light. Deposition treatment chambers in the evaporation device are preferably arranged depending on the structure. For example, when three kinds of EL elements each having a different light emission color are formed in a display panel, it is necessary to form light-emitting layers corresponding to respective light emission colors. In this case, the deposition treatment chamber 190270 can be used for forming a first light-emitting layer, the deposition treatment chamber 190273 can be used for forming a second light-emitting layer, and the deposition treatment chamber 190274 can be used for forming a third light-emitting layer. When different deposition treatment chambers are used for respective light-emitting layers, cross contamination due to different light-emitting materials can be prevented, and throughput of the deposition treatment can be improved.

Note that three kinds of EL elements each having a different light emission color may be sequentially deposited in each of the deposition treatment chambers 190270, 190273, and 190274. In this case, evaporation is performed by moving a shadow mask depending on a region to be deposited.

When an EL element which emits white light is formed, the EL element is formed by vertically stacking light-emitting layers of different light emission colors. In this case also, the element substrate can be sequentially transferred through the deposition treatment chambers so that each light-emitting layer is formed. Alternatively, different light-emitting layers can be formed continuously in the same deposition treatment chamber.

In the deposition treatment chamber 190276, an electrode is formed over the EL layer. The electrode can be formed by an electron beam evaporation method or sputtering, and preferably by a resistance heating evaporation method.

The element substrate in which formation of the electrode is finished is transferred to the sealing treatment chamber 190265 through the intermediate treatment chamber 190264. The sealing treatment chamber 190265 is filled with an inert gas such as helium, argon, neon, or nitrogen, and a sealing substrate is attached to a side of the element substrate where the EL layer is formed under the atmosphere so that the EL layer is sealed. In a sealed state, a space between the element substrate and the sealing substrate may be filled with an inert gas or a resin material. The sealing treatment chamber 190265 is provided with a dispenser which draws a sealing material, a mechanical element such as an arm or a fixing stage which fixes the sealing substrate to face the element substrate, a dispenser or a spin coater which fills the chamber with a resin material, or the like.

Figure 107:
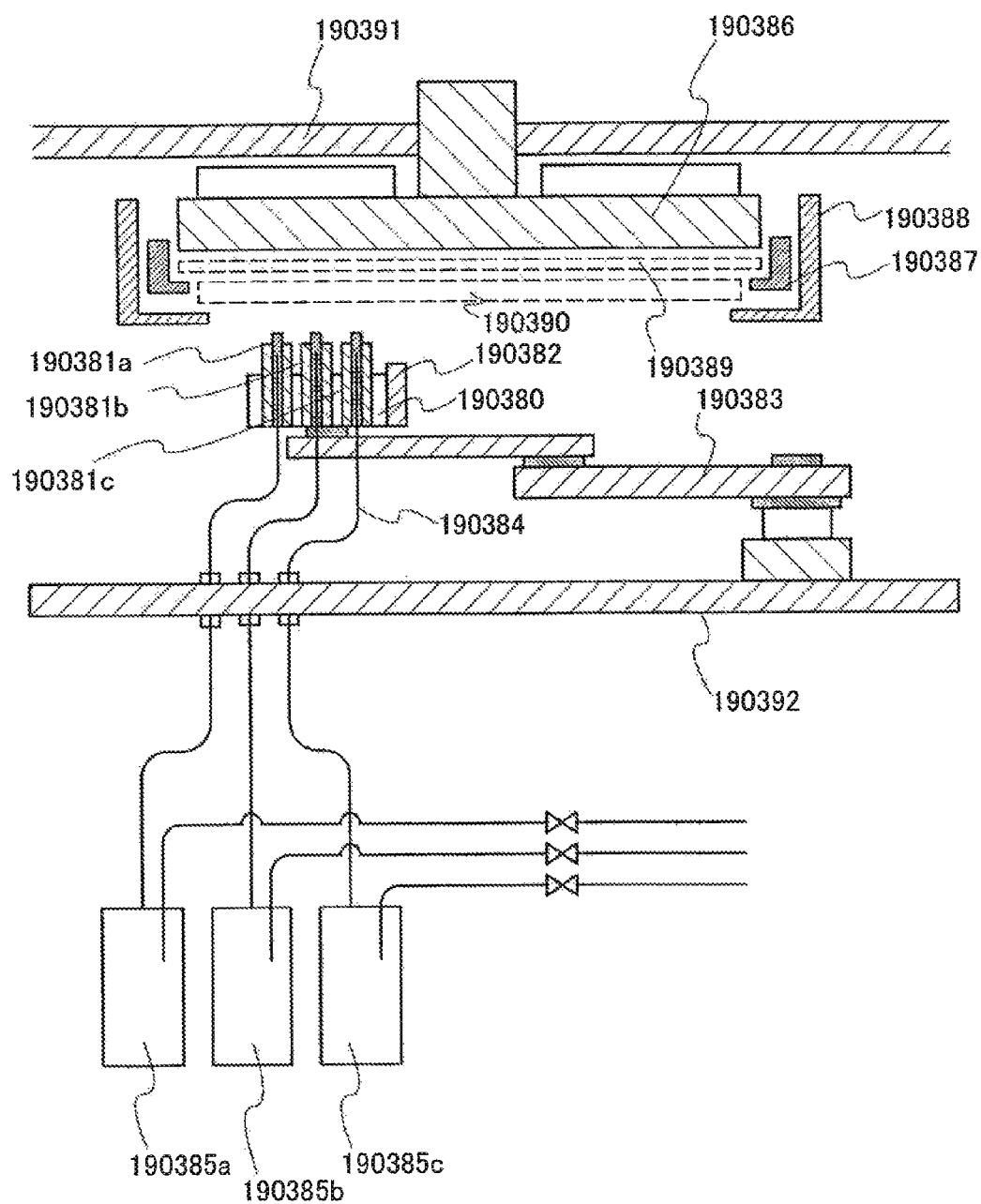
FIG. 107 illustrates the present invention.

FIG. 107 shows an internal structure of a deposition treatment chamber. The deposition treatment chamber is maintained in a reduced pressure state. In FIG. 107, a space interposed between a top plate 190391 and a bottom plate 190392 corresponds to an internal space of the chamber, which is maintained in a reduced pressure state.

One or a plurality of evaporation sources are provided in the treatment chamber. This is because a plurality of evaporation sources are preferably provided when a plurality of layers having different compositions are formed or when different materials are co-evaporated. In FIG. 107, evaporation sources 190381a, 190381b, and 190381c are attached to an evaporation source holder 190380. The evaporation source holder 190380 is held by a multi joint arm 190383. The multi joint arm 190383 allows the evaporation source holder 190380 to move within its movable range by stretching the joint. Alternatively, the evaporation source holder 190380 may be provided with a distance sensor 190382 to monitor a distance between the evaporation sources 190381a to 190381c and a substrate 190389 so that an optimal distance for evaporation is controlled. In this case, the multi-joint arm may be capable of moving toward upper and lower directions (Z direction) as well.

The substrate 190389 is fixed by using a substrate stage 190386 and a substrate chuck 190387 together. The substrate stage 190386 may have a structure where a heater is incorporated so that the substrate 190389 can be heated. The substrate 190389 is fixed to the substrate stage 190386 with the support of the substrate chuck 190387 and is transferred. At the time of evaporation, a shadow mask 190390 provided with an opening corresponding to an evaporation pattern can be used when needed. In this case, the shadow mask 190390 is arranged between the substrate 190389 and the evaporation sources 190381a to 190381c. The shadow mask 190390 adheres to the substrate 190389 or is fixed to the substrate 190389 with a certain interval therebetween by a mask chuck 190388. When alignment of the shadow mask 190390 is needed, the alignment is performed by arranging a camera in the treatment chamber and providing the mask chuck 190388 with a positioning means which slightly moves in X-Y-θ directions.

Each of the evaporation sources 190381a to 190381c is provided with an evaporation material supply means which continuously supplies an evaporation material to the evaporation source. The evaporation material supply means includes material supply sources 190385a, 190385b, and 190385c, which are provided apart from the evaporation sources 190381a, 190381b, and 190381c, and a material supply pipe 190384 which connects the evaporation source and the material supply source. Typically, the material supply sources 190385a to 190385c are provided corresponding to the evaporation sources 190381a to 190381c. In FIG. 74, the material supply source 190385a corresponds to the evaporation source 190381a, the material supply source 190385b corresponds to the evaporation source 190381b, and the material supply source 190385c corresponds to the evaporation source 190381c.

As a method for supplying an evaporation material, an airflow transfer method, an aerosol method, or the like can be employed. In an airflow transfer method, impalpable powder of an evaporation material is transferred in airflow to the evaporation sources 190381a to 190381c by using an inert gas or the like. In an aerosol method, evaporation is performed while material liquid in which an evaporation material is dissolved or dispersed in a solvent is transferred and aerosolized by an atomizer and the solvent in the aerosol is vaporized. In each case, the evaporation sources 190381a to 190381c are provided with a heating means, and a film is formed over the substrate 190389 by vaporizing the transferred evaporation material. In FIG. 107, the material supply pipe 190384 can be bent flexibly and is formed of a thin pipe which has enough rigidity not to be transformed even under reduced pressure.

When an airflow transfer method or an aerosol method is employed, film formation may be performed in the deposition treatment chamber under atmospheric pressure or lower, and preferably under a reduced pressure of 133 to 13300 Pa. The pressure can be adjusted while an inert gas such as helium, argon, neon, krypton, xenon, or nitrogen fills the deposition treatment chamber or is supplied (and exhausted at the same time) to the deposition treatment chamber. Note that an oxidizing atmosphere may be employed by introducing a gas such as oxygen or nitrous oxide in the deposition treatment chamber where an oxide film is formed. Alternately, a reducing atmosphere may be employed by introducing a gas such as hydrogen in the deposition treatment chamber where an organic material is deposited.

As another method for supplying an evaporation material, a screw may be provided in the material supply pipe 190384 to continuously push the evaporation material toward the evaporation source.

With this evaporation device, a film can be formed continuously with high uniformity even in the case of a large display panel. Since it is not necessary to supply an evaporation material to the evaporation source every time the evaporation material is run out, throughput can be improved.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 15)

In this embodiment mode, a structure of an EL element is described. In particular, a structure of an inorganic EL element is described.

An inorganic EL element is classified as either a dispersion type inorganic EL element or a thin-film type inorganic EL element, depending on its element structure. These elements differ in that the former includes an electroluminescent layer in which particles of a light-emitting material are dispersed in a binder, whereas the latter includes an electroluminescent layer formed of a thin film of a light-emitting material. However, the former and the latter have in common in that they need electrons accelerated by a high electric field. Note that mechanisms for obtaining light emission are donor-acceptor recombination light emission which utilizes a donor level and an acceptor level; and localized light emission which utilizes inner-shell electron transition of a metal ion. In general, donor-acceptor recombination light emission is employed in dispersion type inorganic EL elements and localized light emission is employed in thin-film type inorganic EL elements in many cases.

A light-emitting material includes a base material and an impurity element to be a luminescence center. Light emission of various colors can be obtained by changing the impurity element to be included. The light-emitting material can be formed using various methods, such as a solid phase method or a liquid phase method (a coprecipitation method). Further, a liquid phase method such as a spray pyrolysis method, a double decomposition method, a method employing precursor pyrolysis, a reverse micelle method, a method in which one or more of these methods are combined with high-temperature baking, or a freeze-drying method, or the like can be used.

A solid phase method is a method in which a base material and an impurity element or a compound containing an impurity element are weighed, mixed in a mortar, and heated and baked in an electric furnace so as to be reacted; thus, the impurity element is included in the base material. The baking temperature is preferably 700 to 1500° C. This is because a solid-phase reaction does not proceed when the temperature is too low, and the base material decomposes when the temperature is too high. Note that although the materials may be baked in powder form, they are preferably baked in pellet form. Although a solid phase method needs a comparatively high temperature, it is a simple method, and thus has high productivity and is suitable for mass production.

A liquid phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the particles are small and the baking temperature is low.

As a base material to be used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (MN), gallium nitride (GaN), indium nitride (InN), or the like can be used, for example. Further, zinc selenide (ZnSe), zinc telluride (ZnTe), or the like; or a ternary mixed crystal such as calcium gallium sulfide ($CaGa_2S_4$), strontium gallium sulfide ($SrGa_2S_4$), or barium gallium sulfide ($BaGa_2S_4$) may be used.

As a luminescence center for localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added for charge compensation.

On the other hand, as a luminescence center for donor-acceptor recombination light emission, a light-emitting material including a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

When the light-emitting material for donor-acceptor recombination light emission is synthesized by a solid phase method, a base material, the first impurity element or a compound containing the first impurity element, and the second impurity element or a compound containing the second impurity element are weighed, mixed in a mortar, and heated and baked in an electric furnace. As the base material, the aforementioned base material can be used. As the first impurity element or the compound containing the first impurity element, fluorine (F), chlorine (Cl), aluminum sulfide ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because a solid-phase reaction does not proceed when the temperature is too low, and the base material decomposes when the temperature is too high. Note that although the materials may be baked in powder form, they are preferably baked in pellet form.

As the impurity element in the case of using a solid phase reaction, compounds including the first impurity element and the second impurity element may be used in combination. In this case, the impurity elements are easily diffused, and the solid phase reaction proceeds readily, so that a uniform light-emitting material can be obtained. Further, since an unnecessary impurity element is not included, a light-emitting material with high purity can be obtained. As the compound including the first impurity element and the second impurity element, copper chloride (CuCl), silver chloride (AgCl), or the like can be used, for example.

Note that the concentration of these impurity elements is in the range of 0.01 to 10 at. %, and is preferably in the range of 0.05 to 5 at. % with respect to the base material.

In the case of a thin-film type inorganic EL element, an electroluminescent layer includes the aforementioned light-emitting material, and can be famed using a physical vapor deposition (PVD) method such as sputtering or a vacuum evaporation method, for example, a resistance heating evaporation method or an electron beam evaporation (EB evaporation) method, a chemical vapor deposition (CVD) method such as a metal organic CVD method or a low-pressure hydride transport CVD method, an atomic layer epitaxy (ALE) method, or the like.

Figure 108A:
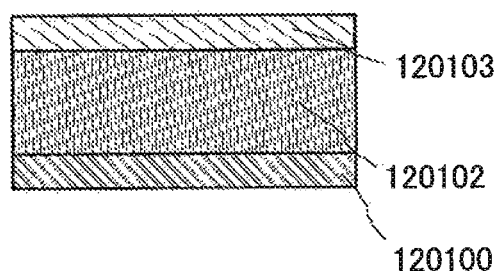
FIGS. 108A to 108C each illustrate the present invention.
Figure 108B:
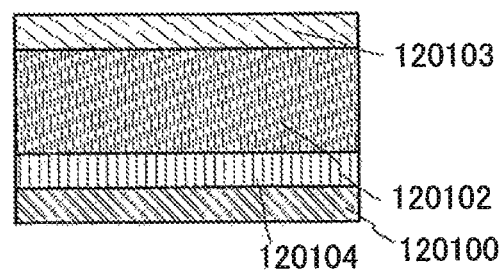
Figure 108C:
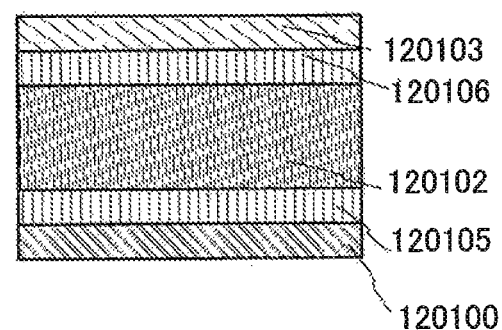

FIGS. 108A to 108C each show an example of a thin-film type inorganic EL element which can be used as the light-emitting element. In FIGS. 108A to 108C, a light-emitting element includes a first electrode layer 120100, an electroluminescent layer 120102, and a second electrode layer 120103.

The light-emitting elements shown in FIGS. 108B and 108C each have a structure where an insulating film is provided between the electrode layer and the electroluminescent layer in the light-emitting element in FIG. 108A. The light-emitting element shown in FIG. 108B includes an insulating film 120104 between the first electrode layer 120100 and the electroluminescent layer 120102. The light-emitting element shown in FIG. 108C includes an insulating film 120105 between the first electrode layer 120100 and the electroluminescent layer 120102, and an insulating film 120106 between the second electrode layer 120103 and the electroluminescent layer 120102.

Note that the insulating film 120104 is provided so as to be in contact with the first electrode layer 120100 in FIG. 61B; however, the insulating film 120104 may be provided in contact with the second electrode layer 120103 by reversing the order of the insulating film and the electroluminescent layer.

In the case of a dispersion type inorganic EL, a film-shaped electroluminescent layer is formed by dispersing particulate light-emitting materials in a binder. When particles with a desired size cannot be sufficiently obtained by a method of forming the light-emitting material, the light-emitting materials may be processed into particles by being crushed in a mortar or the like. The binder is a substance for fixing the particulate light-emitting material in a dispersed state and maintaining the shape as the electroluminescent layer. The light-emitting material is uniformly dispersed in the electroluminescent layer and fixed by the binder.

In the case of a dispersion type inorganic EL, as a method of forming the electroluminescent layer, a droplet discharging method by which the electroluminescent layer can be selectively formed, a printing method (such as screen printing or offset printing), a coating method such as a spin coating method, a dipping method, a dispenser method, or the like can be used. The thickness of the electroluminescent layer is not particularly limited, but preferably in the range of 10 to 1000 nm. In the electroluminescent layer including the light-emitting material and the binder, a ratio of the light-emitting material is preferably equal to or more than 50 wt % and equal to or less than 80 wt %.

Figure 109A:
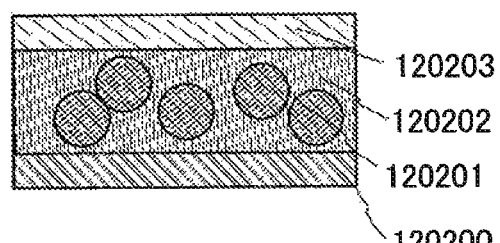
FIGS. 109A to 109C each illustrate the present invention.
Figure 109B:
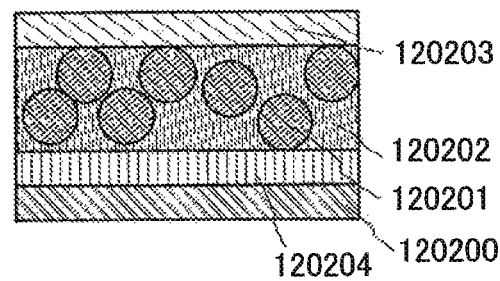
Figure 109C:
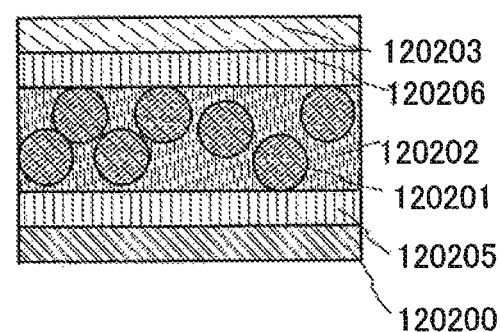

FIGS. 109A to 109C each show an example of a dispersion type inorganic EL element which can be used as the light-emitting element. A light-emitting element in FIG. 109A has a stacked-layer structure of a first electrode layer 120200, an electroluminescent layer 120202, and a second electrode layer 120203. The electroluminescent layer 120202 includes a light-emitting material 120201 held by a binder.

An insulating material can be used for the binder. As the insulating material, an organic material or an inorganic material can be used. Alternatively, a mixed material containing an organic material and an inorganic material may be used. As the organic insulating material, a polymer having a comparatively high dielectric constant, such as a cyanoethyl cellulose based resin, or a resin such as polyethylene, polypropylene, a polystyrene based resin, a silicone resin, an epoxy resin, or vinylidene fluoride can be used. Alternatively, a heat-resistant polymer such as aromatic polyamide or polybenzimidazole, or a siloxane resin may be used. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen may be used as a substituent. Further alternately, a resin material, for example, a vinyl resin such as polyvinyl alcohol or polyvinylbutyral, a phenol resin, a novolac resin, an acrylic resin, a melamine resin, an urethane resin, or an oxazole resin (polybenzoxazole) may be used. A dielectric constant can be adjusted by appropriately mixing these resins with fine particles having a high dielectric constant, such as barium titanate ($BaTiO_3$) or strontium titanate ($SrTiO_3$).

The inorganic insulating material included in the binder can be formed using silicon oxide ($SiO_x$), silicon nitride ($SiN_x$), silicon containing oxygen and nitrogen, aluminum nitride (MN), aluminum containing oxygen and nitrogen, aluminum oxide ($Al_2O_3$) containing oxygen and nitrogen, titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalite ($BaTa_2O_6$), lithium tantalite ($LiTaO_3$), yttrium oxide ($Y_2O_3$), zirconium oxide ($ZrO_2$), ZnS, or a substance containing another inorganic insulating material. When an inorganic material having a high dielectric constant is included in the organic material (by addition or the like), the dielectric constant of the electroluminescent layer formed of the light-emitting material and the binder can be more effectively controlled, and the dielectric constant can be further increased.

In a manufacturing step, the light-emitting material is dispersed in a solution containing the binder. As a solvent for the solution containing the binder, it is acceptable as long as a solvent dissolves a binder material and can make a solution having a viscosity suitable for a method of forming the electroluminescent layer (various wet processes) and for desired film thickness. For example, an organic solvent or the like can be used as the solvent. When a siloxane resin is used as the binder, propylene glycol monomethyl ether, propylene glycol monomethyl ether acetate (also referred to as PGMEA), 3-methoxy-3-methyl-1-butanol (also referred to as MMB), or the like can be used as the solvent.

The light-emitting elements shown in FIGS. 109B and 109C each have a structure where an insulating film is provided between the electrode layer and the electroluminescent layer in the light-emitting element in FIG. 109A. The light-emitting element shown in FIG. 109B includes an insulating film 120204 between the first electrode layer 120200 and the electroluminescent layer 120202. The light-emitting element shown in FIG. 109C includes an insulating film 120205 between the first electrode layer 120200 and the electroluminescent layer 120202, and an insulating film 120206 between the second electrode layer 120203 and the electroluminescent layer 120202. In such a manner, the insulating film may be provided between the electroluminescent layer and one of the electrode layers interposing the electroluminescent layer, or may be provided between the electroluminescent layer and each of the electrode layers interposing the electroluminescent layer. The insulating film may be a single layer or stacked layers including a plurality of layers.

Although the insulating film 120204 is provided in contact with the first electrode layer 120200 in FIG. 109B, the insulating film 120204 may be provided in contact with the second electrode layer 120203 by reversing the order of the insulating film and the electroluminescent layer.

A material used for an insulating film such as the insulating film 120104 in FIG. 108B and the insulating film 120204 in FIG. 109B preferably has high withstand voltage and dense film quality. Further, the material preferably has a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; or a mixed film of these materials or a stacked-layer film including two or more of those materials can be used. The insulating film can be formed by sputtering, evaporation, CVD, or the like. The insulating film may be formed by dispersing particles of the insulating material in a binder. A binder material may be formed using a material and a method similar to those of the binder contained in the electroluminescent layer. The thickness of the insulating film is not particularly limited, but preferably in the range of 10 to 1000 nm.

Note that the light-emitting element can emit light when voltage is applied between the pair of electrode layers interposing the electroluminescent layer. The light-emitting element can operate with DC drive or AC drive.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 16)

In this embodiment mode, an example of a display device is described. In particular, the case where optical treatment is performed is described.

Figure 110A:
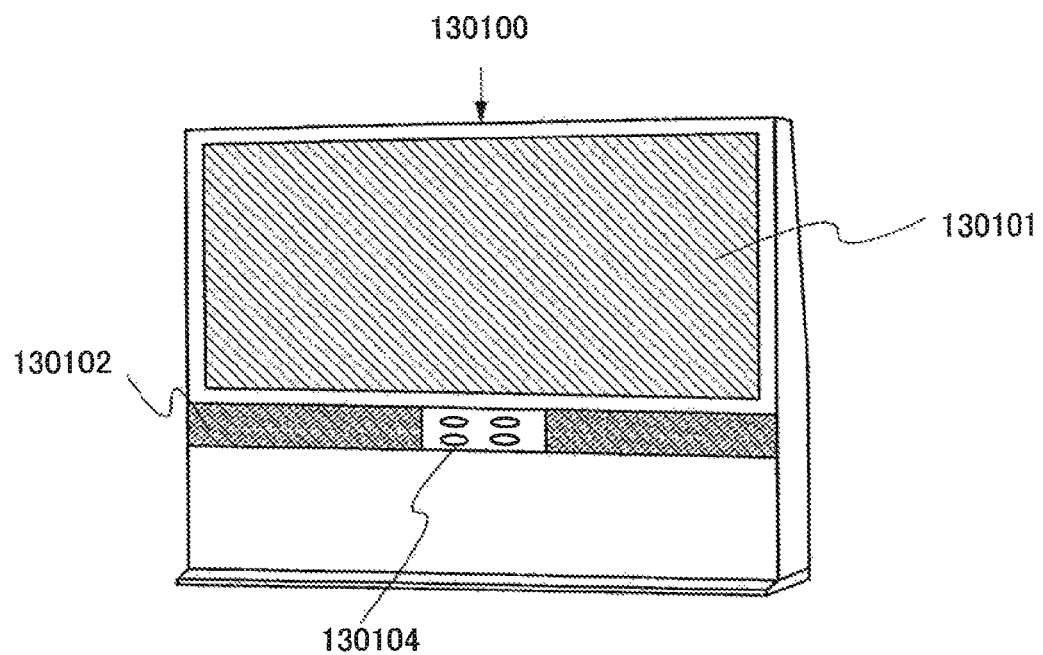
FIGS. 110A and 110B illustrate the present invention.
Figure 110B:
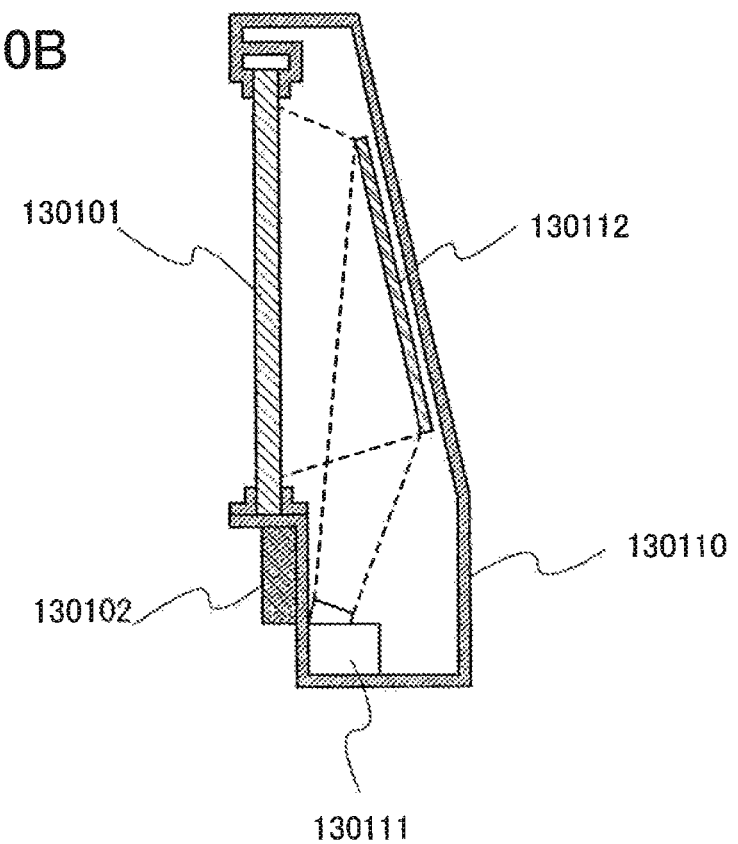

A rear projection display device 130100 in FIGS. 110A and 110B is provided with a projector unit 130111, a mirror 130112, and a screen panel 130101. The rear projection display device 130100 may also be provided with a speaker 130102 and operation switches 130104. The projector unit 130111 is provided at a lower portion of a housing 130110 of the rear projection display device 130100, and projects incident light which projects an image based on a video signal to the mirror 130112. The rear projection display device 130100 displays an image projected from a rear surface of the screen panel 130101.

Figure 111:
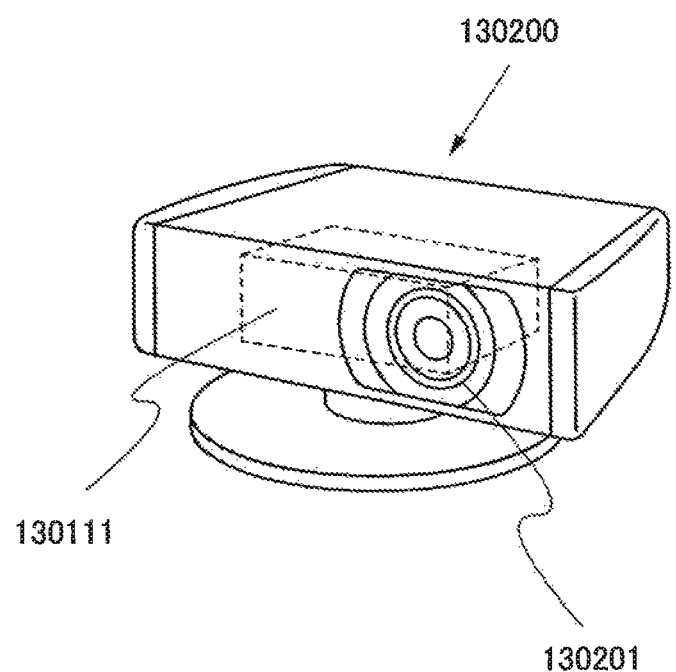
FIG. 111 illustrates the present invention.

FIG. 111 shows a front projection display device 130200. The front projection display device 130200 is provided with the projector unit 130111 and a projection optical system 130201. The projection optical system 130201 projects an image to a screen or the like provided at the front.

The structure of the projector unit 130111 which is applied to the rear projection display device 130100 in FIGS. 110A and 110B and the front projection display device 130200 in MG 111 is described below.

Figure 112:
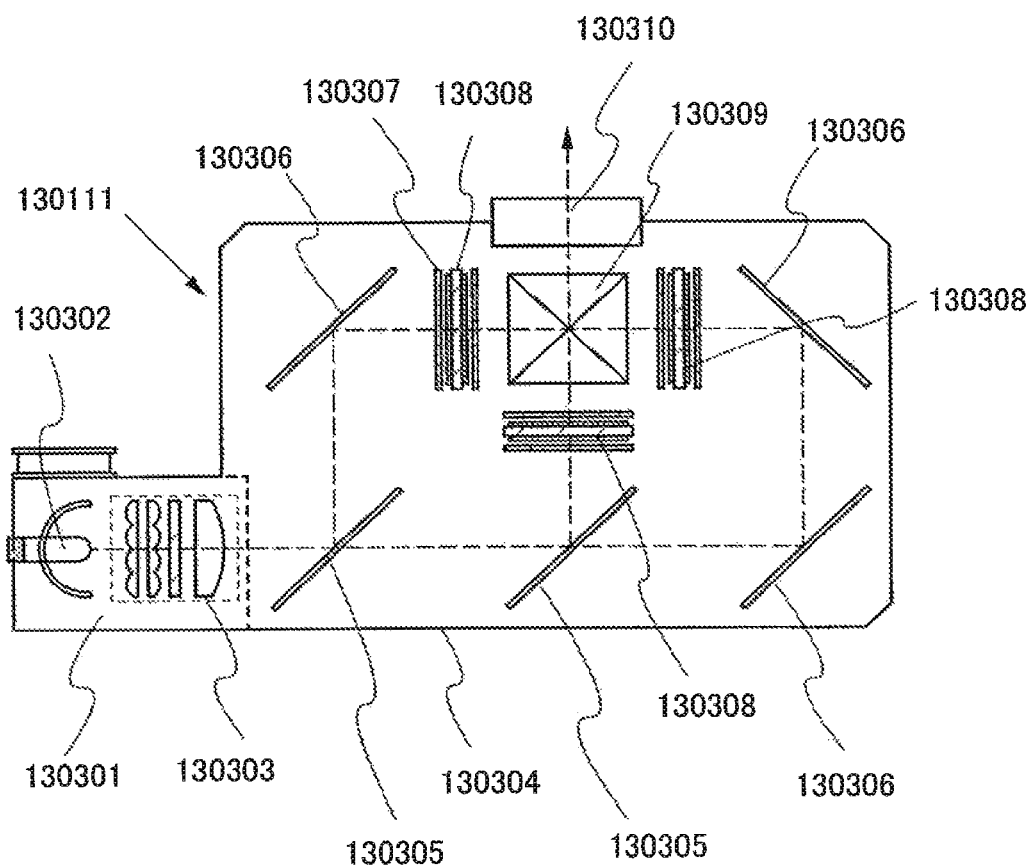
FIG. 112 illustrates the present invention.

FIG. 112 shows a structure example of the projector unit 130111. The projector unit 130111 is provided with a light source unit 130301 and a modulation unit 130304. The light source unit 130301 is provided with a light source optical system 130303 including lenses and a light source lamp 130302. The light source lamp 130302 is stored in a housing so that stray light is not scattered. As the light source lamp 130302, a high-pressure mercury lamp or a xenon lamp, for example, which can emit a large amount of light, is used. The light source optical system 130303 is provided with an optical lens, a film having a function of polarizing light, a film for adjusting phase difference, an IR film, or the like as appropriate. The light source unit 130301 is provided so that emitted light is incident on the modulation unit 130304. The modulation unit 130304 is provided with a plurality of display panels 130308, a color filter, a dichroic mirror 130305, a total reflection mirror 130306, a prism 130309, and a projection optical system 130310. Light emitted from the light source unit 130301 is split into a plurality of optical paths by the dichroic mirror 130305.

The display panel 130308 and a color filter which transmits light with a predetermined wavelength or wavelength range are provided in each optical path. The transmissive display panel 130308 modulates transmitted light based on a video signal. Light of each color transmitted through the display panel 130308 is incident on the prism 130309, and an image is displayed on a screen through the projection optical system 130310. Note that a Fresnel lens may be provided between the mirror and the screen. Then, projected light which is projected by the projector unit 130111 and reflected by the mirror is converted into generally parallel light by the Fresnel lens and projected on the screen.

Figure 113:
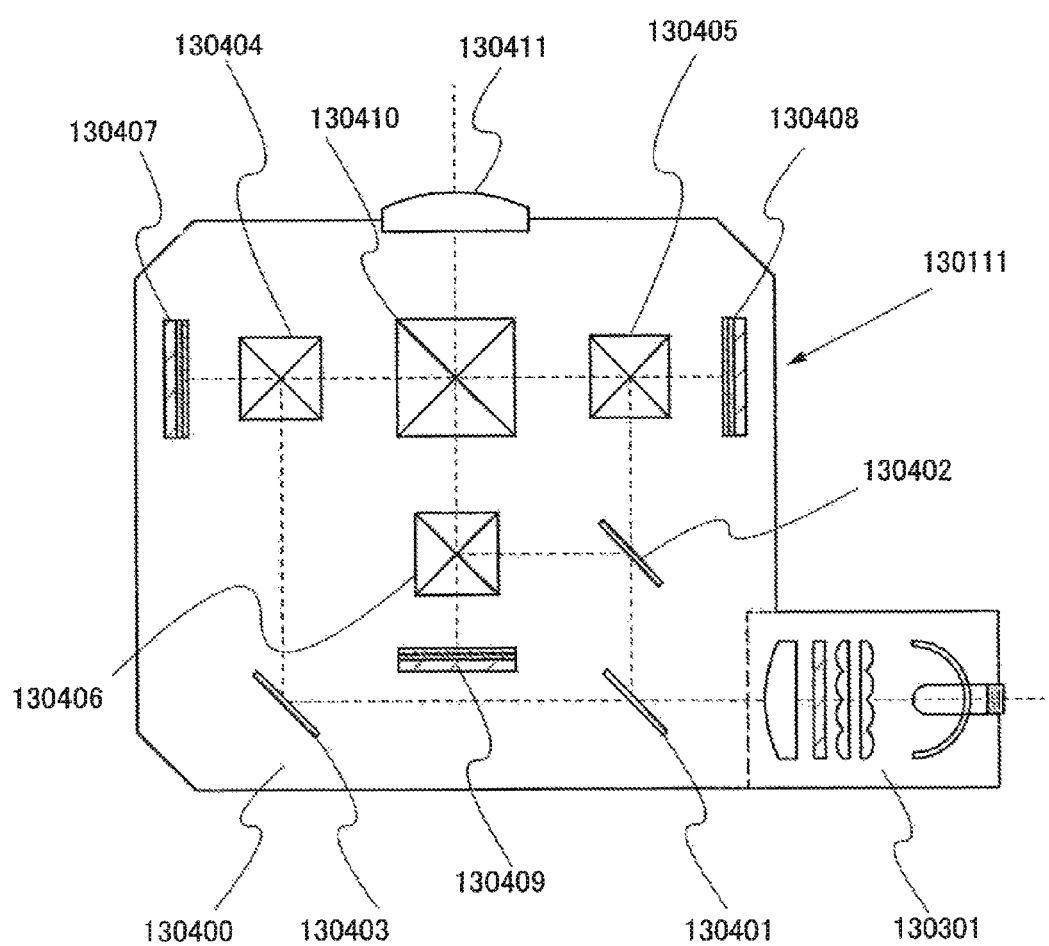
FIG. 113 illustrates the present invention.

FIG. 113 shows the projector unit 130111 provided with reflective display panels 130407, 130408, and 130409.

The projector unit 130111 shown in FIG. 113 includes the light source unit 130301 and a modulation unit 130400. The light source unit 130301 may have a structure similar to the structure of FIG. 112. Light from the light source unit 130301 is split into a plurality of optical paths by dichroic mirrors 130401 and 130402 and a total reflection mirror 130403 to be incident on polarization beam splitters 130404, 130405, and 130406. The polarization beam splitters 130404, 130405, and 130406 are provided corresponding to the reflective display panels 130407, 130408, and 130409 which correspond to respective colors. The reflective display panels 130407, 130408, and 130409 modulate reflected light based on a video signal. Light of respective colors which is reflected by the reflective display panels 130407, 130408, and 130409 is incident on the prism 130109 to be synthesized, and projected through a projection optical system 130411.

Among light emitted from the light source unit 130301, only light in a wavelength region of red is transmitted through the dichroic mirror 130401 and light in wavelength regions of green and blue is reflected by the dichroic mirror 130401. Further, only the light in the wavelength region of green is reflected by the dichroic mirror 130402. The light in the wavelength region of red, which is transmitted through the dichroic mirror 130401, is reflected by the total reflection mirror 130403 and incident on the polarization beam splitter 130404. The light in the wavelength region of blue is incident on the polarization beam splitter 130405. The light in the wavelength region of green is incident on the polarization beam splitter 130406. The polarization beam splitters 130404, 130405, and 130406 have a function of splitting incident light into p-polarized light and s-polarized light and a function of transmitting only p-polarized light. The reflective display panels 130407, 130408, and 130409 polarize incident light based on a video signal.

Only s-polarized light corresponding to respective colors is incident on the reflective display panels 130407, 130408, and 130409 corresponding to respective colors. Note that the reflective display panels 130407, 130408, and 130409 may be liquid crystal panels. In this case, the liquid crystal panel operates in an electrically controlled birefringence (ECB) mode. Liquid crystal molecules are vertically aligned with respect to a substrate at a certain angle. Accordingly, in the reflective display panels 130407, 130408, and 130409, when a pixel is in an off state, display molecules are aligned so as to reflect incident light without changing a polarization state of the incident light. When the pixel is in an on state, alignment of the display molecules is changed, and the polarization state of the incident light is changed.

The projector unit 130111 in FIG. 113 can be applied to the rear projection display device 130100 in FIGS. 110A and 110B and the front projection display device 130200 in FIG. 111.

Figure 114A:
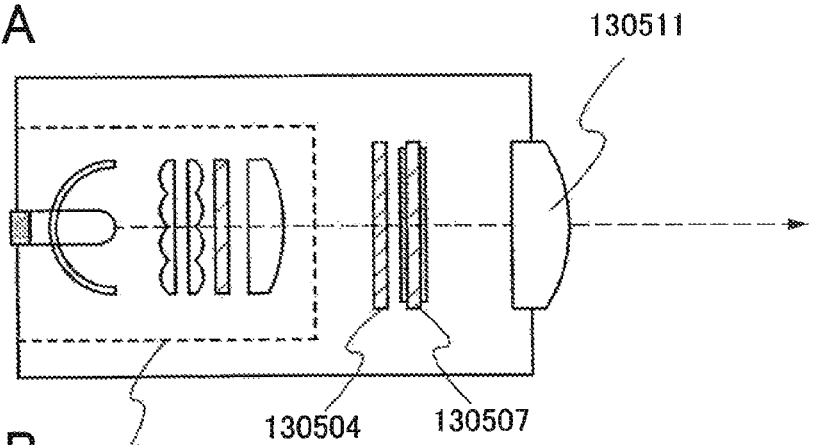
FIGS. 114A to 114C each illustrate the present invention.
Figure 114B:
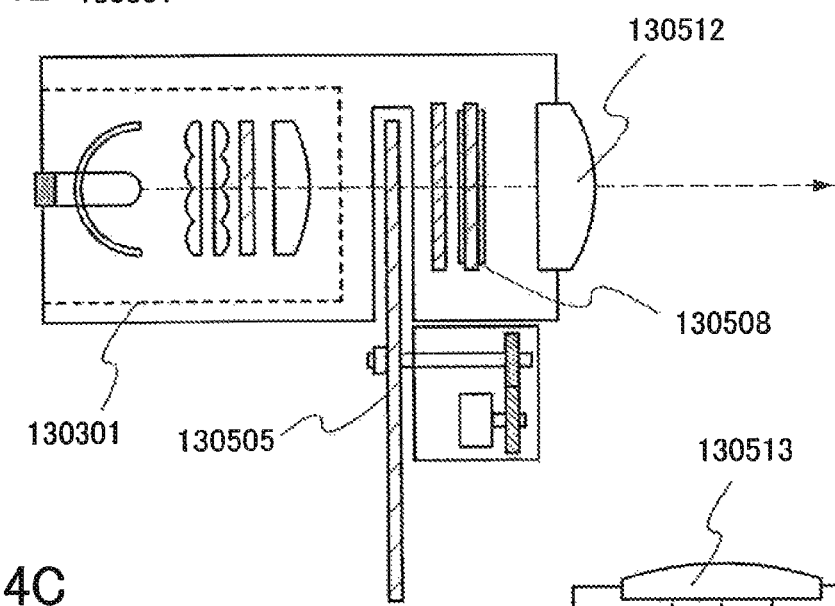
Figure 114C:
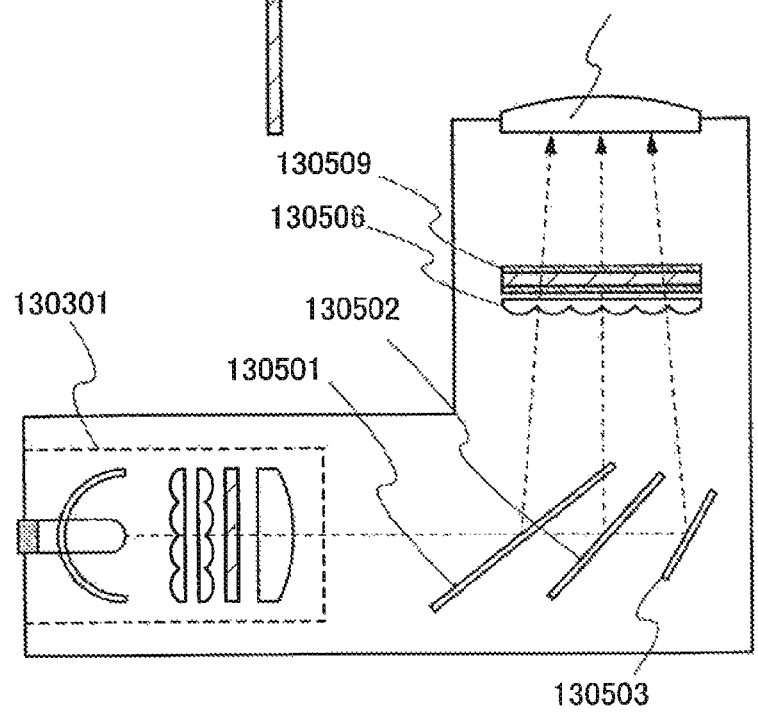

FIGS. 114A to 114C show single-panel type projector units. The projector unit 130111 shown in FIG. 114A includes the light source unit 130301, a display panel 130507, a projection optical system 130511, and a retardation plate 130504. The projection optical system 130511 includes one or a plurality of lenses. The display panel 130507 may include a color filter.

FIG. 114B shows a structure of the projector unit 130111 operating in a field sequential mode. A field sequential mode refers to a mode in which color display is performed by light of respective colors such as red, green, and blue sequentially incident on a display panel with a time lag, without a color filter. High-definition image can be displayed particularly by combination with a display panel with high-speed response to change in input signal. In FIG. 114B, a rotating color filter plate 130505 including a plurality of color filters with red, green, blue, or the like is provided between the light source unit 130301 and a display panel 130508.

FIG. 114C shows a structure of the projector unit 130111 with a color separation method using a micro lens, as a color display method. This method refers to a method in which color display is realized by providing a micro lens array 130506 on a light incident side of a display panel 130509 and emitting light of each color from each direction. The projector unit 130111 employing this method has little loss of light due to a color filter, so that light from the light source unit 130301 can be efficiently utilized. The projector unit 130111 shown in FIG. 114C includes dichroic mirrors 130501, 130502, and 130503 so that light of each color is lit to the display panel 130509 from each direction.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

(Embodiment Mode 17)

In this embodiment mode, examples of electronic devices are described.

Figure 115:
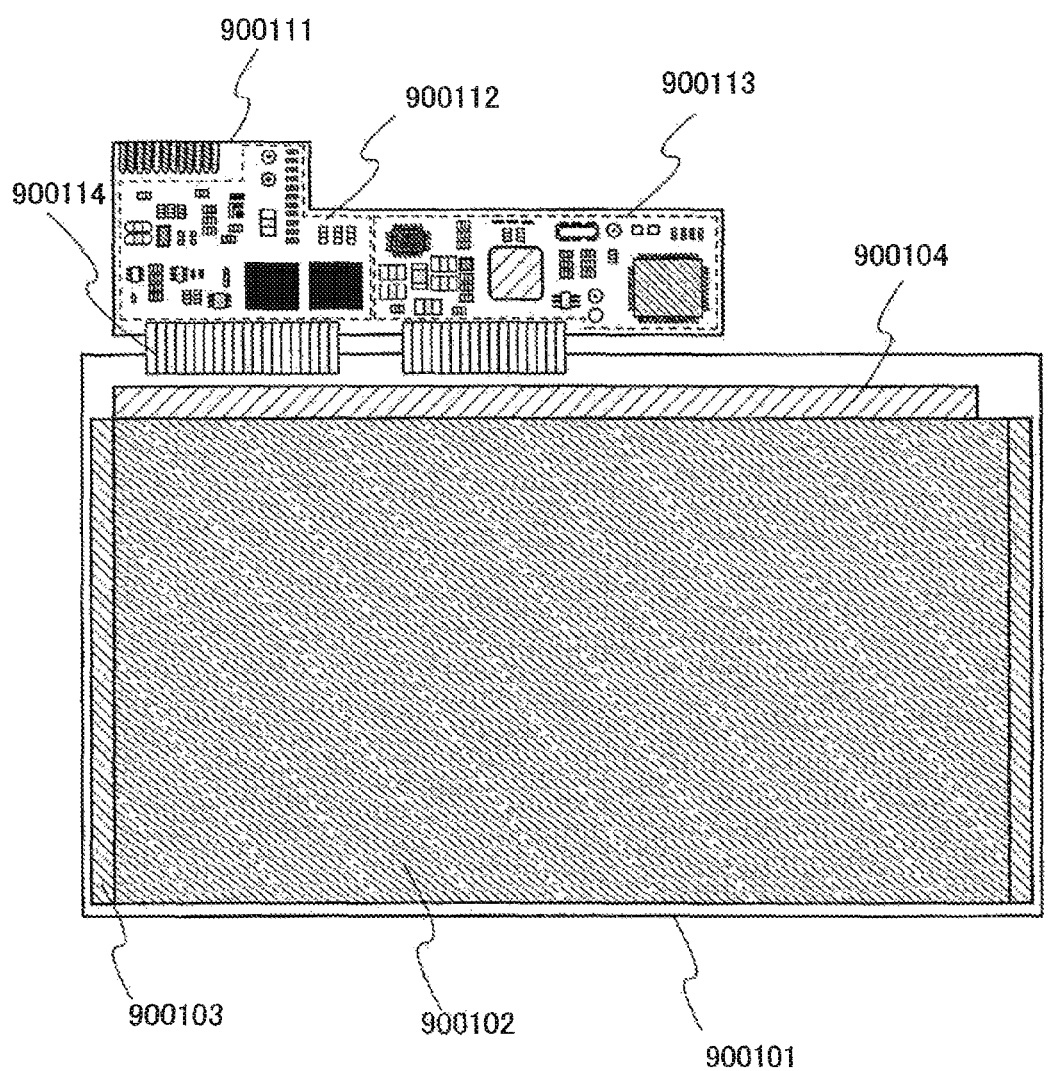
FIG. 115 illustrates the present invention.

FIG. 115 shows a display panel module in which a display panel 900101 and a circuit board 900111 are combined. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected by a connection wiring 900114. As the connection wiring 900114, an FPC or the like can be used.

In the display panel 900101, the pixel portion 900102 and part of peripheral driver circuits (a driver circuit having low operation frequency among a plurality of driver circuits) may be formed over the same substrate by using transistors, and another part of the peripheral driver circuits (a driver circuit having high operation frequency among the plurality of driver circuits) may be formed over an IC chip. The IC chip may be mounted on the display panel 900101 by COG (chip on glass) or the like. Thus, the area of the circuit board 900111 can be reduced, so that a small display device can be obtained. Alternatively, the IC chip may be mounted on the display panel 900101 by using TAB (tape automated bonding) or a printed circuit board. Thus, the area of the circuit board 900111 can be reduced, so that a display device with a narrower frame can be obtained.

For example, in order to reduce power consumption, a pixel portion may be formed over a glass substrate by using transistors, and all peripheral circuits may be formed over an IC chip. The IC chip may be mounted on a display panel by COG or TAB.

Figure 116:
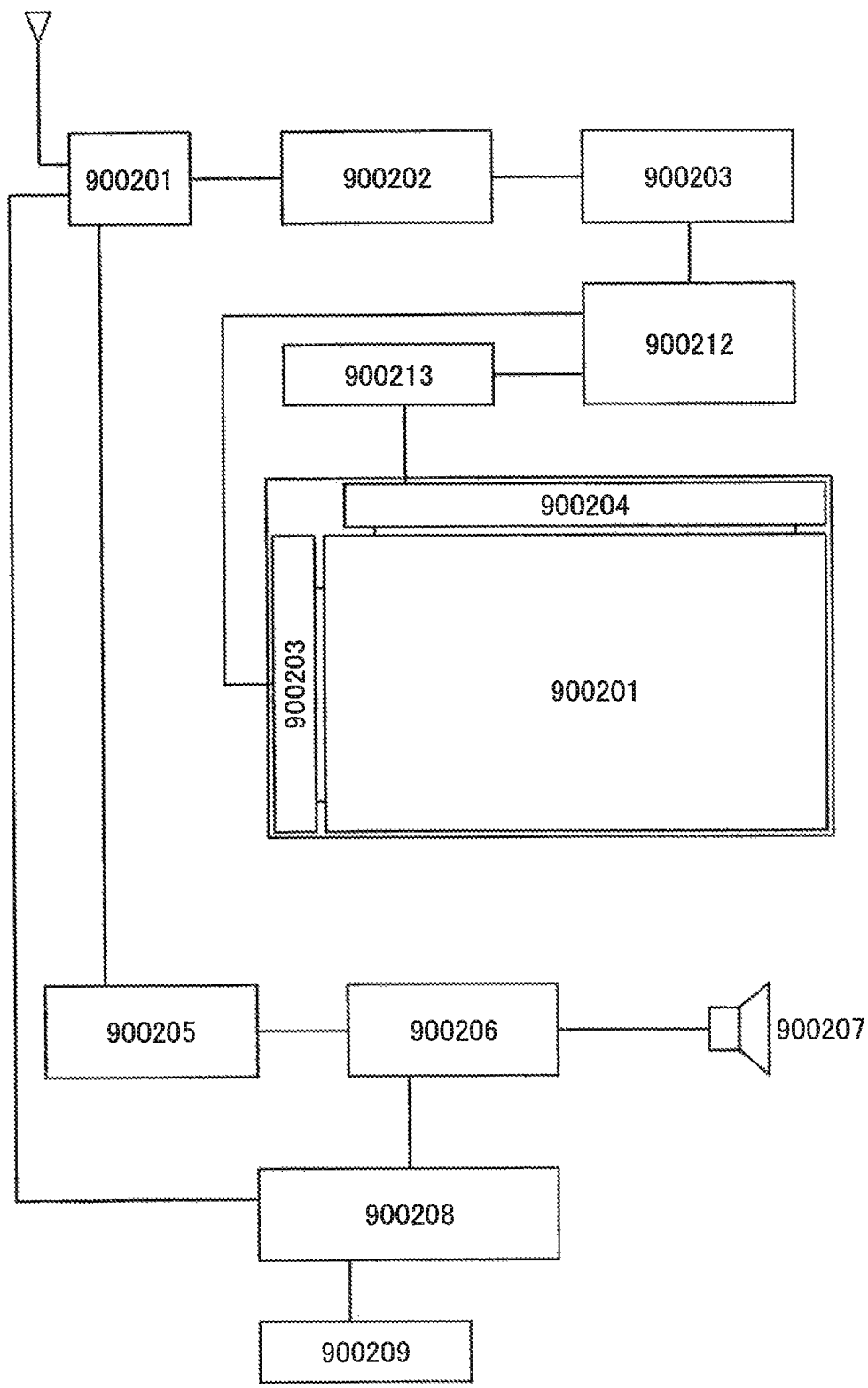
FIG. 116 illustrates the present invention.

A television receiver can be completed with the display panel module shown in FIG. 115. FIG. 116 is a block diagram showing a main structure of a television receiver. A tuner 900201 receives a video signal and an audio signal. The video signal is processed by a video signal amplifier circuit 900202, a video signal processing circuit 900203 for converting a signal output from the video signal amplifier circuit 900202 into a color signal corresponding to each color of red, green, and blue, and a control circuit 900212 for converting the video signal into a signal which meets input specifications of a driver circuit. The control circuit 900212 outputs signals to a scan line side and a signal line side. In the case of digital driving, a structure may be used in which a signal dividing circuit 900213 is provided on the signal line side and an input digital signal is divided into m (m is a positive integer) pieces to be supplied.

Among the signals received by the tuner 900201, the audio signal is transmitted to an audio signal amplifier circuit 900205, and output thereof is supplied to a speaker 900207 through an audio signal processing circuit 900206. A control circuit 900208 receives control information on a receiving station (reception frequency) and sound volume from an input portion 900209, and transmits a signal to the tuner 900201 or the audio signal processing circuit 900206.

Figure 117A:
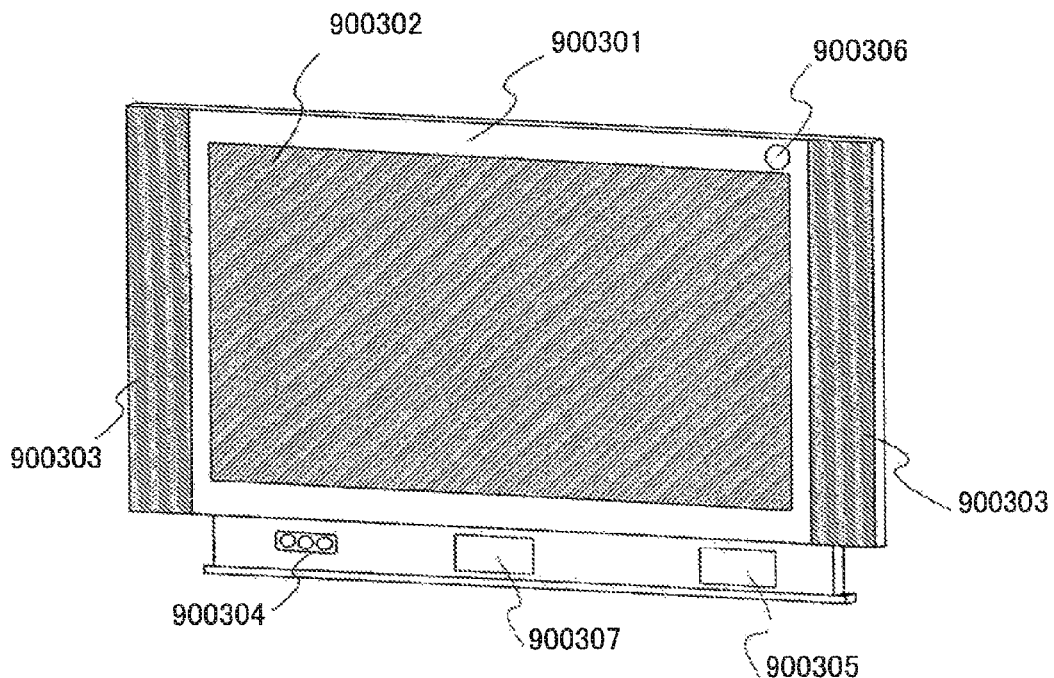
FIGS. 117A and 117B each illustrate the present invention.

FIG. 117A shows a television receiver incorporated with a display panel module which is different from that of FIG. 116. In FIG. 117A, a display screen 900302 stored in a housing 900301 is formed using the display panel module. Note that speakers 900303, operation switches 900304, an input means 900305, a sensor 900306 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900307, or the like may be provided as appropriate.

Figure 117B:
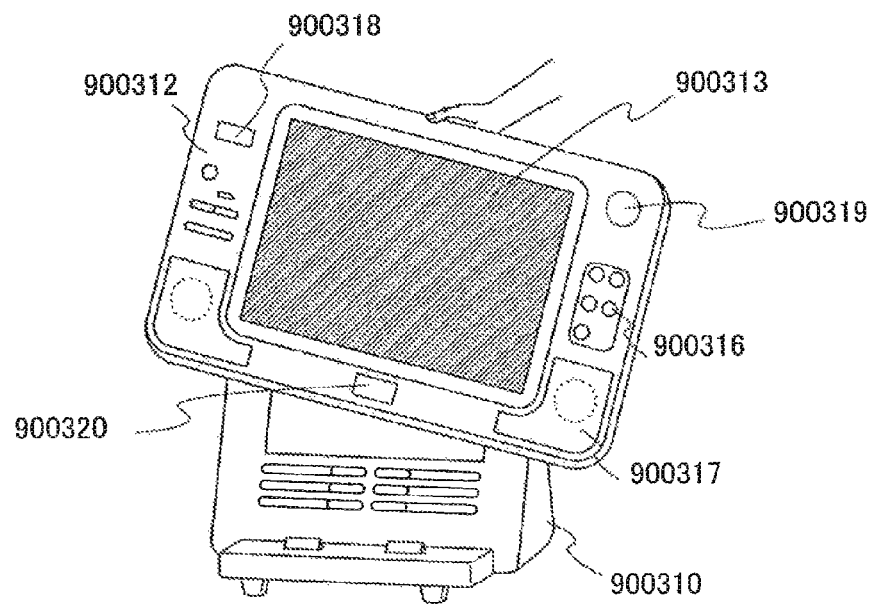

FIG. 117B shows a television receiver, only a display of which can be carried wirelessly. A battery and a signal receiver are incorporated in a housing 900312. The battery drives a display portion 900313, speaker portions 900317, a sensor 900319 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 900320. Electricity can be repeatedly stored in the battery by a charger 900310. The charger 900310 can transmit and receive a video signal and can transmit the video signal to the signal receiver of the display. The device shown in FIG. 117B is controlled by operation keys 900316. Alternatively, the device shown in FIG. 117B can transmit a signal to the charger 900310 by operating the operation keys 900316. That is, the device may be an image audio two-way communication device. Further alternatively, the device shown in FIG. 117B can transmit a signal to the charger 900310 by operating the operation keys 900316, and can control communication of another electronic device when the electronic device is made to receive a signal which can be transmitted from the charger 900310. That is, the device may be a general-purpose remote control device. Note that an input means 900318 or the like may be provided as appropriate. Note that the contents (or may be part of the contents) described in each drawing of this embodiment mode can be applied to the display portion 900313.

Figure 118A:
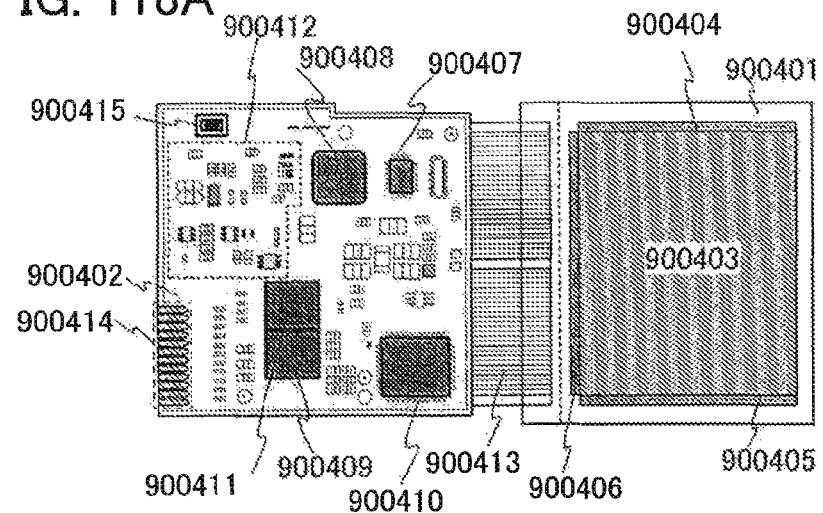
FIGS. 118A and 118B each illustrate the present invention.

FIG. 118A shows a module in which a display panel 900401 and a printed wiring board 900402 are combined. The display panel 900401 may be provided with a pixel portion 900403 including a plurality of pixels, a first scan line driver circuit 900404, a second scan line driver circuit 900405, and a signal line driver circuit 900406 which supplies a video signal to a selected pixel.

The printed wiring board 900402 is provided with a controller 900407, a central processing unit (CPU) 900408, a memory 900409, a power supply circuit 900410, an audio processing circuit 900411, a transmitting/receiving circuit 900412, and the like. The printed wiring board 900402 and the display panel 900401 are connected by a flexible printed circuit (FPC) 900413. The flexible printed circuit (FPC) 900413 may be provided with a storage capacitor, a buffer circuit, or the like so as to prevent noise on power supply voltage or a signal, and increase in rise time of a signal. Note that the controller 900407, the audio processing circuit 900411, the memory 900409, the central processing unit (CPU) 900408, the power supply circuit 900410, and the like can be mounted on the display panel 900401 by using a COG (chip on glass) method. When a COG method is used, the size of the printed wiring board 900402 can be reduced.

Various control signals are input and output through an interface (I/F) portion 900414 provided for the printed wiring board 900402. In addition, an antenna port 900415 for transmitting and receiving a signal to/from an antenna is provided for the printed wiring board 900402.

Figure 118B:
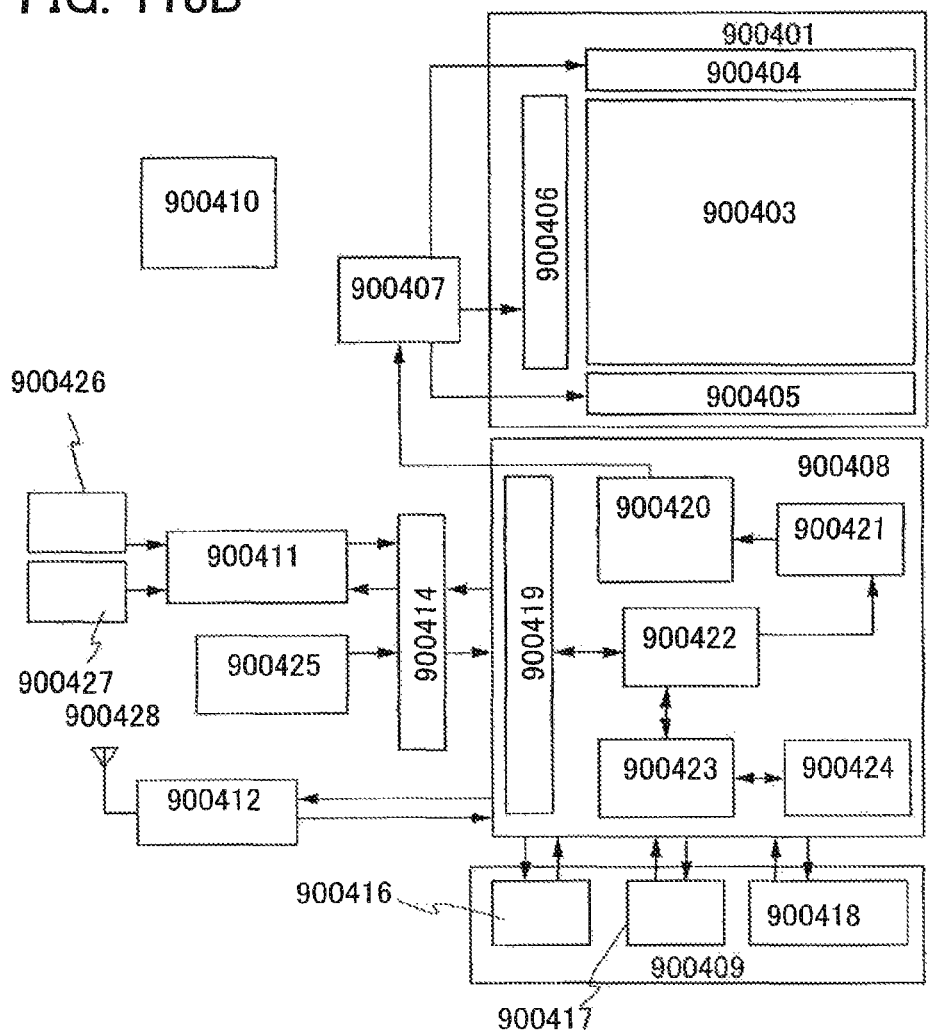

FIG. 118B is a block diagram of the module shown in FIG. 118A. The module includes a VRAM 900416, a DRAM 900417, a flash memory 900418, and the like as the memory 900409. The VRAM 900416 stores data on an image displayed on the panel. The DRAM 900417 stores video data or audio data. The flash memory 900418 stores various programs.

The power supply circuit 900410 supplies electric power for operating the display panel 900401, the controller 900407, the central processing unit (CPU) 900408, the audio processing circuit 900411, the memory 900409, and the transmitting/receiving circuit 900412. Note that depending on panel specifications, the power supply circuit 900410 is provided with a current source in some cases.

The central processing unit (CPU) 900408 includes a control signal generation circuit 900420, a decoder 900421, a register 900422, an arithmetic circuit 900423, a RAM 900424, an interface (I/F) portion 900419 for the central processing unit (CPU) 900408, and the like. Various signals which are input to the central processing unit (CPU) 900408 through the interface (I/F) portion 900414 are once stored in the register 900422, and then input to the arithmetic circuit 900423, the decoder 900421, and the like. The arithmetic circuit 900423 performs operation based on the input signal so as to designate a location to which various instructions are sent. On the other hand, the signal input to the decoder 900421 is decoded and input to the control signal generation circuit 900420. The control signal generation circuit 900420 generates a signal including various instructions based on the input signal, and transmits the signal to locations designated by the arithmetic circuit 900423, specifically the memory 900409, the transmitting/receiving circuit 900412, the audio processing circuit 900411, the controller 900407, and the like.

The memory 900409, the transmitting/receiving circuit 900412, the audio processing circuit 900411, and the controller 900407 operate in accordance with respective instructions. Operations thereof are briefly described below.

A signal input from an input means 900425 is transmitted to the central processing unit (CPU) 900408 mounted on the printed wiring board 900402 through the interface (I/F) portion 900414. The control signal generation circuit 900420 converts image data stored in the VRAM 900416 into a predetermined format based on the signal transmitted from the input means 900425 such as a pointing device or a keyboard, and transmits the converted data to the controller 900407.

The controller 900407 performs data processing of the signal including the image data transmitted from the central processing unit (CPU) 900408 in accordance with the panel specifications, and supplies the signal to the display panel 900401. The controller 900407 generates an Hsync signal, a $V^{sync}$ signal, a clock signal (CLK), alternating voltage (AC Cont), and a switching signal L/R based on power supply voltage input from the power supply circuit 900410 or various signals input from the central processing unit (CPU) 900408, and supplies the signals to the display panel 900401.

The trans ting/receiving circuit 900412 processes a signal which is transmitted and received as a radio wave by an antenna 900428. Specifically, the transmitting/receiving circuit 900412 may include a high-frequency circuit such as an isolator, a band pass filter, a VCO (voltage controlled oscillator), an LPF (low pass filter), a coupler, or a balun. Among signals transmitted and received by the transmitting/receiving circuit 900412, a signal including audio information is transmitted to the audio processing circuit 900411 in accordance with an instruction from the central processing unit (CPU) 900408.

The signal including the audio information, which is transmitted in accordance with the instruction from the central processing unit (CPU) 900408, is demodulated into an audio signal by the audio processing circuit 900411 and is transmitted to a speaker 900427. An audio signal transmitted from a microphone 900426 is modulated by the audio processing circuit 900411 and is transmitted to the transmitting/receiving circuit 900412 in accordance with an instruction from the central processing unit (CPU) 900408.

The controller 900407, the central processing unit (CPU) 900408, the power supply circuit 900410, the audio processing circuit 900411, and the memory 900409 can be mounted as a package of this embodiment mode.

Needless to say, the present invention is not limited to the television receiver, and can be applied to various uses particularly as a large display medium such as an information display board at a train station, an airport, or the like, or an advertisement display board on the street, as well as a monitor of a personal computer.

Next, a structural example of a mobile phone is described with reference to FIG. 119.

A display panel 900501 is incorporated in a housing 900530 so as to be detachable. The shape and the size of the housing 900530 can be changed as appropriate in accordance with the size of the display panel 900501. The housing 900530 to which the display panel 900501 is fixed is fitted into a printed circuit board 900531 and is assembled as a module.

The display panel 900501 is connected to the printed wiring board 900531 through an FPC 900513. The printed wiring board 900531 is provided with a speaker 900532, a microphone 900533, a transmitting/receiving circuit 900534, a signal processing circuit 900535 including a CPU, a controller, and the like, and a sensor 900541 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray). Such a module, an input means 900536, and a battery 900537 are combined and stored in a housing 900539. A pixel portion of the display panel 900501 is provided so as to be seen from an opening window formed in the housing 900539.

In the display panel 900501, the pixel portion and part of peripheral driver circuits (a driver circuit having low operation frequency among a plurality of driver circuits) may be formed over the same substrate by using transistors, and another part of the peripheral driver circuits (a driver circuit having high operation frequency among the plurality of driver circuits) may be formed over an IC chip. The IC chip may be mounted on the display panel 900501 by COG (chip on glass). Alternatively, the IC chip may be connected to a glass substrate by using TAB (tape automated bonding) or a printed circuit board. With such a structure, power consumption of the mobile phone can be reduced, so that operation time of the mobile phone per charge can be extended. In addition, cost of the mobile phone can be reduced.

Figure 119:
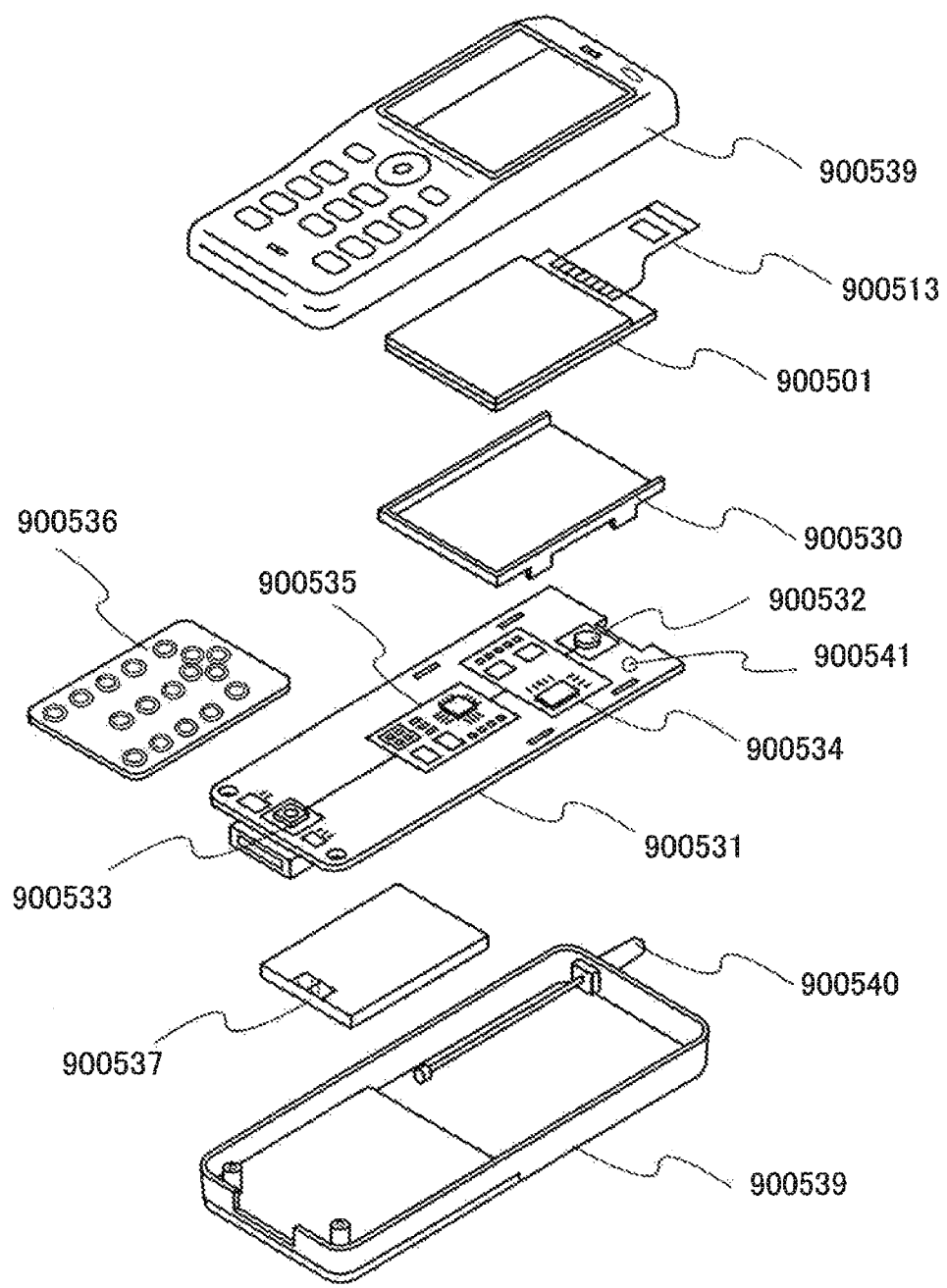
FIG. 119 illustrates the present invention.

The mobile phone shown in FIG. 119 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 119 are not limited to them, and the mobile phone can have various functions.

Figure 120:
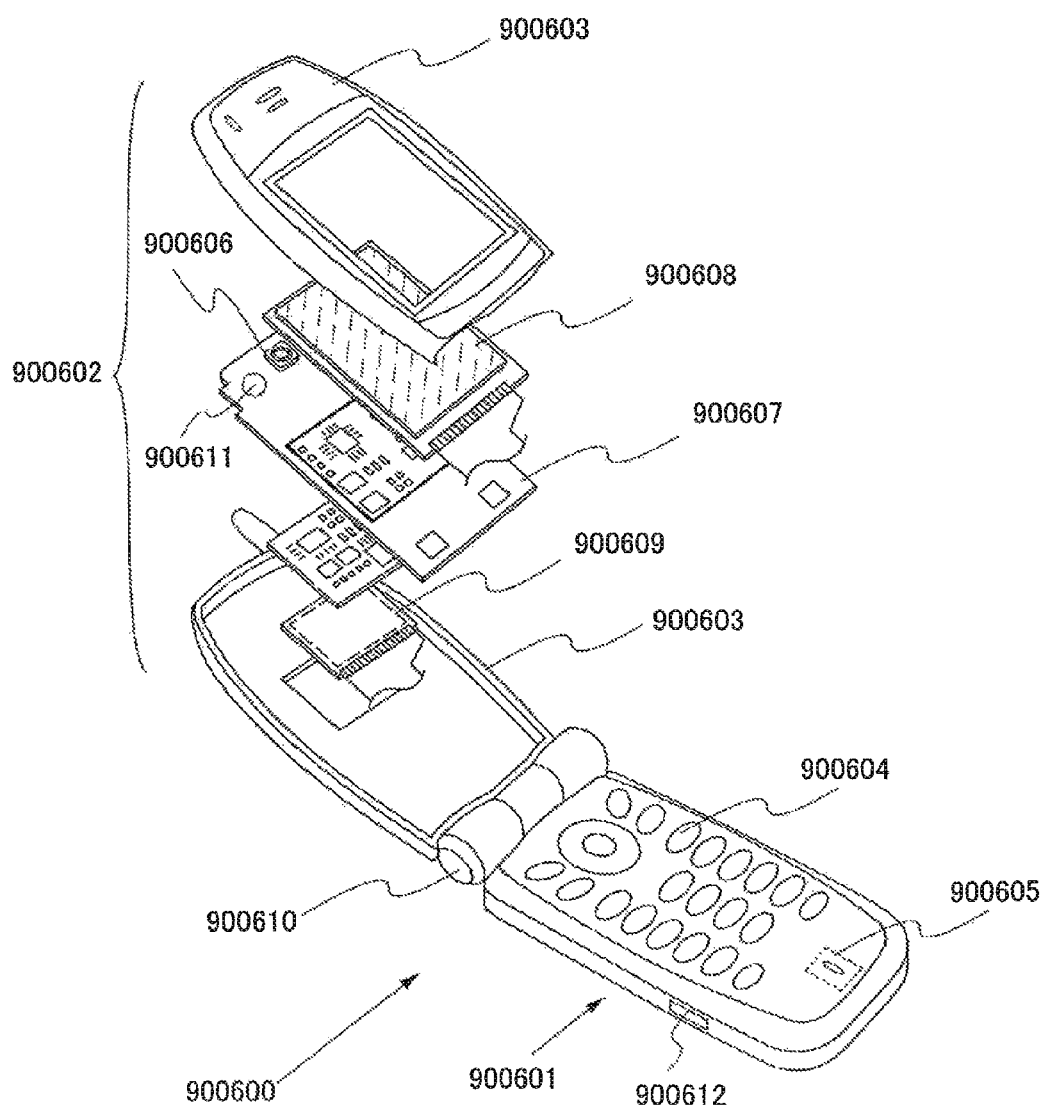
FIG. 120 illustrates the present invention.

In a mobile phone shown in FIG. 120, a main body (A) 900601 which is provided with operation switches 900604, a microphone 900605, and the like is connected to a main body (B) 900602 which is provided with a display panel (A) 900608, a display panel (B) 900609, a speaker 900606, a sensor 900611 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), an input means 900612, and the like by using a hinge 900610 so that the mobile phone can be opened and closed. The display panel (A) 900608 and the display panel (B) 900609 are stored in a housing 900603 of the main body (B) 900602 together with a circuit board 900607. Each of pixel portions of the display panel (A) 900608 and the display panel (B) 900609 is provided so as to be seen from an opening window formed in the housing 900603.

Specifications of the display panel (A) 900608 and the display panel (B) 900609, such as the number of pixels, can be set as appropriate in accordance with functions of a mobile phone 900600. For example, the display panel (A) 900608 can be used as a main screen and the display panel (B) 900609 can be used as a sub-screen.

Each of the mobile phones of this embodiment mode can be changed in various modes depending on functions or applications thereof. For example, it may be a camera-equipped mobile phone by incorporating an imaging element in a portion of the hinge 900610. When the operation switches 900604, the display panel (A) 900608, and the display panel (B) 900609 are stored in one housing, the above-described advantageous effects can be obtained. Further, similar advantageous effects can be obtained when the structure of this embodiment mode is applied to an information display terminal provided with a plurality of display portions.

The mobile phone shown in FIG. 120 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 120 are not limited to them, and the mobile phone can have various functions.

The contents (or may be part of the contents) described in each drawing of this embodiment mode can be applied to various electronic devices. Specifically, the contents (or may be part of the contents) described in each drawing of this embodiment mode can be applied to display portions of electronic devices. Examples of such electronic devices are a video camera, a digital camera, a goggle-type display, a navigation system, an audio reproducing device (e.g., a car audio component or an audio component), a computer, a game machine, a portable information terminal (e.g., a mobile computer, a mobile phone, a mobile game machine, or an electronic book), an image reproducing device provided with a recording medium (specifically, a device which reproduces a recording medium such as a digital versatile disc (DVD) and has a display for displaying a reproduced image), and the like.

Figure 121A:
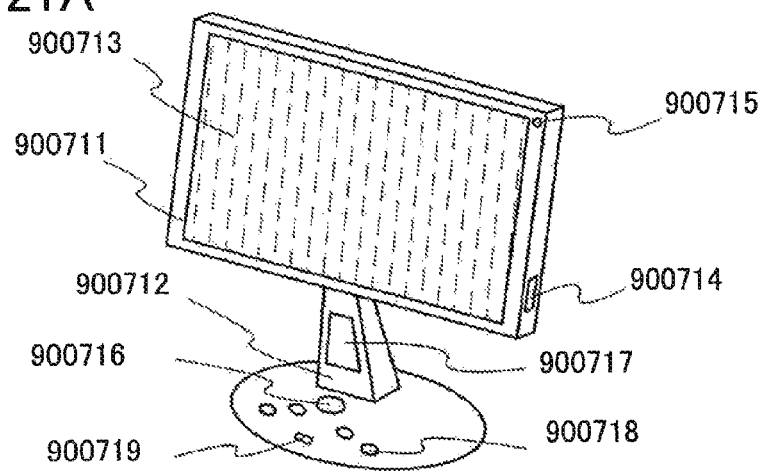
FIGS. 121A to 121C each illustrate the present invention.

FIG. 121A shows a display, which includes a housing 900711, a support base 900712, a display portion 900713, an input means 900714, a sensor 900715 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900716, a speaker 900717, operation keys 900718, an LED lamp 900719, and the like. The display shown in FIG. 121A has a function of displaying a variety of information (e.g., a still image, a moving image, and a text image) on the display portion. Note that the display shown in FIG. 121A is not limited to having this function, and can have various functions.

Figure 121B:
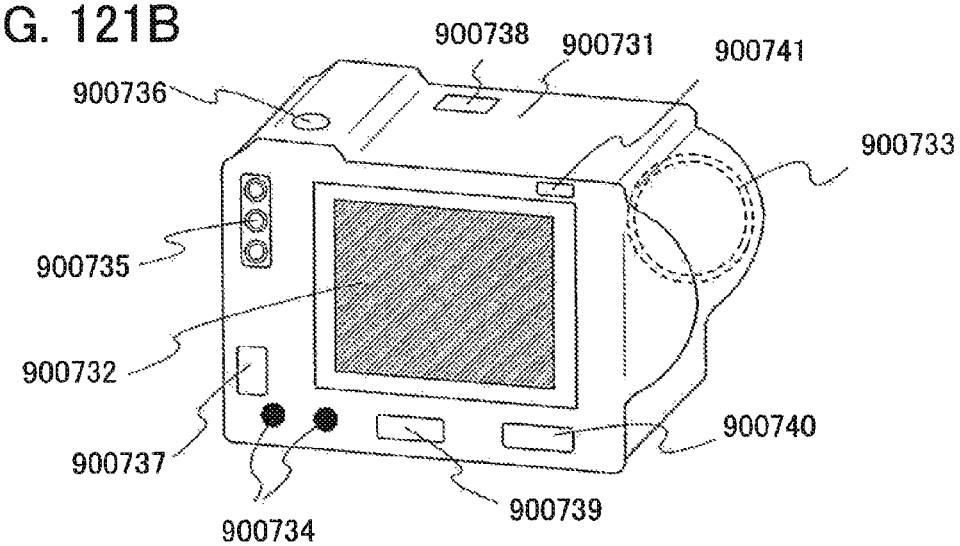

FIG. 121B shows a camera, which includes a main body 900731, a display portion 900732, an image receiving portion 900733, operation keys 900734, an external connection port 900735, a shutter button 900736, an input means 900737, a sensor 900738 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900739, a speaker 900740, an LED lamp 900741, and the like. The camera shown in FIG. 121B has a function of photographing a still image and a moving image; a function of automatically correcting the photographed image (the still image or the moving image); a function of storing the photographed image in a recording medium (provided outside or incorporated in the camera); and a function of displaying the photographed image on the display portion. Note that the camera shown in FIG. 121B is not limited to having these functions, and can have various functions.

Figure 121C:
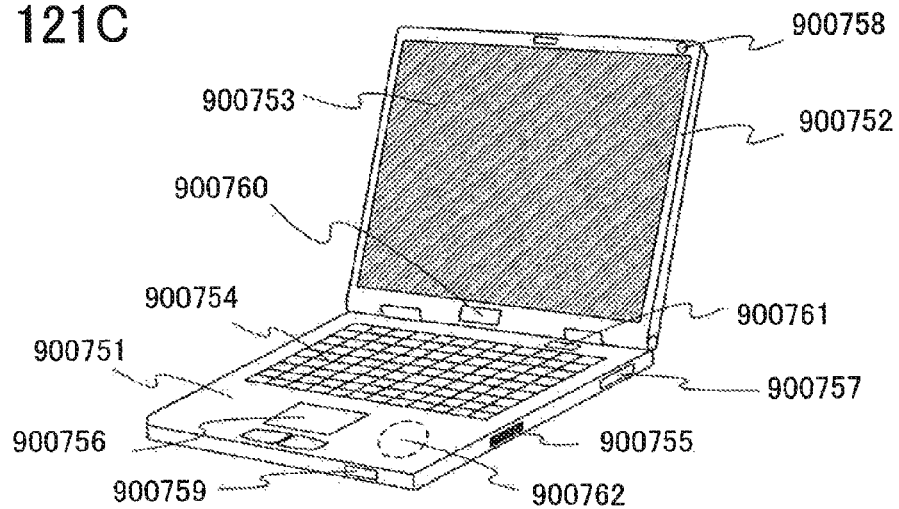

FIG. 121C shows a computer, which includes a main body 900751, a housing 900752, a display portion 900753, a keyboard 900754, an external connection port 900755, a pointing device 900756, an input means 900757, a sensor 900758 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900759, a speaker 900760, an LED lamp 900761, a reader/writer 900762, and the like. The computer shown in FIG. 121C has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; and a function of transmitting or receiving a variety of data by using the communication function. Note that the computer shown in FIG. 121C is not limited to having these functions, and can have various functions.

Figure 128A:
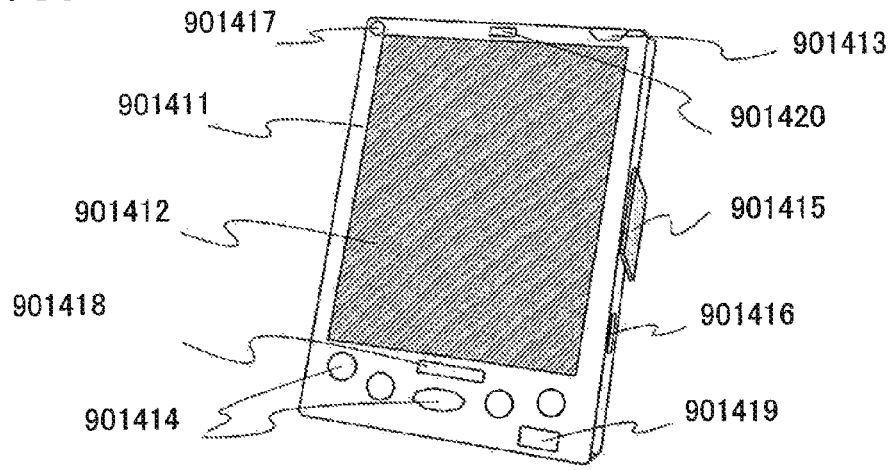
FIGS. 128A to 128C each illustrate the present invention.

FIG. 128A shows a mobile computer, which includes a main body 901411, a display portion 901412, a switch 901413, operation keys, 901414, an infrared port 901415, an input means 901416, a sensor 901417 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901418, a speaker 901419, an LED lamp 901420, and the like. The mobile computer shown in FIG. 128A has a function of displaying a variety of information (e.g., a still image, a moving image, and a text image) on the display portion; a touch panel function on the display portion; a function of displaying a calendar, a date, the time, and the like on the display portion; a function of controlling processing by a variety of software (programs); a wireless communication function; a function of connecting to various computer networks by using the wireless communication function; and a function of transmitting or receiving a variety of data by using the wireless communication function. Note that the mobile computer shown in FIG. 128A is not limited to having these functions, and can have various functions.

Figure 128B:
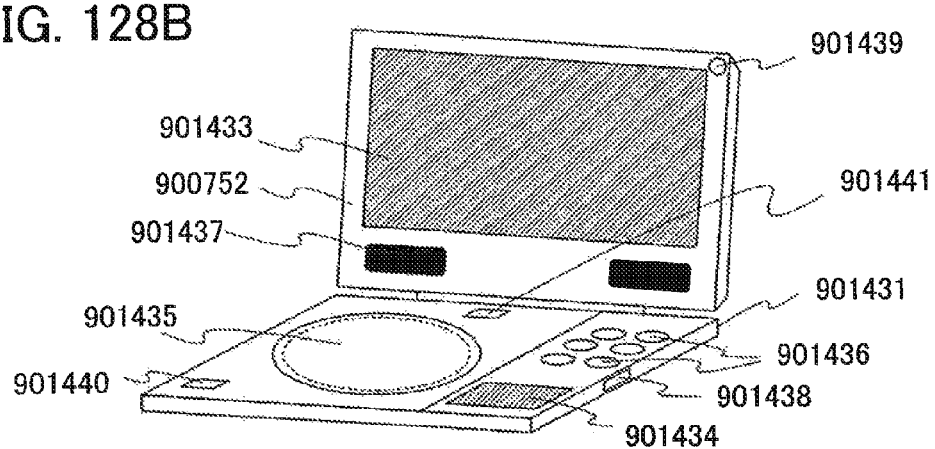

FIG. 128B shows a portable image reproducing device provided with a recording medium (e.g., a DVD reproducing device), which includes a main body 901431, a housing 901432, a display portion A 901433, a display portion B 901434, a recording medium (e.g., DVD) reading portion 901435, operation keys 901436, a speaker portion 901437, an input means 901438, a sensor 901439 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901440, an LED lamp 901441, and the like. The display portion A 901433 can mainly display image information, and the display portion B 901434 can mainly display text information.

Figure 128C:
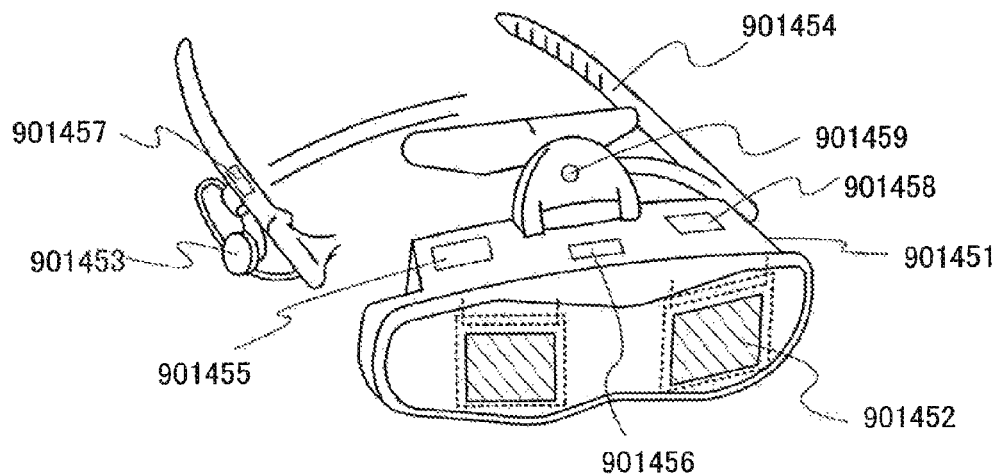

FIG. 128C shows a goggle-type display, which includes a main body 901451, a display portion 901452, an earphone 901453, a support portion 901454, an input means 901455, a sensor 901456 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901457, a speaker 901458, and the like. The goggle-type display shown in FIG. 128C has a function of displaying an image (e.g., a still image, a moving image, or a text image) which is externally obtained on the display portion. Note that the goggle-type display shown in FIG. 128C is not limited to having these functions, and can have various functions.

Figure 129A:
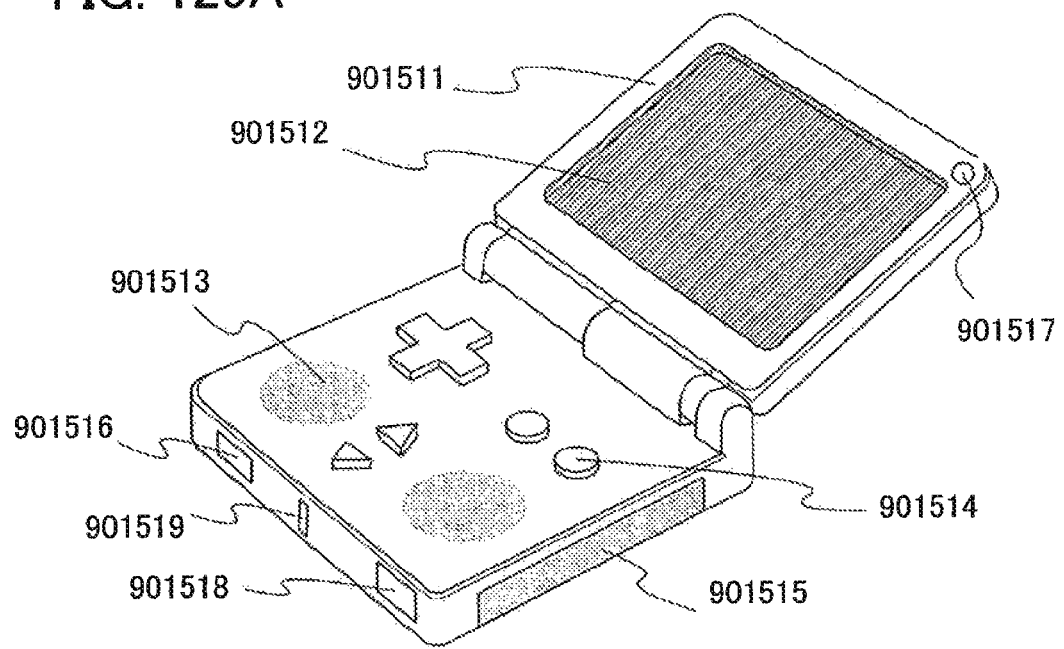
FIGS. 129A and 129B each illustrate the present invention.

FIG. 129A shows a portable game machine, which includes a housing 901511, a display portion 901512, speaker portions 901513, operation keys 901514, a recording medium insert portion 901515, an input means 901516, a sensor 901517 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901518, an LED lamp 901519, and the like. The portable game machine shown in FIG. 129A has a function of reading a program or data stored in the recording medium to display on the display portion, and a function of sharing information with another portable game machine by wireless communication. Note that the portable game machine shown in FIG. 129A is not limited to having these functions, and can have various functions.

Figure 129B:
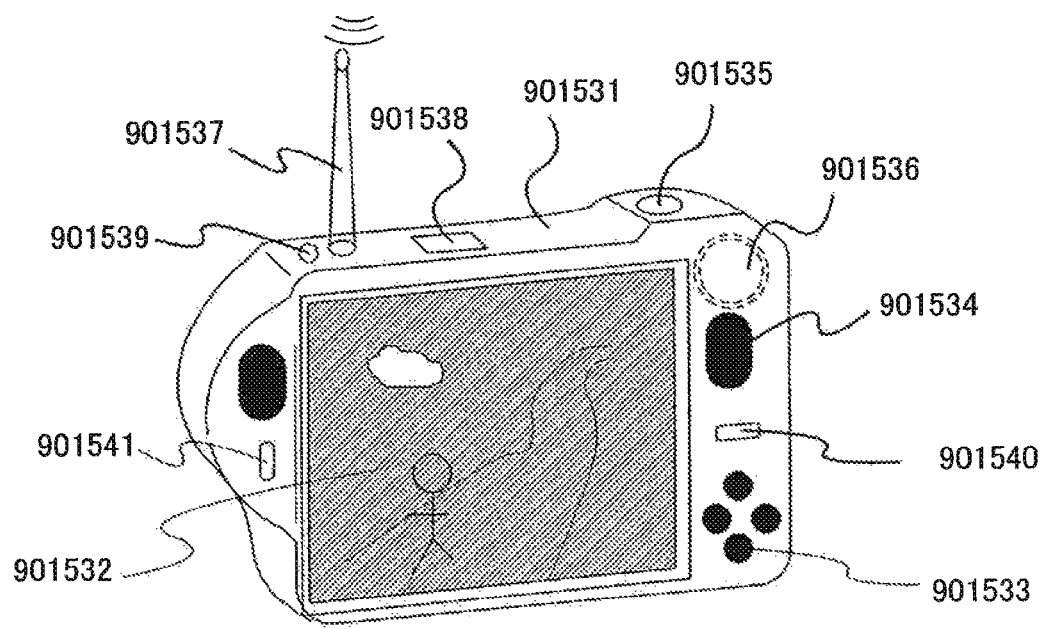

FIG. 129B shows a digital camera having a television reception function, which includes a main body 901531, a display portion 901532, operation keys 901533, a speaker 901534, a shutter button 901535, an image receiving portion 901536, an antenna 901537, an input means 901538, a sensor 901539 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901540, an LED lamp 901541, and the like. The digital camera having the television reception function shown in FIG. 129B has a function of photographing a still image and a moving image; a function of automatically correcting the photographed image; a function of obtaining a variety of information from the antenna; a function of storing the photographed image or the information obtained from the antenna; and a function of displaying the photographed image or the information obtained from the antenna on the display portion. Note that the digital camera having the television reception function shown in FIG. 129B is not limited to having these functions, and can have various functions.

Figure 130:
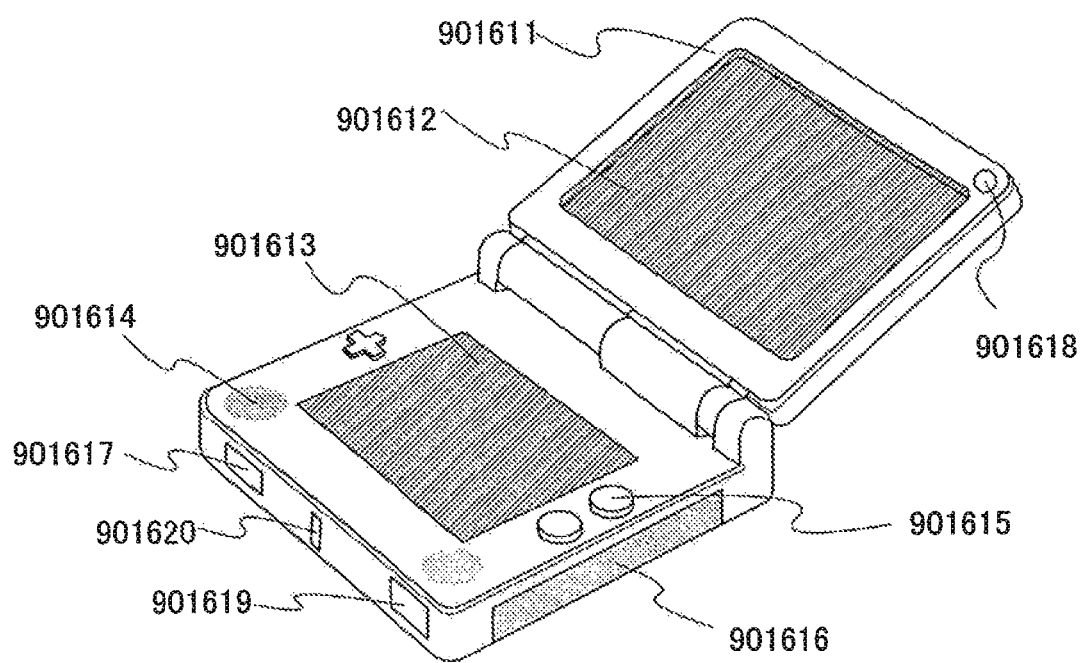
FIG. 130 illustrates the present invention.

FIG. 130 shows a portable game machine, which includes a housing 901611, a first display portion 901612, a second display portion 901613, speaker portions 901614, operation keys 901615, a recording medium insert portion 901616, an input means 901617, a sensor 901618 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901619, an LED lamp 901620, and the like. The portable game machine shown in FIG. 130 has a function of reading a program or data stored in the recording medium to display on the display portion, and a function of sharing information with another portable game machine by wireless communication. Note that the portable game machine shown in FIG. 130 is not limited to having these functions, and can have various functions.

As shown in FIGS. 121A to 121C, FIGS. 128A to 128C, FIGS. 129A to 129C, and FIG. 130, an electronic device includes a display portion for displaying some information. The electronic device can include a display portion having a wide viewing angle.

Next, an application of a semiconductor device is described.

Figure 122:
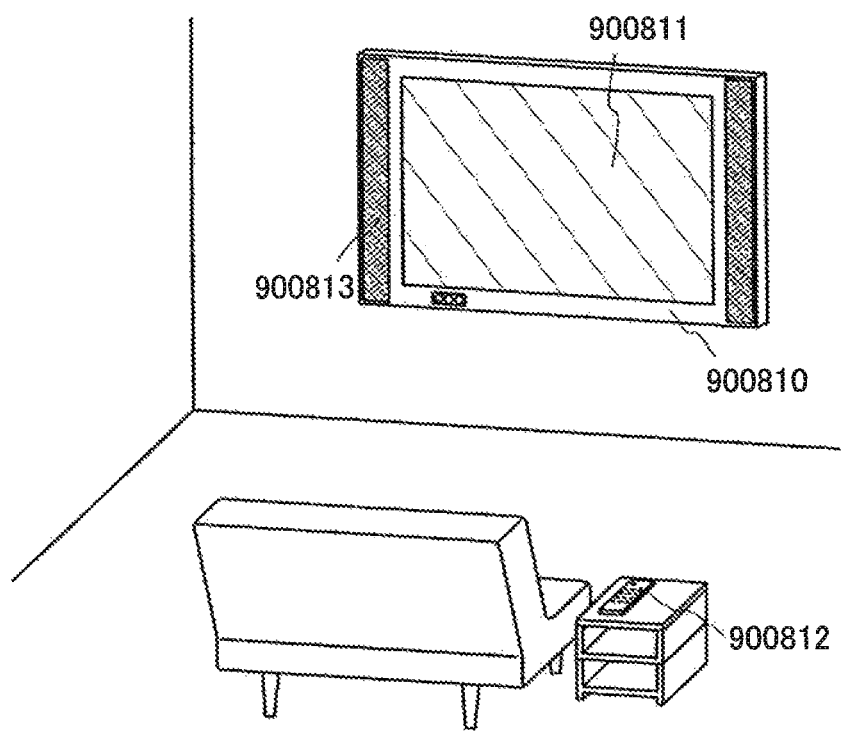
FIG. 122 illustrates the present invention.

FIG. 122 shows an example in which the semiconductor device is incorporated in a structure. FIG. 122 shows a housing 900810, a display panel 900811, a remote controller 900812 which is an operation portion, a speaker portion 900813, and the like. The semiconductor device is incorporated in the structure as a wall-hanging type, so that the semiconductor device can be provided without requiring a wide space.

Figure 123:
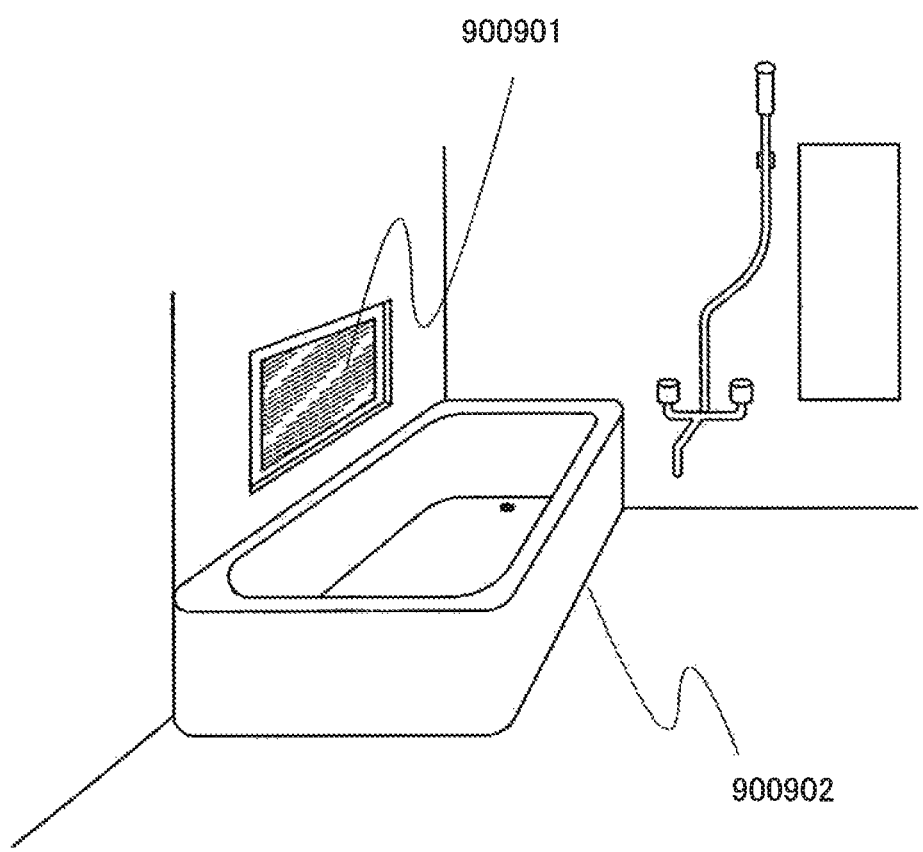
FIG. 123 illustrates the present invention.

FIG. 123 shows another example in which the semiconductor device is incorporated in a structure. A display panel 900901 is incorporated in a prefabricated bath unit 900902, so that a bather can view the display panel 900901. The display panel 900901 has a function of displaying information by an operation of the bather. The display panel 900901 can be utilized for advertisement or an amusement means.

Note that the semiconductor device can be provided in various places as well as on a sidewall of the prefabricated bath unit 900902 shown in FIG. 123. For example, the semiconductor device may be incorporated in part of a mirror or the bathtub itself. At this time, the shape of the display panel 900901 may be a shape in accordance with the mirror or the bathtub.

Figure 124:
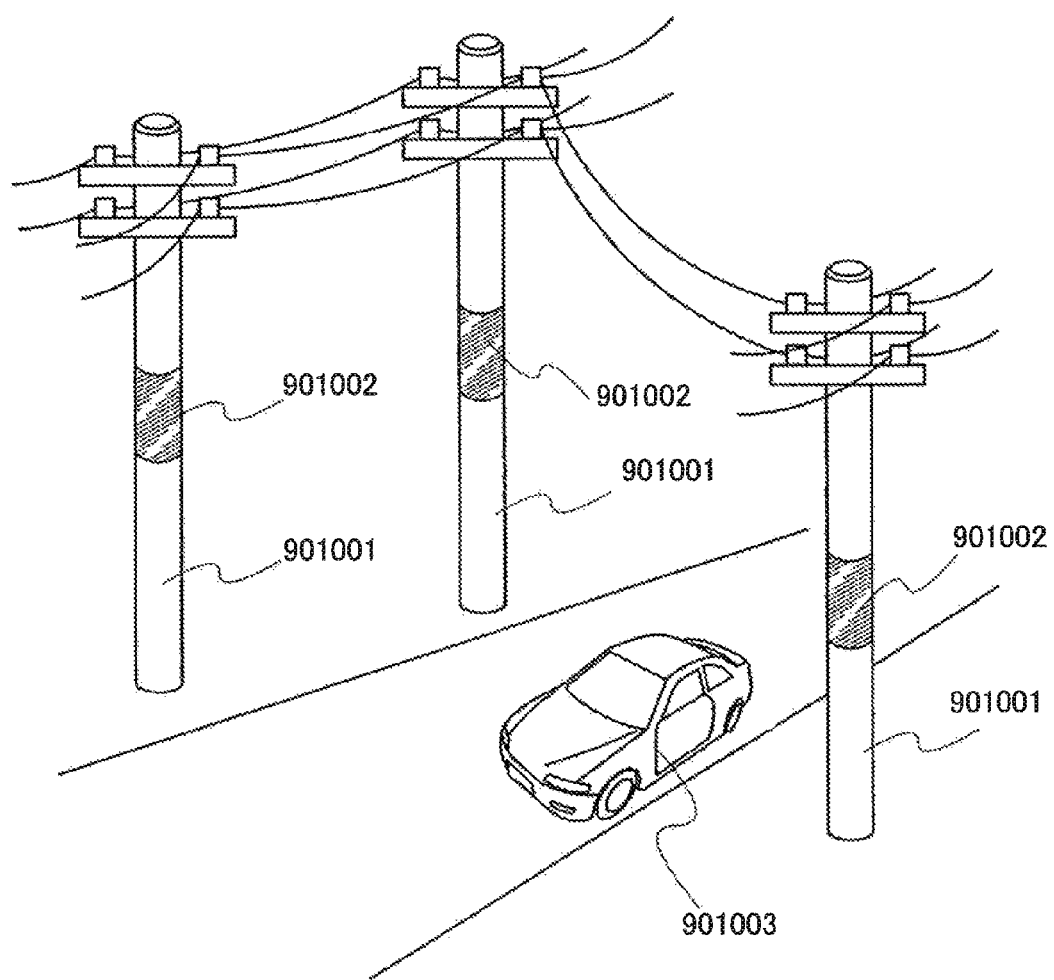
FIG. 124 illustrates the present invention.

FIG. 124 shows another example in which the semiconductor device is incorporated in a structure. Display panels 901002 are curved in accordance with curved surfaces of columnar objects 901001. Note that here, the columnar objects 901001 are described as telephone poles The display panels 901002 shown in FIG. 124 are provided in positions higher than a human eye level. When the display panels 901002 are provided for structures standing outside to each other in large numbers, such as telephone poles, advertisement can be performed to an unspecified number of viewers. Here, since the display panels 901002 can easily display the same images by control from outside and can easily switch images instantly, extremely effective information display and advertising effects can be expected. When self-luminous display elements are provided in the display panels 901002, the display panels 901002 are effectively used as highly visible display media even at night. When the display panels 901002 are provided for the telephone poles, power supply means of the display panels 901002 can be easily secured. In an emergency such as a disaster, the display panels 901002 can be means for quickly transmitting precise information to victims.

Note that as each of the display panels 901002, a display panel in which a display element is driven by providing a switching element such as an organic transistor over a film-shaped substrate so that an image is displayed can be used Note that although this embodiment describes the wall, the prefabricated bath unit, and the columnar object as examples of the structure, this embodiment mode is not limited to this, and the semiconductor device can be provided for various structures.

Next, an example is described in which the semiconductor device is incorporated in a moving object.

Figure 125:
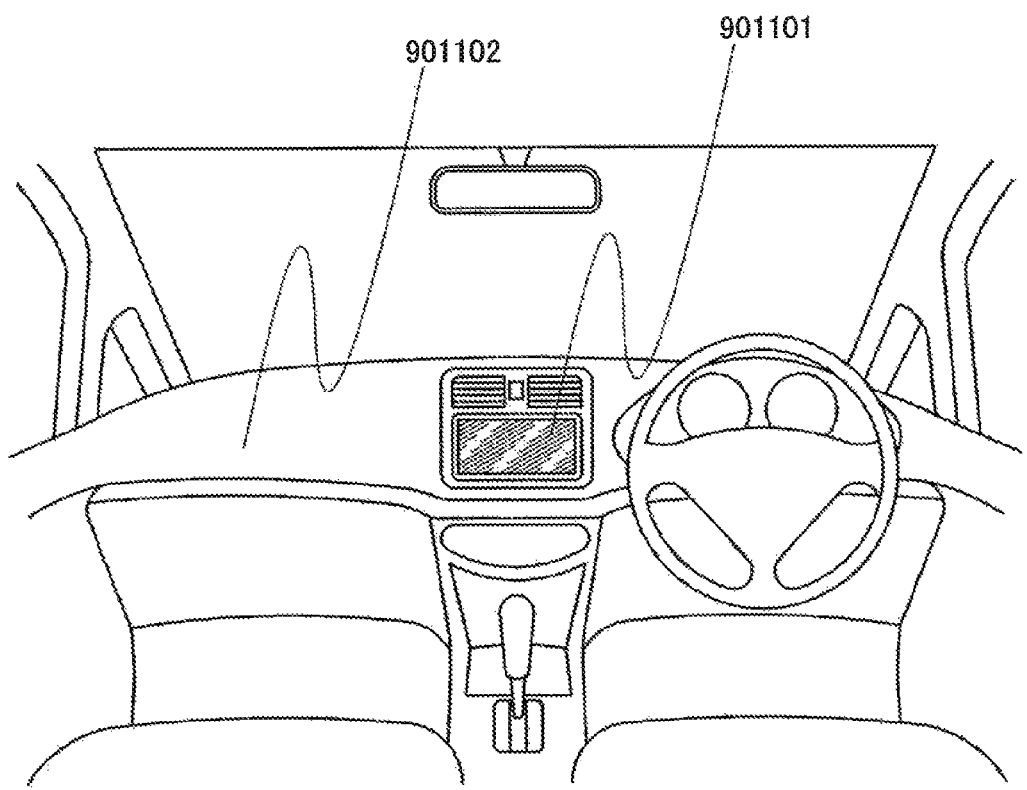
FIG. 125 illustrates the present invention.

FIG. 125 shows an example in which the semiconductor device is incorporated in a car. A display panel 901102 is incorporated in a car body 901101 of the car and can display information on an operation of the car or information input from inside or outside of the car on an on-demand basis. Note that the display panel 901102 may have a navigation function.

Note that the semiconductor device can be provided in various positions as well as the car body 901101 shown in FIG. 125. For example, the semiconductor device may be incorporated in a glass window, a door, a steering wheel, a shift lever, a seat, a room mirror, or the like. At this time, the shape of the display panel 901102 may be a shape in accordance with a shape of an object in which the display panel 901102 is provided.

Figure 126A:
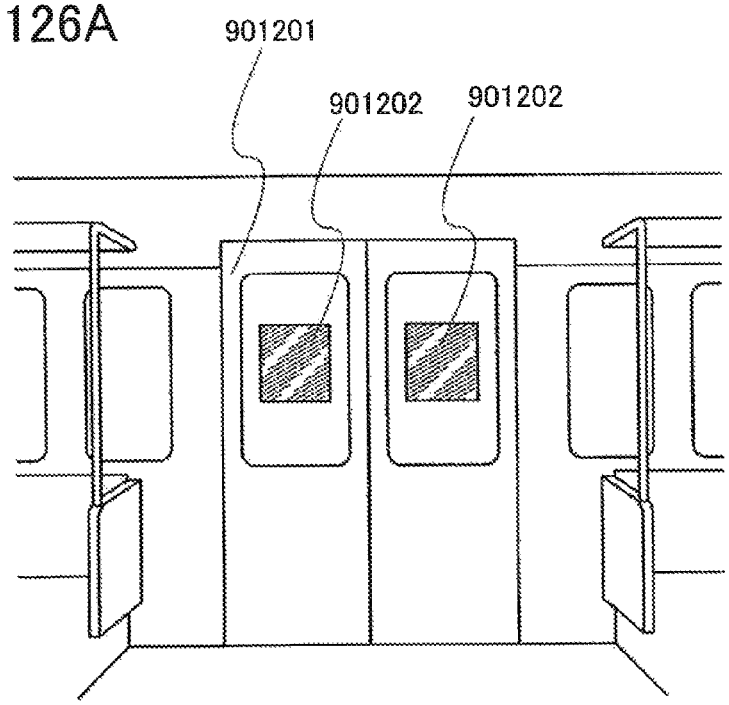
FIGS. 126A and 126B illustrate the present invention.
Figure 126B:
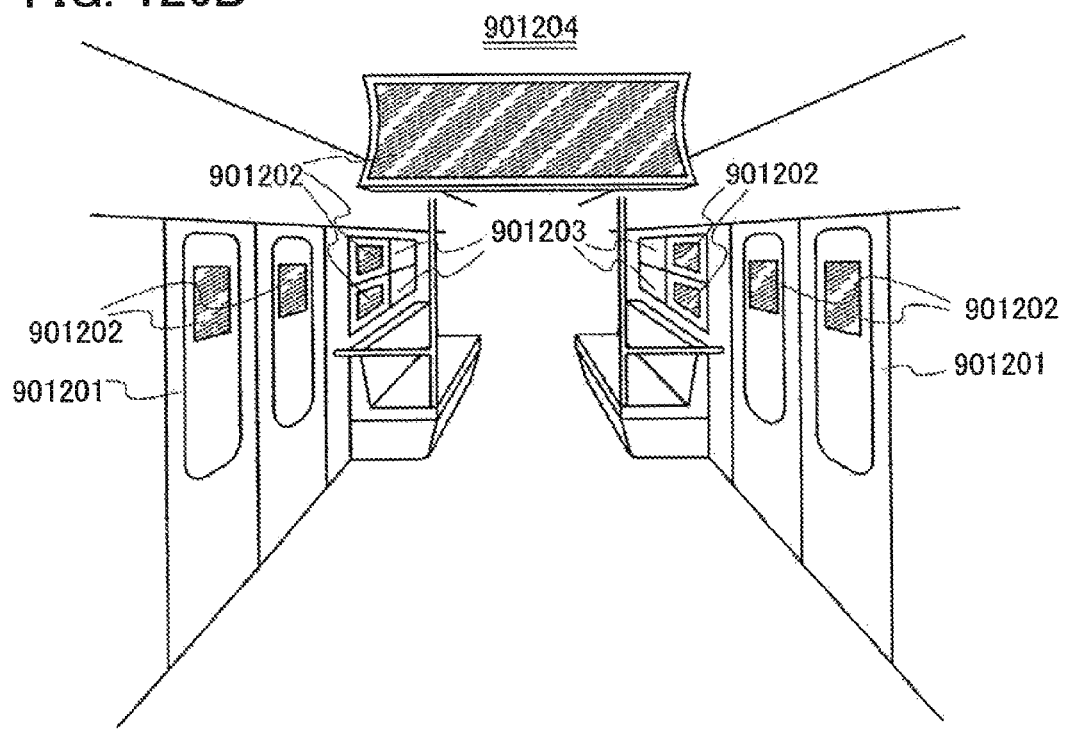

FIGS. 126A and 126B each show an example in which the semiconductor device is incorporated in a train car.

FIG. 126A shows an example in which display panels 901202 are provided for glasses of a door 901201 of the train car. The display panels 901202 have an advantage over conventional paper-based advertisement that labor cost which is necessary for switching advertisement is not needed. Since the display panels 901202 can instantly switch images displayed on display portions by external signals, images on the display panels can be switched as the type of train passenger changes in accordance with different time periods, for example, so that a more effective advertising effect can be expected.

FIG. 126B shows an example in which display panels 901202 are provided for glass windows 901203 and a ceiling 901204 as well as the glasses of the doors 901201 of the train car. Since the semiconductor device can be easily provided in a position in which the semiconductor device is conventionally difficult to be provided in this manner, an effective advertisement effect can be obtained. Since the semiconductor device can instantly switch images displayed on the display portion by external signals, cost and time generated in advertisement switching can be reduced, so that more flexible advertisement operation and information transmission can be performed.

Note that the semiconductor device can be provided in various positions as well as the doors 901201, the glass windows 901203, and the ceiling 901204 which are shown in FIGS. 126A and 126B. For example, the semiconductor device may be incorporated in a hand strap, a seat, a handrail, a floor, or the like. At this time, the shape of the display panel 901202 may be a shape in accordance with a shape of an object in which the display panel 901202 is provided.

Figure 127A:
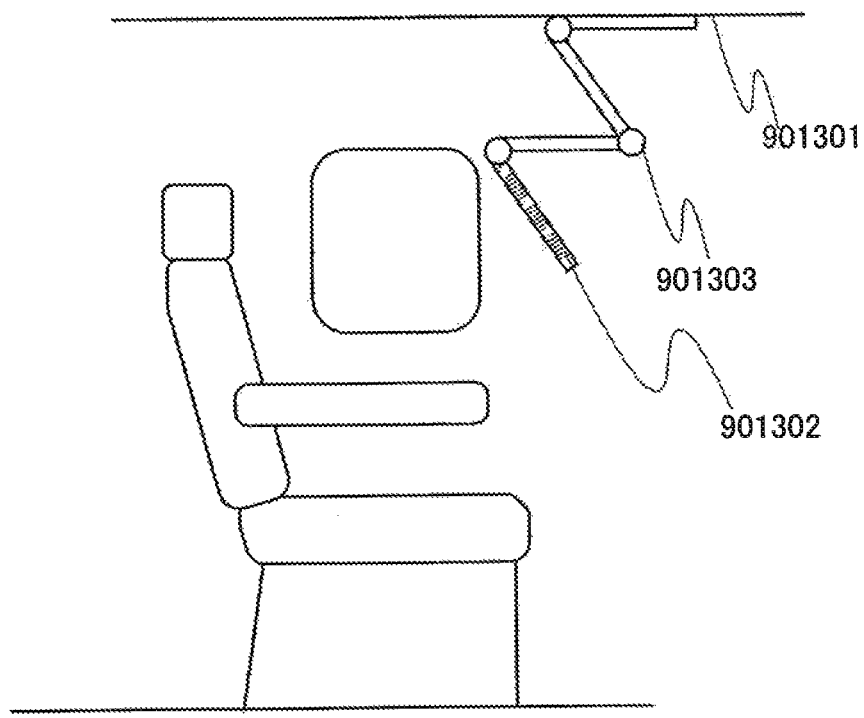
FIGS. 127A and 127B illustrate the present invention.
Figure 127B:
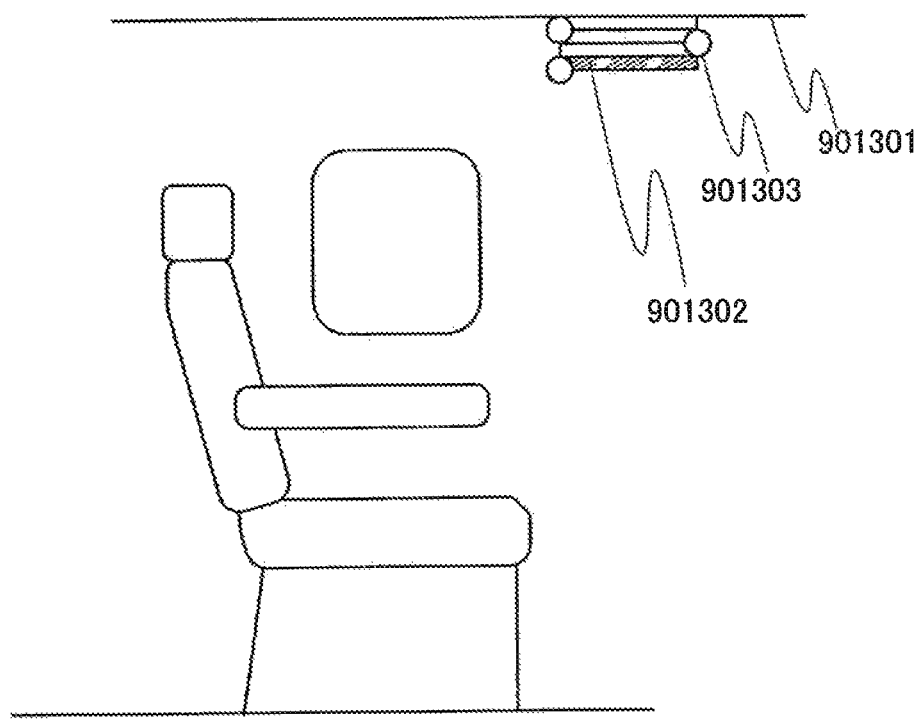

FIGS. 127A and 127B each show an example in which the semiconductor device is incorporated in a passenger airplane.

FIG. 127A shows a shape in use when a display panel 901302 is provided for a ceiling 901301 above a seat of the passenger airplane. The display panel 901302 is incorporated in the ceiling 901301 through a hinge portion 901303, and a passenger can view the display panel 901302 by a telescopic motion of the hinge portion 901303. The display panel 901302 has a function of displaying information by an operation of the passenger. The display panel 901302 can be utilized for advertisement or an amusement means. When the display panel 901302 is stored on the ceiling 901301 by folding the hinge portion 901303 as shown in FIG. 127B, safety during takeoff and landing can be secured. Note that the display panel 901302 can also be utilized as a medium and a guide light by lighting display elements of the display panel 901302 in an emergency.

Note that the semiconductor device can be incorporated in various positions as well as the ceiling 901301 shown in FIGS. 127A and 127B. For example, the semiconductor device may be incorporated in a seat, a table, an armrest, a window, or the like. A large display panel which can be viewed simultaneously by a plurality of people may be provided on a wall of an airframe. At this time, the shape of the display panel 901302 may be a shape in accordance with a shape of an object in which the display panel 901302 is provided.

Note that although this embodiment mode describes the train car body, the car body, and the airplane body as examples of moving objects, the present invention is not limited to them, and the semiconductor device can be provided in various objects such as a motorbike, a four-wheeled vehicle (including a car, a bus, and the like), a train (including a monorail, a railroad, and the like), and a vessel. Since display on display panels in a moving object can be switched instantly by external signals, the semiconductor device can be used for an advertisement display board for an unspecified number of customers, an information display board in an emergency, or the like by providing the semiconductor device in the moving object.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

This application is based on Japanese Patent Application serial no. 2007-133533 filed with Japan Patent Office on May 18, 2007, the entire contents of which are hereby incorporated by reference.

What is claimed is:

1. A display device comprising a pixel portion, the pixel portion comprising:
    a gate wiring;
    a first source wiring and a second source wiring;
    a first transistor, a second transistor, and a third transistor each comprising a gate, a first terminal, and a second terminal;
    a first capacitor, a second capacitor, and a third capacitor each comprising a first terminal and a second terminal; and
    a first liquid crystal element, a second liquid crystal element, and a third liquid crystal element each comprising a first terminal and a second terminal,
    wherein the gate of the first transistor is directly connected to the gate wiring,
    wherein the first terminal of the first transistor is directly connected to the first source wiring, wherein the second terminal of the first transistor is directly connected to the first terminal of the first liquid crystal element,
wherein the second terminal of the first transistor is directly connected to the first terminal of the first capacitor,
wherein the gate of the second transistor is directly connected to the gate wiring,
wherein the first terminal of the second transistor is directly connected to the first source wiring,
wherein the second terminal of the second transistor is directly connected to the first terminal of the second liquid crystal element,
wherein the second terminal of the second transistor is directly connected to the first terminal of the second capacitor,
wherein the first transistor, the second transistor, and the third transistor are configured to be turned on simultaneously,
wherein the first terminal of the third transistor is directly connected to the second source wiring,
wherein the second terminal of the third transistor is directly connected to the first terminal of the third liquid crystal element,
wherein the second terminal of the third transistor is directly connected to the first terminal of the third capacitor,
wherein the first liquid crystal element, the second liquid crystal element, and the third liquid crystal element are in a same column, and
wherein the second terminal of the first capacitor is not directly connected to the second terminal of the third capacitor.

2. The display device according to claim 1, wherein the gate of the third transistor is directly connected to the gate wiring.

3. The display device according to claim 1, wherein the first liquid crystal element, the second liquid crystal element, and the third liquid crystal element are arranged in a line which is substantially parallel to the first source wiring.

4. The display device according to claim 1, wherein the second terminal of the first capacitor is electrically connected to the second terminal of the third capacitor.

5. The display device according to claim 1, wherein the first transistor, the second transistor, and the third transistor are in a same pixel.

6. A display module comprising:
the display device according to claim 1; and
a flexible printed circuit.

7. An electronic device comprising:
the display device according to claim 1; and
at least one of a battery, an antenna, a microphone, a speaker, a sensor, and a keyboard.

8. A display device comprising a pixel portion, the pixel portion comprising:
a gate wiring;
a first source wiring and a second source wiring;
a first transistor, a second transistor, and a third transistor each comprising a gate, a first terminal, and a second terminal;
a first capacitor, a second capacitor, and a third capacitor each comprising a first terminal and a second terminal; and
a first liquid crystal element, a second liquid crystal element, and a third liquid crystal element each comprising a first terminal and a second terminal,
wherein the gate of the first transistor is directly connected to the gate wiring,
wherein the first terminal of the first transistor is directly connected to the first source wiring,
wherein the second terminal of the first transistor is directly connected to the first terminal of the first liquid crystal element,
wherein the second terminal of the first transistor is directly connected to the first terminal of the first capacitor,
wherein the gate of the second transistor is directly connected to the gate wiring,
wherein the first terminal of the second transistor is directly connected to the first source wiring,
wherein the second terminal of the second transistor is directly connected to the first terminal of the second liquid crystal element,
wherein the second terminal of the second transistor is directly connected to the first terminal of the second capacitor,
wherein the first transistor, the second transistor, and the third transistor are configured to be turned on simultaneously,
wherein the first terminal of the third transistor is directly connected to the second source wiring,
wherein the second terminal of the third transistor is directly connected to the first terminal of the third liquid crystal element,
wherein the second terminal of the third transistor is directly connected to the first terminal of the third capacitor,
wherein the first liquid crystal element, the second liquid crystal element, and the third liquid crystal element are in a same column,
wherein the second terminal of the first capacitor is not directly connected to the second terminal of the third capacitor, and
wherein the second terminal of the second capacitor is directly connected to the second terminal of the third capacitor.

9. The display device according to claim 8, wherein the second terminal of the first capacitor is electrically connected to the second terminal of the third capacitor.

10. The display device according to claim 8, wherein the first transistor, the second transistor, and the third transistor are in a same pixel.

11. A display module comprising:
the display device according to claim 8; and
a flexible printed circuit.

12. An electronic device comprising:
the display device according to claim 8; and
at least one of a battery, an antenna, a microphone, a speaker, a sensor, and a keyboard.

13. A display device comprising a pixel portion, the pixel portion comprising:
a gate wiring;
a first source wiring and a second source wiring;
a first transistor, a second transistor, and a third transistor each comprising a gate, a first terminal, and a second terminal;
a first capacitor, a second capacitor, and a third capacitor each comprising a first terminal and a second terminal; and
a first liquid crystal element, a second liquid crystal element, and a third liquid crystal element each comprising a first terminal and a second terminal, wherein the gate of the first transistor is directly connected to the gate wiring,
wherein the first terminal of the first transistor is directly connected to the first source wiring,
wherein the second terminal of the first transistor is directly connected to the first terminal of the first liquid crystal element,
wherein the first terminal of the first liquid crystal element is directly connected to the first terminal of the first capacitor through a first contact hole and a second contact hole,
wherein the gate of the second transistor is directly connected to the gate wiring,
wherein the first terminal of the second transistor is directly connected to the first source wiring,
wherein the second terminal of the second transistor is directly connected to the first terminal of the second liquid crystal element,
wherein the second terminal of the second transistor is directly connected to the first terminal of the second capacitor,
wherein the first transistor, the second transistor, and the third transistor are configured to be turned on simultaneously,
wherein the first terminal of the third transistor is directly connected to the second source wiring,
wherein the second terminal of the third transistor is directly connected to the first terminal of the third liquid crystal element,
wherein the second terminal of the third transistor is directly connected to the first terminal of the third capacitor,
wherein the first liquid crystal element, the second liquid crystal element, and the third liquid crystal element are in a same column, and
wherein the second terminal of the first capacitor is not directly connected to the second terminal of the third capacitor.

14. The display device according to claim 13, wherein the second terminal of the first capacitor is electrically connected to the second terminal of the third capacitor.

15. The display device according to claim 13, wherein the first transistor, the second transistor, and the third transistor are in a same pixel.

16. A display module comprising:
the display device according to claim 13; and
a flexible printed circuit.

17. An electronic device comprising:
the display device according to claim 13; and
at least one of a battery, an antenna, a microphone, a speaker, a sensor, and a keyboard.

18. A display device comprising a pixel portion, the pixel portion comprising:
a gate wiring;
a first source wiring and a second source wiring;
a first transistor, a second transistor, and a third transistor each comprising a gate, a first terminal, and a second terminal;
a first capacitor, a second capacitor, and a third capacitor each comprising a first terminal and a second terminal; and
a first liquid crystal element, a second liquid crystal element, and a third liquid crystal element each comprising a first terminal and a second terminal,
wherein the gate of the first transistor is directly connected to the gate wiring,
wherein the first terminal of the first transistor is directly connected to the first source wiring,
wherein the second terminal of the first transistor is directly connected to the first terminal of the first liquid crystal element,
wherein the second terminal of the first transistor is directly connected to the first terminal of the first capacitor,
wherein the gate of the second transistor is directly connected to the gate wiring,
wherein the first terminal of the second transistor is directly connected to the first source wiring,
wherein the second terminal of the second transistor is directly connected to the first terminal of the second liquid crystal element,
wherein the second terminal of the second transistor is directly connected to the first terminal of the second capacitor,
wherein the first transistor, the second transistor, and the third transistor are configured to be turned on simultaneously,
wherein the first terminal of the third transistor is directly connected to the second source wiring,
wherein the second terminal of the third transistor is directly connected to the first terminal of the third liquid crystal element,
wherein the second terminal of the third transistor is directly connected to the first terminal of the third capacitor,
wherein the first liquid crystal element, the second liquid crystal element, and the third liquid crystal element are in a same column,
wherein the second terminal of the first capacitor is not directly connected to the second terminal of the third capacitor, and
wherein the first transistor, the second transistor, and the third transistor comprise an oxide semiconductor material.

19. The display device according to claim 18, wherein the second terminal of the first capacitor is electrically connected to the second terminal of the third capacitor.

20. The display device according to claim 18, wherein the first transistor, the second transistor, and the third transistor are in a same pixel.

21. A display module comprising:
the display device according to claim 18; and
a flexible printed circuit.

22. An electronic device comprising:
the display device according to claim 18; and
at least one of a battery, an antenna, a microphone, a speaker, a sensor, and a keyboard.

* * * * *